US012120947B2

(12) United States Patent
Jung et al.

(10) Patent No.: US 12,120,947 B2
(45) Date of Patent: Oct. 15, 2024

(54) ORGANOMETALLIC COMPOUND, COMPOSITION INCLUDING SAME, ORGANIC LIGHT-EMITTING DEVICE, AND ELECTRONIC APPARATUS

(71) Applicants: Samsung Electronics Co., Ltd., Suwon-si (KR); UNIVERSITAT DE BARCELONA, Barcelona (ES)

(72) Inventors: Yongsik Jung, Seoul (KR); Laura Rodriguez Raurell, Barcelona (ES); Joao Carlos Lima, Caparica (PT); Hyeonho Choi, Suwon-si (KR); Seungyeon Kwak, Suwon-si (KR); Kyuyoung Hwang, Anyang-si (KR)

(73) Assignees: SAMSUNG ELECTRONICS CO., LTD., Gyeonggi-Do (KR); UNIVERSITAT DE BARCELONA, Barcelona (ES)

( * ) Notice: Subject to any disclaimer, the term of this patent is extended or adjusted under 35 U.S.C. 154(b) by 737 days.

(21) Appl. No.: 17/199,655

(22) Filed: Mar. 12, 2021

(65) Prior Publication Data

US 2022/0190260 A1 Jun. 16, 2022

(30) Foreign Application Priority Data

Dec. 3, 2020 (KR) ........................ 10-2020-0167832

(51) Int. Cl.
*H01L 51/00* (2006.01)
*C07F 1/00* (2006.01)
(Continued)

(52) U.S. Cl.
CPC ............. *H10K 85/371* (2023.02); *C07F 1/00* (2013.01); *C09K 11/06* (2013.01);
(Continued)

(58) Field of Classification Search
CPC .... H01L 51/0091; H01L 51/5016; C07F 1/00; C09K 2211/1011; C09K 11/06
See application file for complete search history.

(56) References Cited

U.S. PATENT DOCUMENTS 10,797,249 B2 * 10/2020 Lee ........................ C09K 11/06
10,873,040 B2 * 12/2020 Jeon .................... C07F 15/0086
(Continued)

FOREIGN PATENT DOCUMENTS

CN 102286009 A 12/2011

*Primary Examiner* — Robert D Harlan
(74) *Attorney, Agent, or Firm* — CANTOR COLBURN LLP

(57) ABSTRACT

An organometallic compound represented by Formula 1

Formula 1

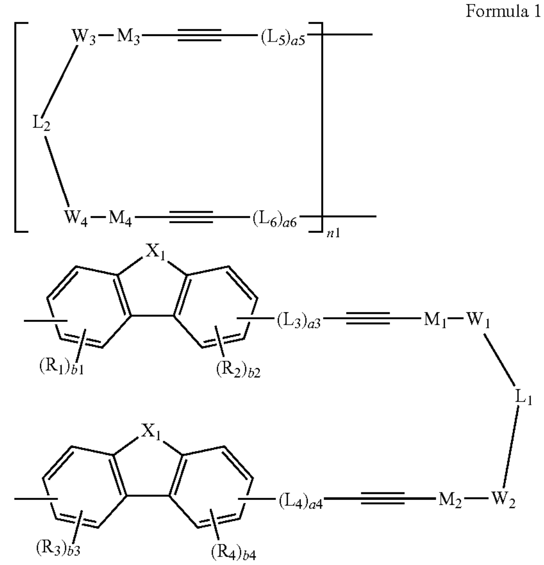

wherein, $M_1$ to $M_4$ are each independently a first-row transition metal, a second-row transition metal, or a third-row transition metal; $X_1$ and $X_2$ are each independently $C(R_5)(R_6)$, $Si(R_5)(R_6)$, $N(R_5)$, O, S, Se, or Te; $W_1$ to $W_4$ are each independently $N(R_7)(R_8)$, $P(R_7)(R_8)$, $S(R_7)$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$; $L_1$ to $L_6$ are each independently a $C_1$-$C_{30}$ alkylene group unsubstituted or substituted with at least one $R_{10a}$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a3 to a6 are each independently an integer from 0 to 3, and $R_1$ to $R_8$ and $R_{10a}$ in Formula 1 are as described herein.

16 Claims, 7 Drawing Sheets

(51) Int. Cl.
*C09K 11/06* (2006.01)
*H10K 85/30* (2023.01)
*H10K 50/11* (2023.01)
*H10K 101/10* (2023.01)

(52) U.S. Cl.
CPC ....... *C09K 2211/1011* (2013.01); *H10K 50/11* (2023.02); *H10K 2101/10* (2023.02)

(56) References Cited

U.S. PATENT DOCUMENTS 11,171,296 B2 * 11/2021 Sim ........................ C09K 11/06
2021/0399243 A1 12/2021 Jung et al.

* cited by examiner

ORGANOMETALLIC COMPOUND, COMPOSITION INCLUDING SAME, ORGANIC LIGHT-EMITTING DEVICE, AND ELECTRONIC APPARATUS

CROSS-REFERENCE TO RELATED APPLICATION

This application claims priority to and the benefit of Korean Patent Application No. 10-2020-0167832 filed on Dec. 3, 2020, in the Korean Intellectual Property Office, and all the benefits accruing therefrom under 35 U.S.C. § 119, the content of which is incorporated herein in its entirety by reference.

BACKGROUND

1. Field

One or more embodiments of the present disclosure relate to an organometallic compound, a composition including the same, an organic light-emitting device, and an electronic apparatus.

2. Description of Related Art

Organic light-emitting devices are self-emissive devices that have a wide viewing angle, a high contrast ratio, a short response time, and excellent characteristics in terms of luminance, driving voltage, and response speed, and produce full-color images.

In an example, an organic light-emitting device includes an anode, a cathode, and an organic layer located between the anode and the cathode and including an emission layer. A hole transport region may be disposed between the anode and the emission layer, and an electron transport region may be located between the emission layer and the cathode. Holes provided from the anode may move toward the emission layer through the hole transport region, and electrons provided from the cathode may move toward the emission layer through the electron transport region. Carriers, such as the holes and the electrons, recombine in the emission layer to produce excitons. These excitons transition from an excited state to a ground state to thereby generate visible light.

SUMMARY

Provided are an organometallic compound, a composition including the same, an organic light-emitting device, and an electronic apparatus.

Additional aspects will be set forth in part in the description which follows and, in part, will be apparent from the description, or may be learned by practice of the presented embodiments of the disclosure.

According to an aspect, provided is an organometallic compound represented by Formula 1.

Formula 1

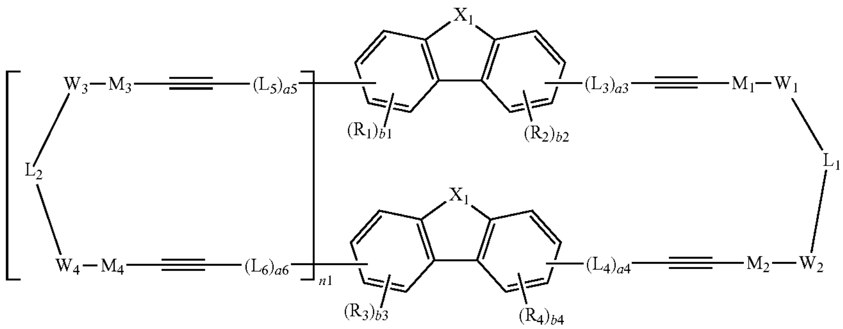

In Formula 1, $M_1$ to $M_4$ are each independently a first-row transition metal of the Periodic Table of Elements, a second-row transition metal of the Periodic Table of Elements, or a third-row transition metal of the Periodic Table of Elements, $X_1$ and $X_2$ are each independently $C(R_5)(R_6)$, $Si(R_5)(R_6)$, $N(R_5)$, O, S, Se, or Te, $W_1$ to $W_4$ are each independently $N(R_7)(R_8)$, $P(R_7)(R_8)$, $S(R_7)$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, $L_1$ to $L_6$ are each independently a $C_1$-$C_{30}$ alkylene group unsubstituted or substituted with at least one $R_{10a}$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a3 to a6 are each independently an integer from 0 to 3, $R_1$ to $R_8$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_1$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a $C_2$-$C_{60}$ heteroarylalkyl group unsubstituted or substituted with at least one $R_{10a}$, a $C_2$-$C_{60}$ alkylheteroaryl group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —$Si(Q_1)(Q_2)(Q_3)$, —$Ge(Q_1)(Q_2)(Q_3)$, —$N(Q_4)(Q_5)$, —$B(Q_6)(Q_7)$, —$P(=O)(Q_8)(Q_9)$, or —$P(Q_8)(Q_9)$, $R_7$ and $R_8$ are optionally connected to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, b1 and b3 are each independently an integer from 1 to 4, b2 and b4 are each independently an integer from 1 to 3, n1 is 0 or 1, and when n1 is 0, a group represented by

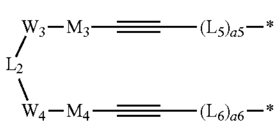

is not present, and $R_{10a}$ is deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$Si(Q_{11})(Q_{12})(Q_{13})$, —$Ge(Q_{11})(Q_{12})(Q_{13})$, —$N(Q_{14})(Q_{15})$, $B(Q_{16})(Q_{17})$, —$P(=O)(Q_{18})(Q_{19})$, or —$P(Q_{18})(Q_{19})$ a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each substituted with one or more of deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$Si(Q_{21})(Q_{22})(Q_{23})$, —$Ge(Q_{21})(Q_{22})(Q_{23})$, —$N(Q_{24})(Q_{25})$, —$B(Q_{26})(Q_{27})$, —$P(=O)(Q_{28})(Q_{29})$, or —$P(Q_{28})(Q_{29})$; or $Si(Q_{31})(Q_{32})(Q_{33})$, —$Ge(Q_{31})(Q_{32})(Q_{33})$, —$N(Q_{34})(Q_{35})$, —$B(Q_{36})(Q_{37})$, $P(=O)(Q_{38})(Q_{39})$, or —$P(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

According to another aspect, provided is a composition including at least one organometallic compound represented by Formula 1 as disclosed herein.

According to another aspect, provided is an organic light-emitting device including a first electrode, a second electrode, and an organic layer disposed between the first electrode and the second electrode and including an emission layer, wherein the organic layer includes at least one organometallic compound represented by Formula 1 as disclosed herein.

According to another aspect, provided is an electronic apparatus including at least one organometallic compound represented by Formula 1 as disclosed herein.

BRIEF DESCRIPTION OF THE DRAWINGS

The above and other aspects, features, and advantages of the disclosure will be more apparent from the following detailed description taken in conjunction with the accompanying drawings, in which.

DETAILED DESCRIPTION

Figure 1:
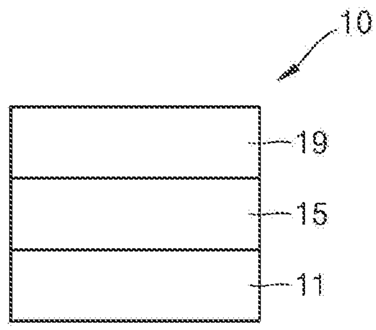
FIG. 1 is a schematic cross-sectional view of an organic light-emitting device according to one or more embodiments.

Reference will now be made in further detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to further explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to a cross section illustration that is a schematic illustration of one or more idealized embodiments. As such, variations from the shapes of the illustration as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figure are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Organometallic Compound

An organometallic compound according to one or more embodiments is represented by Formula 1:

Formula 1

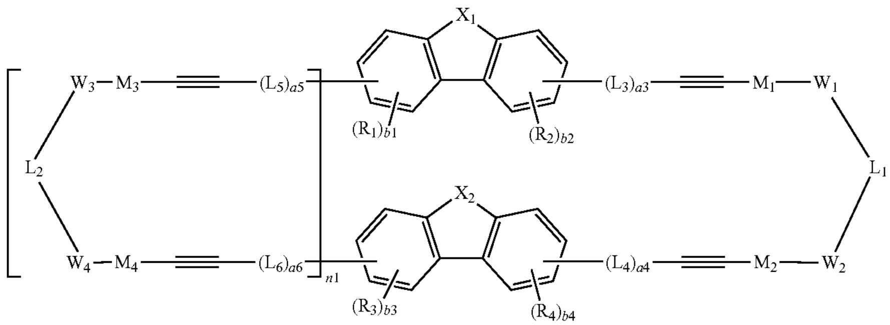

In Formula 1, $M_1$ to $M_4$ may each independently be a first-row transition metal of the Periodic Table of Elements, a second-row transition metal of the Periodic Table of Elements, and a third-row transition metal of the Periodic Table of Elements.

In one or more embodiments, $M_1$ to $M_4$ may each independently be copper (Cu), silver (Ag), or gold (Au). In one or more embodiments, $M_1$ to $M_4$ may each independently be silver (Ag) or gold (Au).

In one or more embodiments, $M_1$ to $M_4$ may each form a coordinate bond with an unshared electron pair of a triple bond and an unshared electron pair of $W_1$ to $W_4$. Accordingly, the organometallic compound represented by Formula 1 may be neutral rather than an ion pair of a cation and an anion.

In Formula 1, $X_1$ and $X_2$ may each independently be $C(R_5)(R_6)$, $Si(R_5)(R_6)$, $N(R_5)$, O, S, Se, or Te. For example, $X_1$ and $X_2$ may each independently be $C(R_5)(R_6)$, $Si(R_5)(R_6)$, $N(R_5)$, O, or S, but embodiments of the present disclosure are not limited thereto.

In Formula 1, $W_1$ to $W_4$ may each independently be $N(R_7)(R_8)$, $P(R_7)(R_8)$, $S(R_7)$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, in Formula 1, $W_1$ to $W_4$ may each independently be $N(R_7)(R_8)$, $P(R_7)(R_8)$, $S(R_7)$, or a group represented by one of Formulae 2-1 to 2-7:

2-1

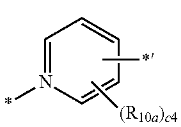

2-2

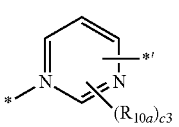

2-3

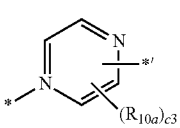

2-4

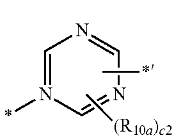

-continued 2-5

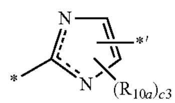

2-6

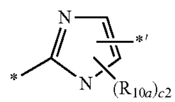

2-7

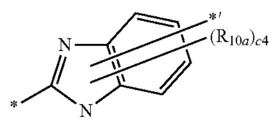

In Formulae 2-1 to 2-7, $R_{10a}$ is the same as described in the present specification, c2 is 1 or 2, c3 is 1, 2, or 3, c4 is 1, 2, 3, or 4,

* indicates a binding site to $M_1$, $M_2$, $M_3$, or $M_4$, and

*' indicates a binding site to $L_1$ or $L_2$.

In one or more embodiments, in Formula 1, $W_1$ to $W_4$ may each independently be $N(R_7)(R_8)$, $P(R_7)(R_8)$, $S(R_7)$, or a group represented by one of Formulae 2-11 to 2-18:

2-11

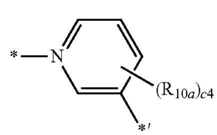

2-12

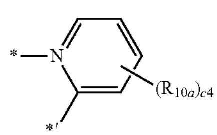

2-13

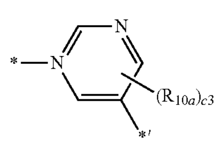

2-14

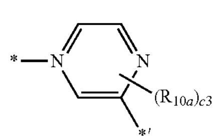

-continued 2-15

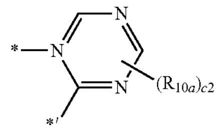

2-16

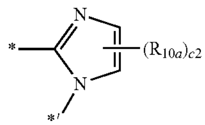

2-17

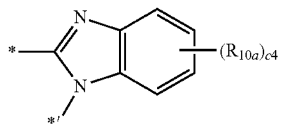

2-18

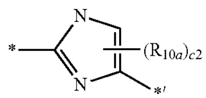

In Formulae 2-11 to 2-18, $R_{10a}$ is the same as described in the present specification, c2 is 1 or 2, c3 is 1, 2, or 3, c4 is 1, 2, 3, or 4,

* indicates a binding site to $M_1$, $M_2$, $M_3$, or $M_4$, and

*' indicates a binding site to $L_1$ or $L_2$.

In one or more embodiments, in Formula 1, $W_1$ to $W_4$ may each independently be $N(R_7)(R_8)$, $P(R_7)(R_8)$, $S(R_7)$, or a group represented by one of Formulae 2-11 to 2-18, $R_7$ and $R_8$ may each independently be:

—F or a $C_1$-$C_{10}$ alkoxy group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, or a tert-pentyl group, each unsubstituted or substituted with one or more of deuterium, —F, —Cl, —Br, —I, a hydroxyl group, a cyano group, a nitro group, or an amino group; and a cyclopentyl group, a cyclohexyl group, a phenyl group, a naphthyl group, or a pyridinyl group, each unsubstituted or substituted with one or more of deuterium, —F, —Cl, —Br, —I, a hydroxyl group, a cyano group, a nitro group, an amino group, a $C_1$-$C_{20}$ alkyl group, or a $C_1$-$C_{20}$ alkoxy group.

In Formula 1, $L_1$ to $L_6$ may each independently be a $C_1$-$C_{30}$ alkylene group unsubstituted or substituted with at least one $R_{10a}$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, in Formula 1, $L_1$ and $L_2$ may each independently be a group represented by Formula 3-1 or 3-2:

3-1

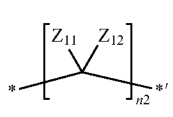

-continued 3-2

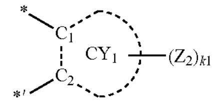

In Formula 3-1 or 3-2, $C_1$ and $C_2$ each indicate a carbon atom, a bond between $C_1$ and $C_2$ is a single bond or a double bond, $CY_1$ is a $C_5$-$C_{30}$ carbocyclic group or a $C_1$-$C_{30}$ heterocyclic group, $Z_{11}$, $Z_{12}$, and $Z_2$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—Si(Q_1)(Q_2)(Q_3)$, $—N(Q_4)(Q_5)$, or $—B(Q_6)(Q_7)$, $Z_{11}$ and $Z_{12}$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is the same as described in the present specification, n2 is an integer from 1 to 10, k1 is an integer from 1 to 10, and

* and *' each indicate a binding site to a neighboring atom.

In one or more embodiments, in Formula 3-2, $CY_1$ may be a cyclopentane group, a cyclohexane group, a cyclopentene group, a cyclohexene group, a benzene group, a naphthalene group, a 1,2,3,4-tetrahydronaphthalene group, an anthracene group, a phenanthrene group, a triphenylene group, a pyrene group, a chrysene group, a pyrrole group, a furan group, a thiophene group, a selenophene group, a silole group, a germole group, an indene group, a 2,3-dihydro-1H-indene group, an indole group, a benzofuran group, a benzothiophene group, a benzoselenophene group, a benzosilole group, a benzogermole group, a benzimidazole group, a benzoxazole group, a benzothiazole group, a benzoselenazole group, a benzoazasilole group, a fluorene group, a carbazole group, a dibenzofuran group, a dibenzothiophene group, a dibenzoselenophene group, a dibenzosilole group, a dibenzogermole group, an azafluorene group, an azacarbazole group, an azadibenzofuran group, an azadibenzothiophene group, an azadibenzoselenophene group, an azadibenzosilole group, an azadibenzogermole group, a pyridine group, a pyrimidine group, a pyrazine group, a pyridazine group, a quinoline group, an isoquinoline group, a quinoxaline group, a quinazoline group, or a phenanthroline group.

In one or more embodiments, in Formula 3-2, $CY_1$ may be a cyclohexane group, a benzene group, a naphthalene group, a 1,2,3,4-tetrahydronaphthalene group, an indene group, a 2,3-dihydro-1H-indene group, an indole group, a benzofuran group, a benzothiophene group, a benzoselenophene group, a benzosilole group, a benzimidazole group, a carbazole group, or a dibenzofuran group, but embodiments of the present disclosure are not limited thereto.

In one or more embodiments, in Formulae 3-1 and 3-2, $Z_{11}$, $Z_{12}$, and $Z_2$ may each independently be:

hydrogen, deuterium, —F, —Cl, —Br, —I, a hydroxyl group, a cyano group, a nitro group, an amino group, a $C_1$-$C_{20}$ alkyl group, or a $C_1$-$C_{20}$ alkoxy group; or a $C_1$-$C_{20}$ alkyl group or a $C_1$-$C_{20}$ alkoxy group, each substituted with at least one of deuterium, —F, —Cl, —Br, —I, a hydroxyl group, a cyano group, a nitro group, or an amino group.

In one or more embodiments, in Formulae 3-1 to 3-3, $Z_{11}$, $Z_{12}$, and $Z_2$ may each independently be:

hydrogen, deuterium, —F, —Cl, —Br, —I, a hydroxyl group, a cyano group, a nitro group, an amino group, a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, a 3-pentyl group, or a sec-isopentyl group; or a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, a 3-pentyl group, or a sec-isopentyl group, each substituted with at least one of deuterium, —F, —Cl, —Br, —I, a hydroxyl group, a cyano group, a nitro group, or an amino group.

In one or more embodiments, in Formula 1, $L_1$ and $L_2$ may each independently be a group represented by one or more of Formulae 3-11 to 3-22:

3-11

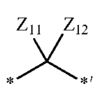

3-12

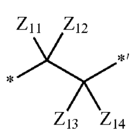

3-13

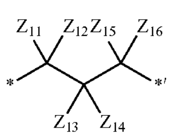

3-14

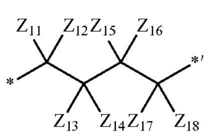

3-15

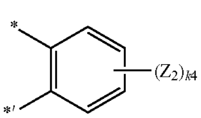

3-16

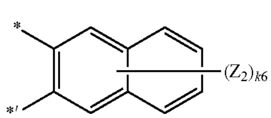

-continued 3-17

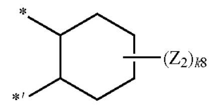

3-18

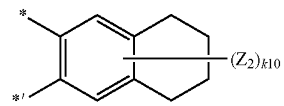

3-19

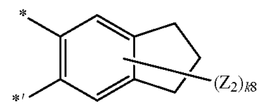

3-20

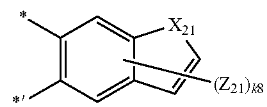

3-21

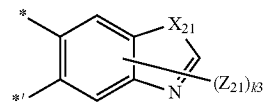

3-22

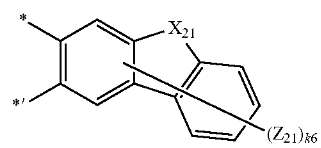

In Formulae 3-11 to 3-22, $X_{21}$ is $C(Z_{22})(Z_{23})$, $Si(Z_{22})(Z_{23})$, $N(Z_{22})$, O, S, or Se, $Z_{11}$, $Z_{12}$, and $Z_2$ are the same as described in the present specification, $Z_{13}$ to $Z_{18}$ are the same as described in connection with $Z_{11}$ provided herein, $Z_{21}$ to $Z_{23}$ are the same as described in connection with $Z_2$ provided herein, k3 is an integer from 1 to 3, k4 is an integer from 1 to 4, k6 is an integer from 1 to 6, k8 is an integer from 1 to 8, k10 is an integer from 1 to 10, and

* and *' each indicate a binding site to a neighboring atom.

In one or more embodiments, in Formula 1, $L_3$ to $L_6$ may each independently be:

a cyclopentylene group, a cyclohexylene group, a cyclopentenylene group, a cyclohexenylene group, a cycloheptenylene group, a phenylene group, a biphenylene group, a terphenylene group, a pentalenylene group, an indenylene group, a naphthylene group, an azulenylene group, a heptalenylene group, an indacenylene group, an acenaphthylene group, a fluorenylene group, a spiro-bifluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoxazolylene group, a benzimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, an imidazopyridimidinylene group, an imidazopyridinylene group, a pyridoindolylene group, a benzofuropyridinylene group, a benzothienopyridinylene group, a pyrimidoindolylene group, a benzofuropyrimidinylene group, a benzothienopyrimidinylene group, a phenoxazinylene group, a pyridobenzoxazinylene group, or a pyridobenzothiazinylene group, each unsubstituted or substituted with one or more of deuterium, —F, —Cl, —Br, —I, a hydroxyl group, a cyano group, a nitro group, an amino group, a $C_1$-$C_{60}$ alkyl group, a $C_1$-$C_{60}$ alkoxy group, a cyclopentyl group, a cyclohexyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyiidinyl group, a quinoxalinyl group, a quinazolinyl group, a cinnolinyl group, a carbazoyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridimidinyl group, an imidazopyridinyl group, a pyridoindolyl group, a benzofuropyridinyl group, a benzothienopyridinyl group, a pyrimidoindolyl group, a benzofuropyrimidinyl group, a benzothienopyrimidinyl group, a phenoxazinyl group, a pyridobenzoxazinyl group, or a pyridobenzothiazinyl group.

In Formula 1, a3 to a6 may each independently be an integer from 0 to 3.

When a3 is 0, $(L_3)_{a3}$ may be a single bond, when a4 is 0, $(L_4)_{a4}$ may be a single bond, when a5 is 0, $(L_5)_{a5}$ may be a single bond, and when a6 is 0, $(L_6)_{a6}$ may be a single bond.

In one or more embodiments, in Formula 1, a3 to a6 may each be 0.

In Formula 1, $R_1$ to $R_8$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{10}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a $C_2$-$C_{60}$ heteroarylalkyl group unsubstituted or substituted with at least one $R_{10a}$, a $C_2$-$C_{60}$ alkylheteroaryl group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, $—Si(Q_1)(Q_2)(Q_3)$, $—Ge(Q_1)(Q_2)(Q_3)$, $—N(Q_4)(Q_5)$, $—B(Q_6)(Q_7)$, $—P(=O)(Q_6)(Q_9)$, or $—P(Q_8)(Q_9)$, or $R_7$ and $R_8$ may optionally be connected to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, wherein Ria is as defined in this specification.

In one or more embodiments, in Formula 1, $R_1$ to $R_6$ may each independently be:

hydrogen, deuterium, —F, —Cl, —Br, —I, a hydroxyl group, a cyano group, a nitro group, or an amino group;

a $C_1$-$C_{60}$ alkyl group or a $C_1$-$C_6$ alkoxy group, each unsubstituted or substituted with one or more of deuterium, —F, —Cl, —Br, —I, a hydroxyl group, a cyano group, a nitro group, or an amino group;

a cyclopentyl group, a cyclohexyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridimidinyl group, an imidazopyridinyl group, a pyridoindolyl group, a benzofuropyridinyl group, a benzothienopyridinyl group, a pyrimidoindolyl group, a benzofuropyrimidinyl group, a benzothienopyrimidinyl group, a phenoxazinyl group, a pyridobenzoxazinyl group, or a pyridobenzothiazinyl group, each unsubstituted or substituted with one or more of deuterium, —F, —Cl, —Br, —I, a hydroxyl group, a cyano group, a nitro group, an amino group, a $C_1$-$C_{60}$ alkyl group, a $C_1$-$C_{60}$ alkoxy group, a cyclopentyl group, a cyclohexyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridimidinyl group, an imidazopyridinyl group, a pyridoindolyl group, a benzofuropyridinyl group, a benzothienopyridinyl group, a pyrimidoindolyl group, a benzofuropyrimidinyl group, a benzothienopyrimidinyl group, a phenoxazinyl group, a pyridobenzoxazinyl group, or a pyridobenzothiazinyl group; or —$Si(Q_1)(Q_2)(Q_3)$, —$N(Q_4)(Q_5)$, or —$B(Q_6)(Q_7)$, wherein $Q_1$ to $Q_7$ may each independently be hydrogen, deuterium, a $C_1$-$C_{10}$ alkyl group, a phenyl group, a biphenyl group, a naphthyl group, a fluorenyl group, a carbazolyl group, a dibenzofuranyl group, a dibenzothiophenyl group, a pyridinyl group, a pyrimidinyl group, a pyrazinyl group, or a triazinyl group.

In one or more embodiments, in Formula 1, $R_1$ to $R_8$ may each independently be:

hydrogen, deuterium, —F, a cyano group, a nitro group, —$CH_3$, —$CD_3$, —$CD_2H$, —$CDH_2$, —$CF_3$, —$CF_2H$, —$CFH_2$, a group represented by one of Formulae 9-1 to 9-26, a group represented by one of Formulae 10-1 to 10-256, —$Si(Q_1)(Q_2)(Q_3)$, —$N(Q_4)(Q_5)$, or —$B(Q_6)(Q_7)$, but embodiments of the present disclosure are not limited thereto:

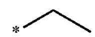
9-1

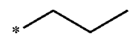
9-2

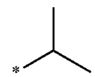
9-3

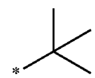
9-4

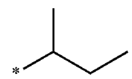
9-5

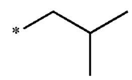
9-6

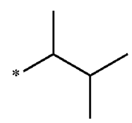
9-7

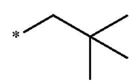
9-8

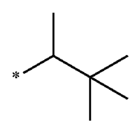
9-9

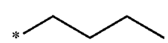
9-10

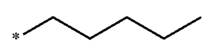
9-11

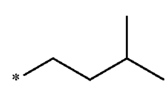
9-12

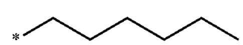
9-13

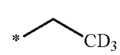

9-14

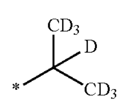

9-15

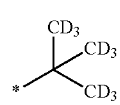

9-16

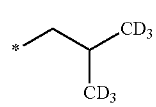

9-17

-continued
9-18
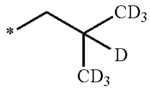
9-19
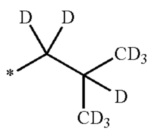
9-20
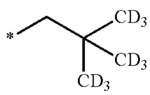
9-21
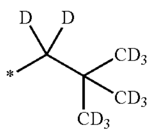
9-22
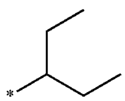
9-23
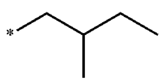
9-24
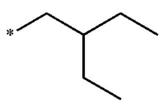
9-25
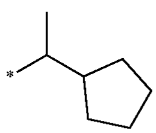
9-26
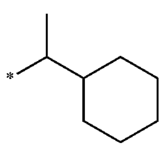
10-1
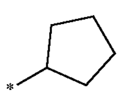
10-2
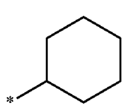
10-3
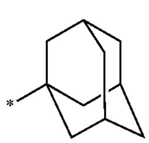
10-4
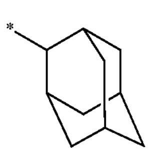
-continued
10-5
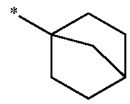
10-6
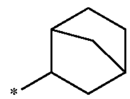
10-7
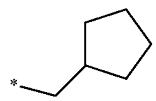
10-8
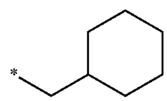
10-9
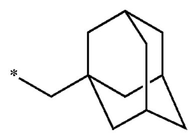
10-10
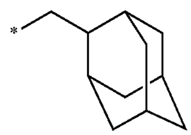
10-11
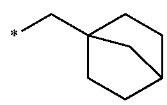
10-12
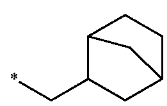
10-13
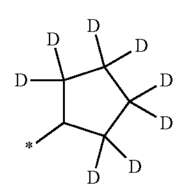
10-14
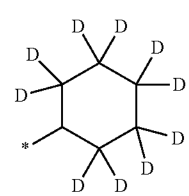
10-15
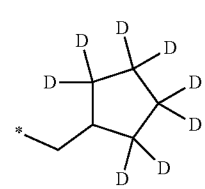

-continued
10-16
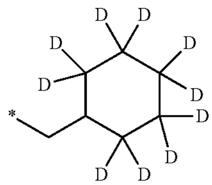
10-17
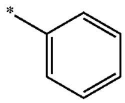
10-18
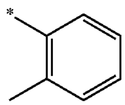
10-19
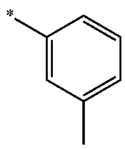
10-20
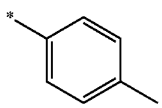
10-21
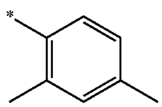
10-22
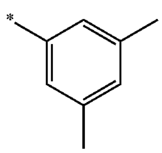
10-23
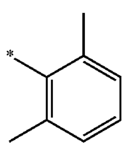
10-24
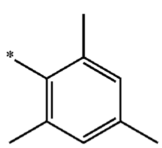
10-25
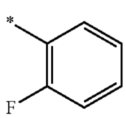
10-26
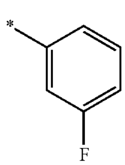
-continued
10-27
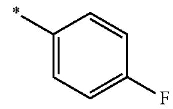
10-28
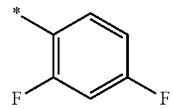
10-29
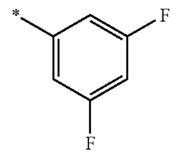
10-30
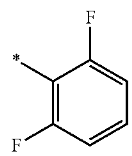
10-31
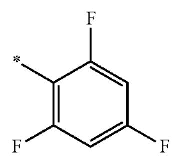
10-32
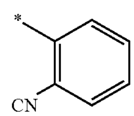
10-33
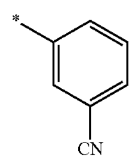
10-34
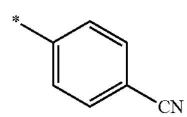
10-35
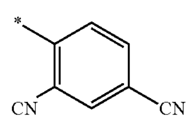
10-36
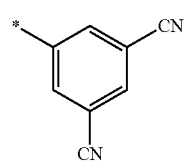
10-37
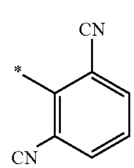

-continued
10-38
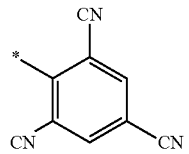
10-39
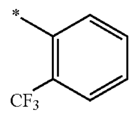
10-40
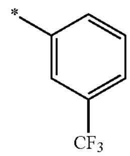
10-41
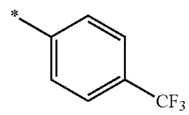
10-42
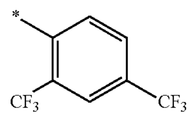
10-43
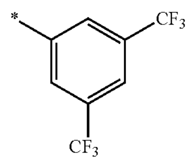
10-44
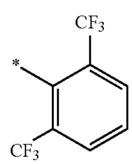
10-45
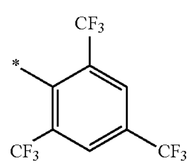
10-46
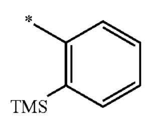
10-47
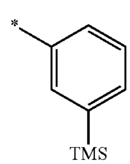
10-48
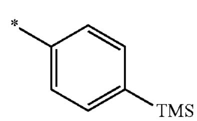
-continued
10-49
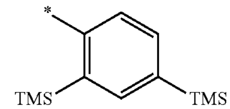
10-50
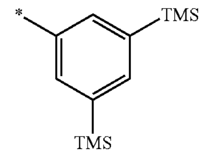
10-51
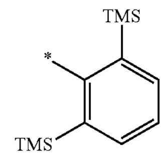
10-52
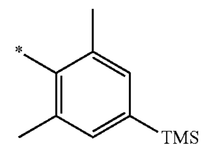
10-53
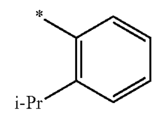
10-54
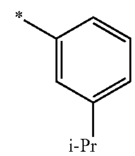
10-55
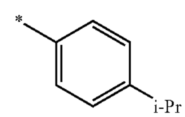
10-56
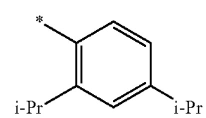
10-57
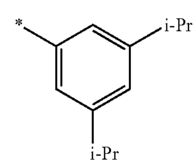
10-58
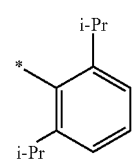
10-59
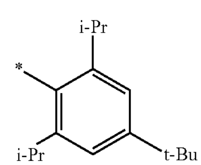

-continued
10-60
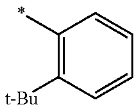
10-61
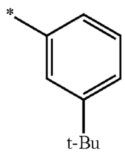
10-62
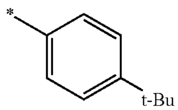
10-63
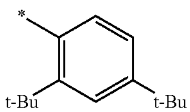
10-64
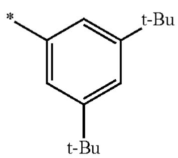
10-65
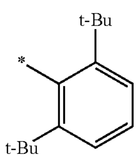
10-66
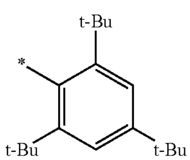
10-67
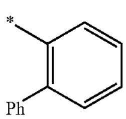
10-68
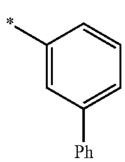
10-69
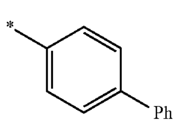
10-70
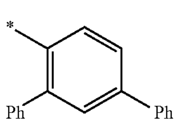
-continued
10-71
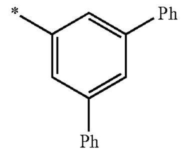
10-72
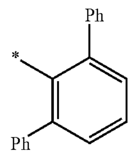
10-73
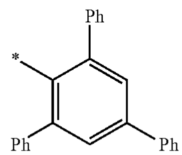
10-74
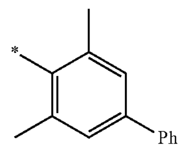
10-75
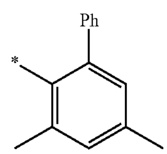
10-76
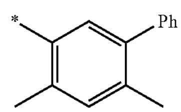
10-77
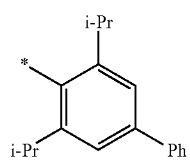
10-78
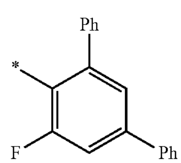
10-79
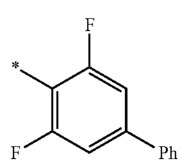
10-80
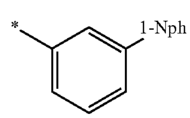
10-81
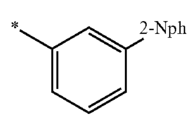

-continued
10-82
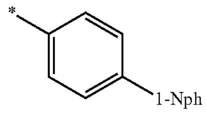
10-83
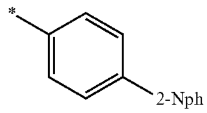
10-84
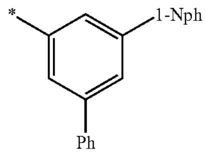
10-85
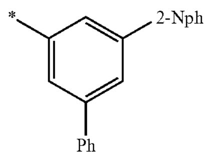
10-86
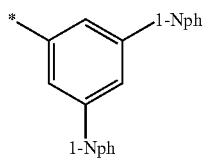
10-87
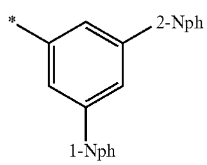
10-88
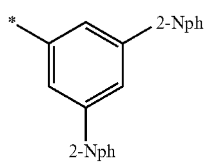
10-89
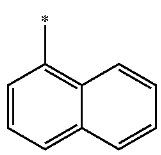
10-90
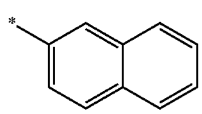
10-91
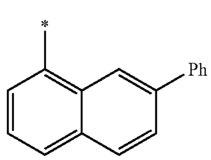
-continued
10-92
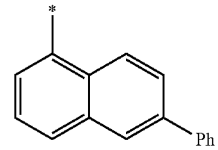
10-93
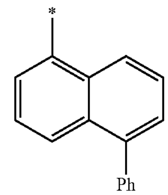
10-94
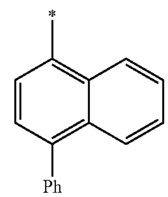
10-95
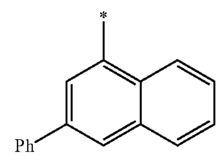
10-96
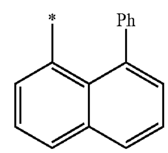
10-97
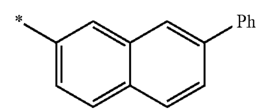
10-98
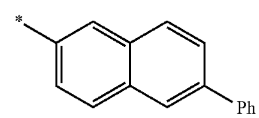
10-99
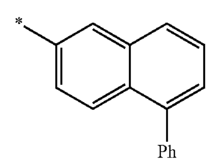
10-100
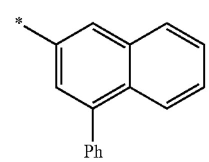
10-101
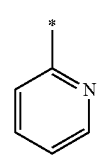

-continued
10-102
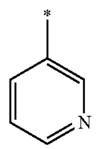
10-103
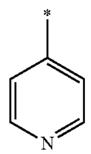
10-104
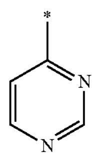
10-105
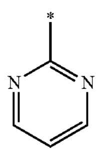
10-106
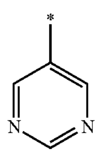
10-107
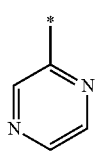
10-108
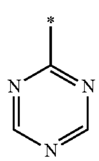
10-109
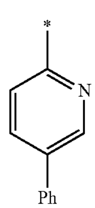
10-110
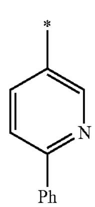
-continued
10-111
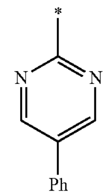
10-112
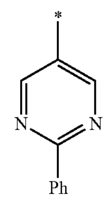
10-113
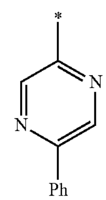
10-114
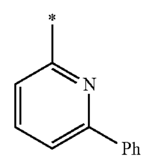
10-115
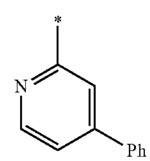
10-116
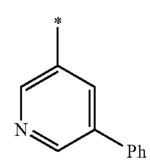
10-117
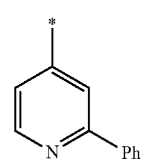
10-118
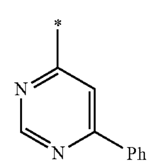
10-119
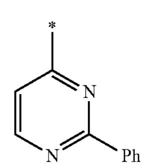

-continued
10-120
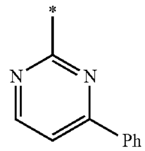
10-121
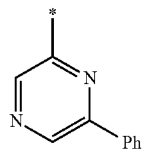
10-122
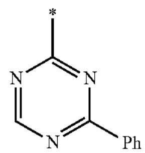
10-123
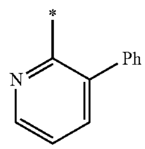
10-124
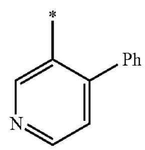
10-125
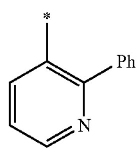
10-126
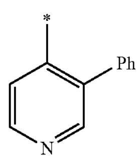
10-127
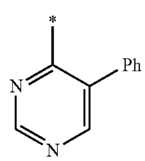
10-128
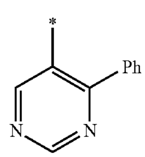
10-129
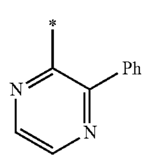
-continued
10-130
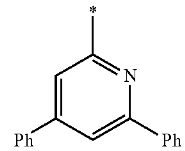
10-131
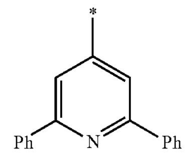
10-132
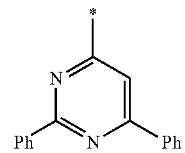
10-133
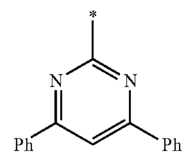
10-134
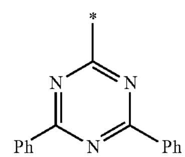
10-135
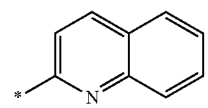
10-136
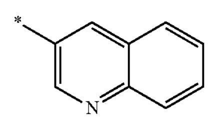
10-137
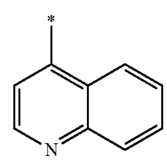
10-138
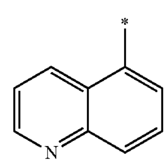
10-139
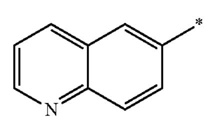
10-140
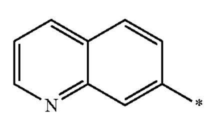

-continued
10-141
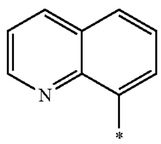
10-142
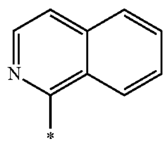
10-143
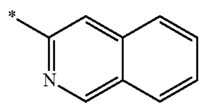
10-144
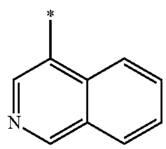
10-145
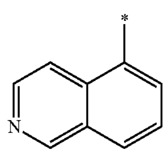
10-146
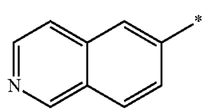
10-147
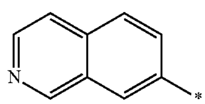
10-148
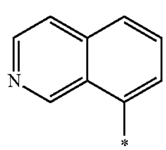
10-149
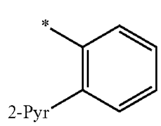
10-150
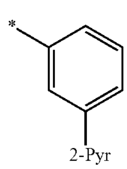
10-151
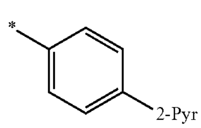
-continued
10-152
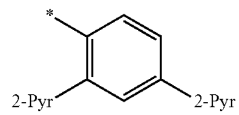
10-153
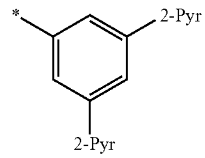
10-154
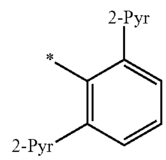
10-155
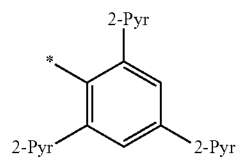
10-156
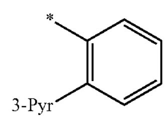
10-157
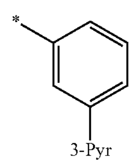
10-158
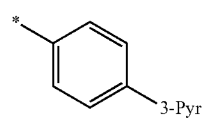
10-159
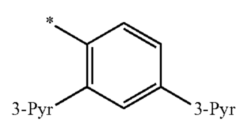
10-160
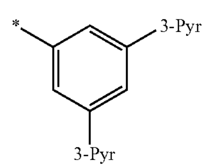
10-161
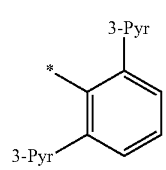

-continued
10-162
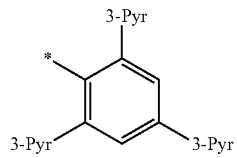
10-163
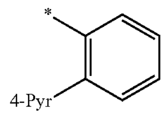
10-164
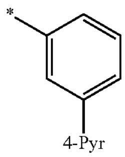
10-165
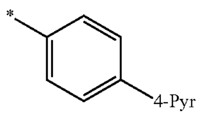
10-166
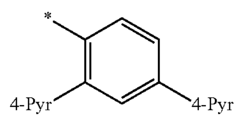
10-167
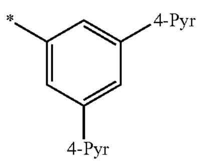
10-168
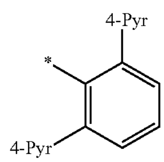
10-169
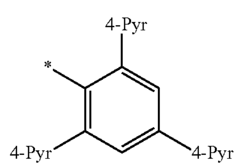
10-170
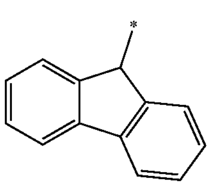
10-171
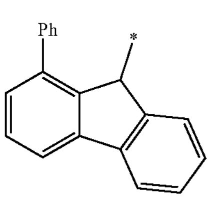
-continued
10-172
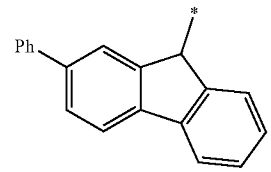
10-173
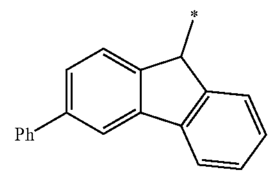
10-174
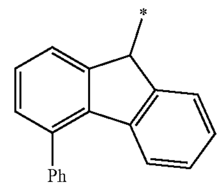
10-175
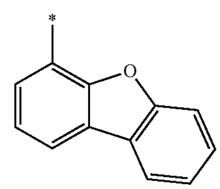
10-176
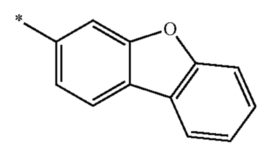
10-177
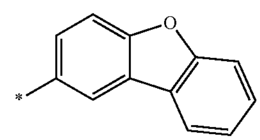
10-178
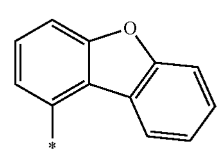
10-179
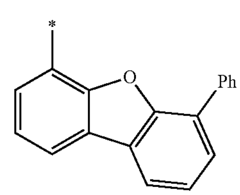
10-180
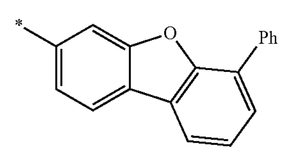

-continued
10-181
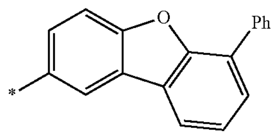
10-182
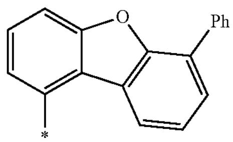
10-183
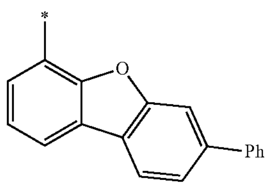
10-184
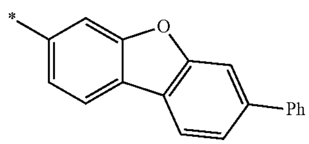
10-185
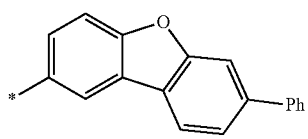
10-186
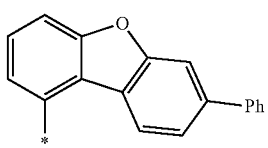
10-187
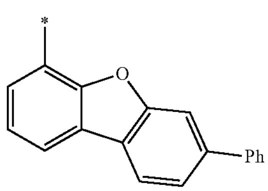
10-188
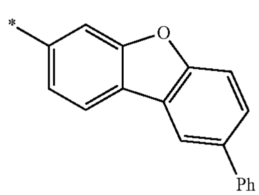
10-189
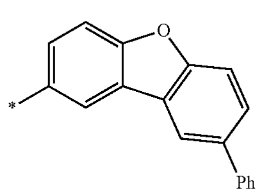
-continued
10-190
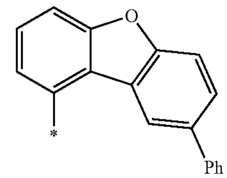
10-191
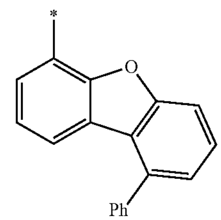
10-192
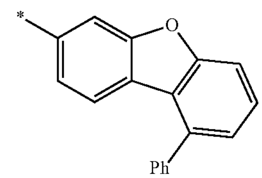
10-193
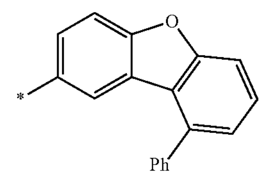
10-194
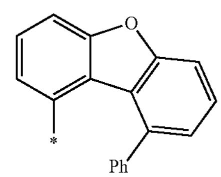
10-195
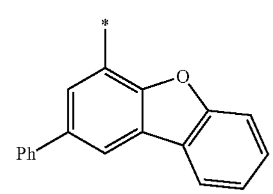
10-196
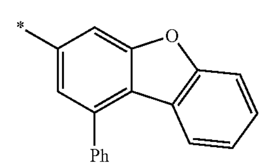
10-197
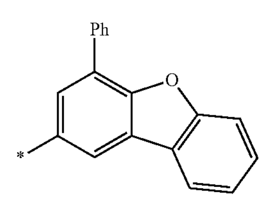

-continued
10-198
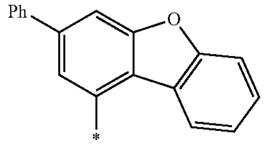
10-199
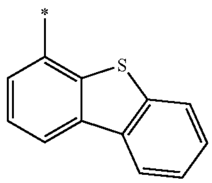
10-200
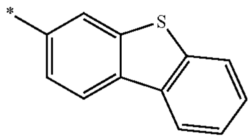
10-201
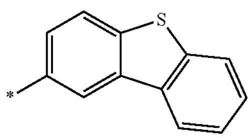
10-202
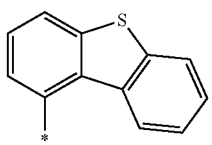
10-203
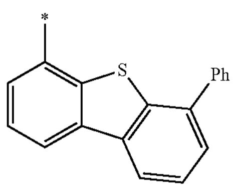
10-204
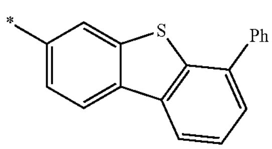
10-205
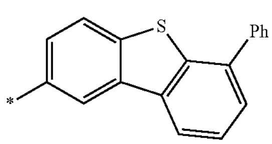
10-206
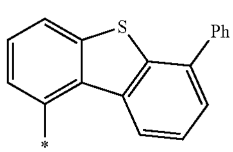
10-207
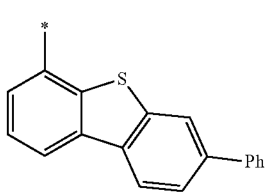
-continued
10-208
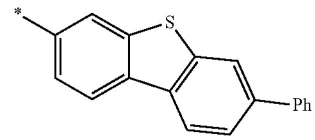
10-209
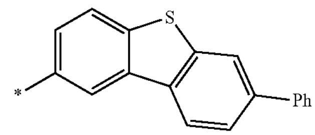
10-210
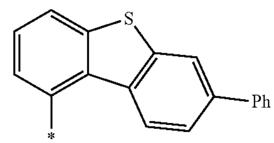
10-211
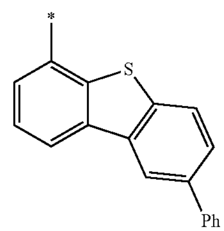
10-212
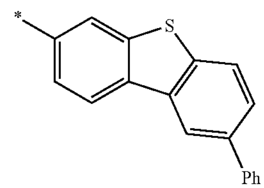
10-213
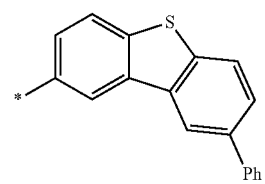
10-214
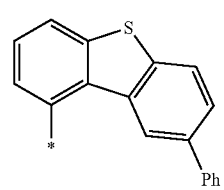
10-215
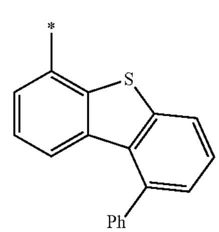

-continued
10-216
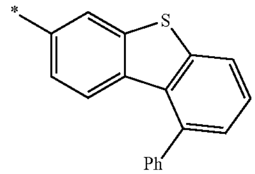
10-217
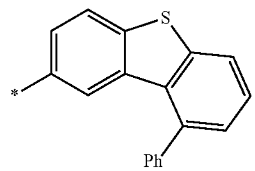
10-218
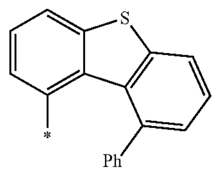
10-219
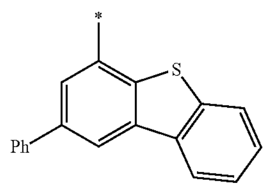
10-220
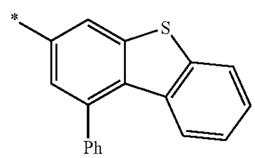
10-221
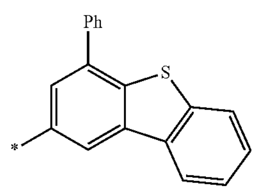
10-222
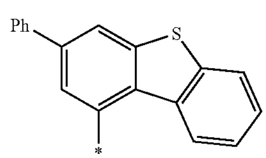
10-223
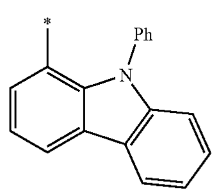
10-224
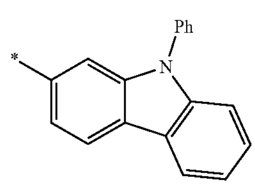
-continued
10-225
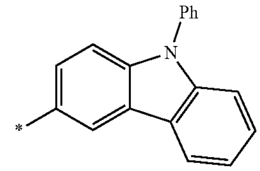
10-226
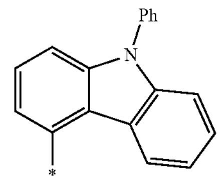
10-227
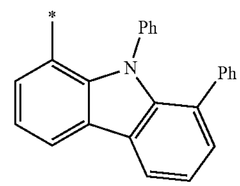
10-228
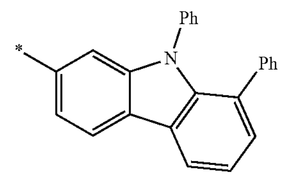
10-229
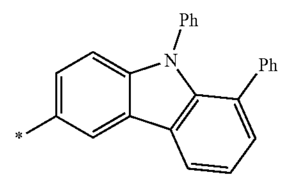
10-230
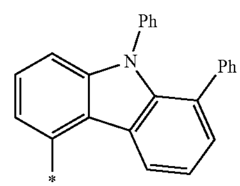
10-231
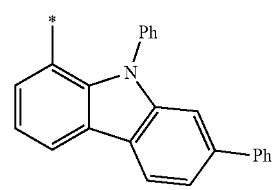
10-232
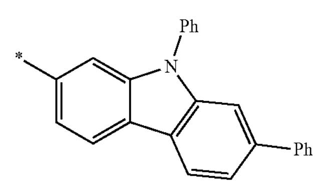

-continued
10-233
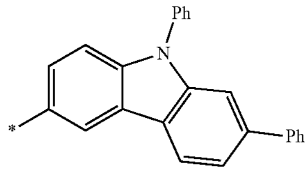
10-234
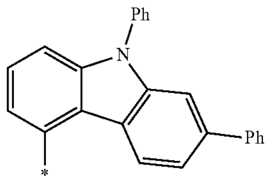
10-235
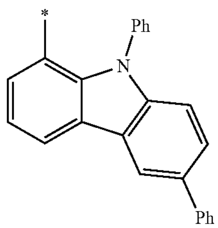
10-236
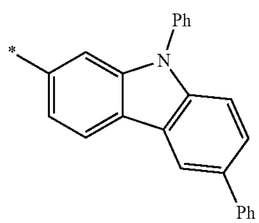
10-237
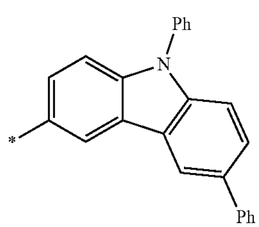
10-238
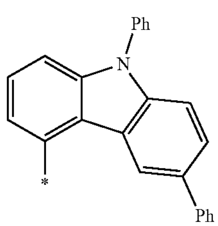
10-239
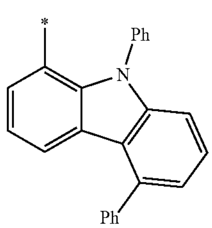
-continued
10-240
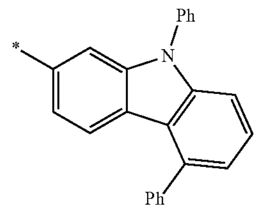
10-241
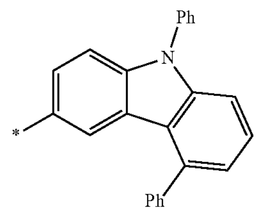
10-242
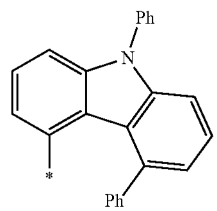
10-243
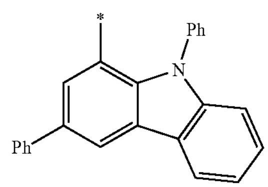
10-244
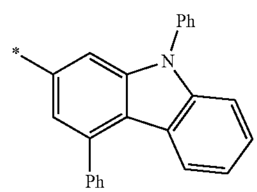
10-245
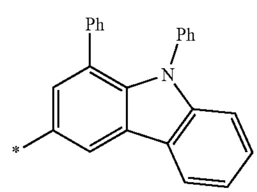
10-246
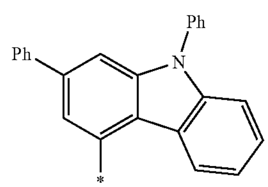
10--247
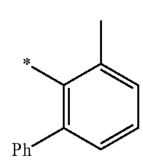

-continued 10-248

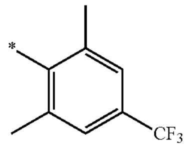

10-249

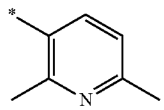

10-250

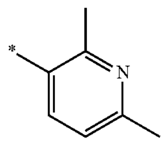

10-251

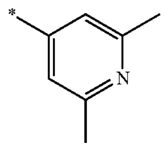

10-252

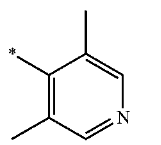

10-253

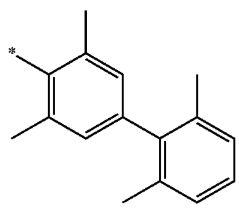

10-254

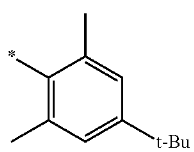

10-255

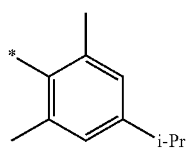

10-256

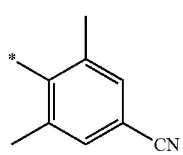

wherein $Q_1$ to $Q_7$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CH_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with one or more of deuterium, a $C_1$ to $C_{10}$ alkyl group, or a phenyl group, and in Formulae 9-1 to 9-26 and 10-1 to 10-256,

* indicates a binding site to a neighboring atom, i-Pr is an isopropyl group, t-Bu is a t-butyl group, Ph is a phenyl group, 1-Nph is a 1-naphthyl group, 2-Nph is a 2-naphthyl group, 2-Pyr is a 2-pyridyl group, 3-Pyr is a 3-pyridyl group, 4-Pyr is a 4-pyridyl group, and TMS is a trimethylsilyl group.

In one or more embodiments, in Formula 1, $R_1$ to $R_6$ may each independently be:

hydrogen, deuterium, —F, —Cl, —Br, —I, a hydroxyl group, a cyano group, a nitro group, an amino group, or a $C_1$-$C_{10}$ alkoxy group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, or a tert-pentyl group, each unsubstituted or substituted with one or more of deuterium, —F, —Cl, —Br, —I, a hydroxyl group, a cyano group, a nitro group, or an amino group; or a cyclopentyl group, a cyclohexyl group, a phenyl group, a naphthyl group, or a pyridinyl group, each unsubstituted or substituted with one or more of deuterium, —F, —Cl, —Br, —I, a hydroxyl group, a cyano group, a nitro group, an amino group, a $C_1$-$C_{20}$ alkyl group, or a $C_1$-$C_{20}$ alkoxy group.

In one or more embodiments, in Formula 1, $R_7$ and $R_8$ may each independently be:

—F or a $C_1$-$C_{10}$ alkoxy group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, or a tert-pentyl group, each unsubstituted or substituted with one or more of deuterium, —F, —Cl, —Br, —I, a hydroxyl group, a cyano group, a nitro group, or an amino group; or a cyclopentyl group, a cyclohexyl group, a phenyl group, a naphthyl group, or a pyridinyl group, each unsubstituted or substituted with one or more of deuterium, —F, —Cl, —Br, —I, a hydroxyl group, a cyano group, a nitro group, an amino group, a $C_1$-$C_{20}$ alkyl group, or a $C_1$-$C_{20}$ alkoxy group. In Formula 1, b1 and b3 may each independently be an integer from 1 to 4, and b2 and b4 may each independently be an integer from 1 to 3. In Formula 1, n1 may be 0 or 1, and when n1 is 0, the group represented by the structure:

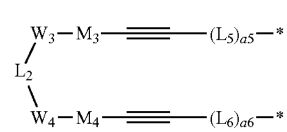

does not exist.

In one or more embodiments, in Formula 1, when n1 is 0, a group represented by

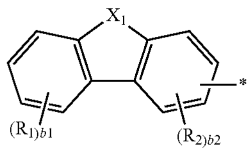

may be a group represented by one of Formulae CY1-1 to CY1-4, or a group represented by

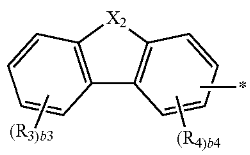

may be a group represented by one of Formulae CY2-1 to CY2-4:

CY1-1

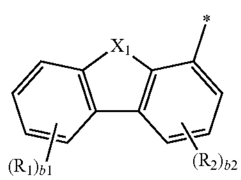

CY1-2

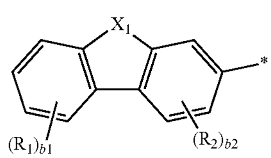

CY1-3

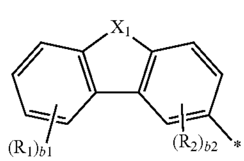

CY1-4

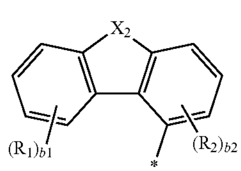

CY2-1

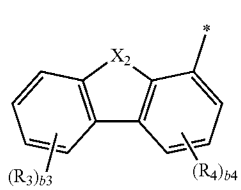

-continued

CY2-2

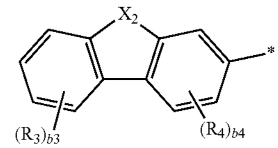

CY2-3

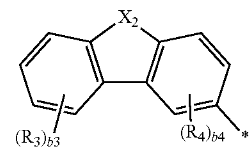

CY2-4

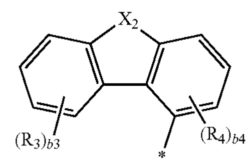

In Formulae CY1-1 to CY1-4 and CY2-1 to CY2-4, $X_1$, $X_2$, $R_1$ to $R_4$, and b1 to b4 are the same as described in the present specification, and

* indicates a binding site to a neighboring atom.

In one or more embodiments, in Formula 1, when n1 is 1, a group represented by:

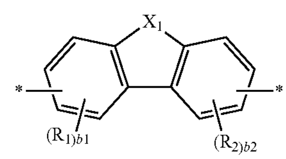

may be a group represented by one of Formulae CY1-5 to CY1-7, or a group represented by:

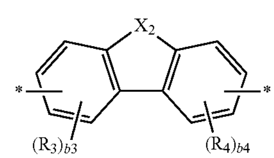

may be a group represented by one of Formulae CY2-5 to CY2-7:

CY1-5

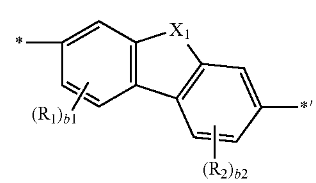

-continued
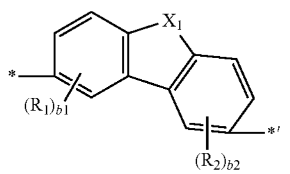
CY1-6
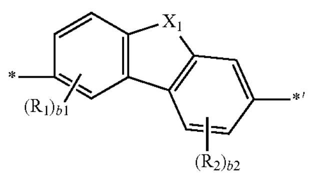
CY1-7
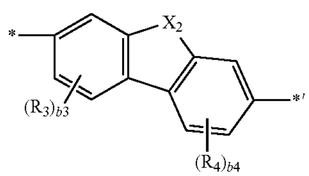
CY2-5
-continued
CY2-6
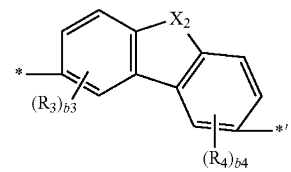
CY2-7
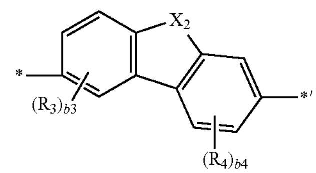
In Formulae CY1-5 to CY1-7 and CY2-5 to CY2-7,
$X_1$, $X_2$, $R_1$ to $R_4$, b2, and b4 are the same as described in the present specification,
b1 and b3 are each independently an integer from 1 to 3, and
* and *' each indicate a binding site to a neighboring atom.
In one or more embodiments, the organometallic compound may be represented by Formula 1-1 or 1-2:
Formula 1-1
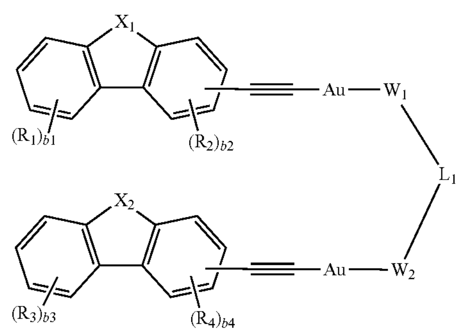
Formula 1-2
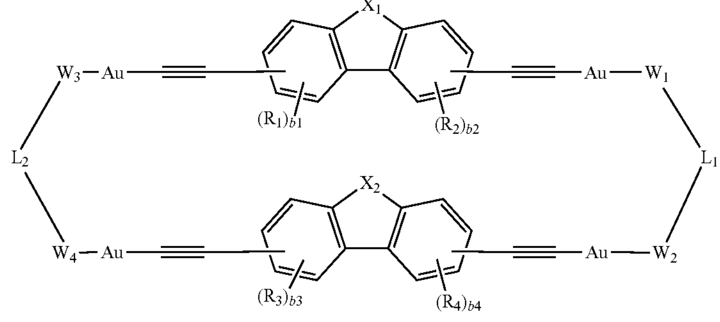

In Formula 1-1 or 1-2,
$W_1$ to $W_4$, $X_1$, $X_2$, $L_1$, $L_2$, $R_1$ to $R_4$, and b1 to b4 are the same as described in the present specification.
In one or more embodiments, the organometallic compound may be represented by one of Compounds 1 to 810, but embodiments of the present disclosure are not limited thereto:
1
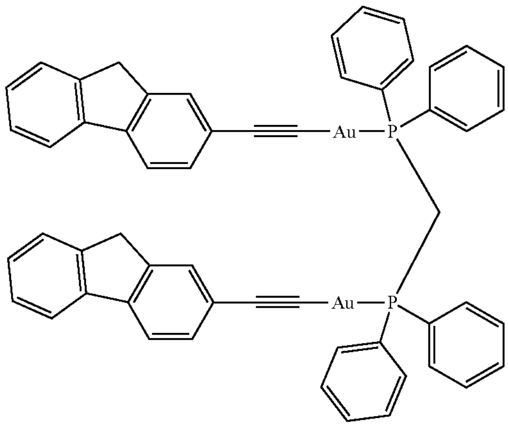
2
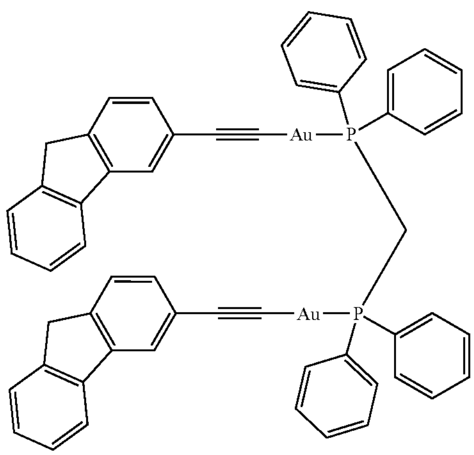
3
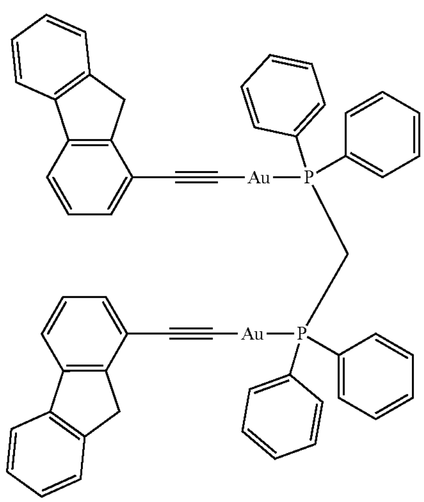
-continued
4
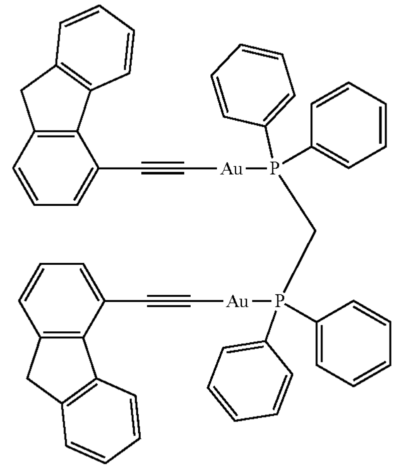
5
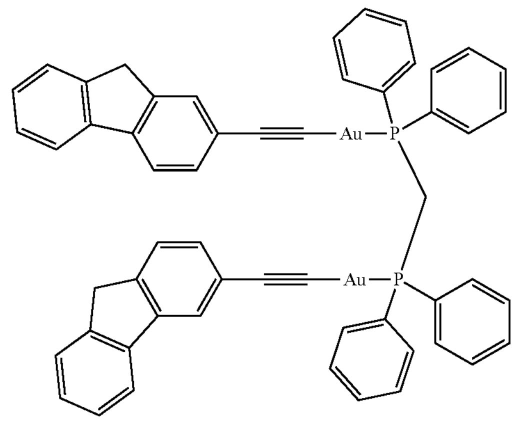
6
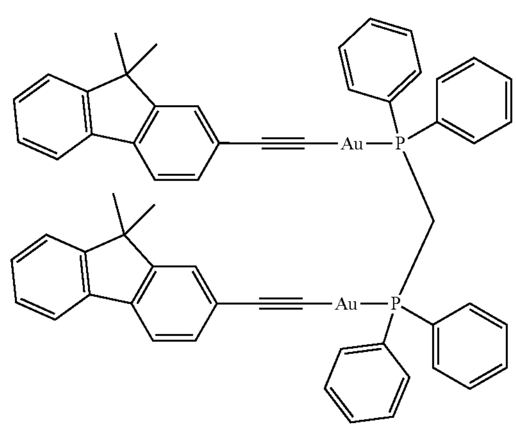

-continued
7
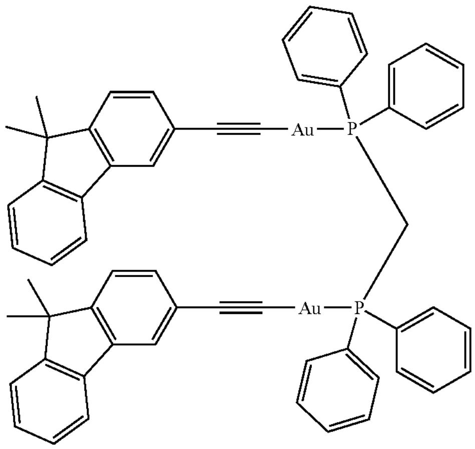
8
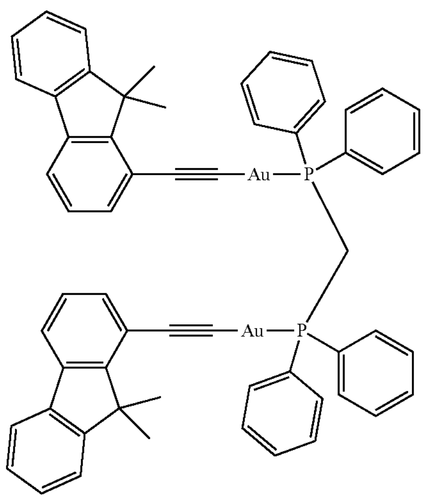
9
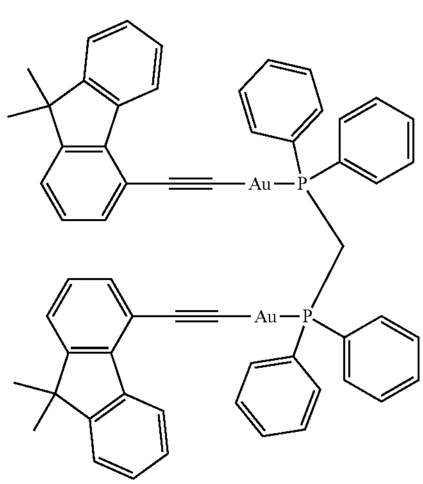
-continued
10
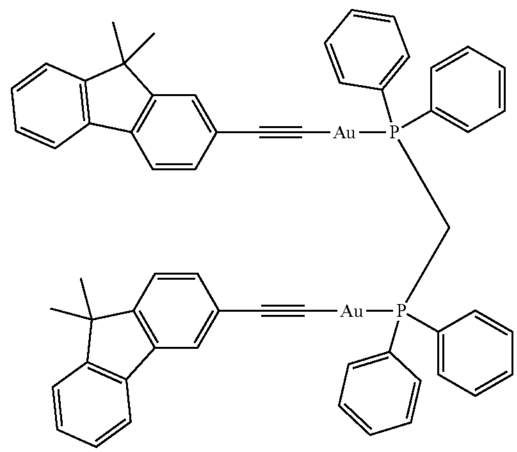
11
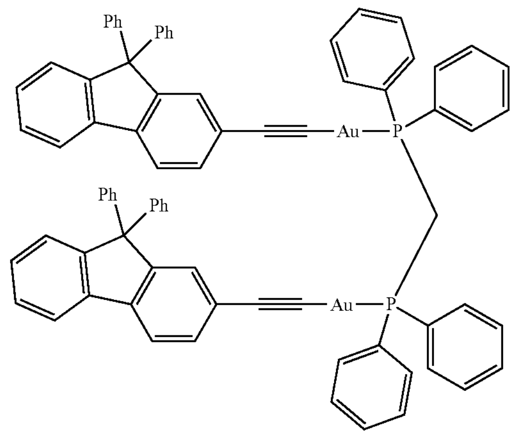
12
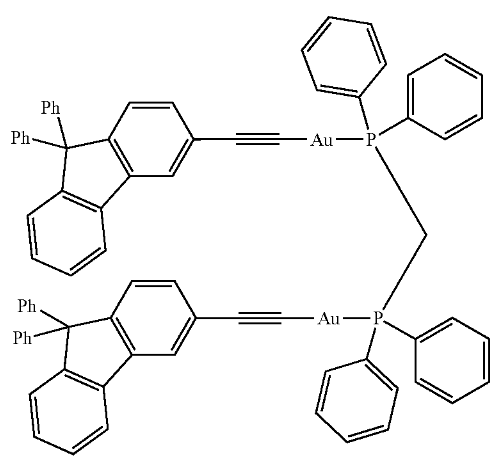

13
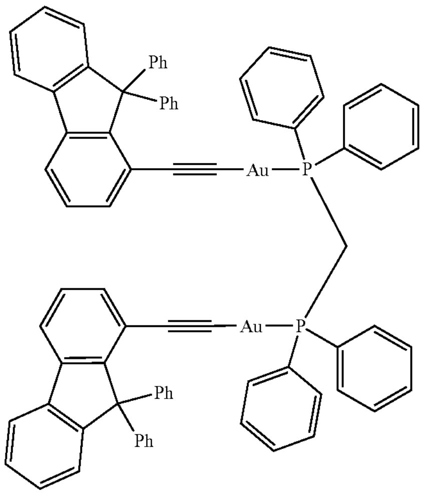
14
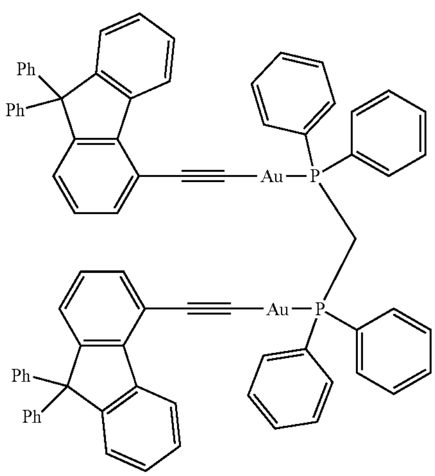
15
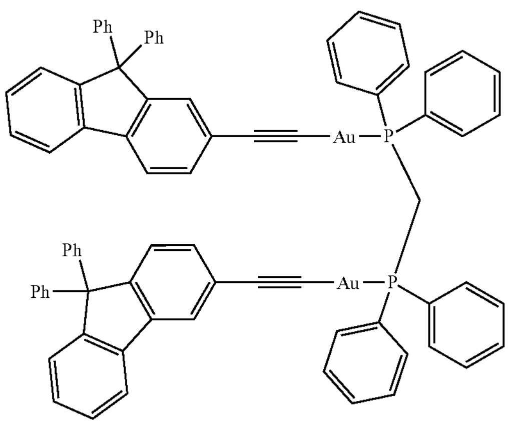
16
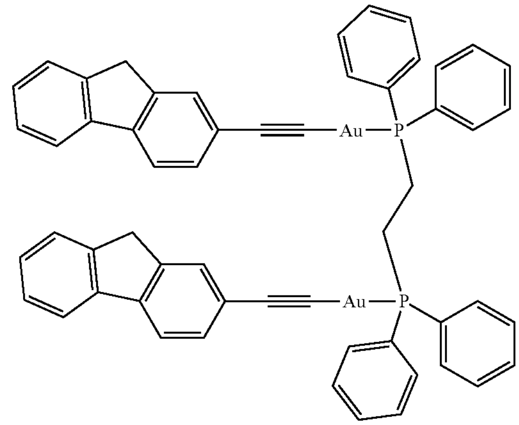
17
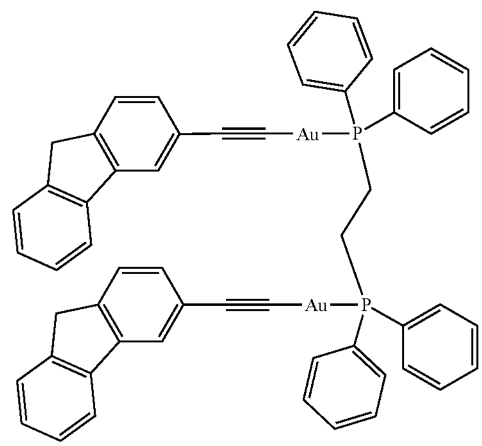
18
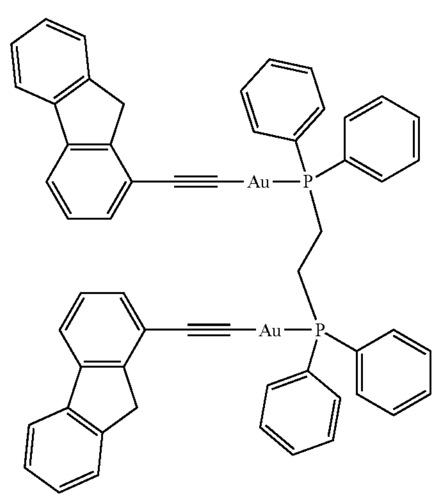

19
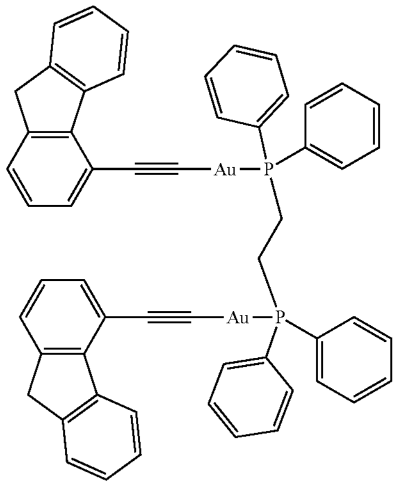
20
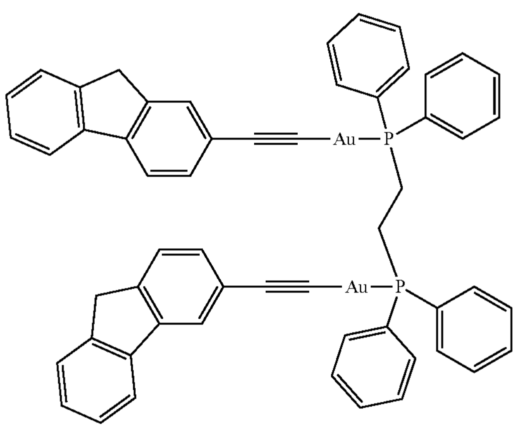
21
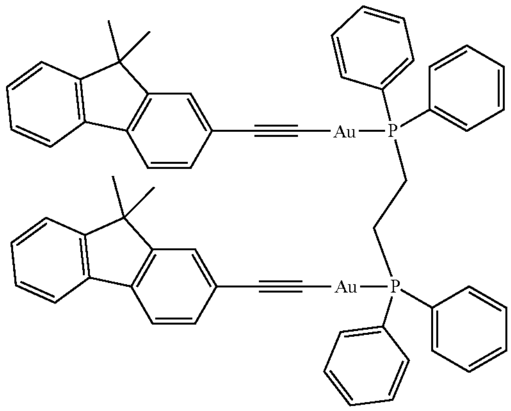
22
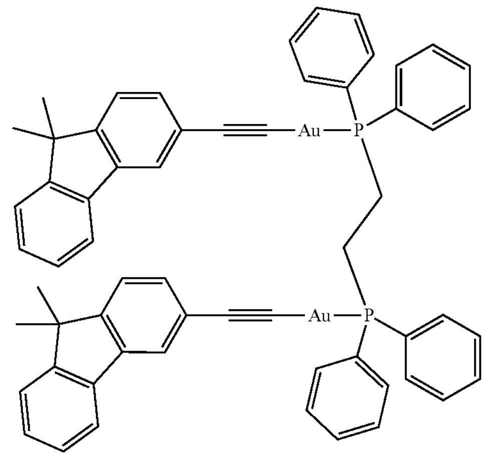
23
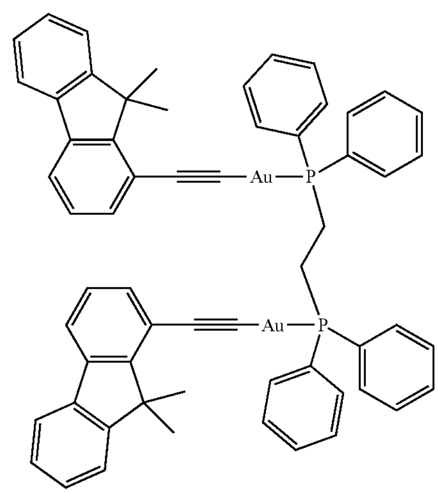
24
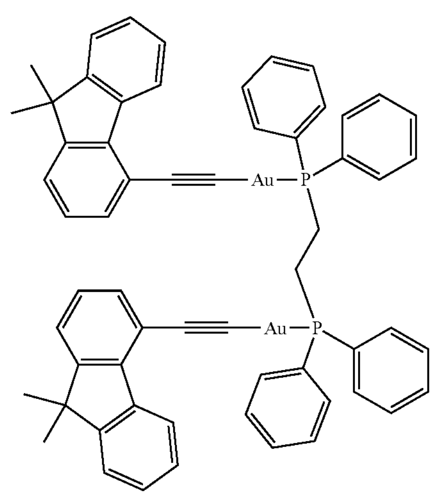

-continued
25
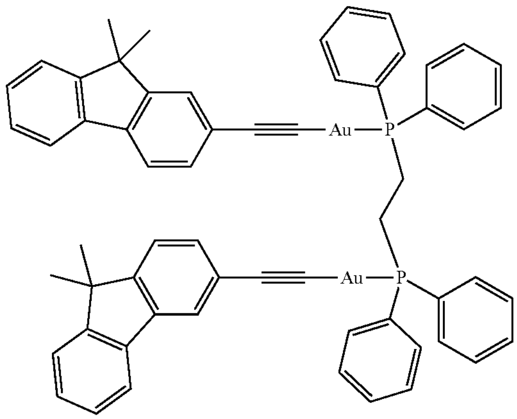
26
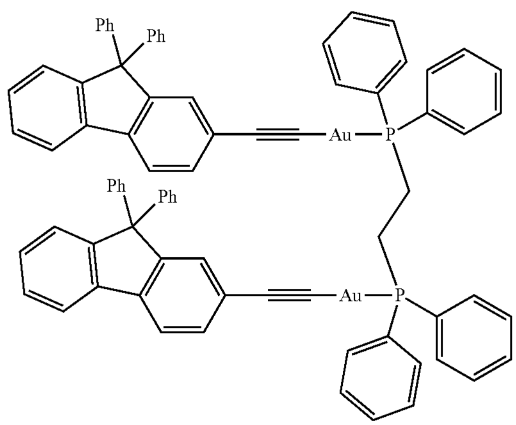
27
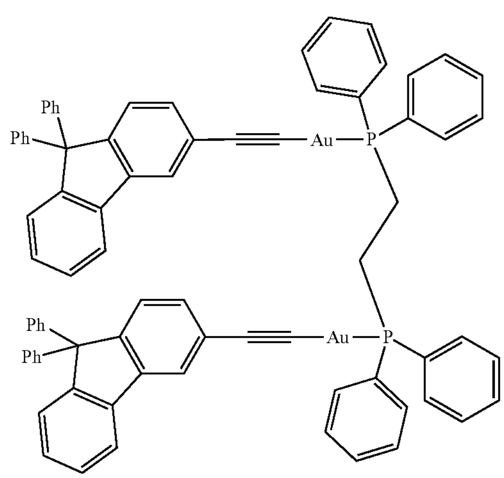
-continued
28
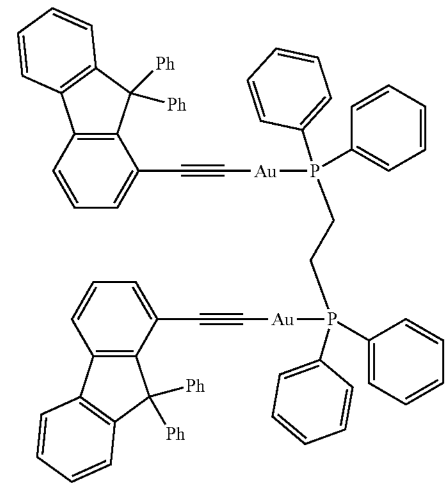
29
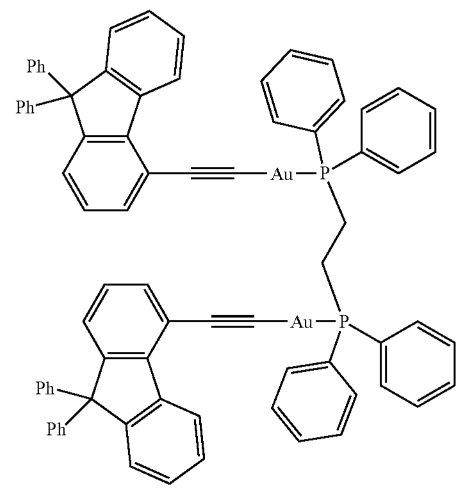
30
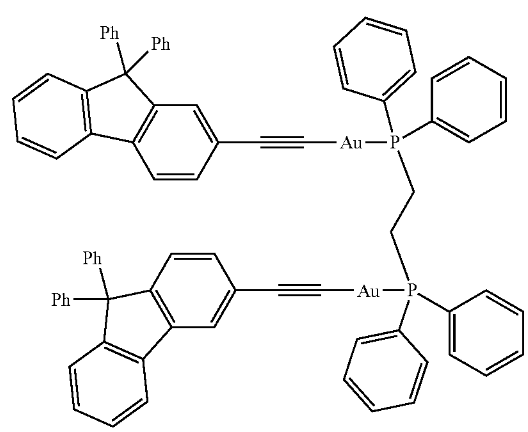

31
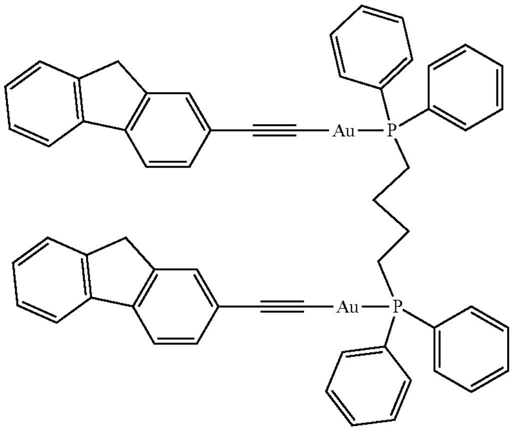
32
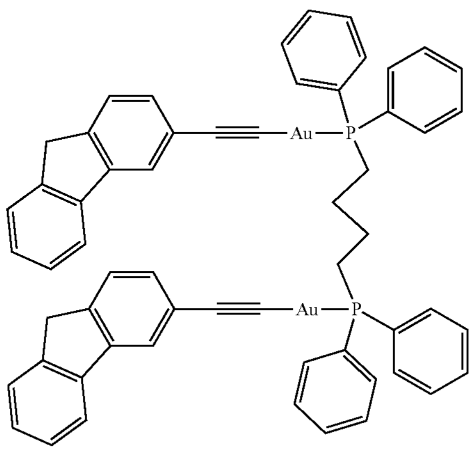
33
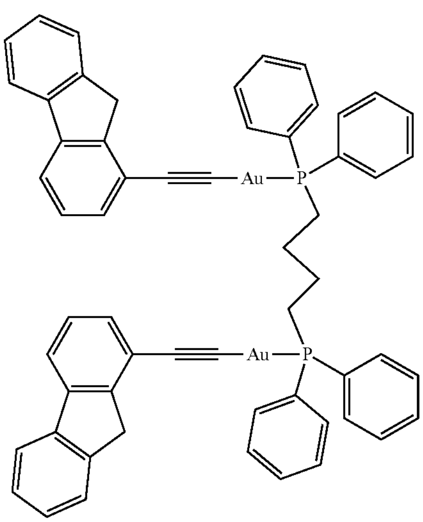
34
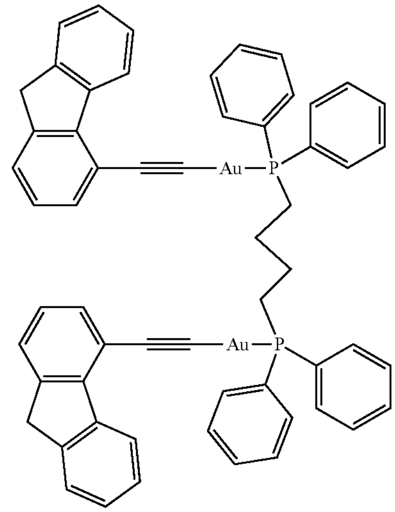
35
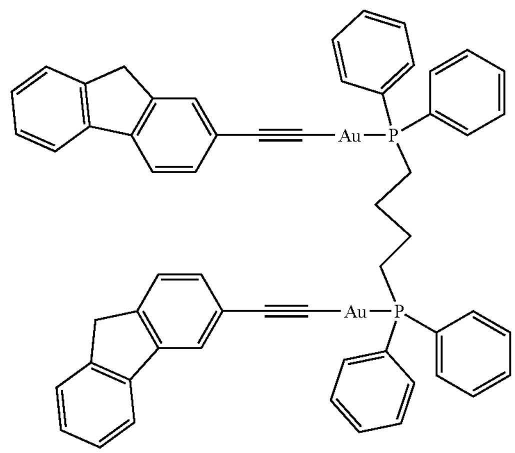
36
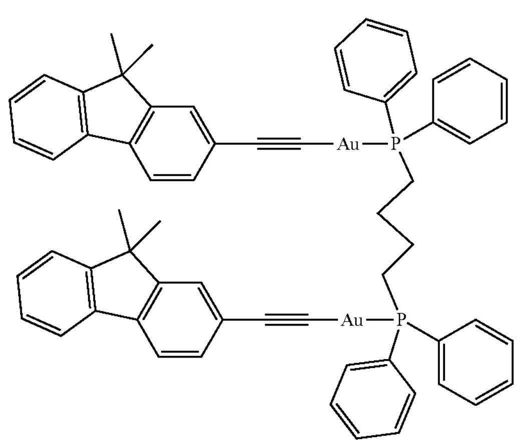

-continued
37
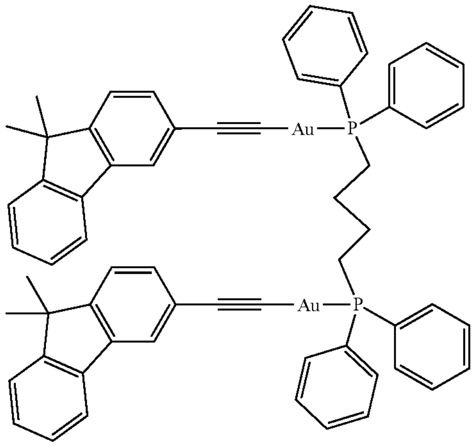
38
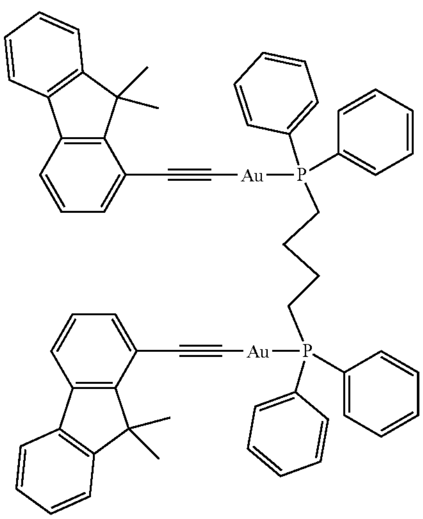
39
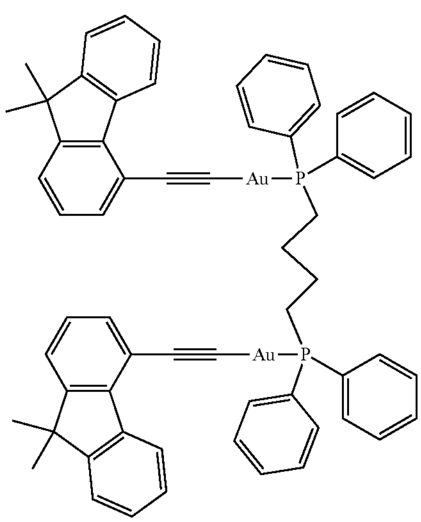
-continued
40
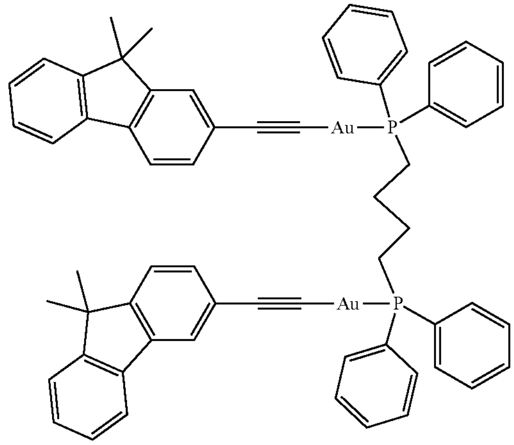
41
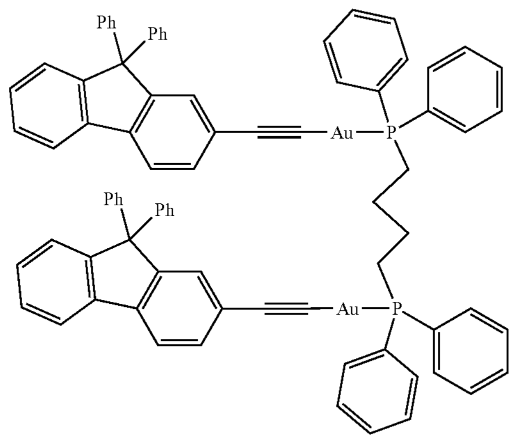
42
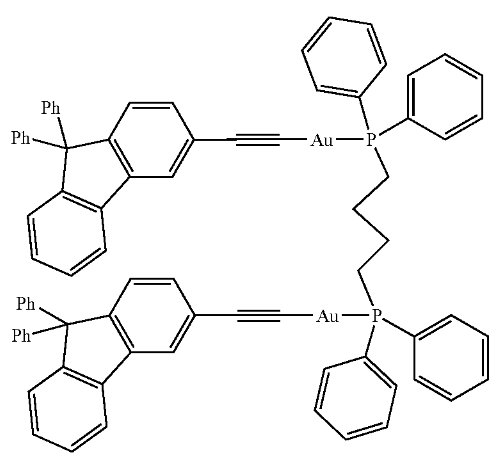

-continued
43
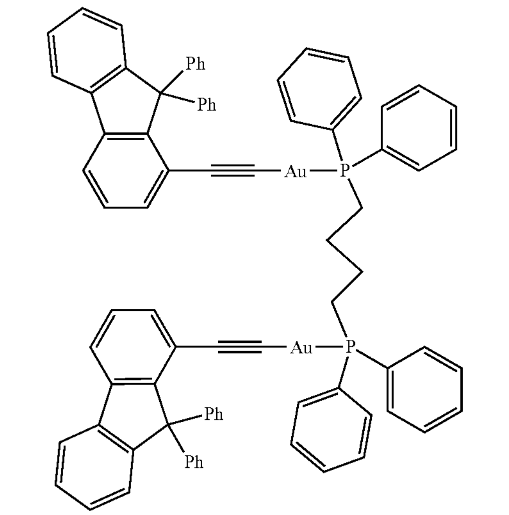
44
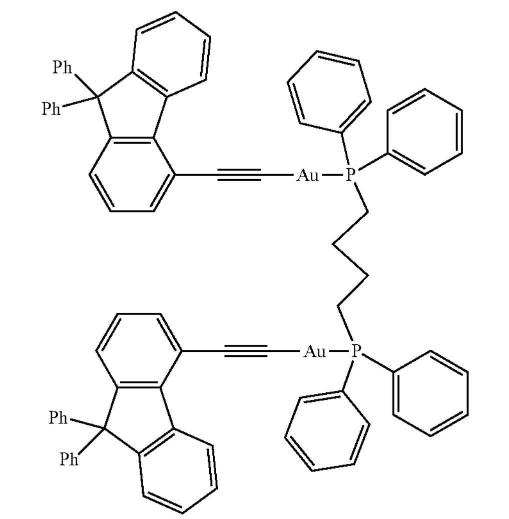
45
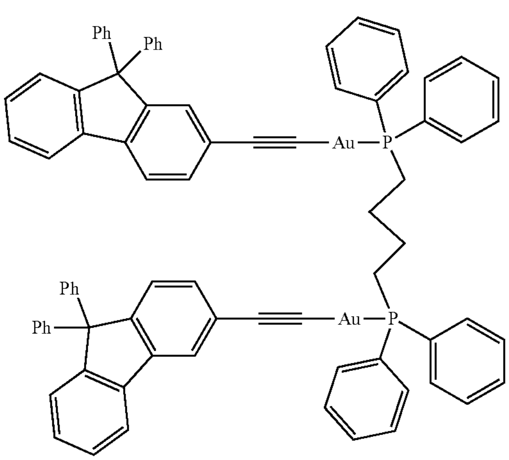
46
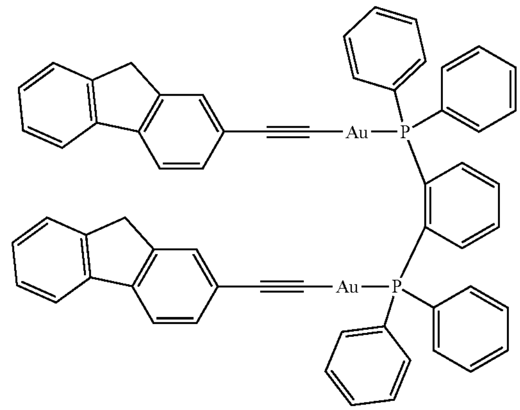
47
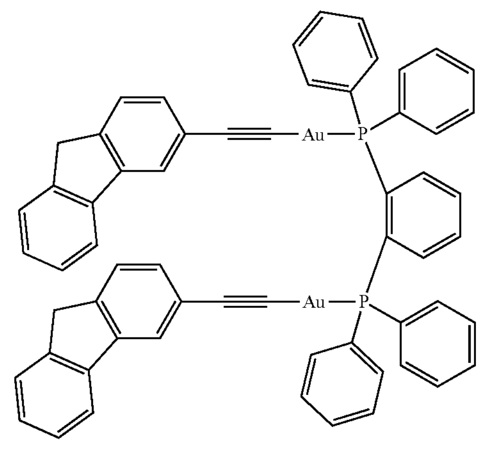
48
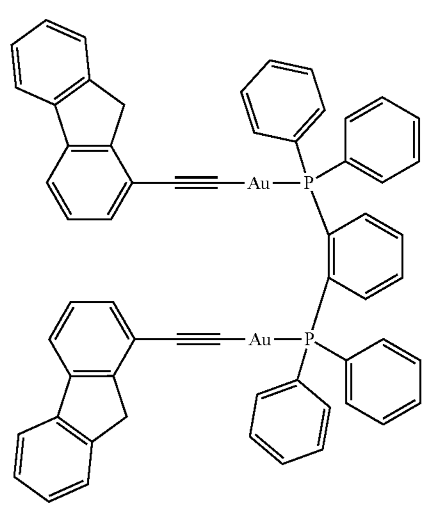

49
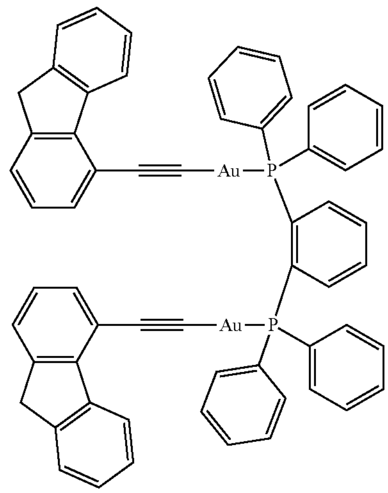
50
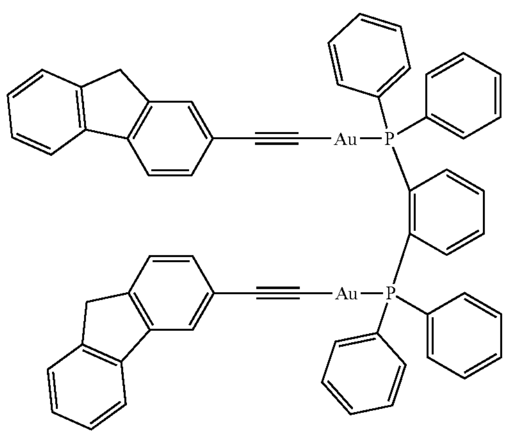
51
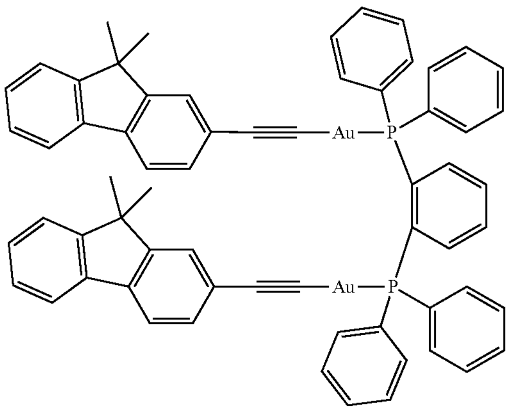
52
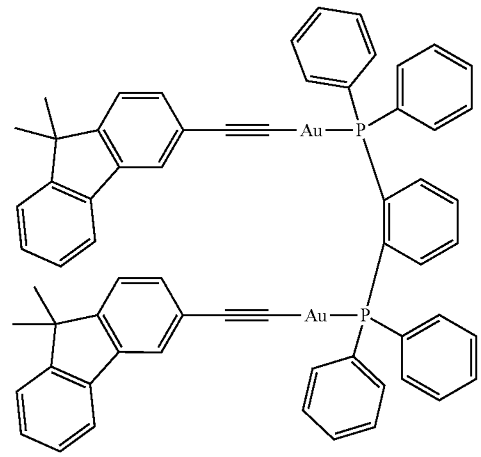
53
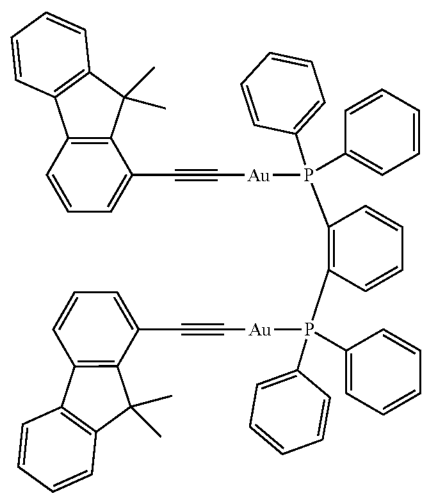
54
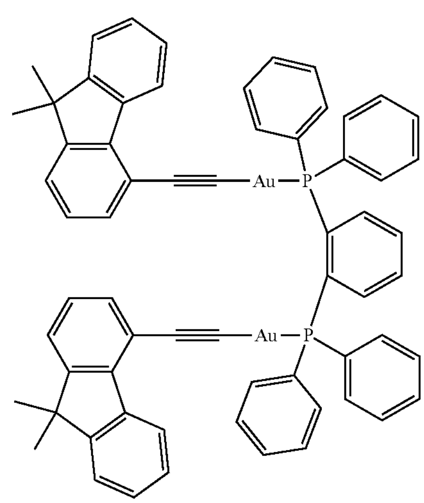

-continued
55
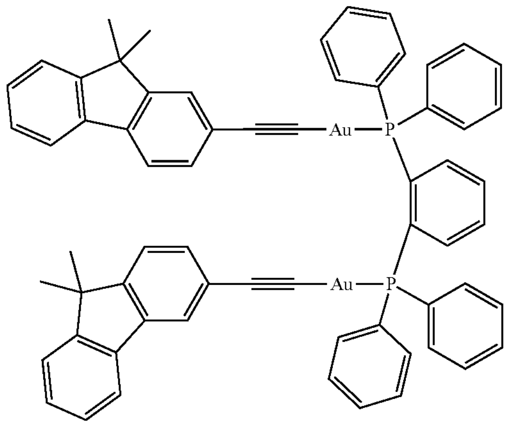
56
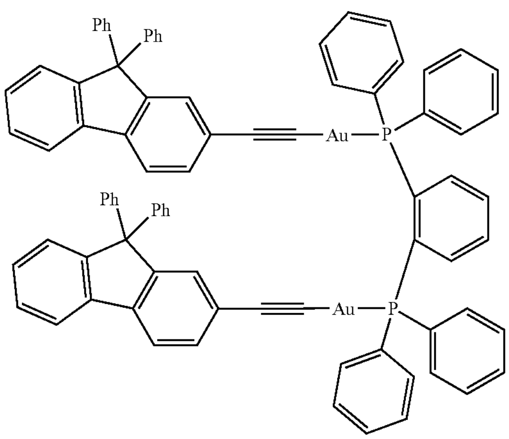
57
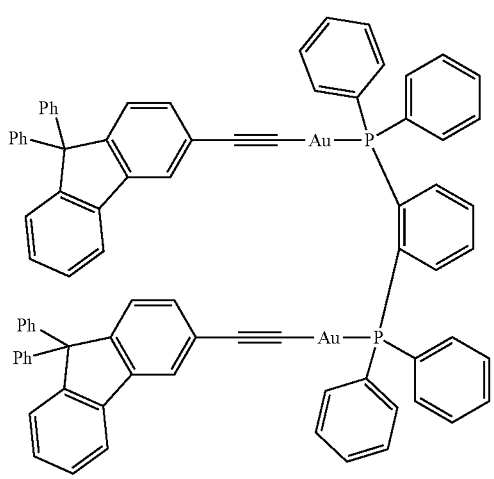
-continued
58
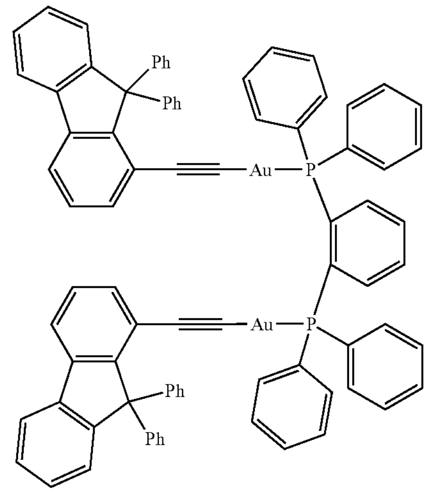
59
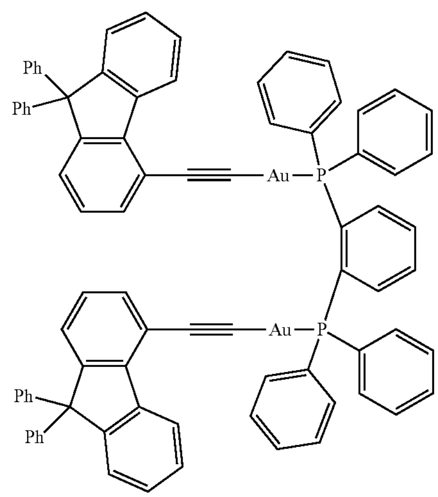
60
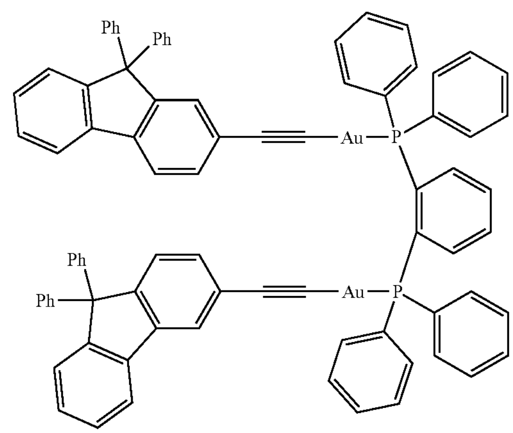

61
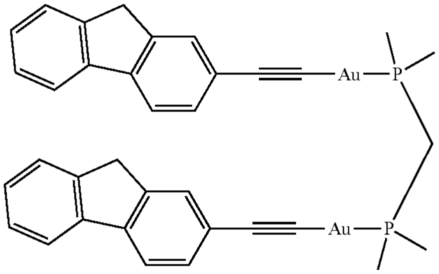
62
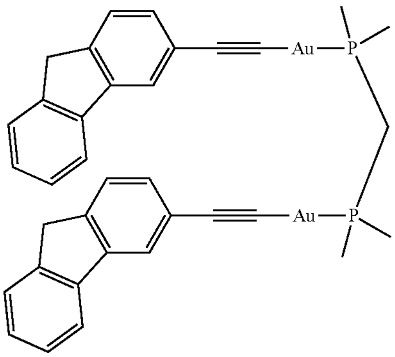
63
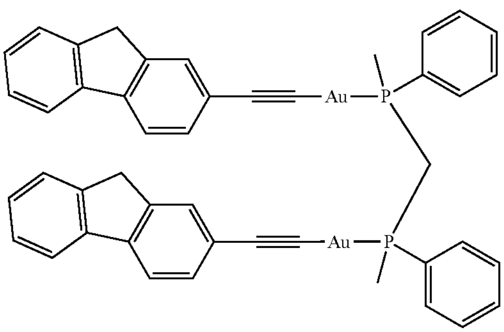
64
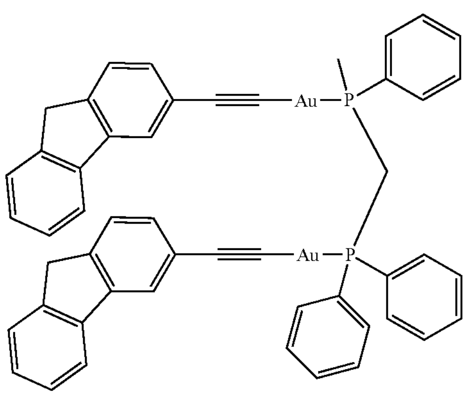
65
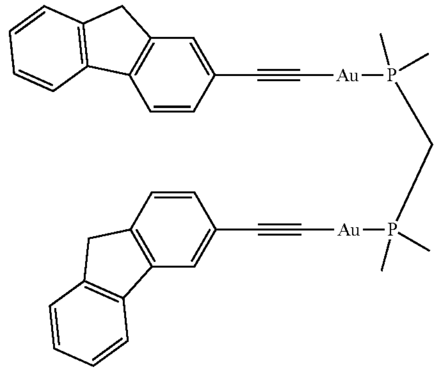
66
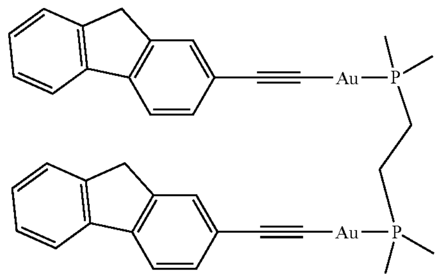
67
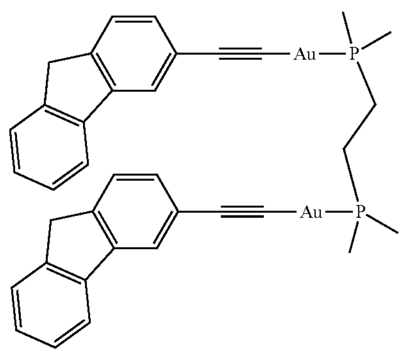
68
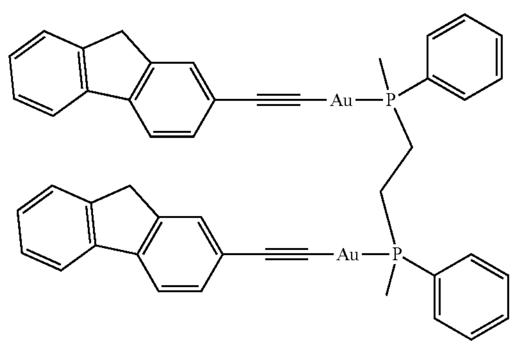

-continued
69
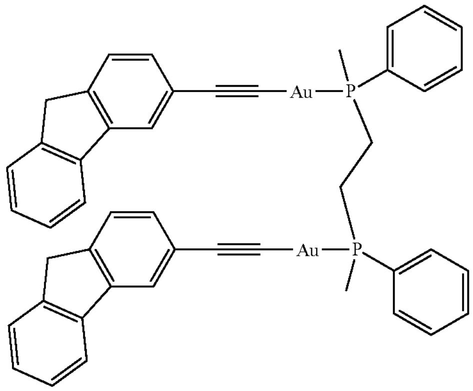
70
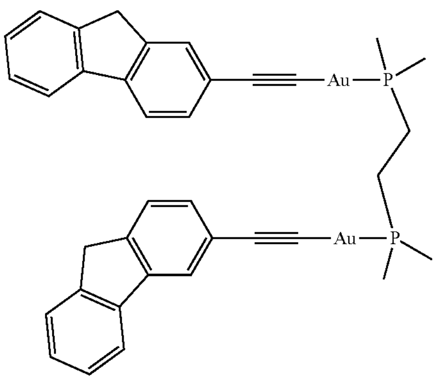
71
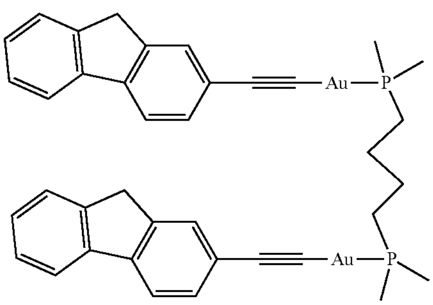
72
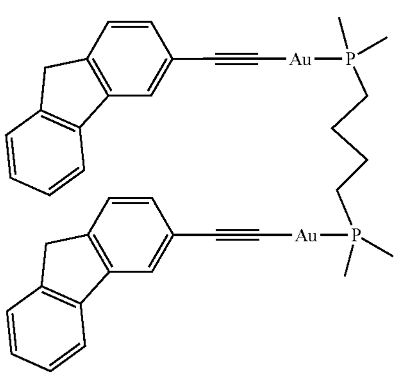
-continued
73
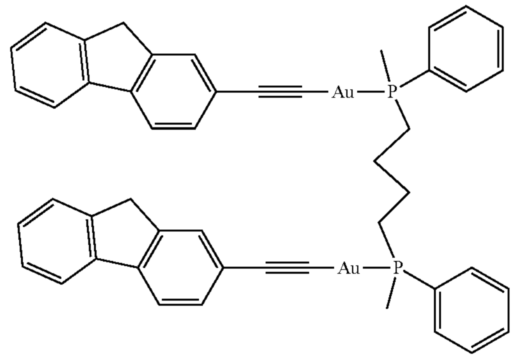
74
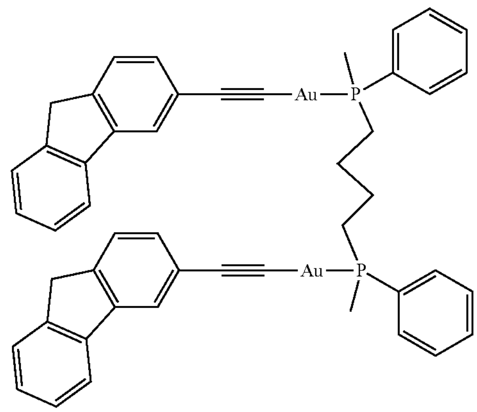
75
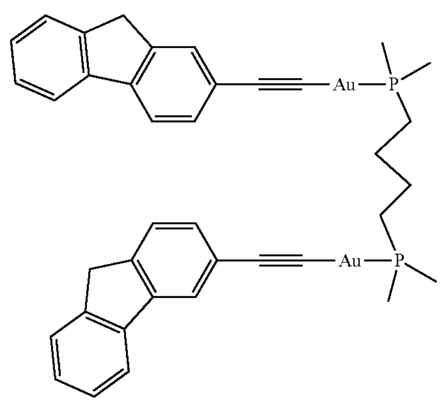
76
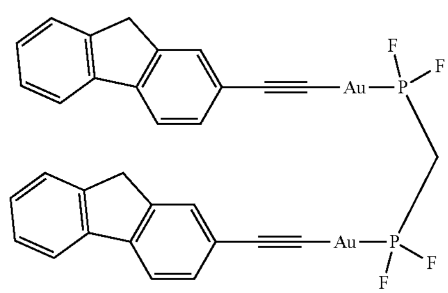

-continued
77
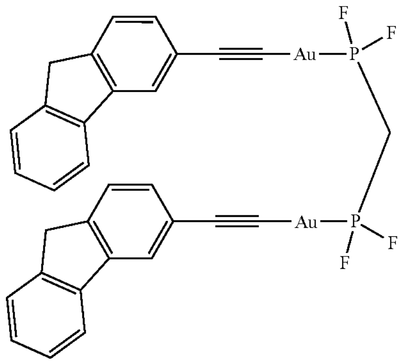
78
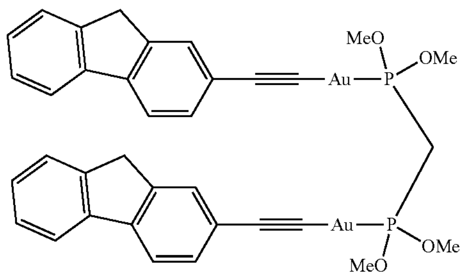
79
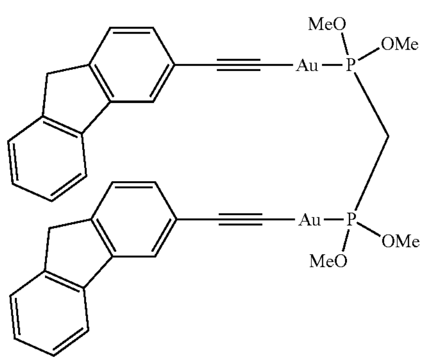
80
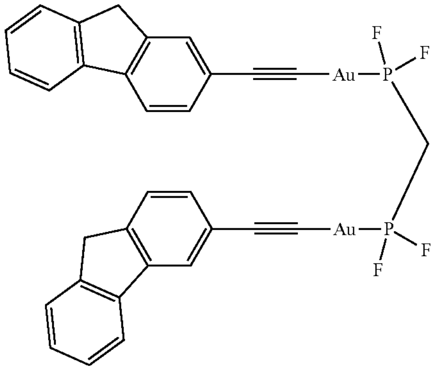
-continued
81
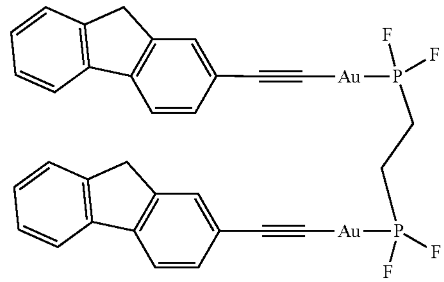
82
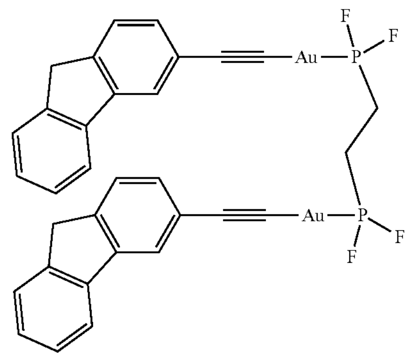
83
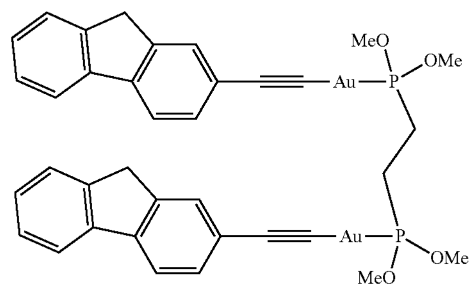
84
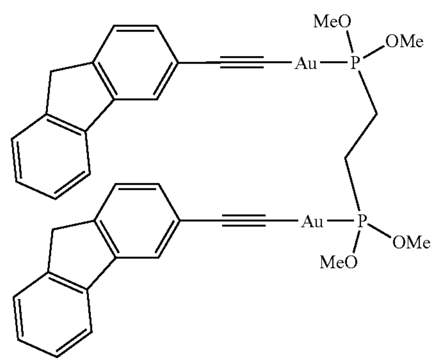

-continued
85
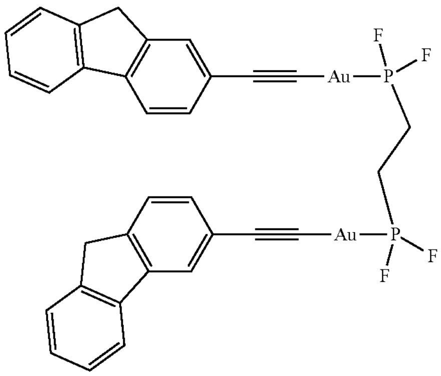
86
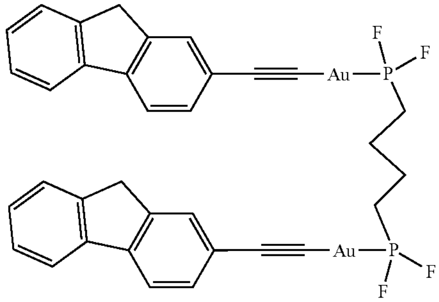
87
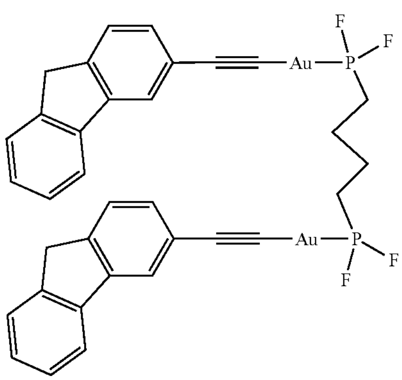
88
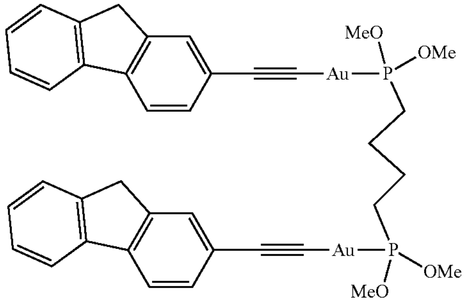
-continued
89
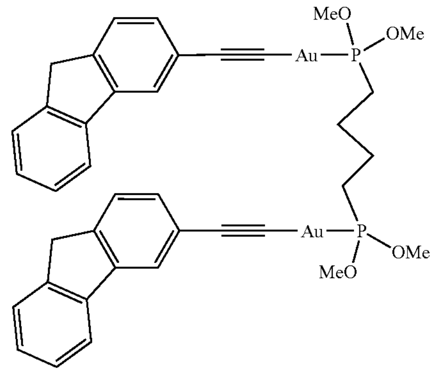
90
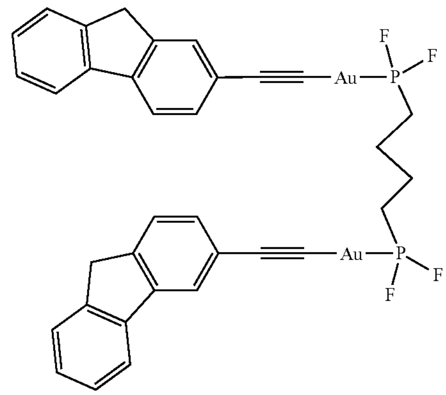
91
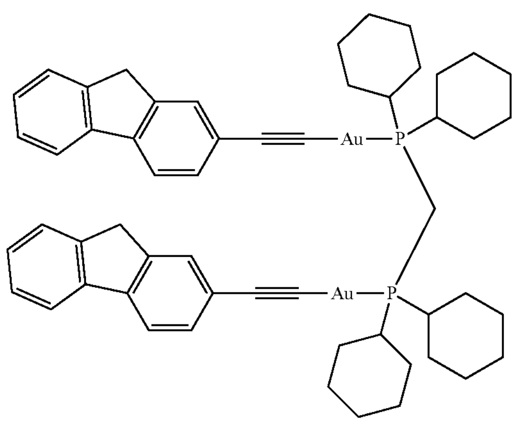
92
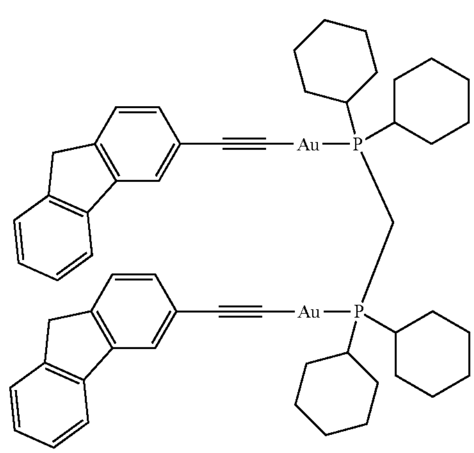

-continued
93
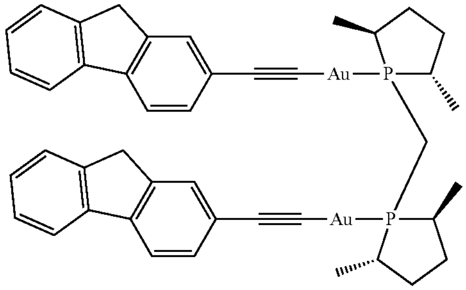
94
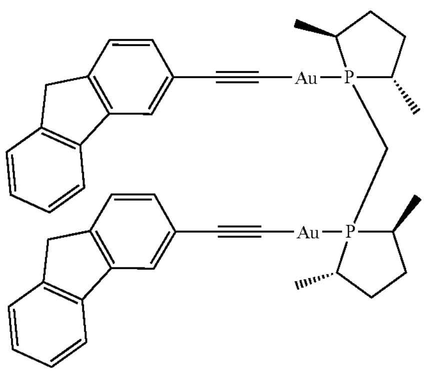
95
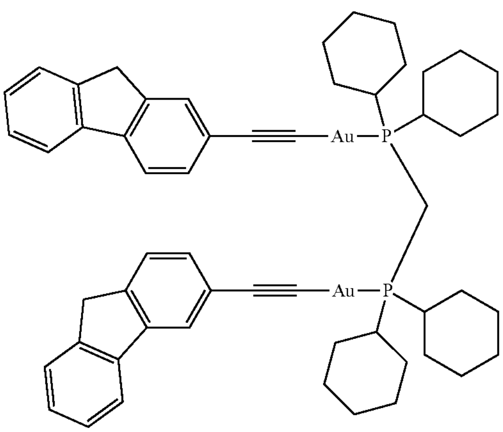
96
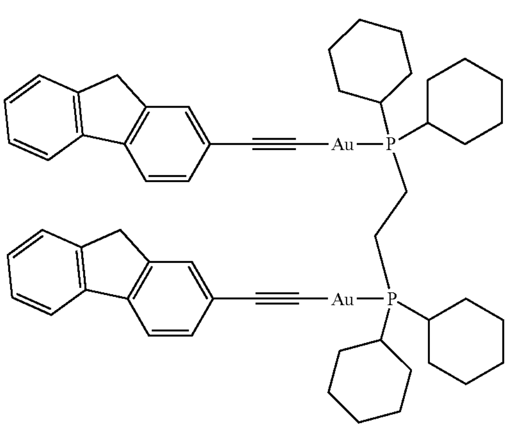
-continued
97
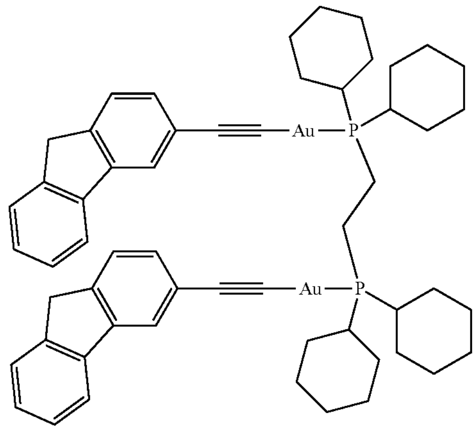
98
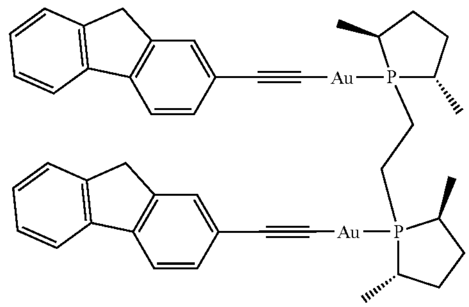
99
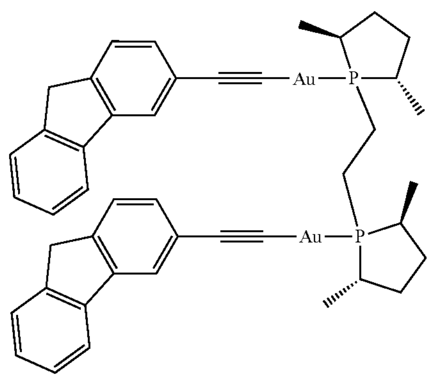
100
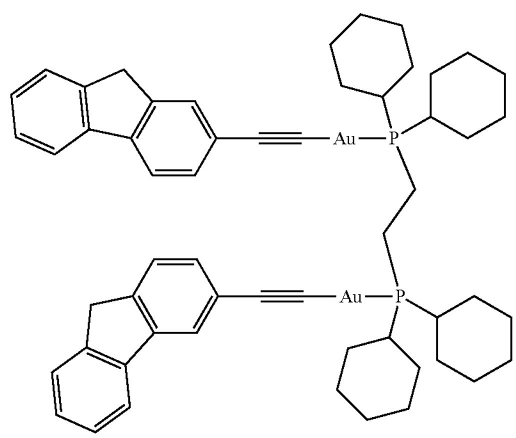

-continued
101
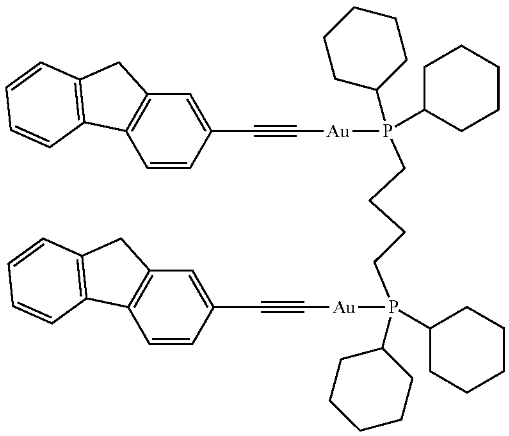
102
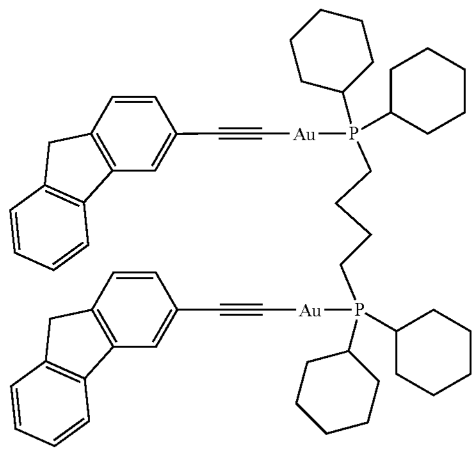
103
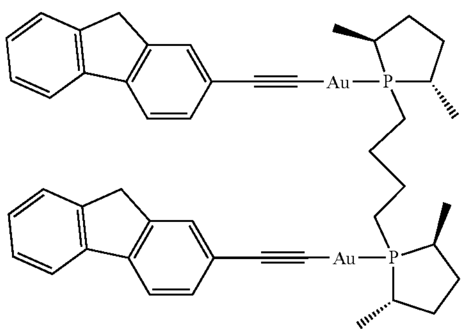
104
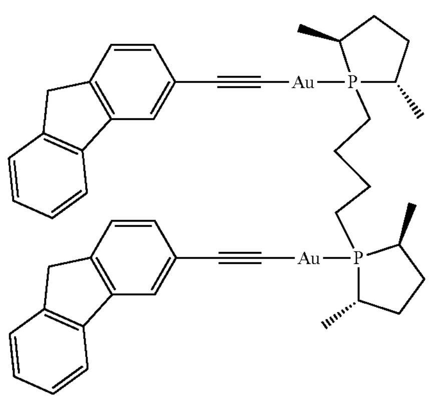
-continued
105
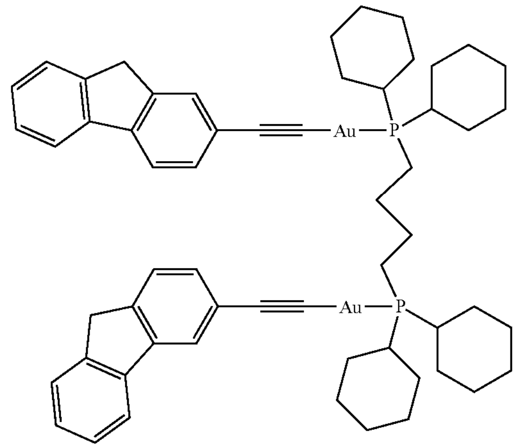
106
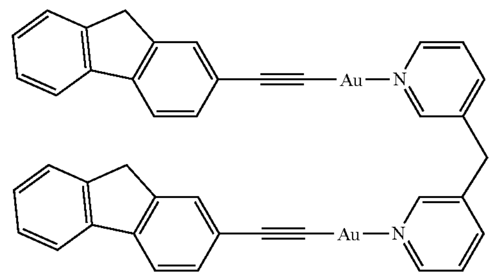
107
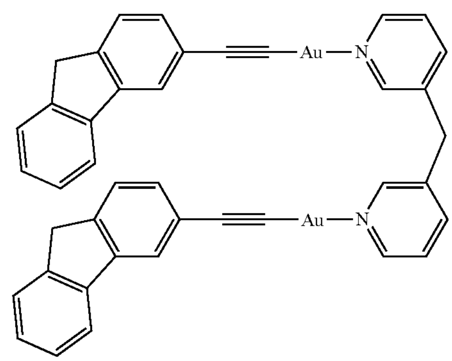
108
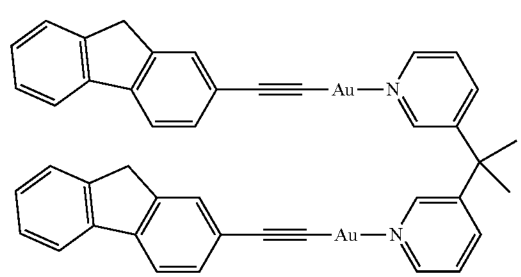

109
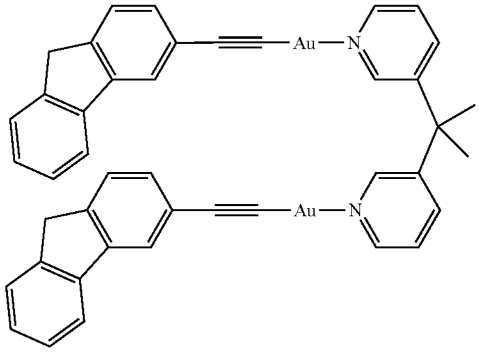
110
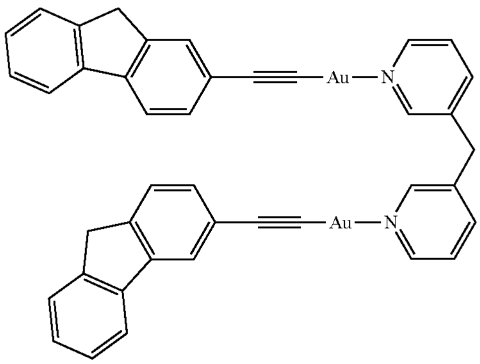
111
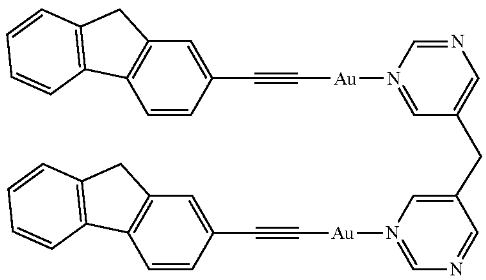
112
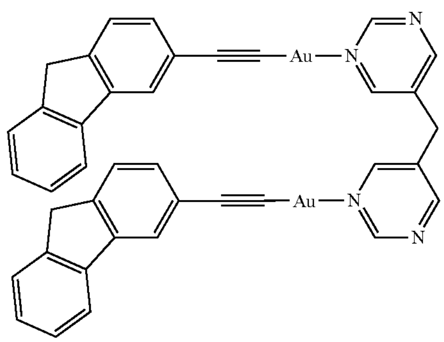
113
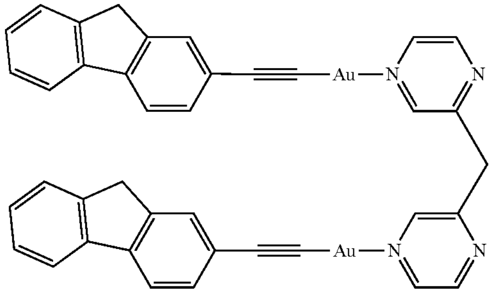
114
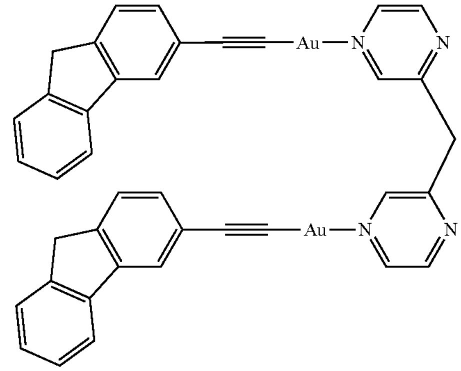
115
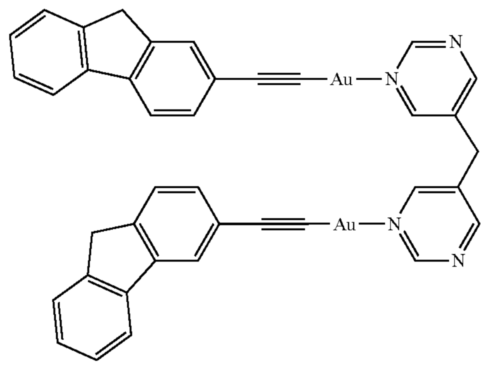
116
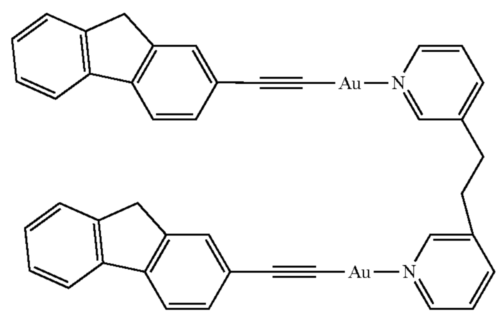
117
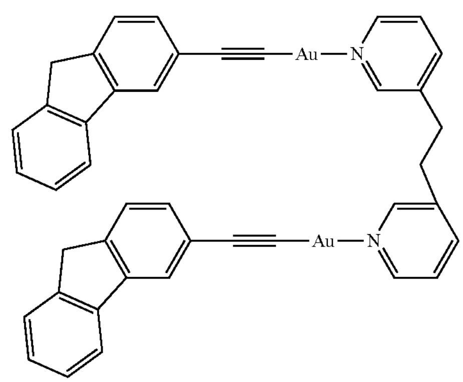

-continued
118
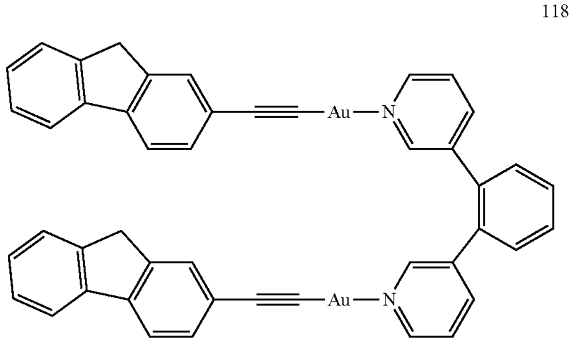
119
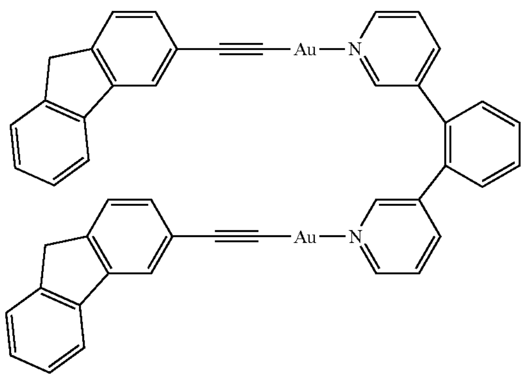
120
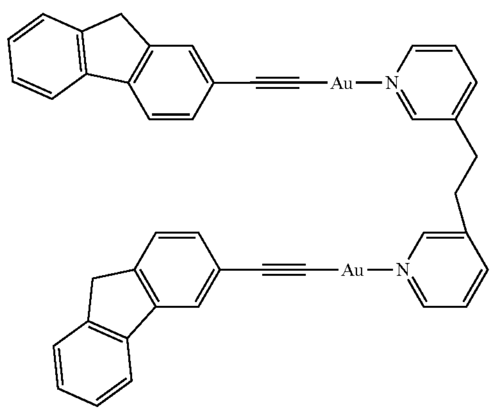
121
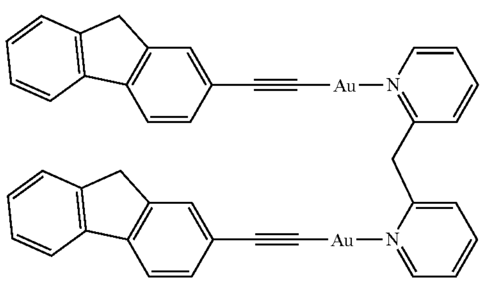
-continued
122
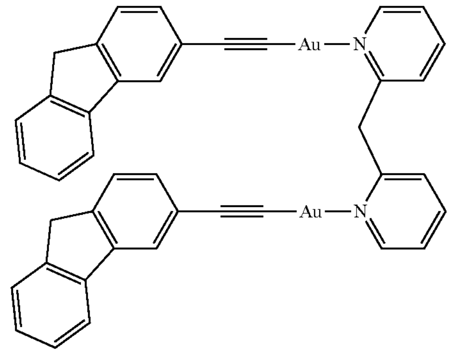
123
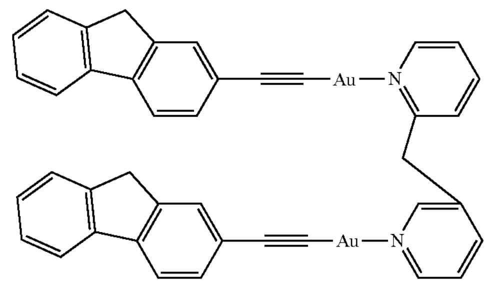
124
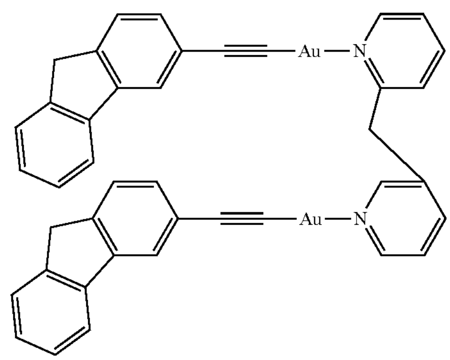
125
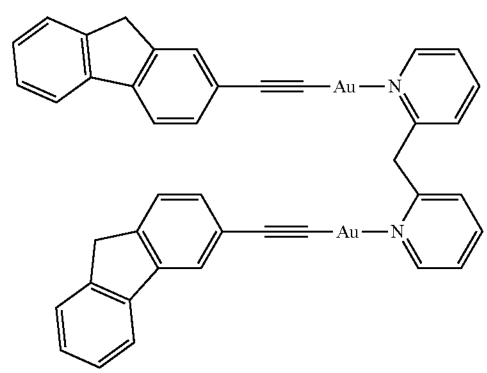
126
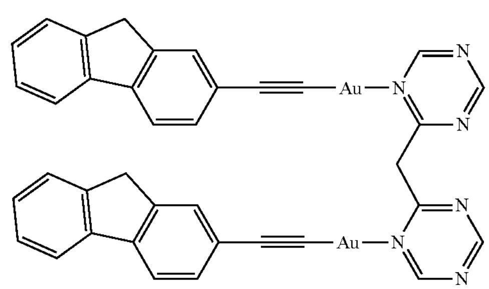

-continued
127
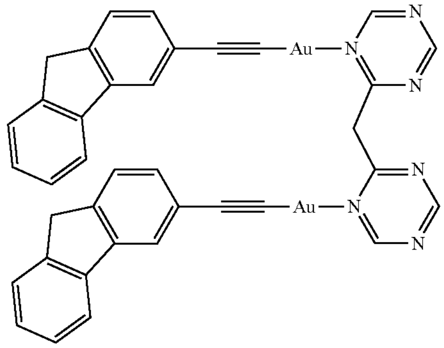
128
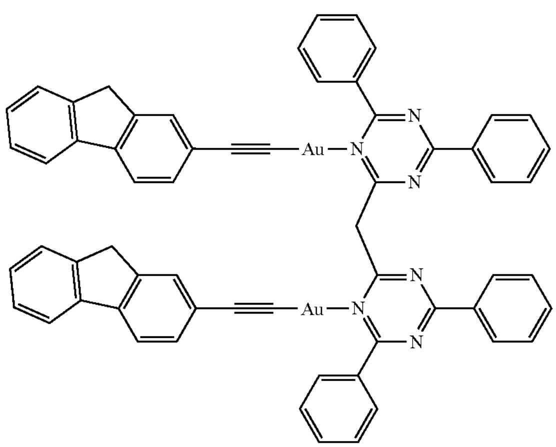
129
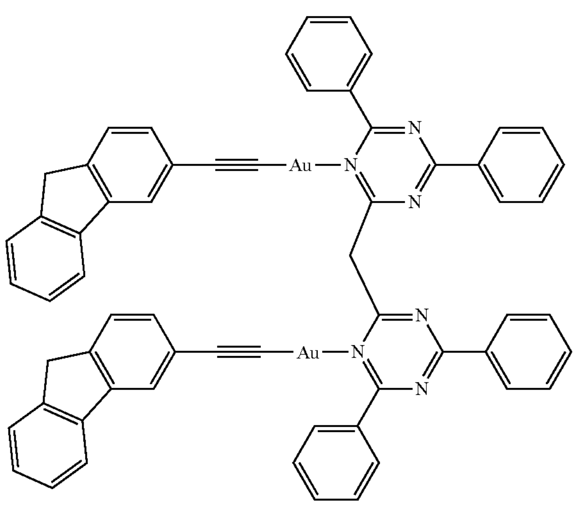
-continued
130
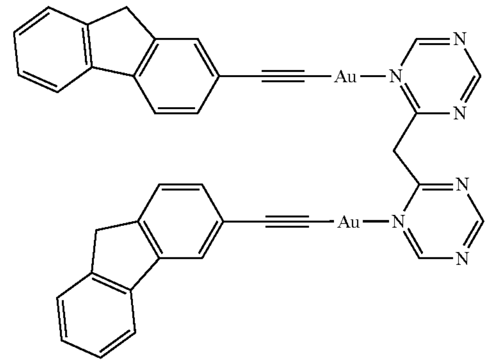
131
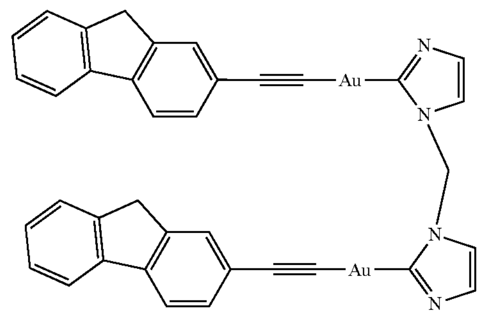
132
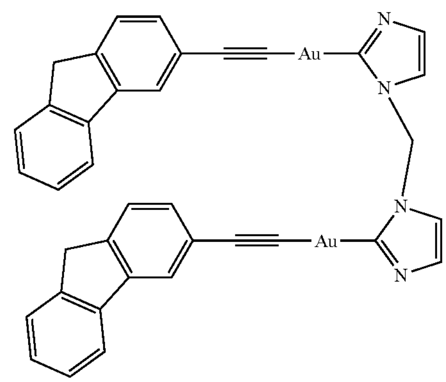
133
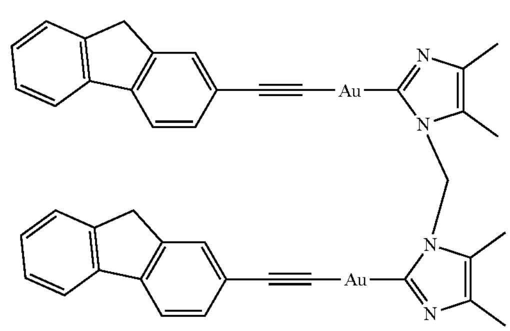

-continued
134
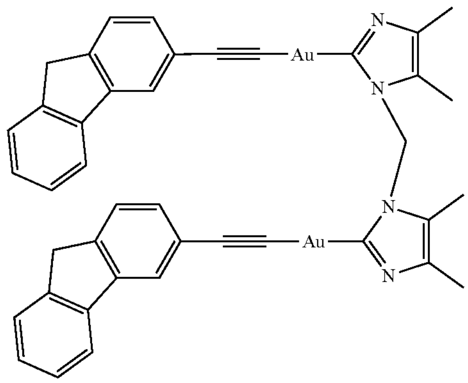
135
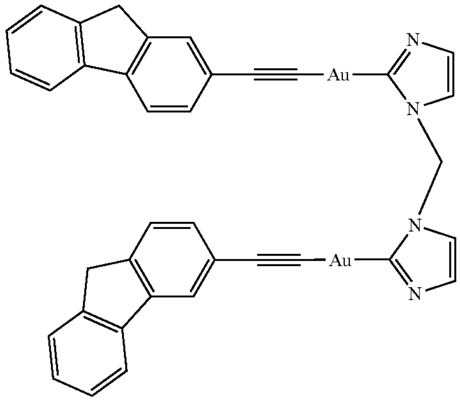
136
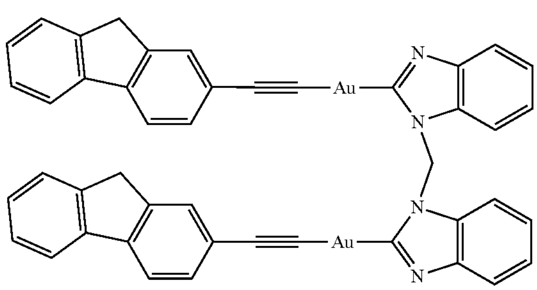
137
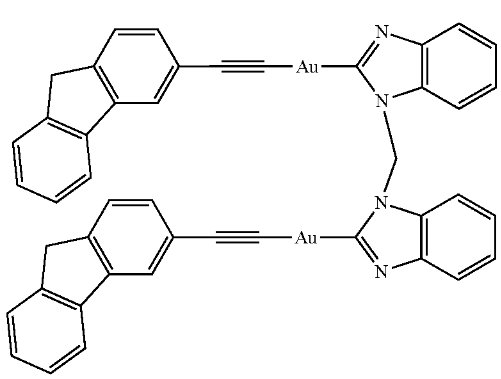
-continued
138
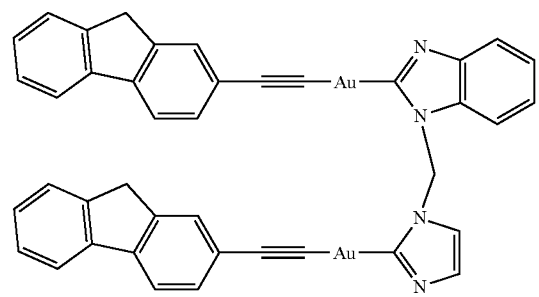
139
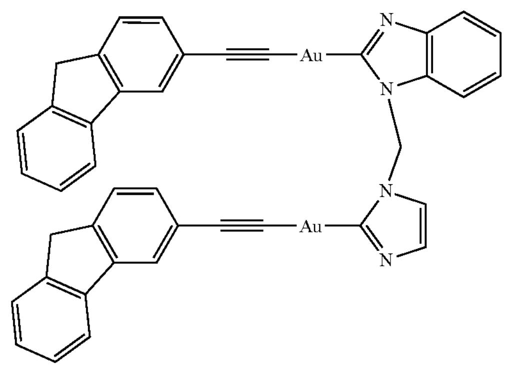
140
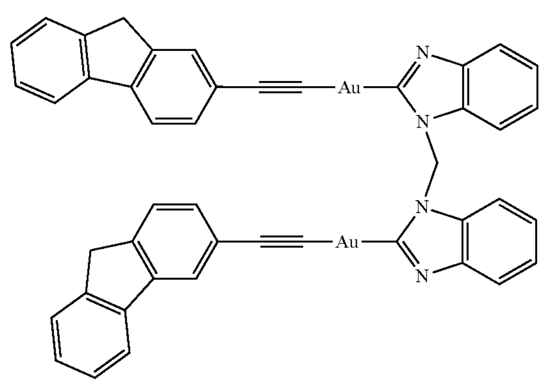
141
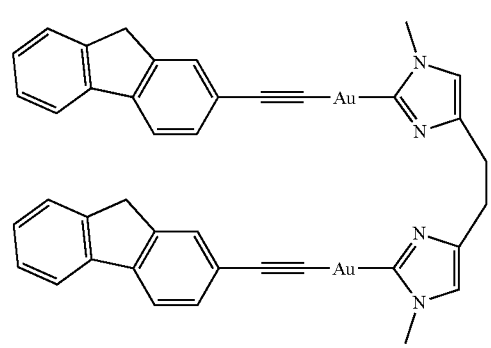

-continued
142
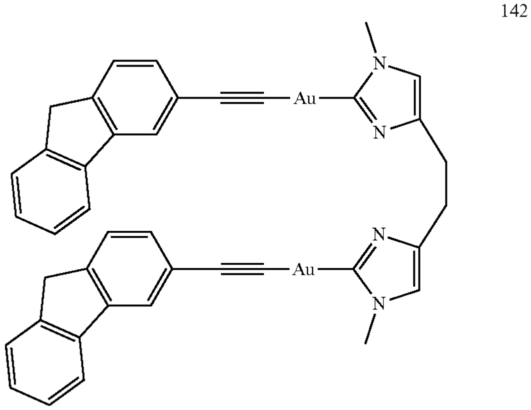
143
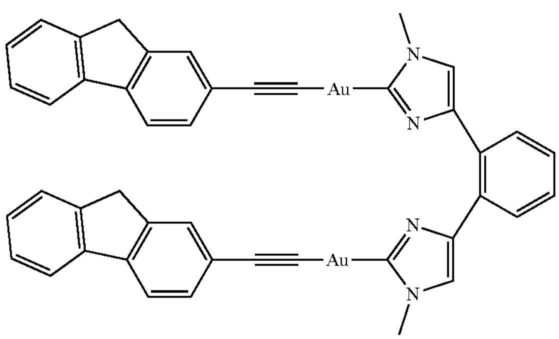
144
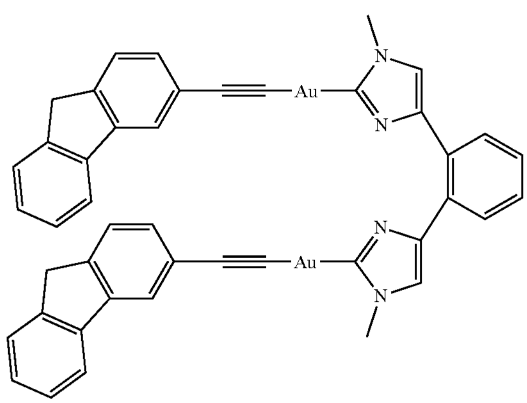
145
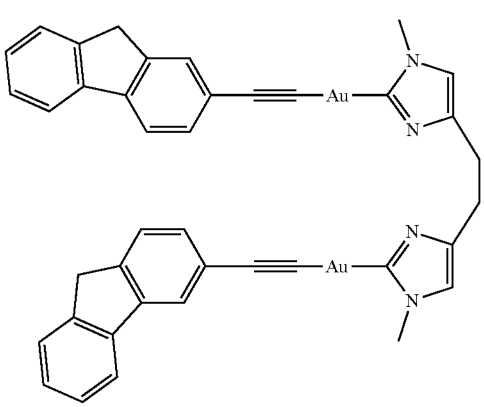
-continued
146
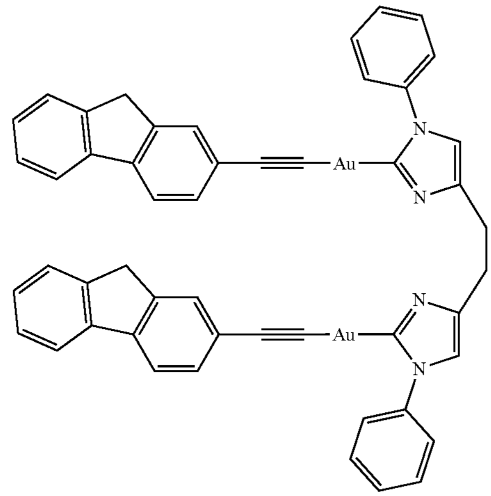
147
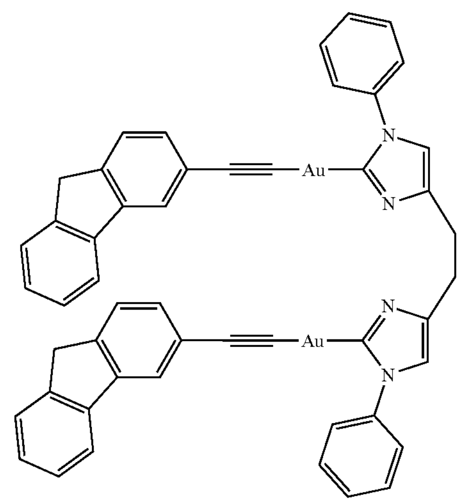
148
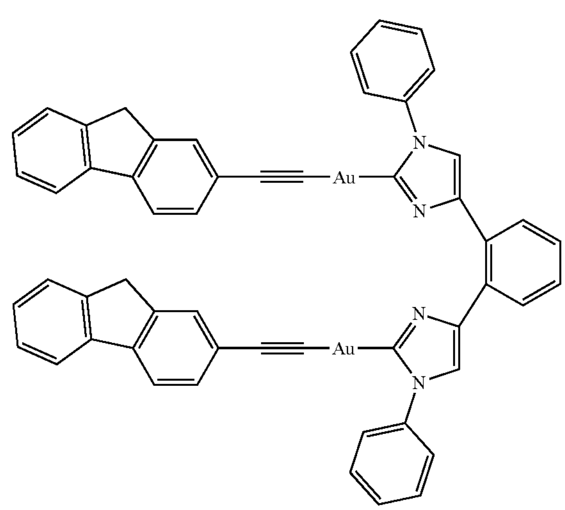

149
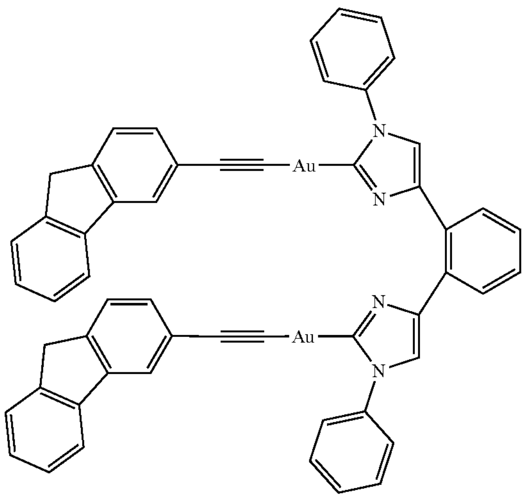
150
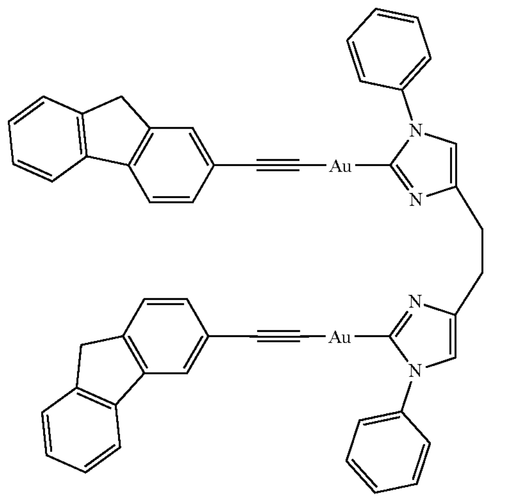
151
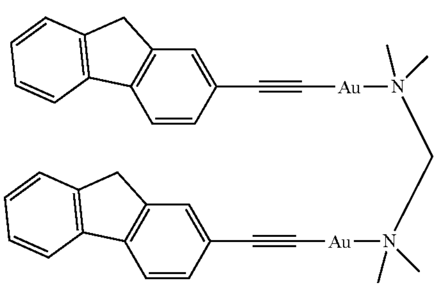
152
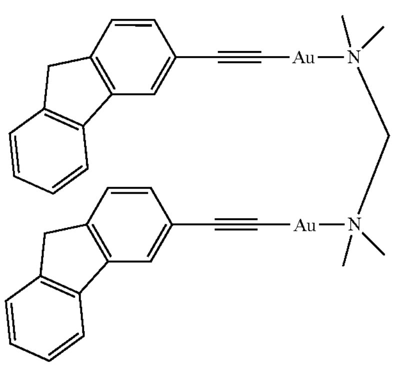
153
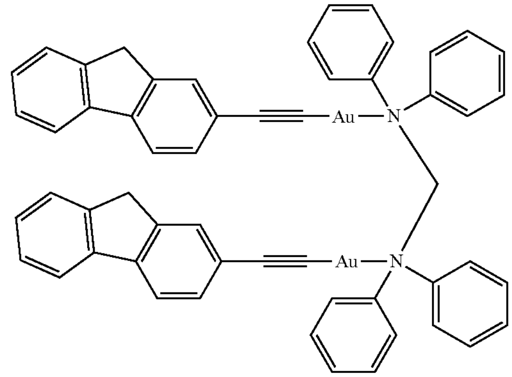
154
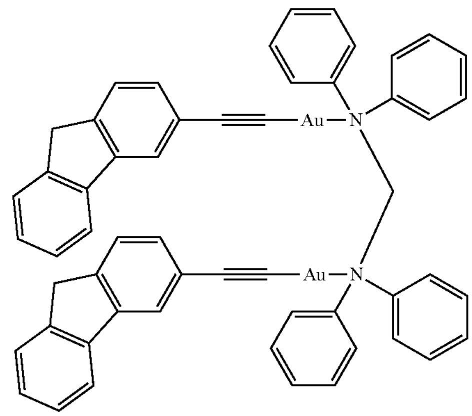
155
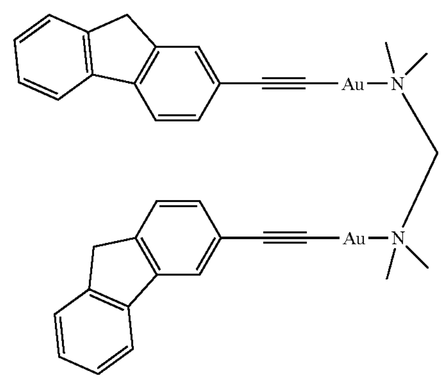
156
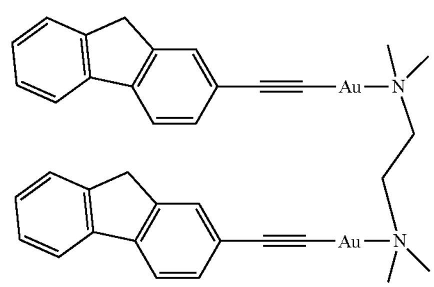

-continued
157
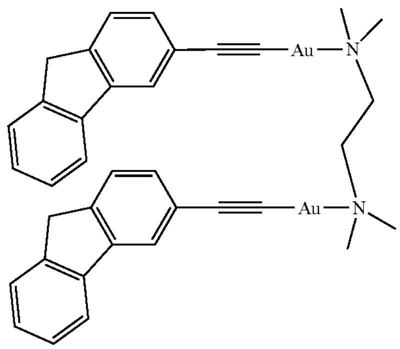
158
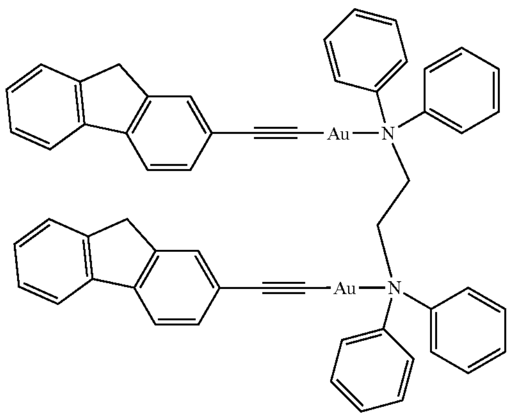
159
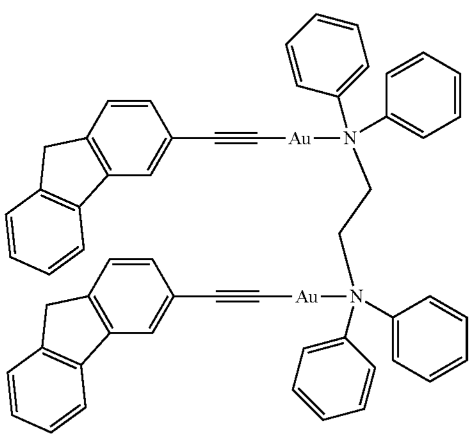
160
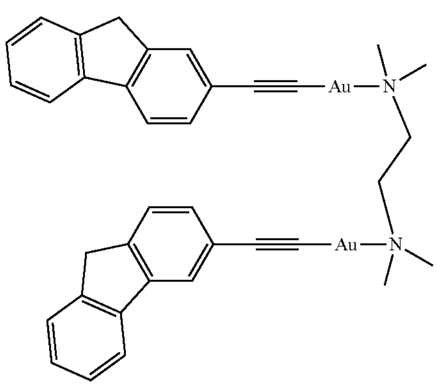
-continued
161
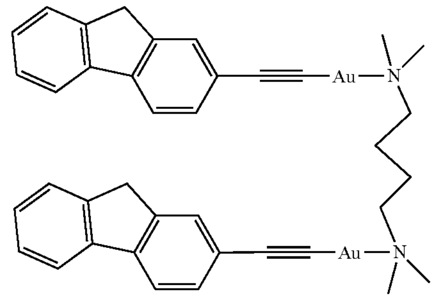
162
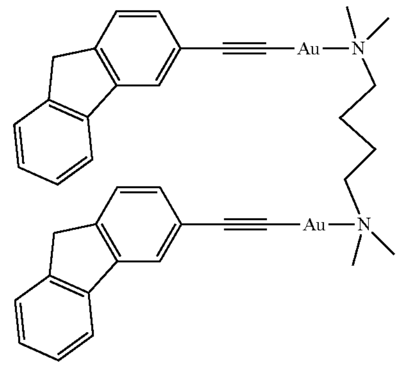
163
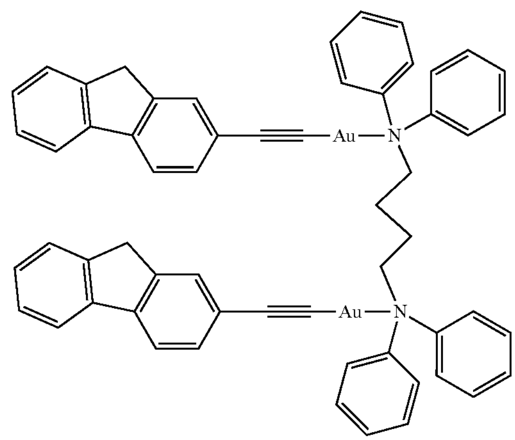
164
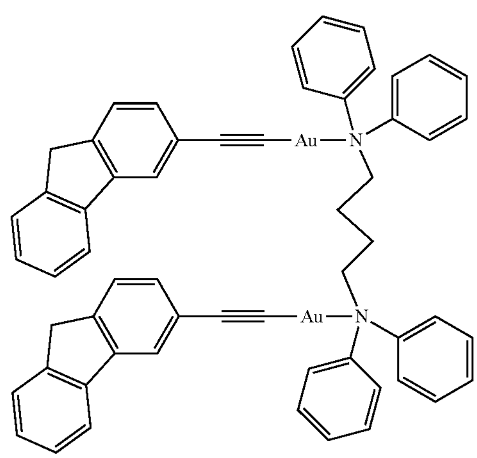

165
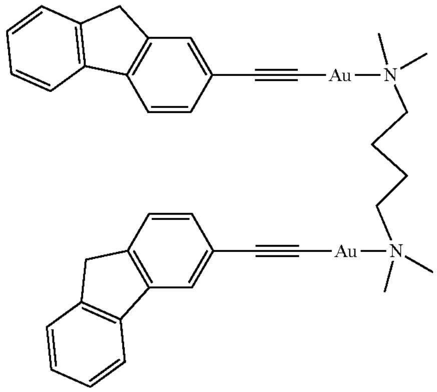
166
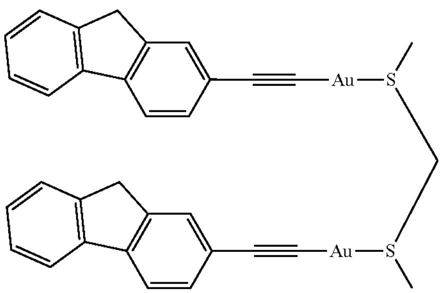
167
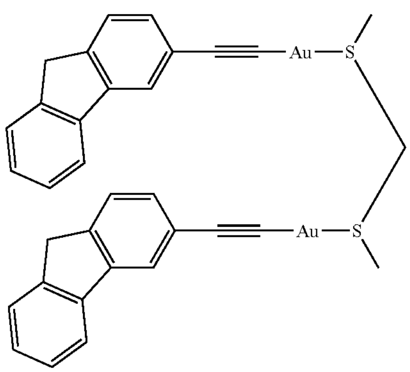
168
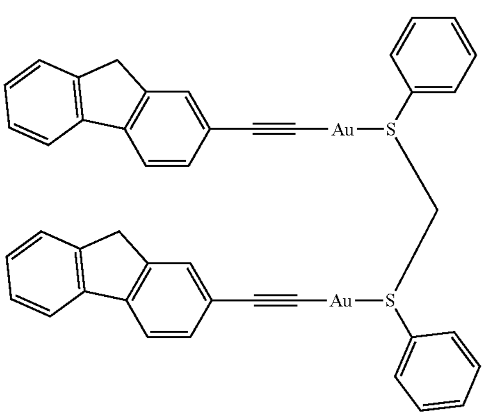
169
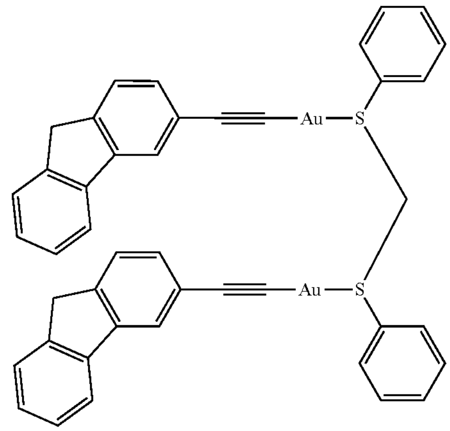
170
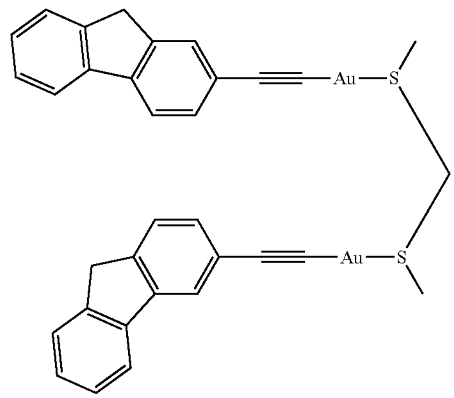
171
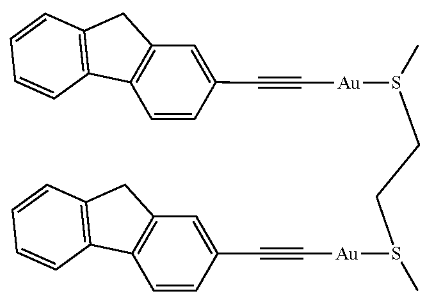
172
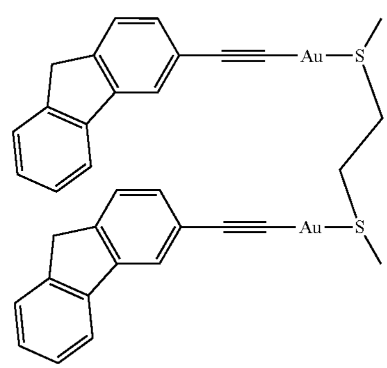

-continued
173
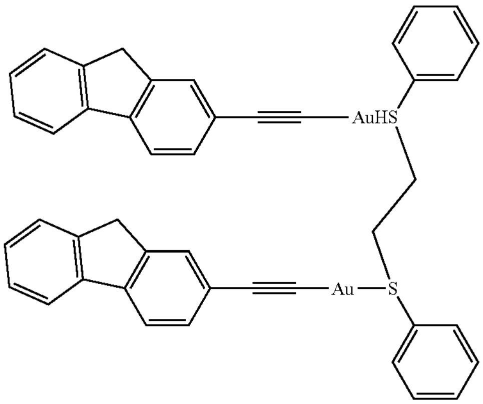
174
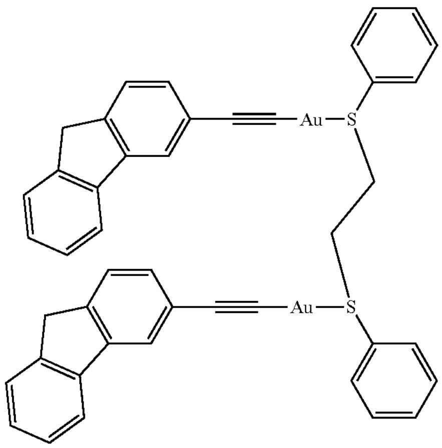
175
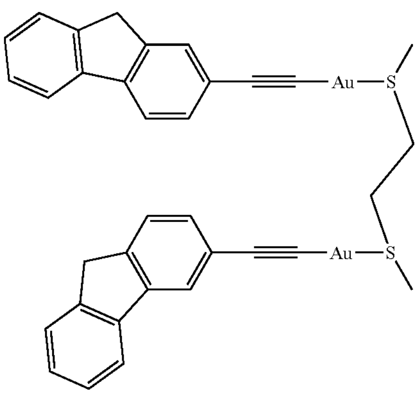
176
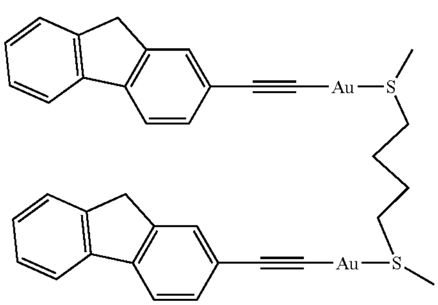
-continued
177
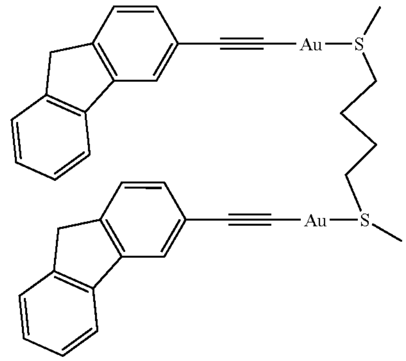
178
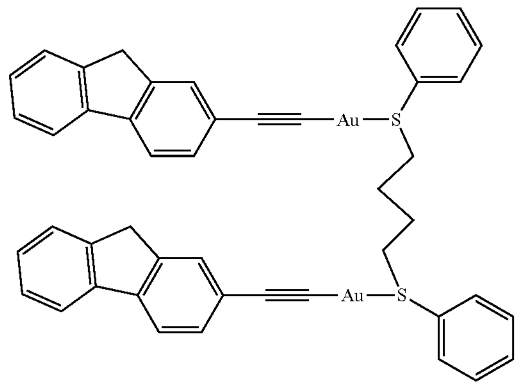
179
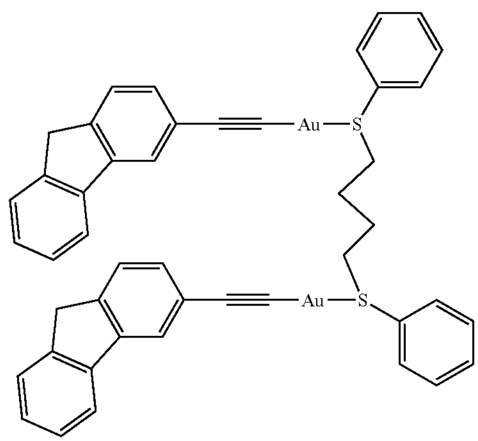
180
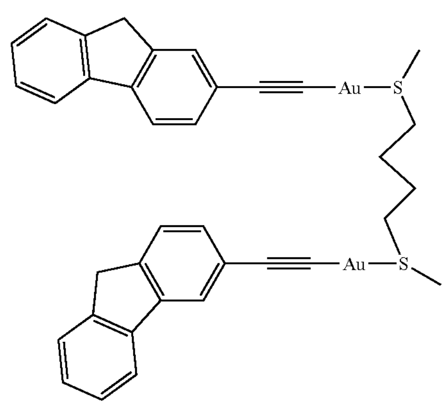

-continued
181
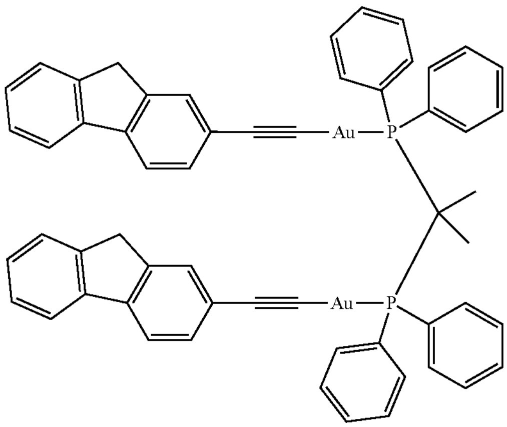
182
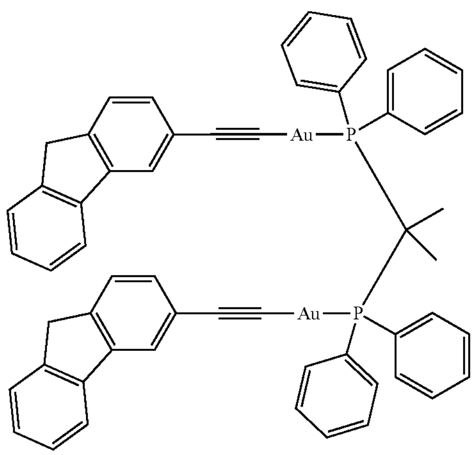
183
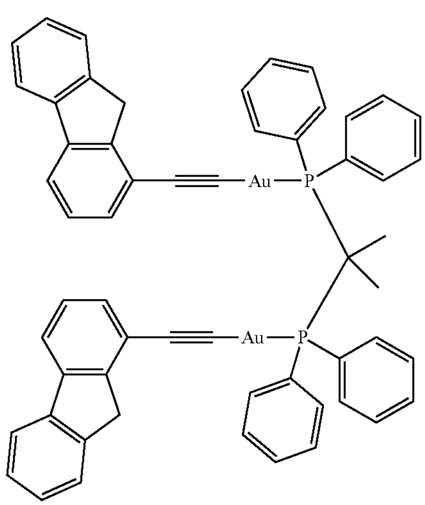
-continued
184
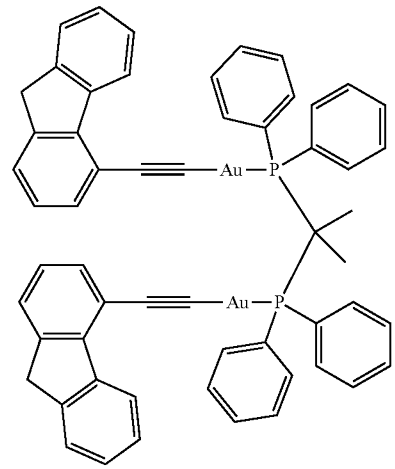
185
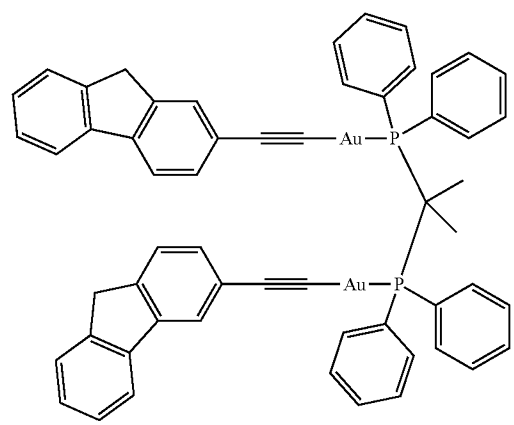
186
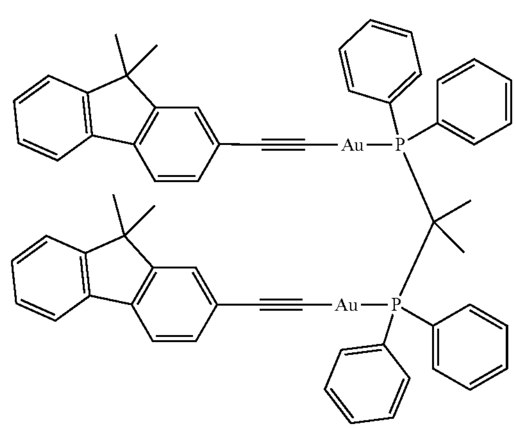

-continued
187
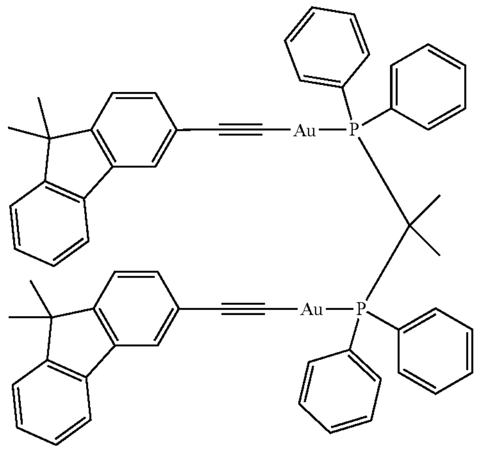
188
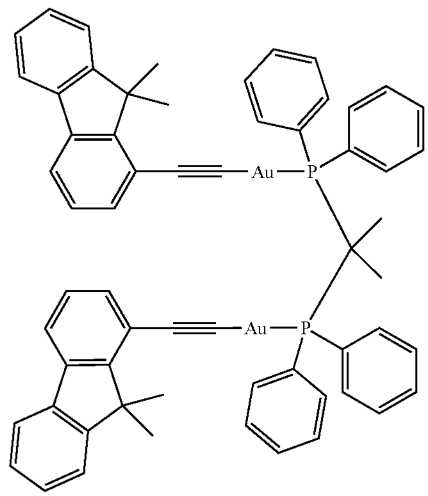
189
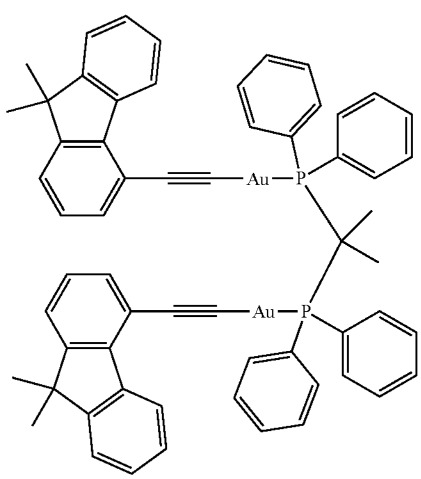
-continued
190
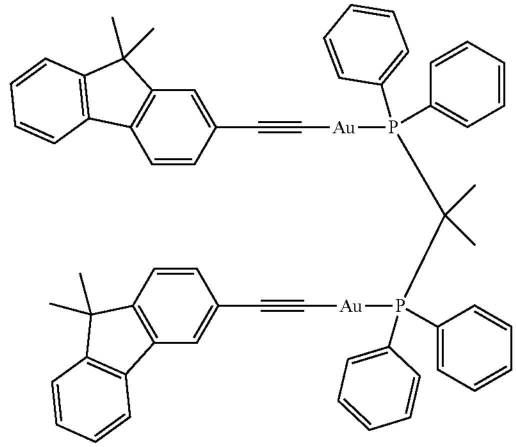
191
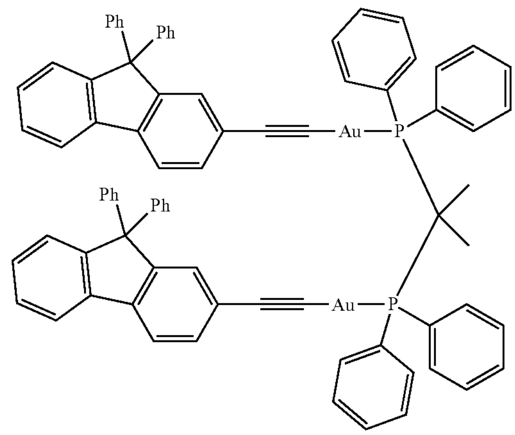
192
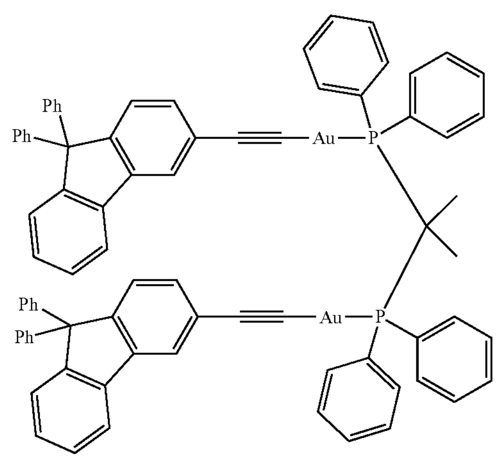

-continued
193
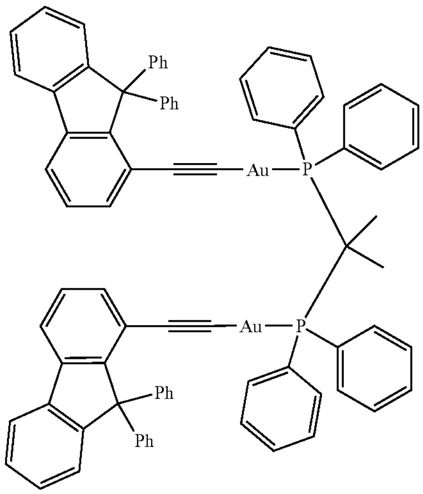
194
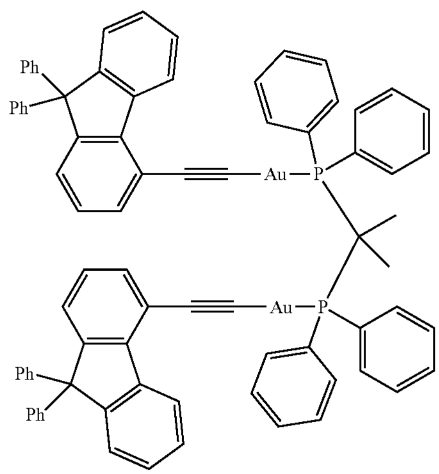
195
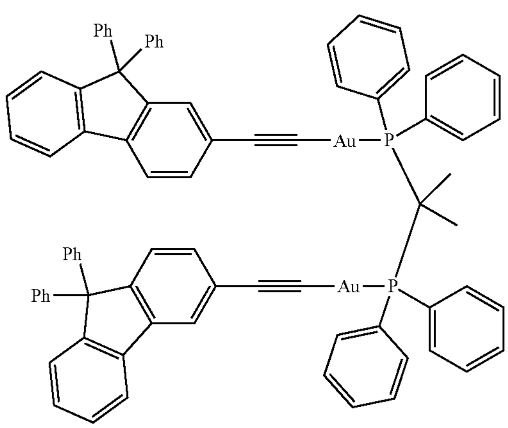
-continued
196
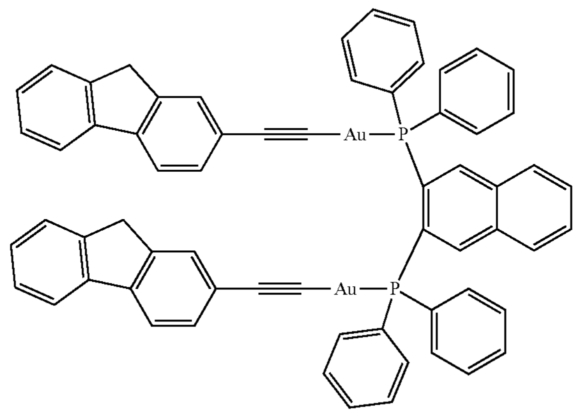
197
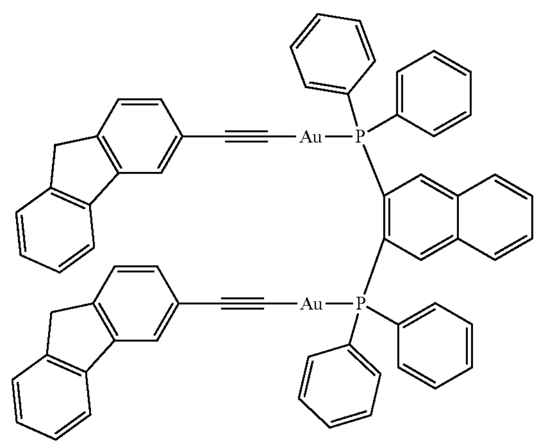
198
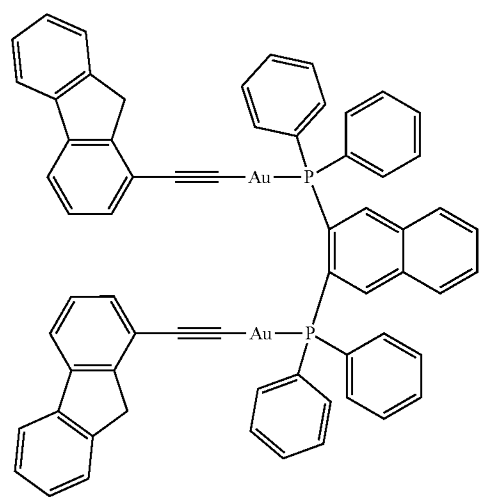

-continued
199
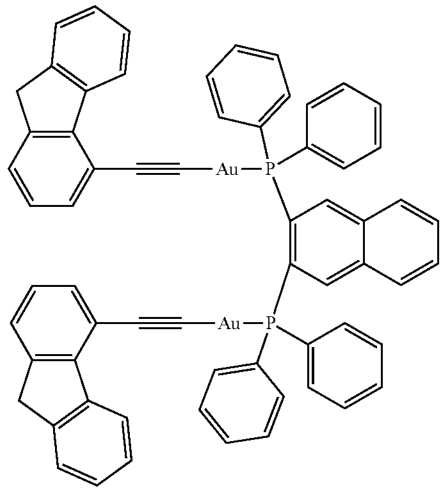
200
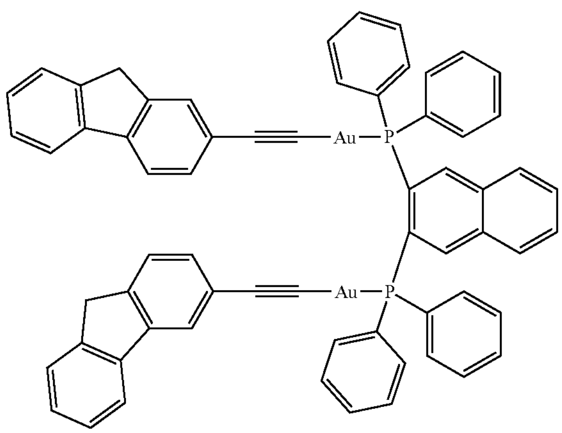
201
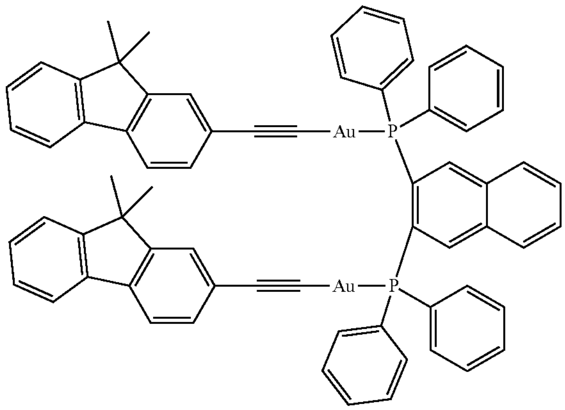
-continued
202
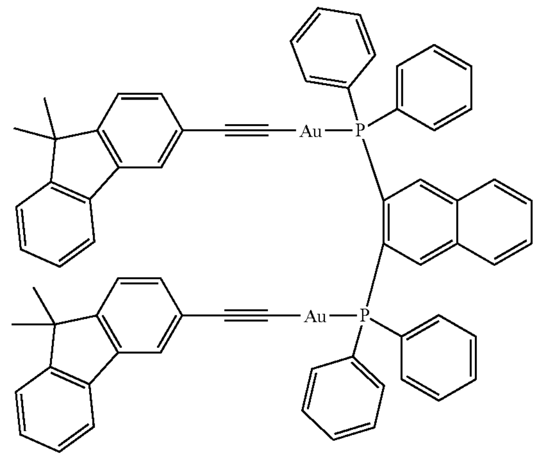
203
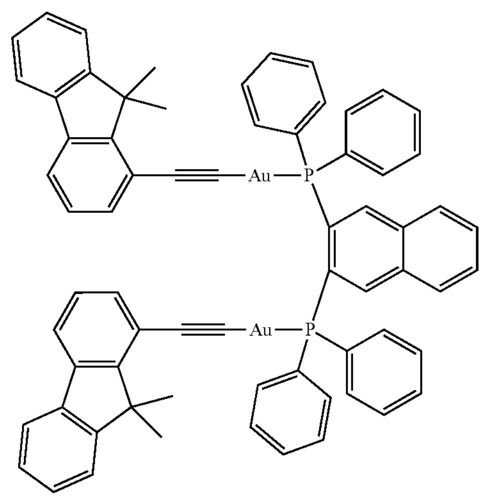
204
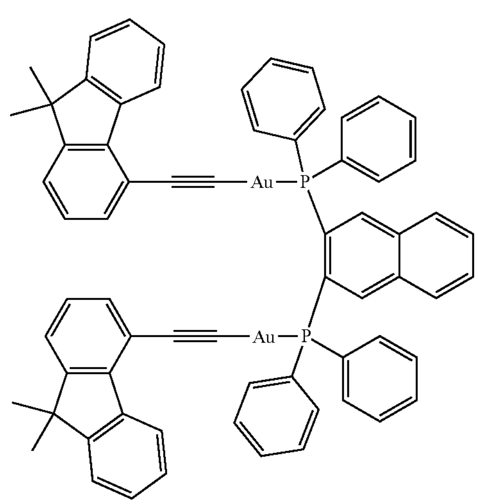

-continued
205
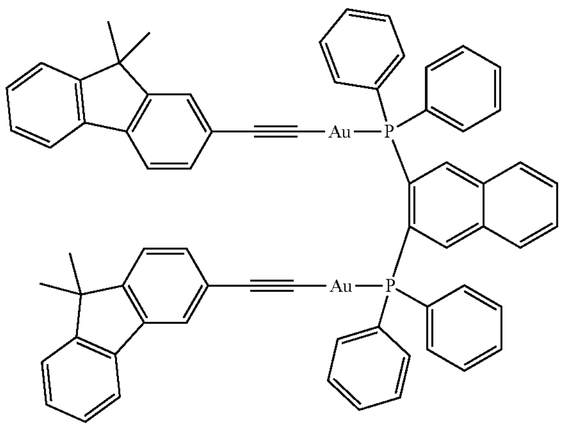
206
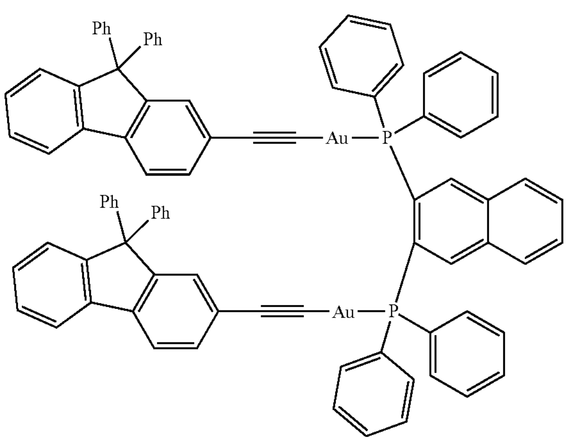
207
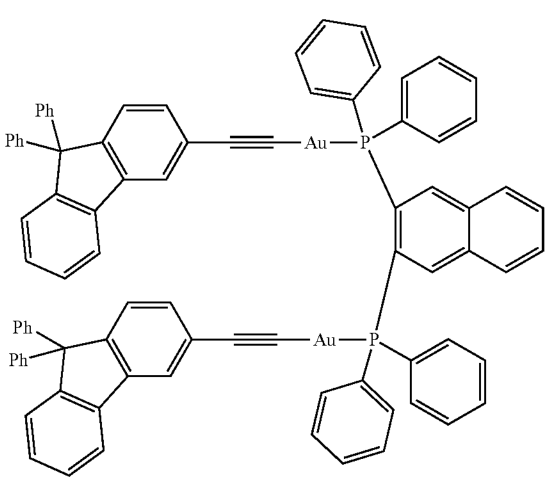
-continued
208
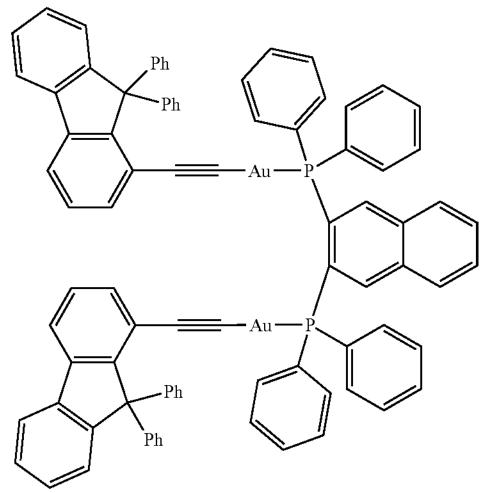
209
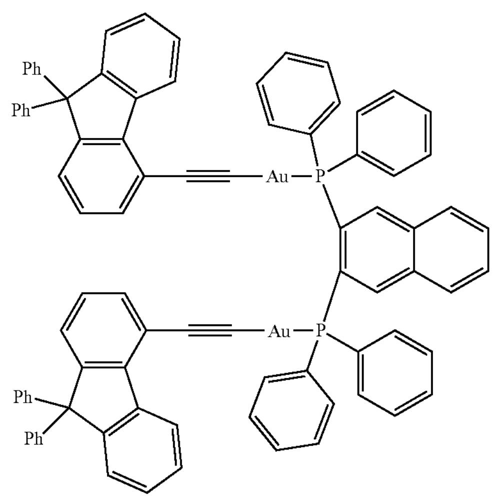
210
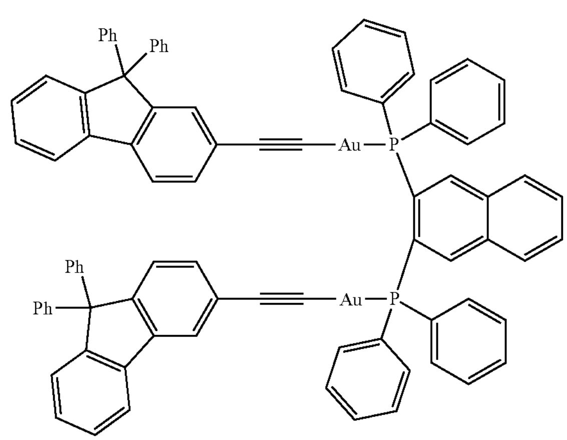

-continued
211
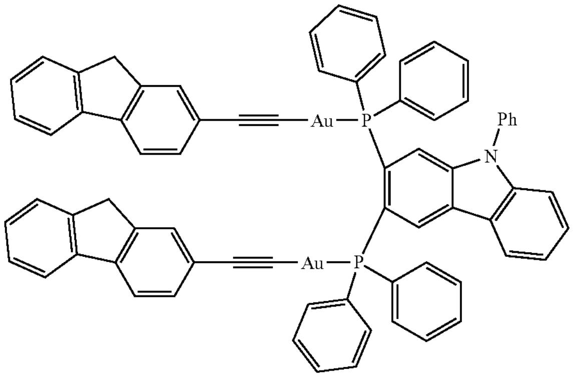
212
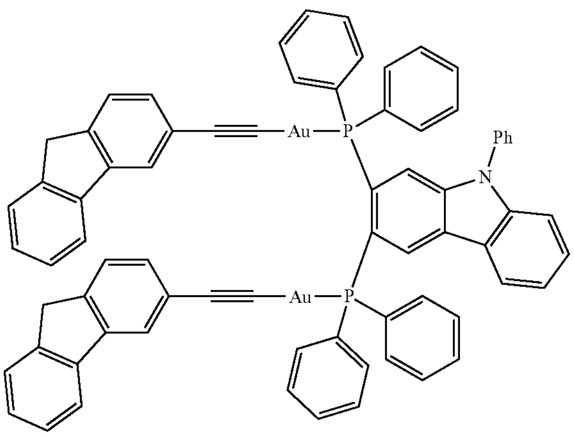
213
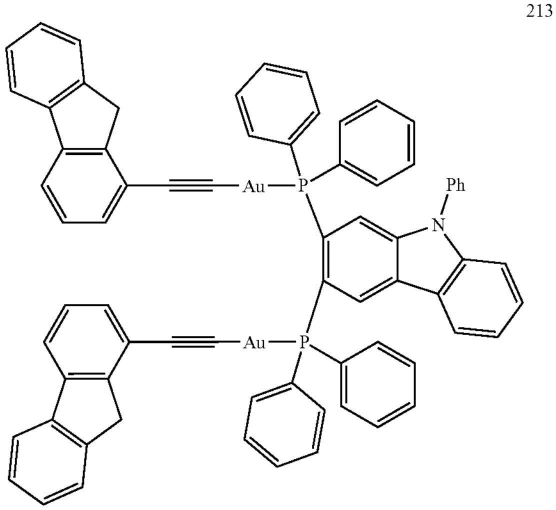
-continued
214
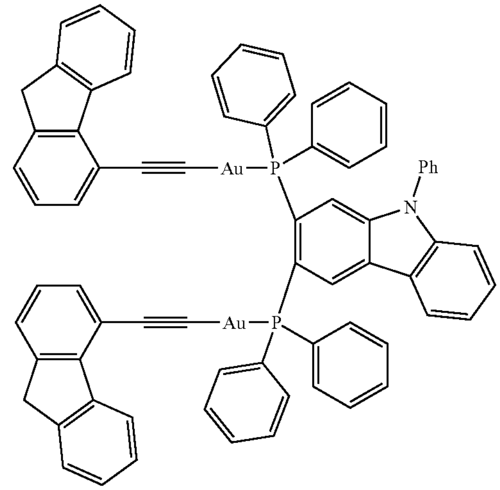
215
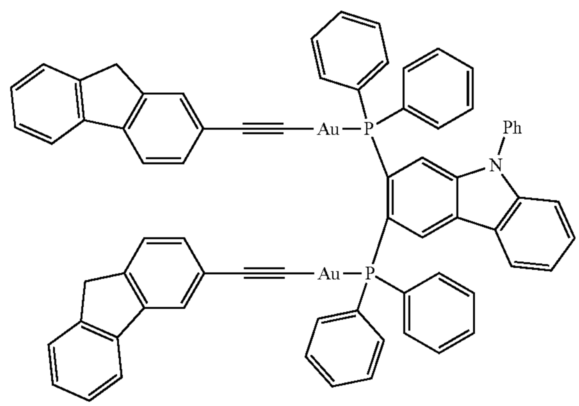
216
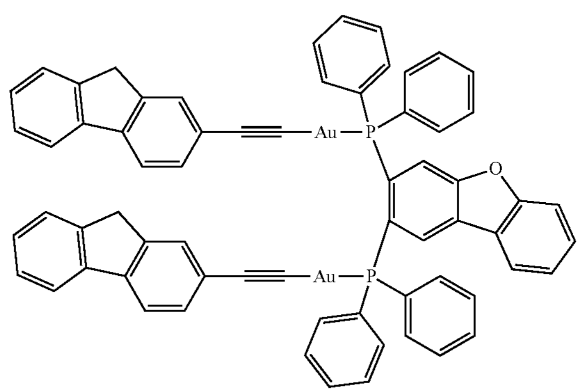

-continued
217
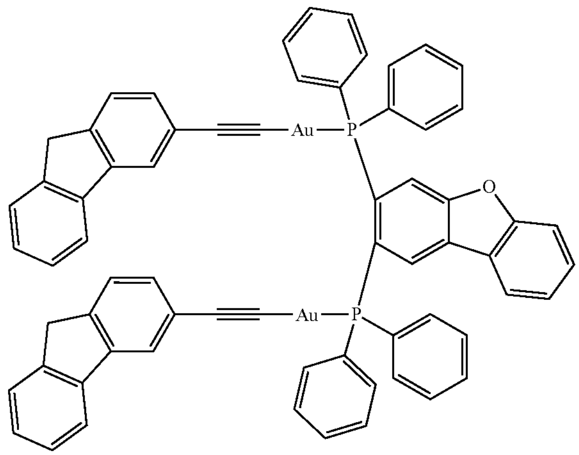
218
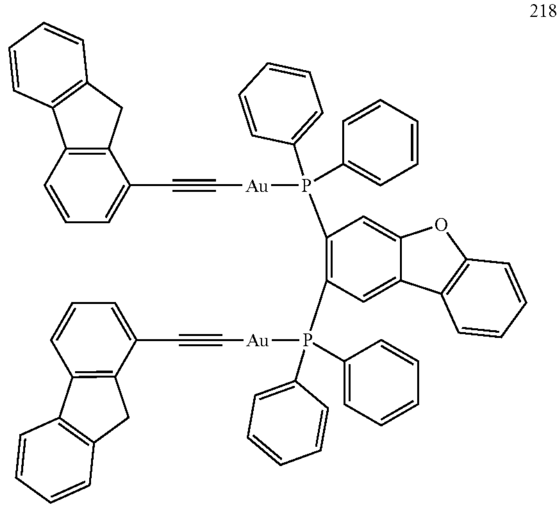
219
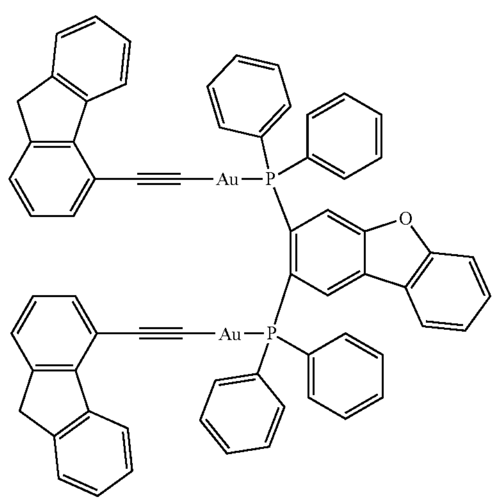
-continued
220
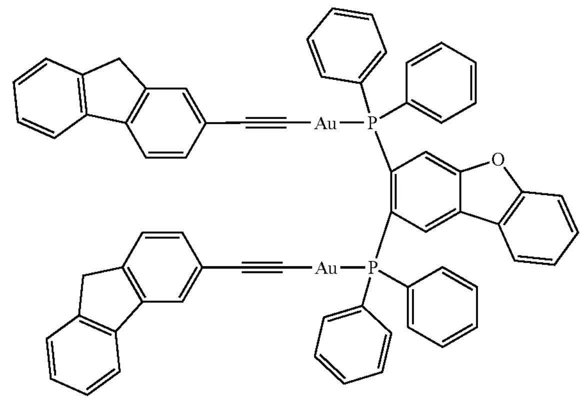
221
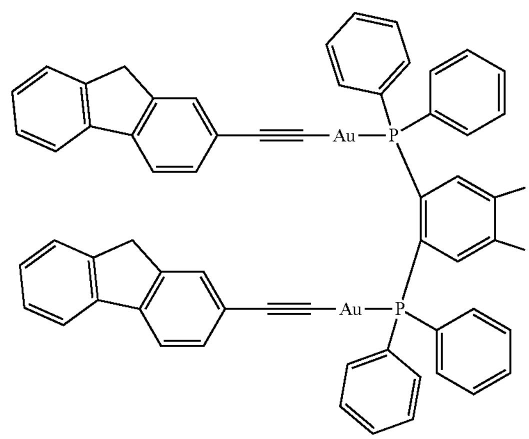
222
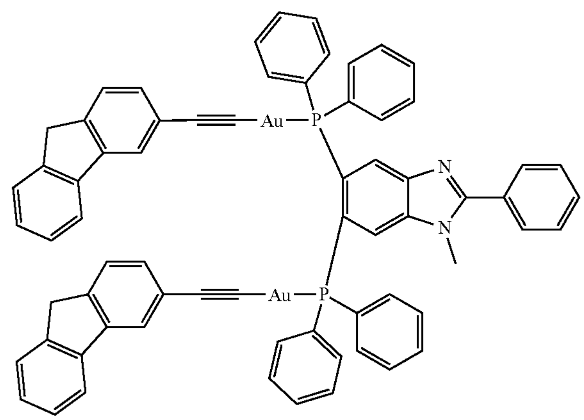

-continued
223
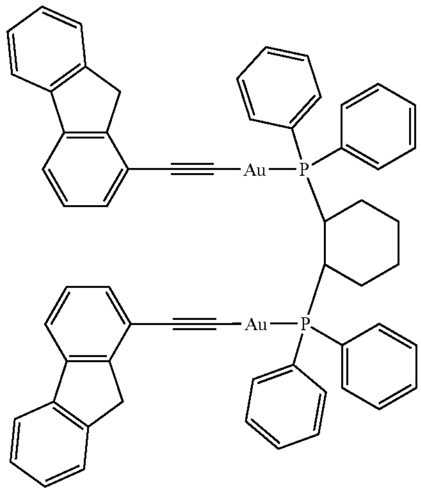
226
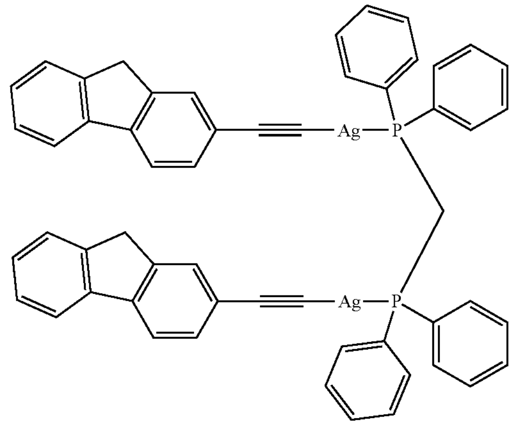
224
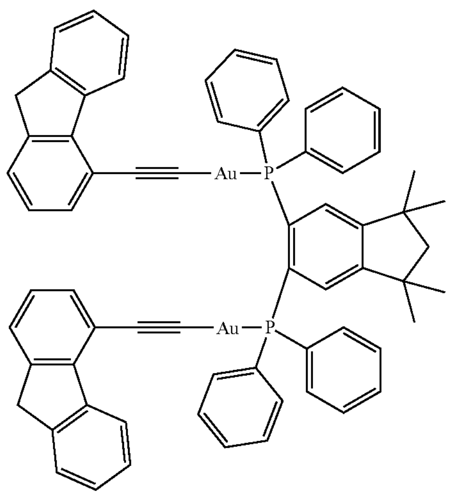
227
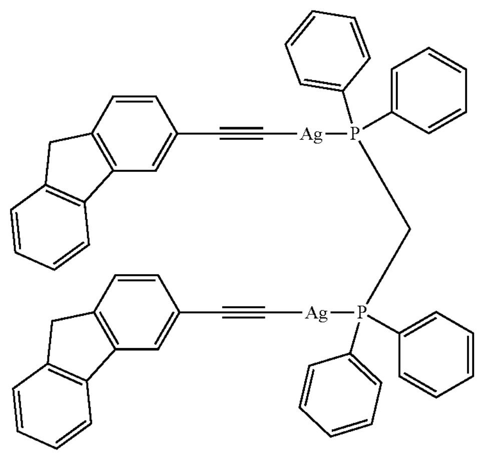
225
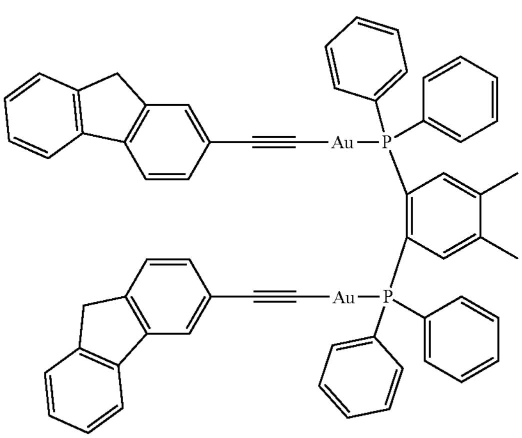
228
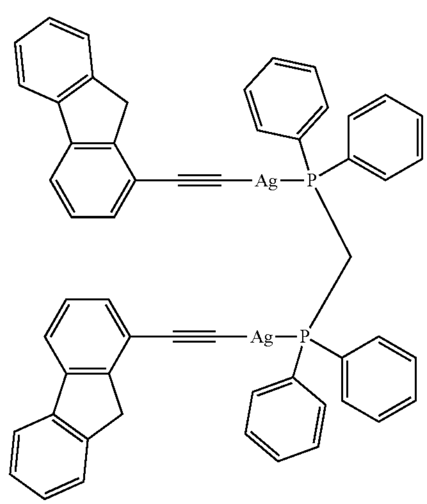

-continued
229
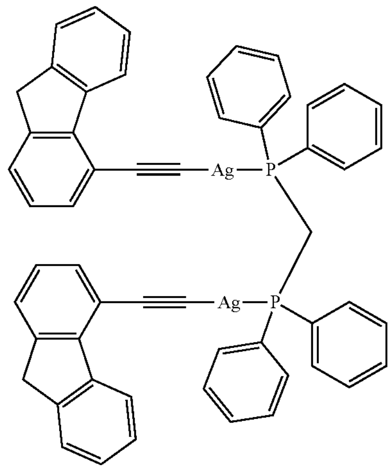
230
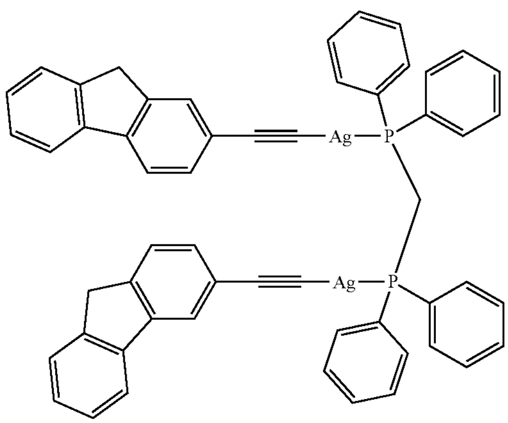
231
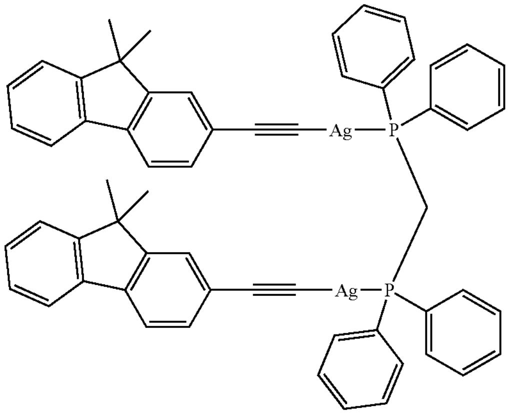
-continued
232
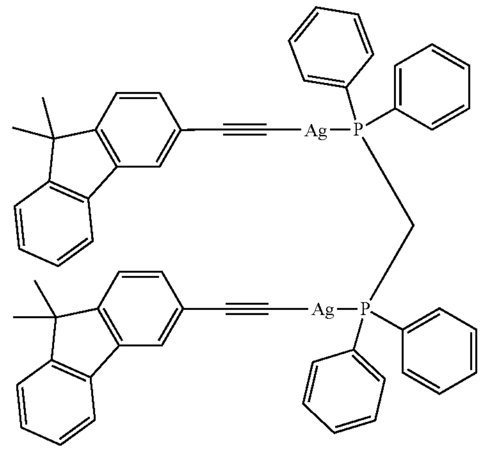
233
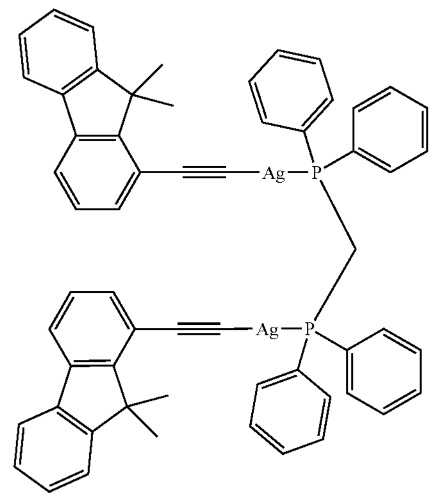
234
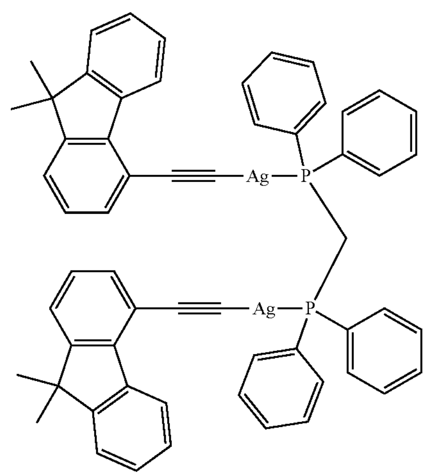

-continued
235
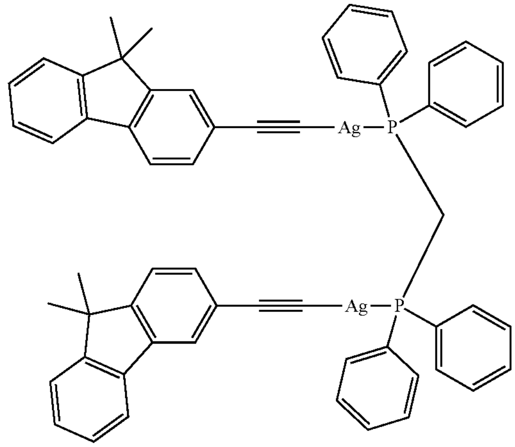
236
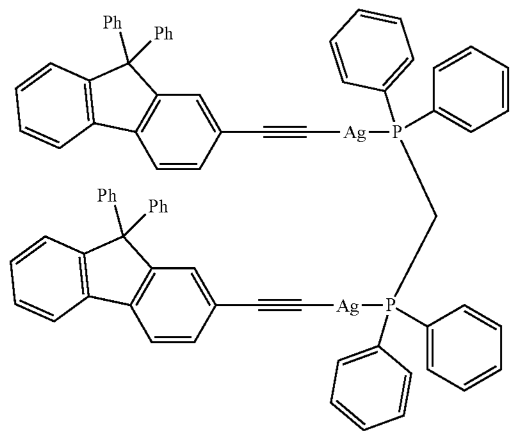
237
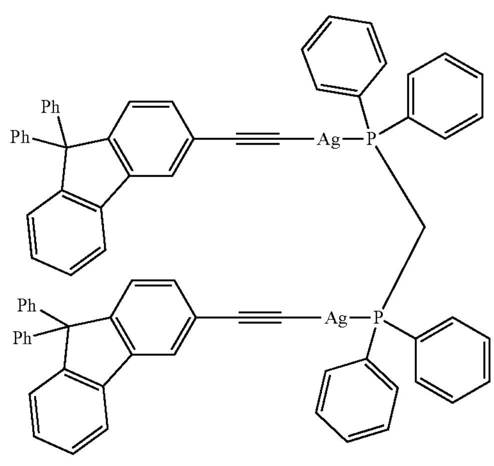
-continued
238
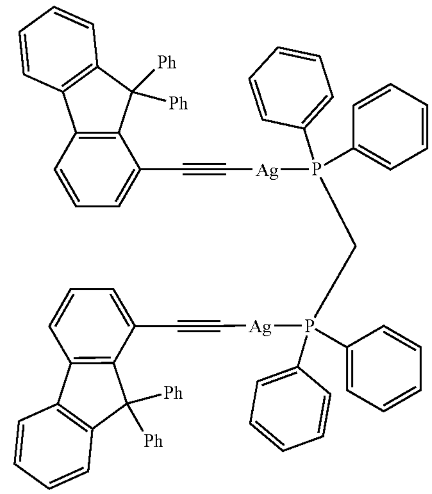
239
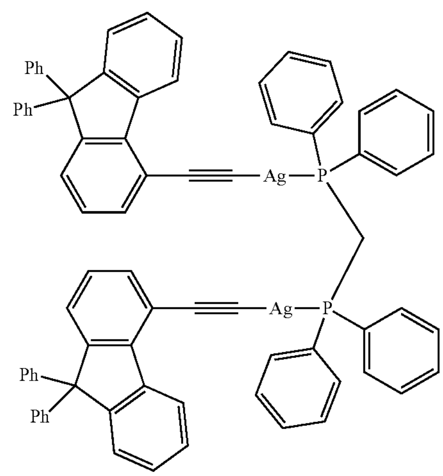
240
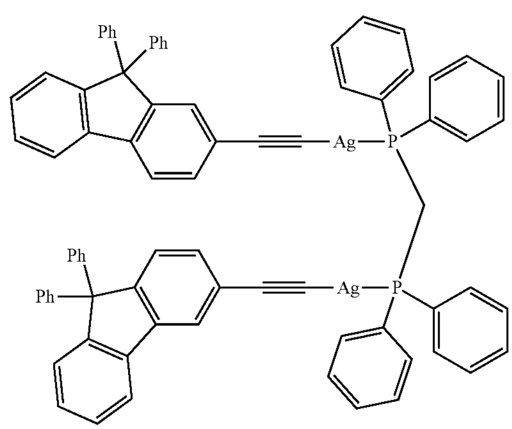

-continued
241
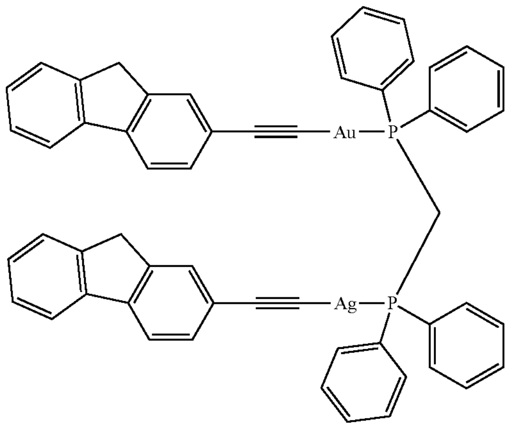
242
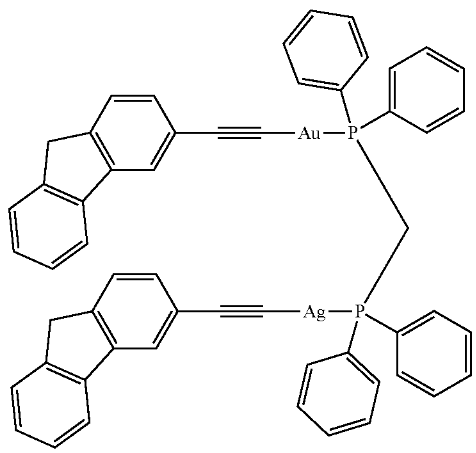
243
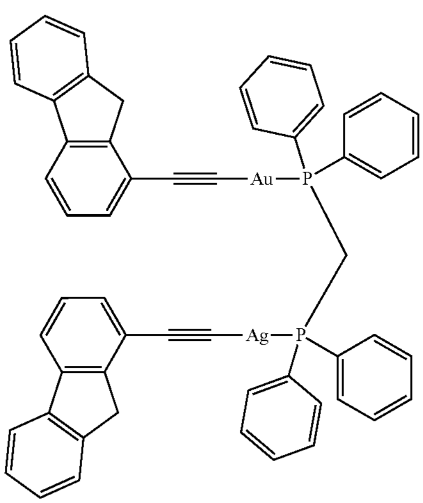
-continued
244
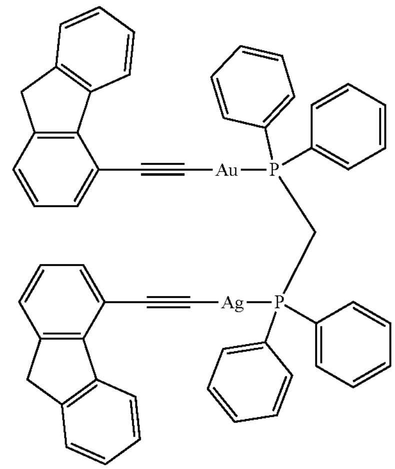
245
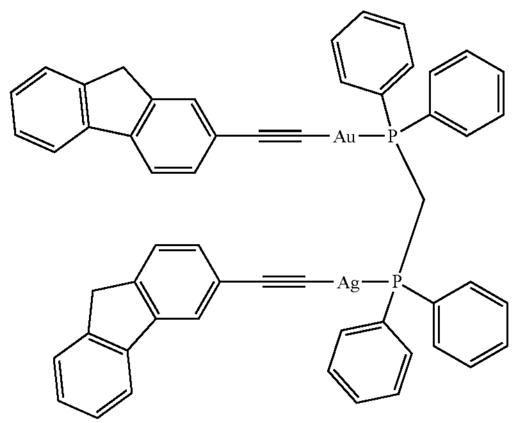
246
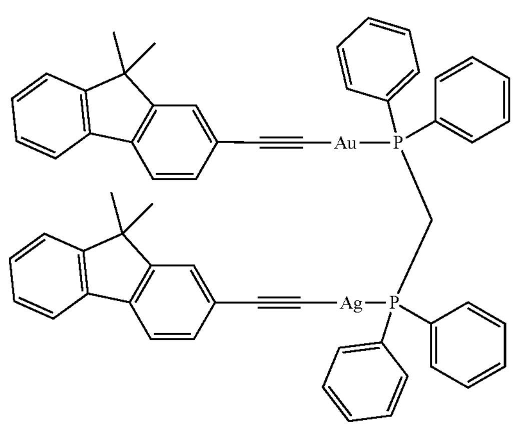

247
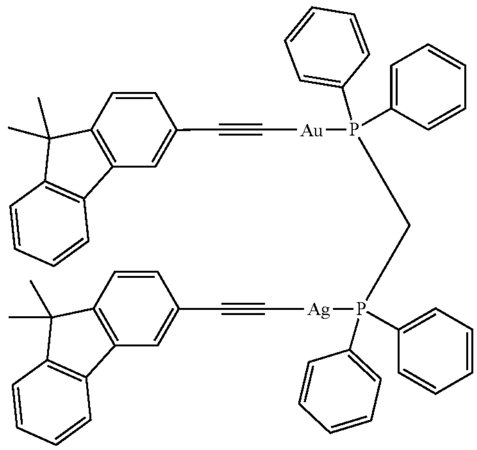
248
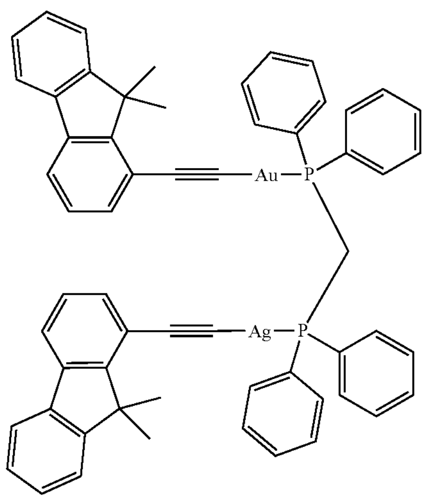
249
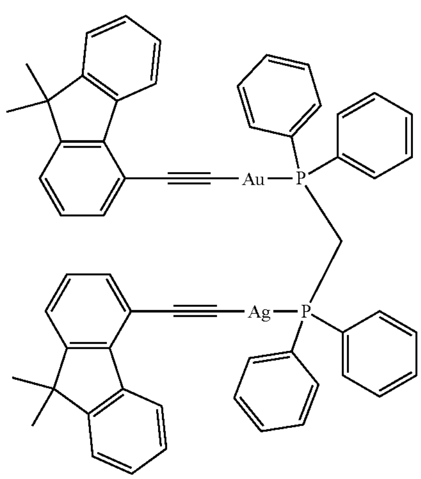
250
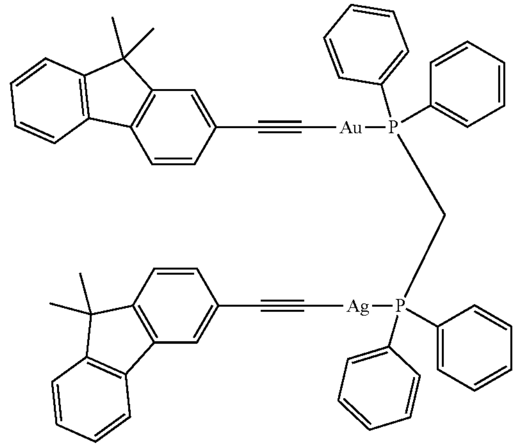
251
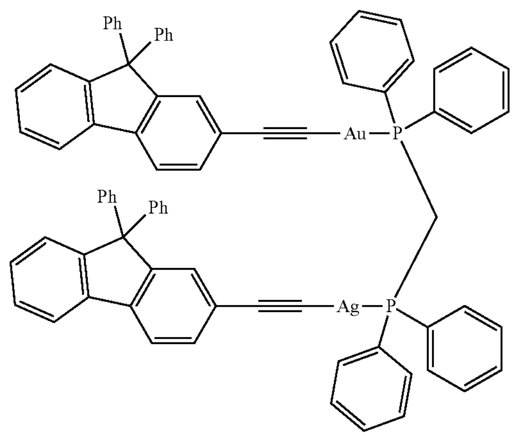
252
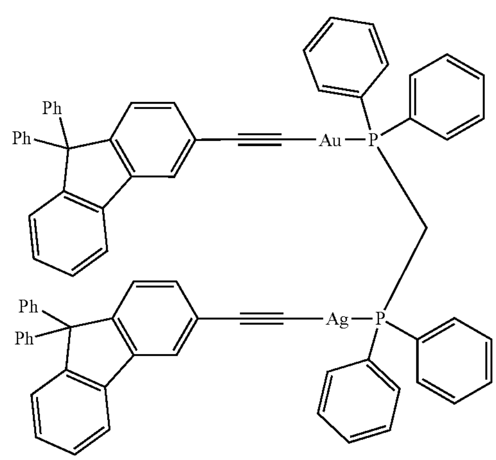

-continued
253
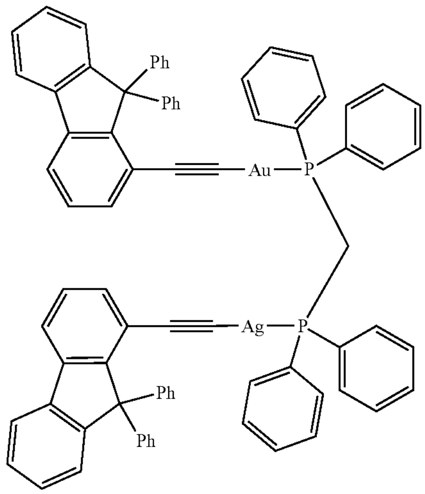
254
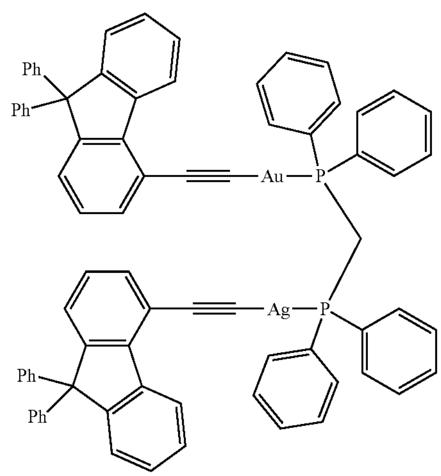
255
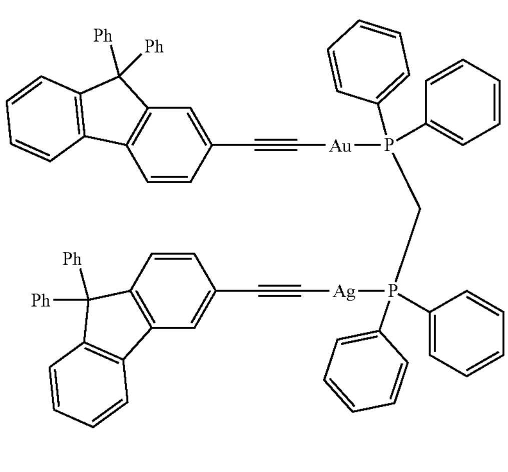
-continued
256
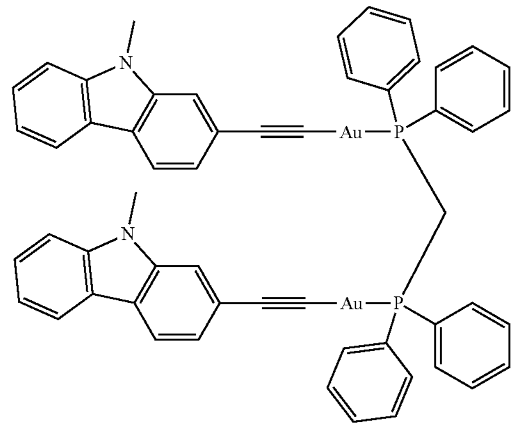
257
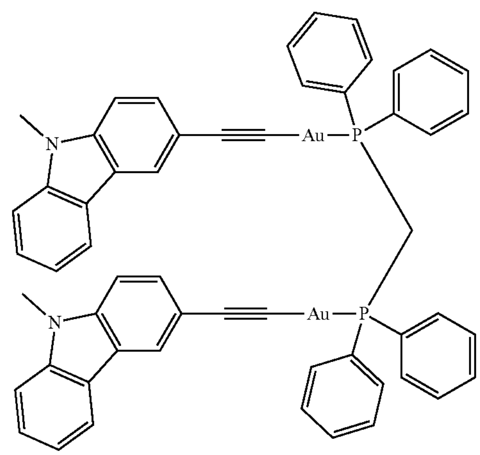
258
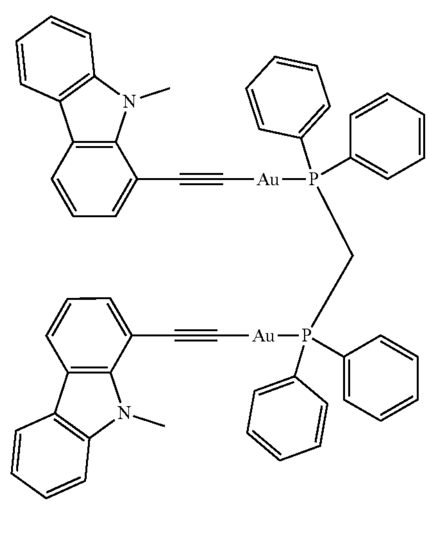

-continued
259
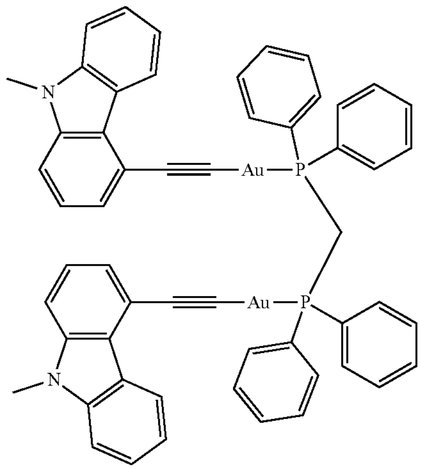
260
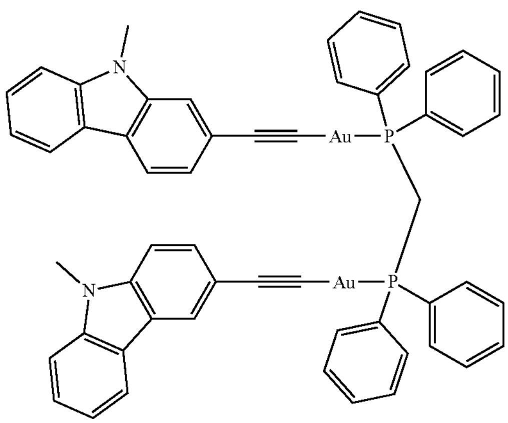
261
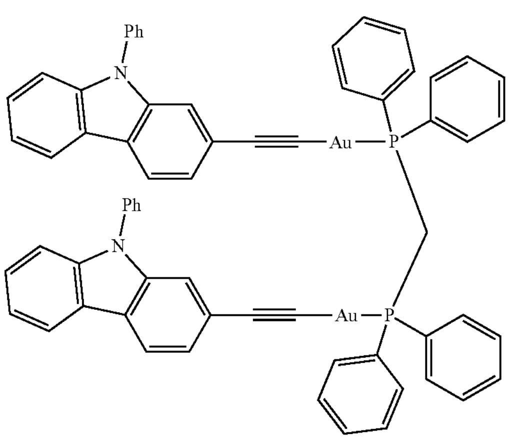
-continued
262
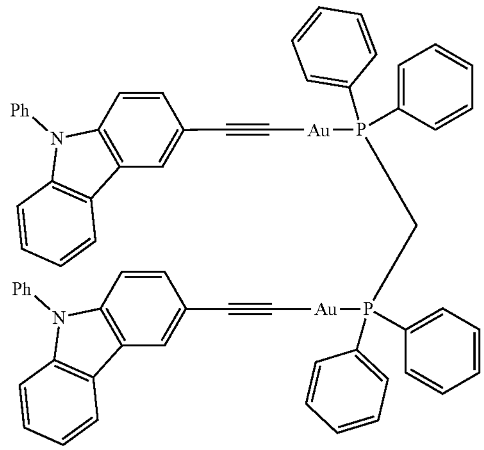
263
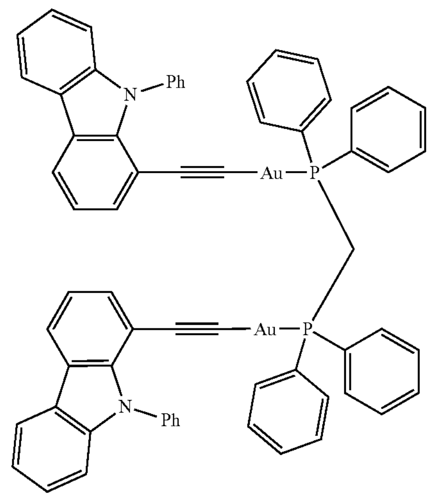
264
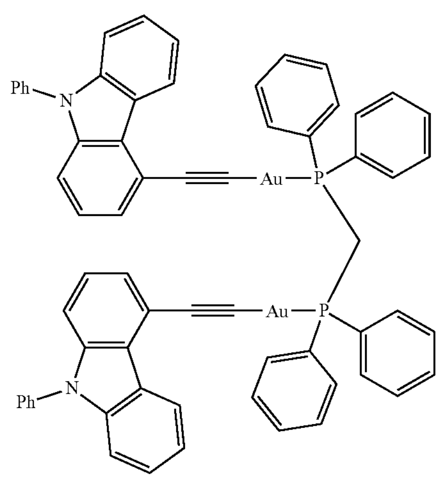

-continued
265
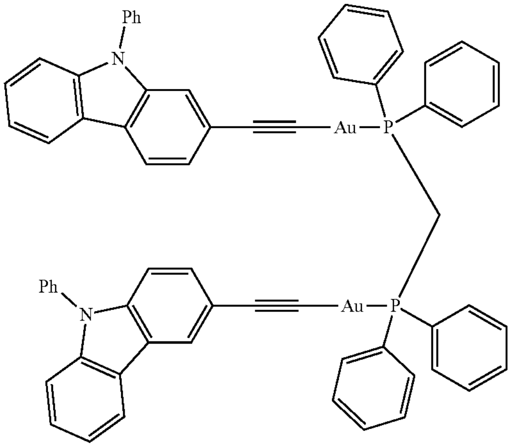
266
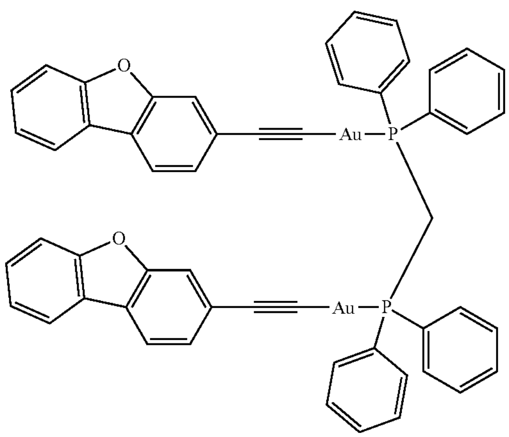
267
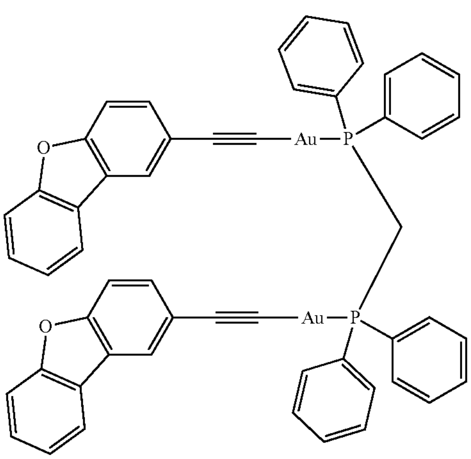
-continued
268
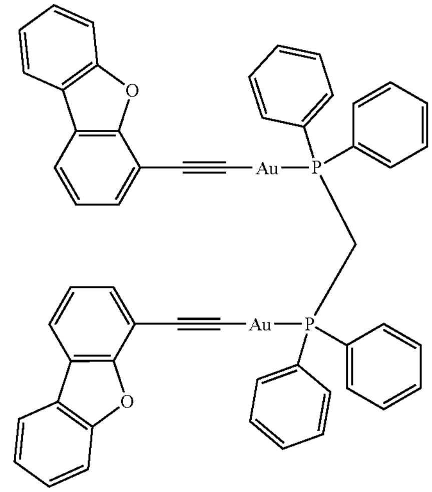
269
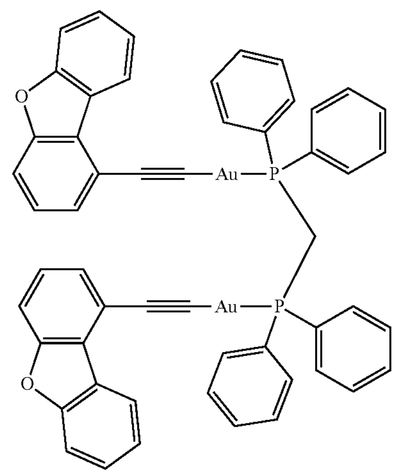
270
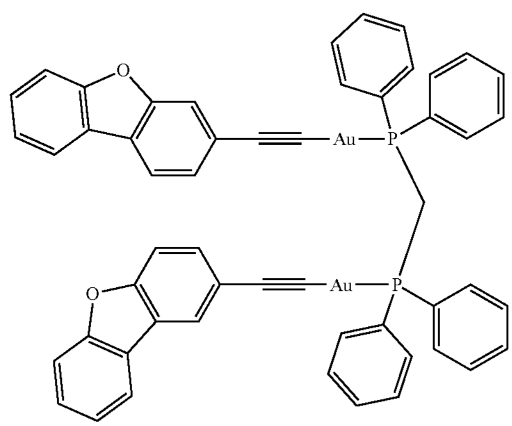

-continued
271
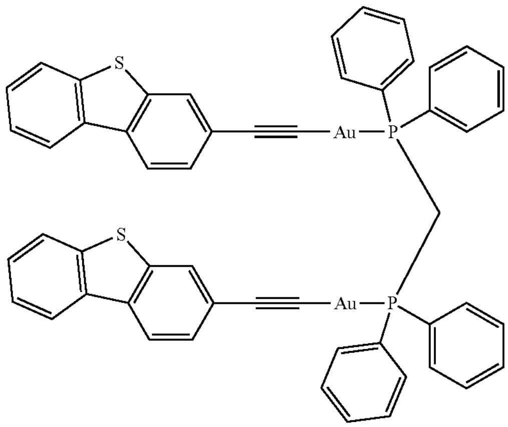
272
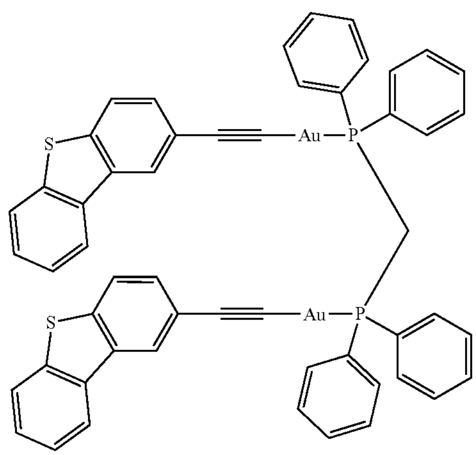
273
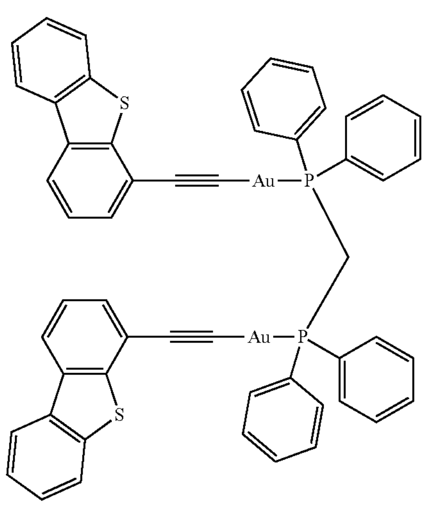
-continued
274
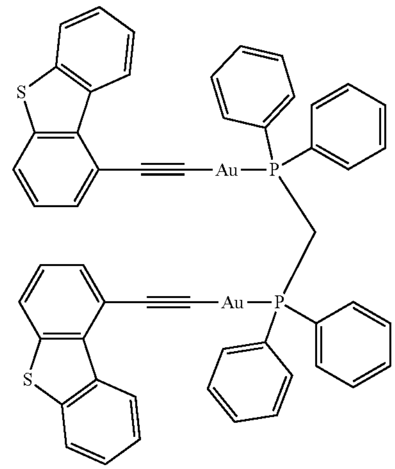
275
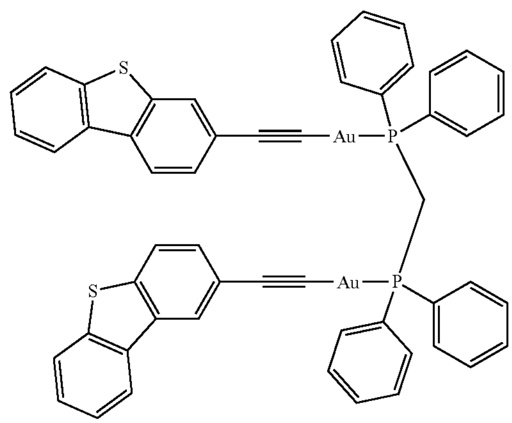
276
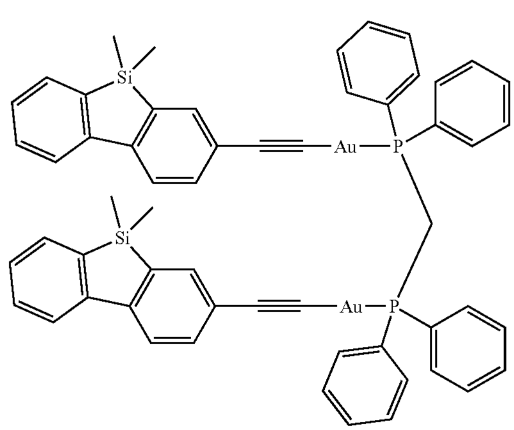

-continued
277
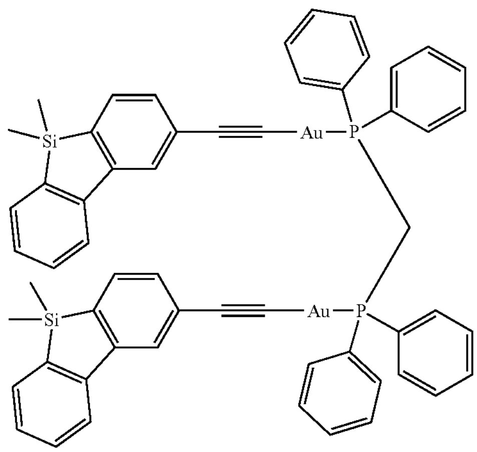
278
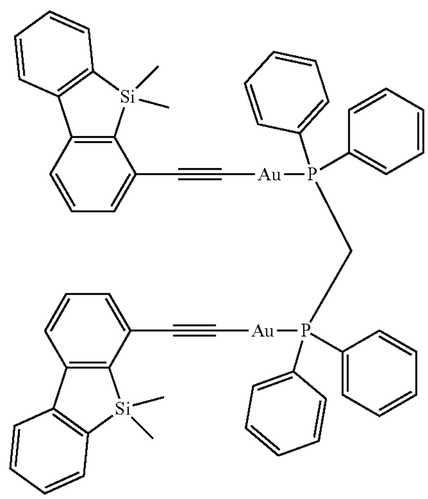
279
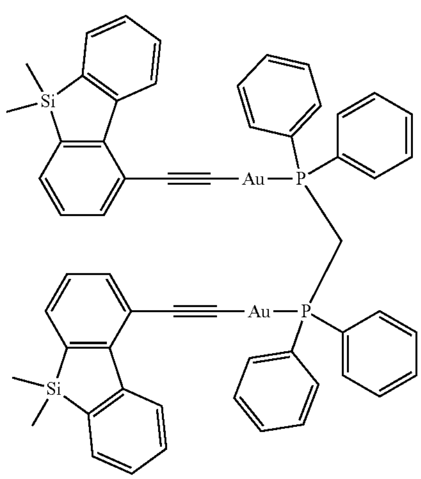
-continued
280
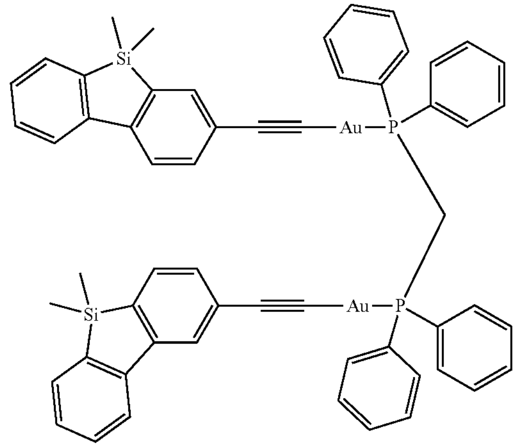
281
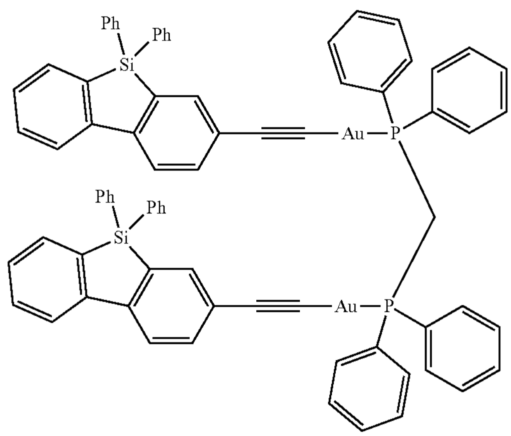
282
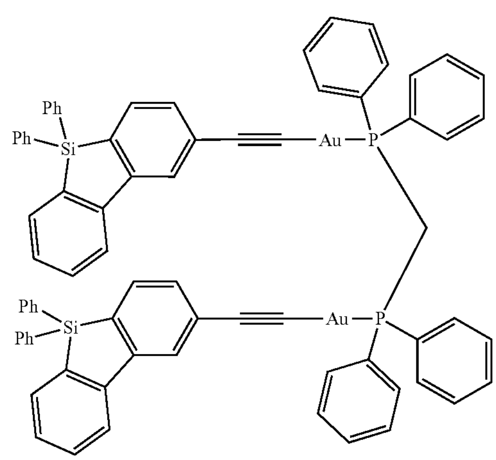

-continued
283
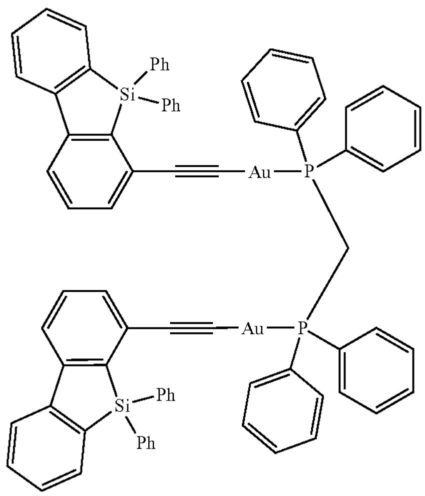
284
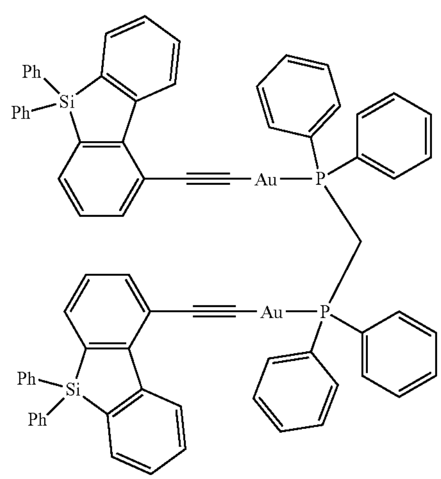
285
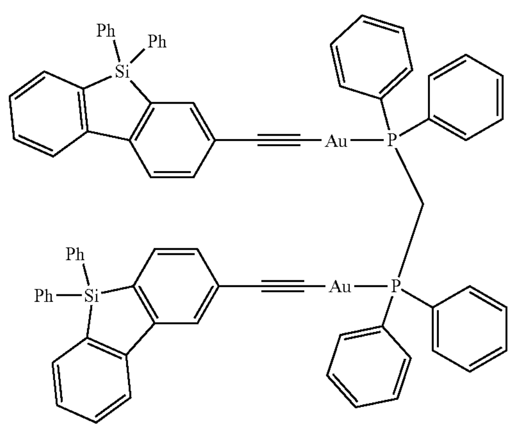
-continued
286
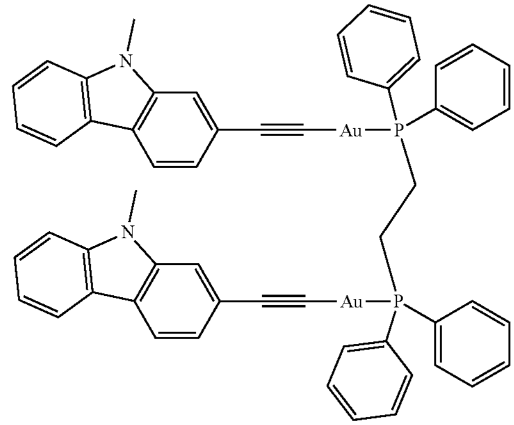
287
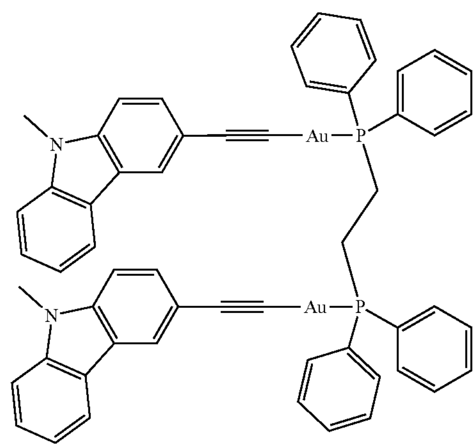
288
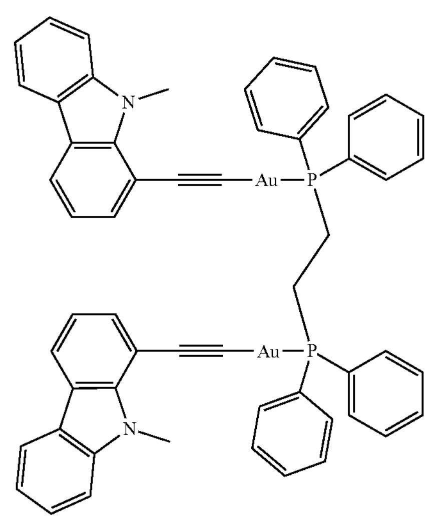

289
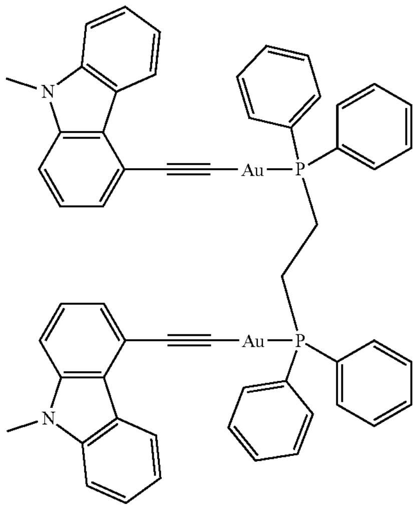
290
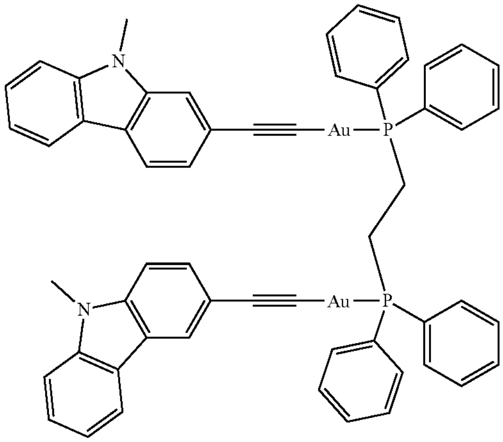
291
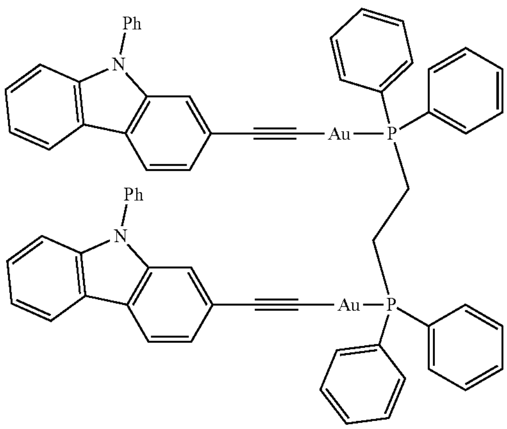
292
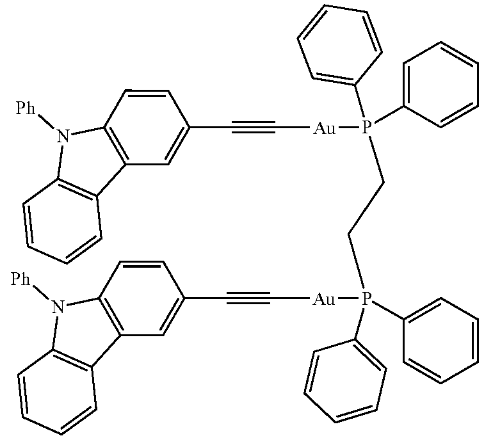
293
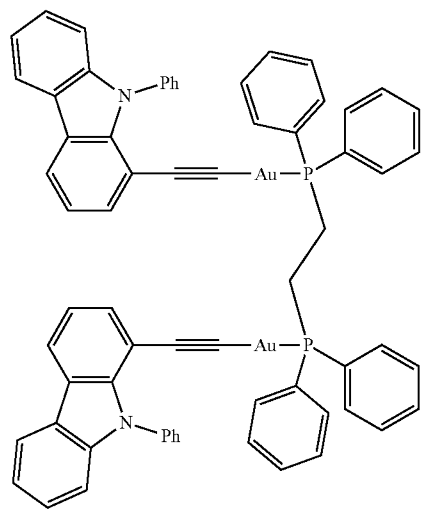
294
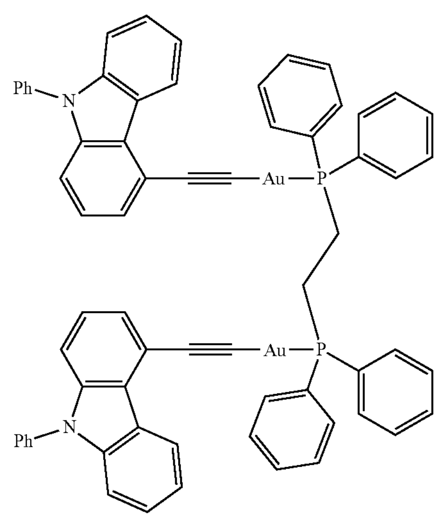

-continued
295
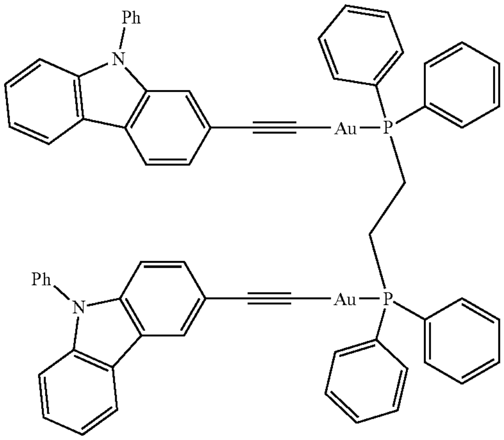
296
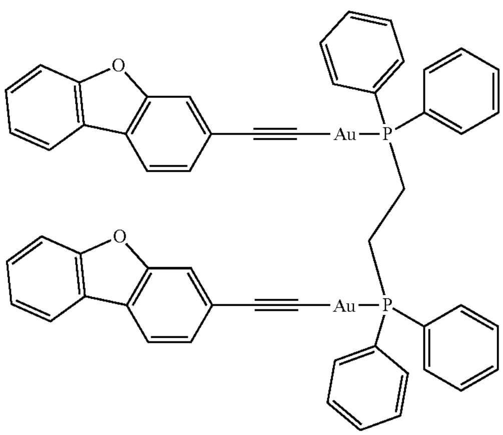
297
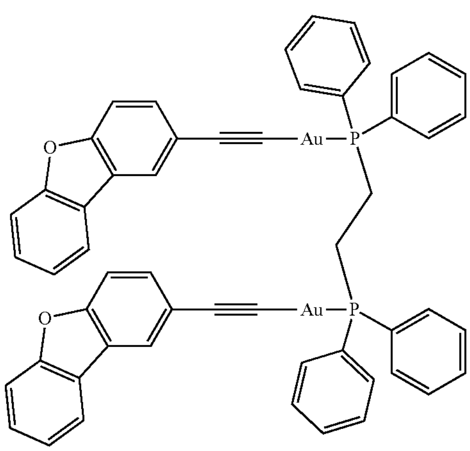
-continued
298
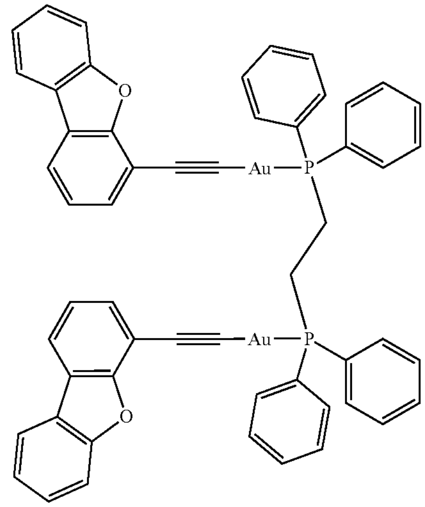
299
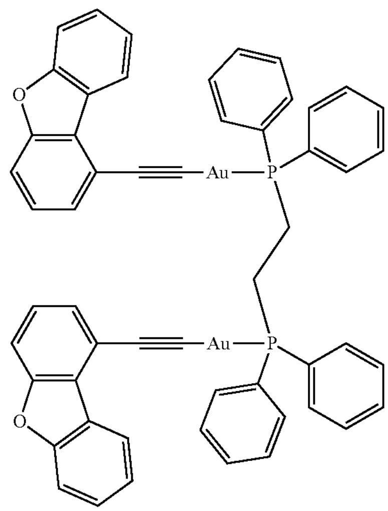
300
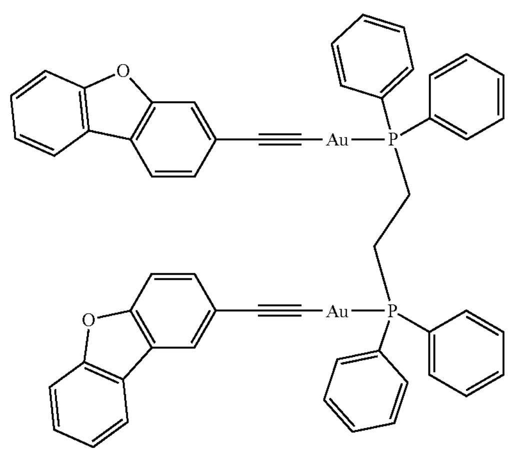

-continued
301
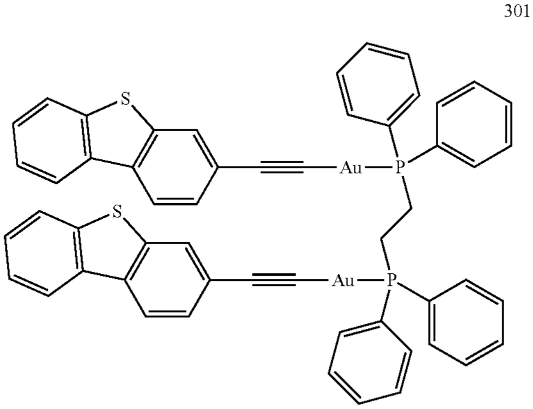
302
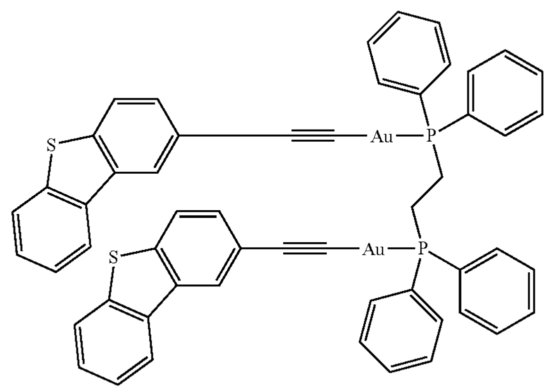
303
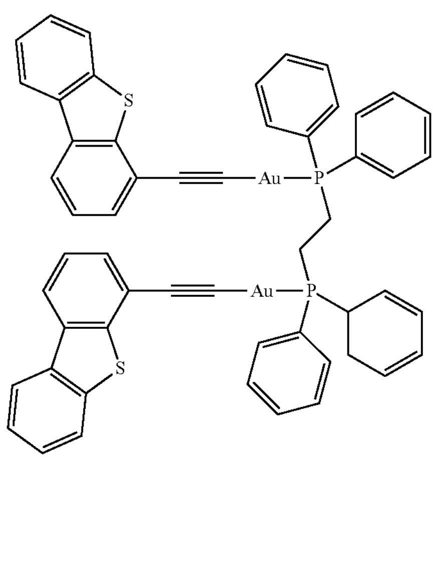
304
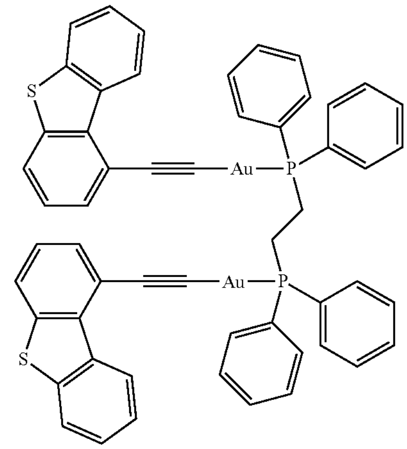
305
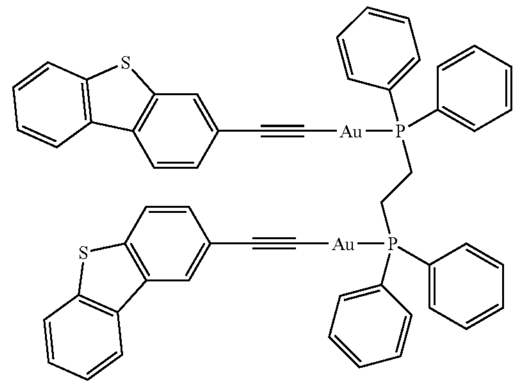
306
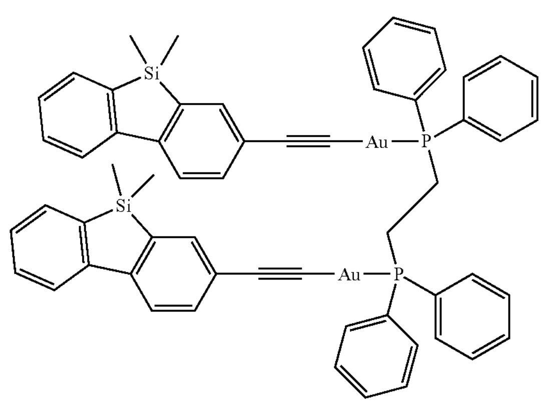

-continued
307
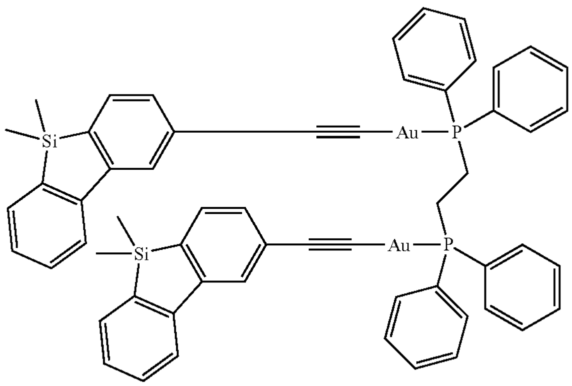
308
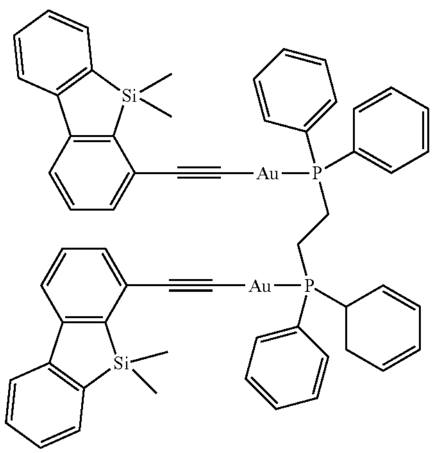
309
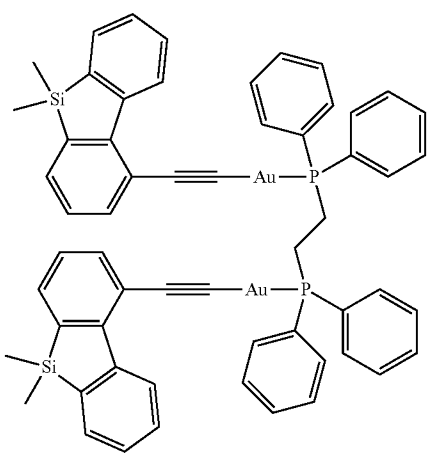
-continued
310
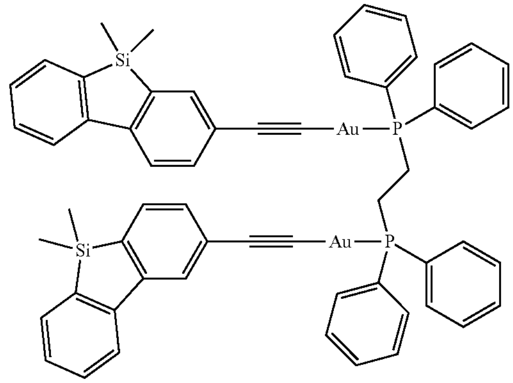
311
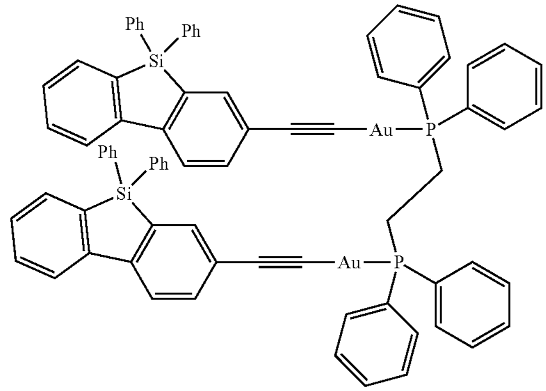
312
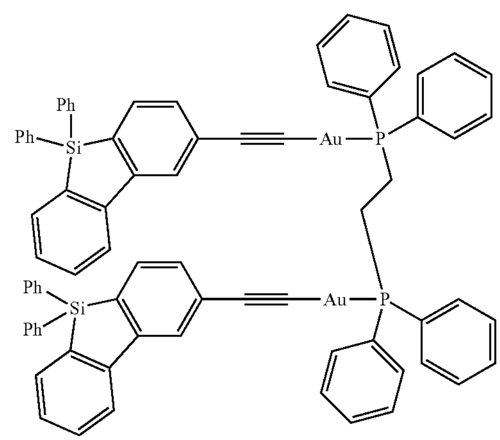

-continued
313
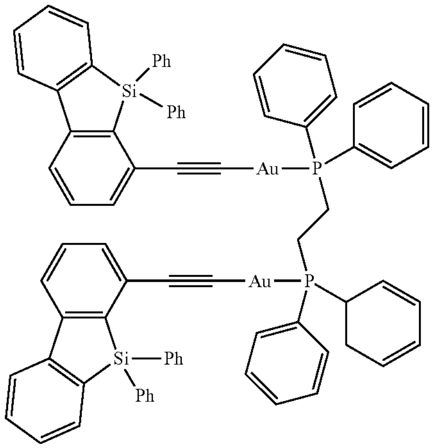
314
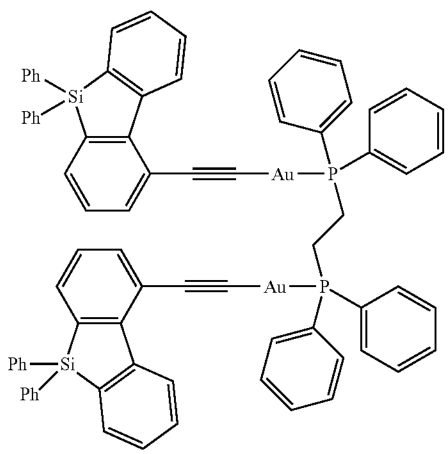
315
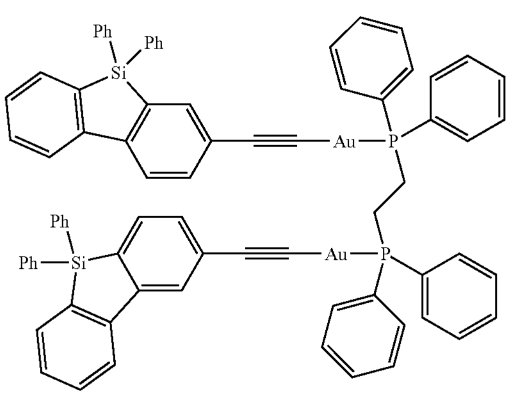
-continued
316
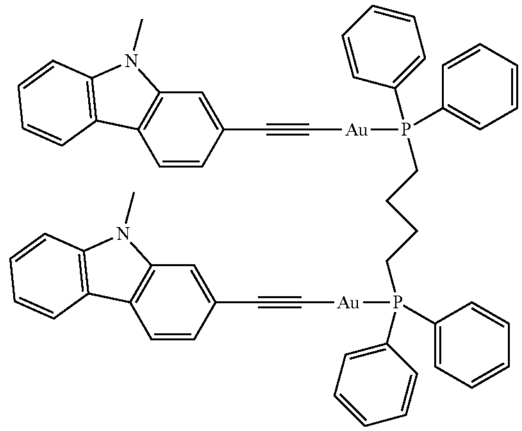
317
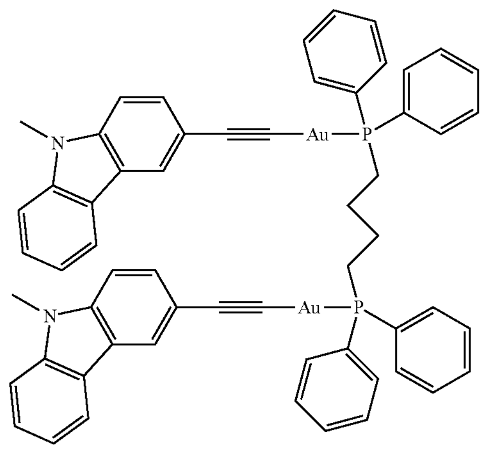
318
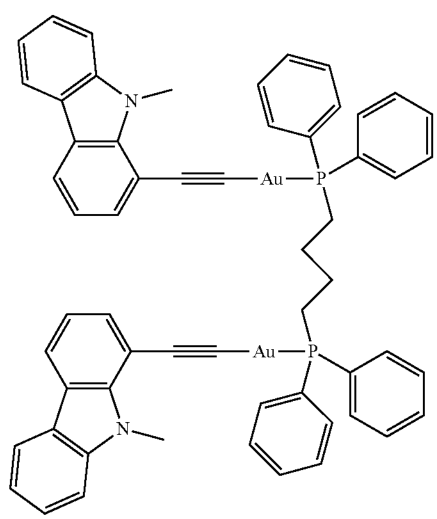

-continued
319
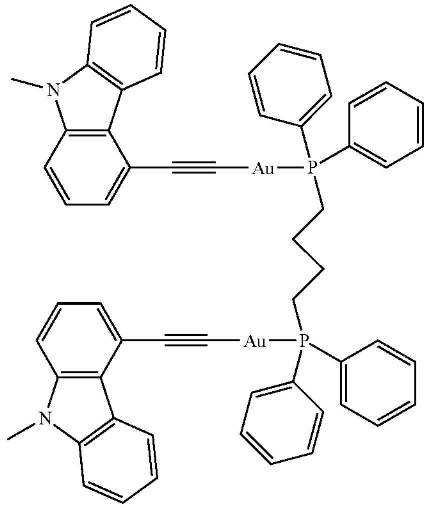
320
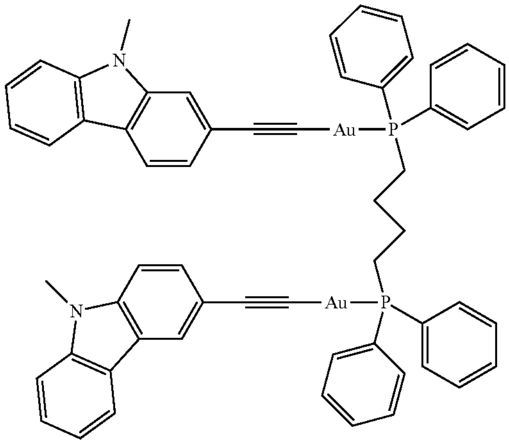
321
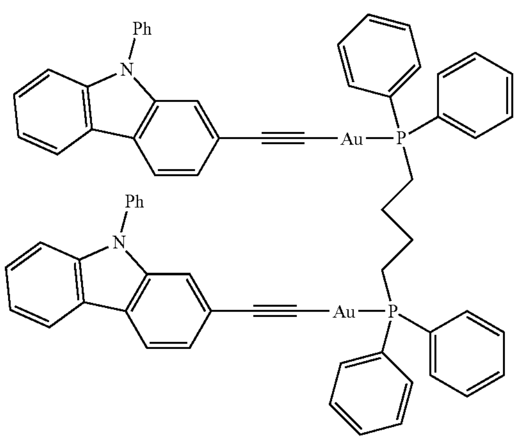
-continued
322
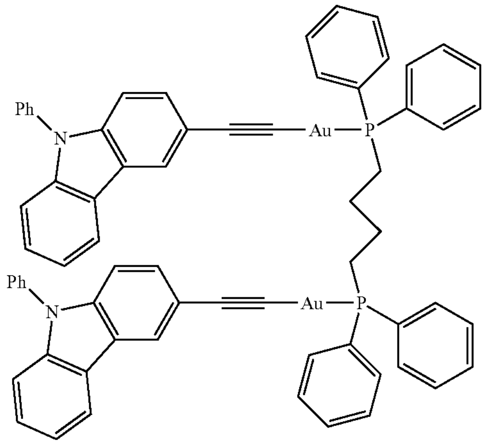
323
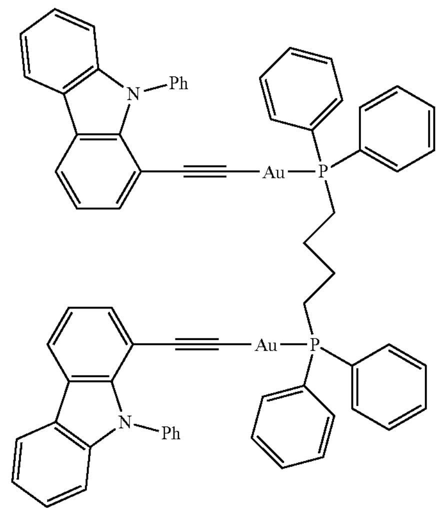
324
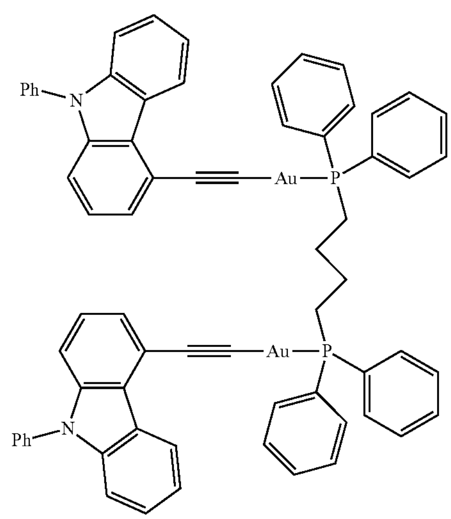

-continued
325
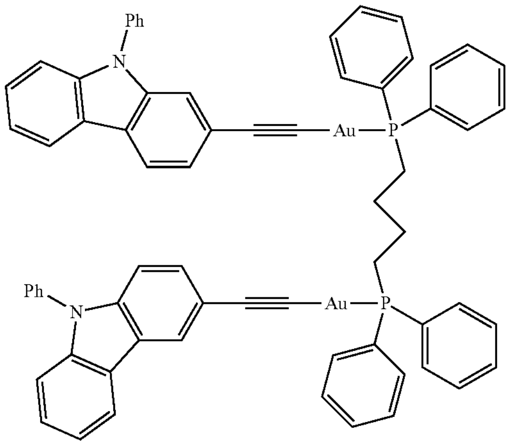
326
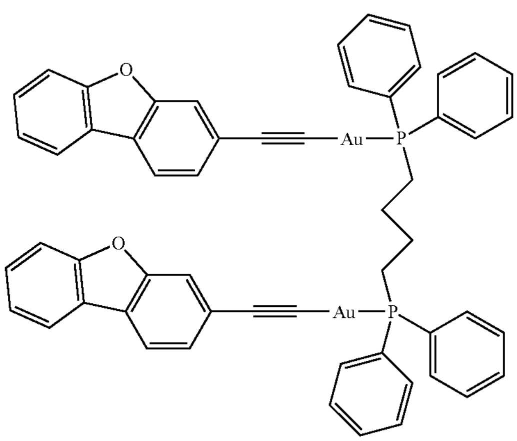
327
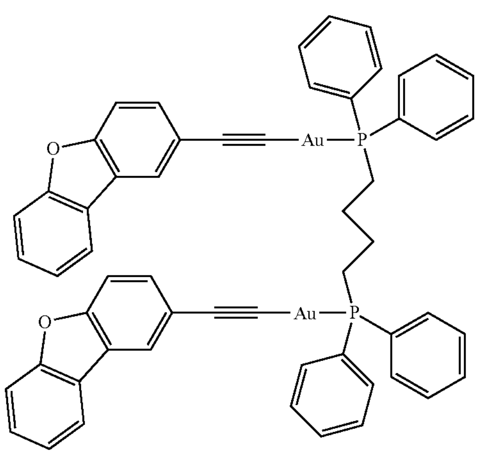
-continued
328
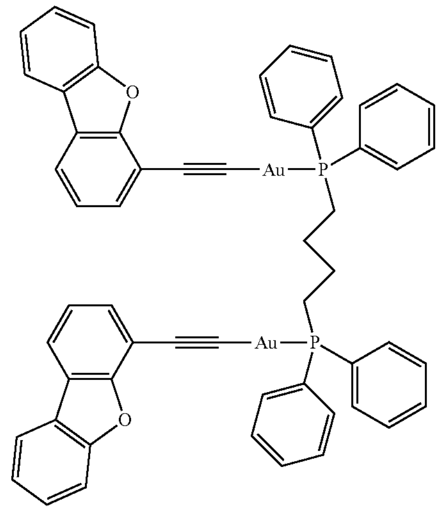
329
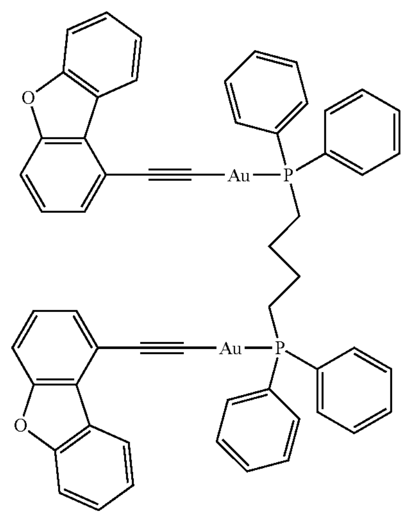
330
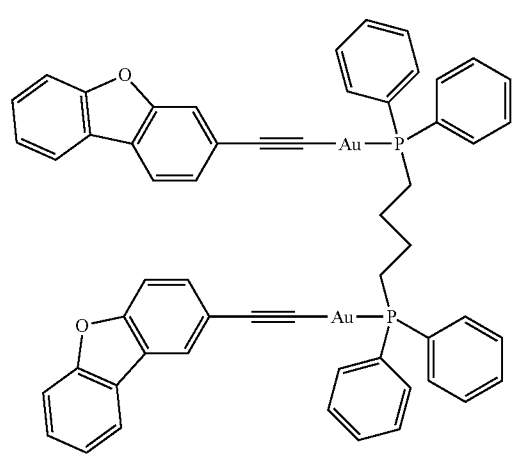

-continued
331
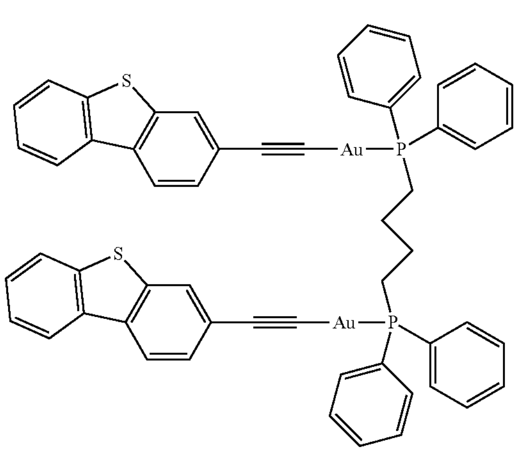
332
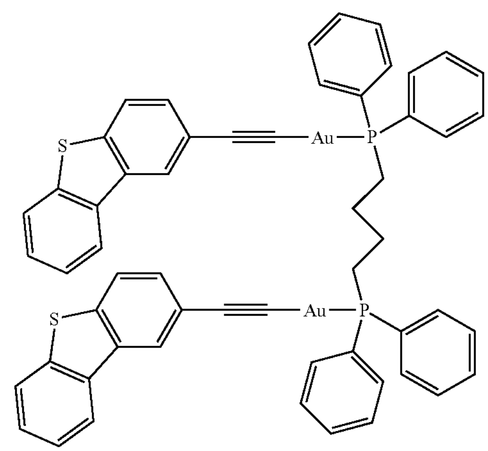
333
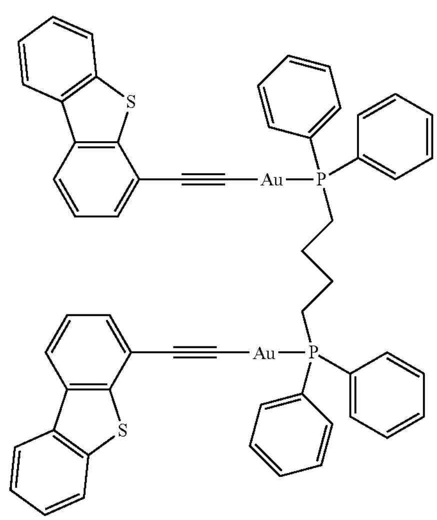
-continued
334
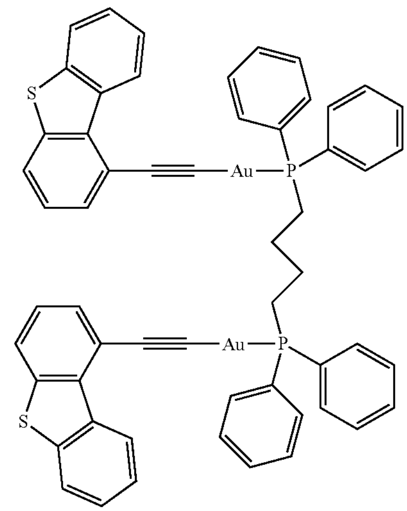
335
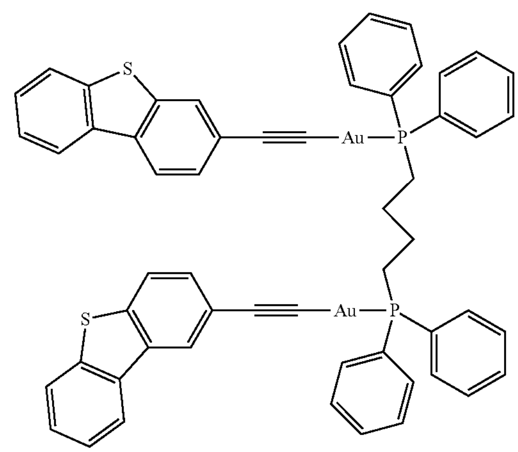
336
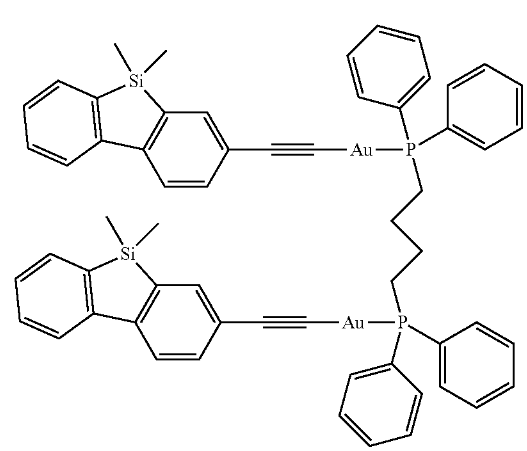

-continued
337
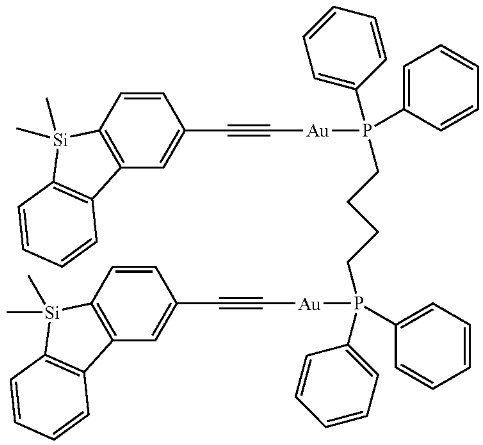
338
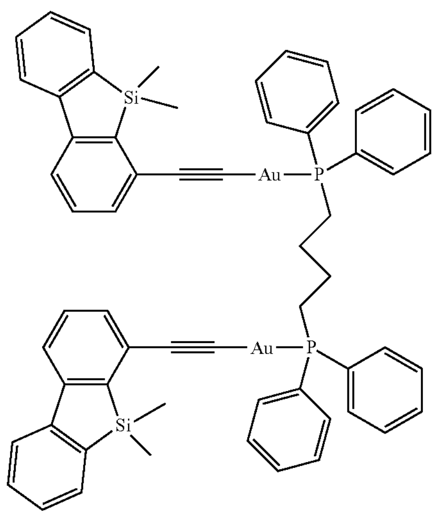
339
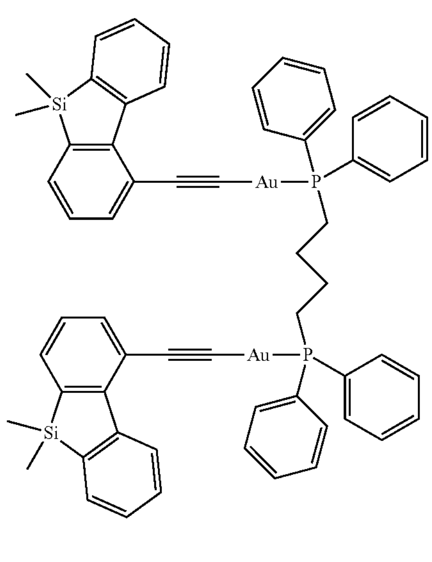
-continued
340
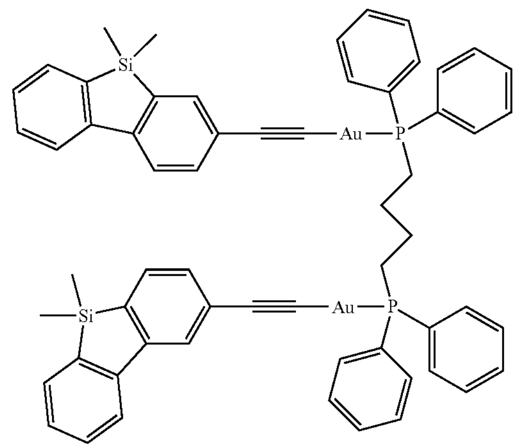
341
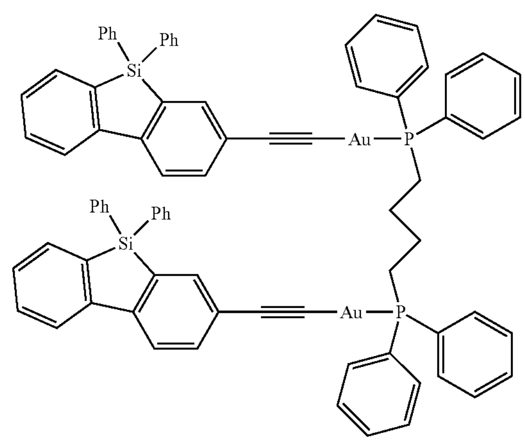
342
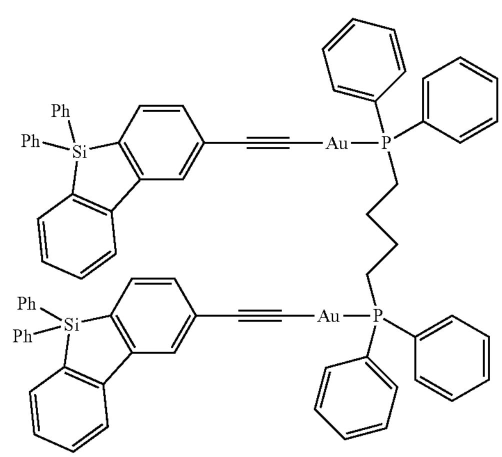

-continued
343
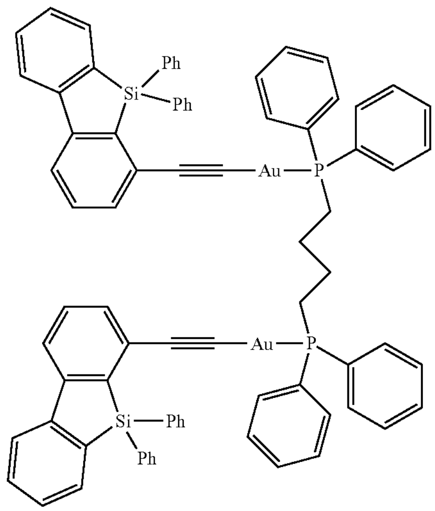
344
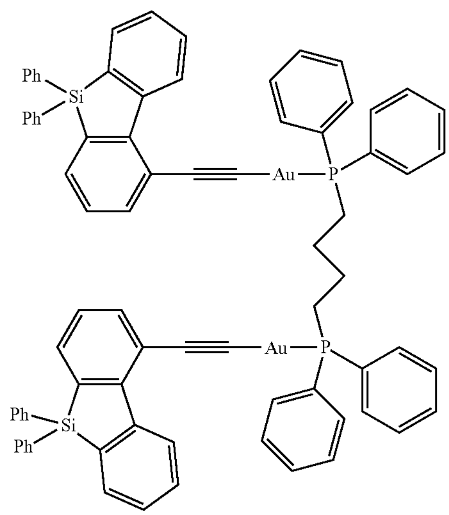
345
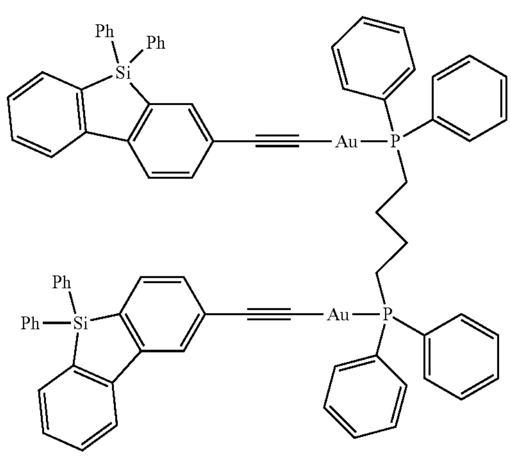
-continued
346
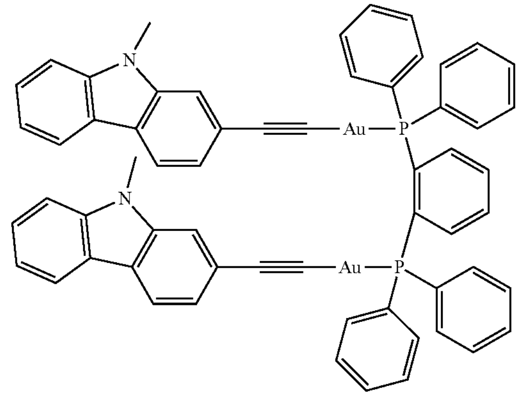
347
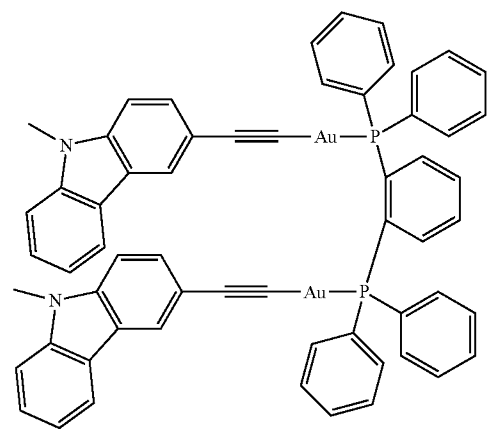
348
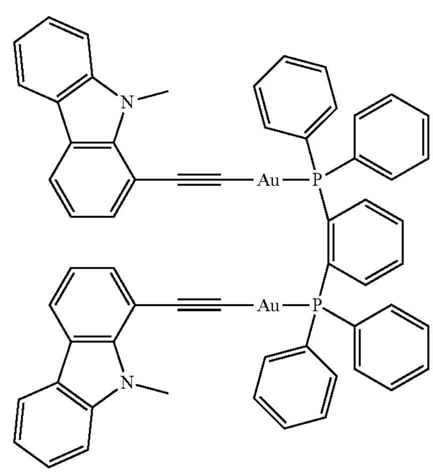

-continued
349
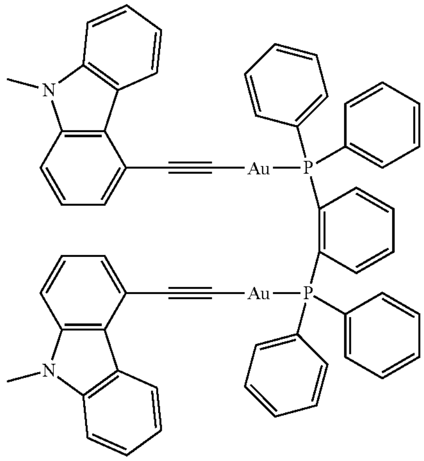
350
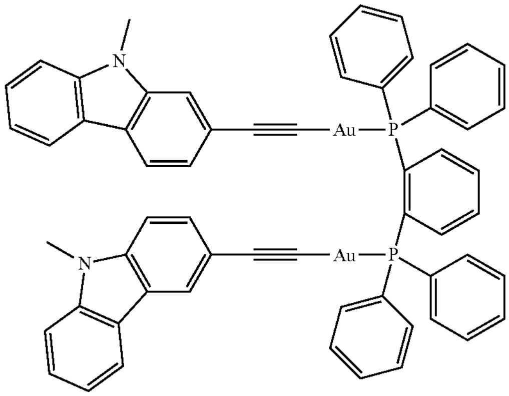
351
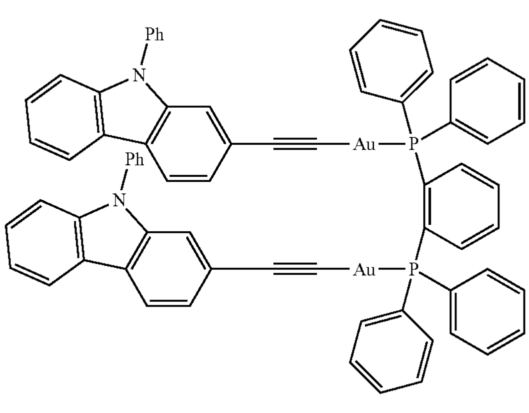
-continued
352
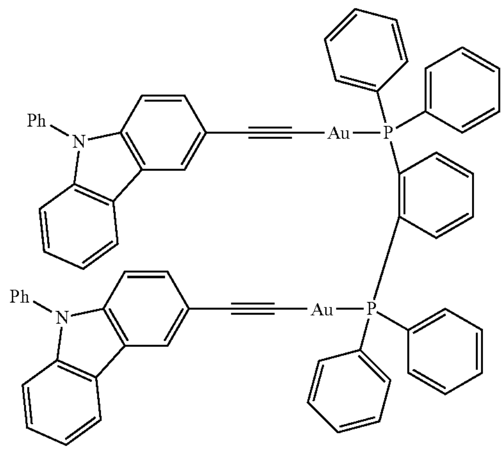
353
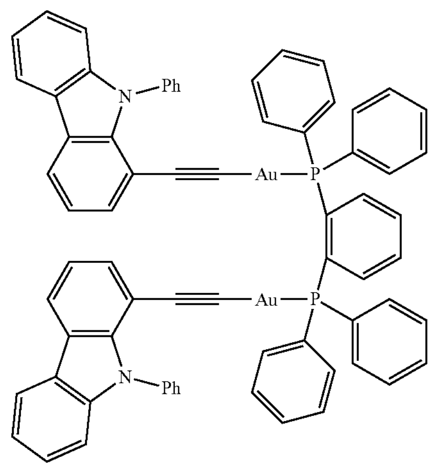
354
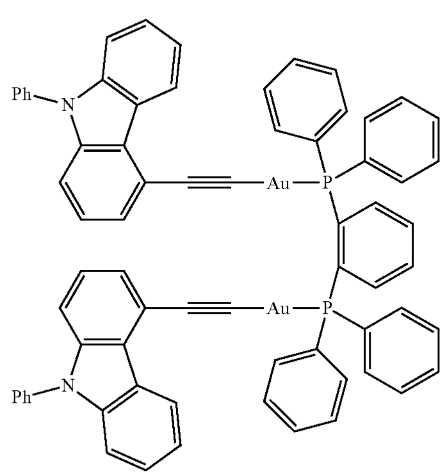

355
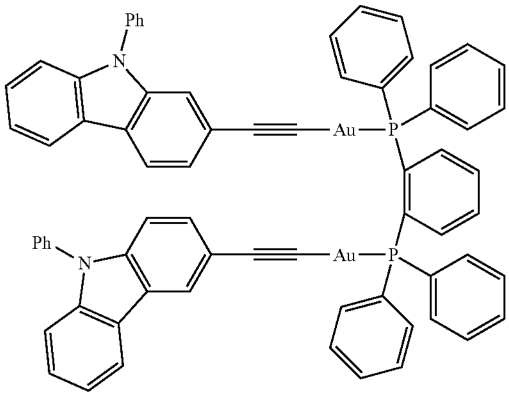
356
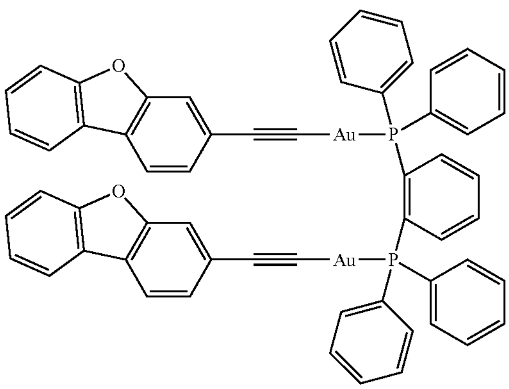
357
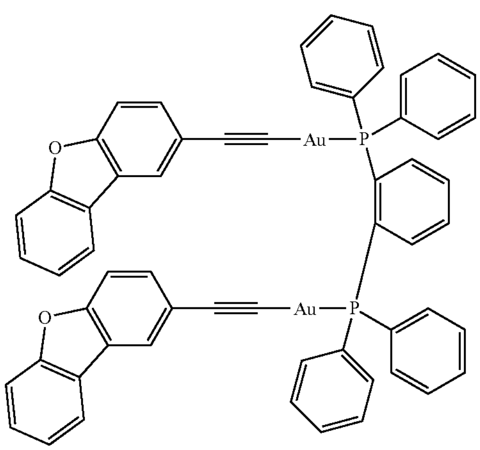
358
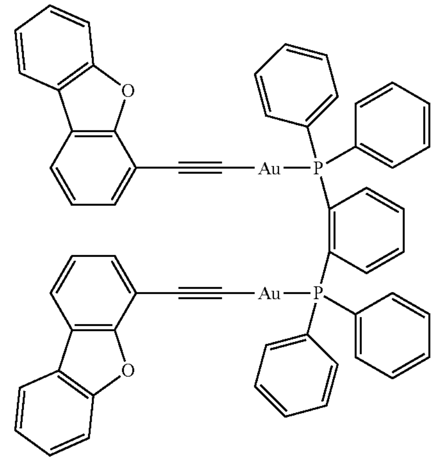
359
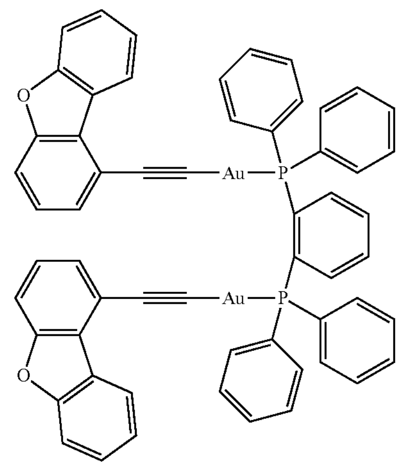
360
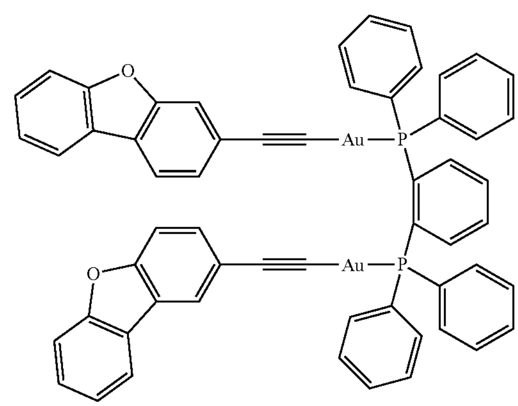

-continued
361
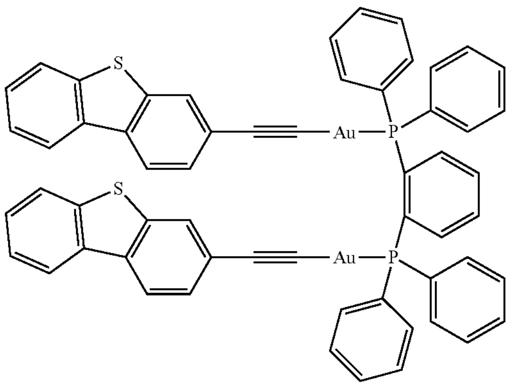
362
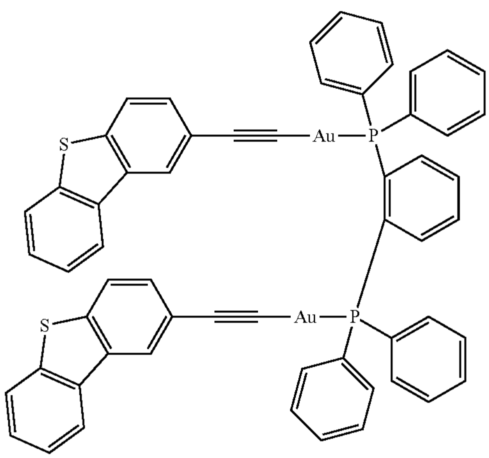
363
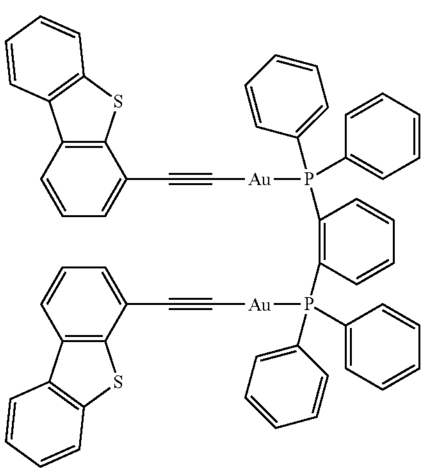
-continued
364
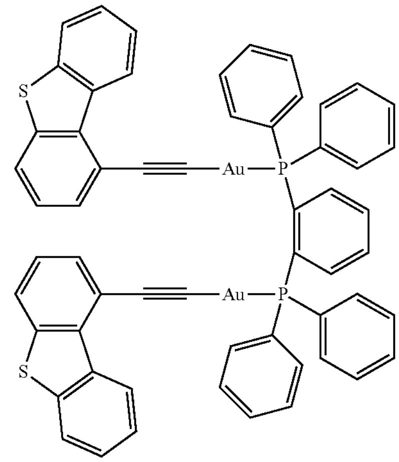
365
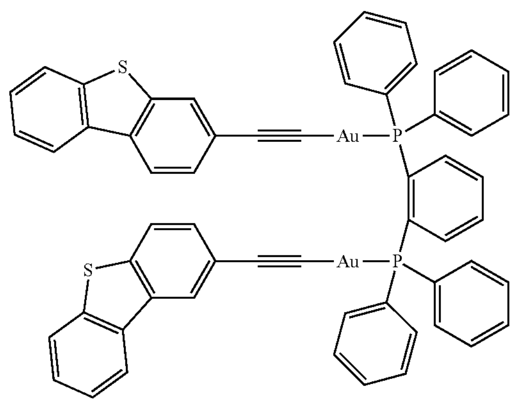
366
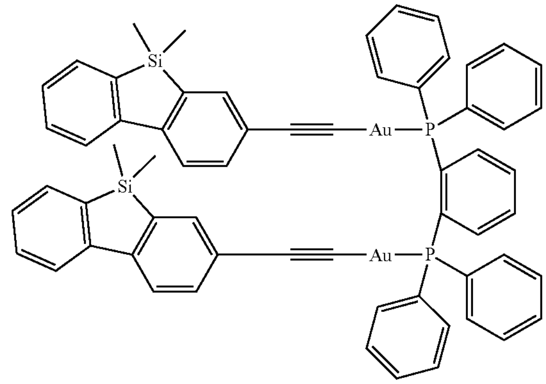

-continued
367
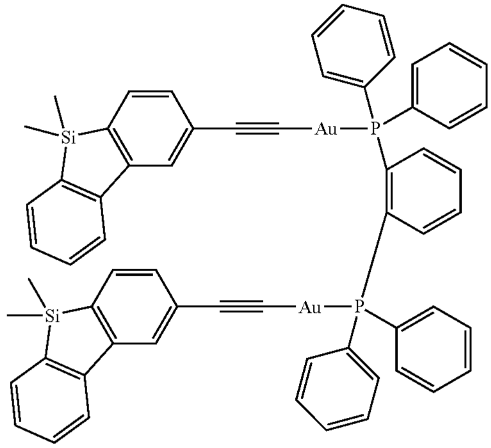
368
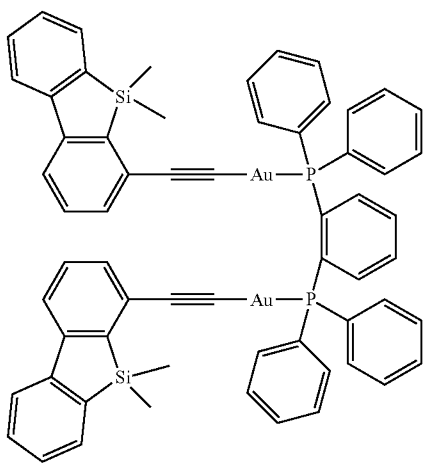
369
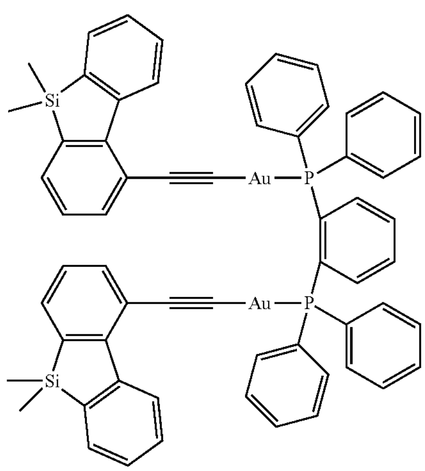
-continued
370
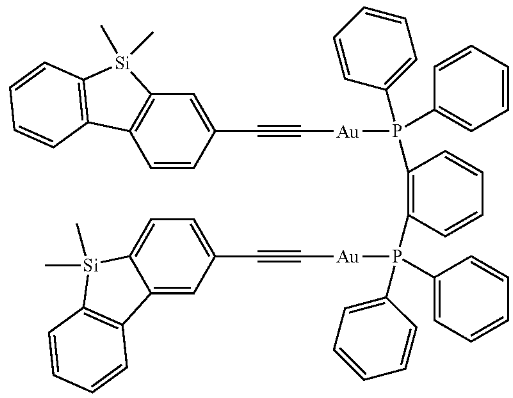
371
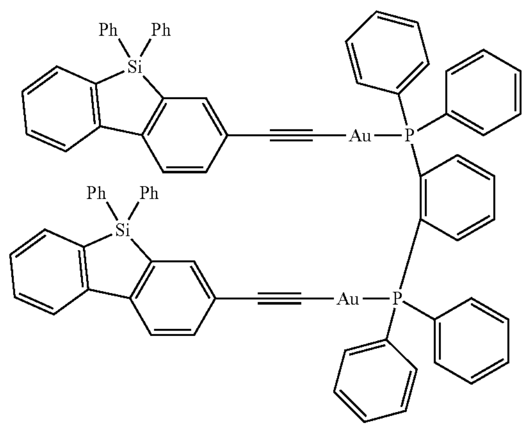
372
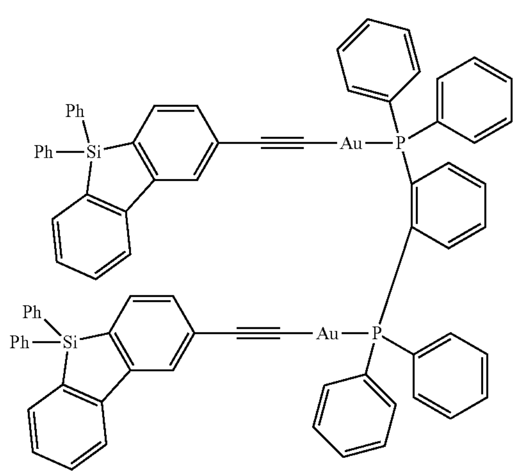

373
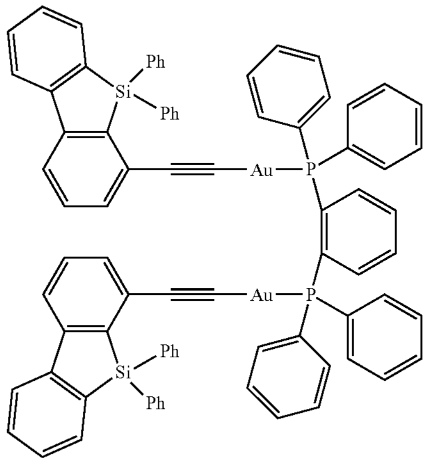
374
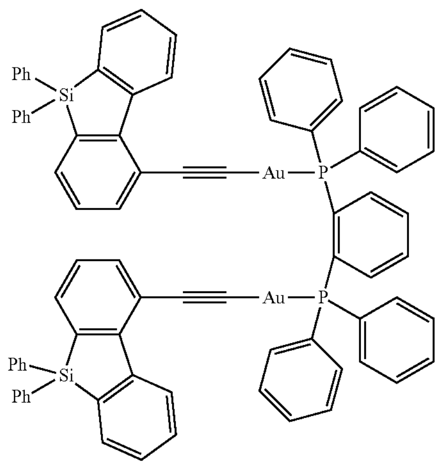
375
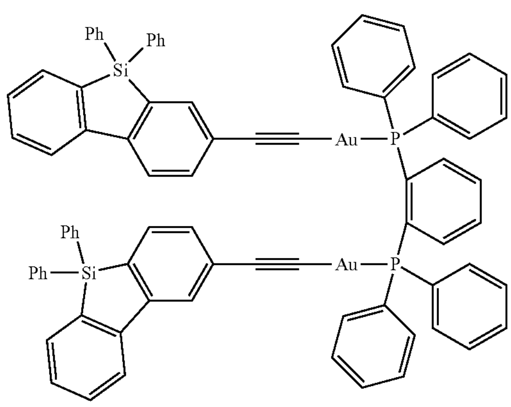
376
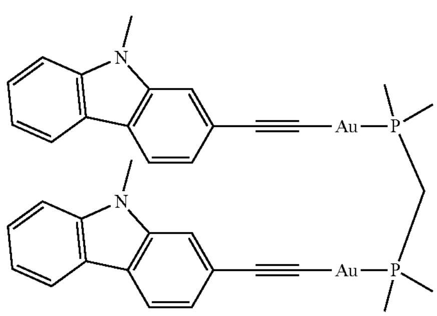
377
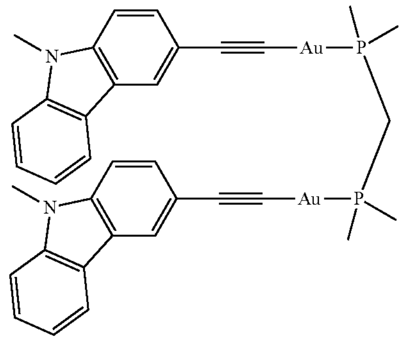
378
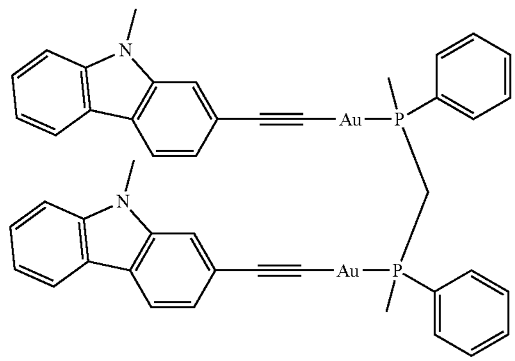
379
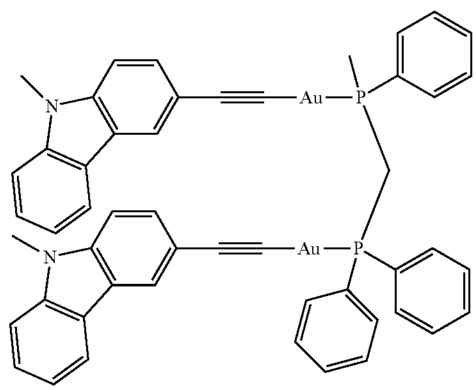
380
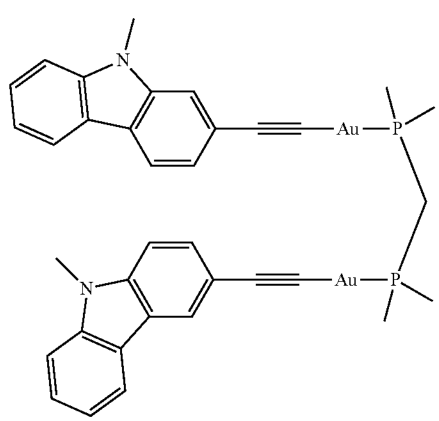

-continued
381
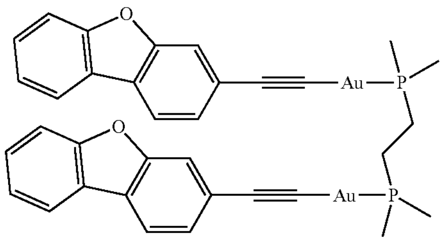
382
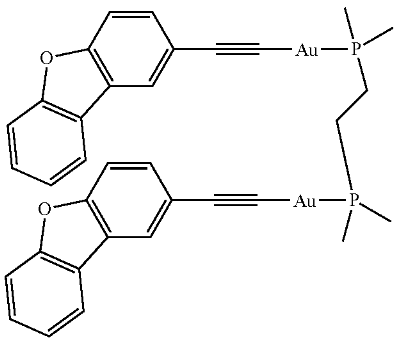
383
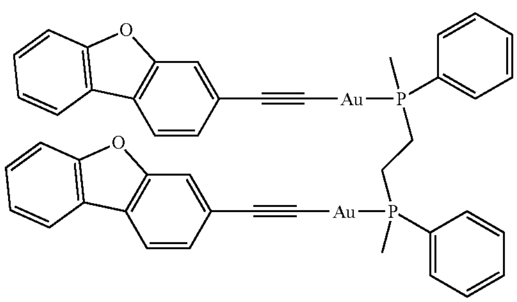
384
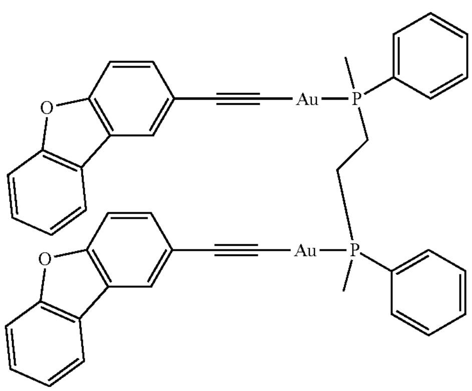
385
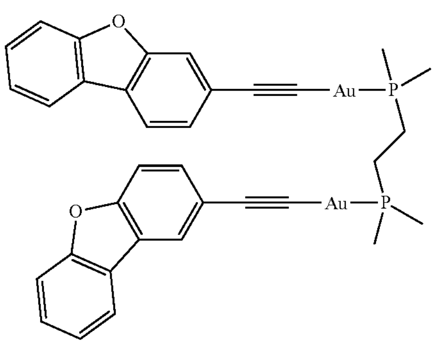
-continued
386
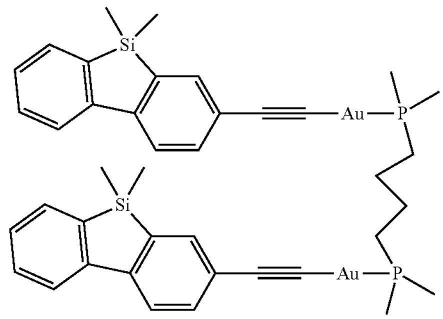
387
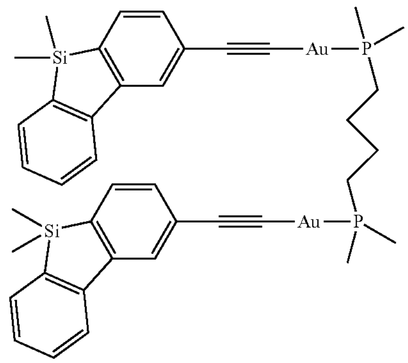
388
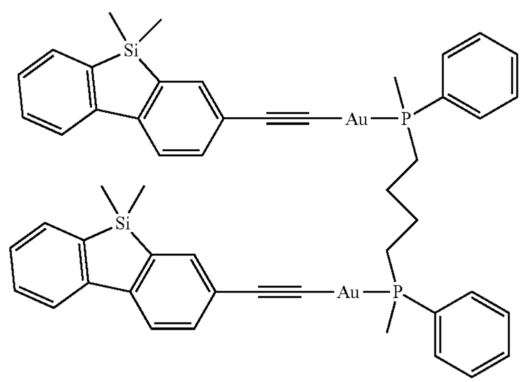
389
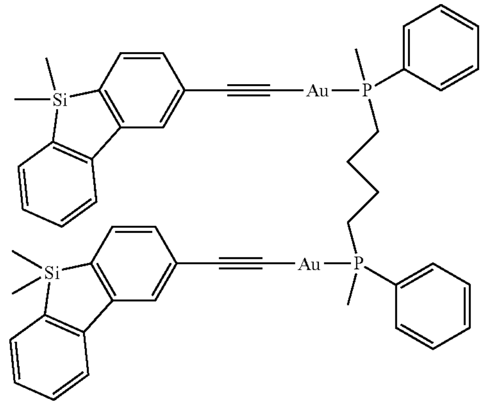

-continued
390
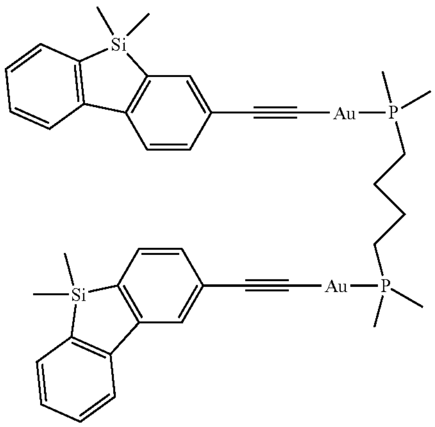
391
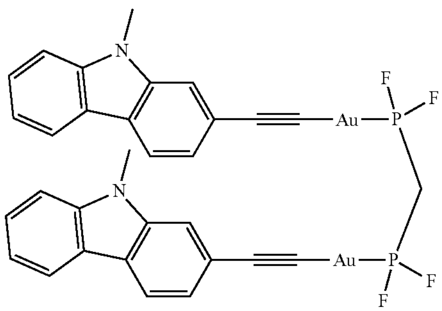
392
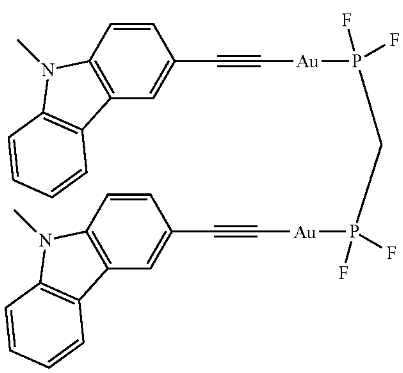
393
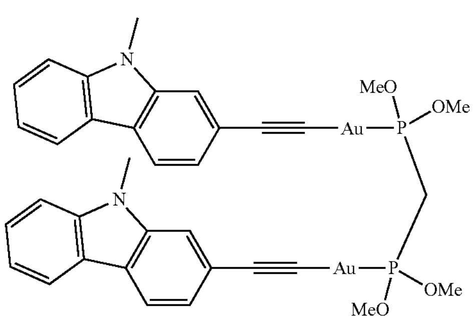
-continued
394
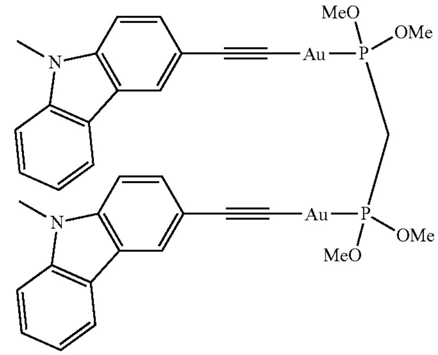
395
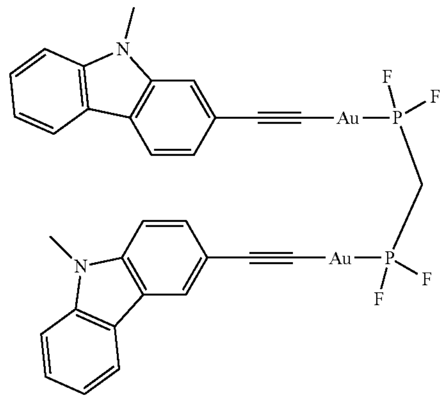
396
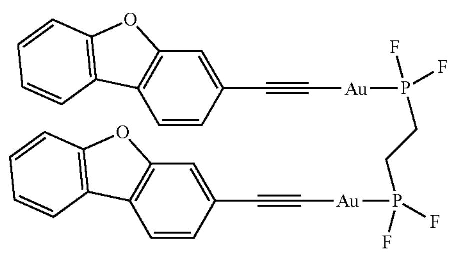
397
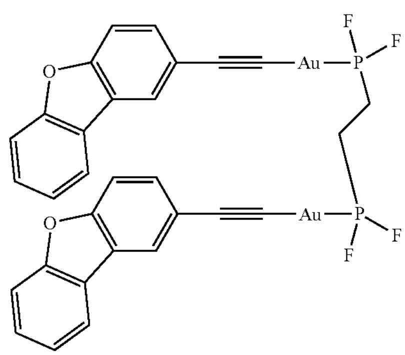
398
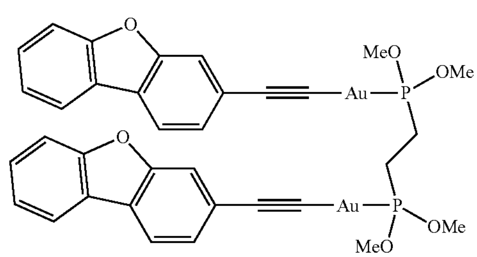

399
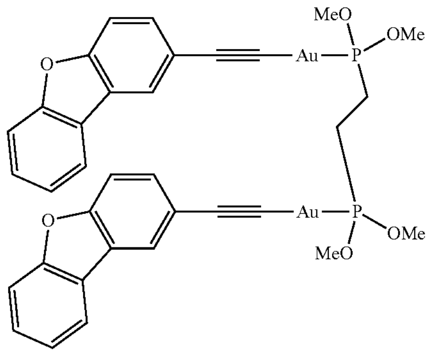
400
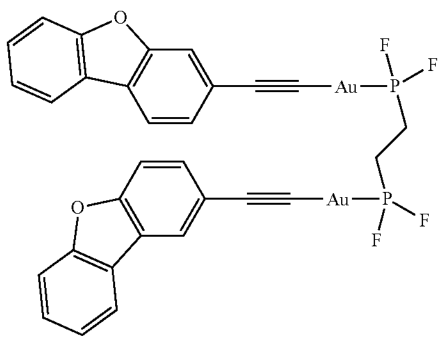
401
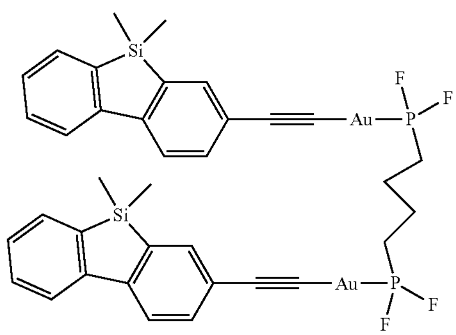
402
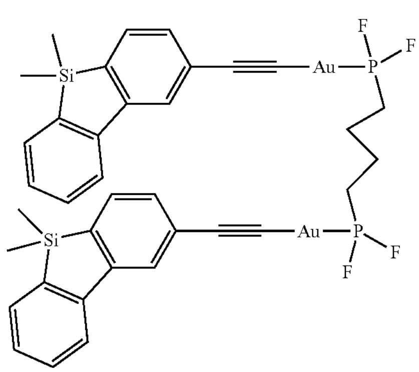
403
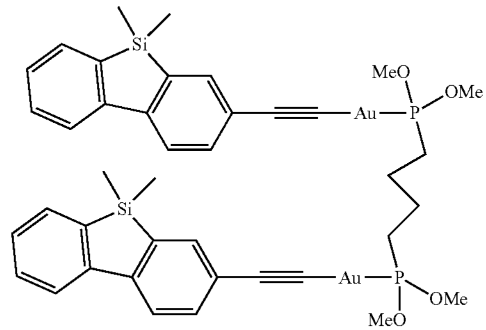
404
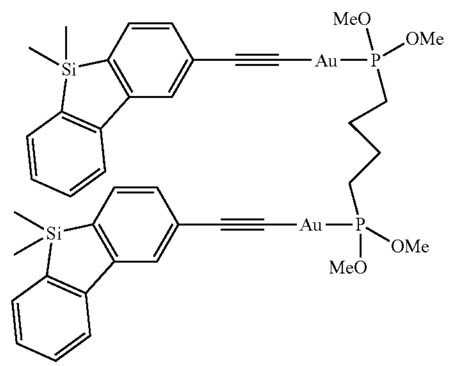
405
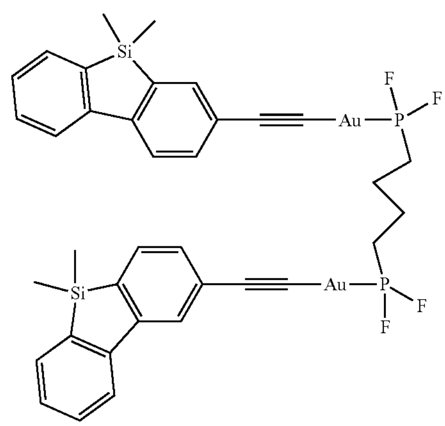
406
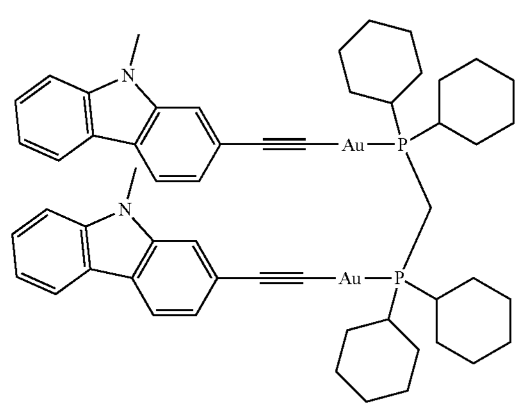

407
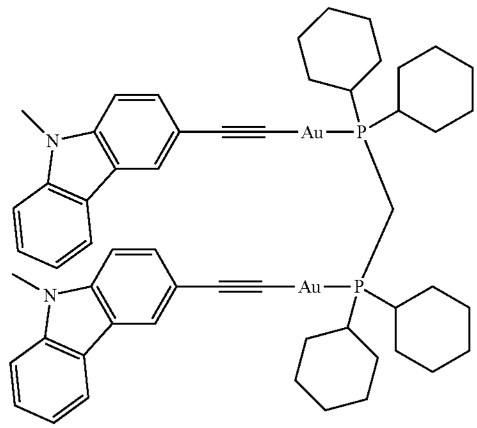
408
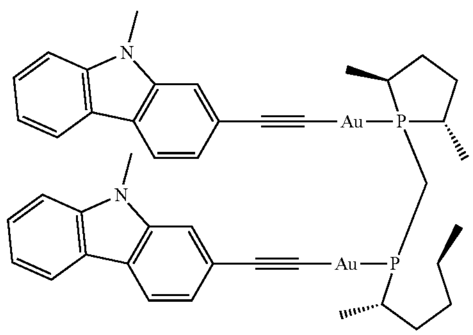
409
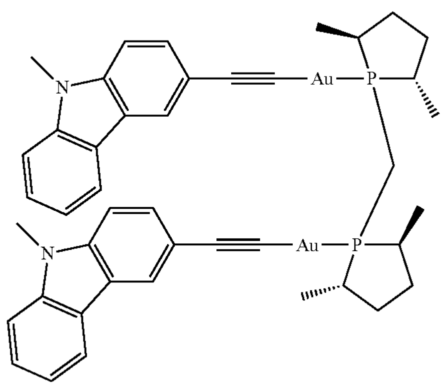
410
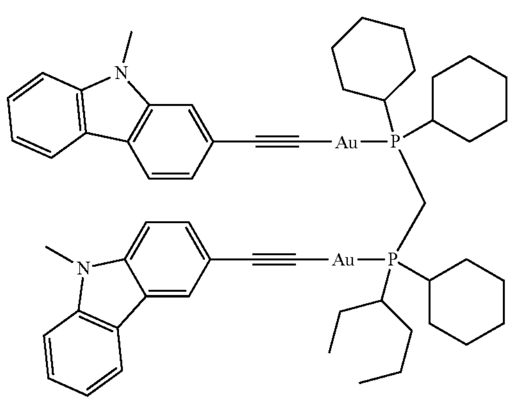
411
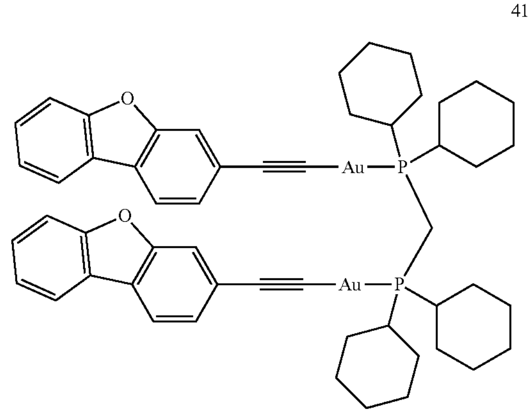
412
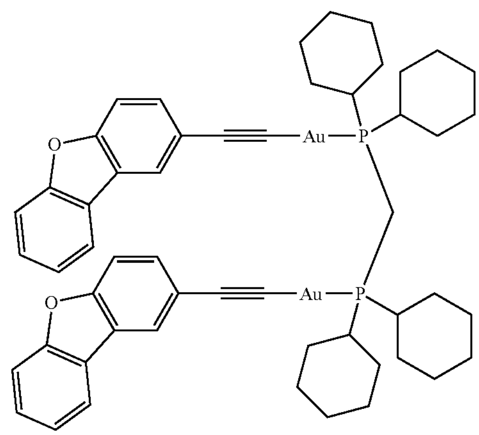
413
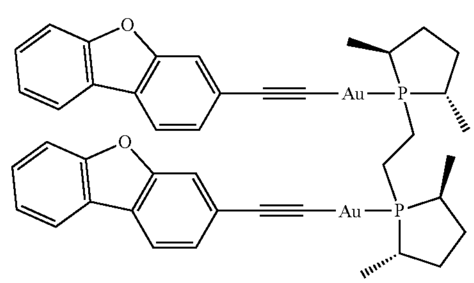
414
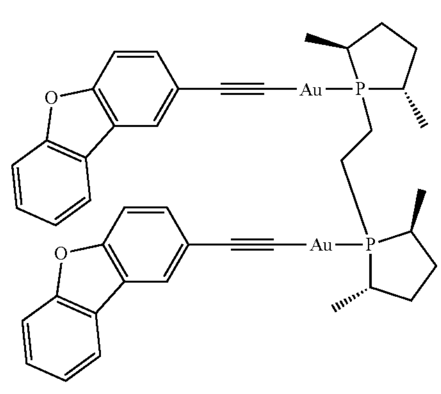

-continued
415
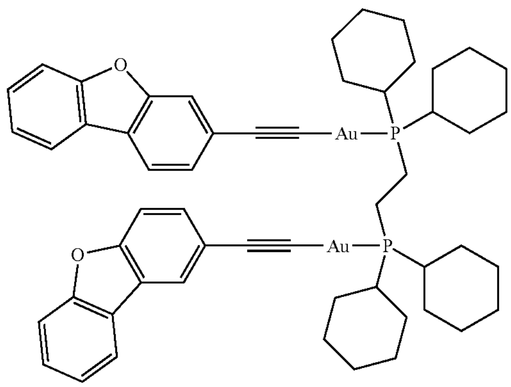
416
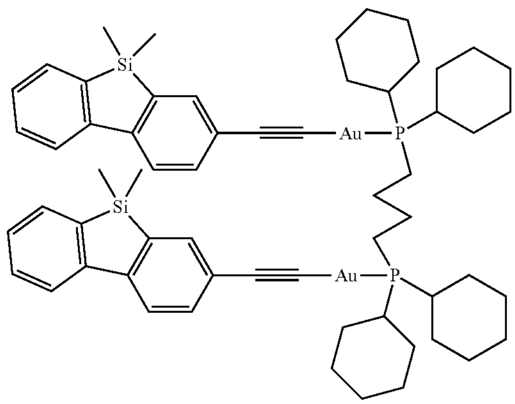
417
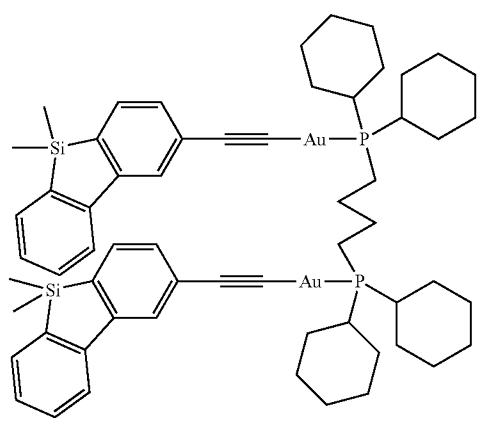
418
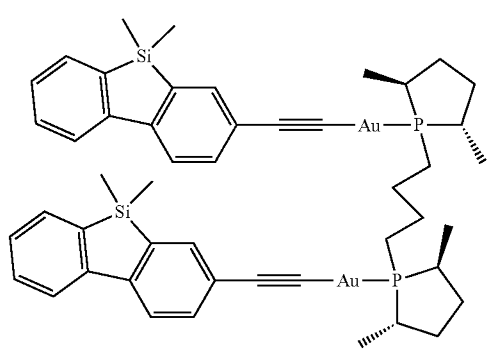
-continued
419
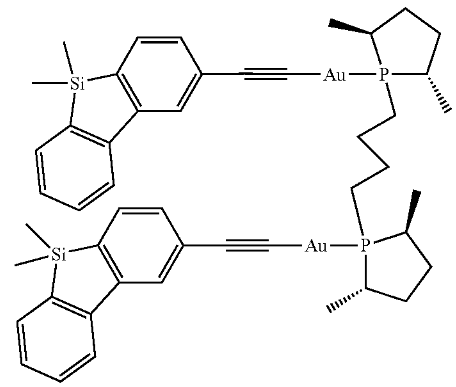
420
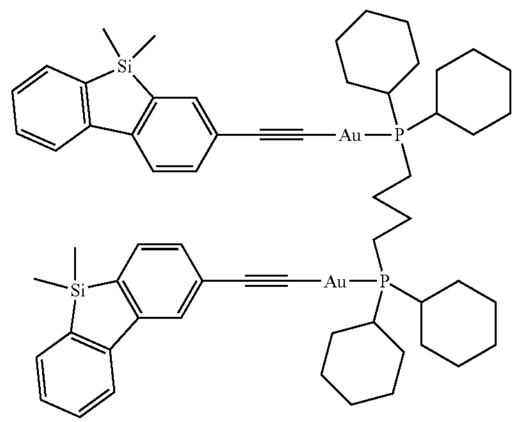
421
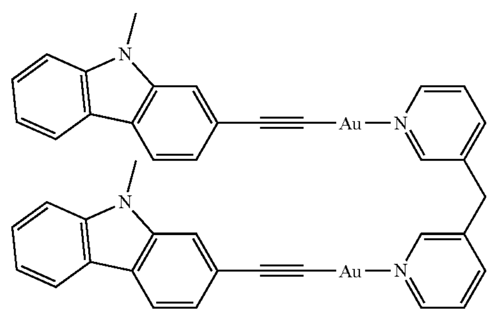
422
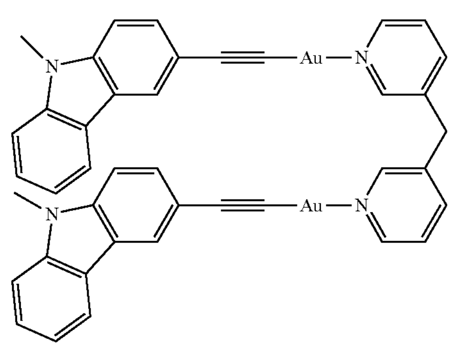

-continued
423
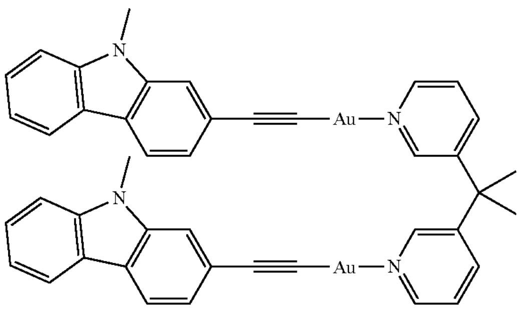
424
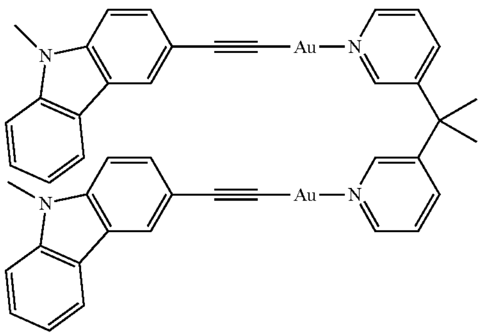
425
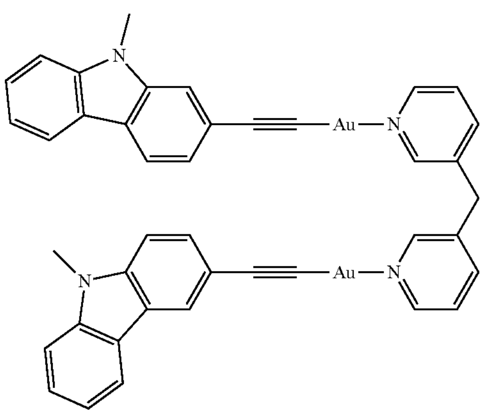
426
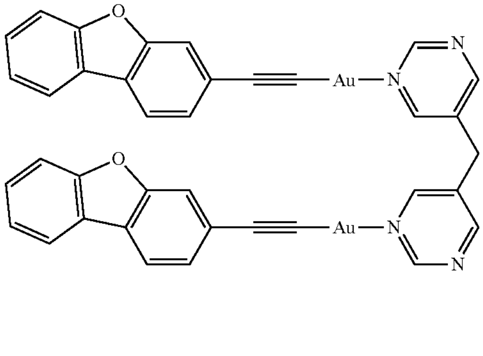
-continued
427
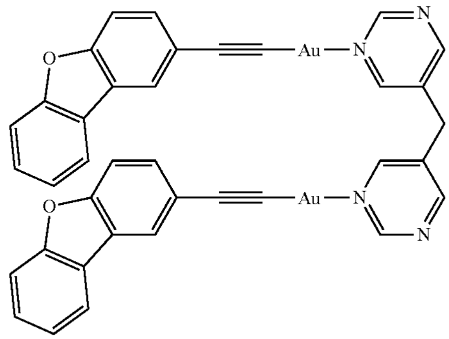
428
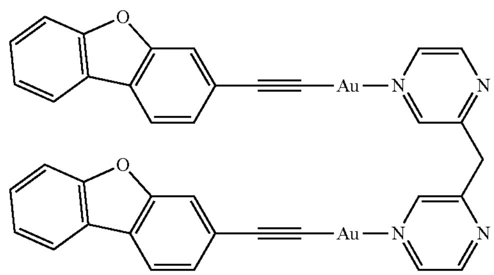
429
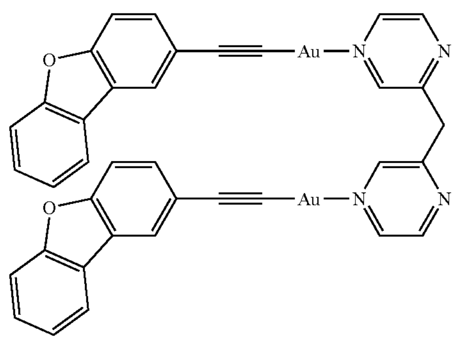
430
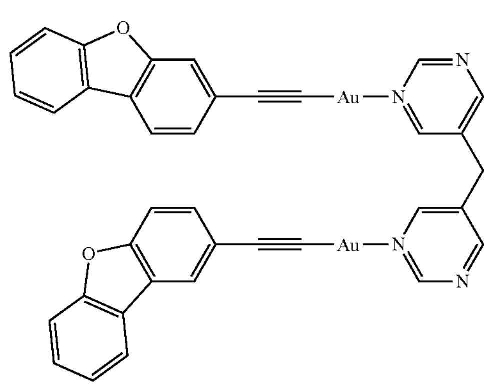

-continued
431
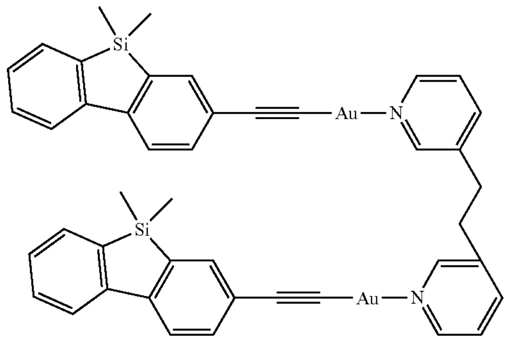
432
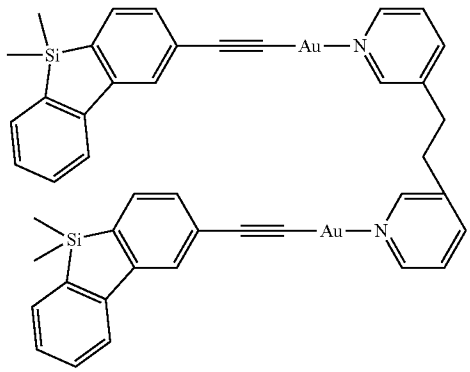
433
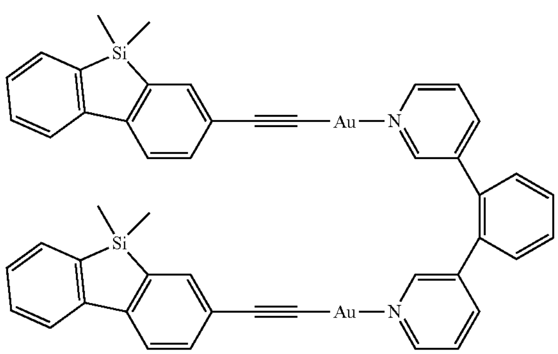
434
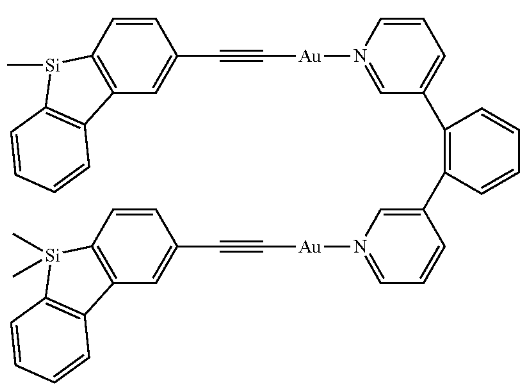
-continued
435
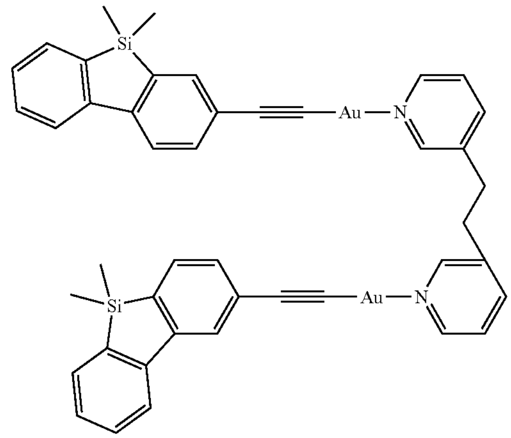
436
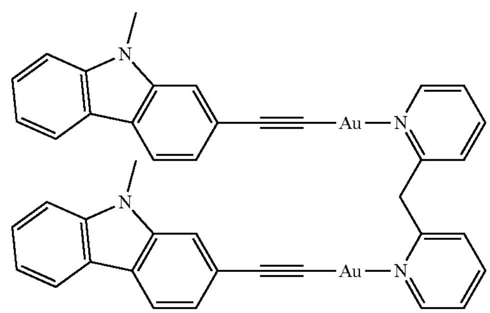
437
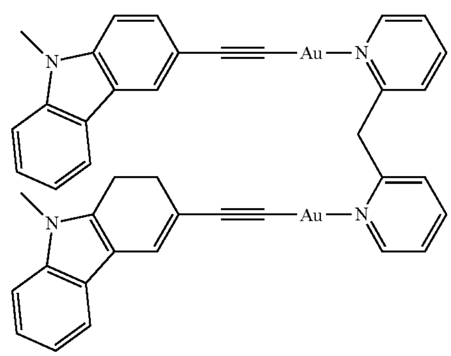
438
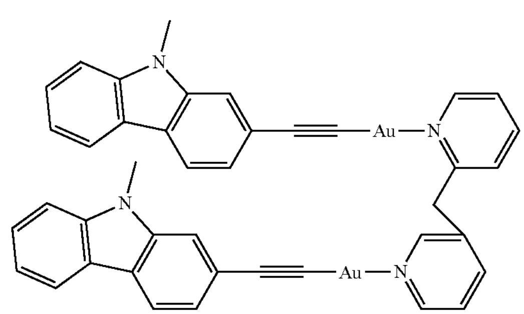

-continued
439
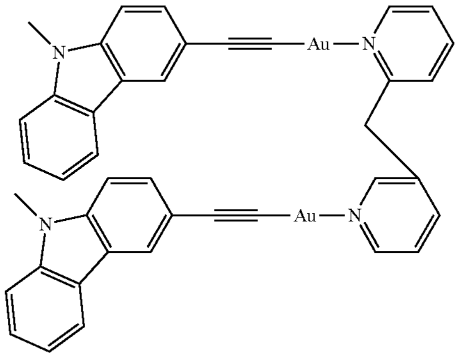
440
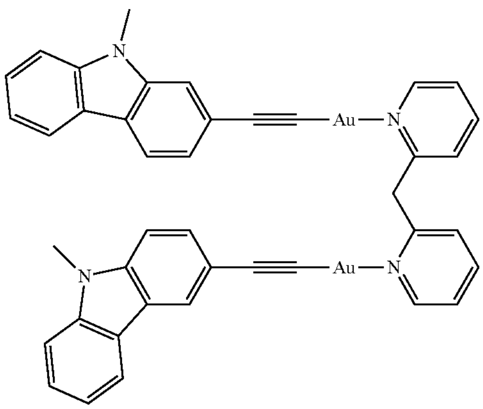
441
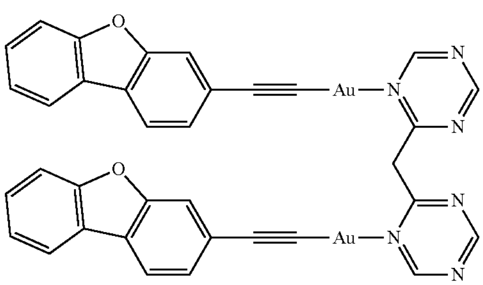
442
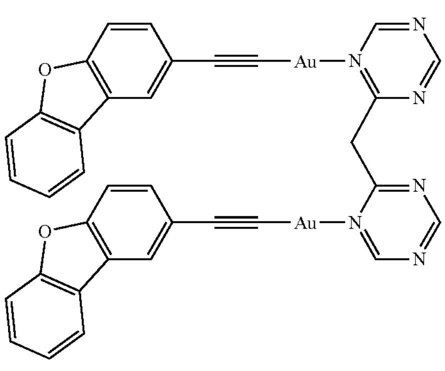
-continued
443
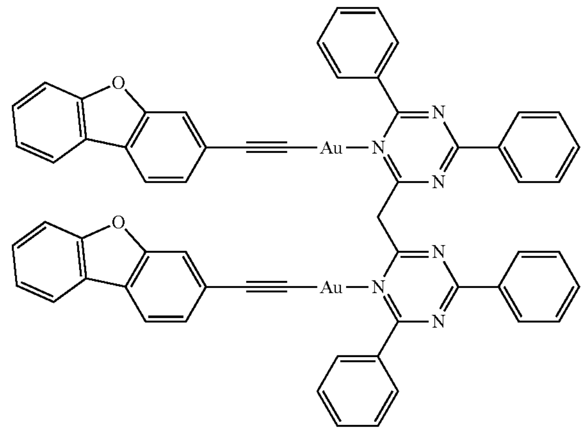
444
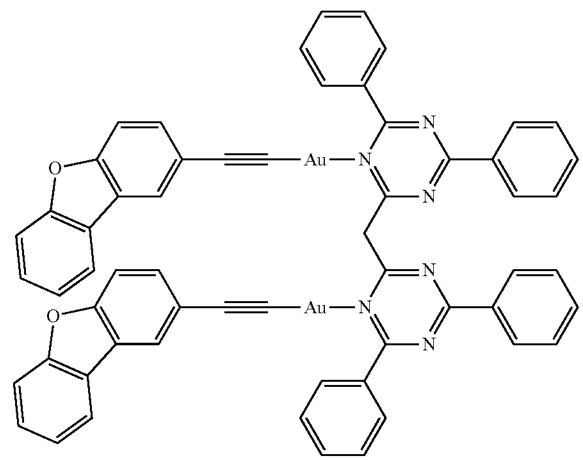
445
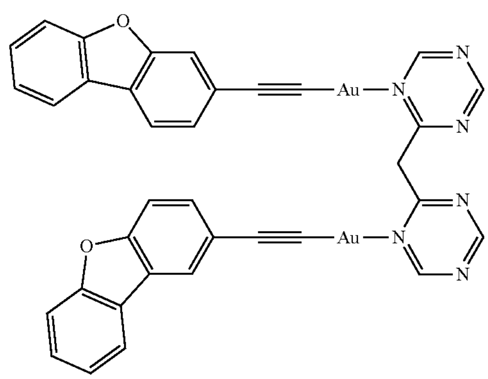
446
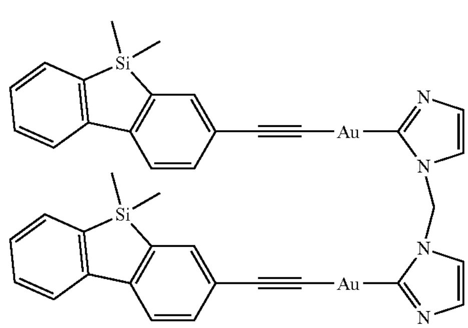

-continued
447
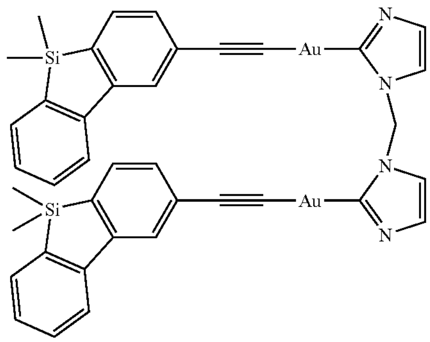
448
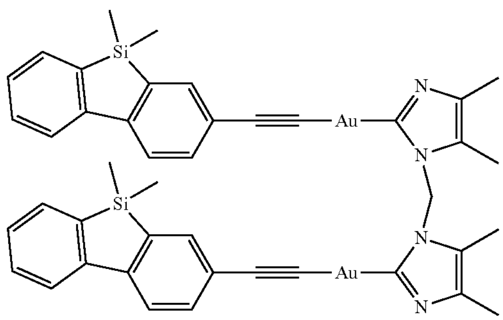
449
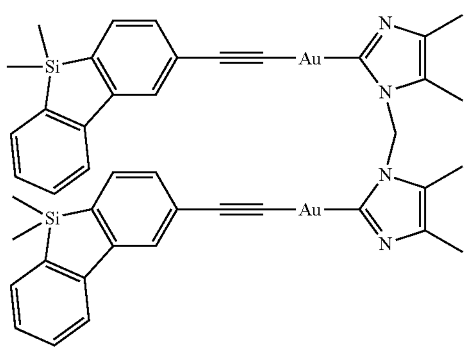
450
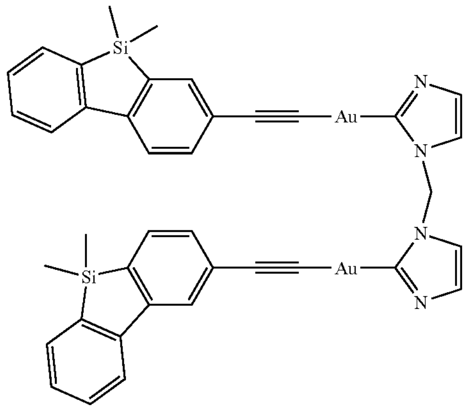
-continued
451
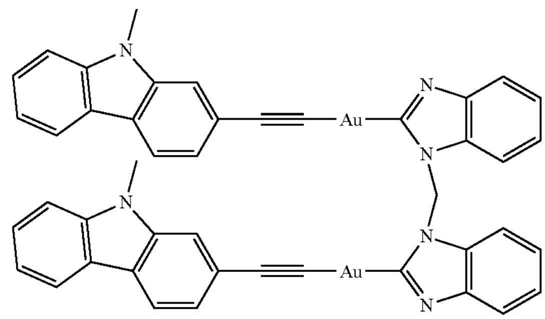
452
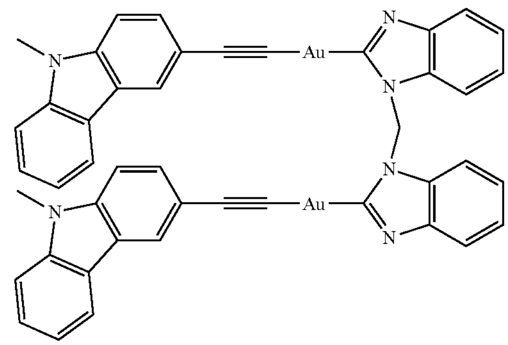
453
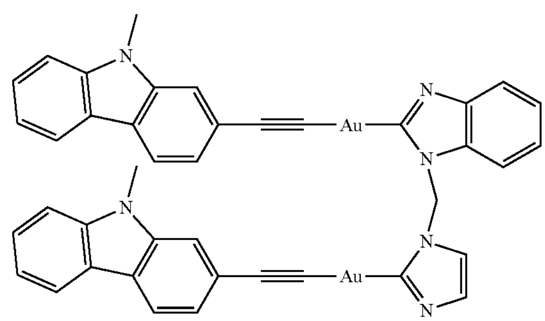
454
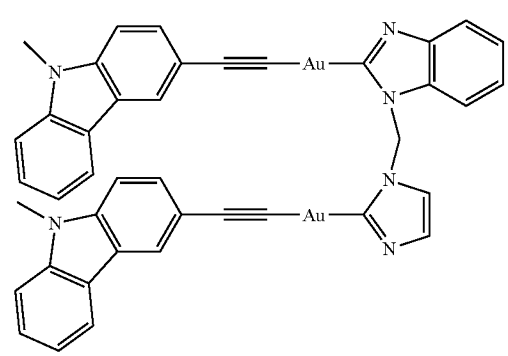

455
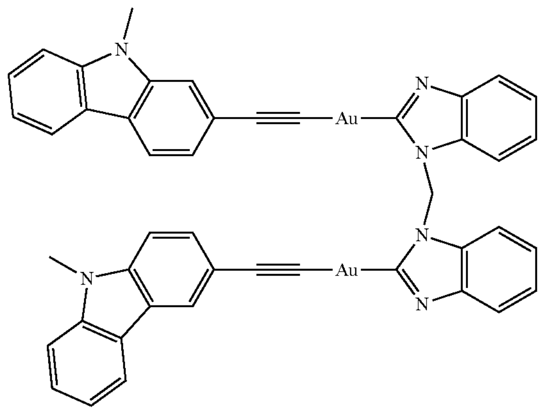
456
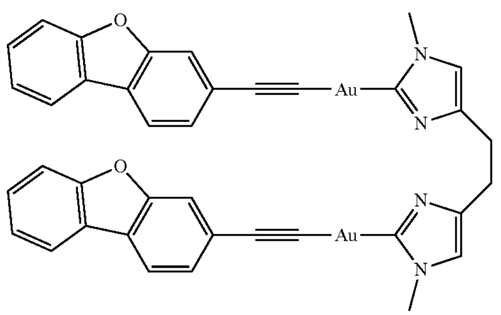
457
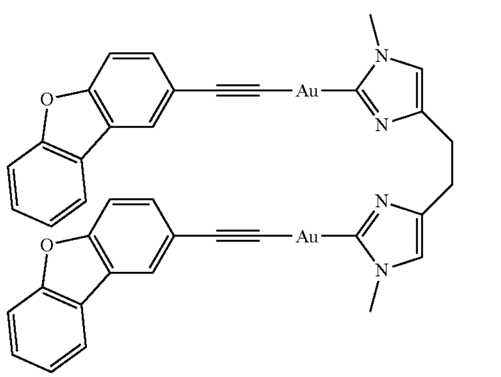
458
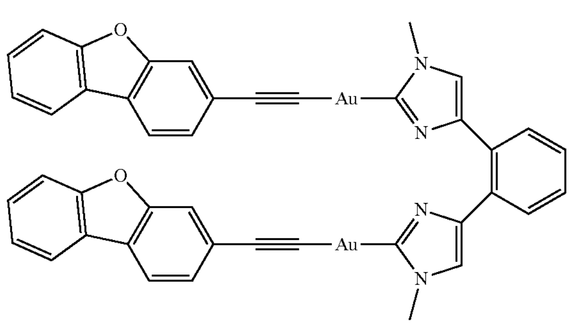
459
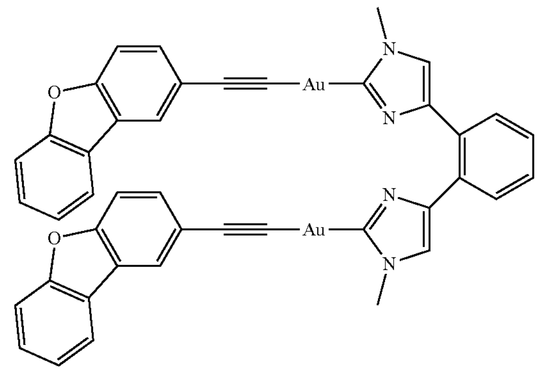
460
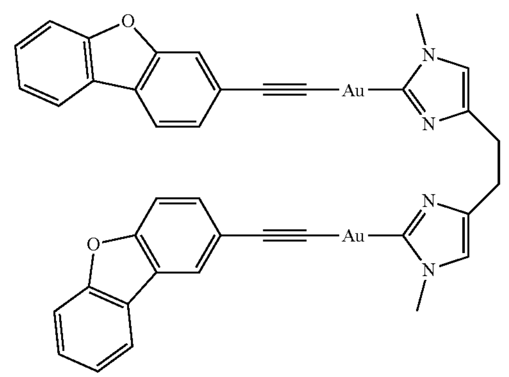
461
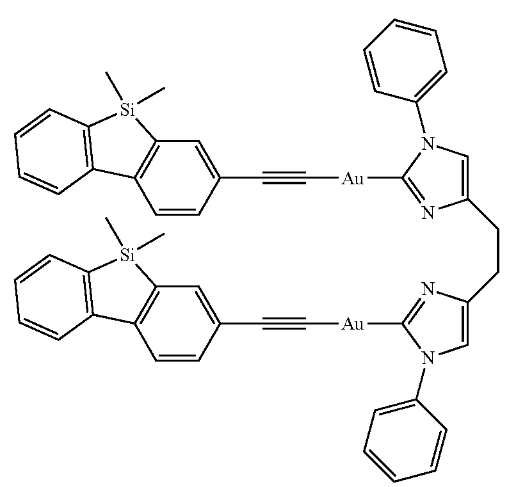

-continued
462
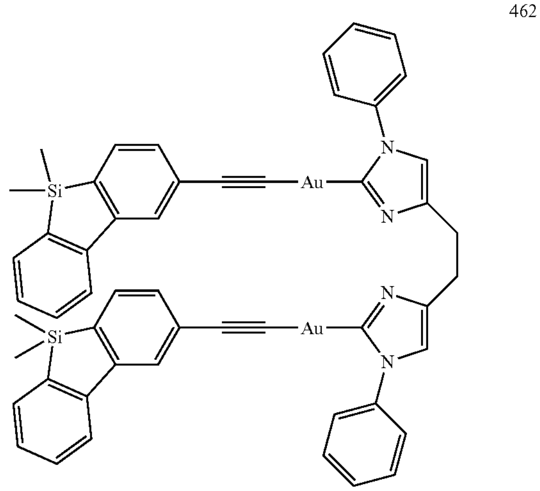
463
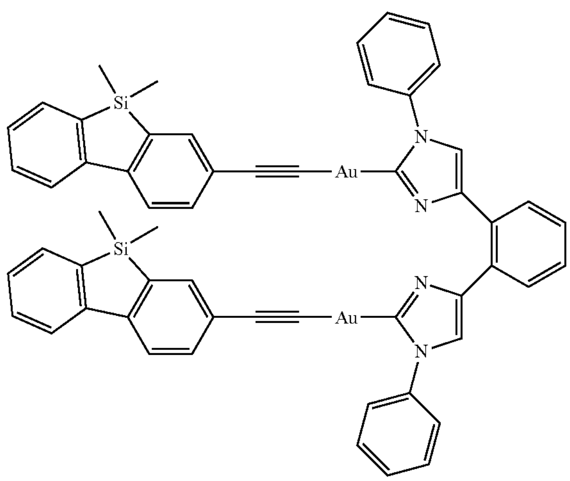
464
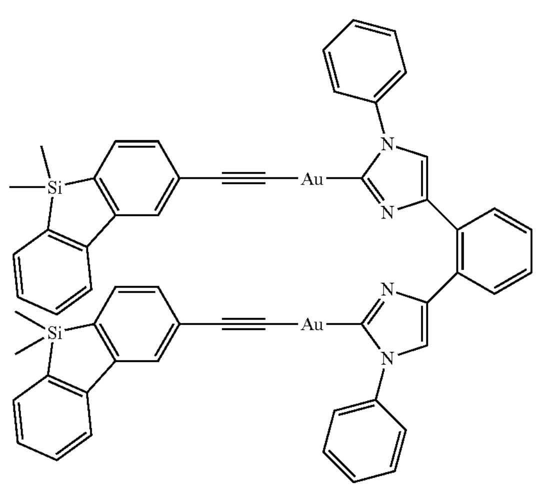
-continued
465
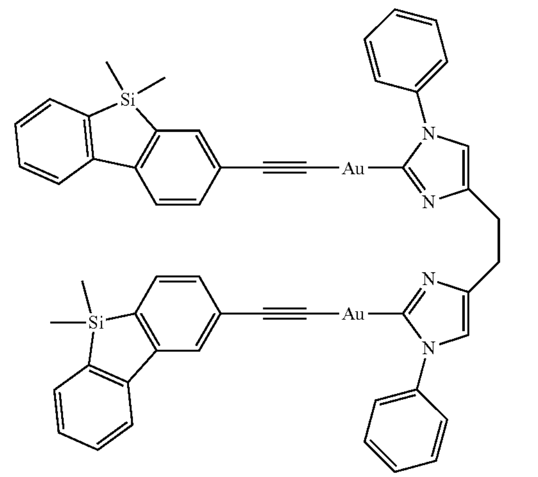
466
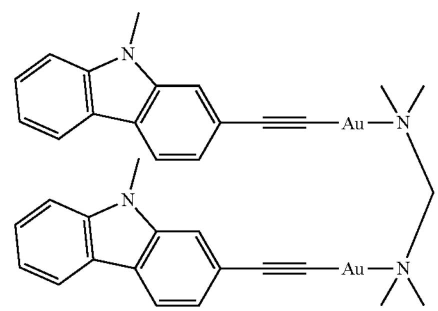
467
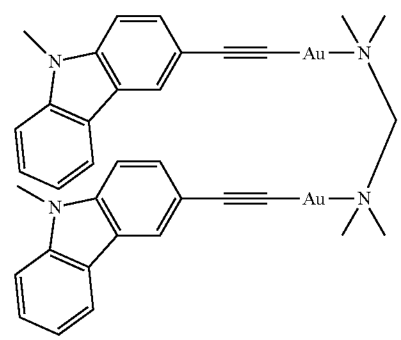
468
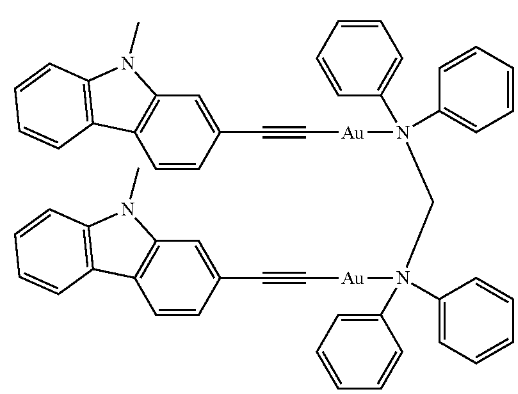

-continued
469
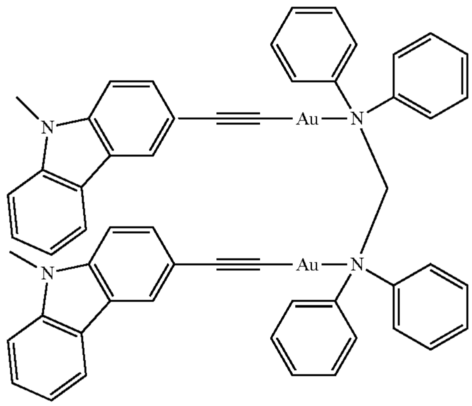
470
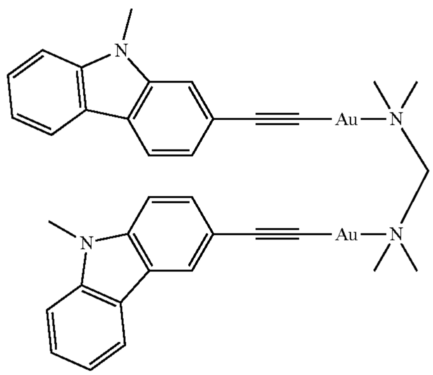
471
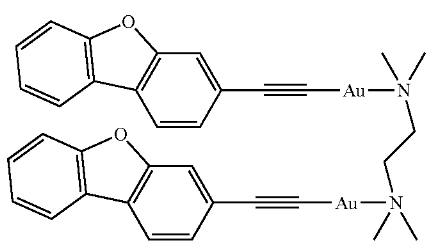
472
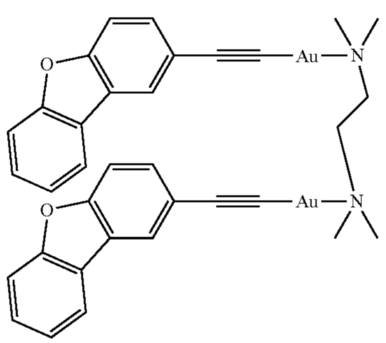
-continued
473
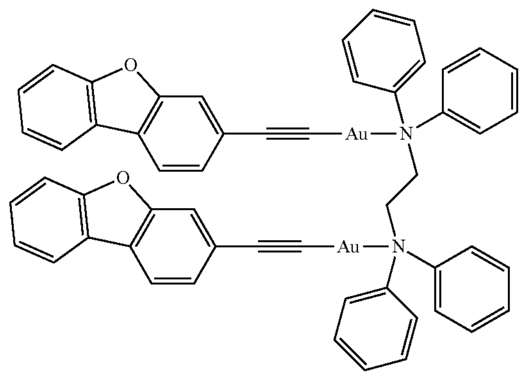
474
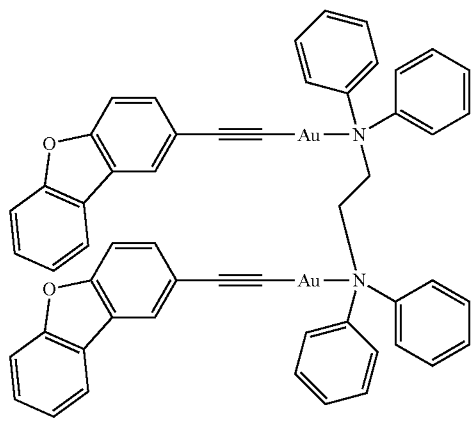
475
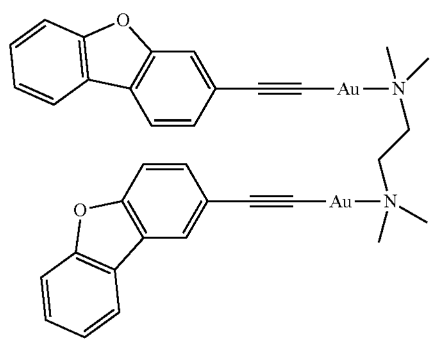
476
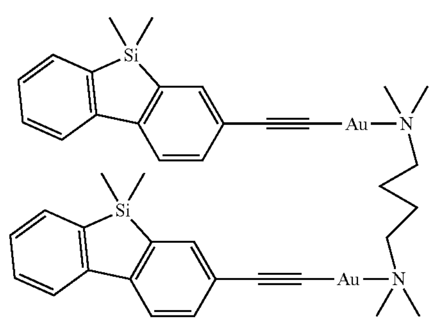

-continued
477
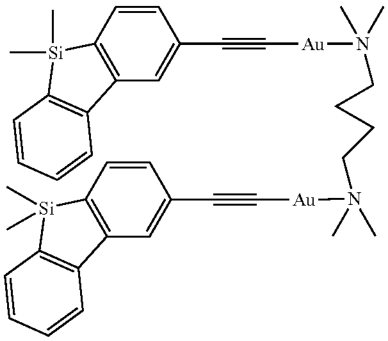
478
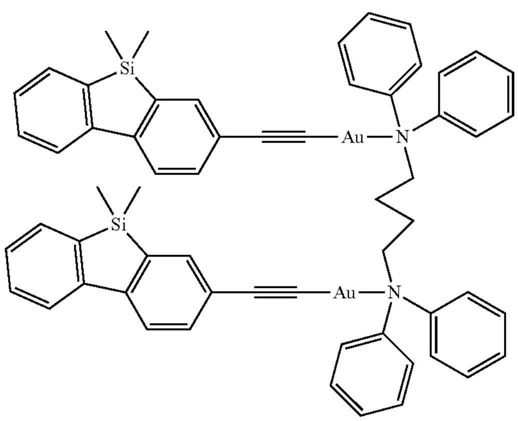
479
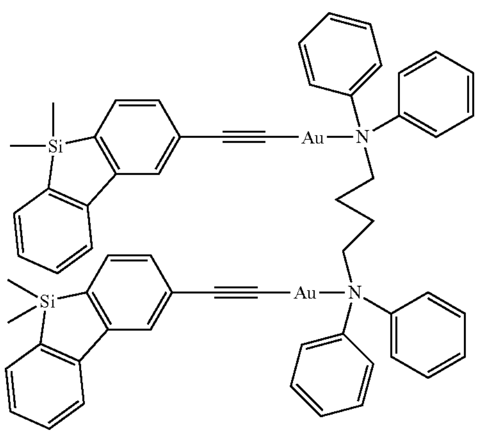
480
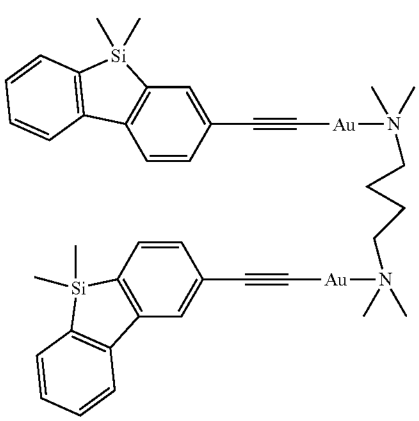
-continued
481
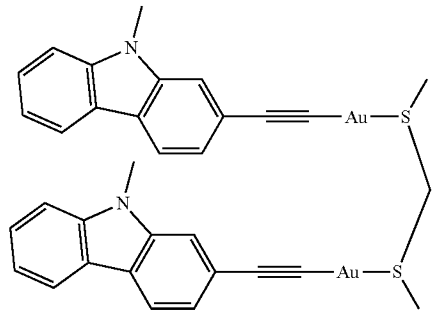
482
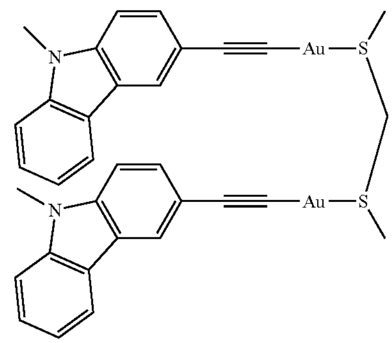
483
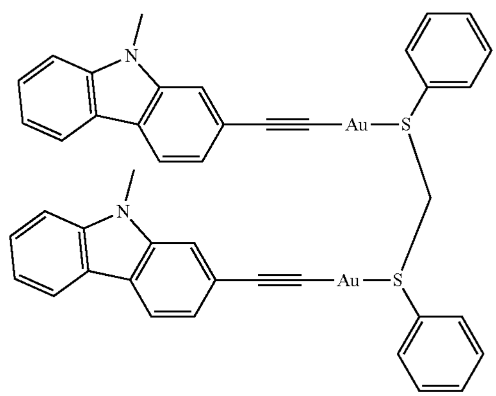
484
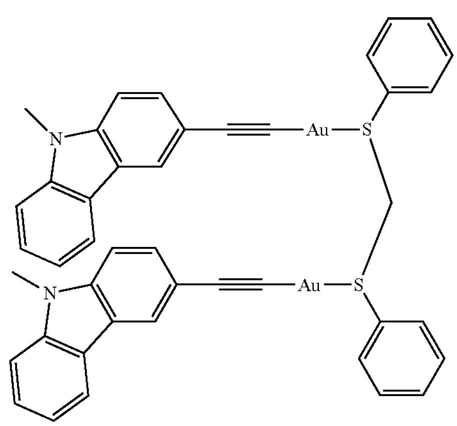

-continued
485
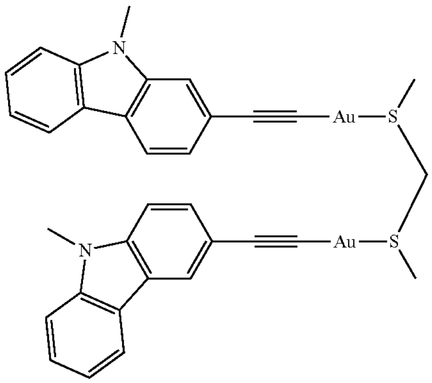
486
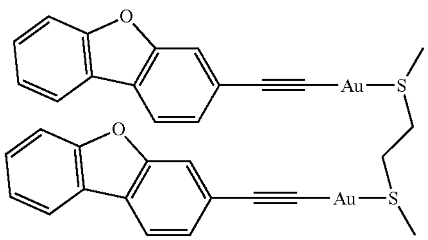
487
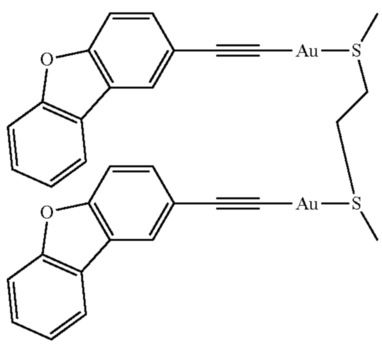
488
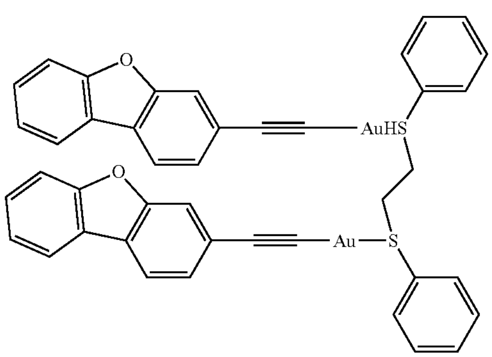
-continued
489
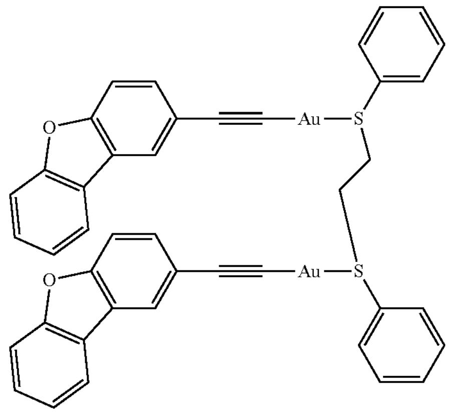
490
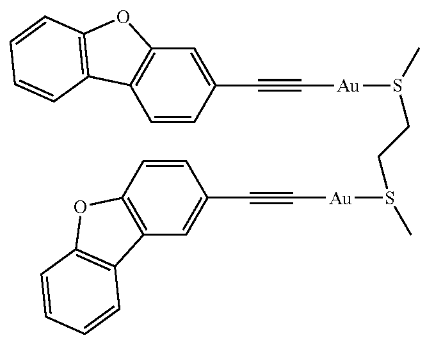
491
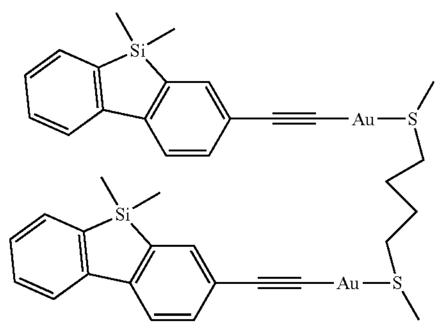
492
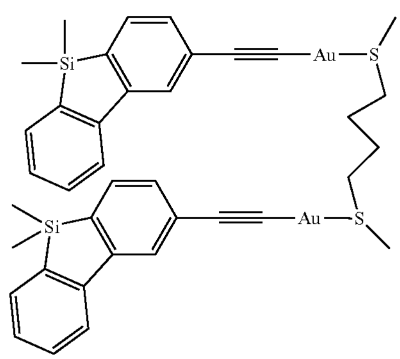

-continued
493
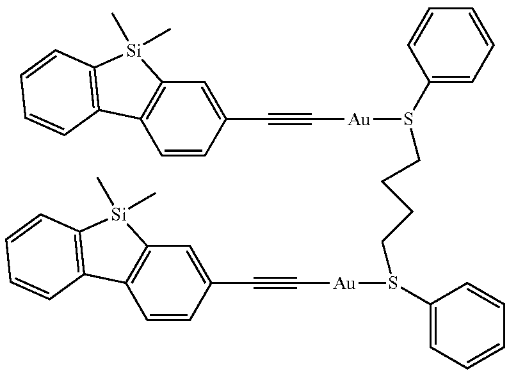
494
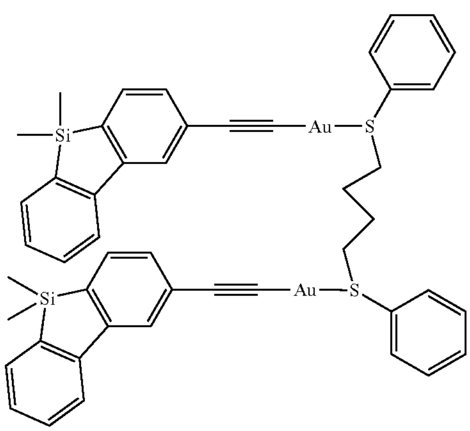
495
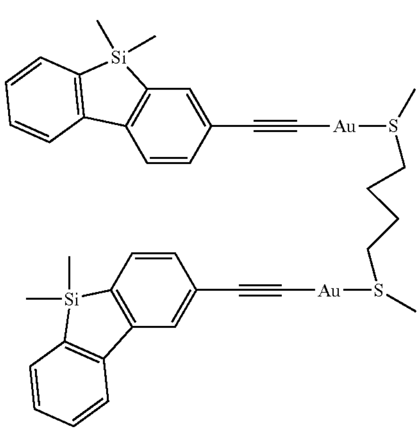
-continued
496
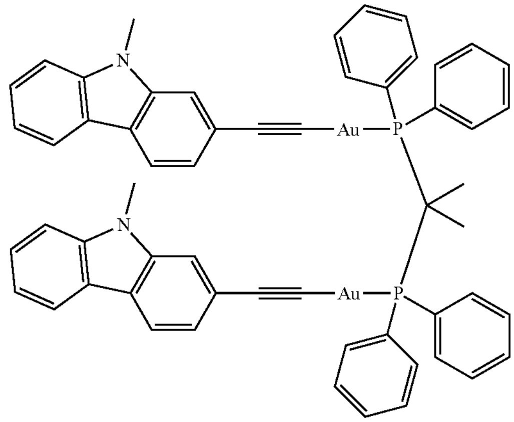
497
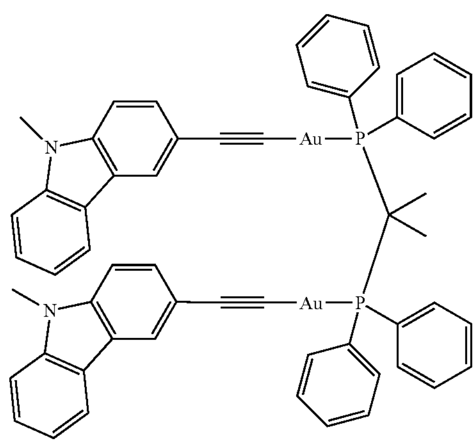
498
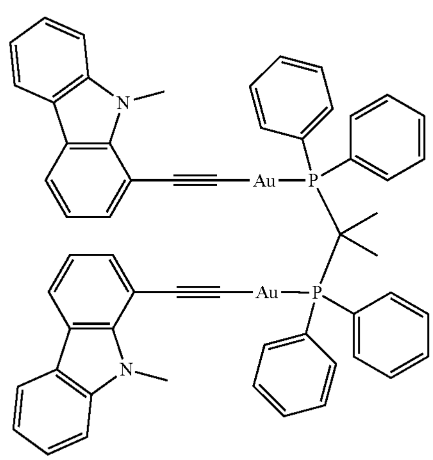

-continued
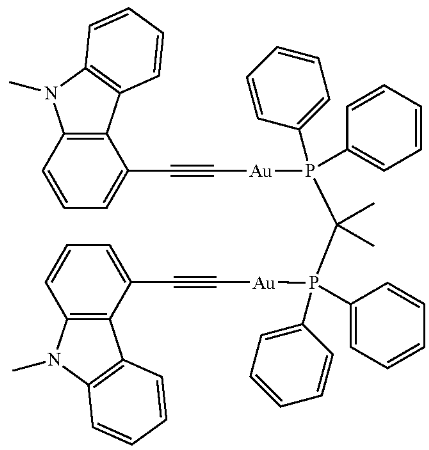
499
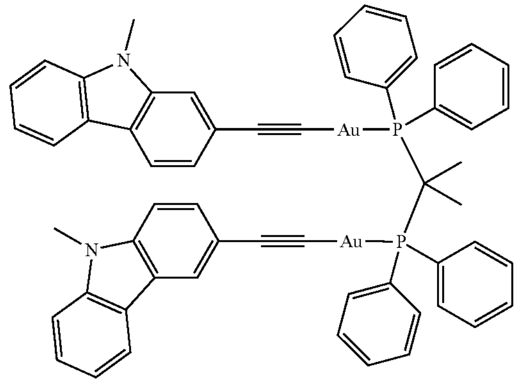
500
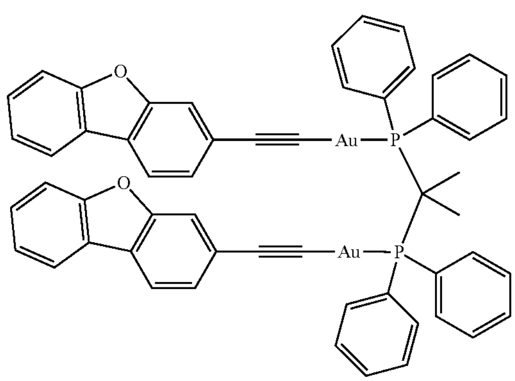
501
-continued
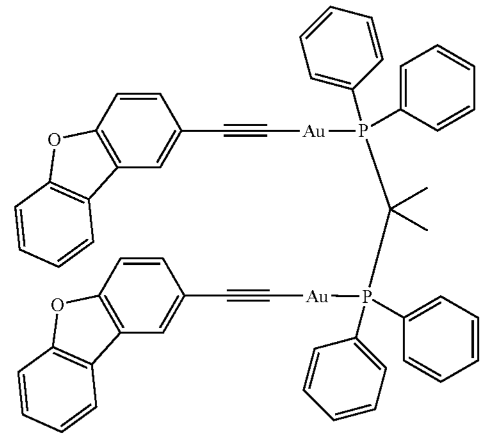
502
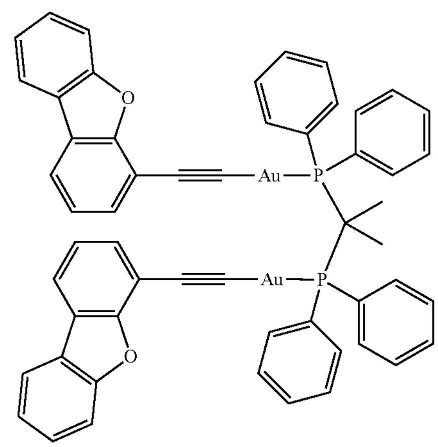
503
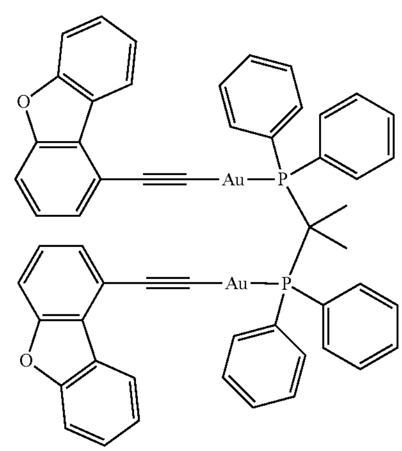
504

-continued
505
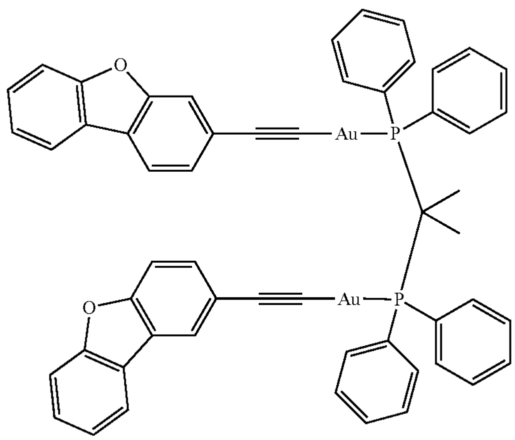
506
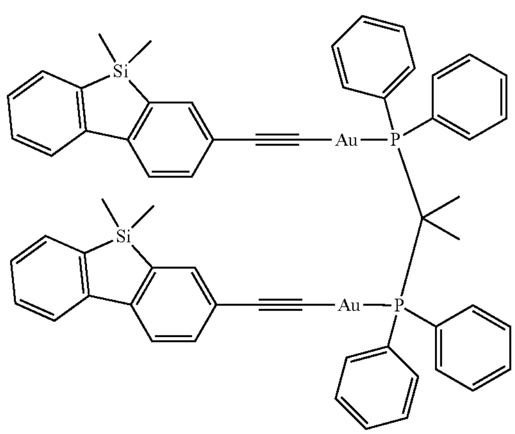
507
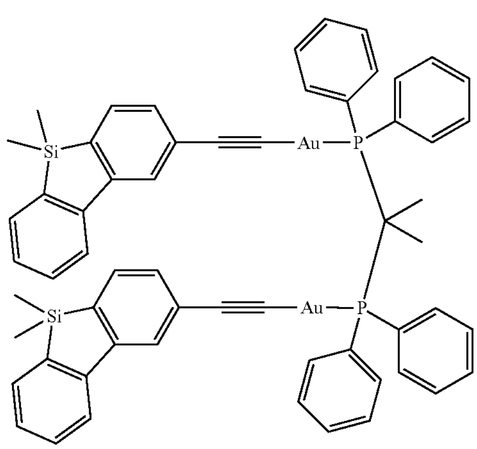
-continued
508
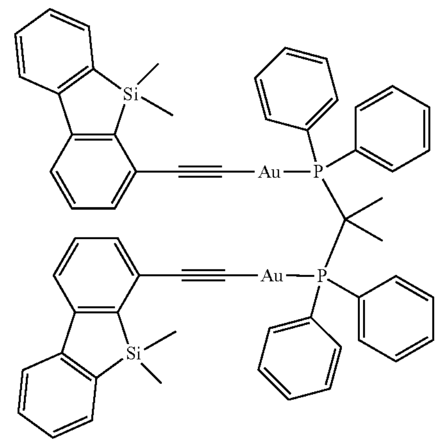
509
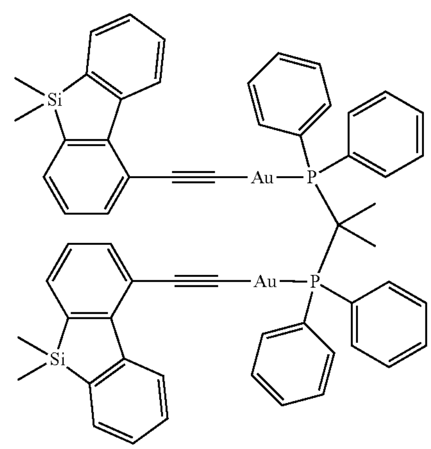
510
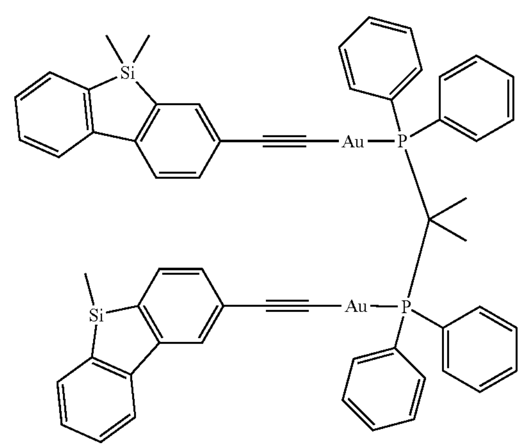

-continued
511
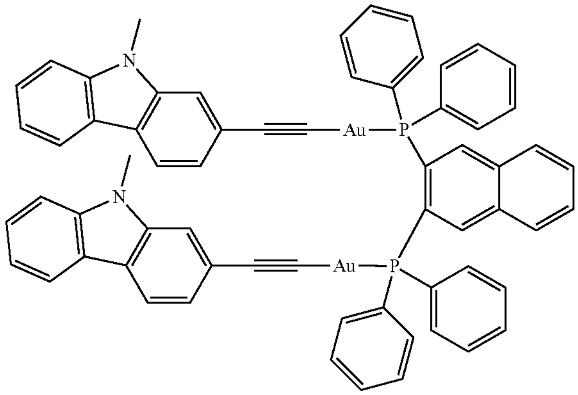
512
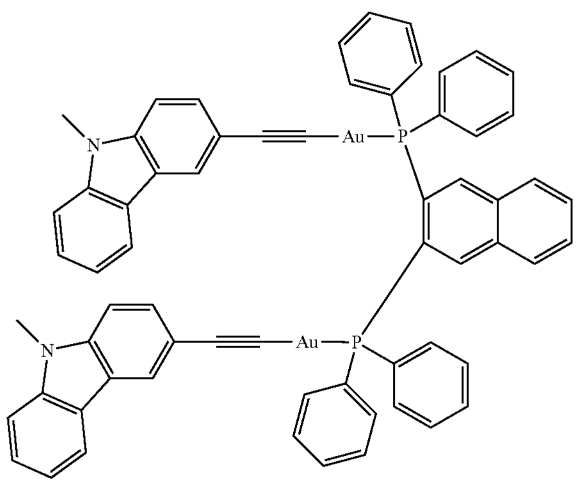
513
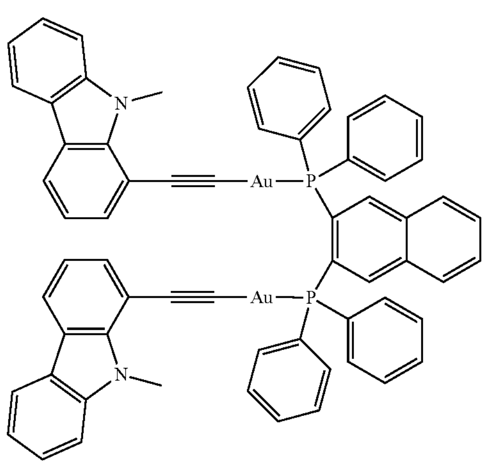
-continued
514
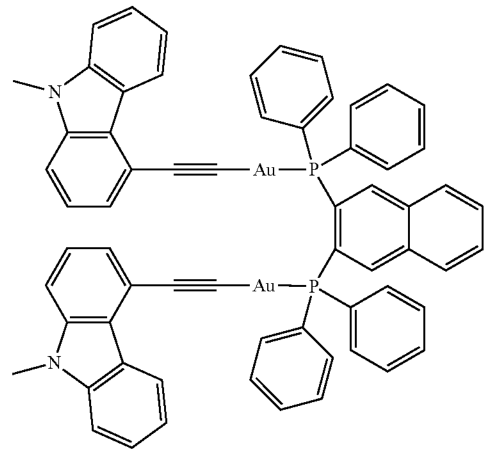
515
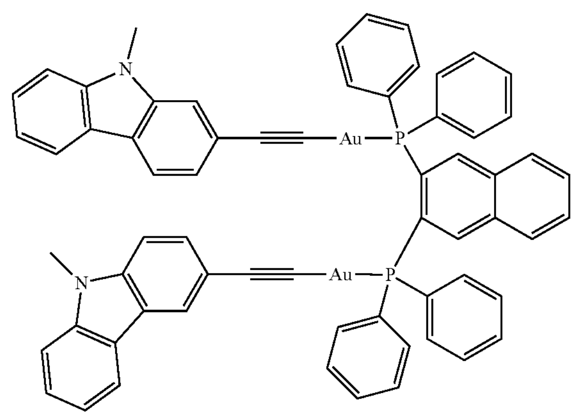
516
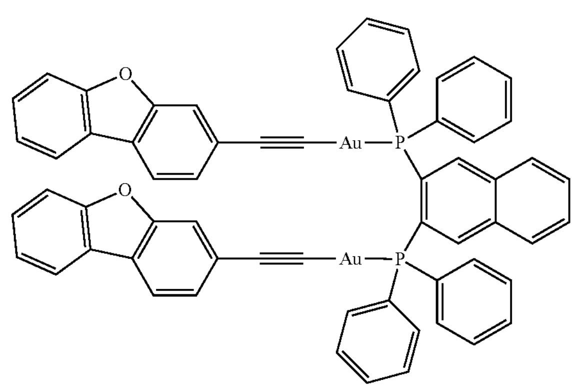

-continued
517
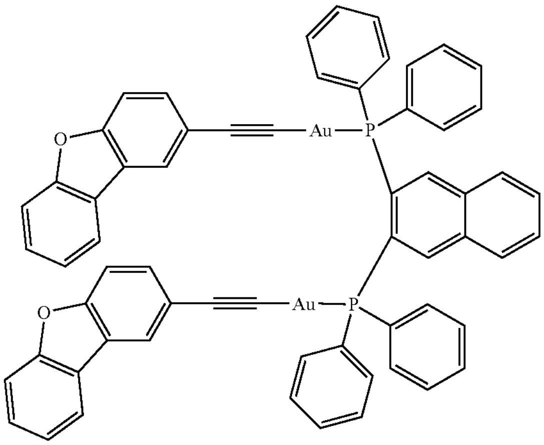
518
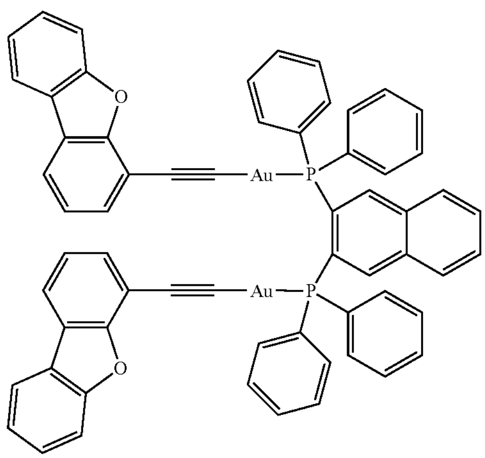
519
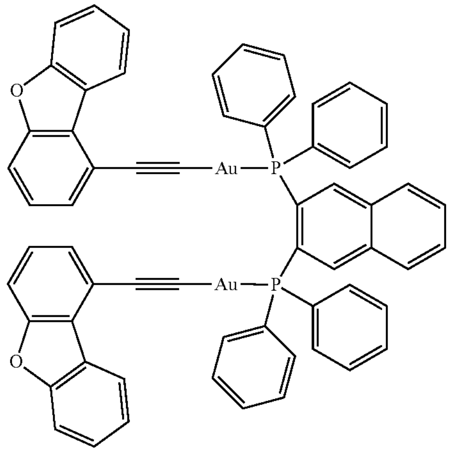
-continued
520
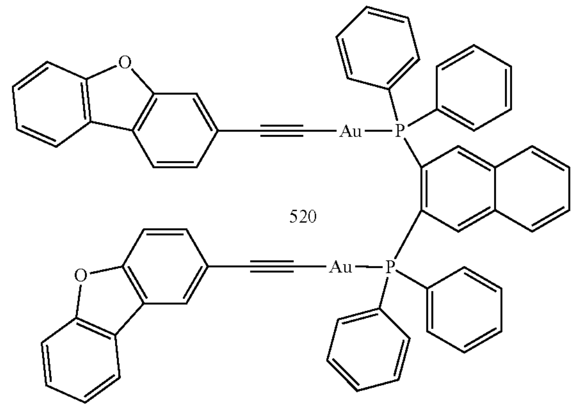
521
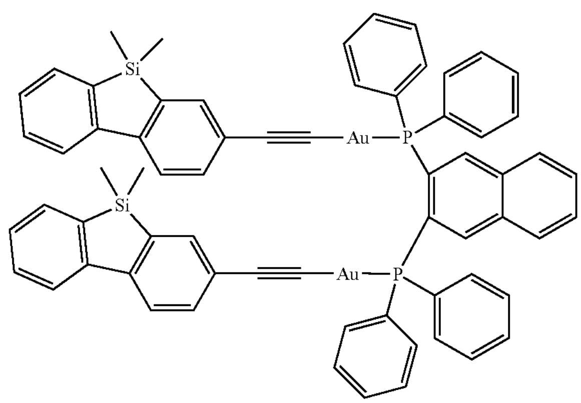
522
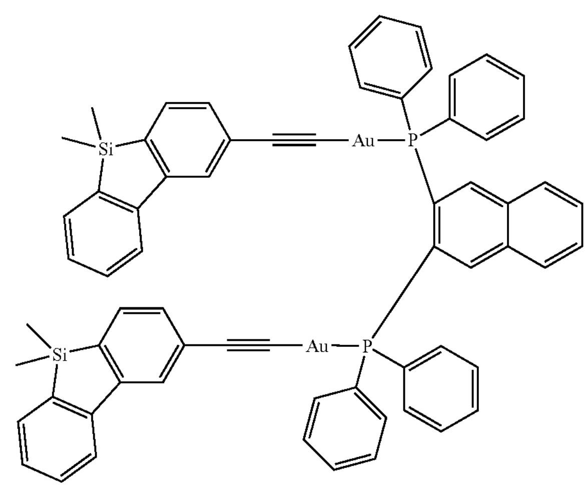

-continued
523
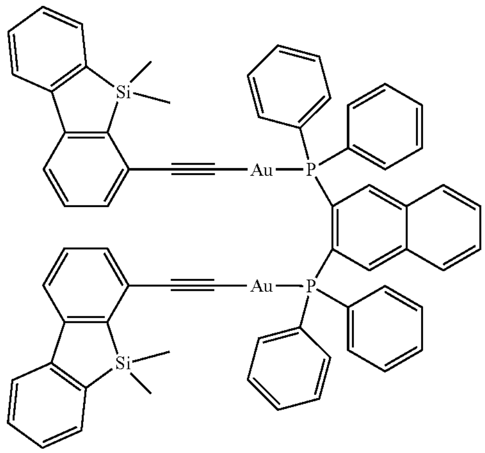
524
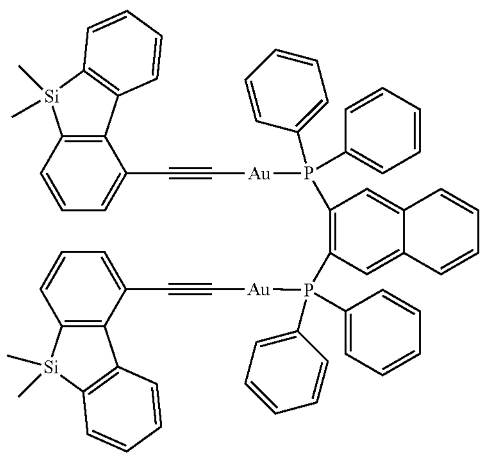
525
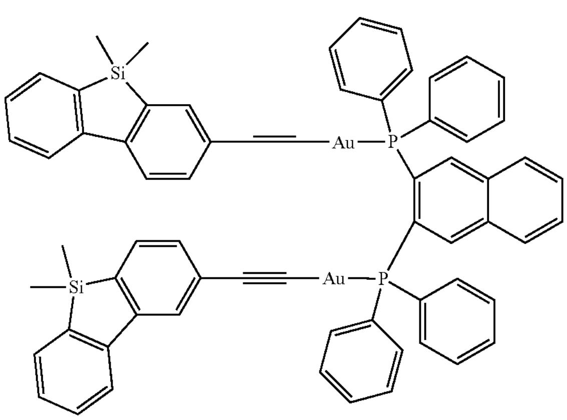
-continued
526
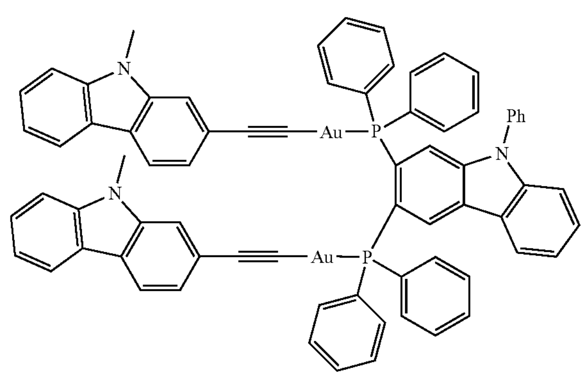
527
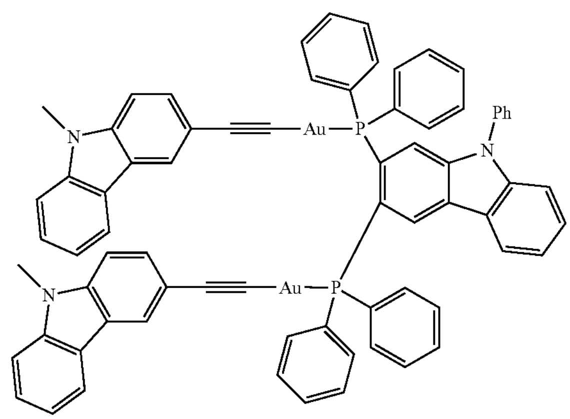
528
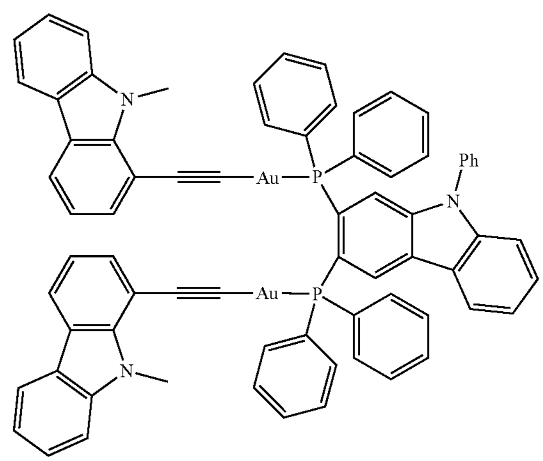

529
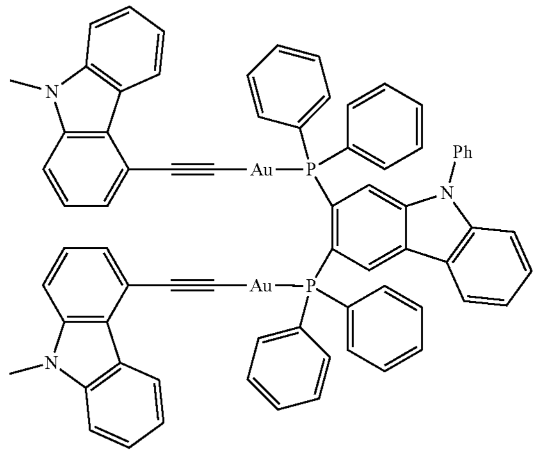
530
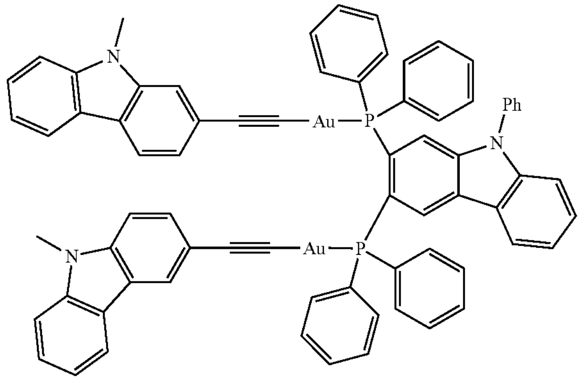
531
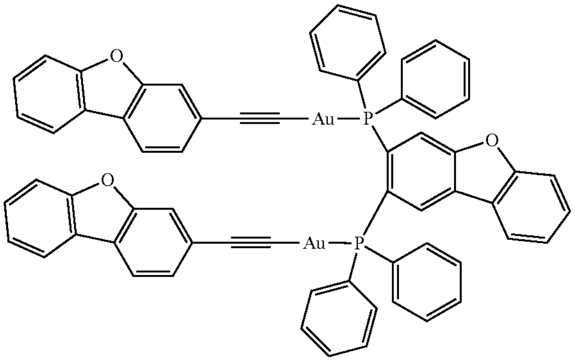
532
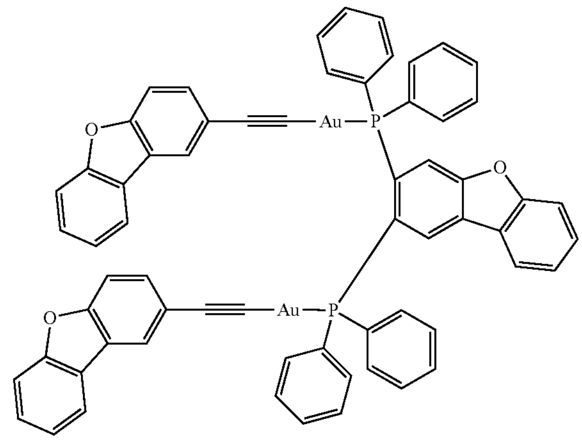
533
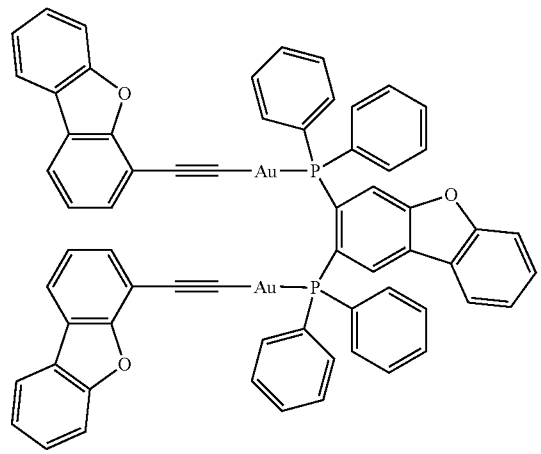
534
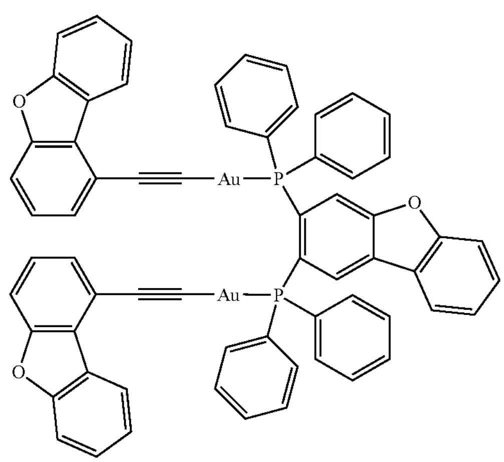

-continued
535
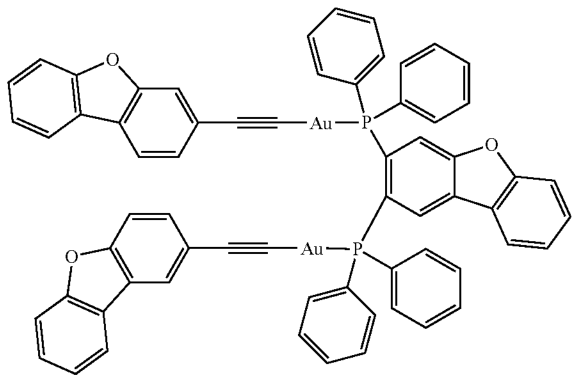
536
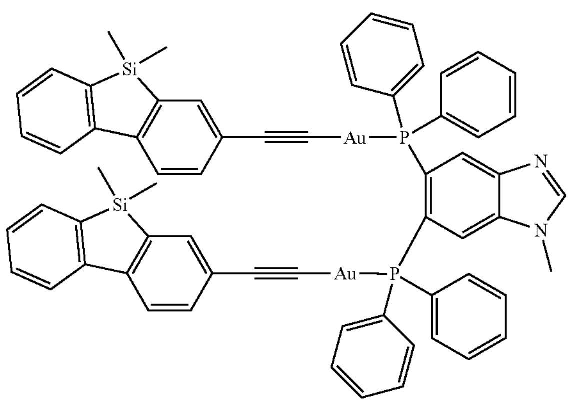
537
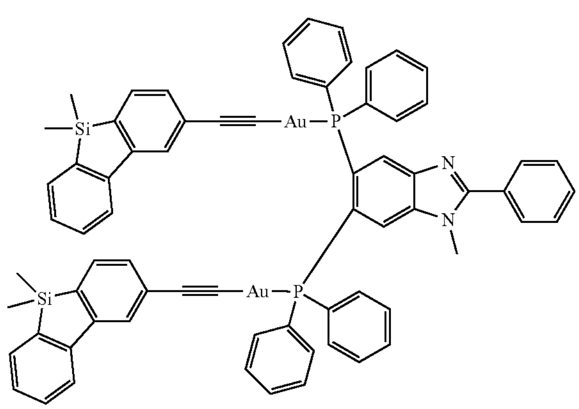
-continued
538
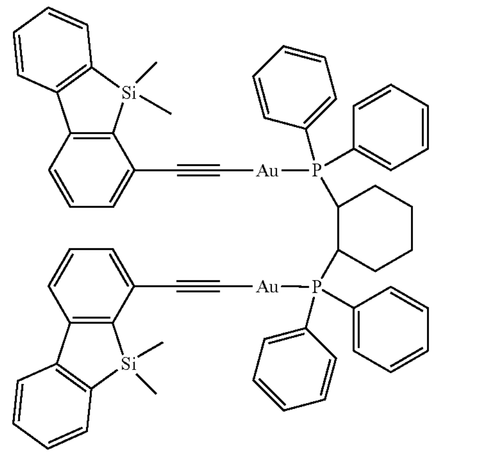
539
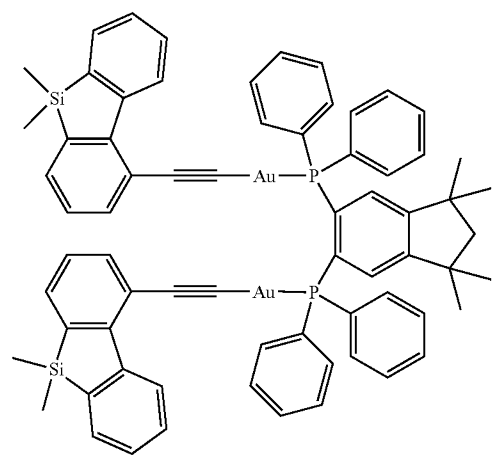
540
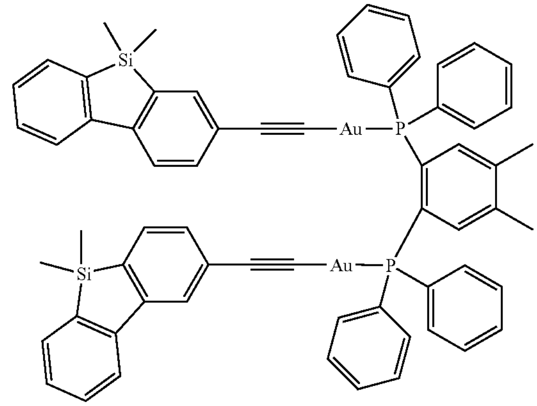

541
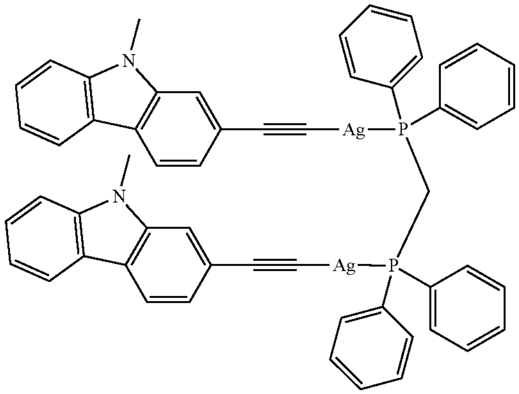
542
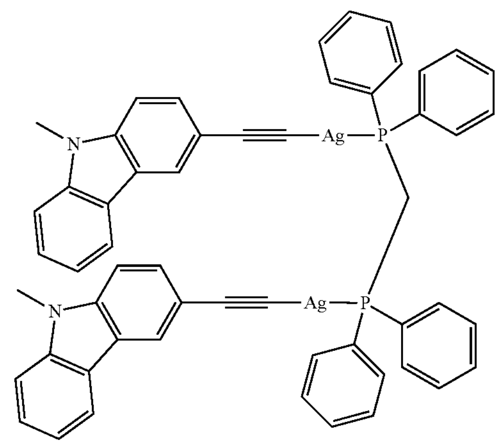
543
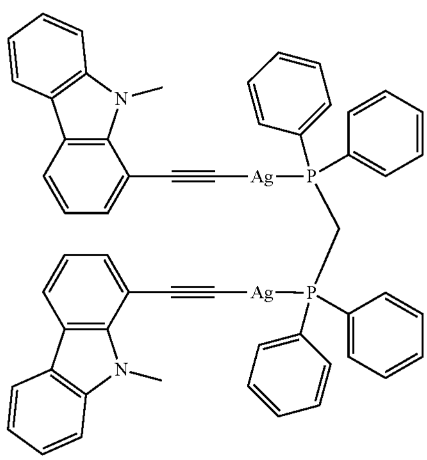
544
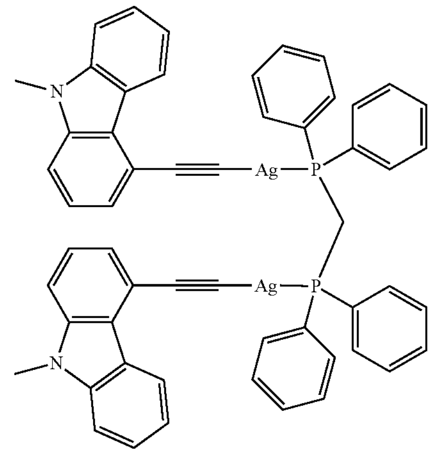
545
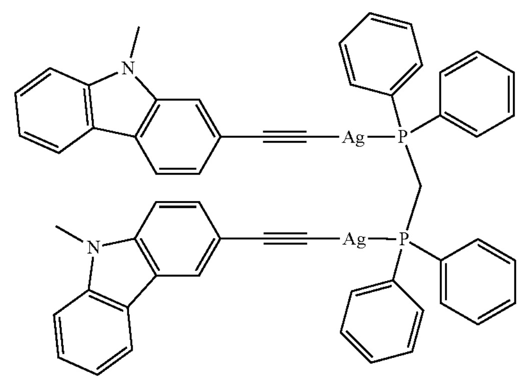
546
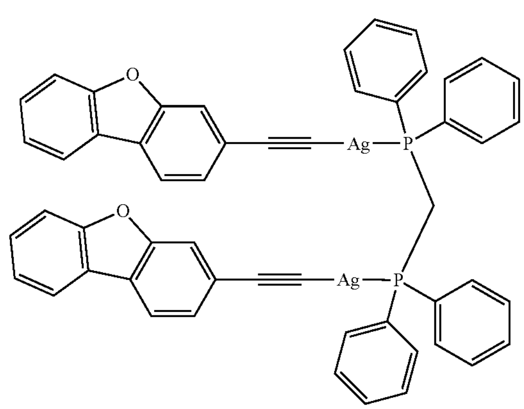

-continued
547
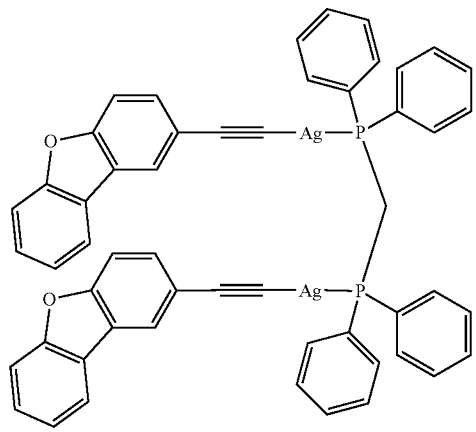
548
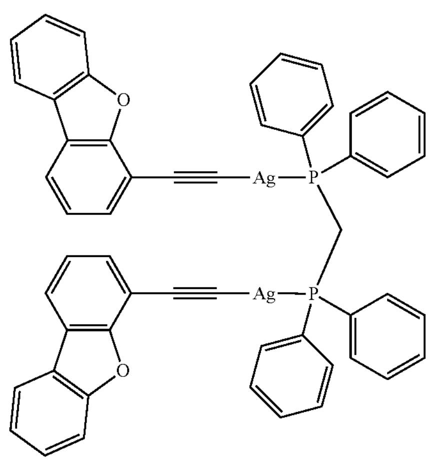
549
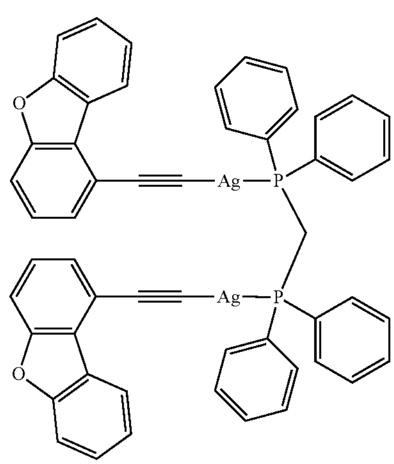
-continued
550
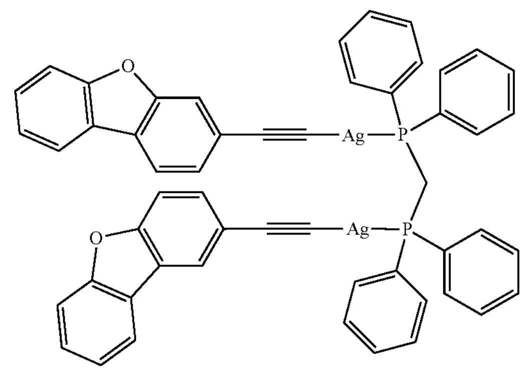
551
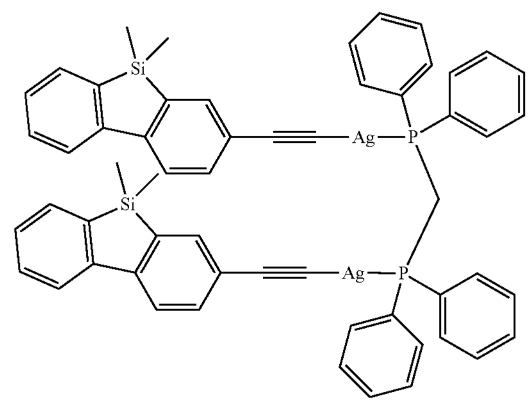
552
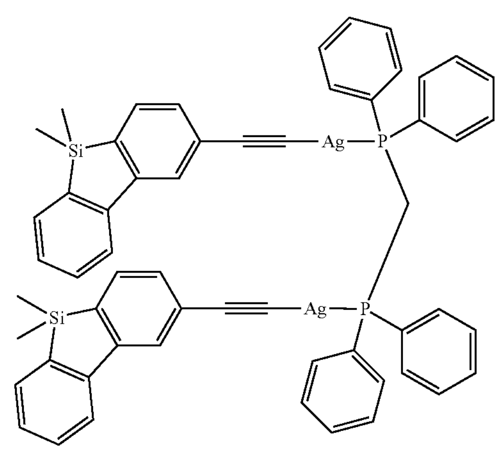

553
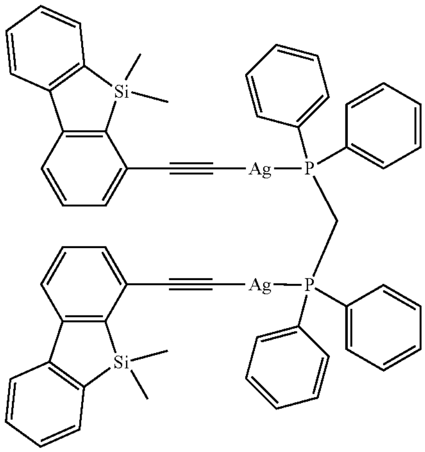
554
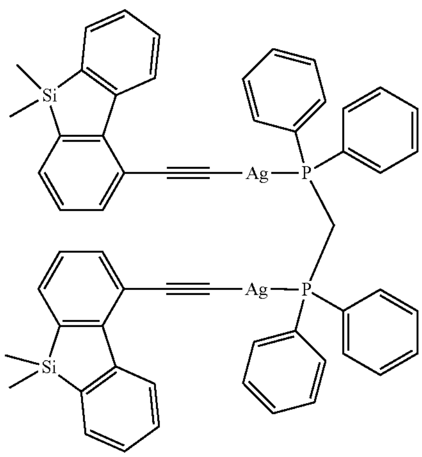
555
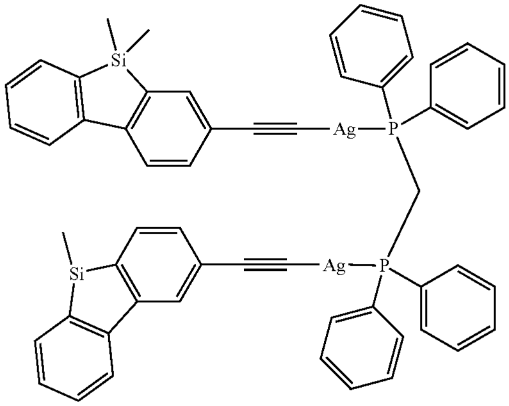
556
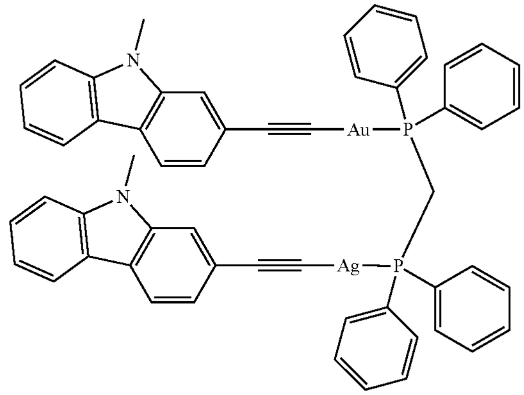
557
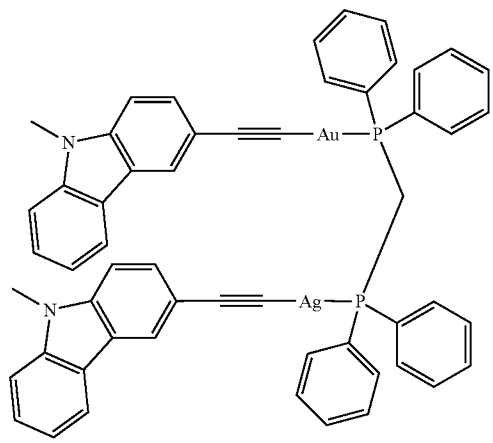
558
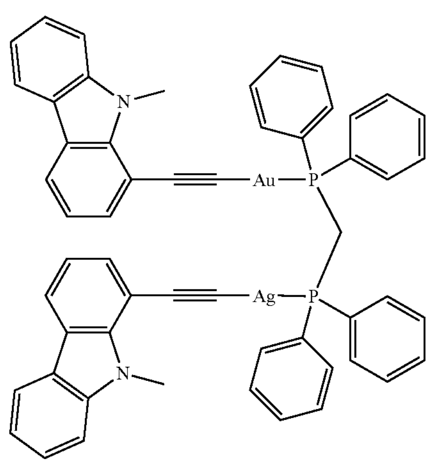

-continued
559
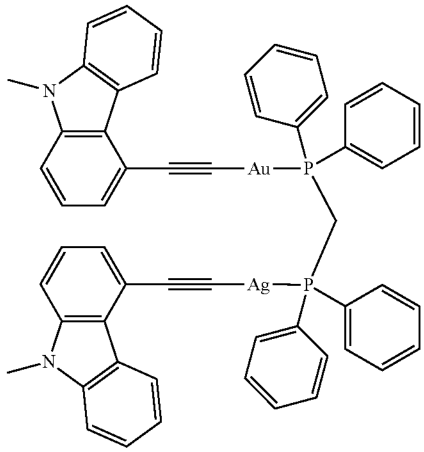
560
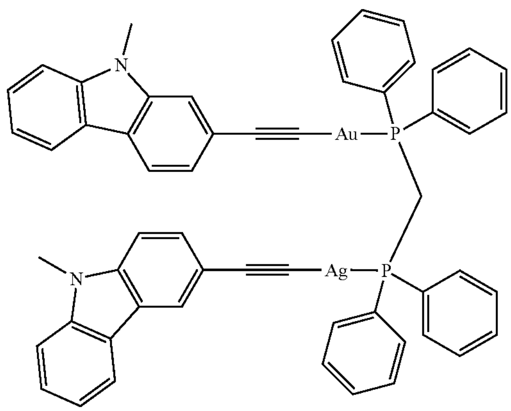
561
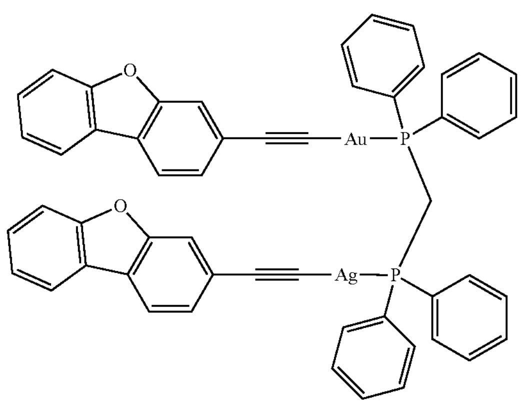
-continued
562
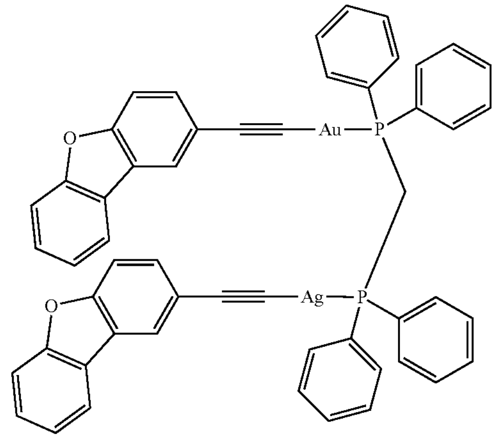
563
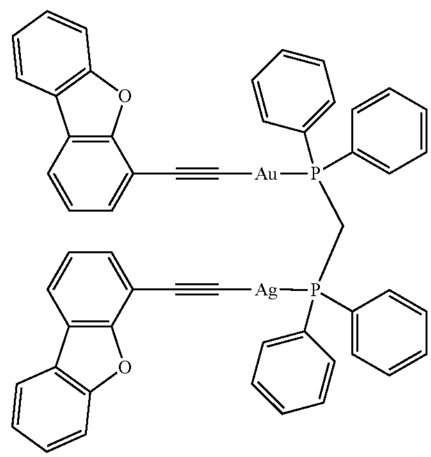
564
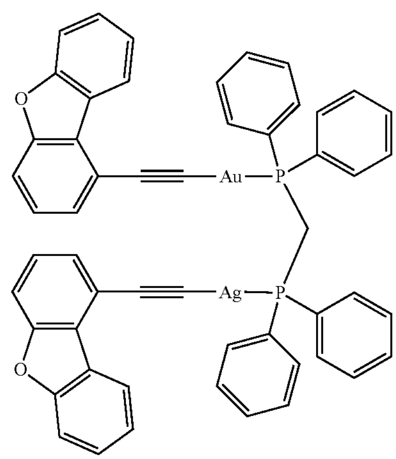

565
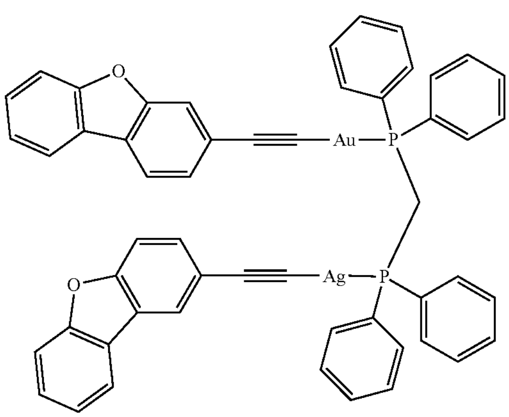
566
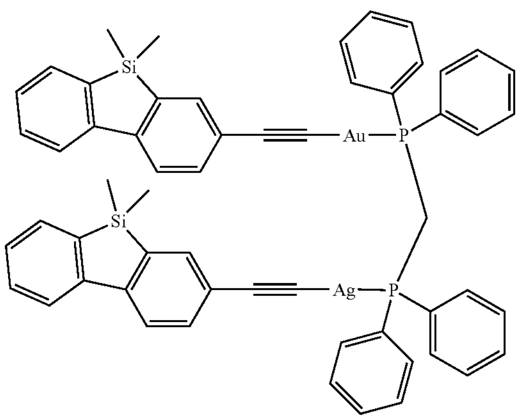
567
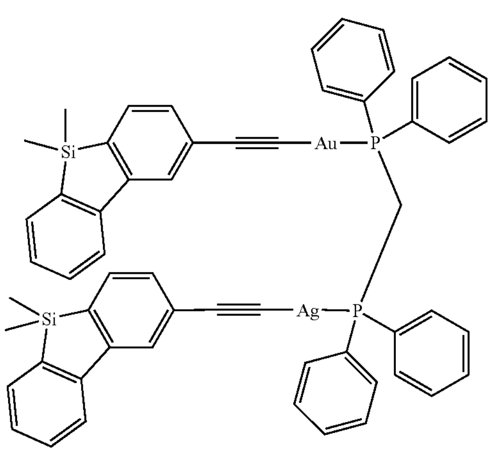
568
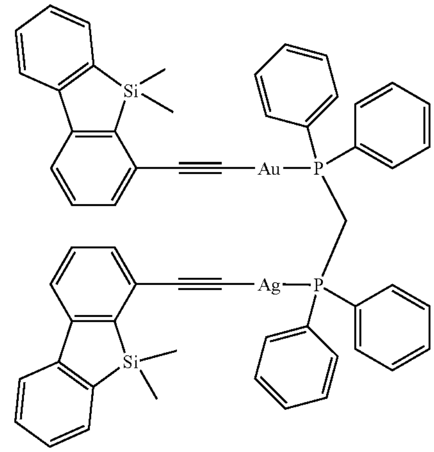
569
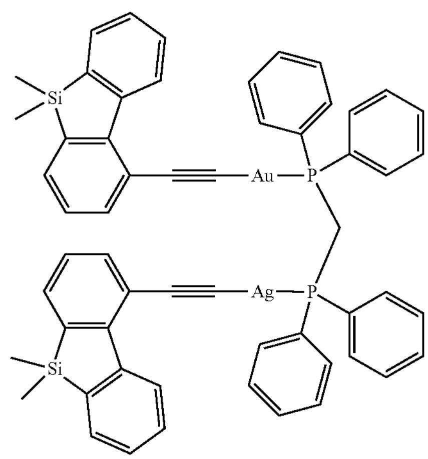
570
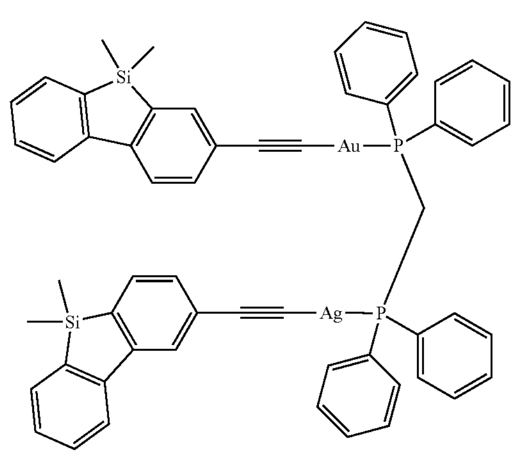

571
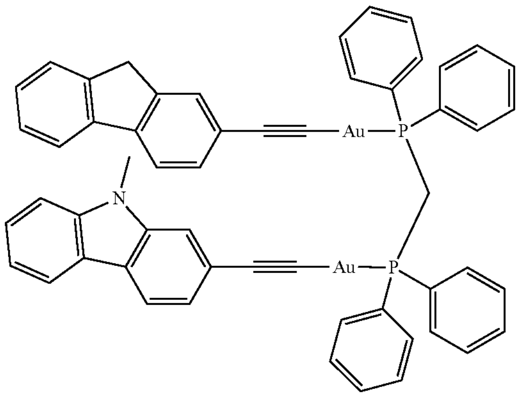
572
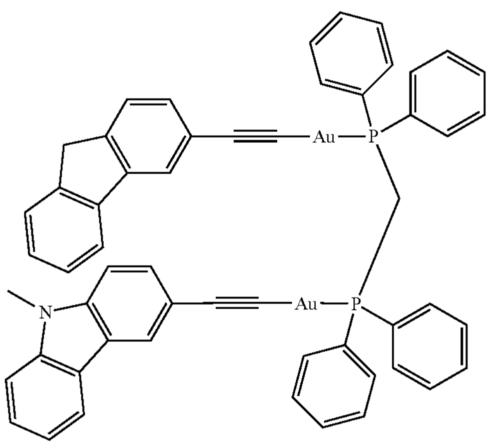
573
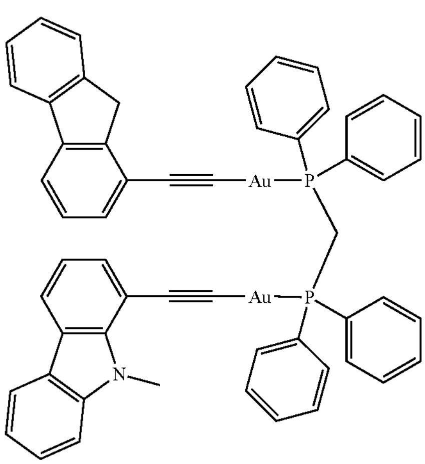
574
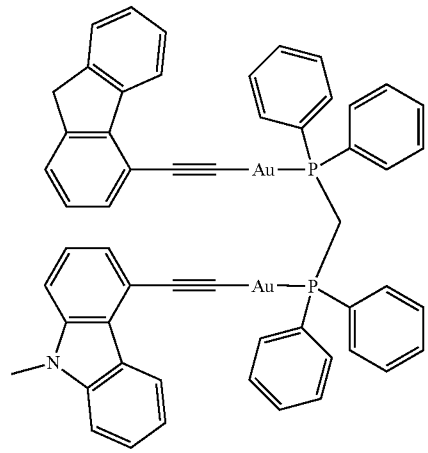
575
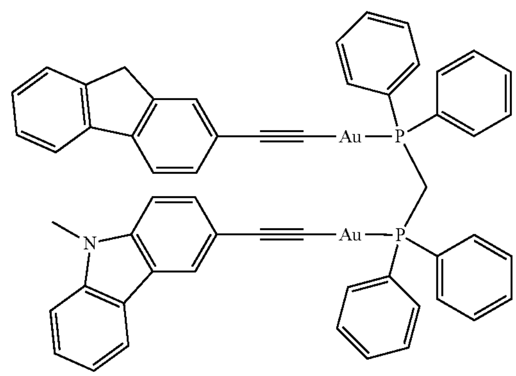
576
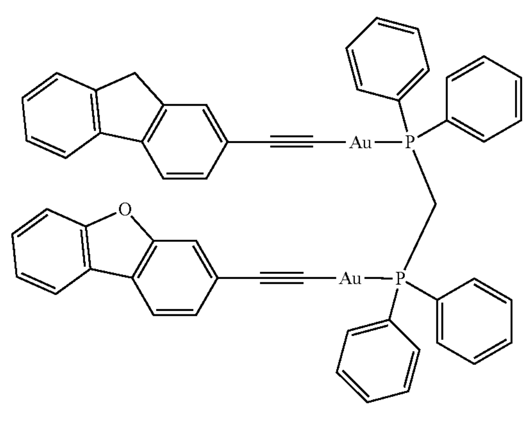

577
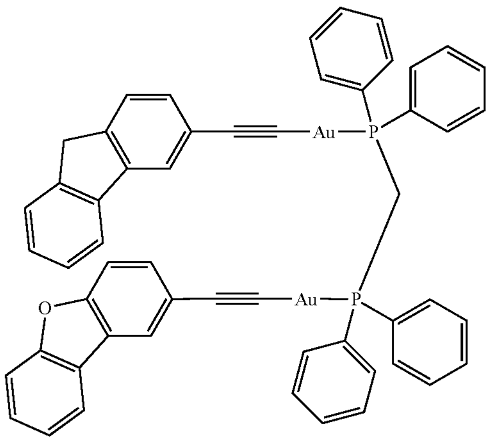
578
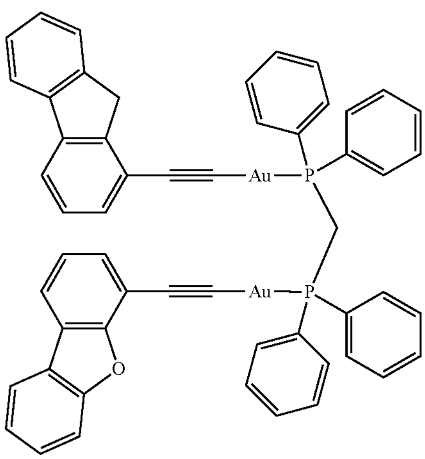
579
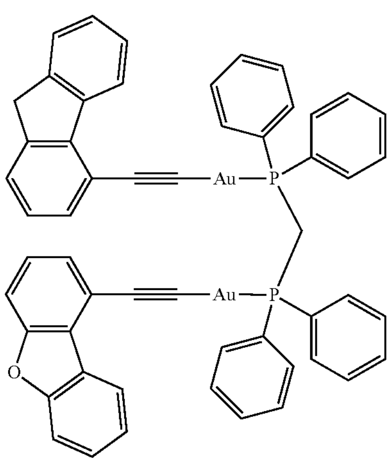
580
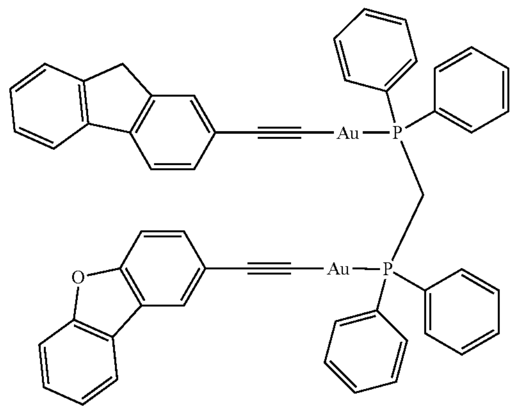
581
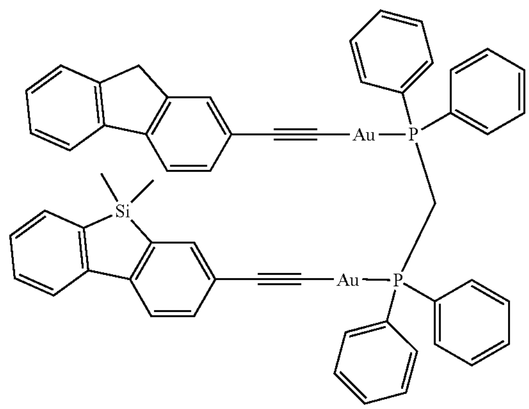
582
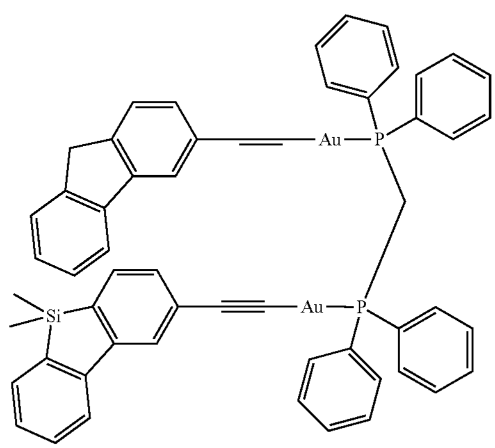

-continued
583
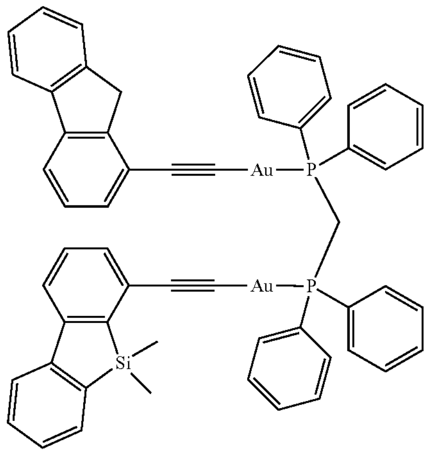
584
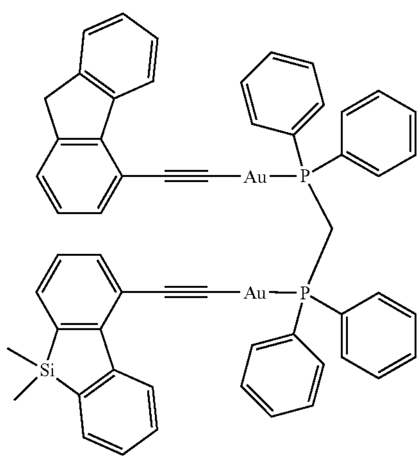
585
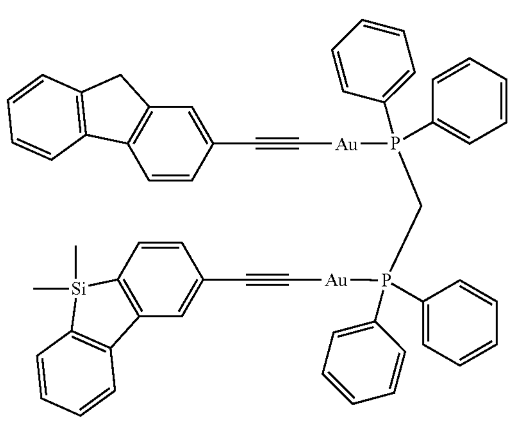
-continued
586
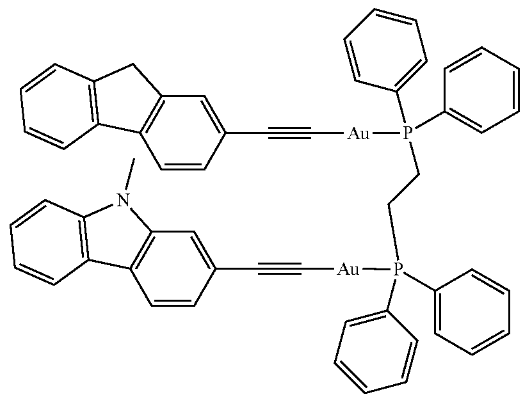
587
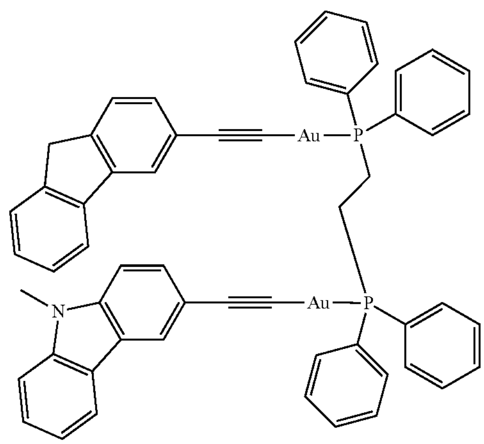
588
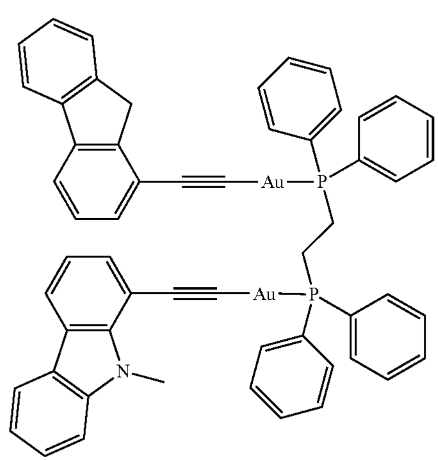

589
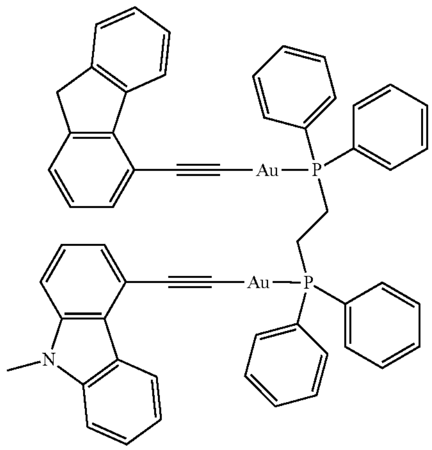
590
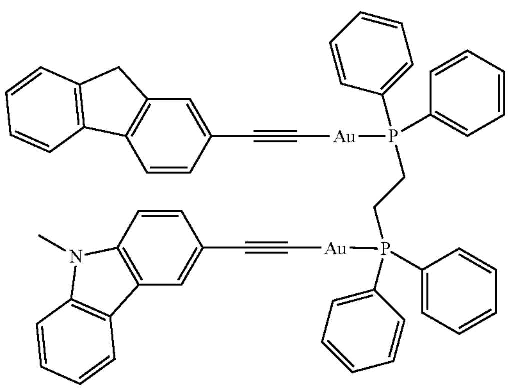
591
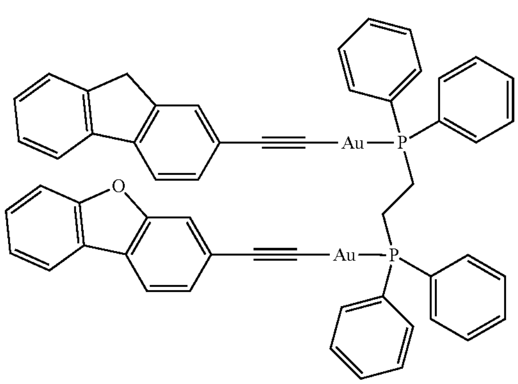
592
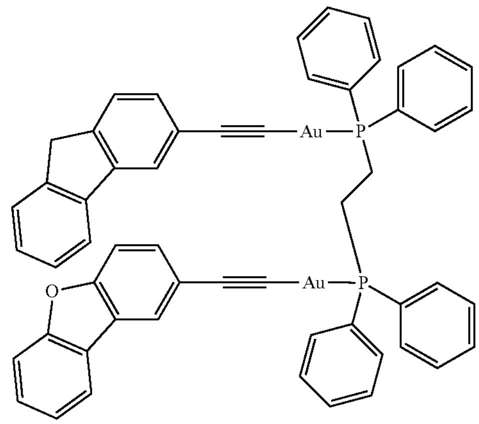
592
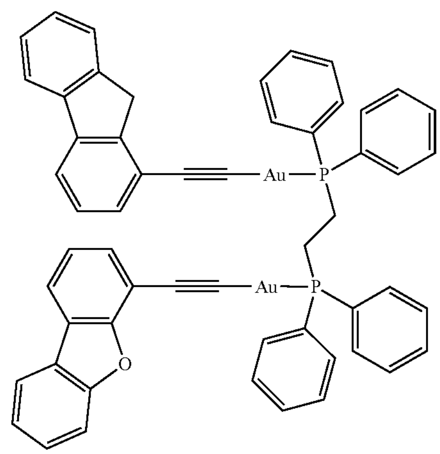
594
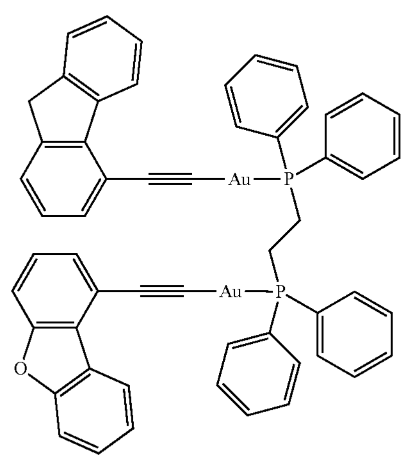

-continued
595
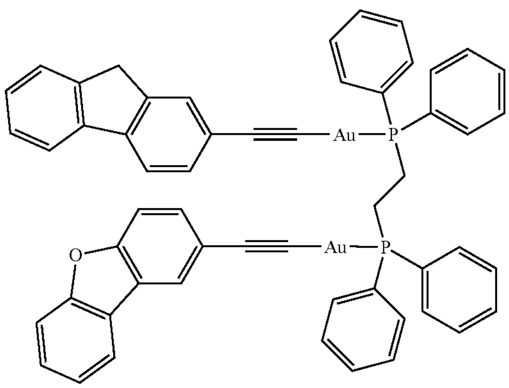
596
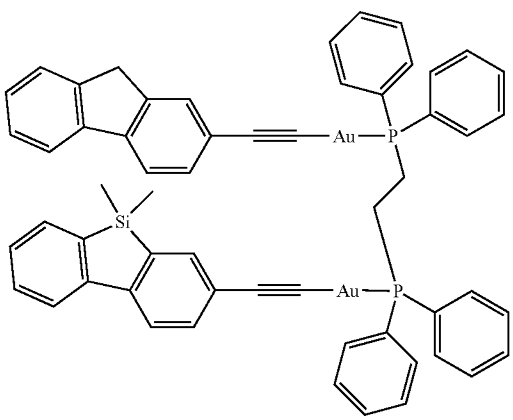
597
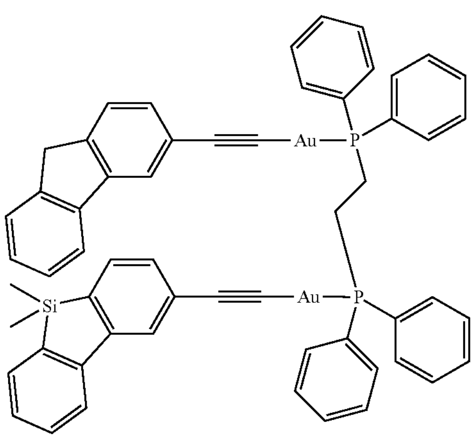
-continued
598
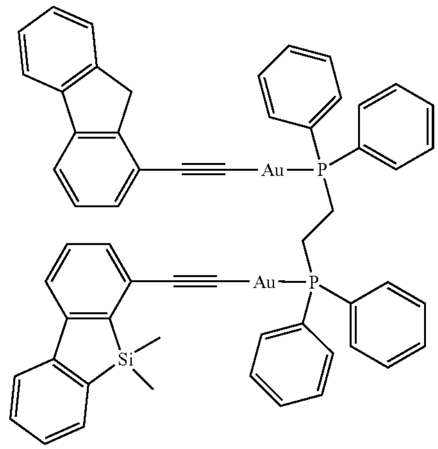
599
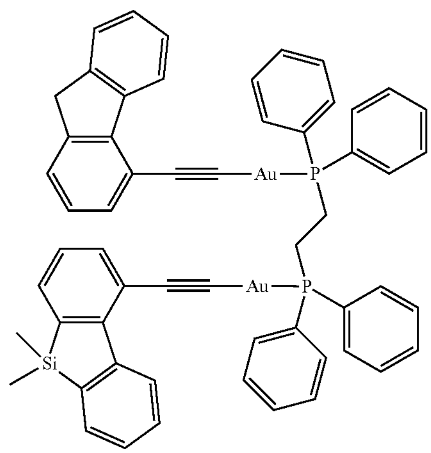
600
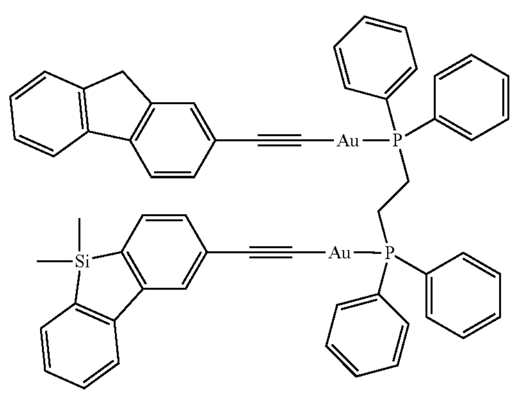

601
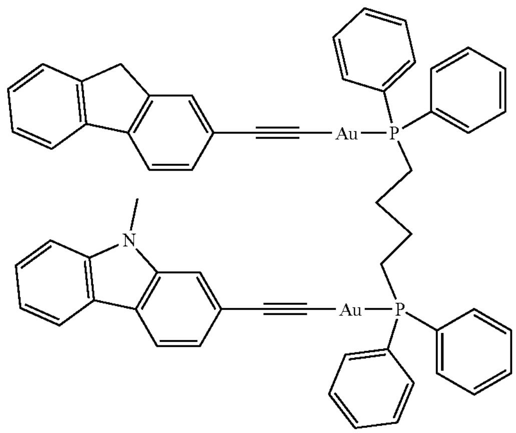
602
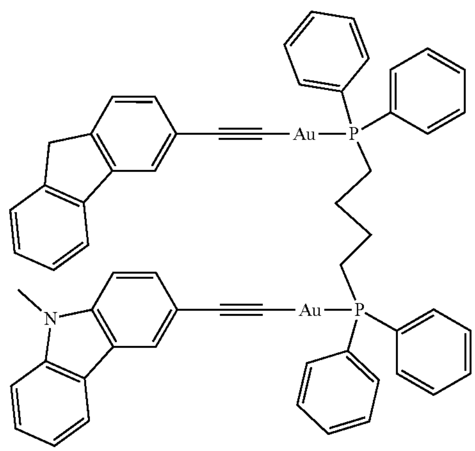
603
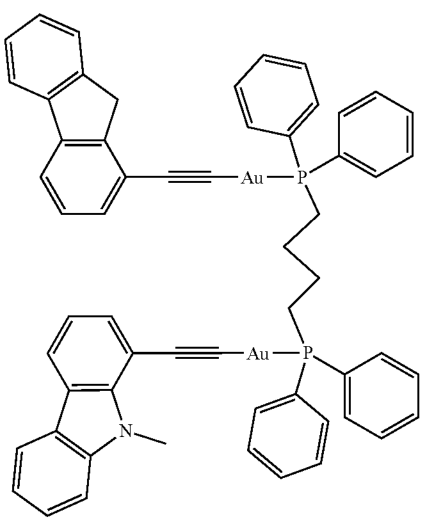

-continued
604
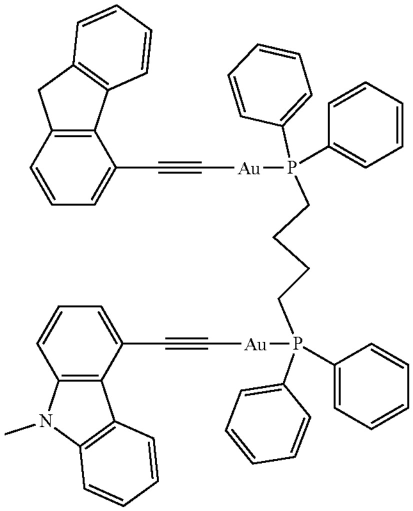
605
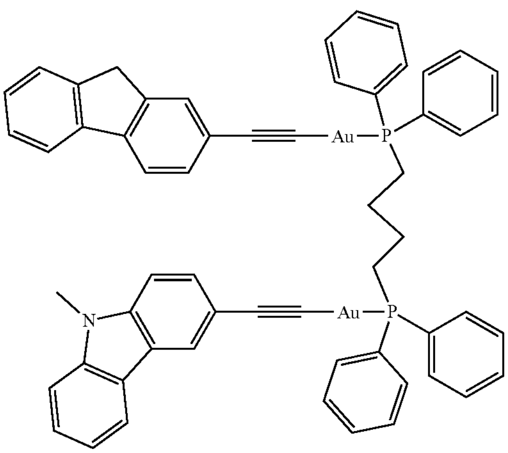
606
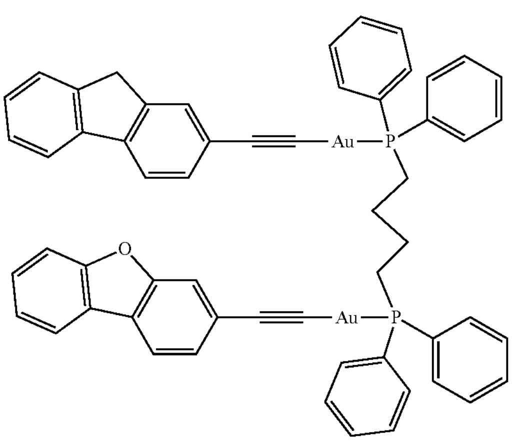

-continued
607
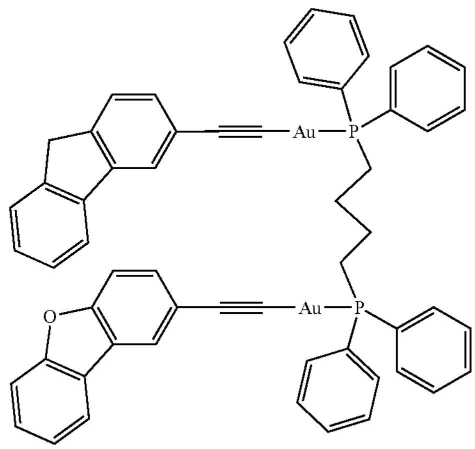
608
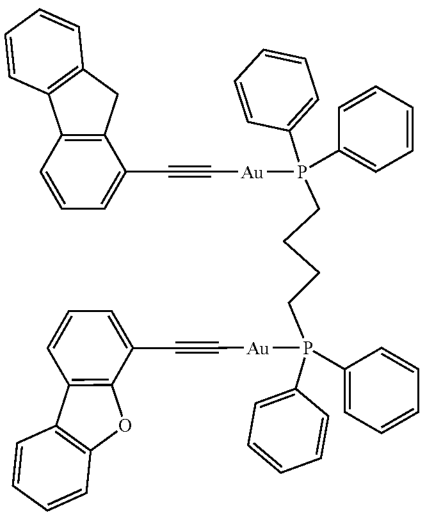
609
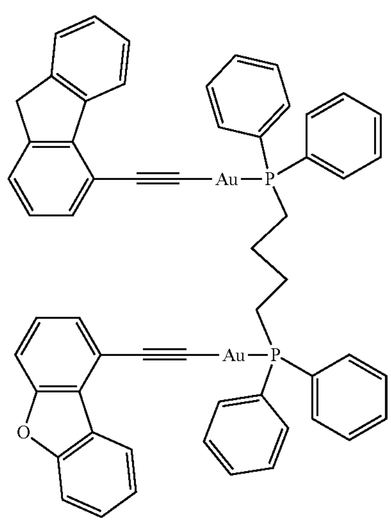

-continued
610
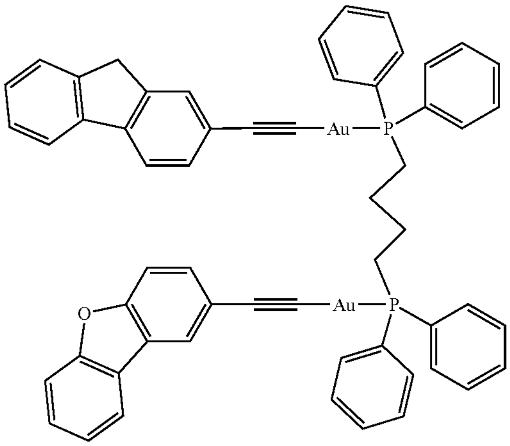
611
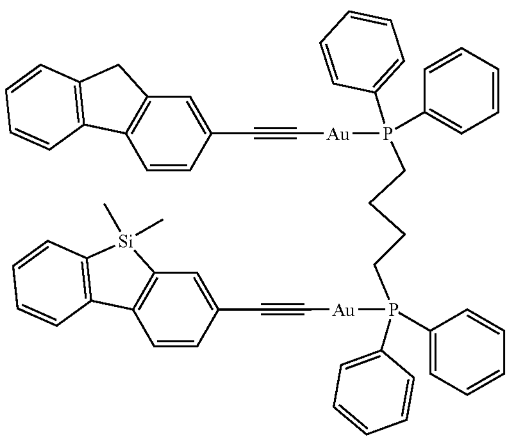
612
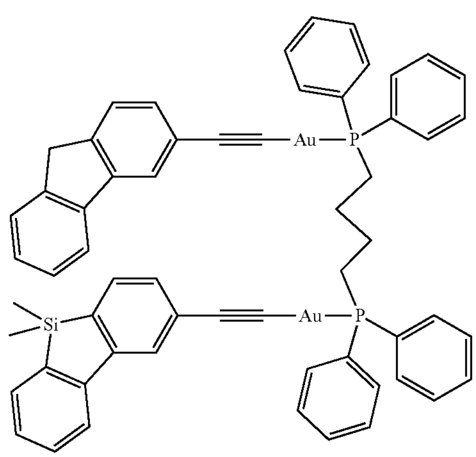

-continued
613
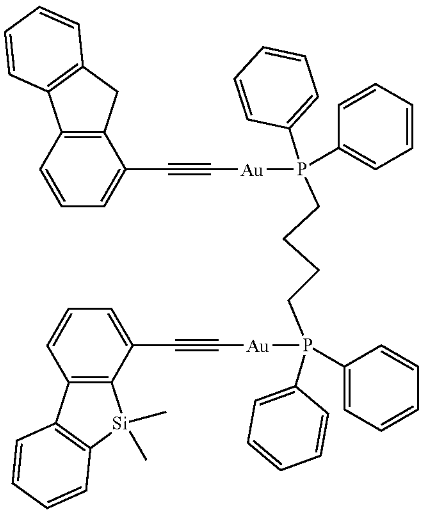
614
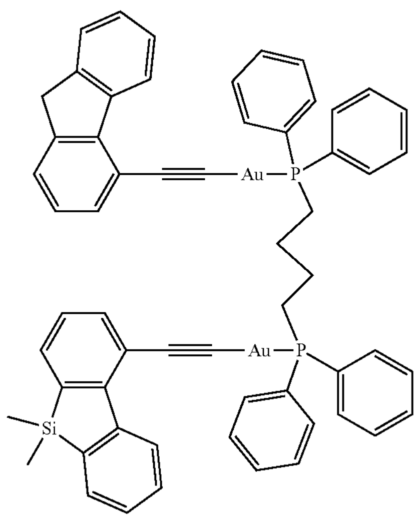
615
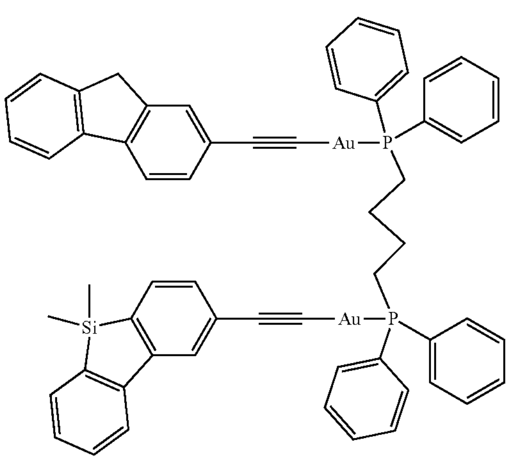

-continued
616
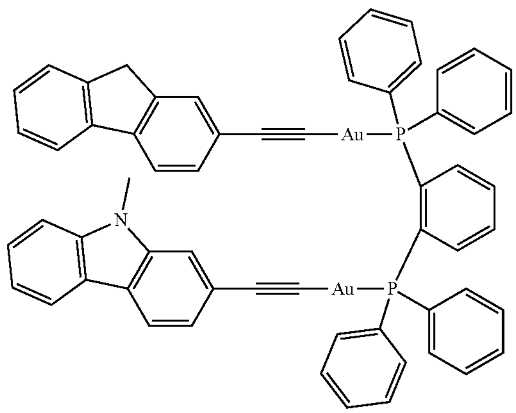
617
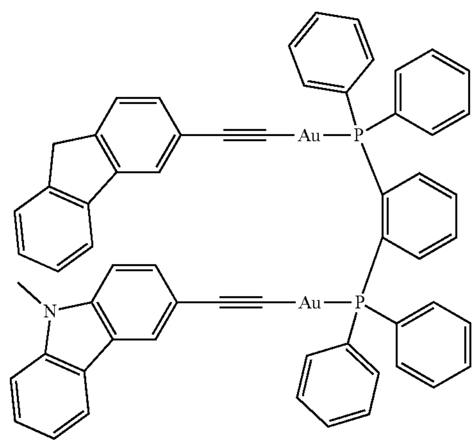
618
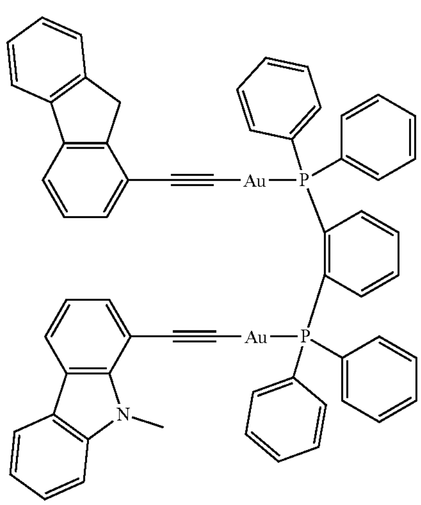

-continued
619
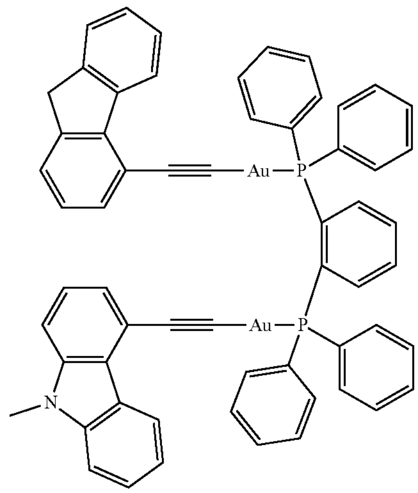
620
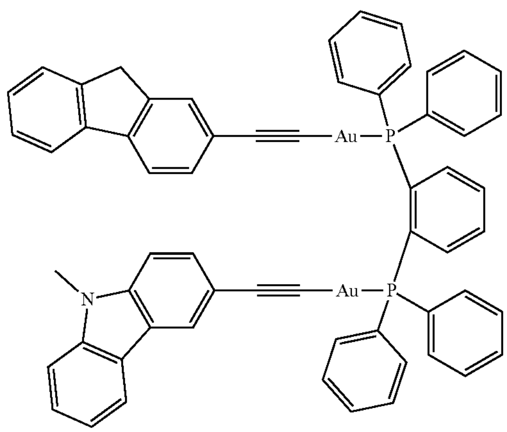
621
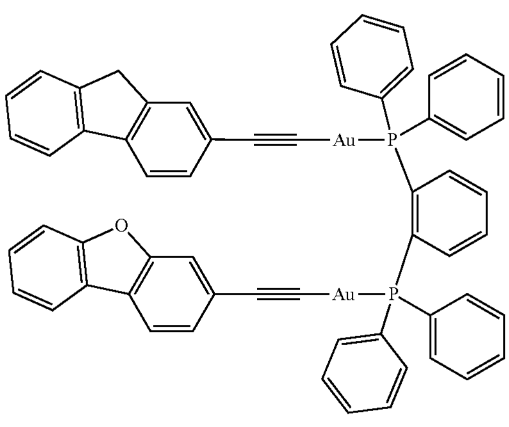

-continued
622
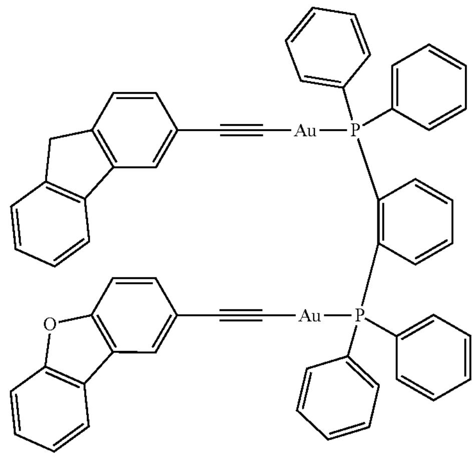
623
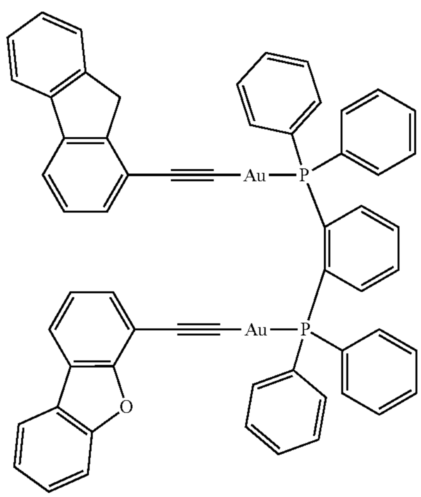
624
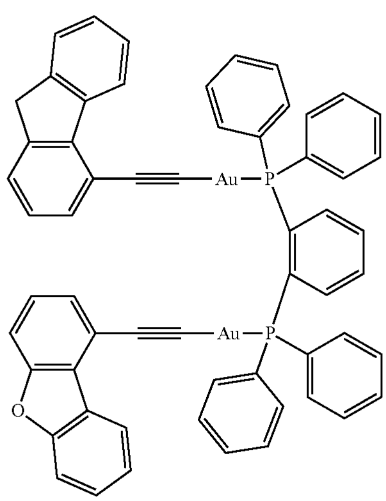

-continued
625
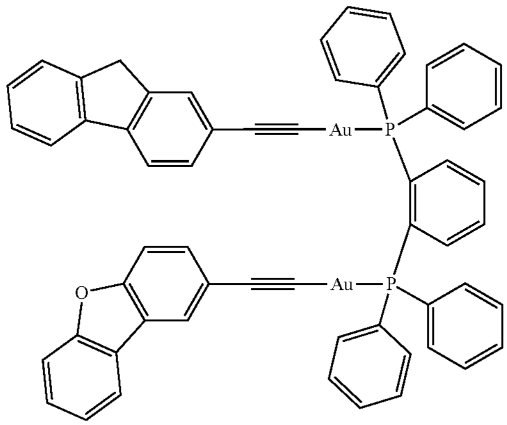
626
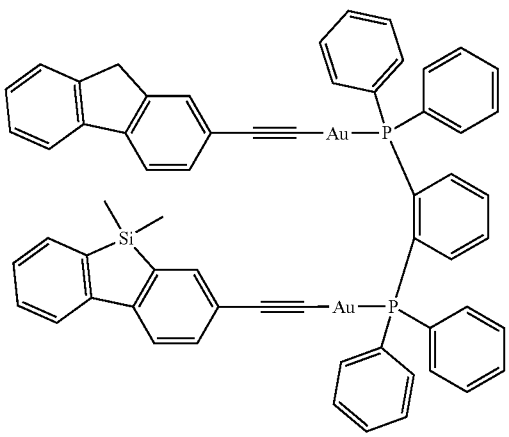
627
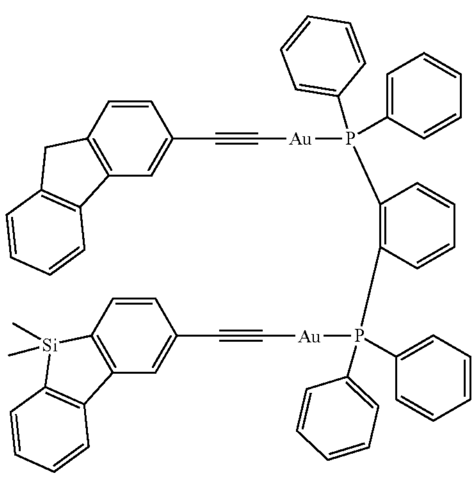

-continued
628
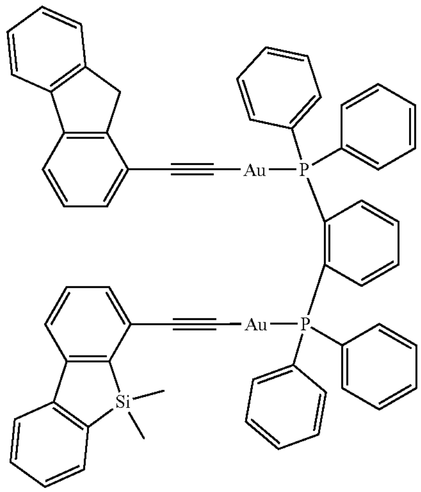
629
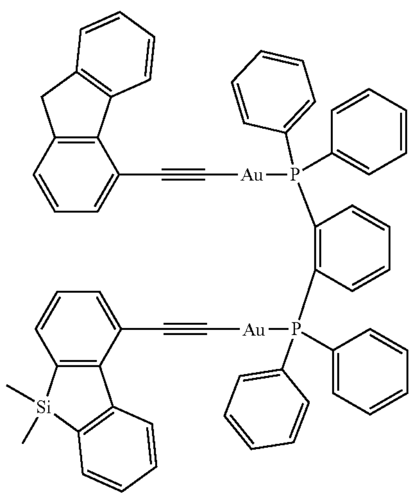
630
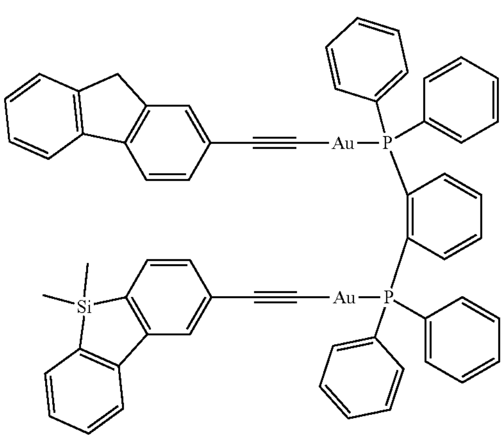

-continued
631
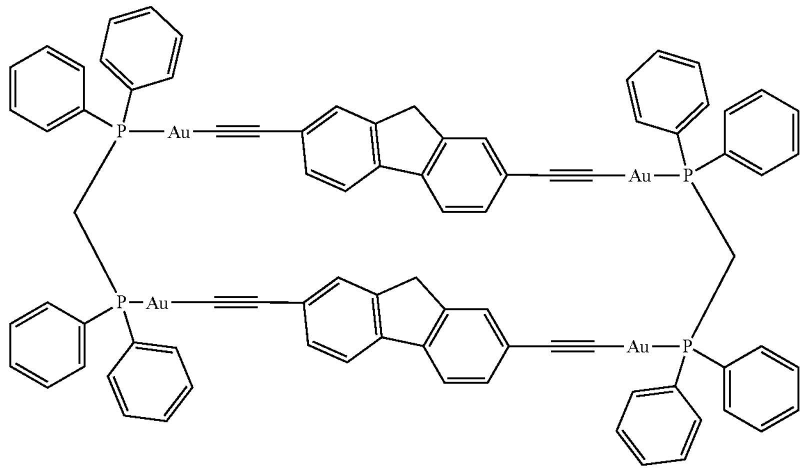
632
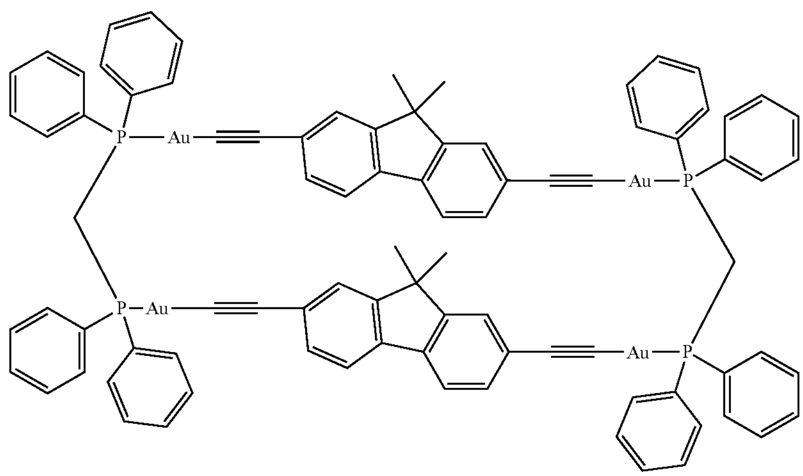
633
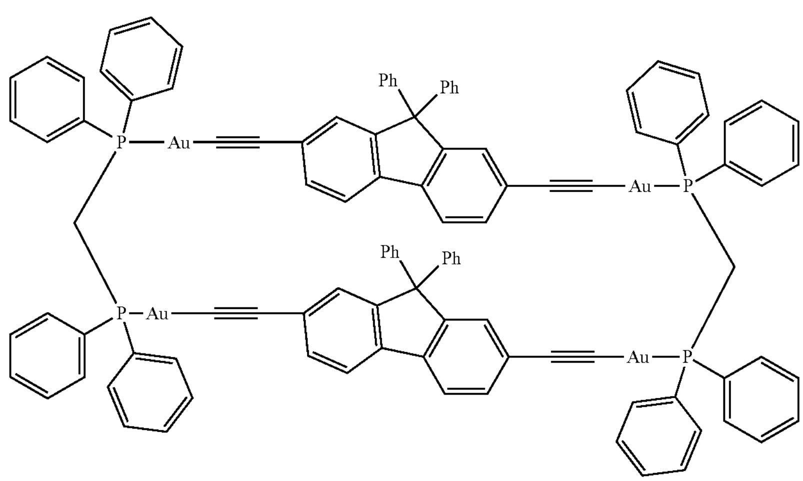

-continued
634
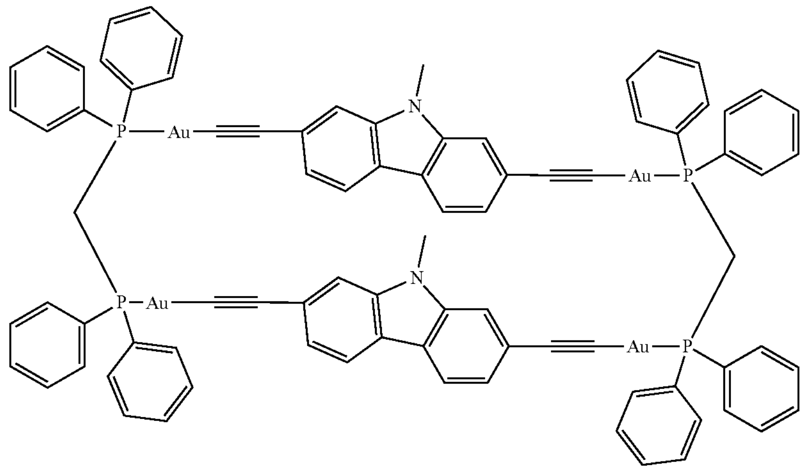
635
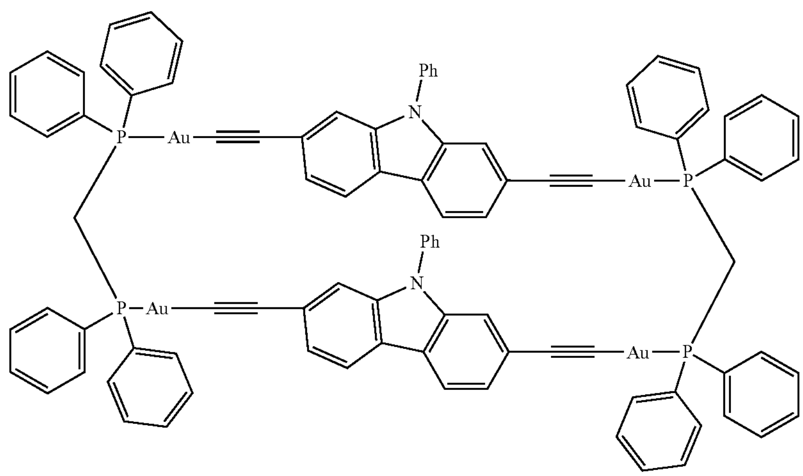
636
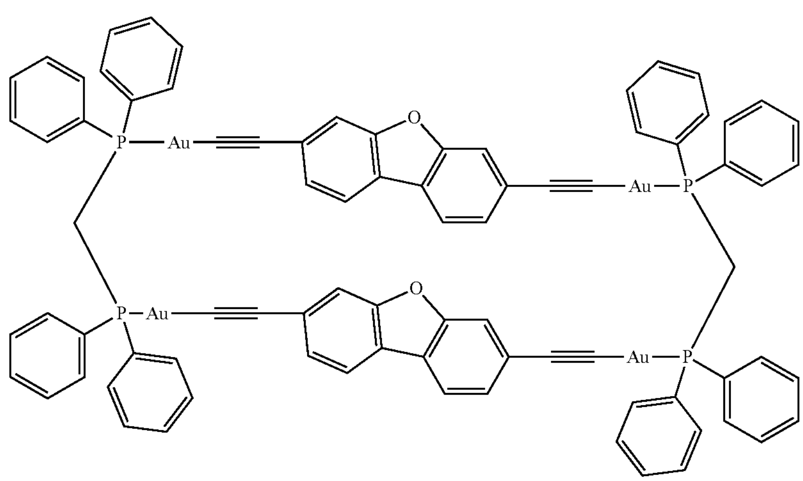

-continued
637
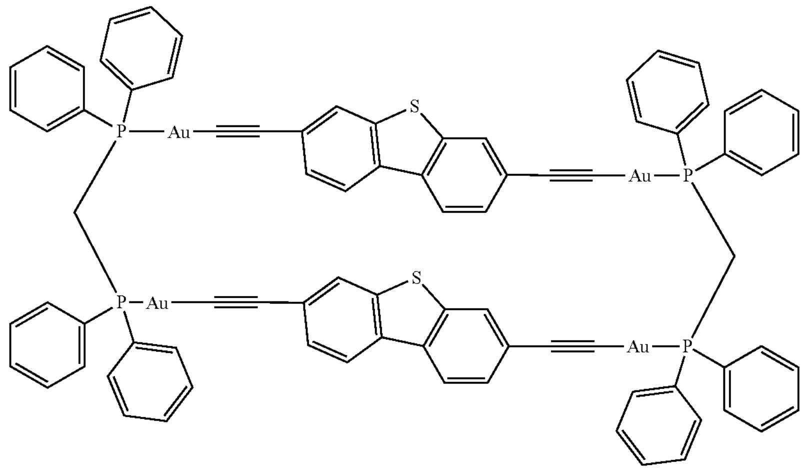
638
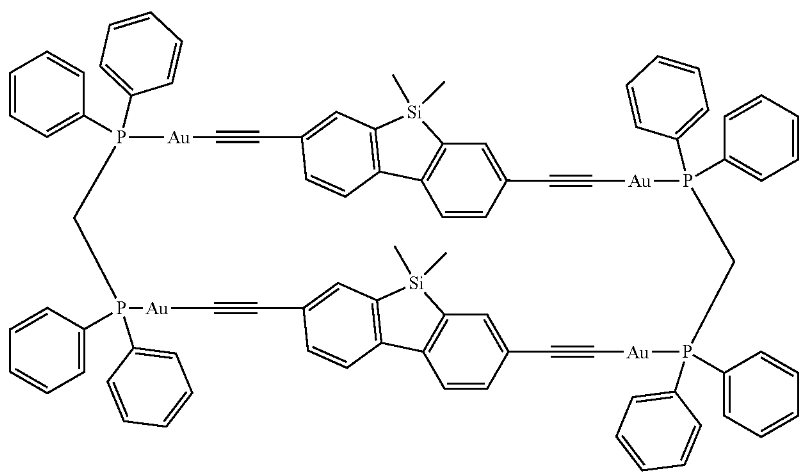
639
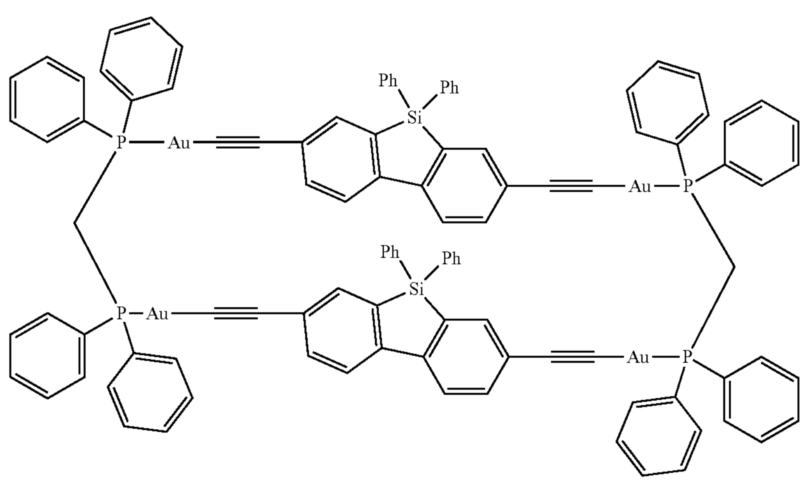

-continued
640
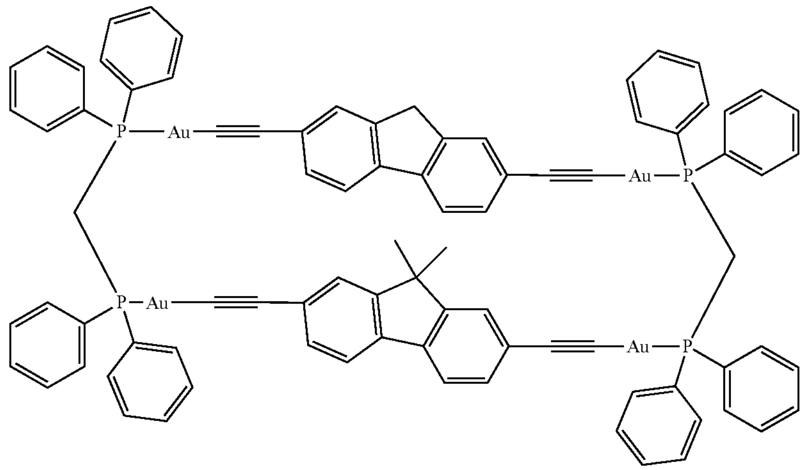
641
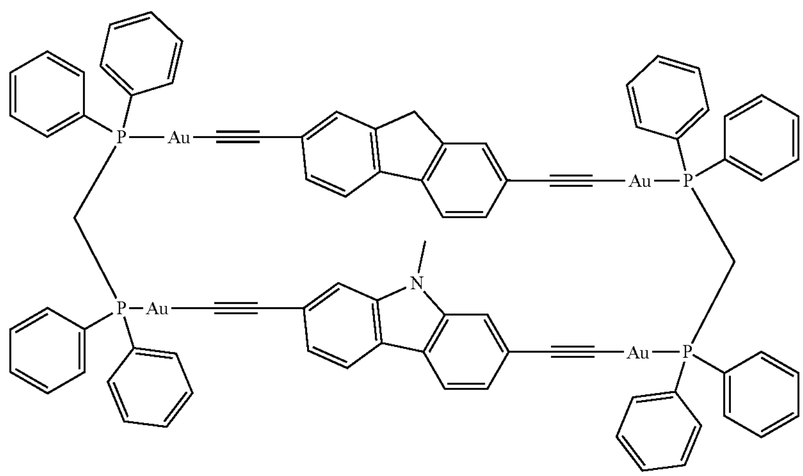
642
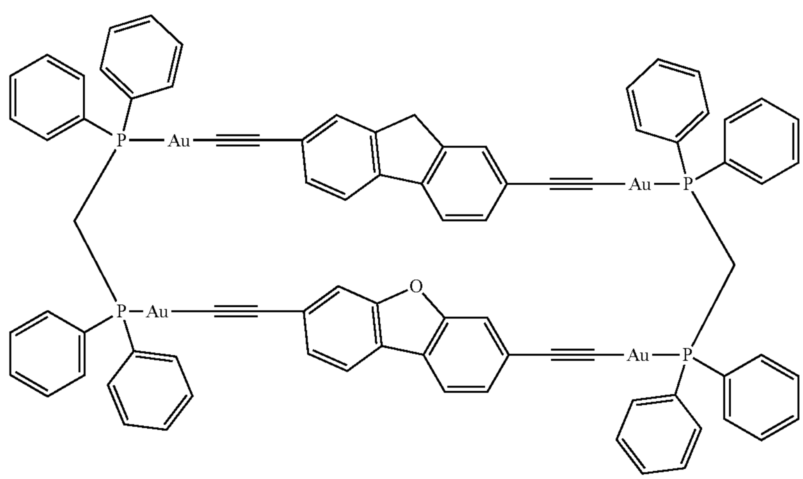

-continued
643
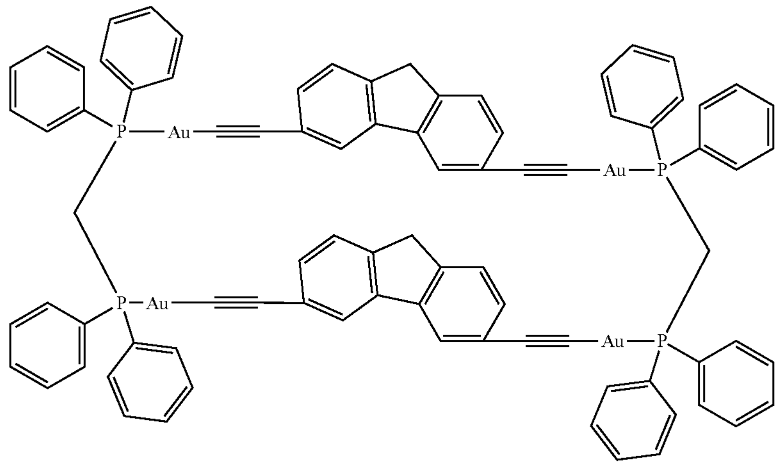
644
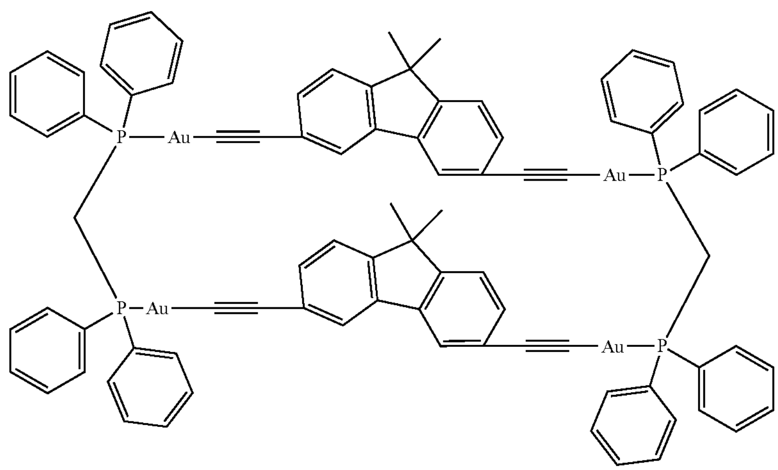
645
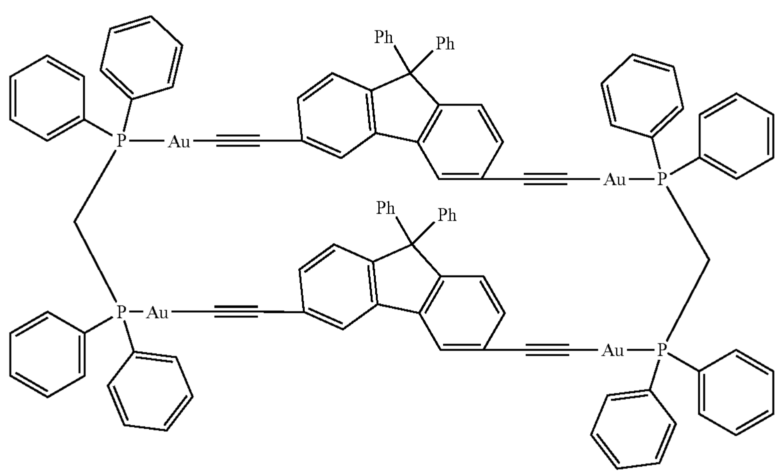

-continued
646
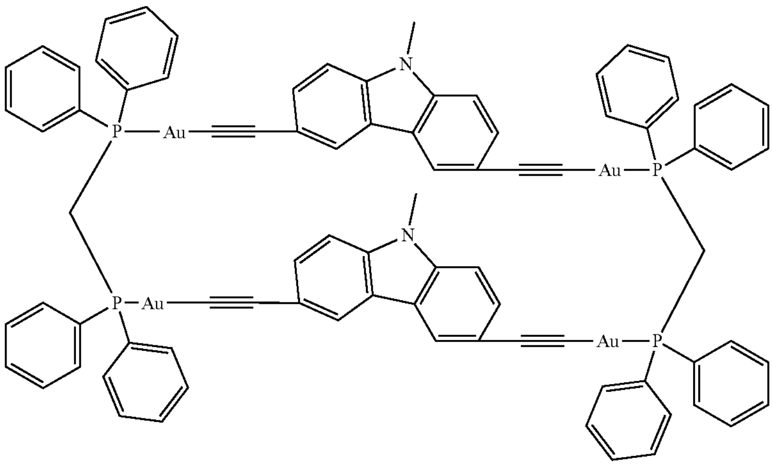
647
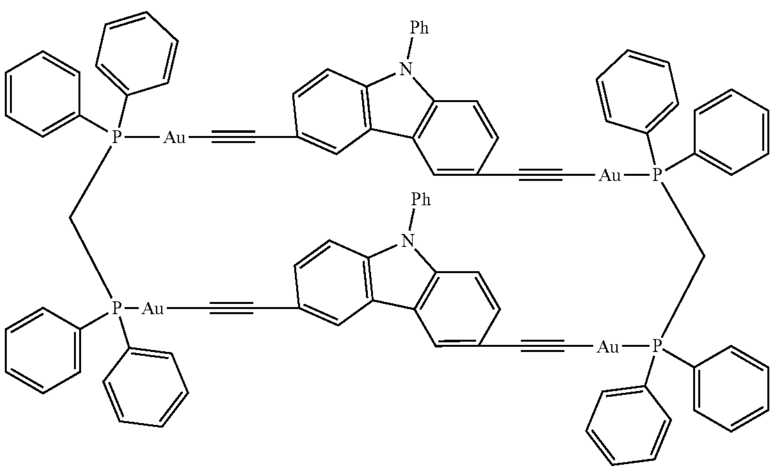
648
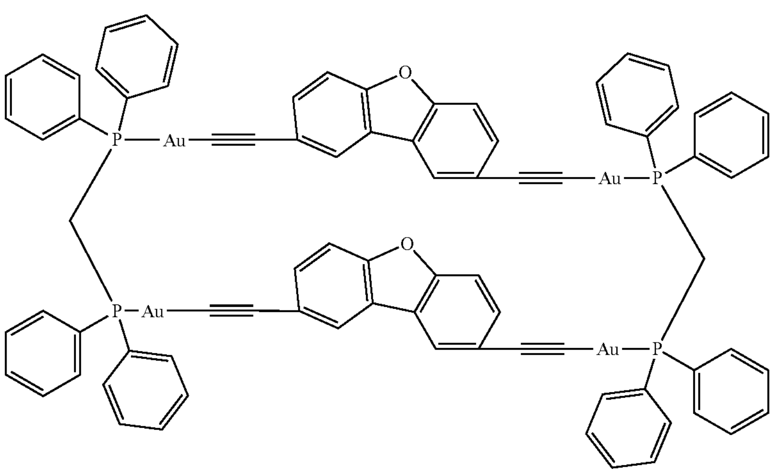

-continued
649
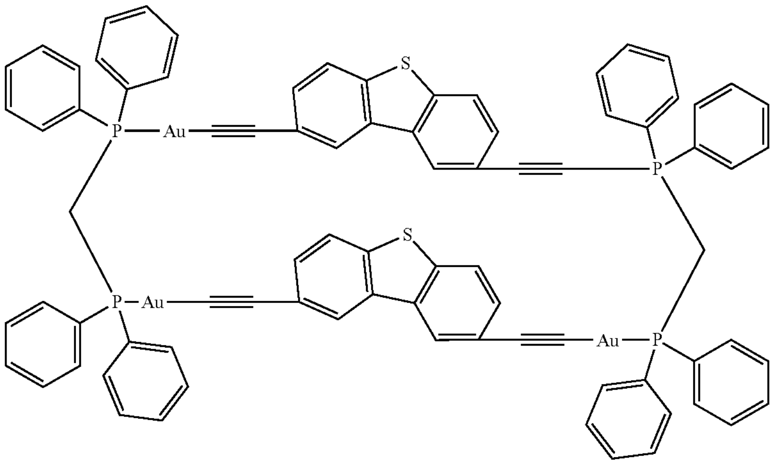
650
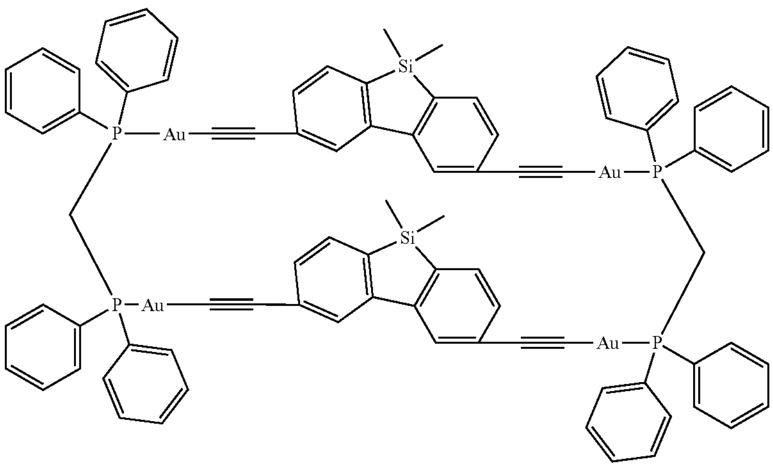
651
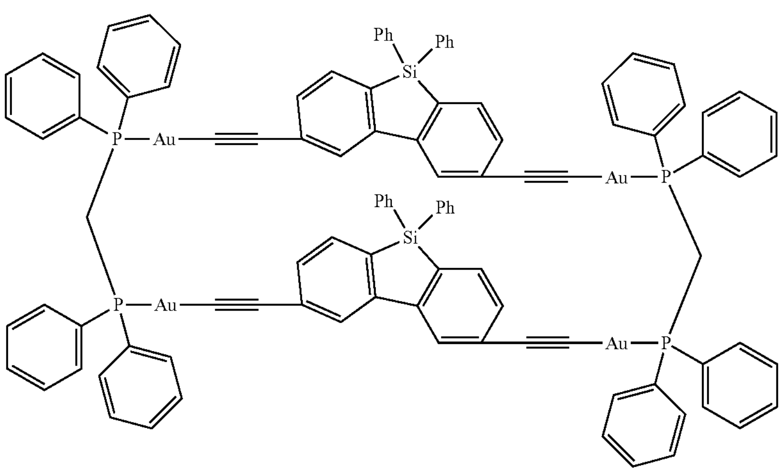

-continued
652
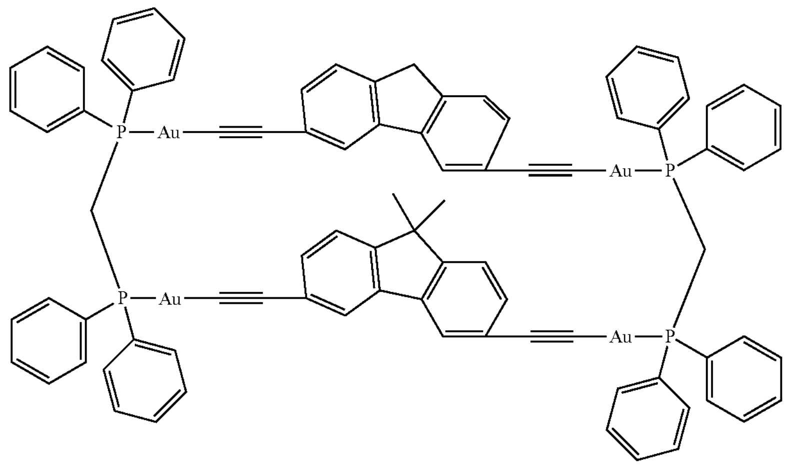
653
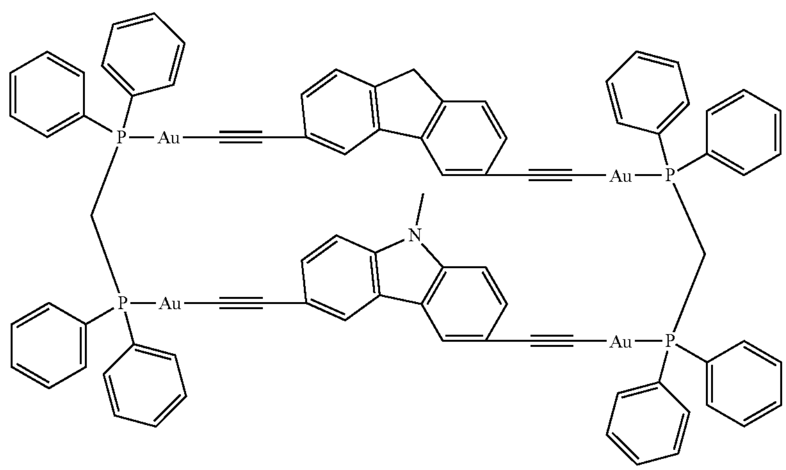
654
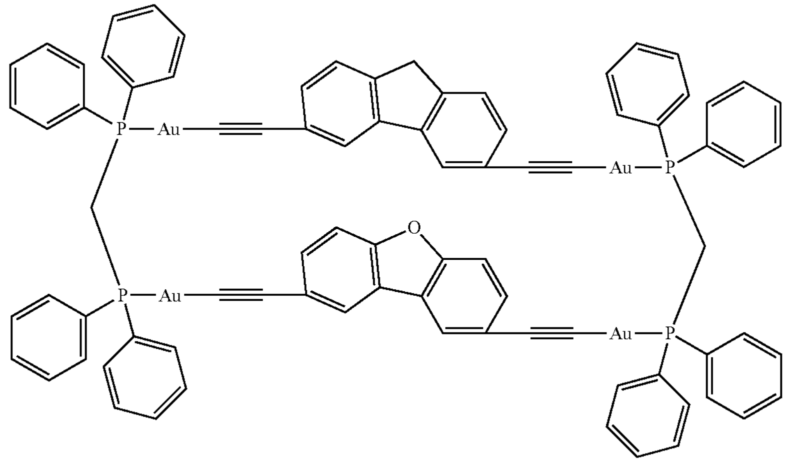

-continued
655
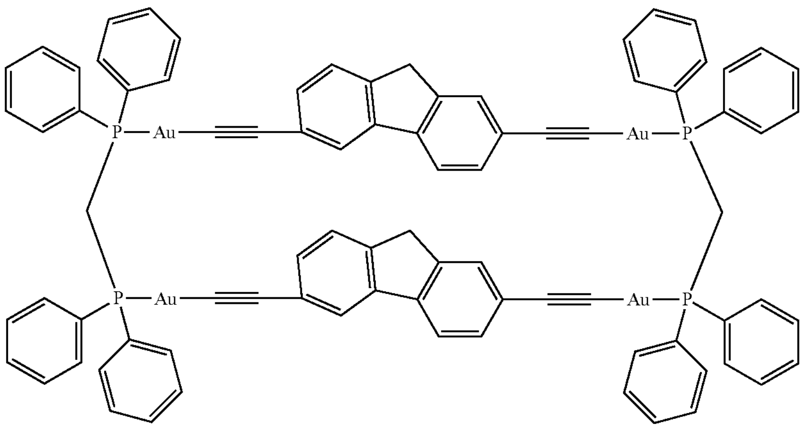
656
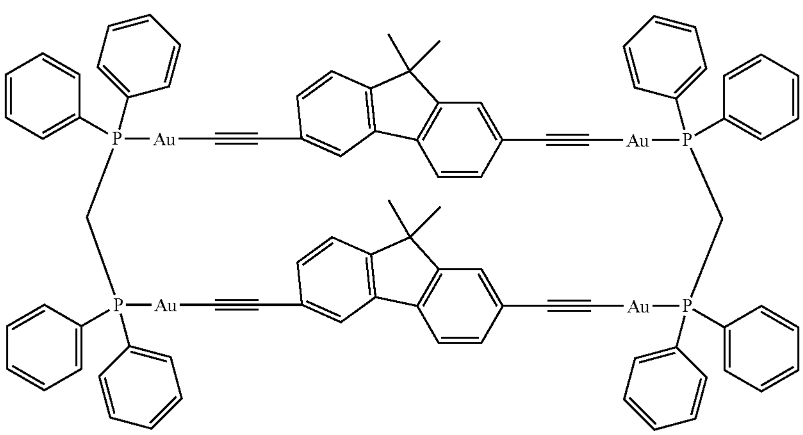
657
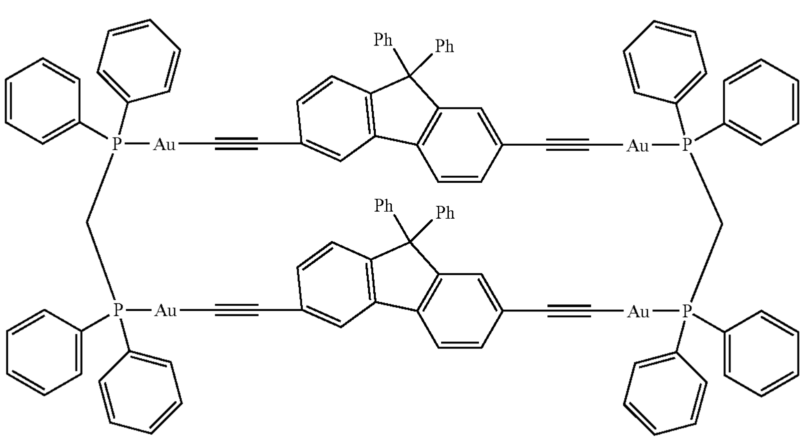

-continued
658
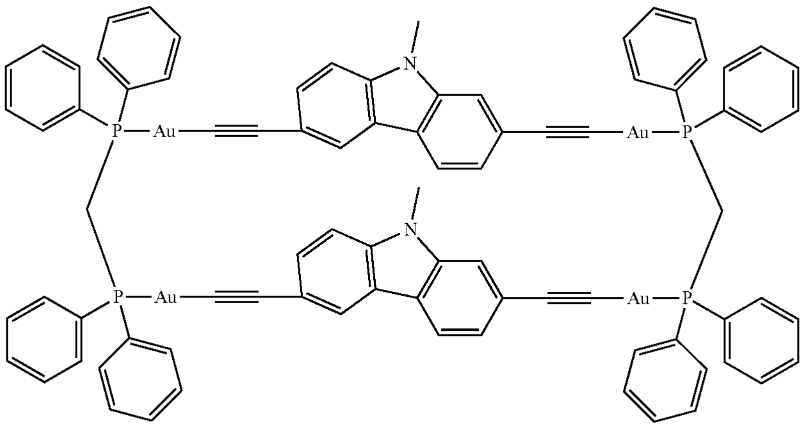
659
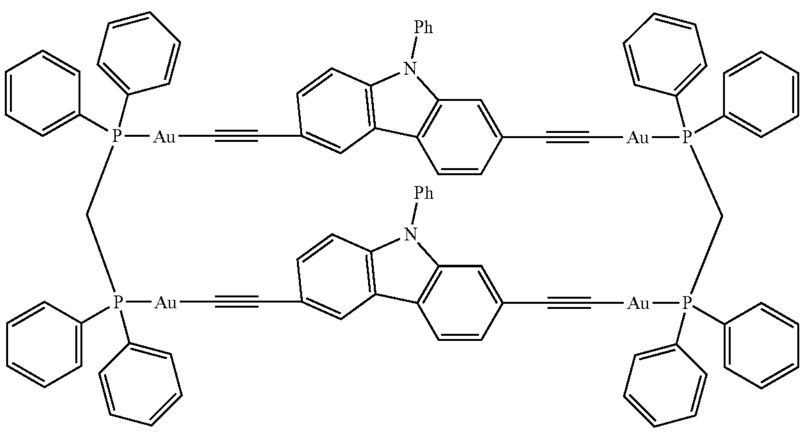
660
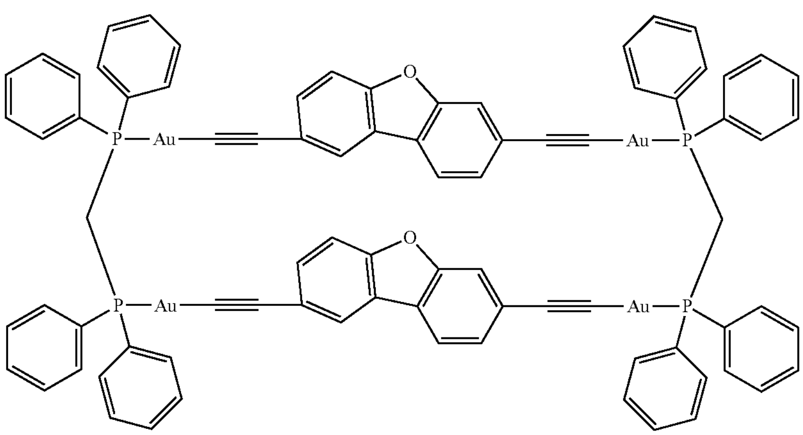

-continued
661
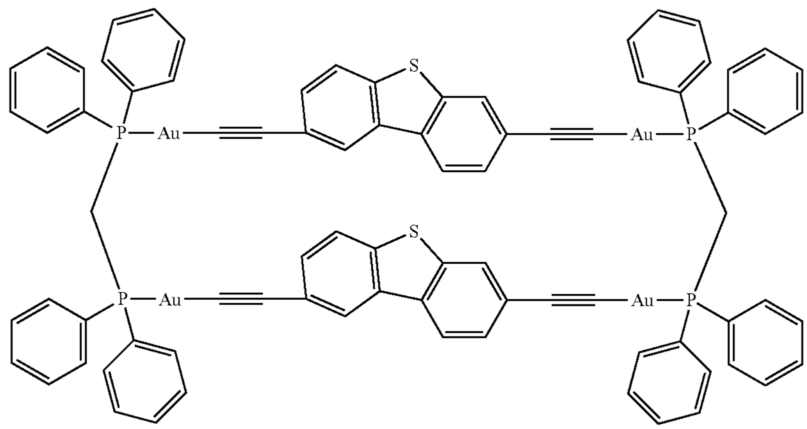
662
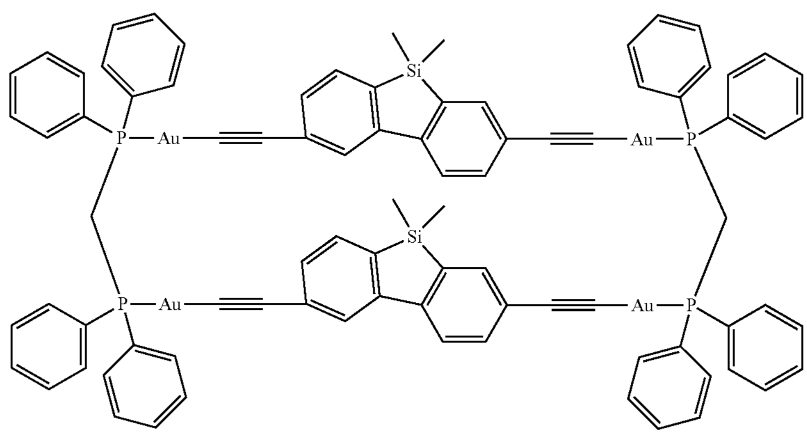
663
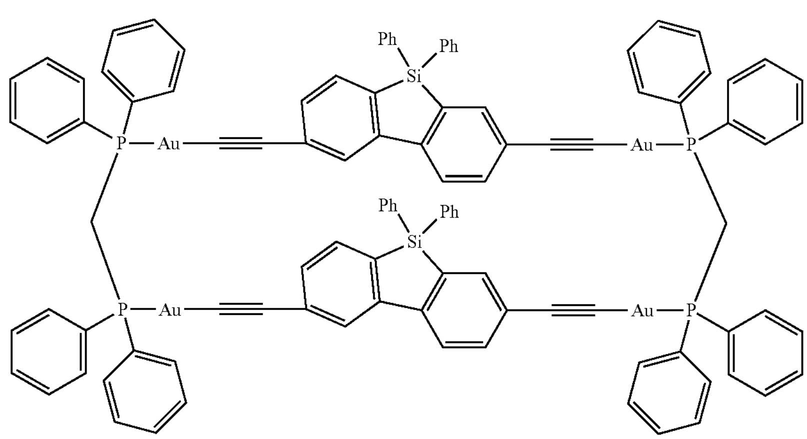

-continued
664
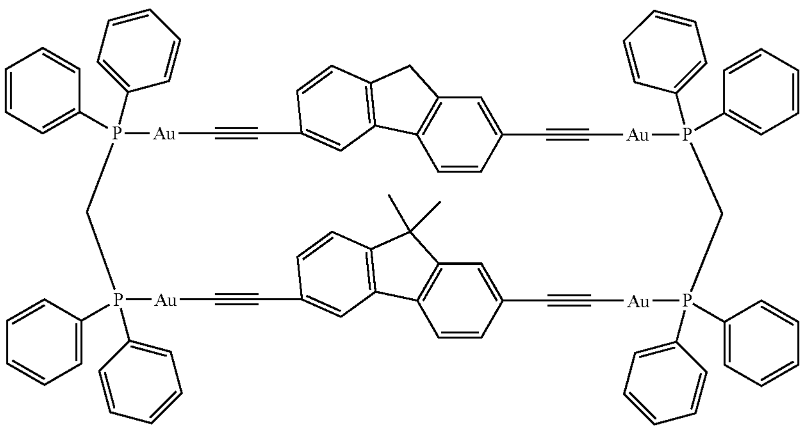
665
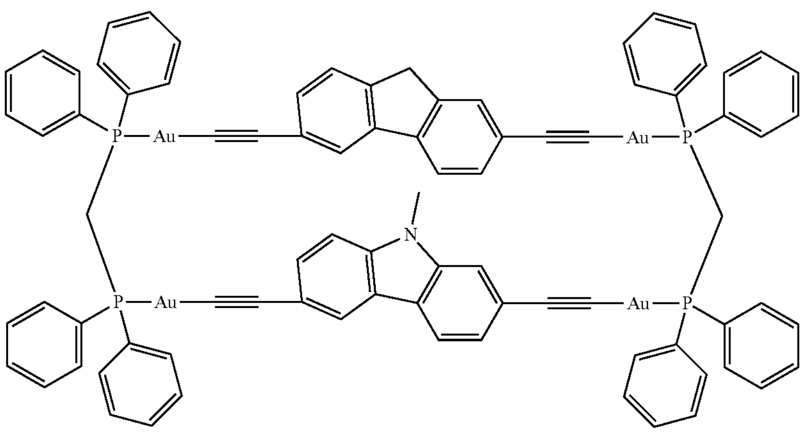
666
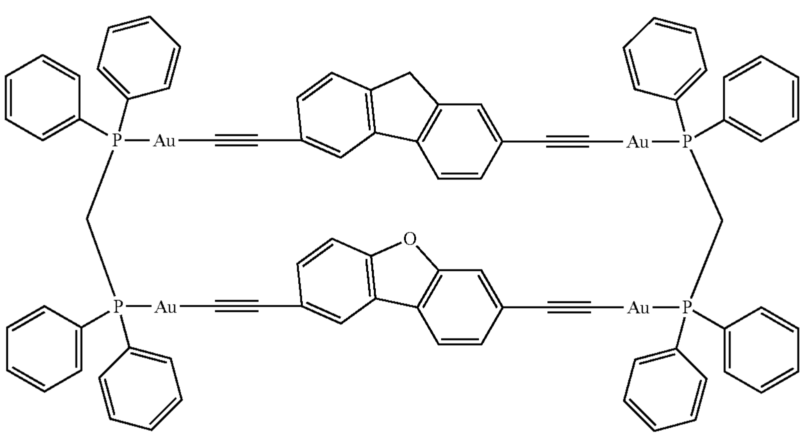

-continued
667
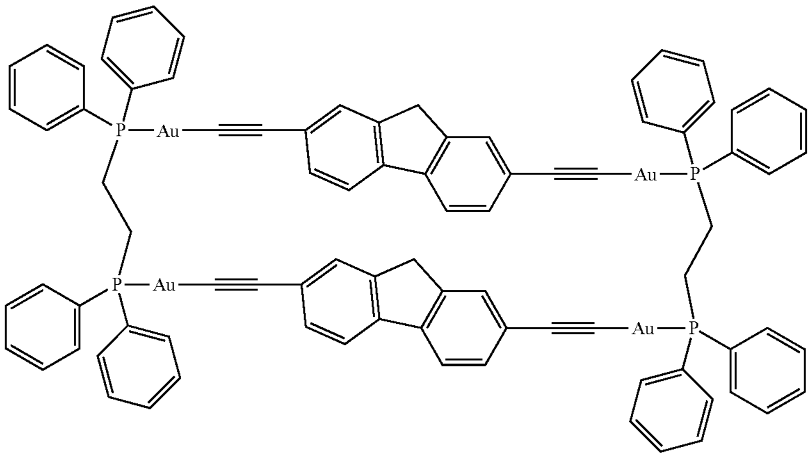
668
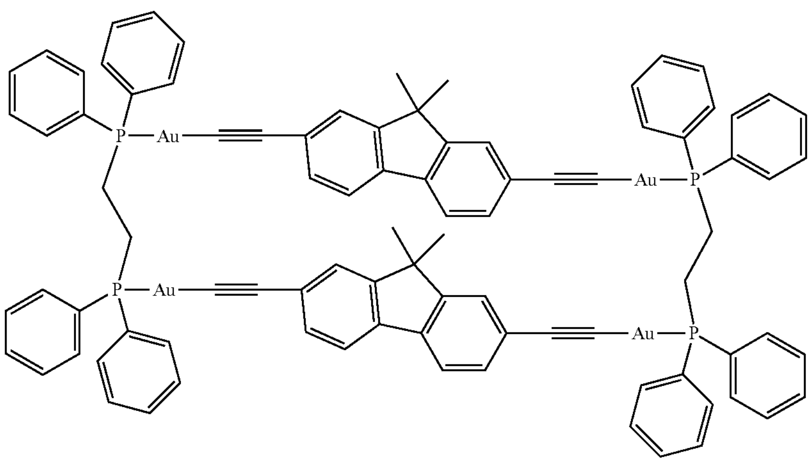
669
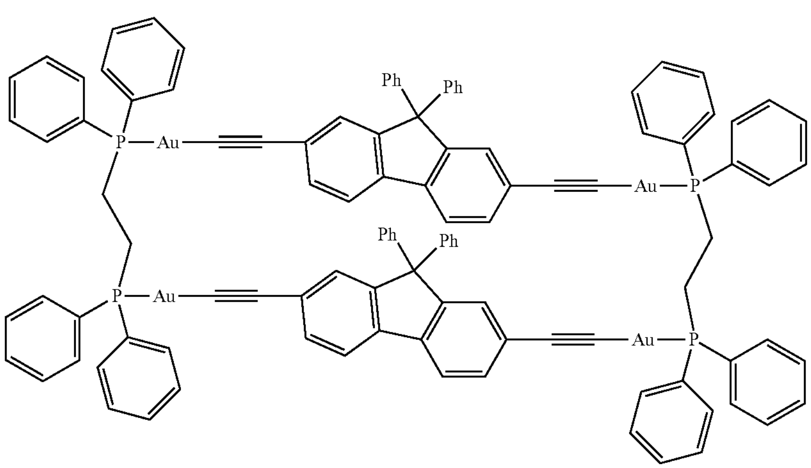

-continued
670
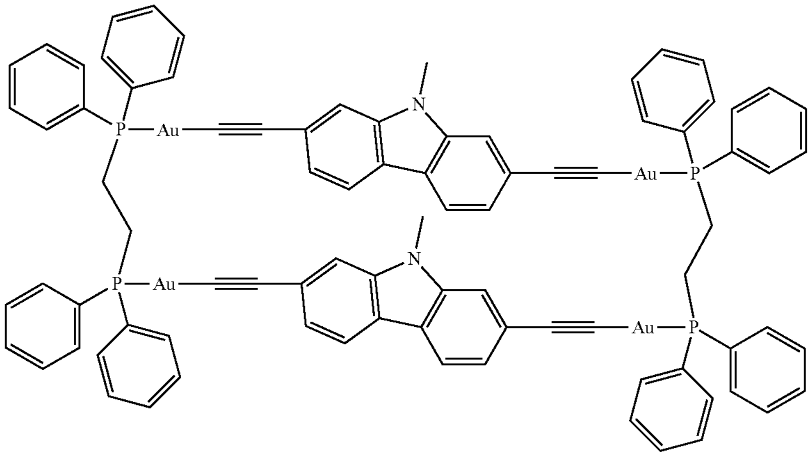
671
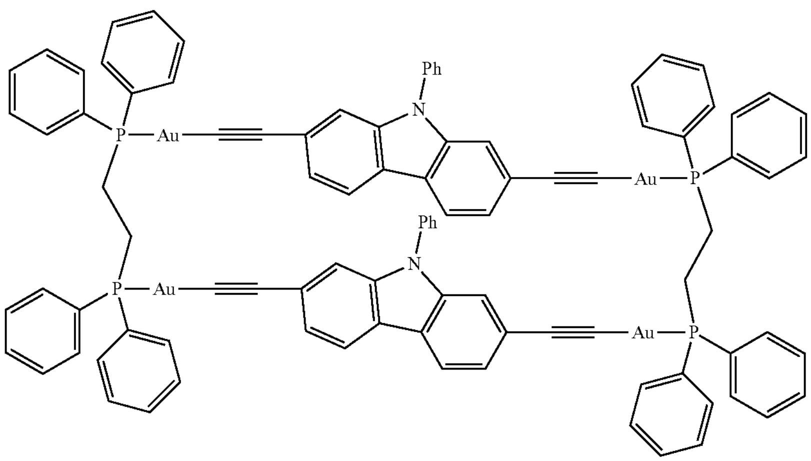
672
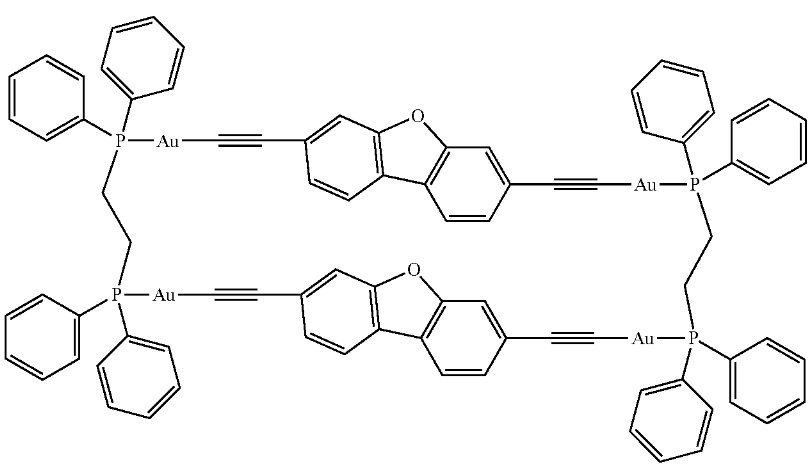

-continued
673
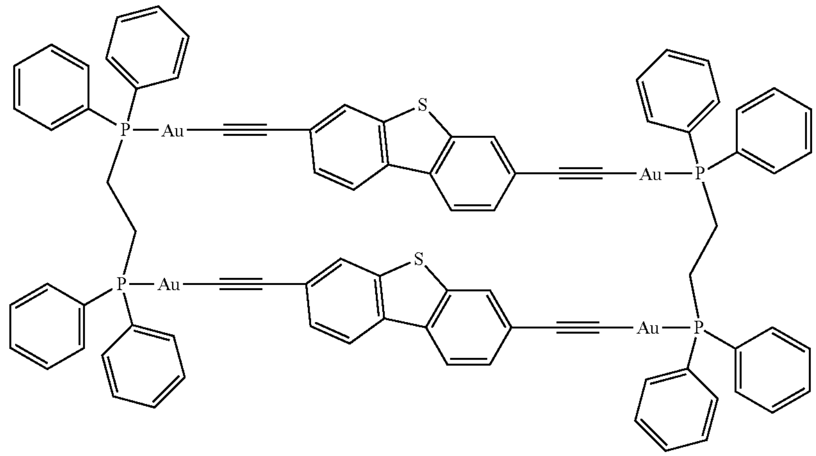
674
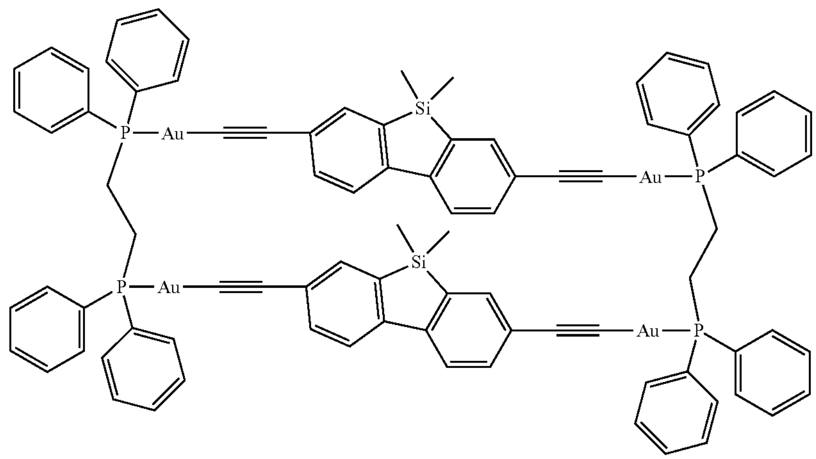
675
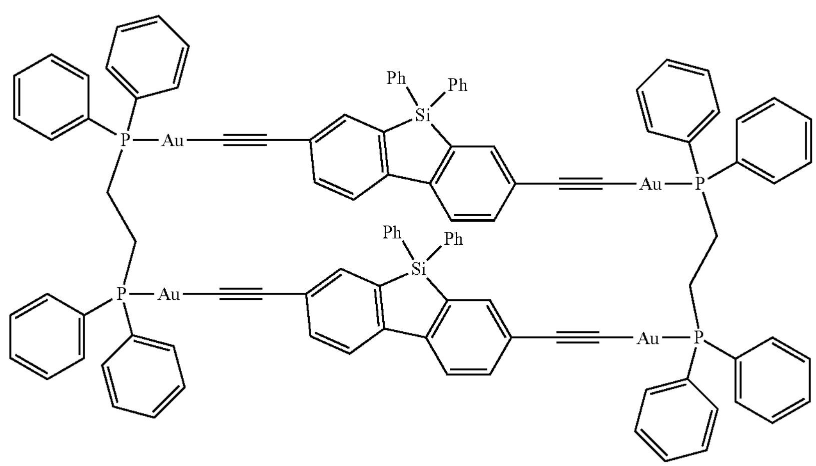

-continued
676
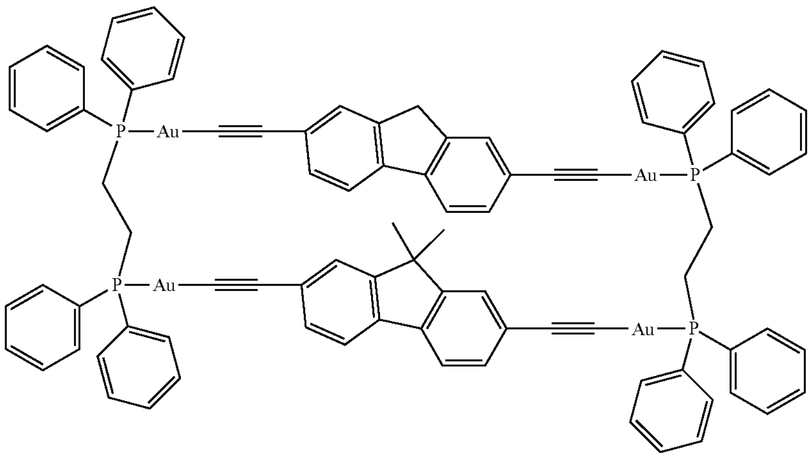
677
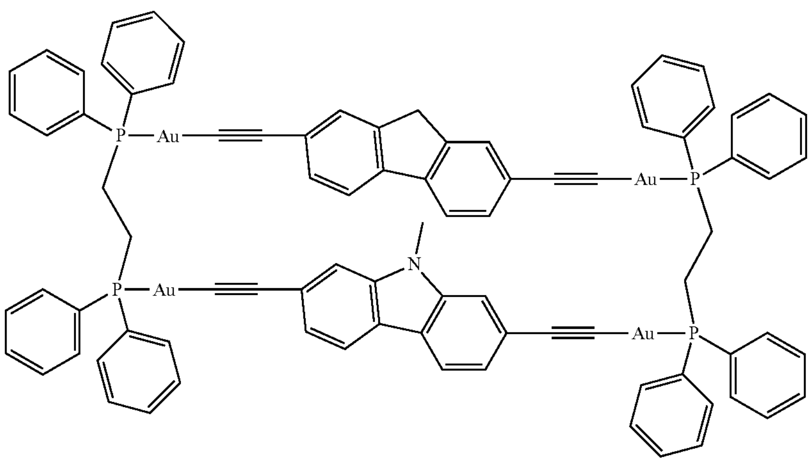
678
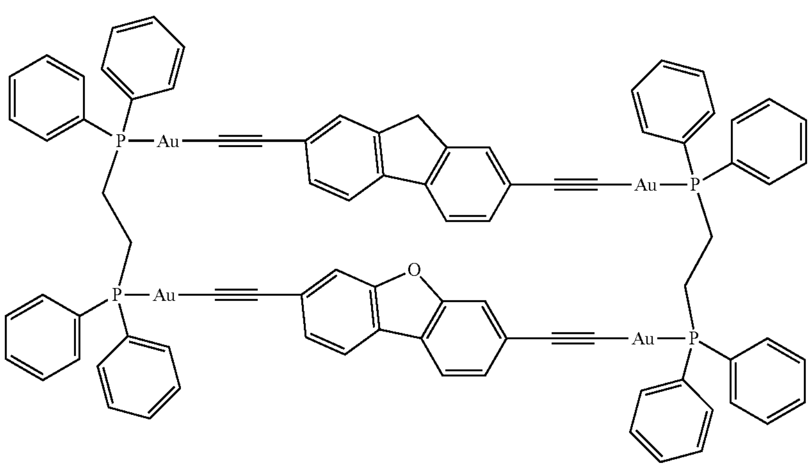

-continued
679
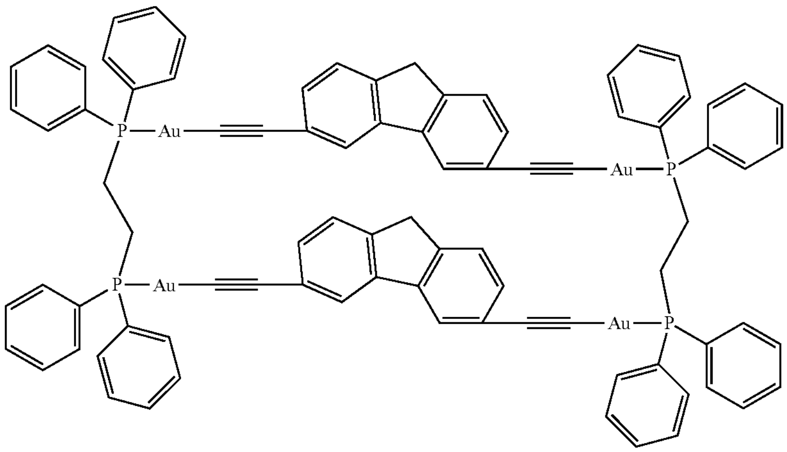
680
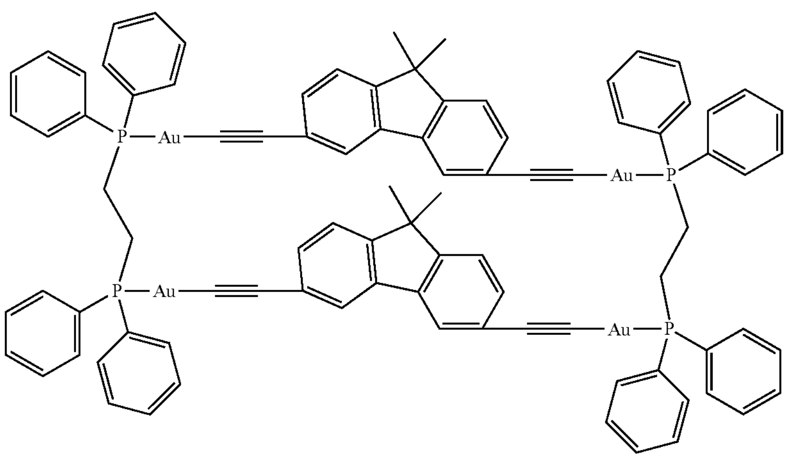
681
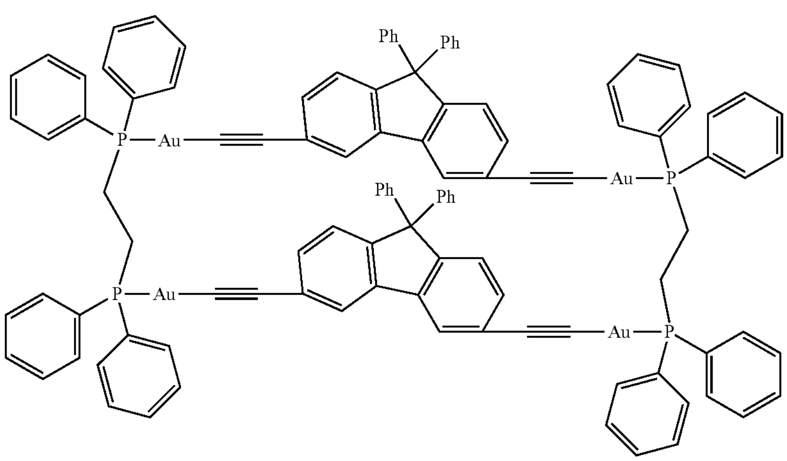

-continued
682
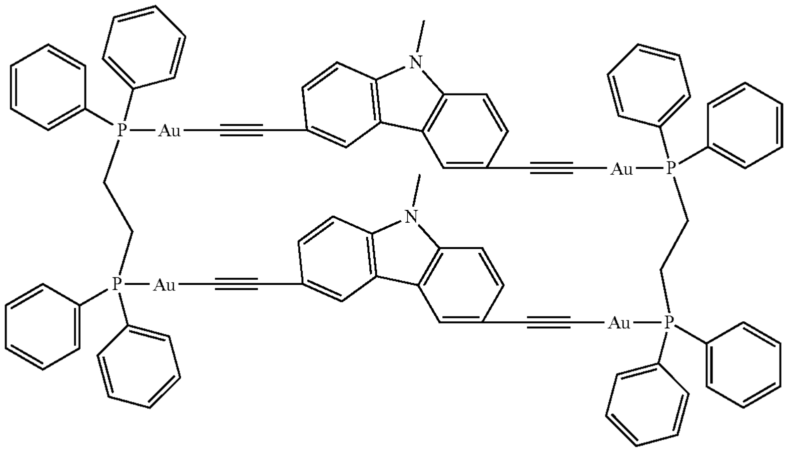
683
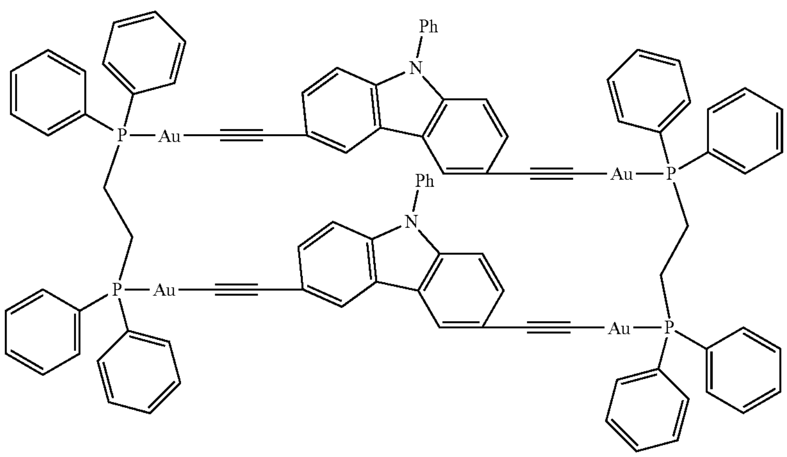
684
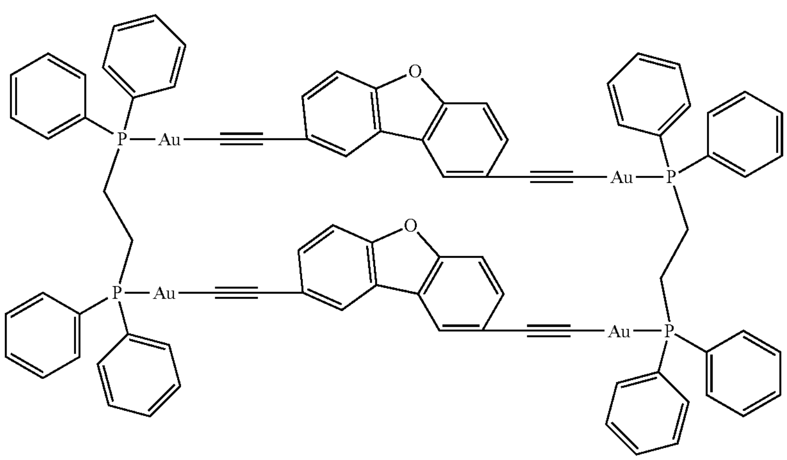

-continued
685
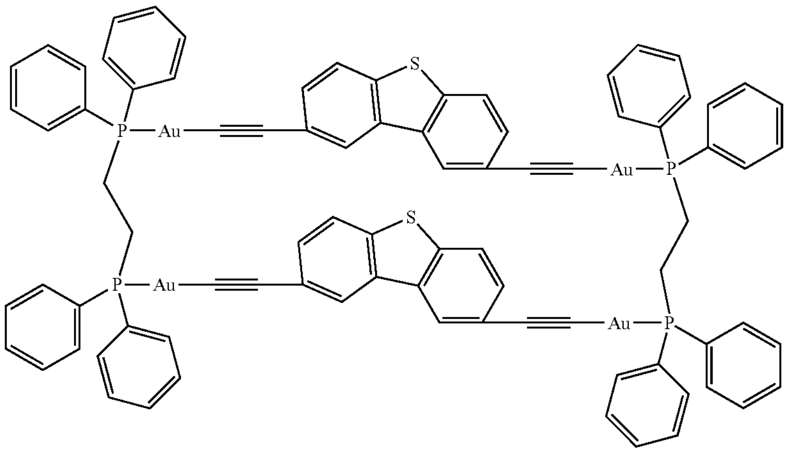
686
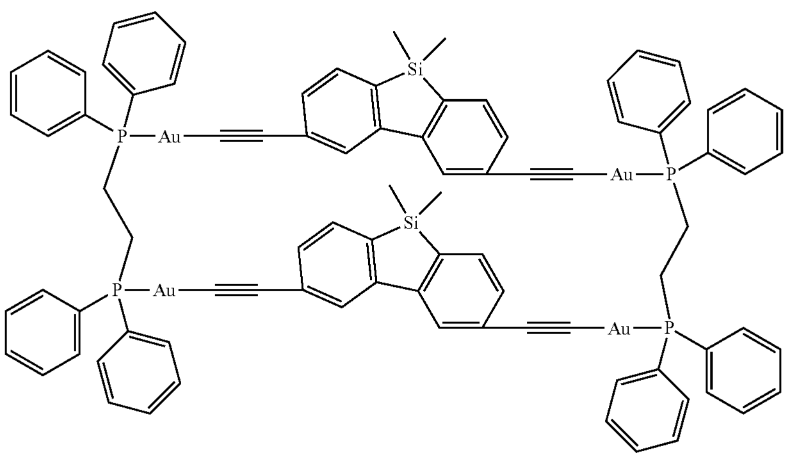
687
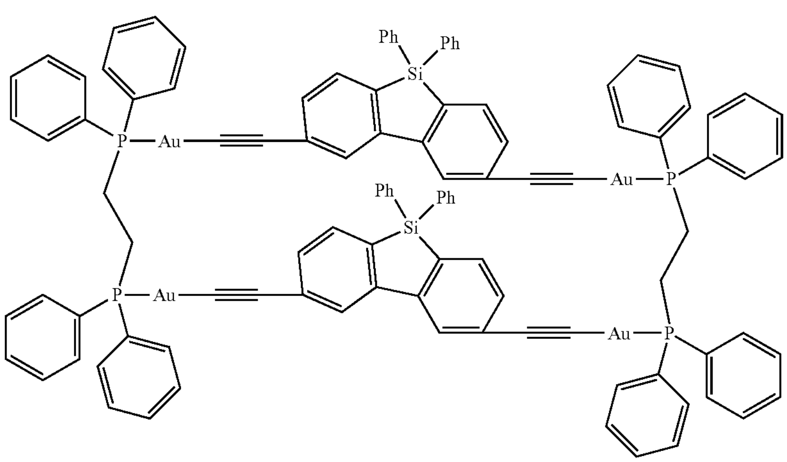

-continued
688
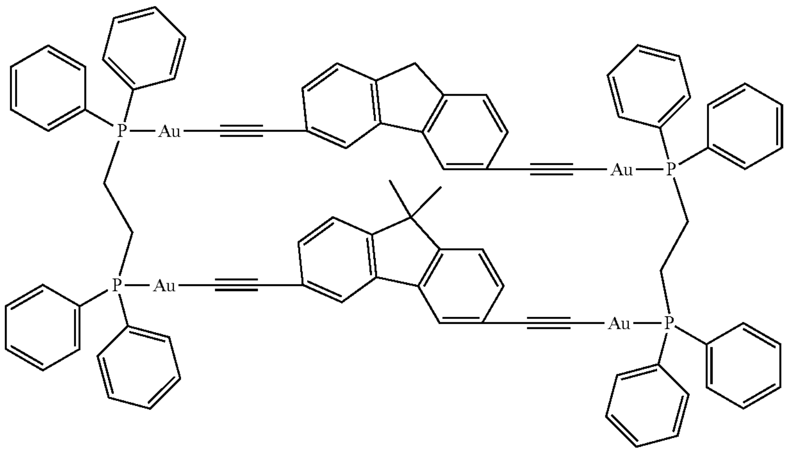
689
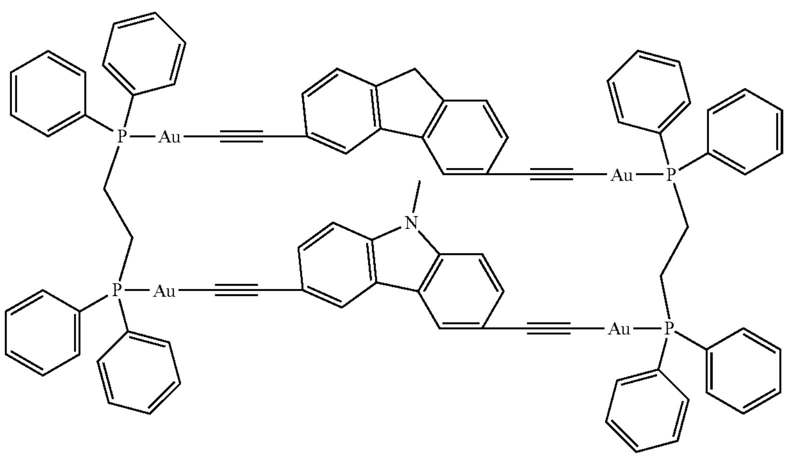
690
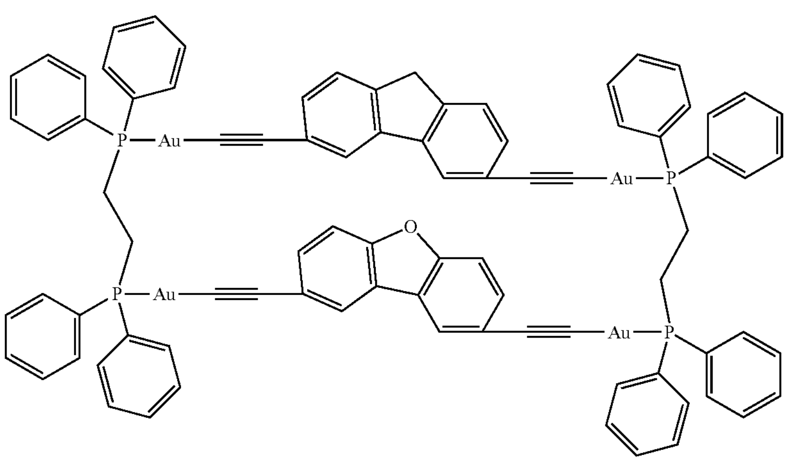

-continued
691
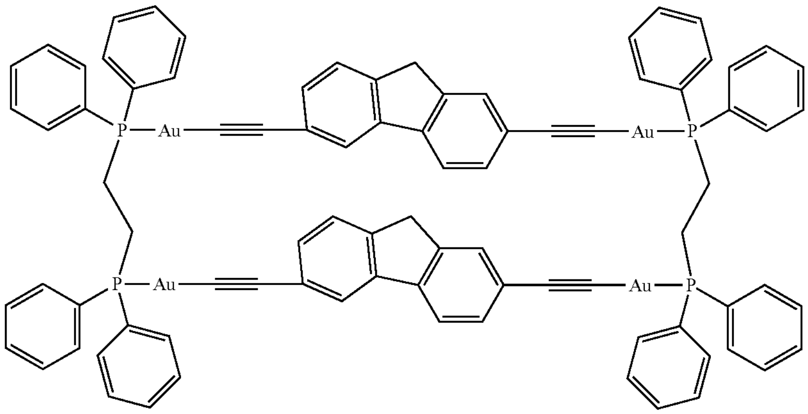
692
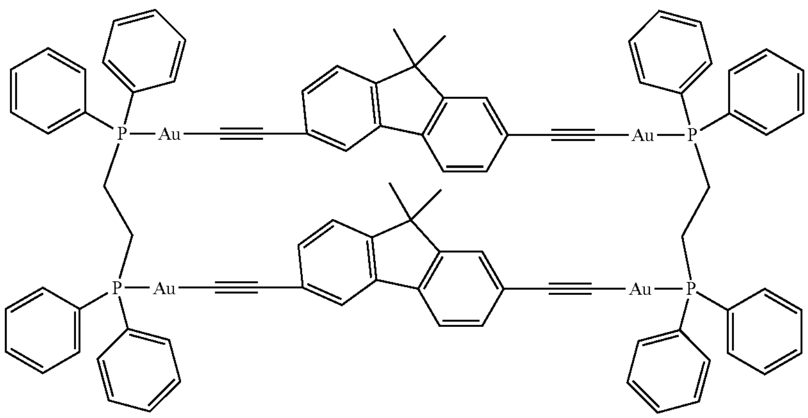
693
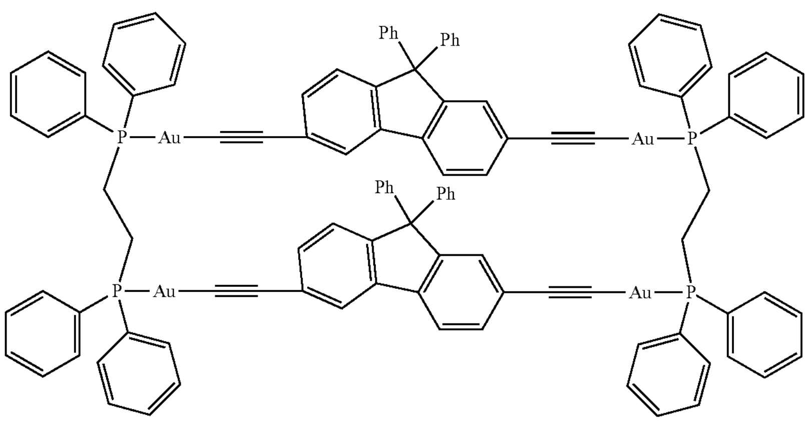
694
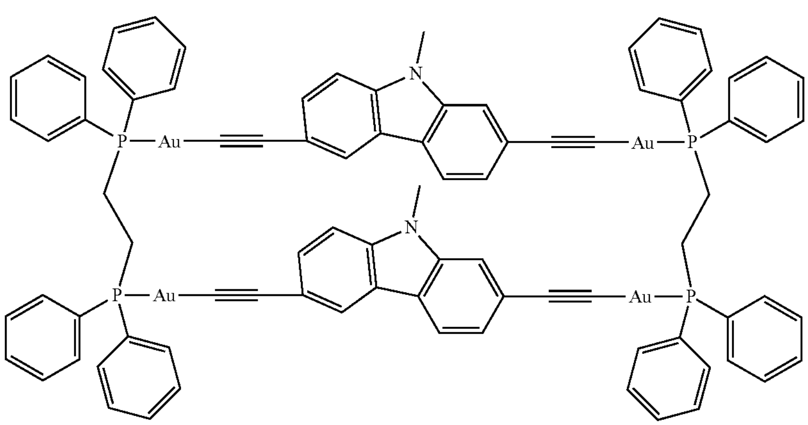

-continued
695
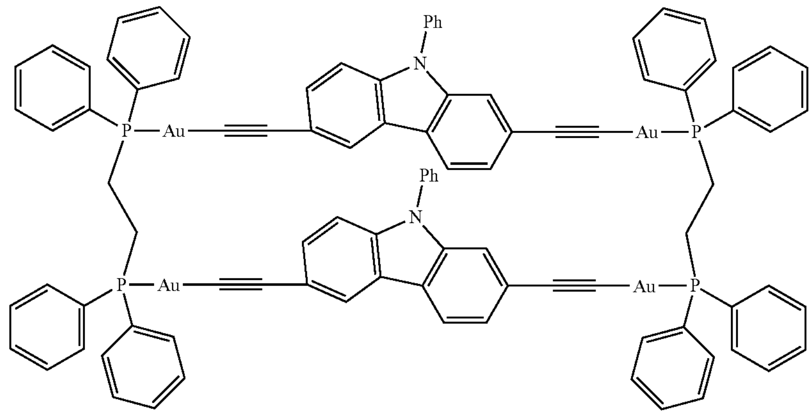
696
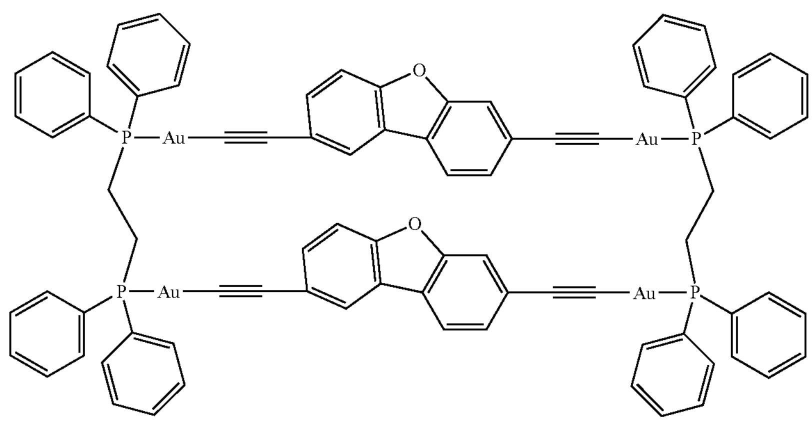
697
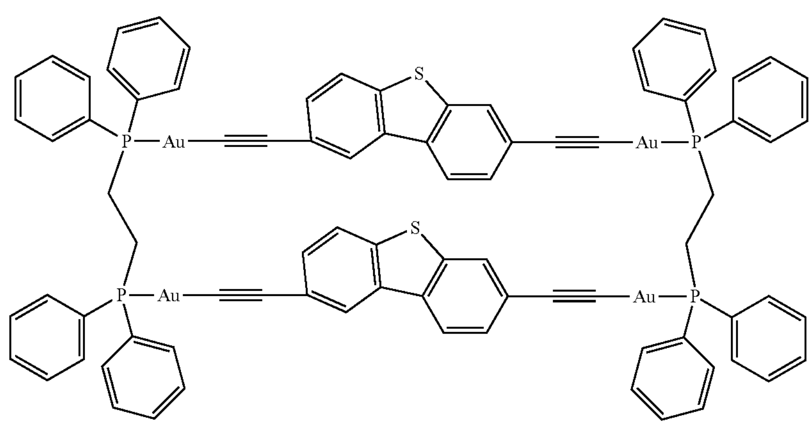

-continued
698
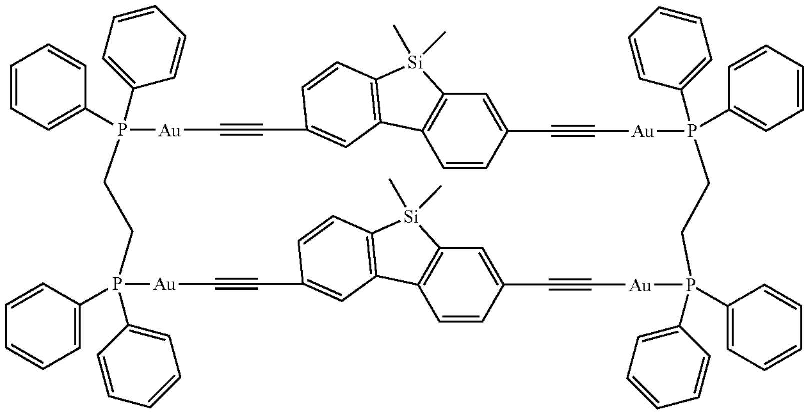
699
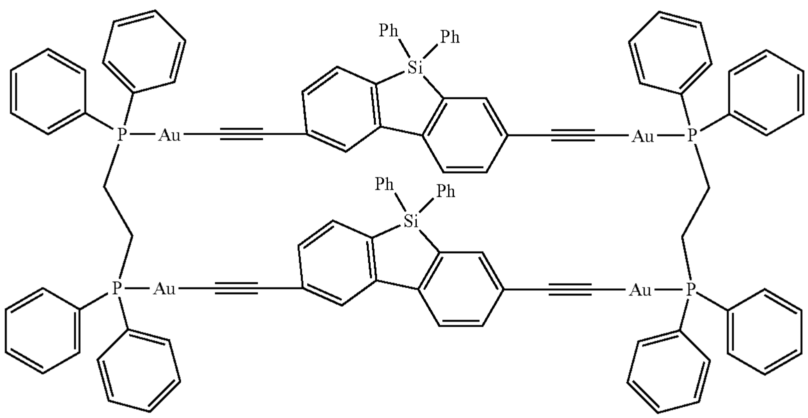
700
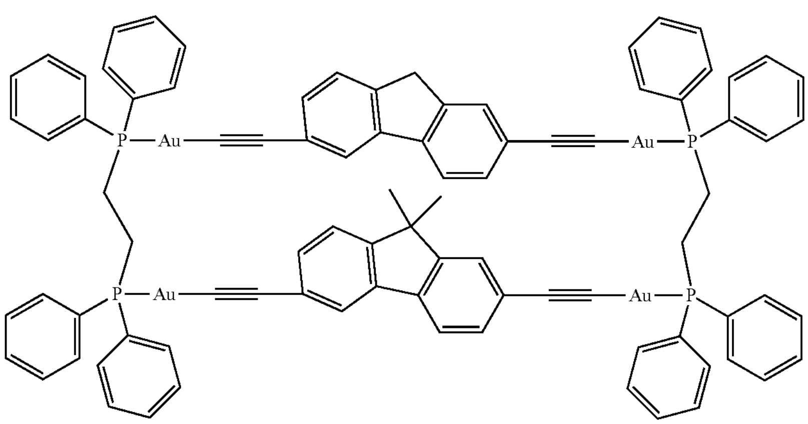

-continued
701
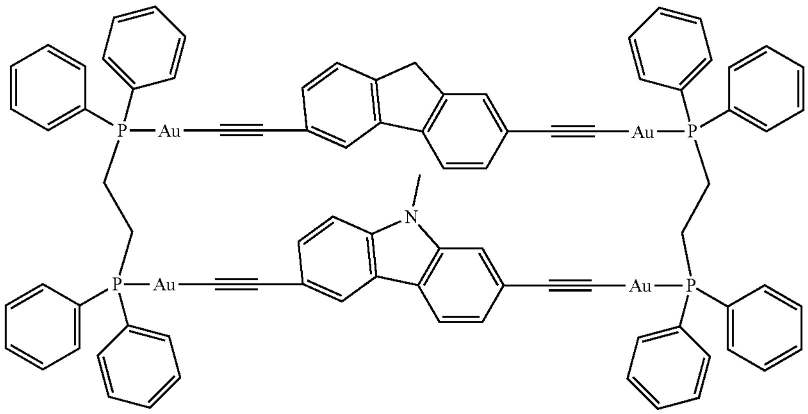
702
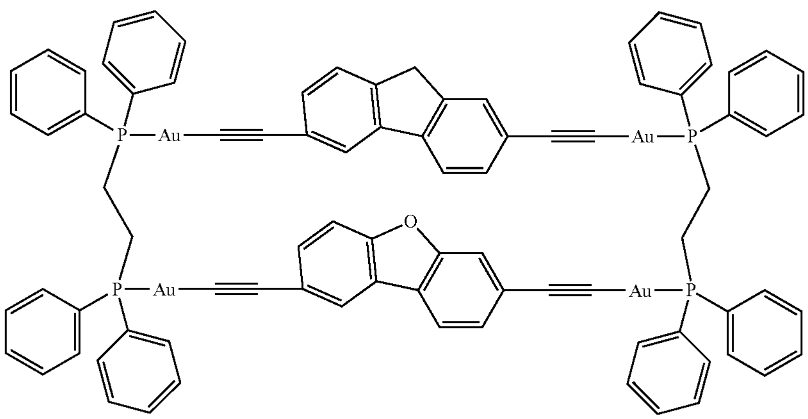
703
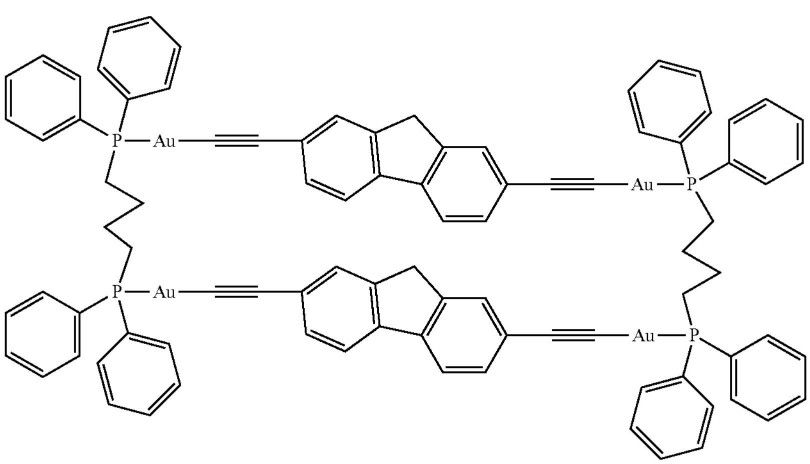

-continued
704
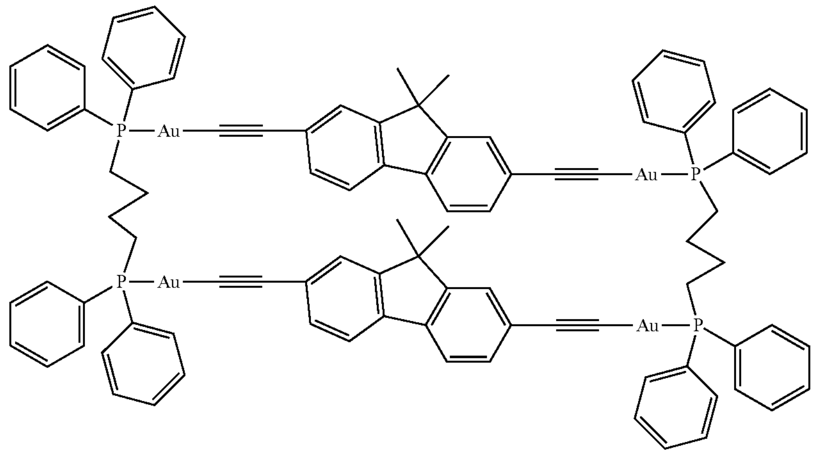
705
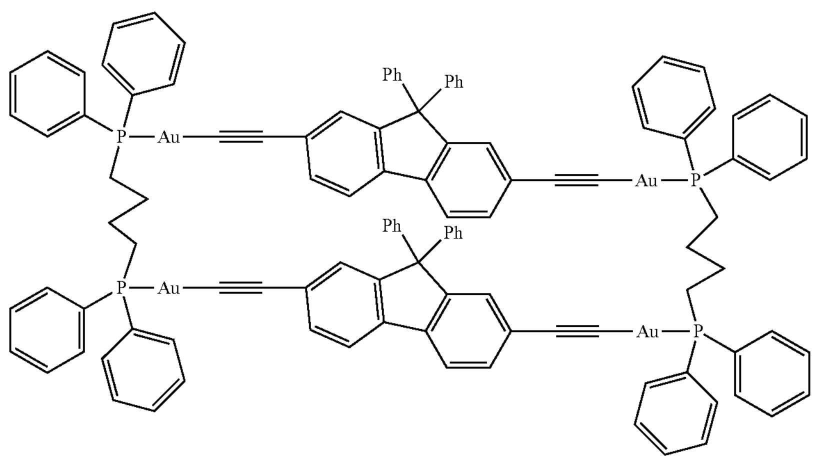
706
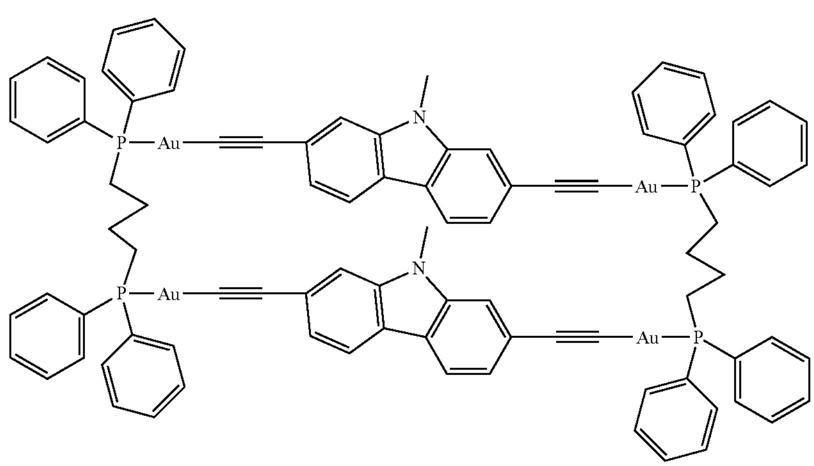

-continued
707
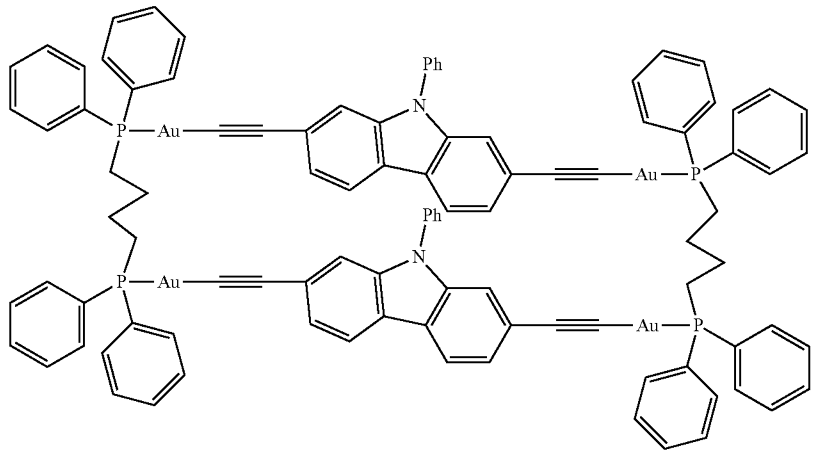
708
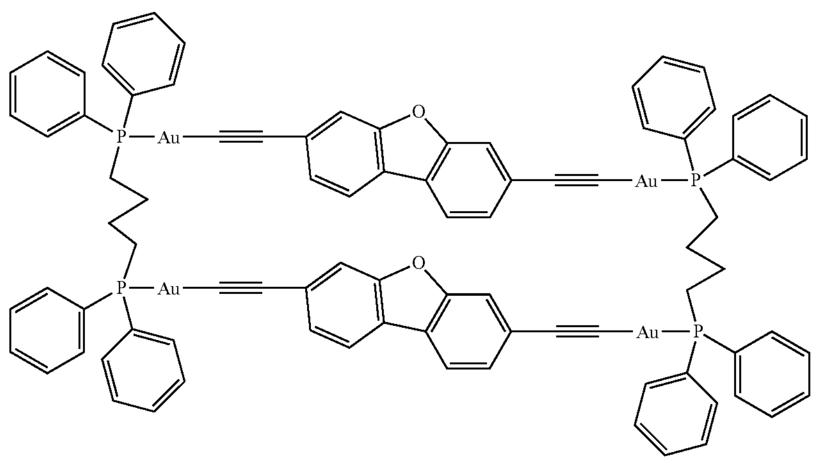
709
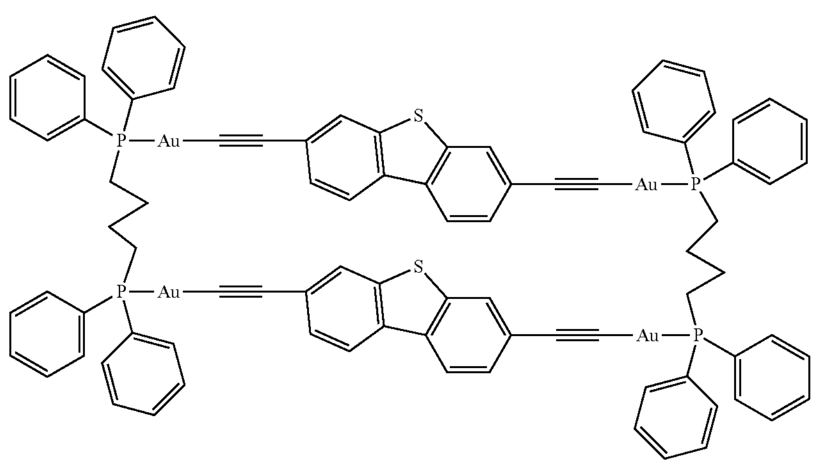

-continued
710
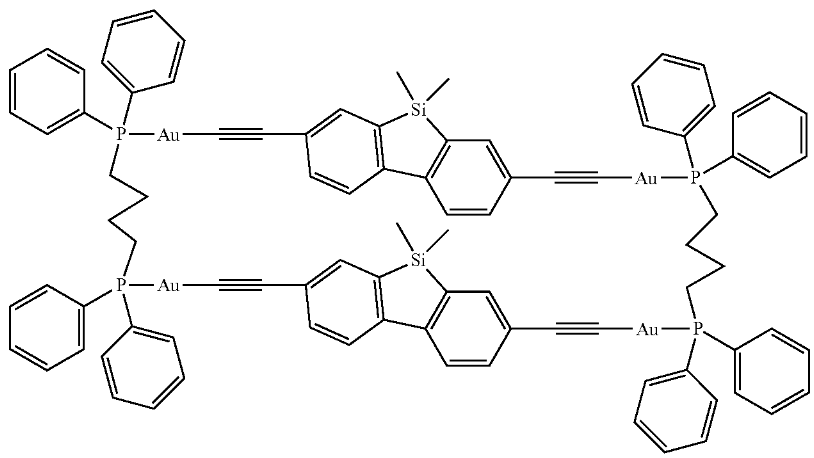
711
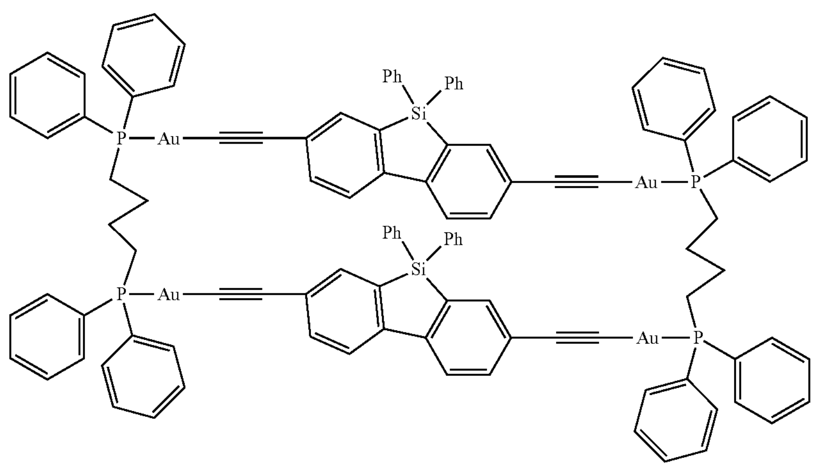
712
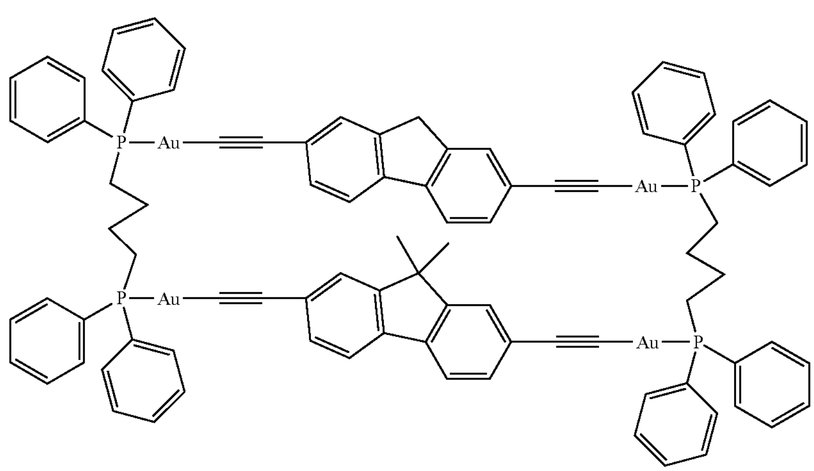

-continued
713
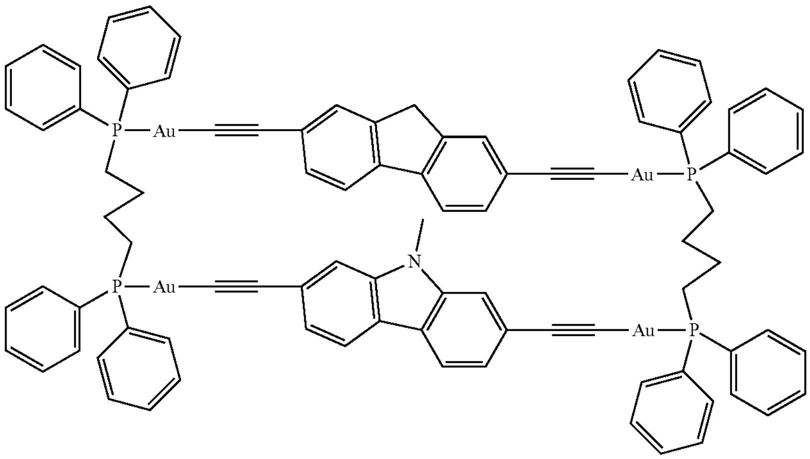
714
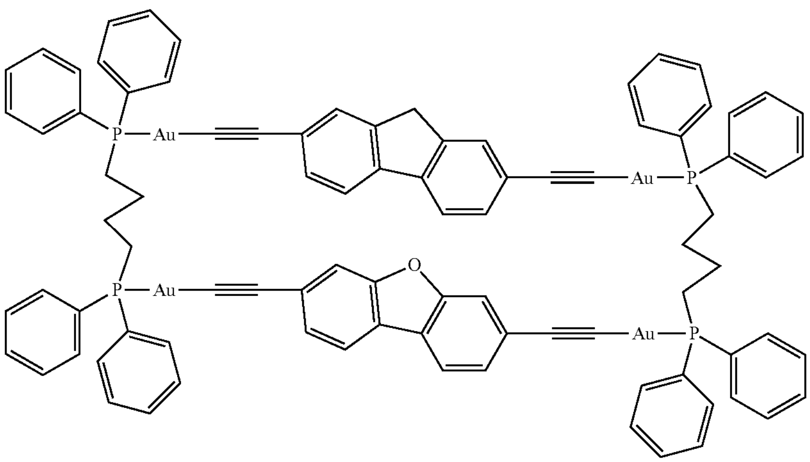
715
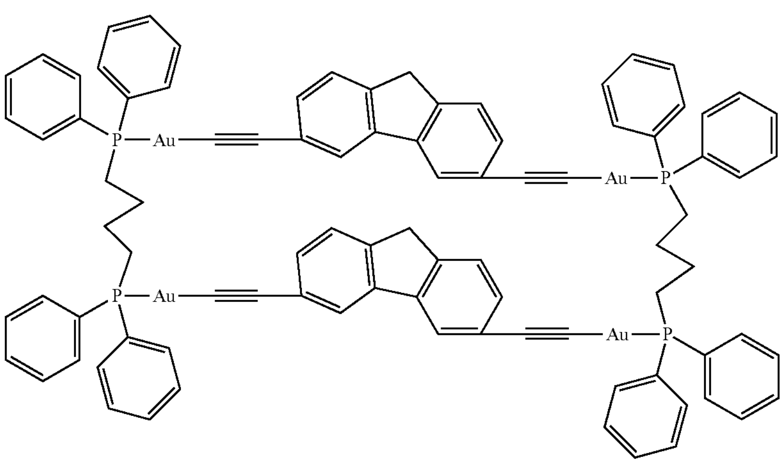

-continued
716
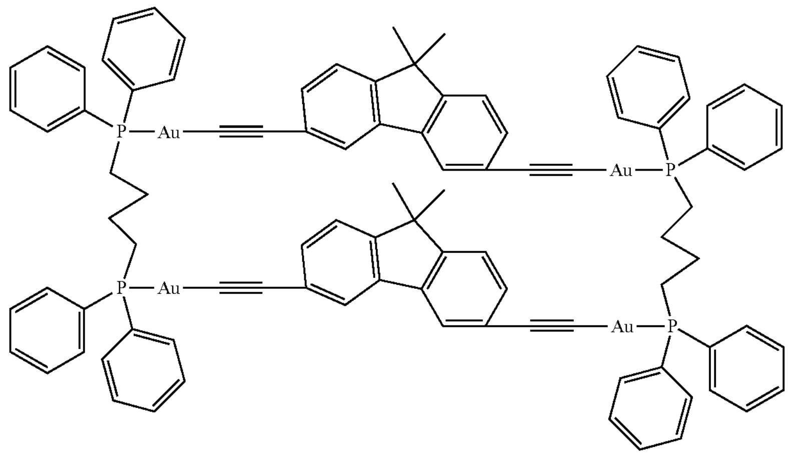
717
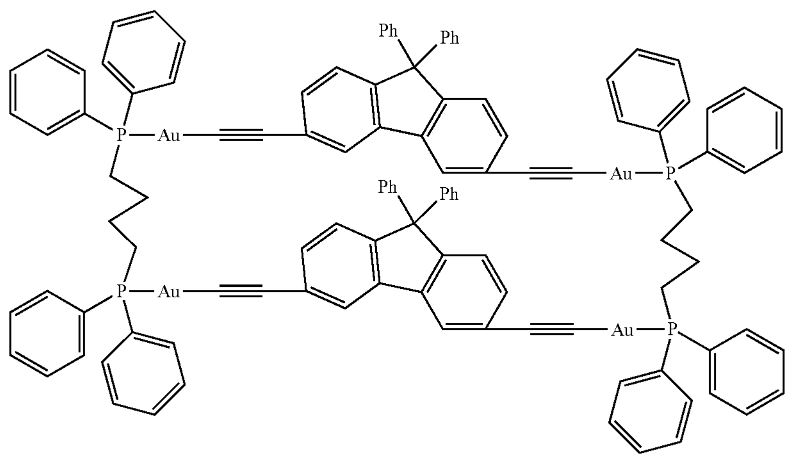
718
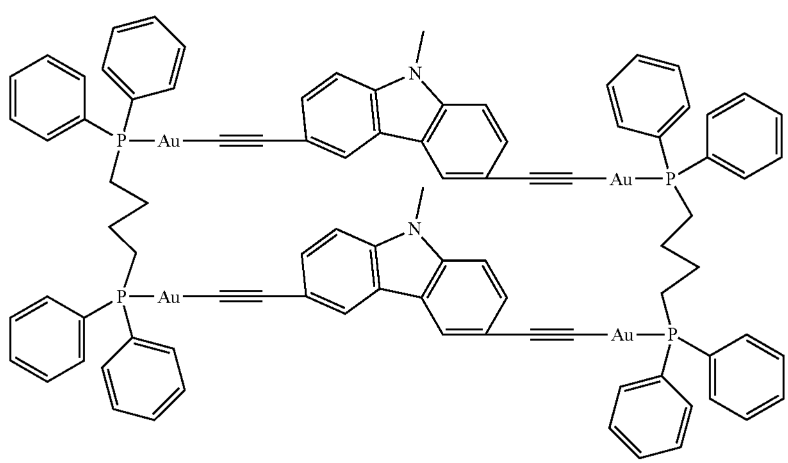

-continued
719
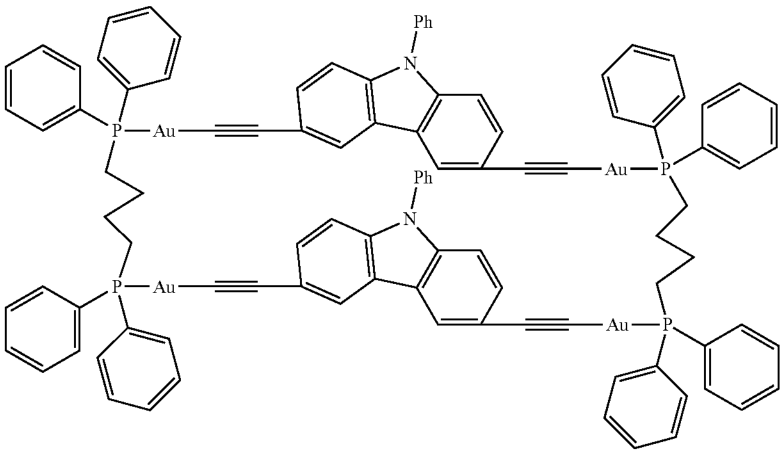
720
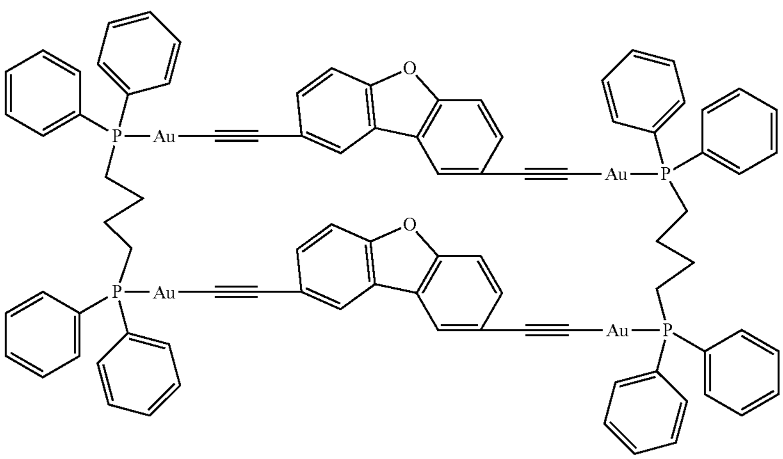
721
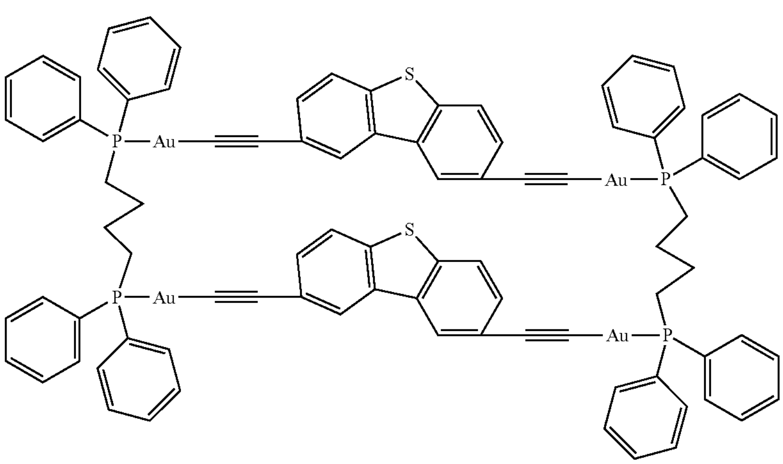

-continued
722
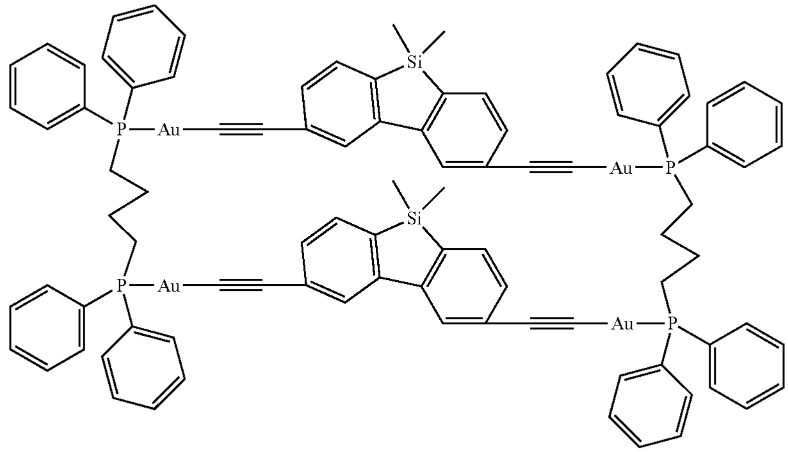
723
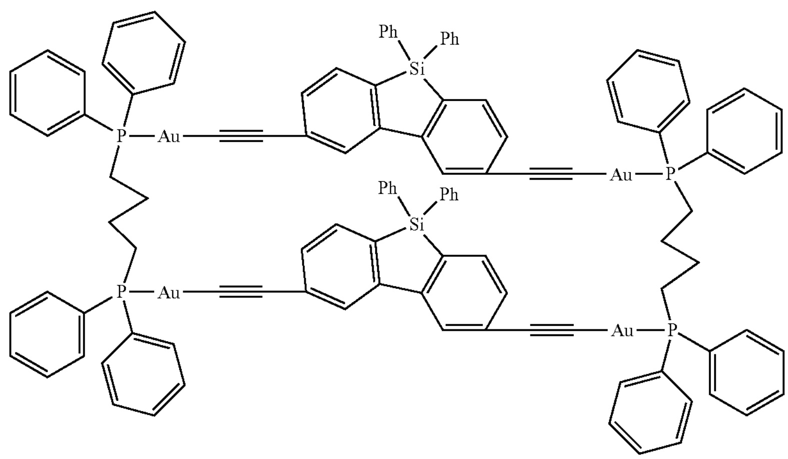
724
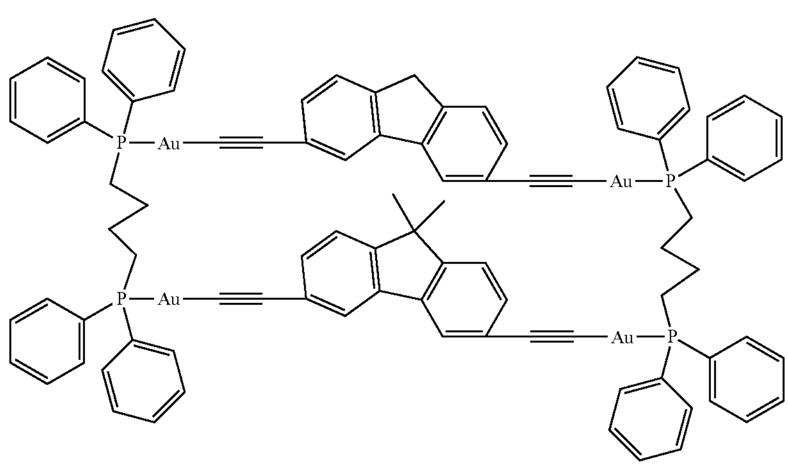

-continued
725
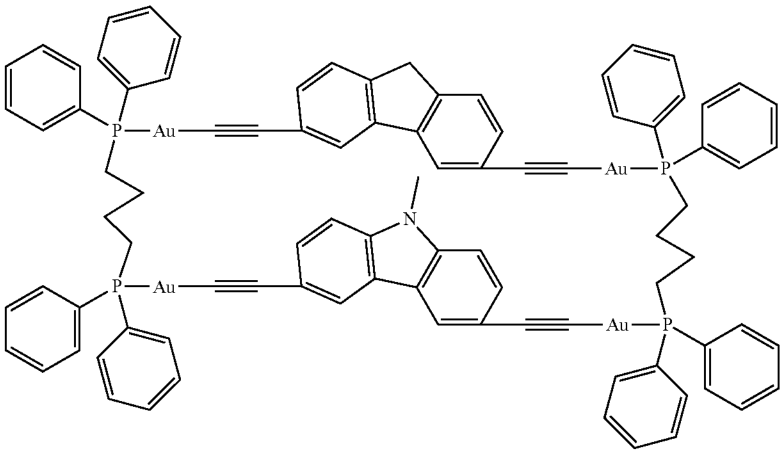
726
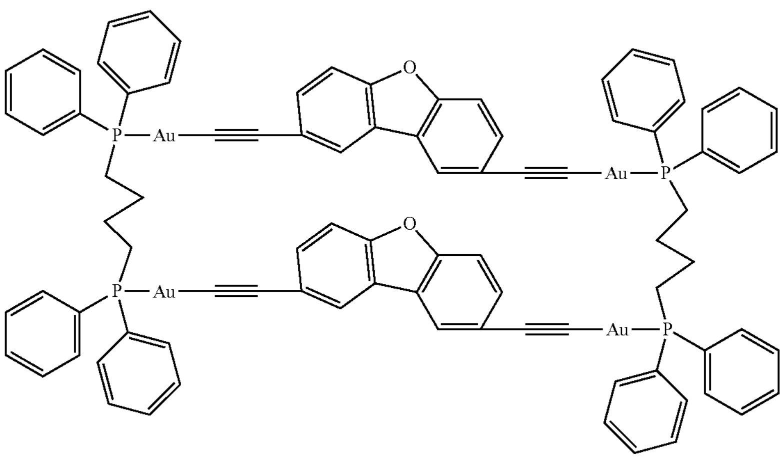
727
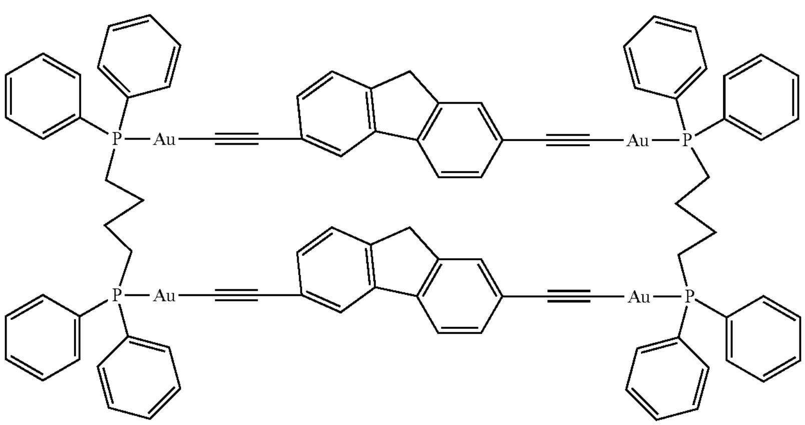

-continued
728
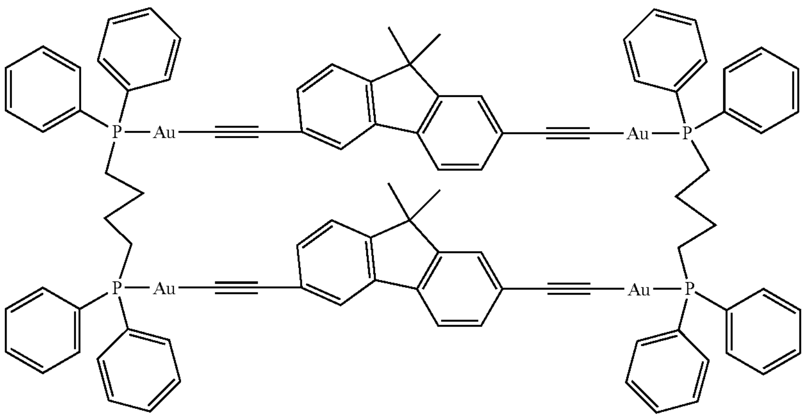
729
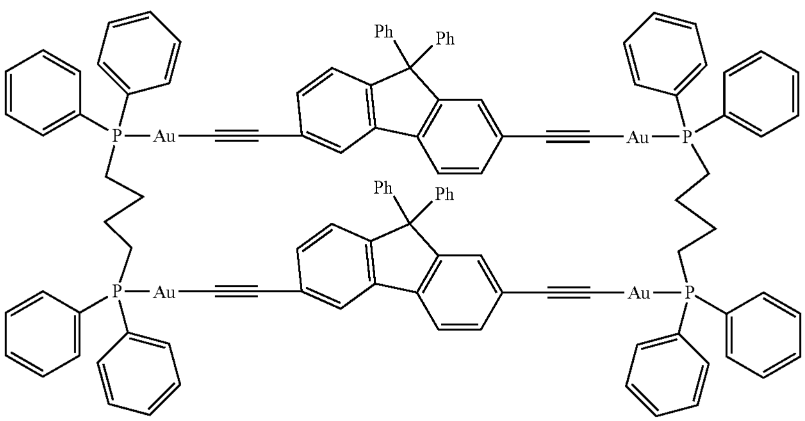
730
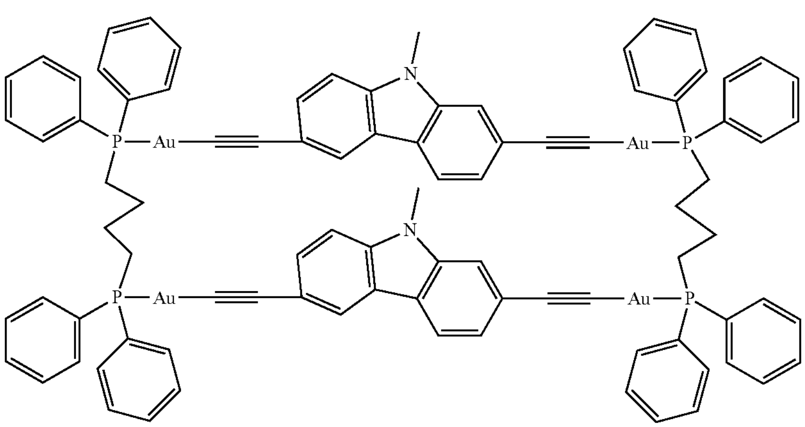

-continued
731
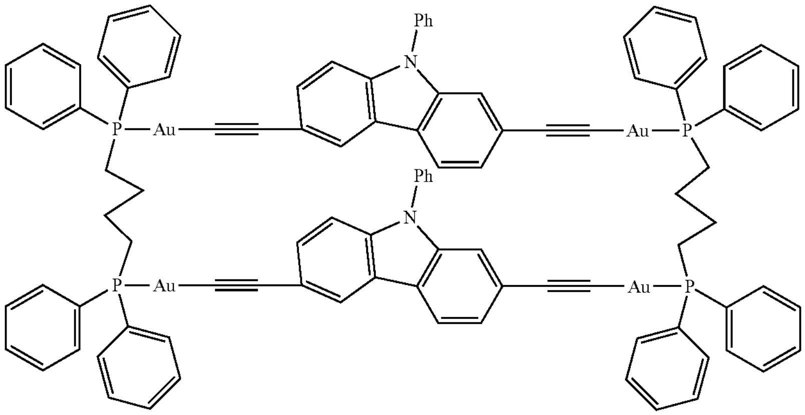
732
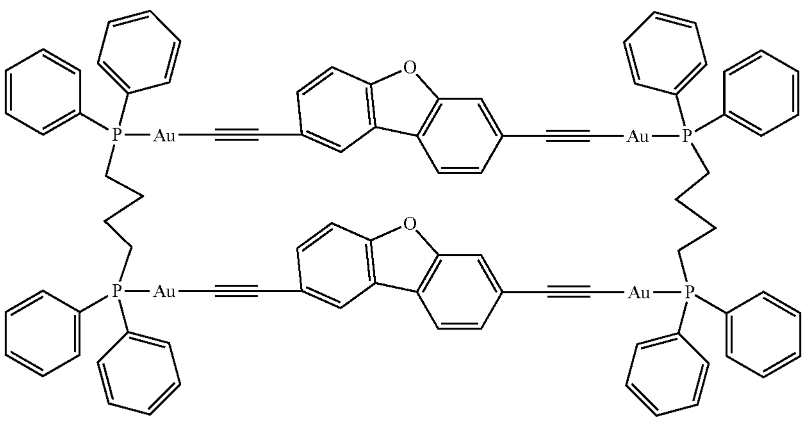
733
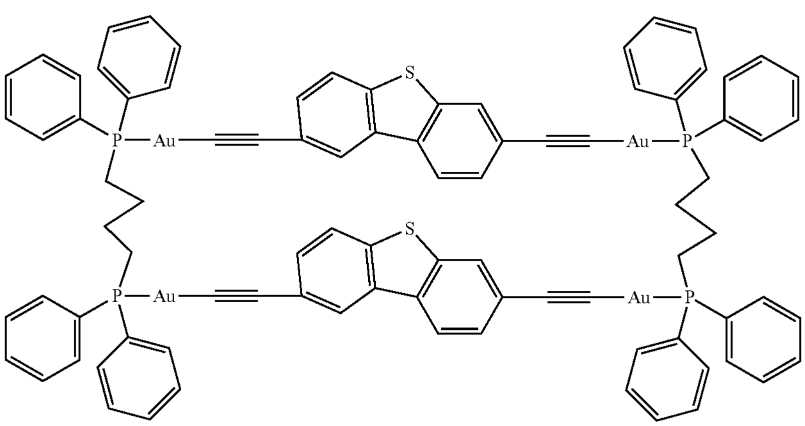

-continued
734
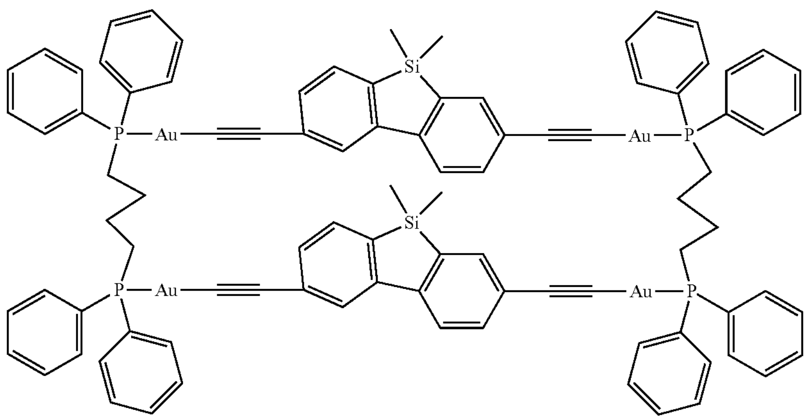
735
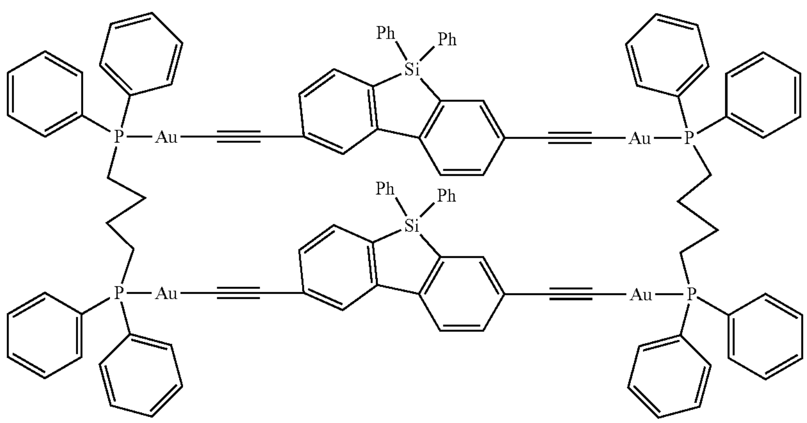
736
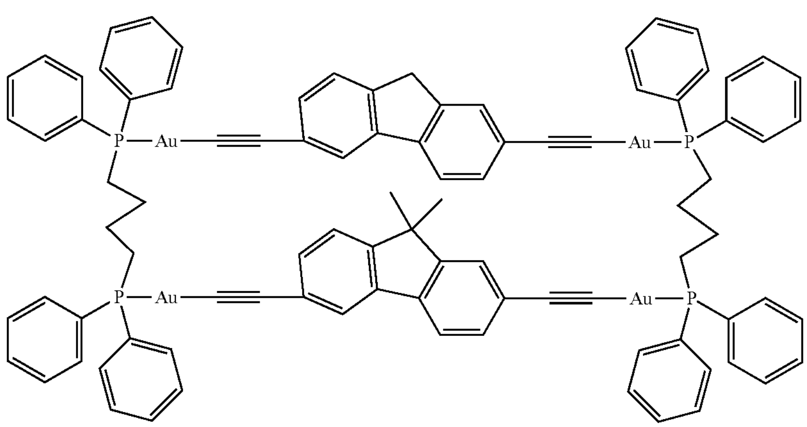

-continued
737
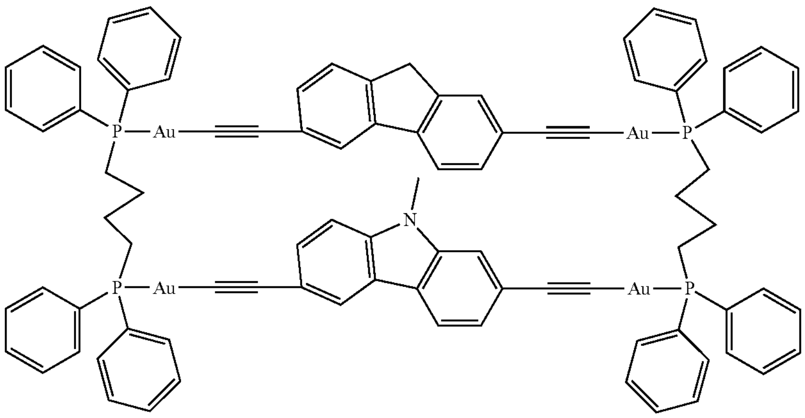
738
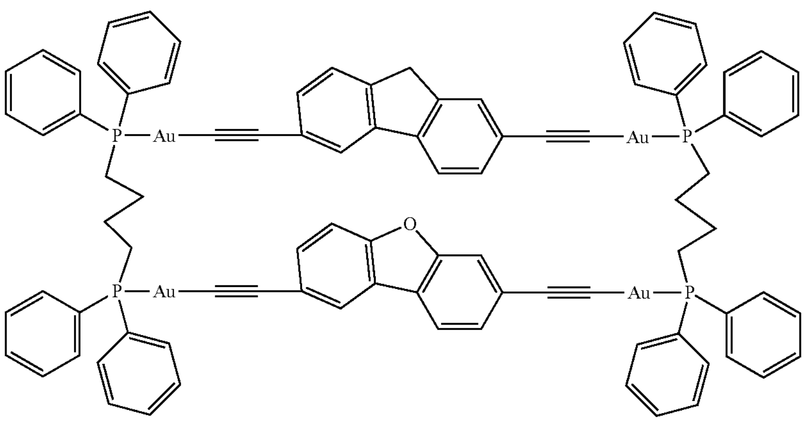
739
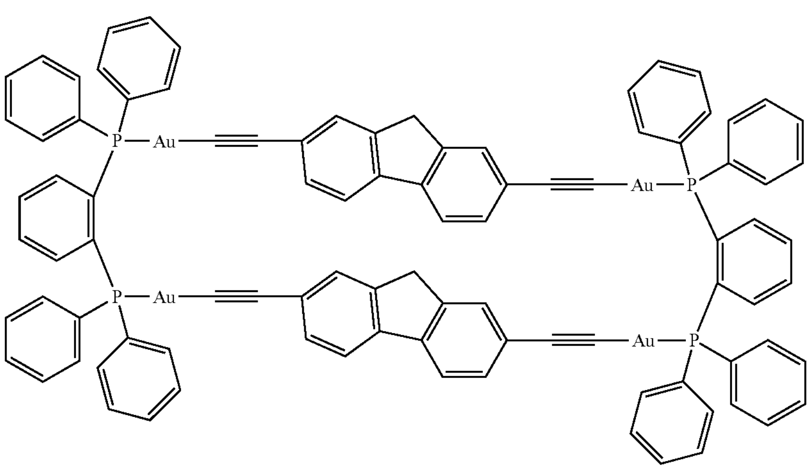

-continued
740
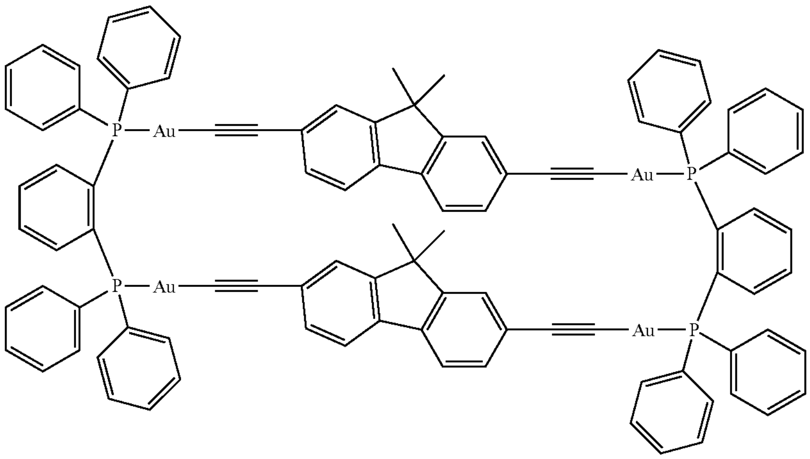
741
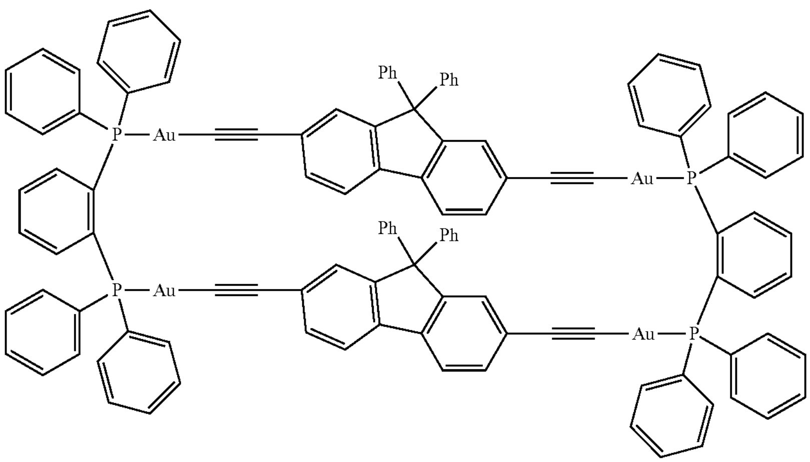
742
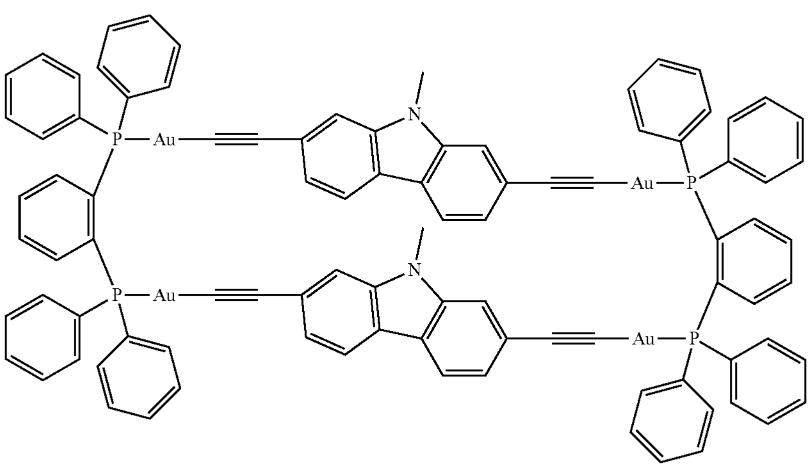

-continued
743
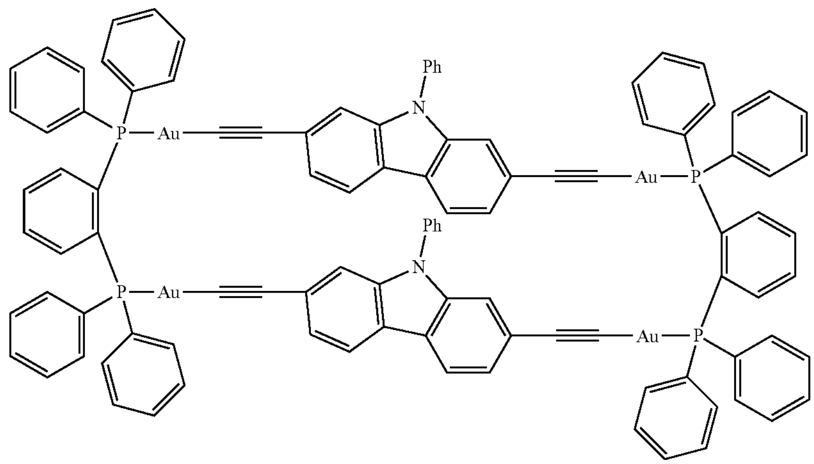
744
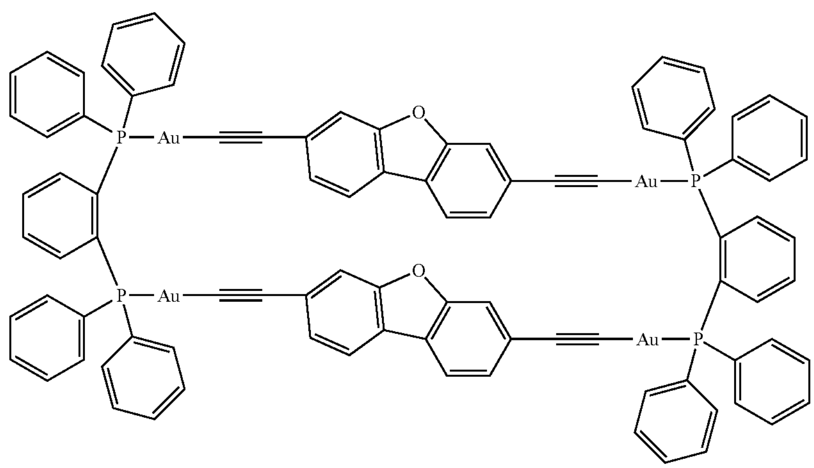
745
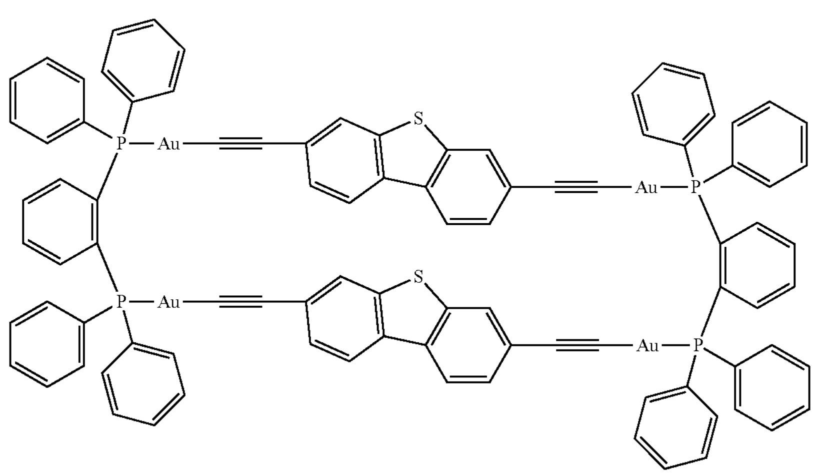

-continued
746
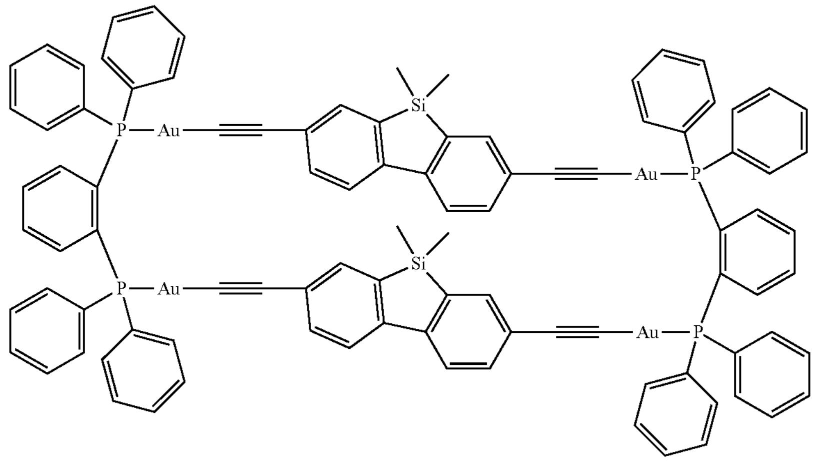
747
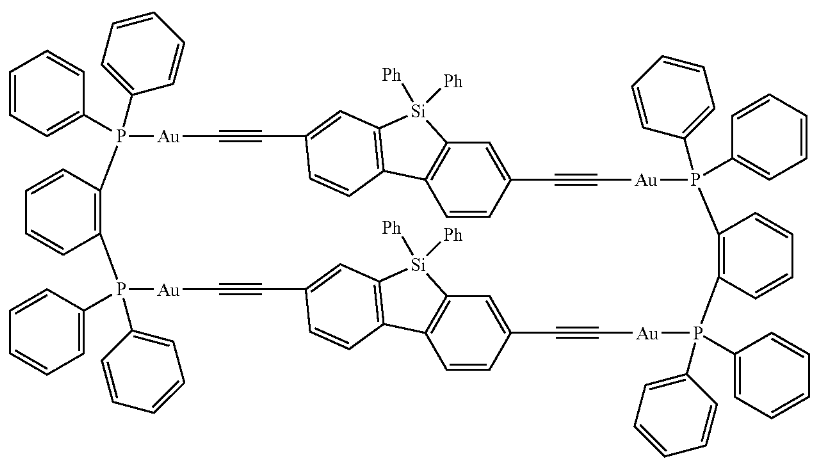
748
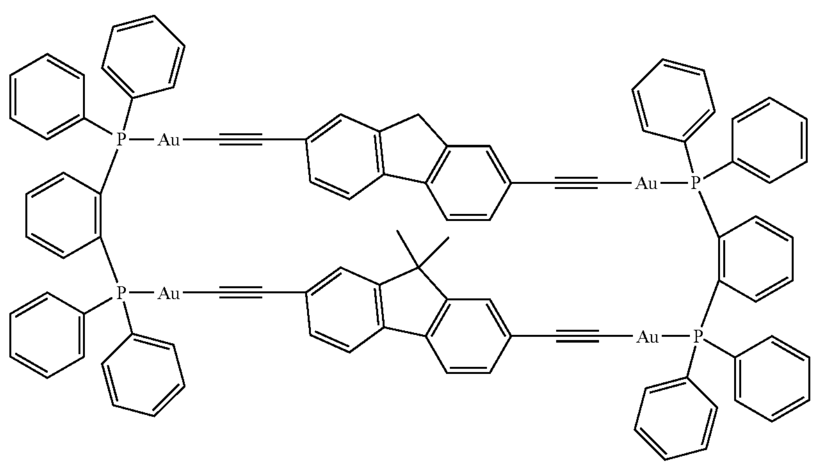

-continued
749
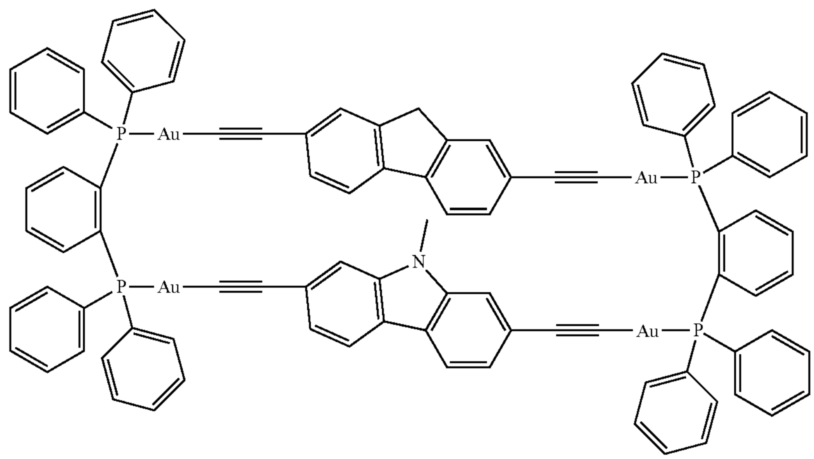
750
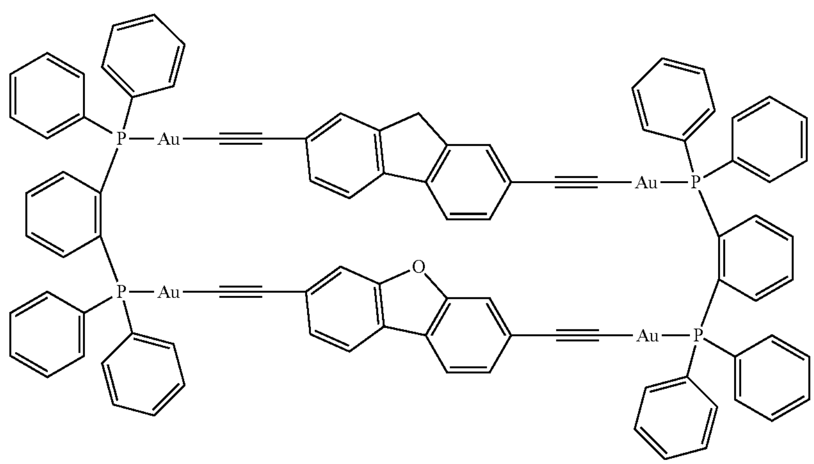
751
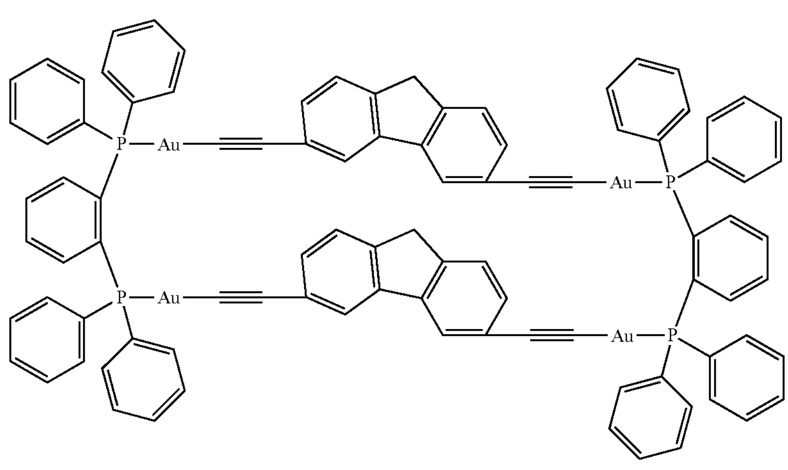

-continued
752
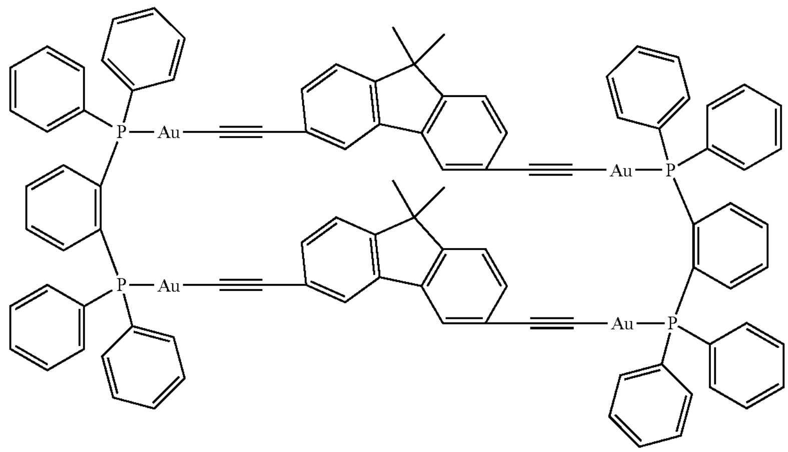
753
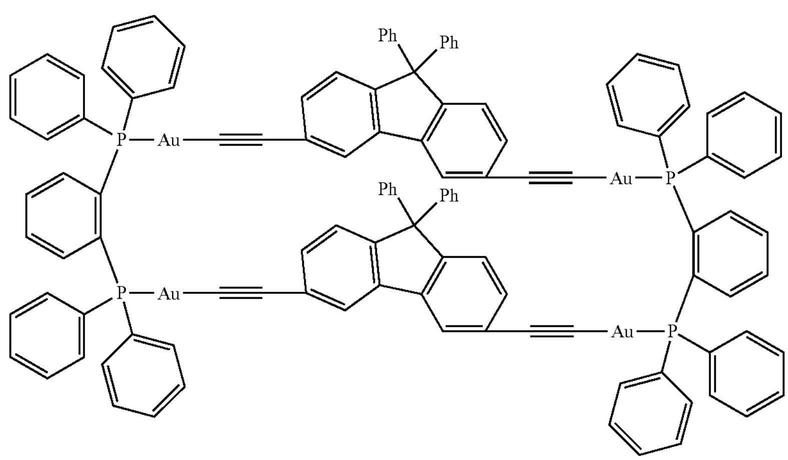
754
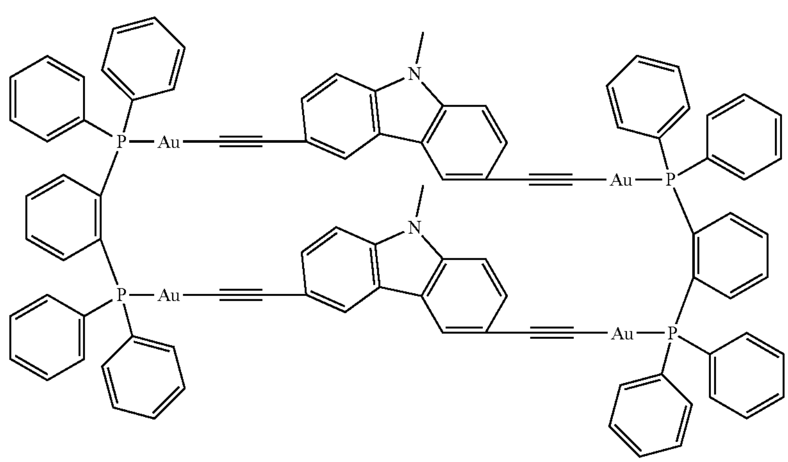

-continued
755
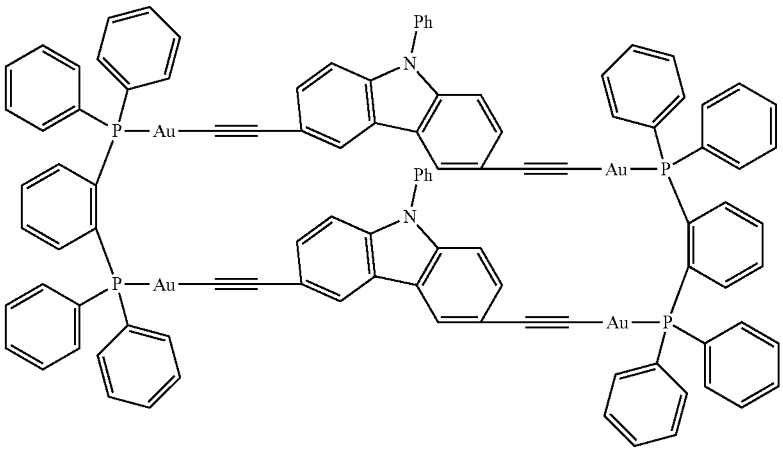
756
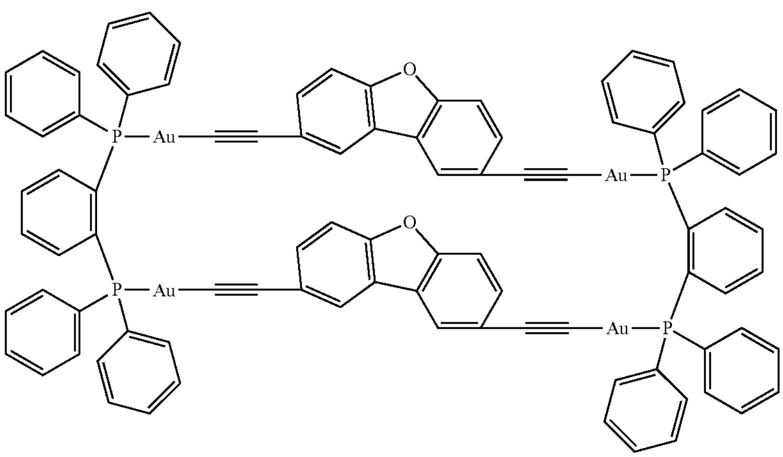
757
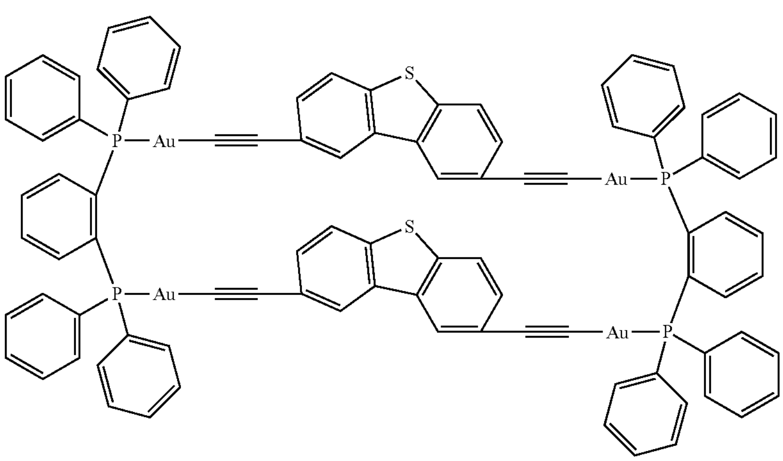

-continued
758
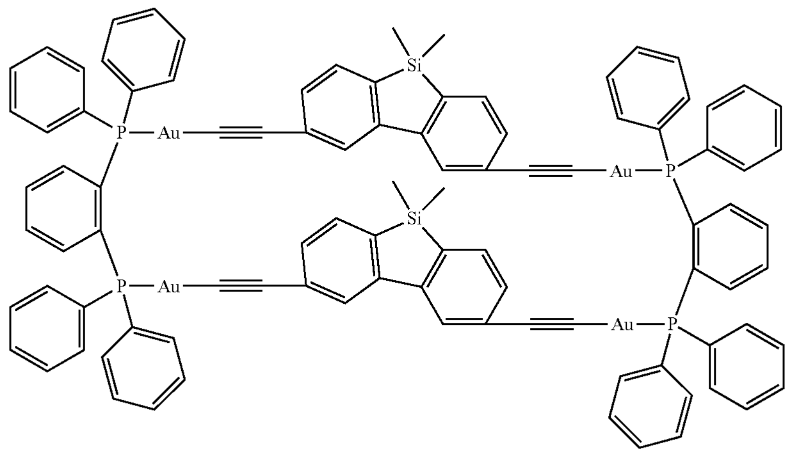
759
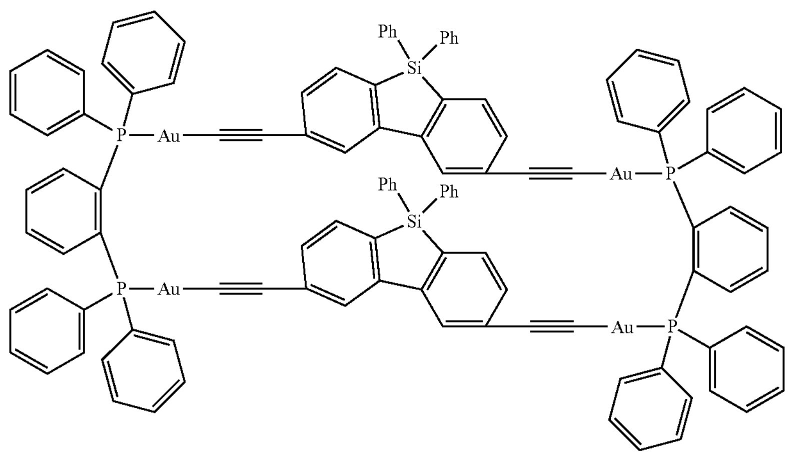
760
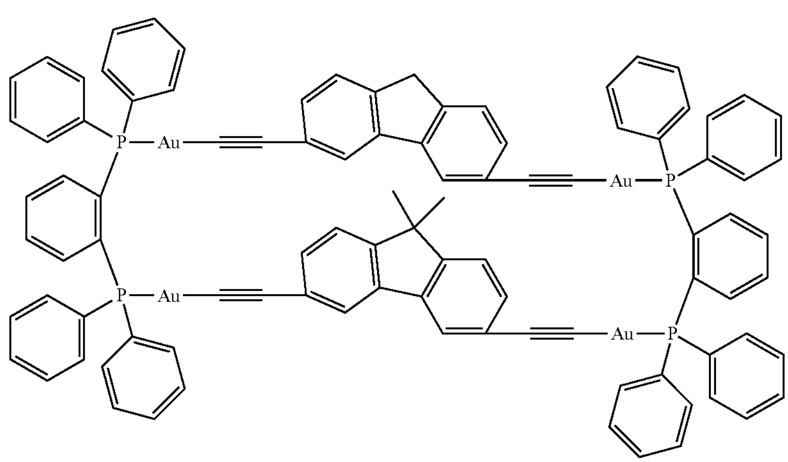

-continued
761
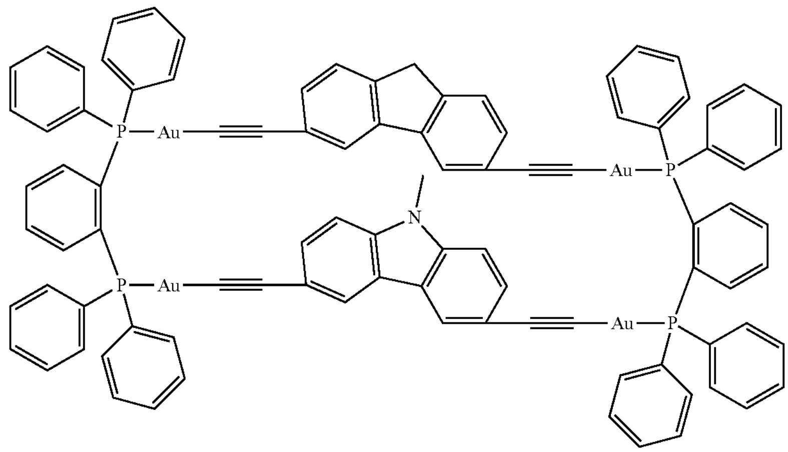
762
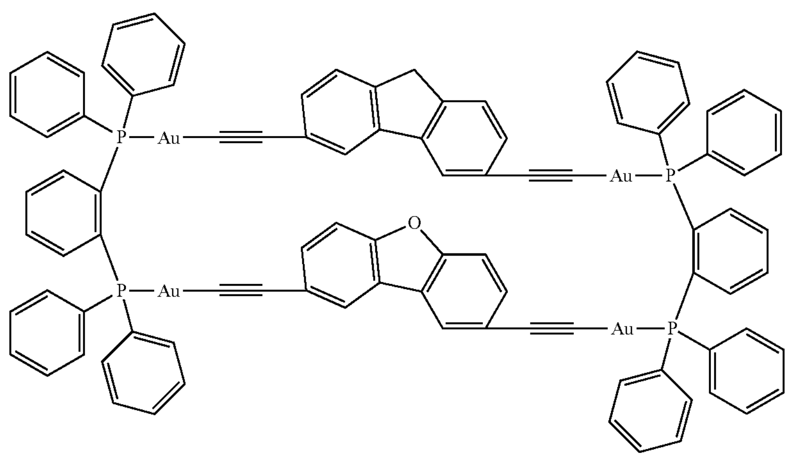
763
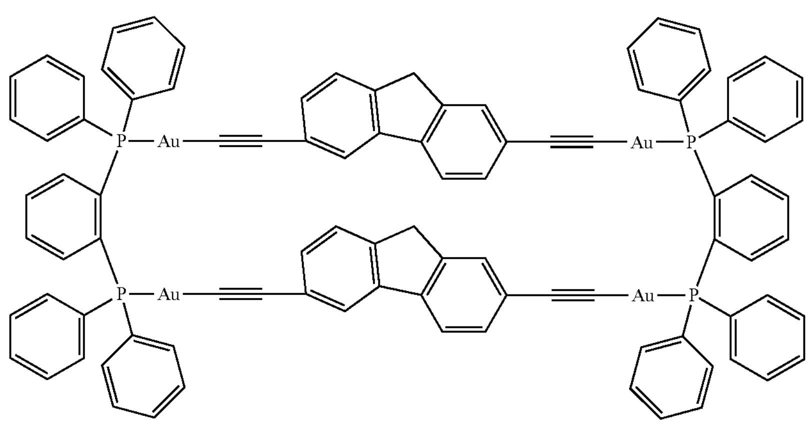

-continued
764
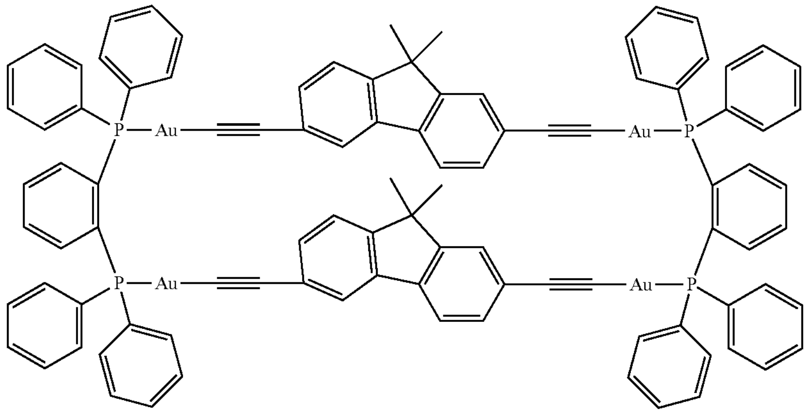
765
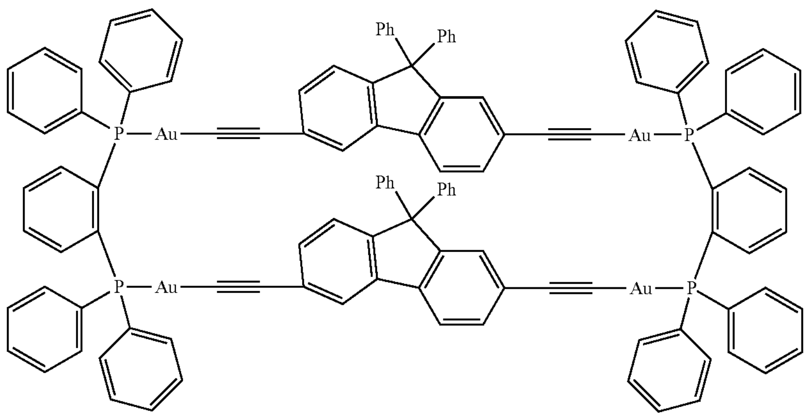
766
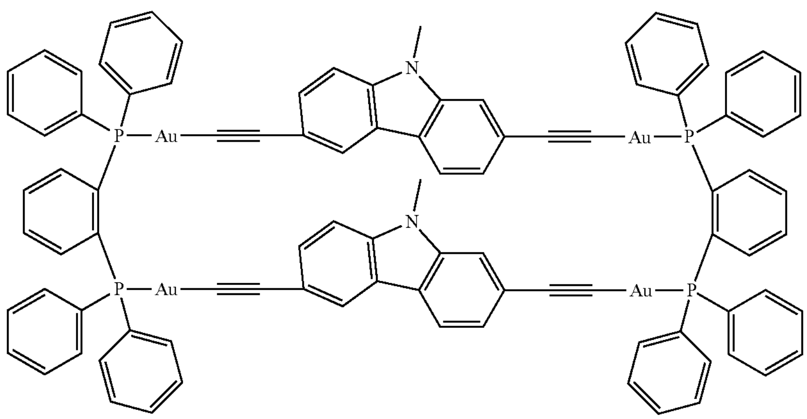
767
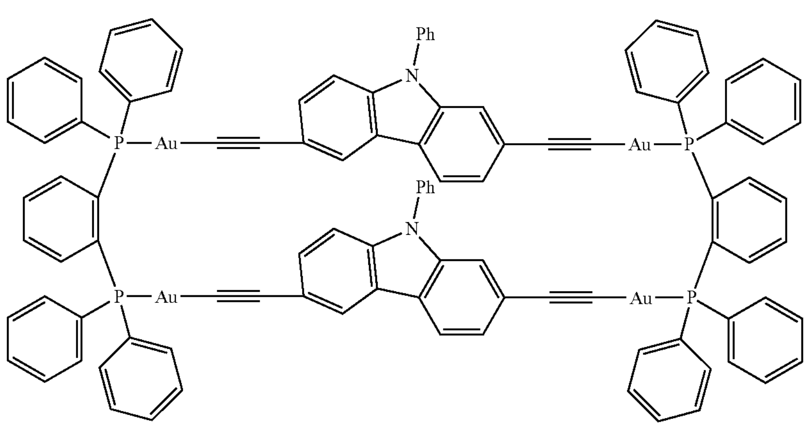

-continued
768
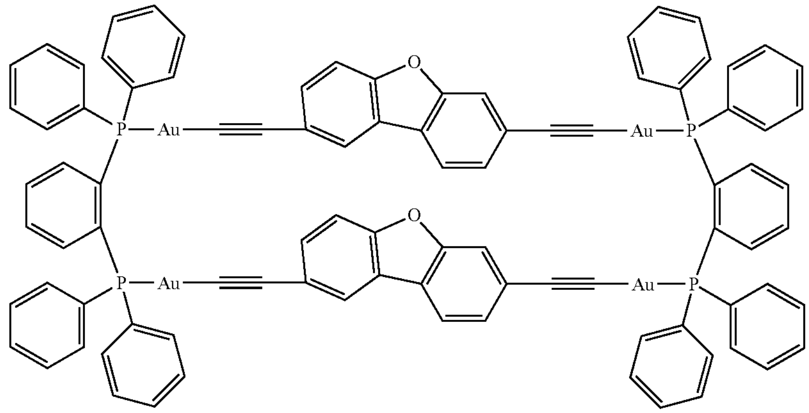
769
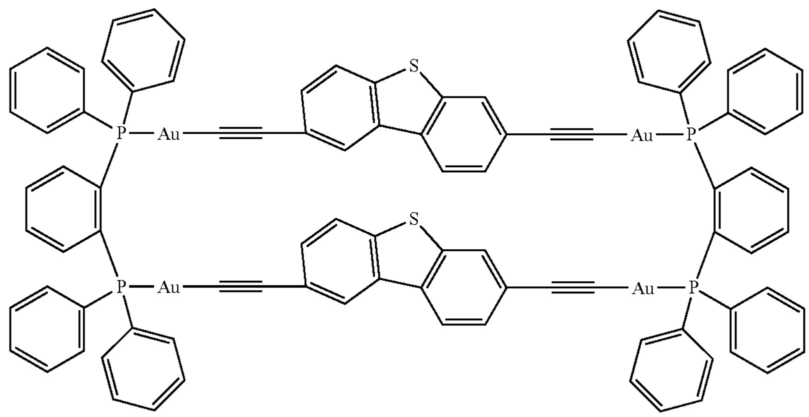
770
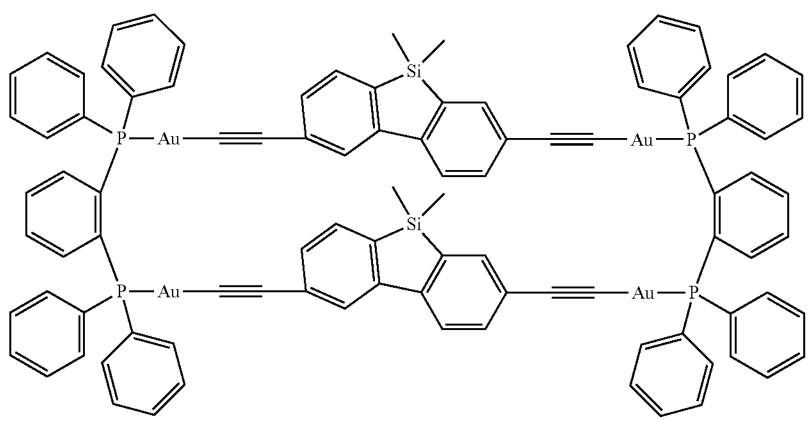
771
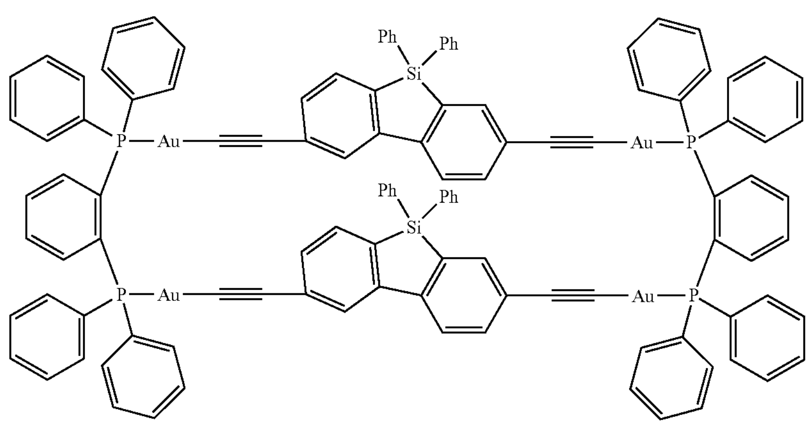

-continued
772
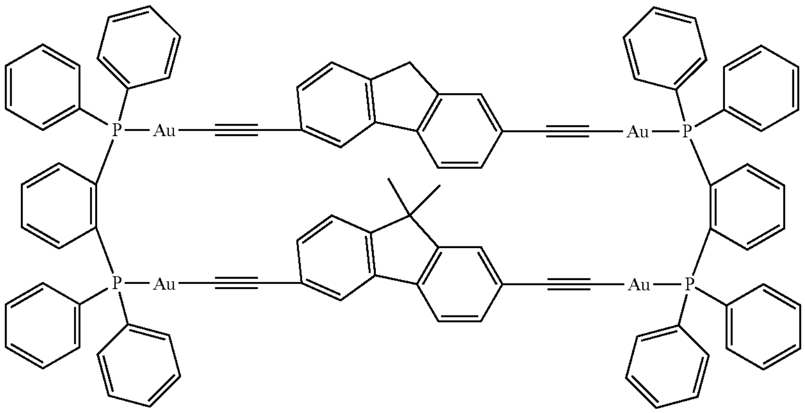
773
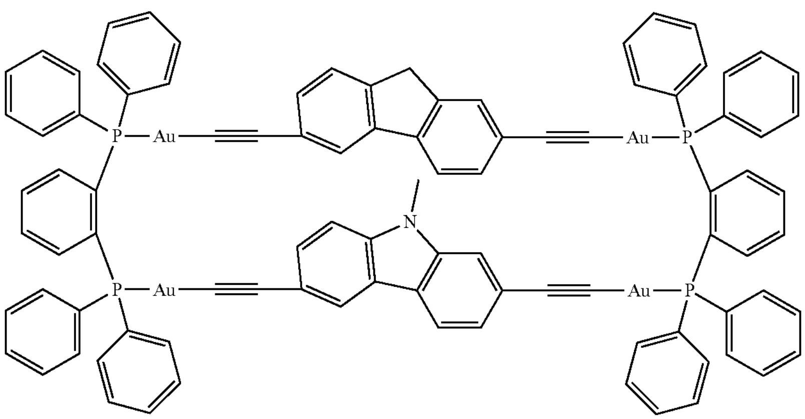
774
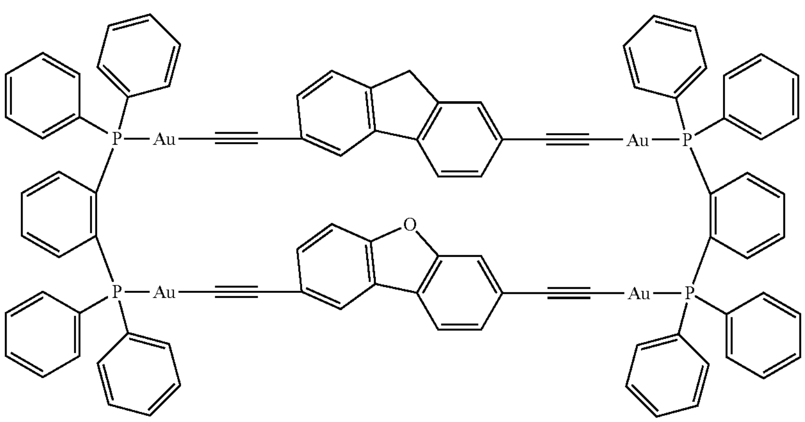

-continued
775
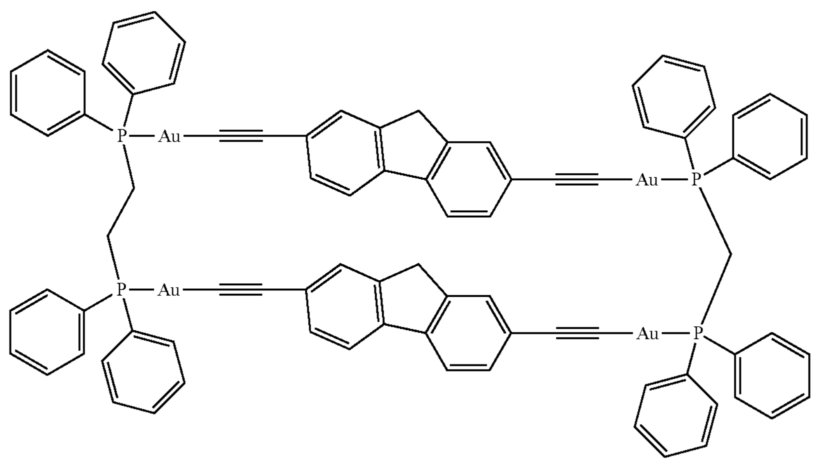
776
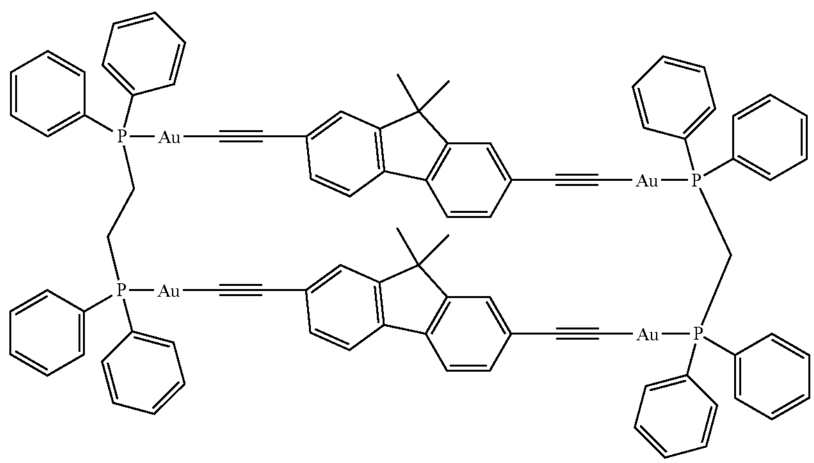
777
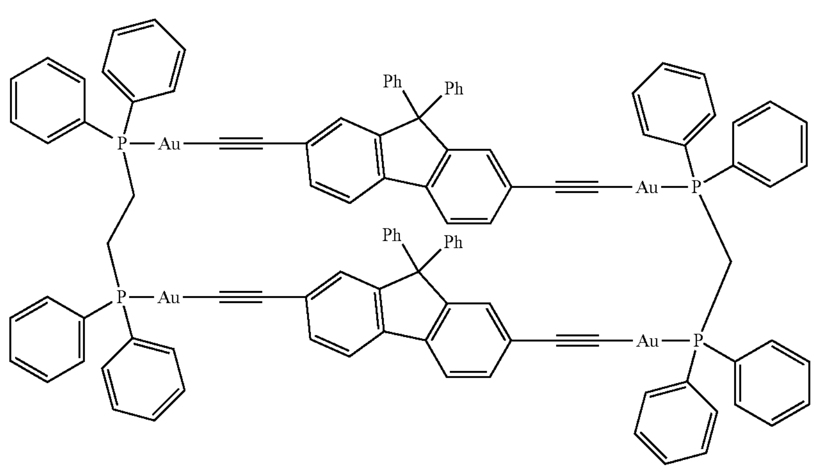

-continued
778
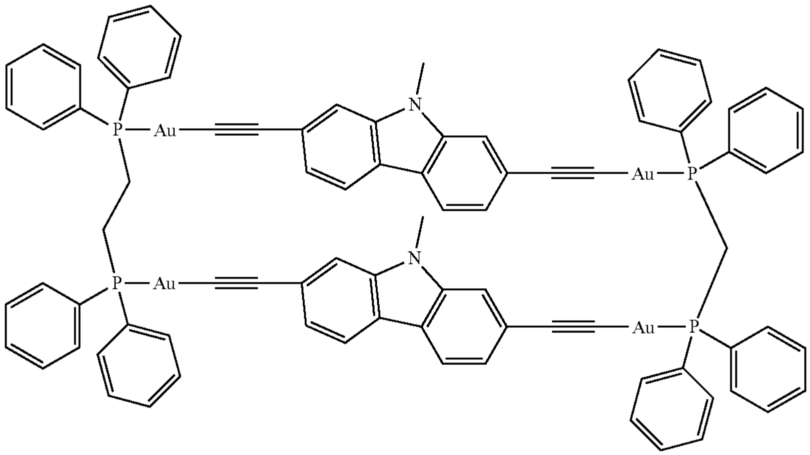
779
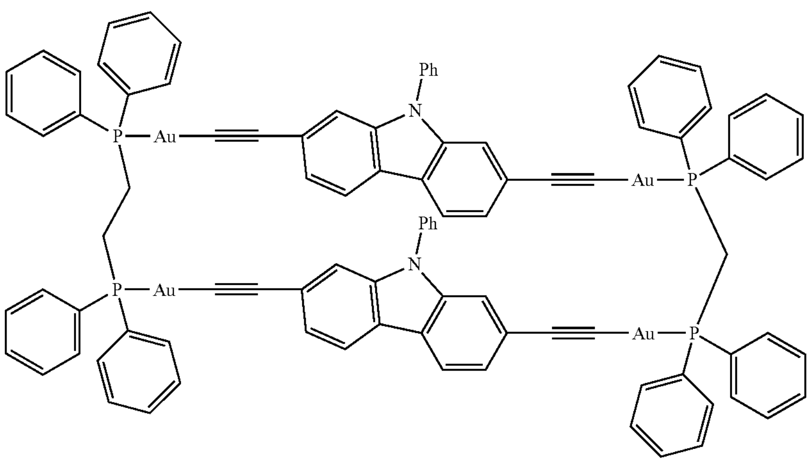
780
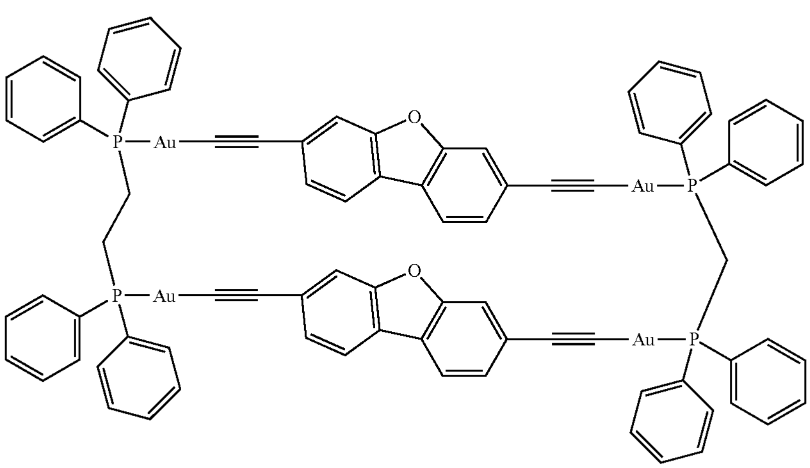

-continued
781
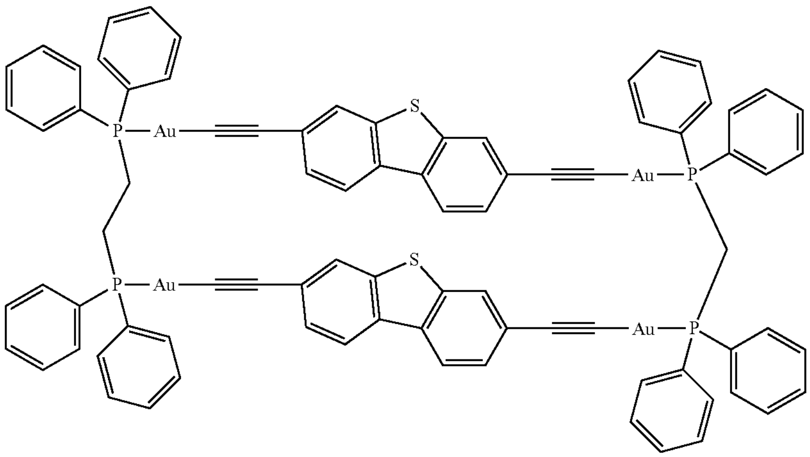
782
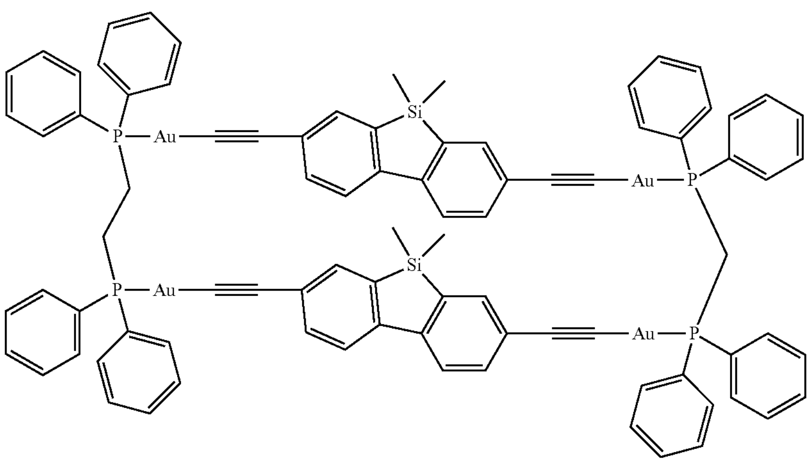
783
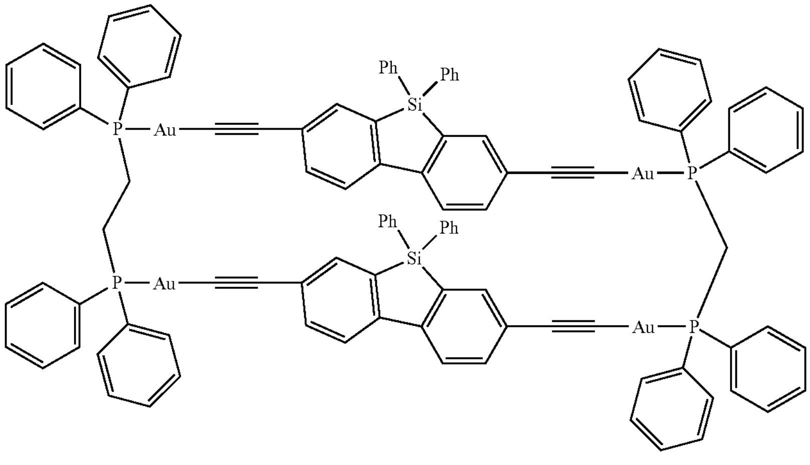

-continued
784
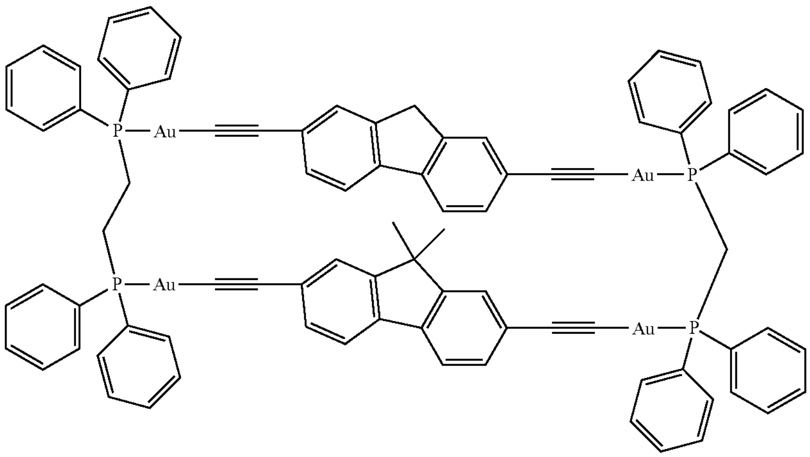
785
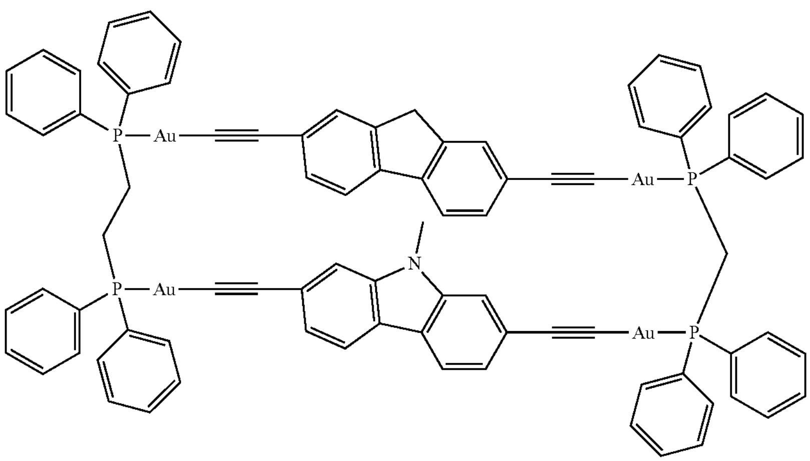
786
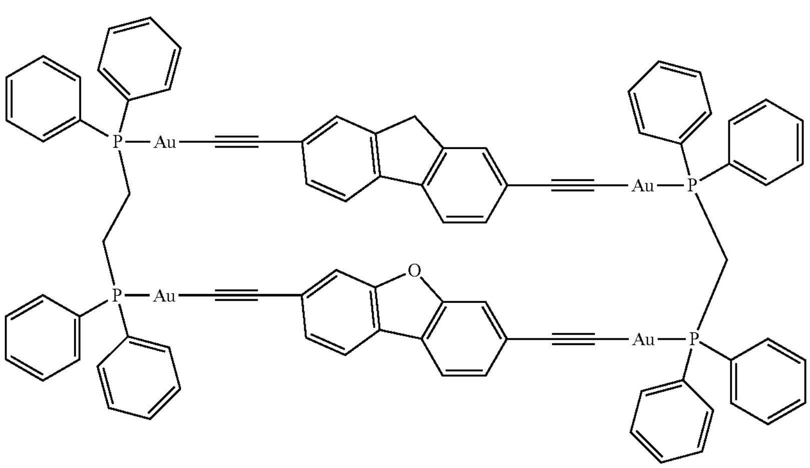

-continued
787
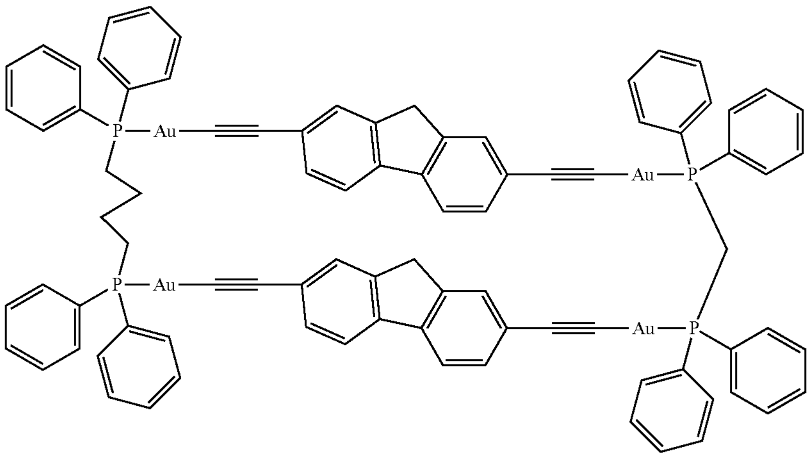
788
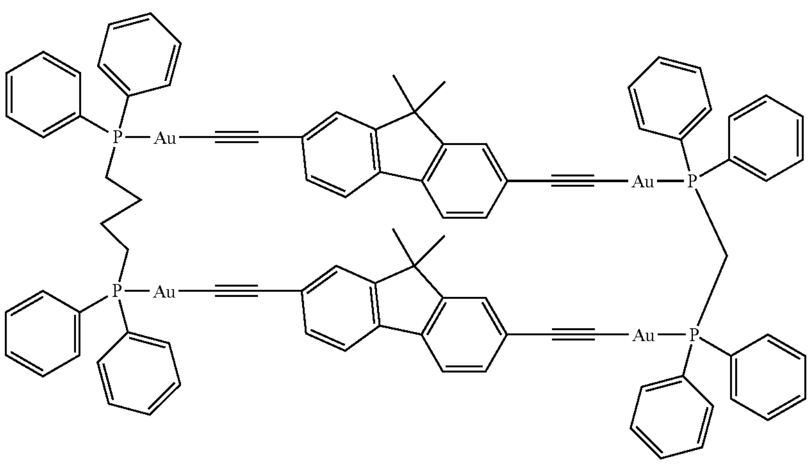
789
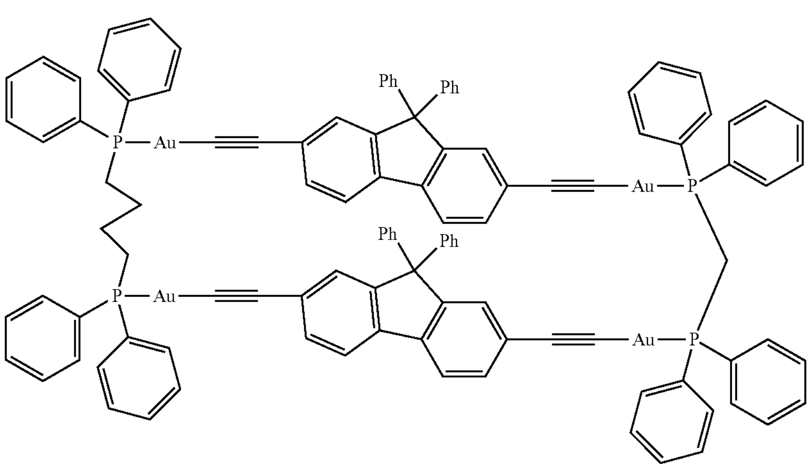

-continued
790
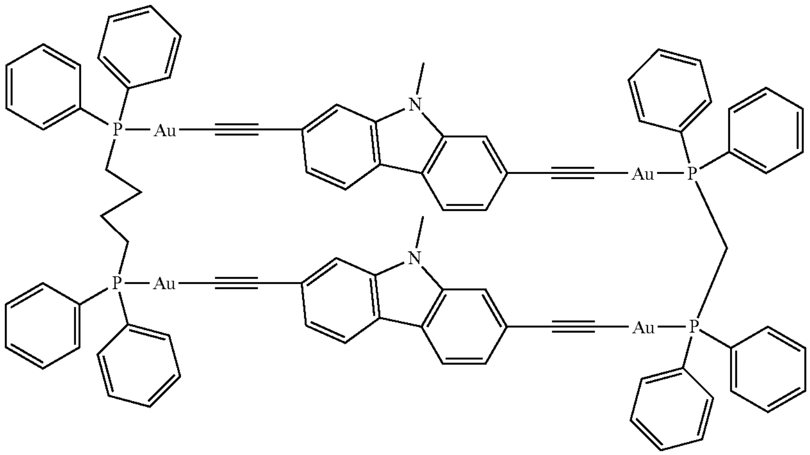
791
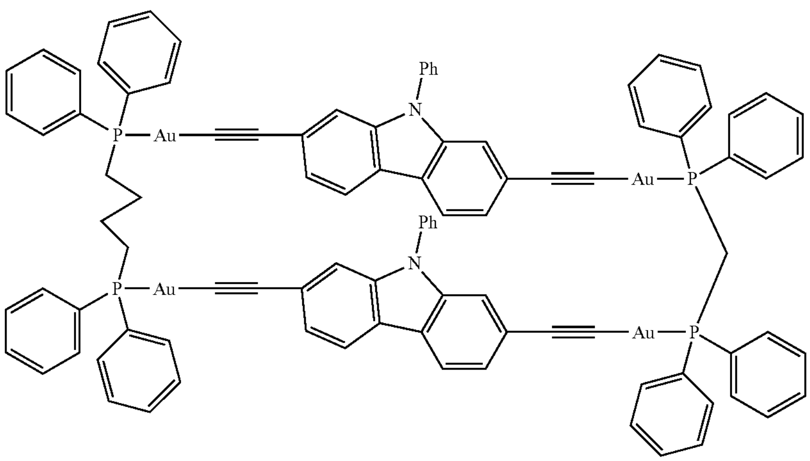
792
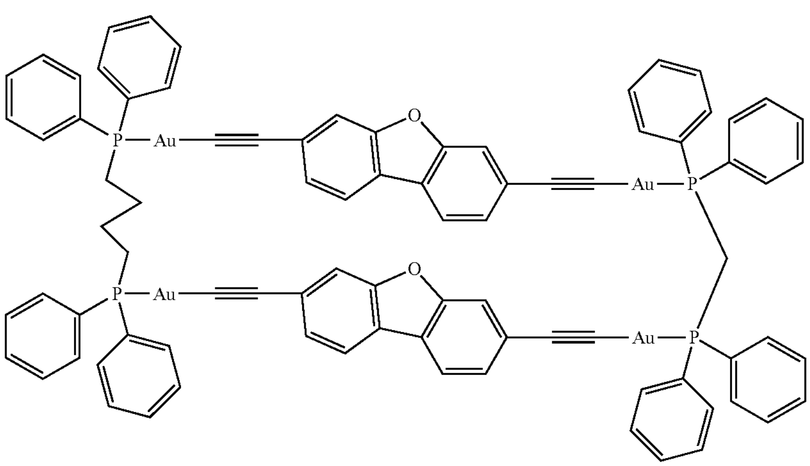

-continued
793
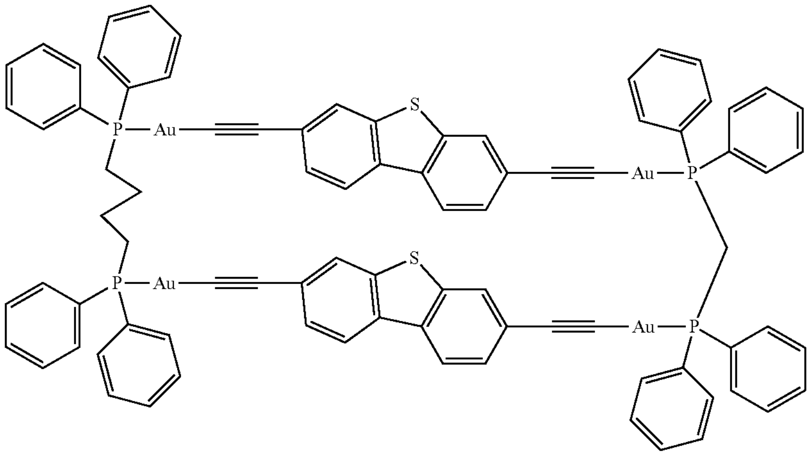
794
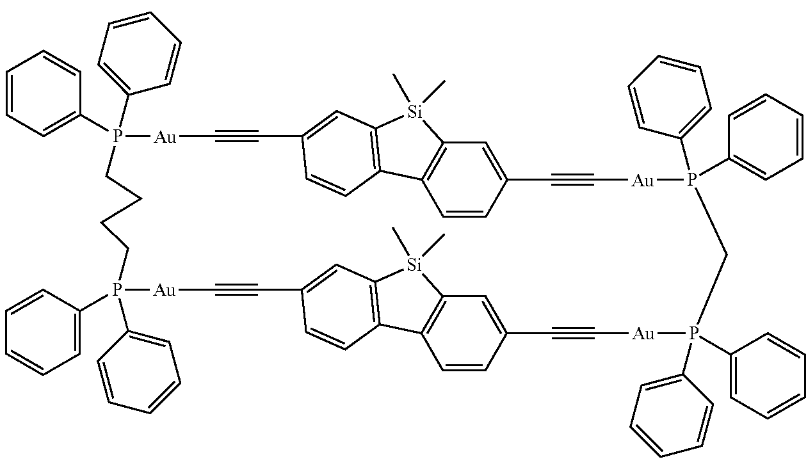
795
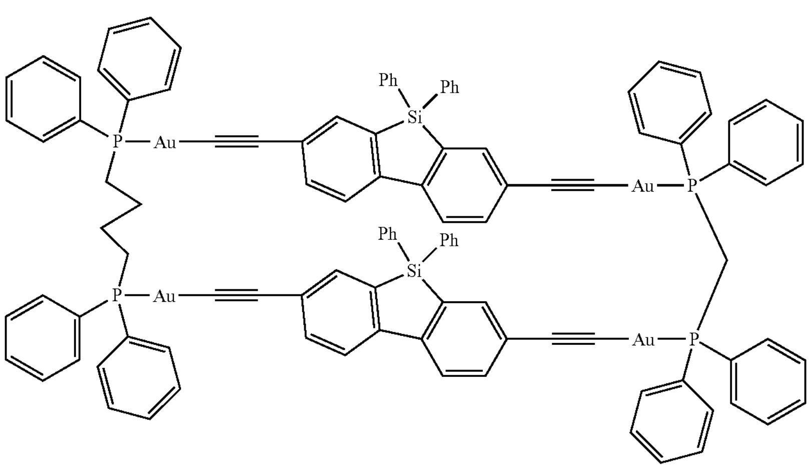

-continued
796
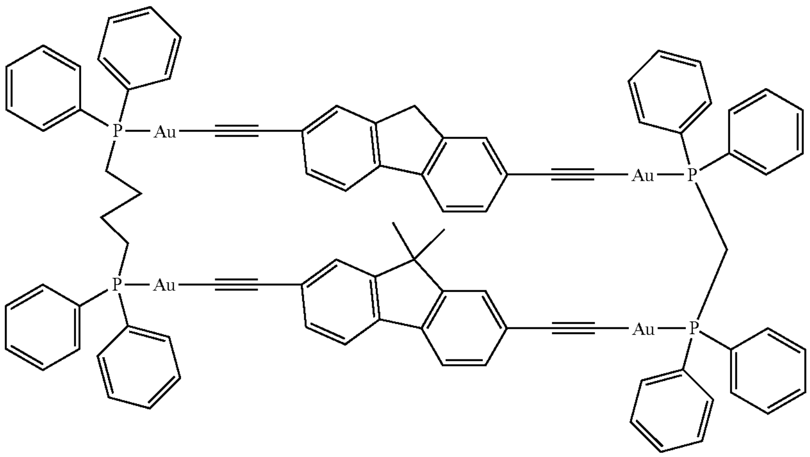
797
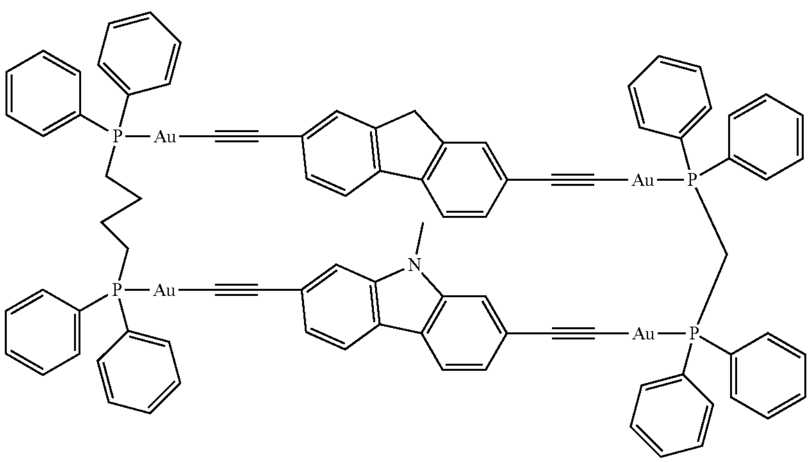
798
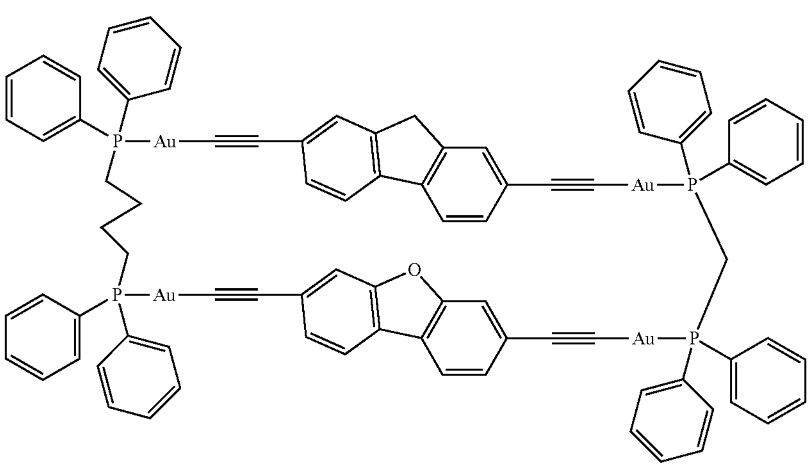

799
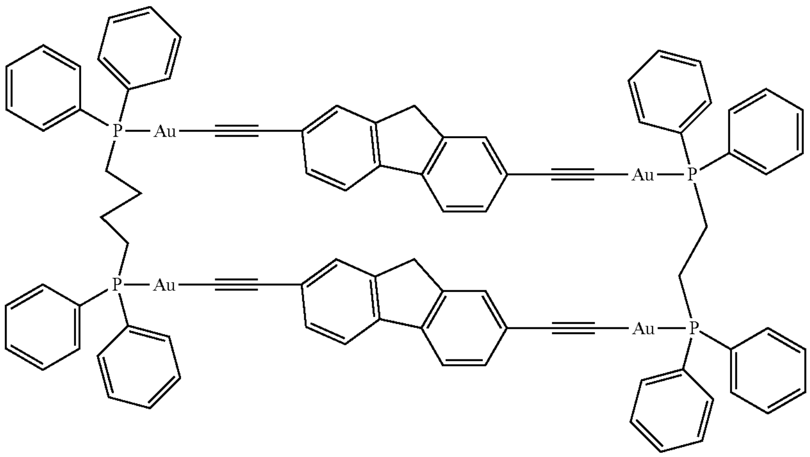
800
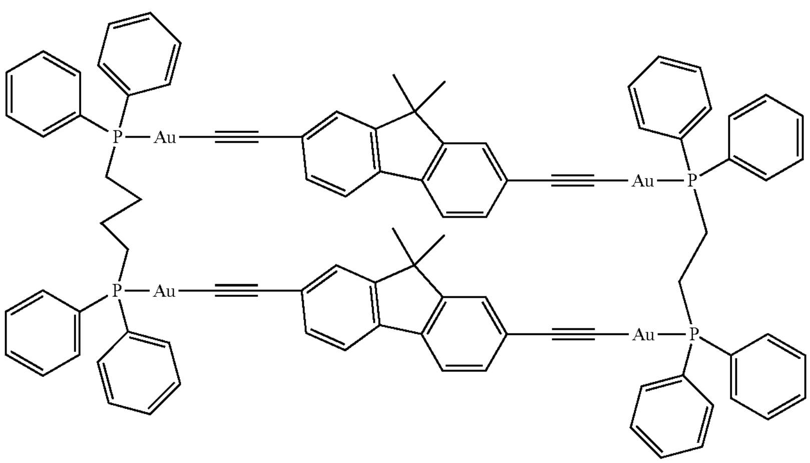
801
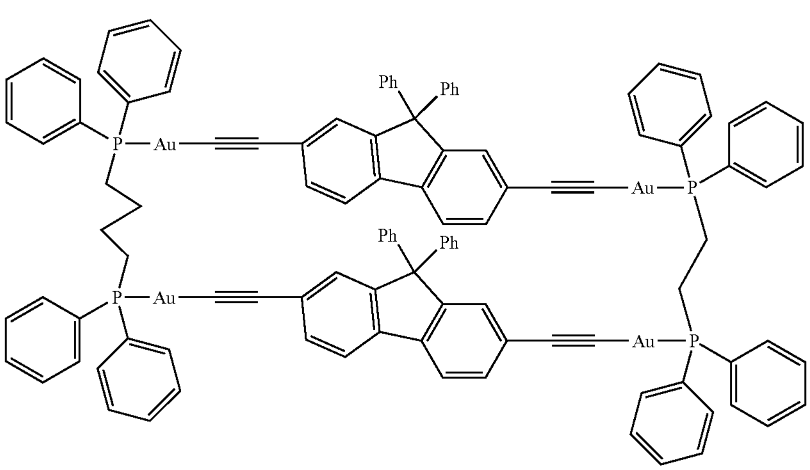

-continued
802
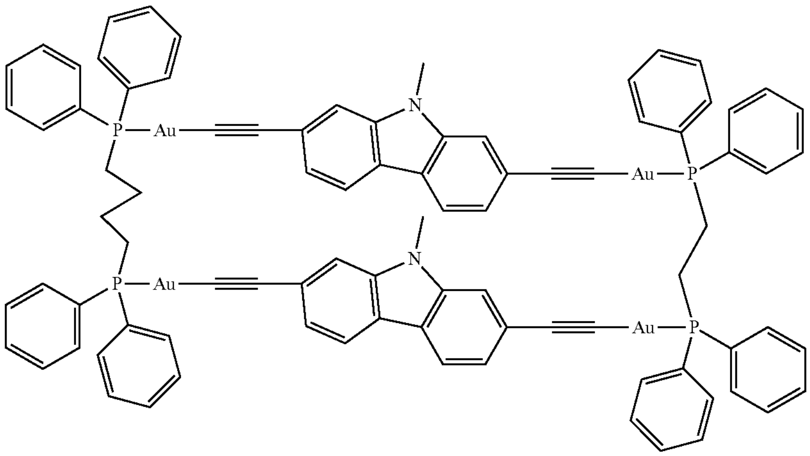
803
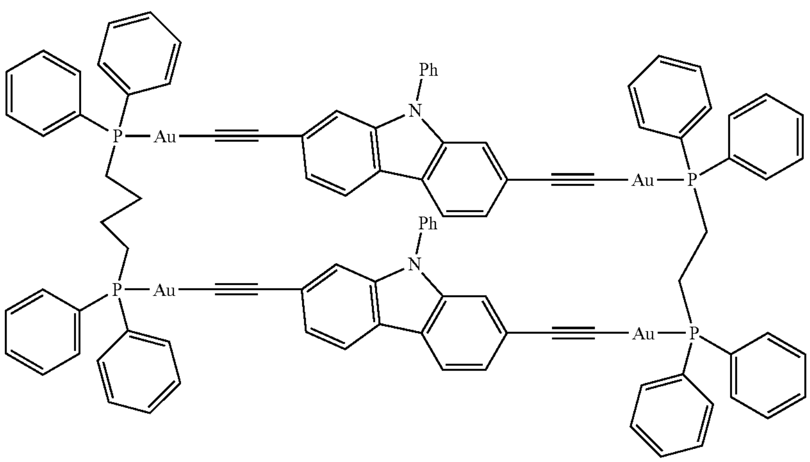
804
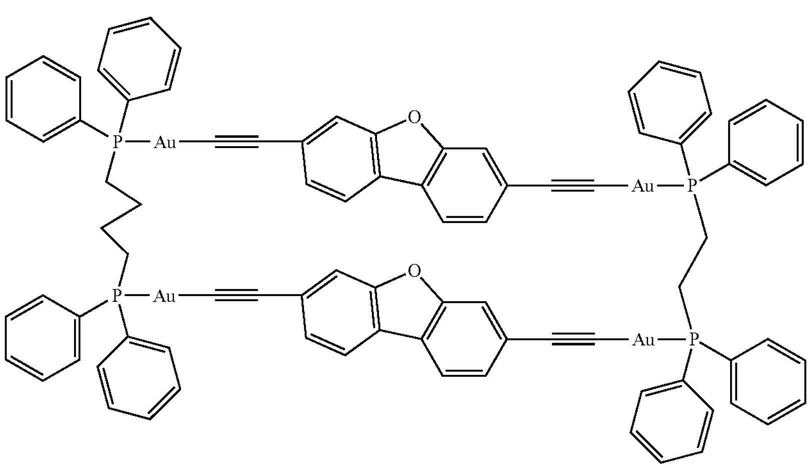

-continued
805
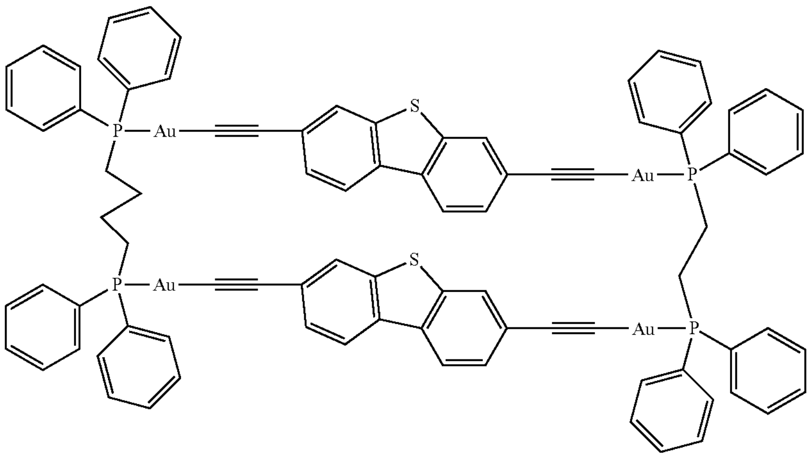
806
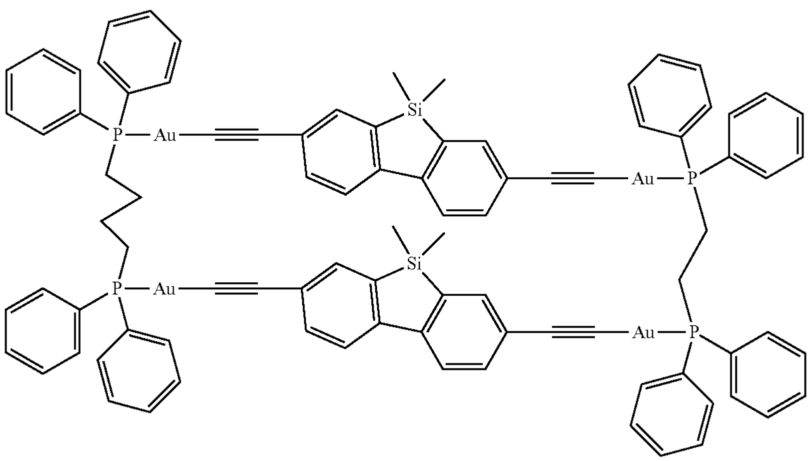
807
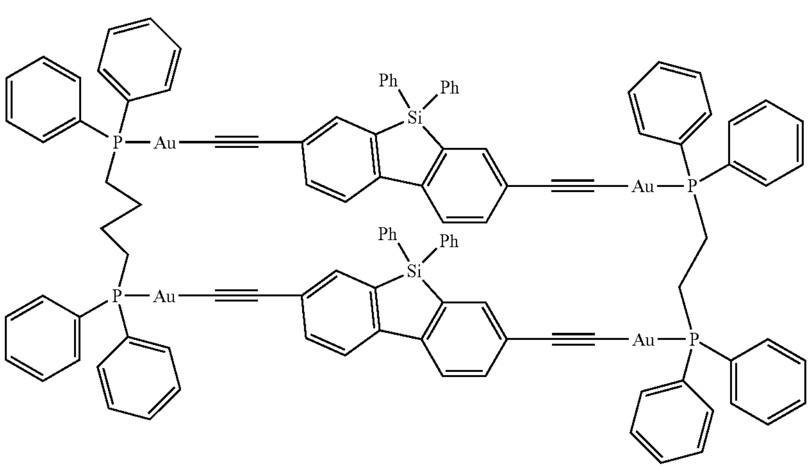

-continued

808

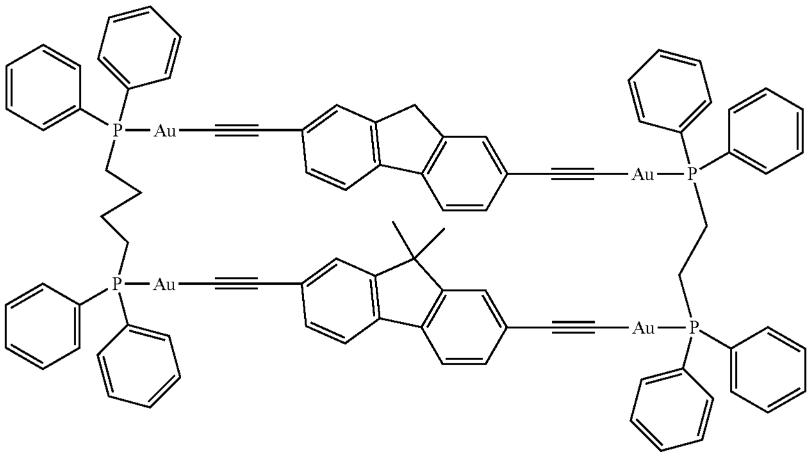

809

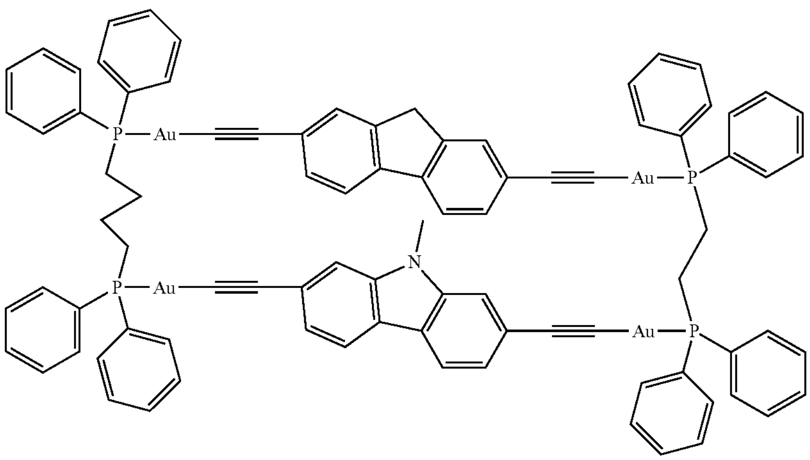

810

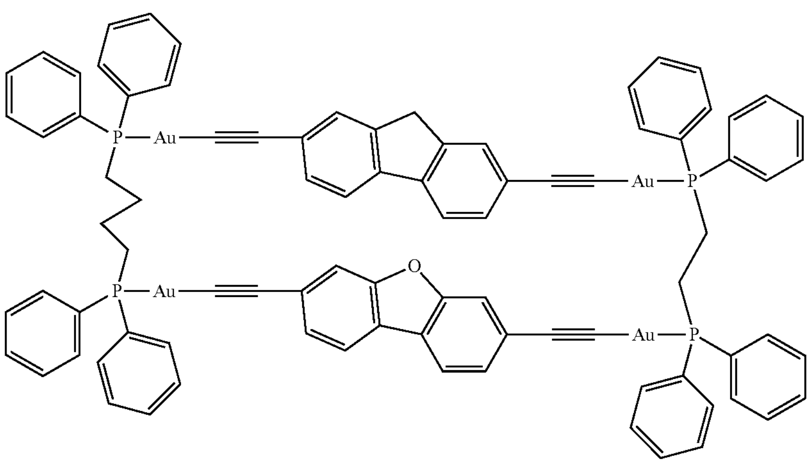

The organometallic compound may absorb ultraviolet rays (UV) at room temperature to emit phosphorescent light having a maximum luminescence wavelength of about 400 nanometers (nm) to about 700 nm, for example, about 430 nm to about 650 nm, about 450 nm to about 550 nm, or about 470 nm to about 500 nm.

In the present specification, UV may be electromagnetic radiation having one or more wavelengths in a range of about 10 nm to about 400 nm.

The organometallic compound represented by Formula 1 has a pincer or closed-ring structure including metal atoms $M_1$, $M_2$, $M_3$, and $M_4$, which are heavy atoms.

In the pincer or closed-ring structure, a distance between two metal atoms, for example, between $M_1$ and $M_2$ and between $M_3$ and $M_4$, is relatively shortened, and thus the stability of a triplet exciton may be improved by the interaction between the two metal atoms. When the stability is improved, the lifespan of the triplet exciton increases and the distribution density of the triplet exciton increases. Accordingly, the organometallic compound may stably emit phosphorescent light through photoluminescence even at room temperature. Therefore, an electronic device, for example, an organic light-emitting device, including the organometallic compound may have improved luminescence efficiency.

The organometallic compound may include groups represented by;

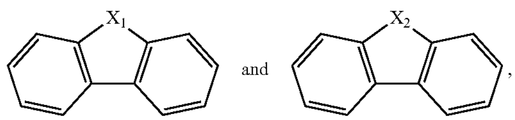

and accordingly, the linearity of a molecular structure may be increased. Accordingly, the distance between two metal atoms may further shortened, resulting in further improvement of the stability of the triplet exciton.

Also, the organometallic compound includes an alkyne ligand coordinated with a metal atom. Because the alkyne ligand has a weak acidity and forms a strong coordinative bond compared to an alkyl ligand, the reactivity to the substitution reaction is relatively small. Especially, the alkyne ligand may form a strong bond with a transition metal such as gold (Au) or silver (Ag). Accordingly, the organometallic compound may have improved molecular stability and may be easily synthesized.

As described above, the organometallic compound may exhibit room-temperature phosphorescence emission characteristics, and may have electrical characteristics that are appropriate for application as a material for an organic light-emitting device, for example, a material for a dopant in an emission layer. Accordingly, the organic light-emitting device including the organometallic compound may have high efficiency and/or long lifespan.

Furthermore, the organometallic compound may be applied to an image sensor as well as a material for an organic light-emitting device. Also, because the organometallic compound has excellent room-temperature phosphorescence emission characteristics, a diagnostic composition having high diagnostic efficiency may be provided using the organometallic compound and the organometallic compound may be used for a therapy using light.

The organometallic compound may emit phosphorescent light at room temperature due to photoluminescence, and thus, may be used for optical recording and bio-imaging.

For example, the organometallic compound has excellent room-temperature phosphorescence emission characteristics, and thus, may be usefully used as a labeling material for bio-imaging. For example, after the labeling material for bio-imaging including the organometallic compound is injected into a living body, the organometallic compound is photo-excited using an excitation source, and then luminescence is observed such that a position of the labeling material may be monitored.

In one or more embodiments, the phosphorescence emission intensity of the organometallic compound may reversibly vary according to the oxygen concentration. For example, as the oxygen concentration of the organometallic compound decreases, the phosphorescence emission intensity may increase.

Accordingly, the organometallic compound may be used as a material for measuring the oxygen concentration. For example, a phosphorescence intensity reduction curve is optimized as an exponential decay curve to thereby measure phosphorescence lifetime, followed by comparison and analysis to thereby estimate the oxygen concentration.

Alternatively, the organometallic compound may be used as a material for measuring pressure, based on a principle in which the oxygen concentration inside an object to be measured varies in response to pressure applied to the object to be measured.

Accordingly, the organometallic compound may be used for an oxygen concentration measurement sensor, an oxygen concentration measurement system, a pressure detection sensor, a pressure detection system, or the like.

Synthesis methods of the organometallic compound represented by Formula 1 may be recognizable by one of ordinary skill in the art by referring to the Synthesis Examples provided below.

Composition

According to another aspect, provided is a composition including at least one organometallic compound represented by Formula 1.

The composition may further include a solvent, in addition to the organometallic compound. The solvent may include an organic solvent that is commonly used.

In one or more embodiments, the composition may be used, for example, in the manufacture of organic layers of electronic devices (for example, organic light-emitting devices).

In one or more embodiments, the composition may be a diagnostic composition or a composition for measurement.

Because the organometallic compound represented by Formula 1 may provide high luminescence efficiency, the diagnostic composition may have high diagnostic efficiency and the composition for measurement may reliably measure an object to be measured.

The diagnostic composition or the composition for measurement may be variously applied to various diagnostic kits, diagnostic reagents, measurement kits, measurement reagents, biosensors, biomarkers, or the like.

In one or more embodiments, the composition may be a security ink composition.

Because the organometallic compound may emit phosphorescent light at room temperature due to photoluminescence, the organometallic compound may be appropriate for use in the security ink composition.

For example, the security ink composition may be provided in the form of a security pattern on a security document or a security article. The security article may be an article that has the risk of forgery, such as an identification card (for example, a resident registration certificate, a driver's license, or an employee card), a certificate, a passport, a credit card, or the like. When light energy having an energy greater than a band gap of the organometallic compound is applied to the security ink composition by using an electromagnetic radiation excitation source such as UV light to thereby excite the organometallic compound, the organometallic compound may emit light by photoluminescence, and thus a security pattern appears. By observing the security pattern with naked eyes, it is possible to determine forge and falsification of security documents or security articles.

Organic Light-Emitting Device

The organometallic compound represented by Formula 1 may be appropriate for use as an organic layer of the organic light-emitting device, for example, a material for an emission layer in the organic layer. Accordingly, according to another aspect, provided is an organic light-emitting device including: a first electrode; a second electrode; and an organic layer located between the first electrode and the second electrode and including an emission layer, wherein the organic layer includes at least one organometallic compound represented by Formula 1.

The organic light-emitting device may have low driving voltage, high efficiency, high luminance, high quantum efficiency, and/or long lifespan by including the organic layer including at least one organometallic compound represented by Formula 1.

The organometallic compound represented by Formula 1 may be used between a pair of electrodes of an organic light-emitting device. In one or more embodiments, the organometallic compound may be included in at least one of an emission layer, a hole transport region (for example, the hole transport region including at least one of a hole injection layer, a hole transport layer, and an electron blocking layer), and an electron transport region (for example, the electron transport region including at least one of a hole blocking layer, an electron transport layer, and an electron injection layer).

In one or more embodiments, the first electrode may be an anode, the second electrode may be a cathode, the organic layer may include a hole transport region between the first electrode and the emission layer and an electron transport region between the emission layer and the second electrode, the hole transport region may include a hole injection layer, a hole transport layer, an electron blocking layer, a buffer layer, or any combination thereof, and the electron transport region may include a hole blocking layer, an electron transport layer, an electron injection layer, or any combination thereof, but embodiments of the present disclosure are not limited thereto.

In one or more embodiments, the emission layer of the organic light-emitting device may include the organometallic compound represented by Formula 1.

The emission layer of the organic light-emitting device may emit red light, green light, or blue light. For example, the emission layer may emit green light or blue light.

In one or more embodiments, the emission layer of the organic light-emitting device may include a host and a dopant, and the dopant may include the organometallic compound. An amount of the host in the emission layer may be greater than an amount of the dopant in the emission layer.

In one or more embodiments, the emission layer may be a green or blue emission layer including the organometallic compound, but embodiments of the present disclosure are not limited thereto. In one or more embodiments, the organometallic compound may be a green phosphorescent dopant or a blue phosphorescent dopant.

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this case, Compound 1 may be included in the emission layer of the organic light-emitting device. In one or more embodiments, the organic layer may include, as the organometallic compound, Compound 1 and Compound 2. In this case, Compound 1 and Compound 2 may be present in an identical layer (for example, Compound 1 and Compound 2 may all be present in an emission layer), or different layers (for example, Compound 1 may be present in an emission layer and Compound 2 may be present in a hole blocking layer).

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

The term "organic layer" used herein refers to a single layer and/or a plurality of layers between the first electrode and the second electrode of the organic light-emitting device. The "organic layer" may include, in addition to an organic compound, an organometallic complex including metal, but the organic layer is not limited thereto.

FIG. 1 is a schematic cross-sectional view of an organic light-emitting device 10 according to one or more embodiments. Hereinafter, a structure of an organic light-emitting device according to one or more embodiments of the present disclosure and a method of manufacturing the organic light-emitting device will be described with reference to FIG. 1. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed, for example, by depositing or sputtering a material for forming the first electrode 11 on the substrate. The first electrode 11 may be an anode. The material for forming the first electrode 11 may be chosen from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. In one or more embodiments, the first electrode 11 may have a three-layered structure of ITO/Ag/ITO, but the structure of the first electrode 11 is not limited thereto.

The organic layer 15 is located on the first electrode 11.

The organic layer 15 may include a hole transport region, an emission layer, and an electron transport region.

The hole transport region may be between the first electrode 11 and the emission layer.

The hole transport region may include at least one of a hole injection layer, a hole transport layer, an electron blocking layer, and a buffer layer.

The hole transport region may include only either a hole injection layer or a hole transport layer. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 angstrom per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one of m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, or a compound represented by Formula 202 below:

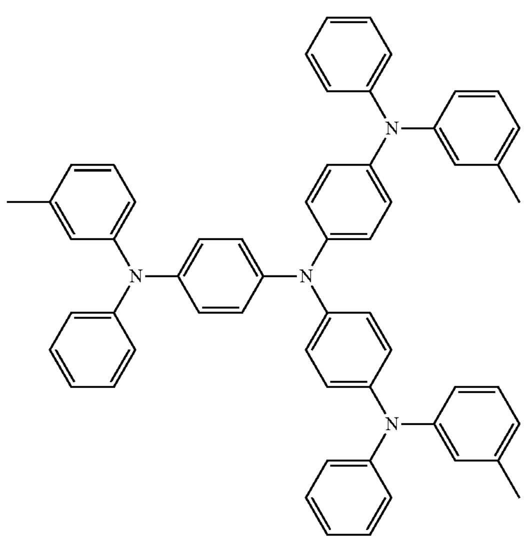

m-MTDATA

-continued

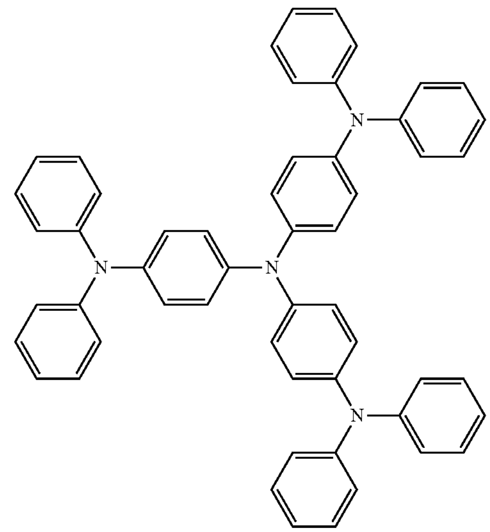

TDATA

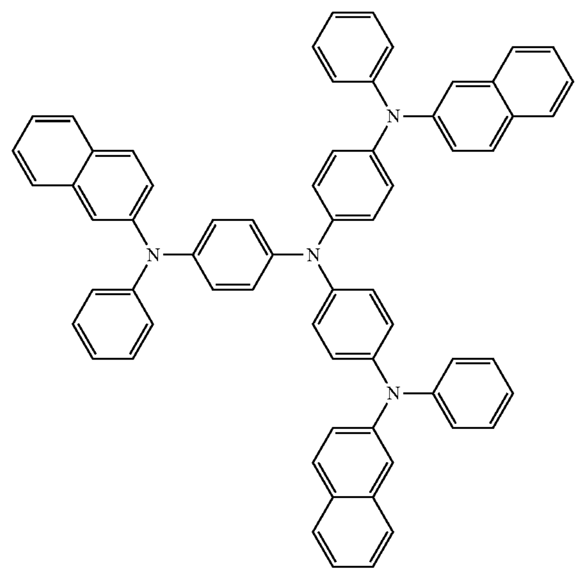

2-TNATA

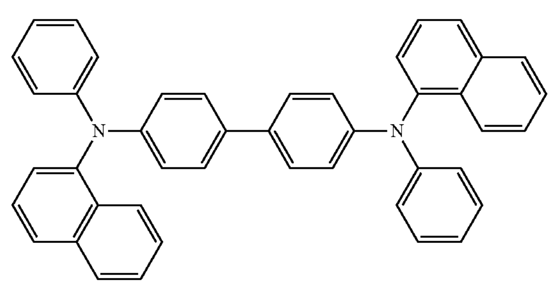

NPB

-continued

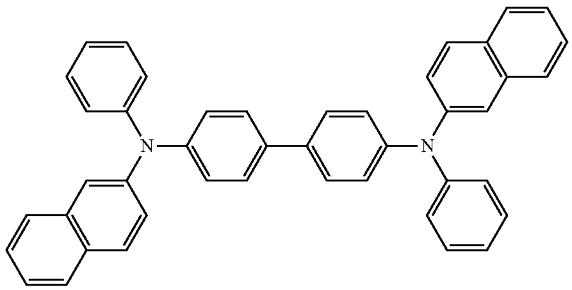

β-NPB

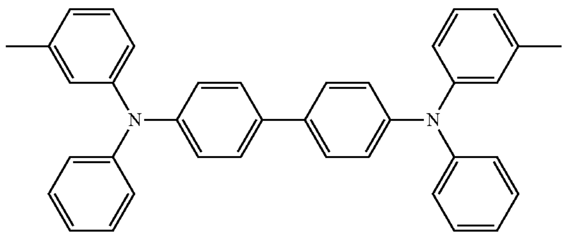

TPD

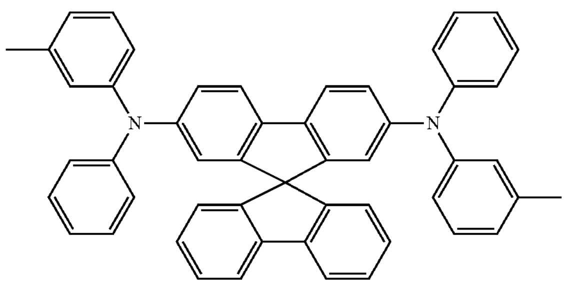

Spiro-TPD

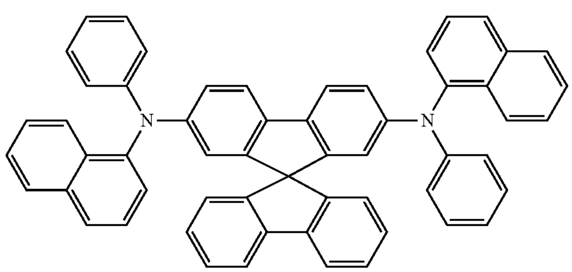

Spiro-NPB

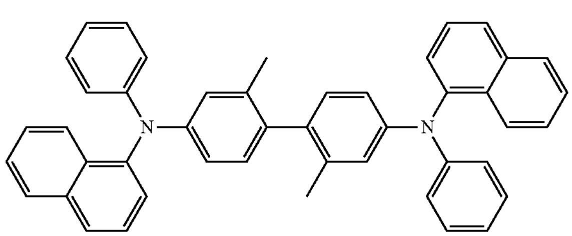

methylated NPB

-continued

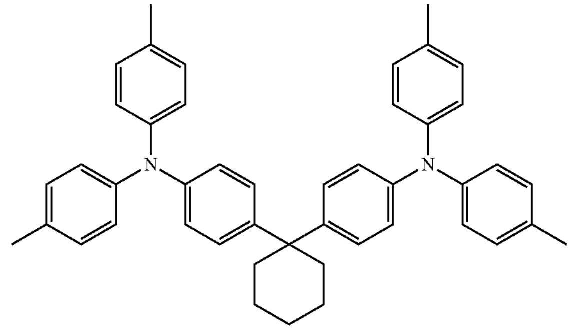

TAPC

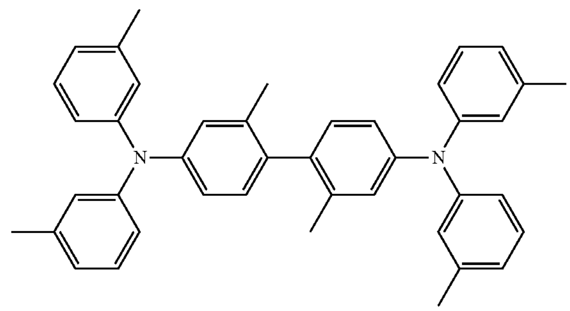

HMTPD

Formula 201

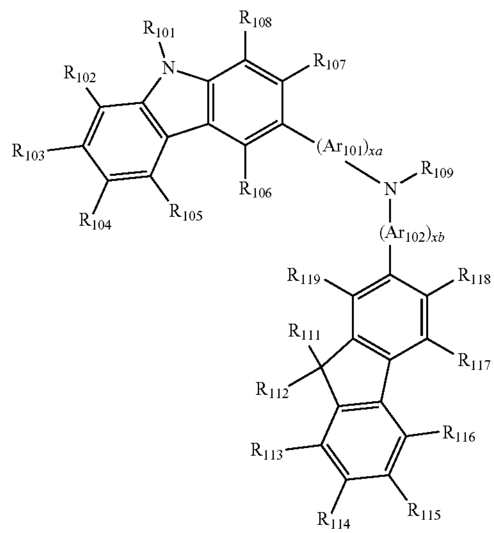

Formula 202

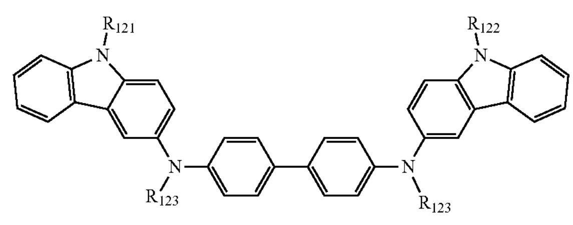

In Formula 201, $Ar_{101}$ and $Ar_{102}$ may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group.

In Formula 201, xa and xb may each independently be an integer from 0 to 5, or 0, 1, or 2. In one or more embodiments, xa may be 1 and xb may be 0, but xa and xb are not limited thereto.

In Formulae 201 and 202, $R_{101}$ to $R_{108}$, $R_{111}$ to $R_{119}$ and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like) or a $C_1$-$C_{10}$ alkoxy group (for example, a methoxy group, an ethoxy group, a propoxy group, a butoxy group, a pentoxy group, or the like);

a $C_1$-$C_{10}$ alkyl group, or a $C_1$-$C_{10}$ alkoxy group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but embodiments of the present disclosure are not limited thereto.

In Formula 201, $R_{109}$ may be:

a phenyl group, a naphthyl group, an anthracenyl group, or a pyridinyl group; and a phenyl group, a naphthyl group, an anthracenyl group, or a pyridinyl group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

According to one or more embodiments, the compound represented by Formula 201 may be represented by Formula 201A below, but embodiments of the present disclosure are not limited thereto:

Formula 201A

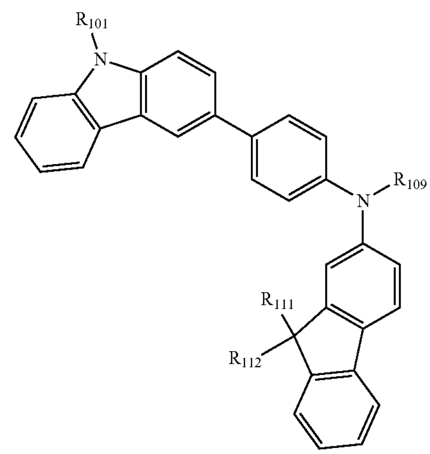

In Formula 201A, $R_{101}$, $R_{111}$, $R_{112}$, and $R_{109}$ may be understood by referring to the description provided herein.

In one or more embodiments, the compound represented by Formula 201 and the compound represented by Formula 202 may include one of Compounds HT1 to HT20 illustrated below, but are not limited thereto:

HT1

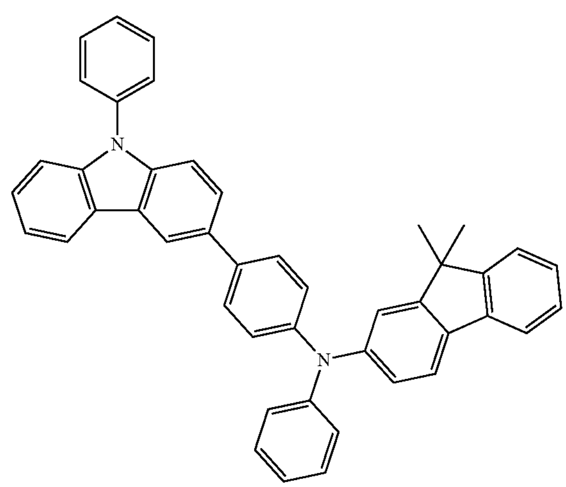

-continued
HT2
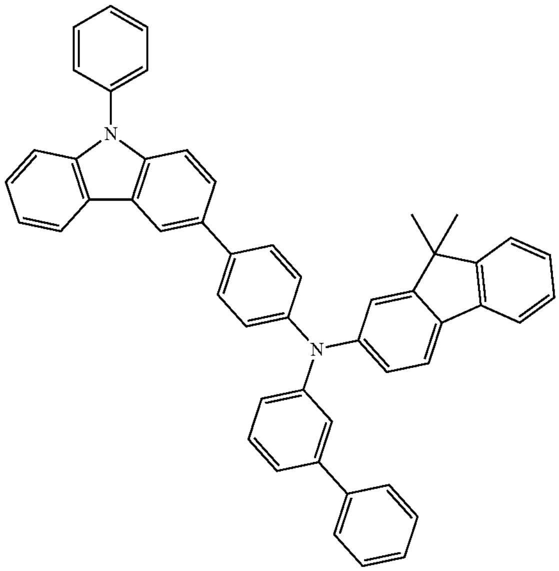
HT3
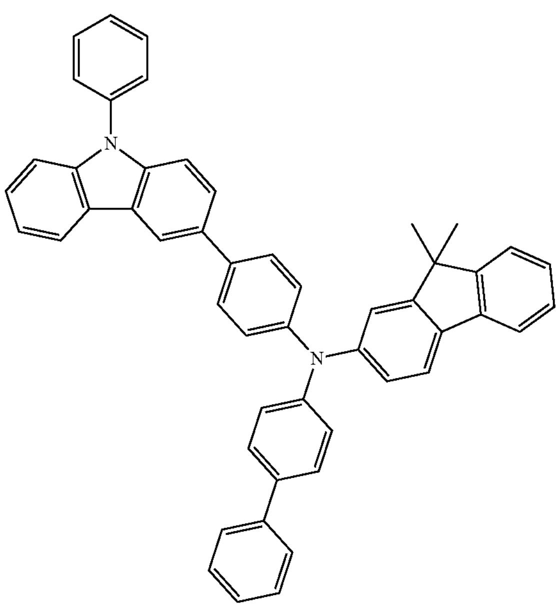
-continued
HT4
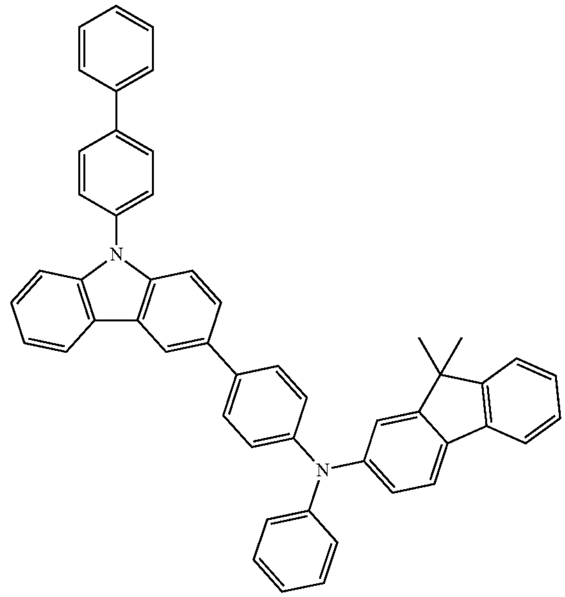
HT5
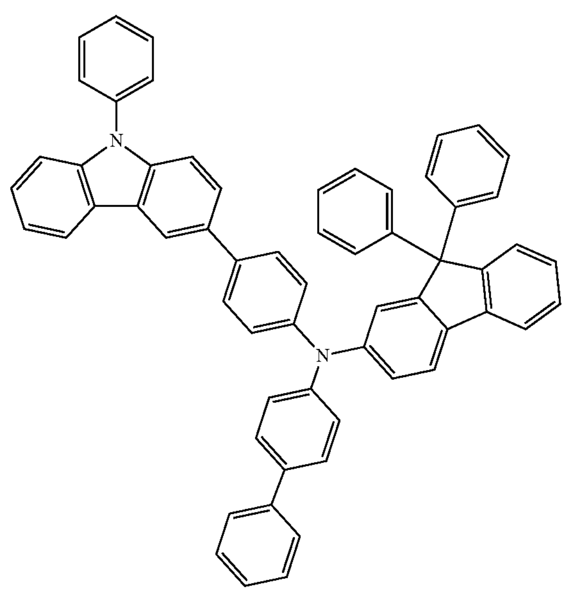

-continued
HT6
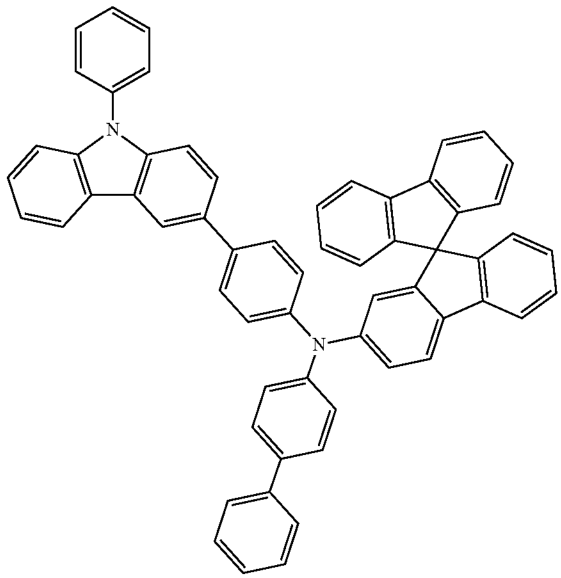
HT7
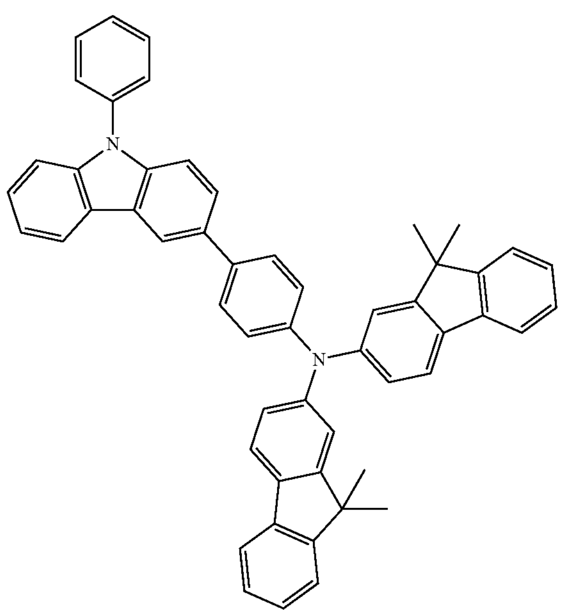
-continued
HT8
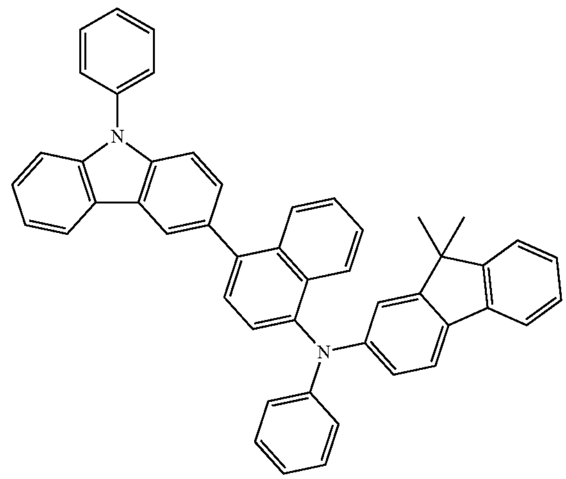
HT9
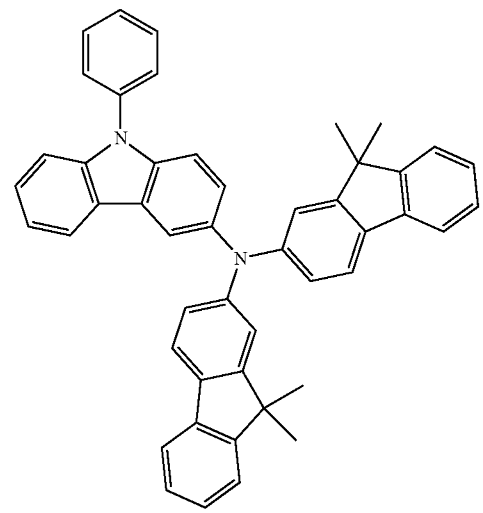
HT10
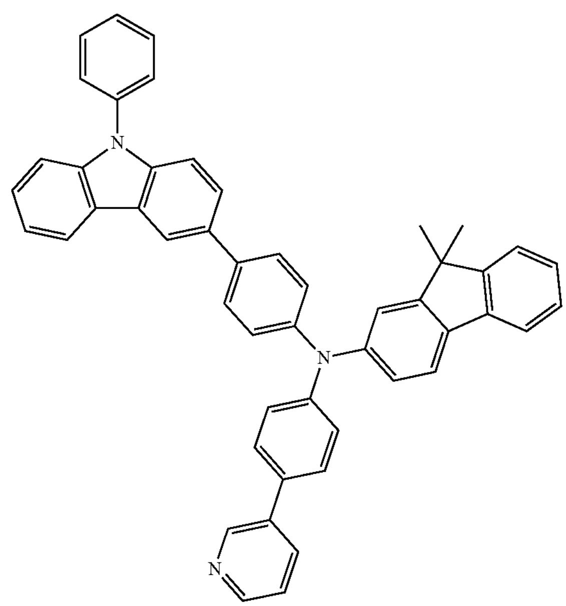

-continued
HT11
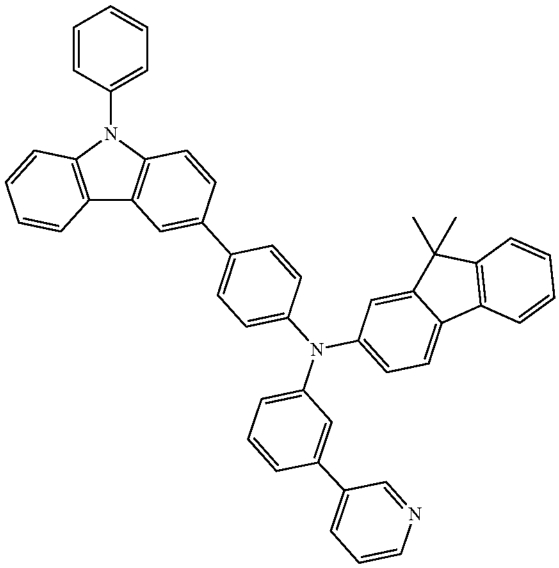
HT12
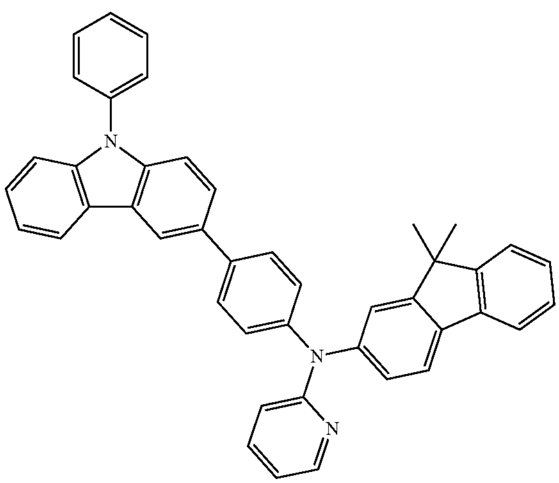
HT13
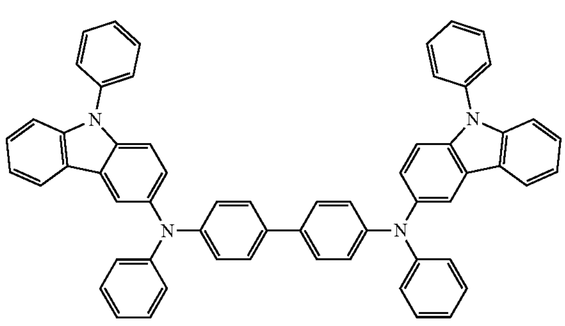
-continued
HT14
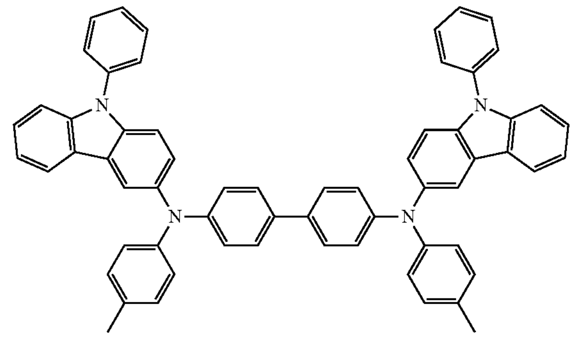
HT15
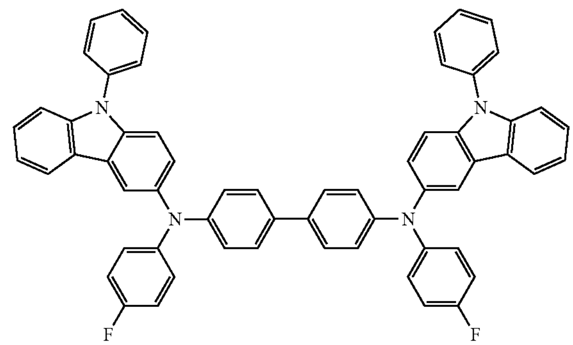
HT16
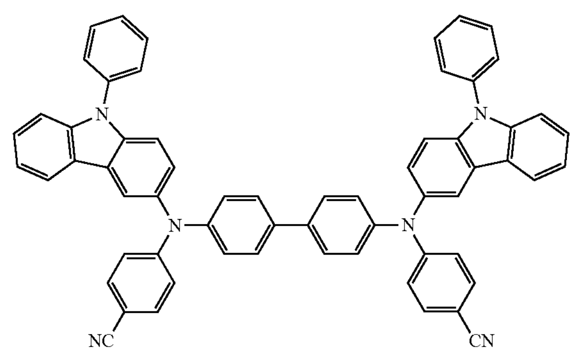
HT17
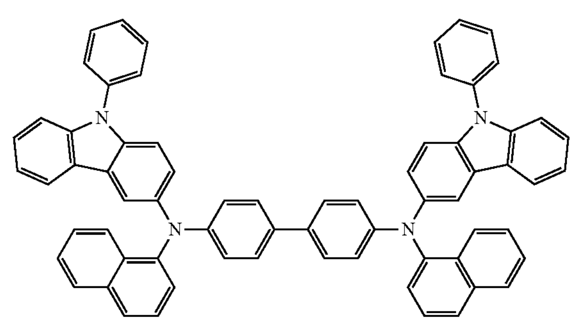

-continued

HT18

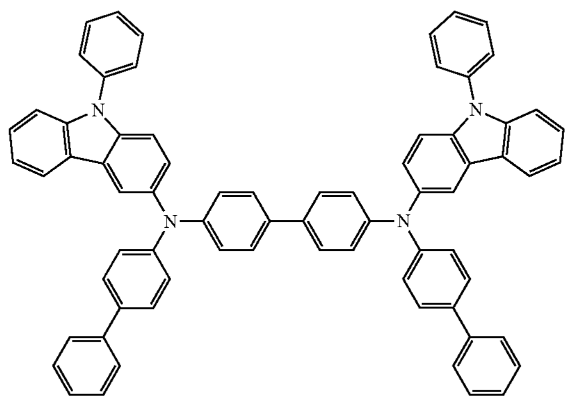

HT19

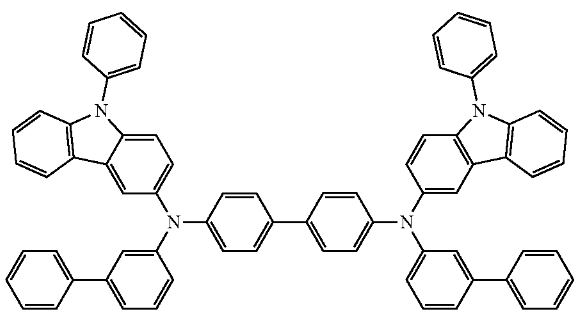

HT20

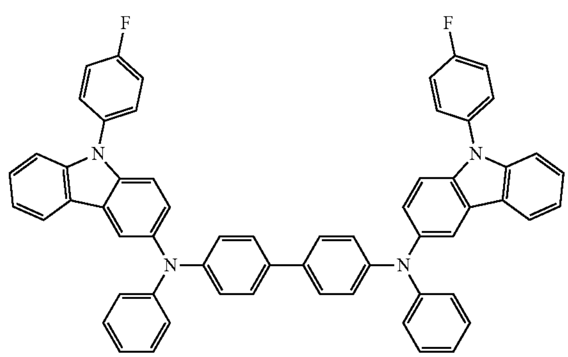

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one or more of a quinone derivative, a metal oxide, or a cyano group-containing compound, but embodiments of the present disclosure are not limited thereto. In one or more embodiments, non-limiting examples of the p-dopant are: a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or Compound HT-D2 below, but are not limited thereto.

HT-D1

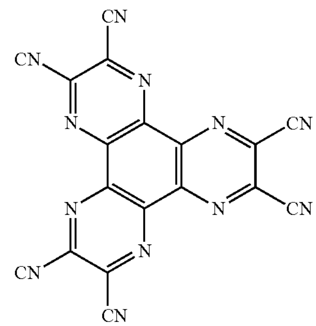

HT-D2

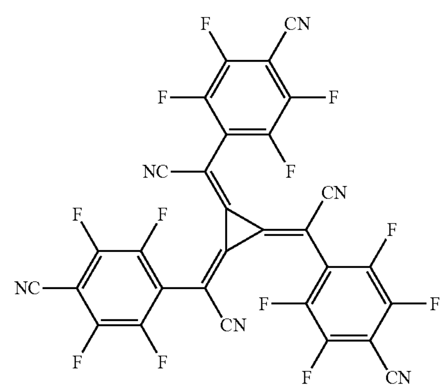

F4-TCNQ

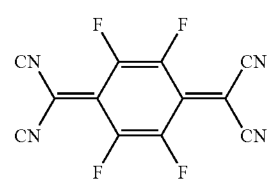

The hole transport region may further include a buffer layer.

The buffer layer may compensate for an optical resonance distance according to a wavelength of light emitted from the emission layer, thereby increasing efficiency of an organic light-emitting device.

The hole transport region may further include an electron blocking layer. The electron blocking layer may include a material available in the art, for example, mCP, but embodiments of the present disclosure are not limited.

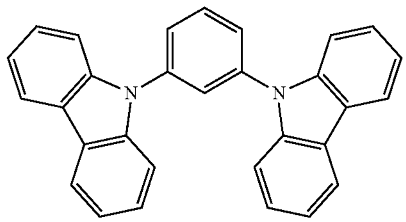

mCP

The thickness of the electron blocking layer may be about 50 Å to about 1,000 Δ, for example about 70 Å to about 500 Å. When the thickness of the electron blocking layer is within the range described above, the electron blocking layer may have satisfactory electron blocking characteristics without a substantial increase in driving voltage.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

The emission layer may include the organometallic compound represented by Formula 1.

In one or more embodiments, the emission layer may include only the organometallic compound represented by Formula 1.

When the emission layer includes a host and a dopant, an amount of the dopant may be in the range of about 0.01 parts by weight to about 20 parts by weight, based on 100 parts by weight of the emission layer. However, embodiments of the present disclosure are not limited thereto. When the amount of the dopant satisfies the range, it may be possible to realize emission without extinction phenomenon.

A thickness of the emission layer may be in a range of about 100 Å to about 1,000 Å, for example, about 200 Å to about 60 Å. When the thickness of the emission layer is within this range, excellent light-emission characteristics may be obtained without a substantial increase in driving voltage.

Then, an electron transport region may be located on the emission layer.

The electron transport region may include at least one of a hole blocking layer, an electron transport layer, and an electron injection layer.

For example, the electron transport region may have a hole blocking layer/electron transport layer/electron injection layer structure or an electron transport layer/electron injection layer structure, and the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP and Bphen, but embodiments of the present disclosure are not limited thereto.

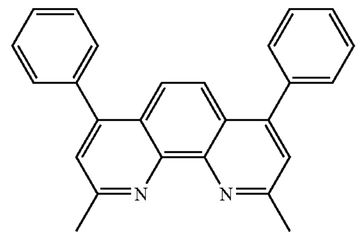

BCP

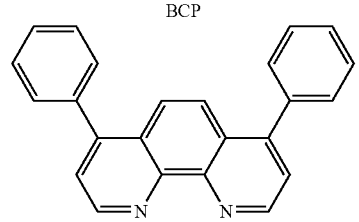

Bphen

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may further include at least one of BCP, Bphen, $Alq_3$, Balq, TAZ, or NTAZ.

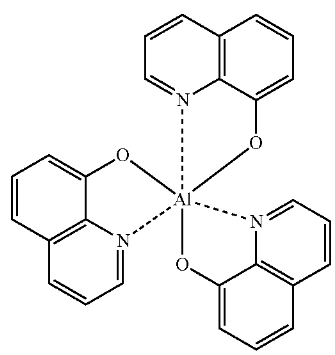

$Alq_3$

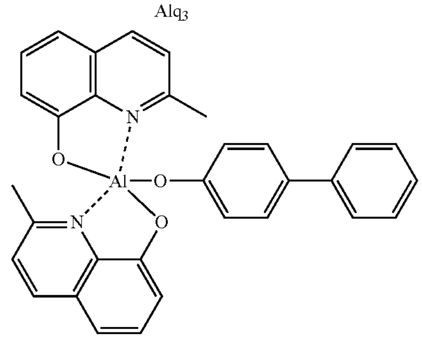

BAlq

-continued

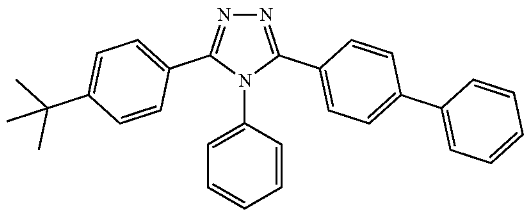

TAZ

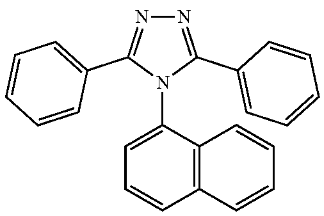

NTAZ

In one or more embodiments, the electron transport layer may include at least one of ET1, ET2, or ET3, but are not limited thereto:

ET1

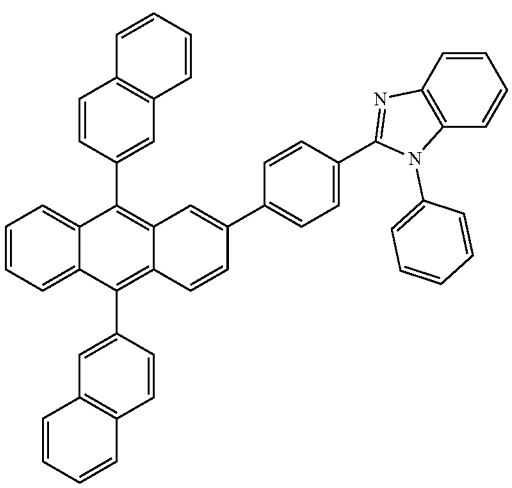

ET2

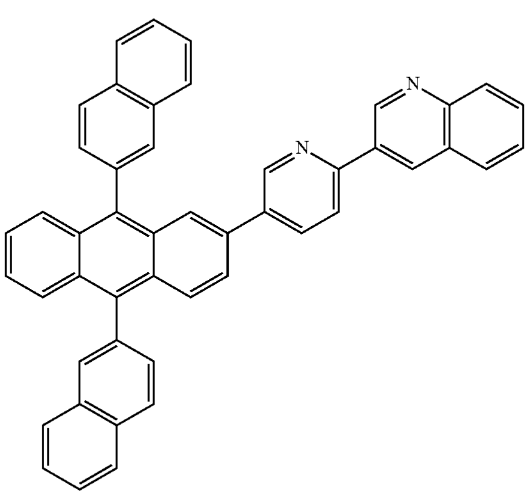

-continued

ET3

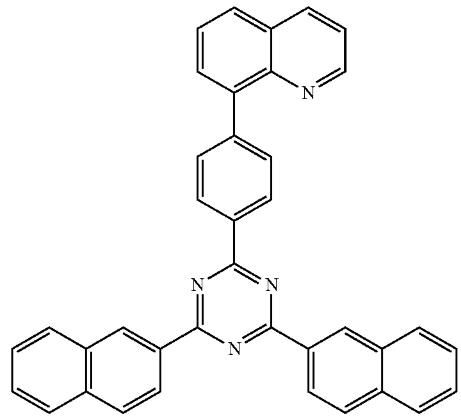

A thickness of the electron transport layer may be in a range of about 100 Å to about 1,000 Å, for example, about 150 Å to about 500 Å. When the thickness of the electron transport layer is within the range described above, satisfactory electron transport characteristics may be obtained without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2.

ET-D1

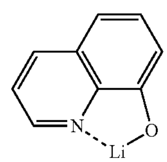

ET-D2

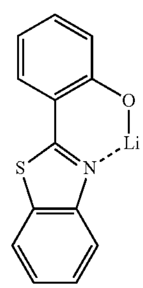

In one or more embodiments, the electron transport region may include an electron injection layer that promotes the flow of electrons from the second electrode 19 thereinto.

The electron injection layer may include at least one of LiQ, LiF, NaCl, CsF, $Li_2O$, or BaO.

A thickness of the electron injection layer may be in a range of about 1 Δ to about 100 Å, and, for example, about 3 Δ to about 90 Å. When the thickness of the electron injection layer is within the range described above, satisfactory electron injection characteristics may be obtained without a substantial increase in driving voltage.

The second electrode 19 is located on the organic layer 15. The second electrode 19 may be a cathode. A material for forming the second electrode 19 may be metal, a metal alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Electronic Apparatus

The organometallic compound represented by Formula 1 may be applied to various electronic apparatuses. Accordingly, according to another aspect, provided is an electronic apparatus including the organometallic compound.

The electronic apparatus may include various displays, light sources, lighting, computers, electronic dictionaries, medical devices, projectors, and image sensors.

In one or more embodiments, the electronic apparatus may include the organic light-emitting device as described above, and the organometallic compound may be included in the organic light-emitting device.

Definition of Terms

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" used herein refers to a monovalent group represented by-$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, P, Si, and S as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms as ring atoms, and the term "$C_6$-$C_{60}$ arylene group" as used herein refers to a divalent group having a carbocyclic aromatic system having 6 to 60 carbon atoms as ring atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having an aromatic system that has at least one heteroatom selected from N, O, P, Si, and S as a ring-forming atom instead of a carbon atom, and 1 to 60 carbon atoms. The term "$C_1$-$C_{60}$ heteroarylene group" as used herein refers to a divalent group having an aromatic system that has at least one heteroatom selected from N, O, P, and S as a ring-forming atom instead of a carbon atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be fused to each other.

The term "$C_6$-$C_{60}$ aryloxy group" as used herein refers to-$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "monovalent non-aromatic condensed polycyclic group" used herein refers to a monovalent group in which two or more rings are condensed with each other, only carbon is used as a ring-forming atom (for example, the number of carbon atoms may be 8 to 60), and the whole molecule is a non-aromaticity group. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, a heteroatom selected from N, O, P, Si, and S, other than carbon atoms (for example, having 1 to 60 carbon atoms), as a ring-forming atom, and non-aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$R_{10a}$" as used herein refers to:

deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$Si(Q_{11})(Q_{12})(Q_{13})$, —$Ge(Q_{11})(Q_{12})(Q_{13})$, —$N(Q_{14})(Q_{15})$, —$B(Q_{16})(Q_{17})$, —$P(=O)(Q_{18})(Q_{19})$, or —$P(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_1$-$C_6$ heteroaryl group, a monovalent non-aromatic condensed polycyclic group, or a monovalent non-aromatic condensed heteropolycyclic group, each substituted with one or more of deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$Si(Q_{21})(Q_{22})(Q_{23})$, $Ge(Q_{21})(Q_{22})(Q_{23})$, —$N(Q_{24})(Q_{25})$, —$B(Q_{26})(Q_{27})$, —$P(=O)(Q_{28})(Q_{29})$, or —$P(Q_{28})(Q_{29})$; or $Si(Q_{31})(Q_{32})(Q_{33})$, —$Ge(Q_{31})(Q_{32})(Q_{33})$, —$N(Q_{34})(Q_{35})$, —$B(Q_{36})(Q_{37})$, —$P(=O)(Q_{38})(Q_{39})$, or —$P(Q_{38})(Q_{39})$.

$Q_1$ to $Q_9$, $Q_{11}$ to $Q_{19}$, $Q_{21}$ to $Q_{29}$, and $Q_{31}$ to $Q_{39}$, which are used herein, may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

The expressions * and *' used herein each indicate a binding site to a neighboring atom, unless otherwise stated.

The term "room temperature" used herein refers to a temperature of about 25° C.

Hereinafter, a compound and an organic light-emitting device according to embodiments are described in detail with reference to Synthesis Example and Examples. However, the organic light-emitting device is not limited thereto.

EXAMPLES

Compound Synthesis Example

Synthesis Example 1: Synthesis of Compound A

Compound A was synthesized according to the following reaction scheme.

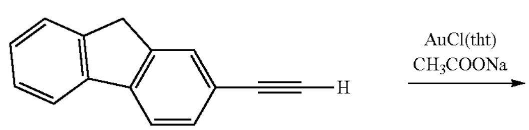

Ligand L

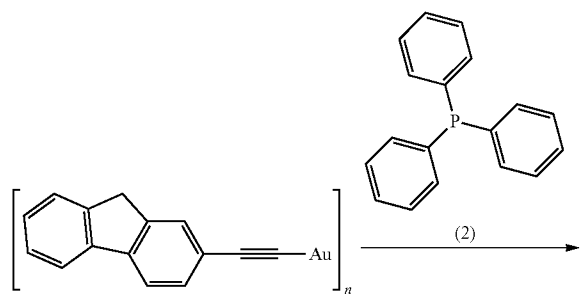

(1)

-continued

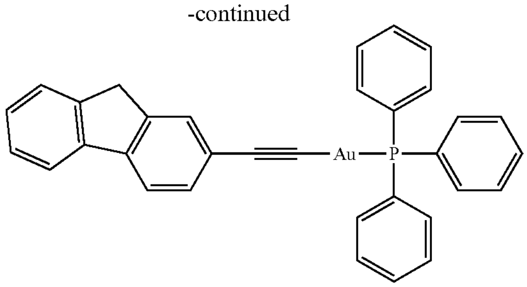

Compound A

Synthesis of Intermediate (1)

100 milligrams (mg) (0.53 millimoles (mmol)) of 2-ethynylfluorene (ligand L) was dissolved in 10 milliliters (mL) of a mixed solution containing tetrahydrofuran (THF) and methanol (MeOH) in a volume ratio of 1:1, and 169 mg (0.53 mmol) of chloro(tetrahydrothiophene)gold(I)(AuCl (tht)) and 86.2 mg (1.1 mmol) of sodium acetate were added thereto. When a brown precipitate was formed, the mixture was stirred for an hour. When the reaction was complete, a formed solid was subjected to filtration and separation to thereby obtain 167 mg (yield of 82%) of Intermediate (1). ATR-FTIR ($cm^{-1}$): 1446 (C═C), 1997 (C≡C).

Synthesis of Compound A 13.5 mg (0.052 mmol) of triphenylphosphine was dissolved in 10 mL of dichloromethane (DCM), and 20 mg (0.052 mmol) of Intermediate (1) was added thereto. The mixture was stirred for an hour. When the reaction is complete, a solution was concentrated to reduce the volume to about half, n-hexane was added thereto to form a precipitate. A formed solid was subjected to filtration and separation and then recrystallized in a DCM/n-hexane condition, to thereby obtain 23.5 mg (yield of 70%) of Compound A.

Proton nuclear magnetic resonance spectroscopy ($^1$H NMR) (400 megahertz (MHz), $CDCl_3$): Chemical shift (δ) (parts per million, (ppm)): 3.86 (s, 2H, $H_2$), 7.27 (t, J=7.5 Hz, 1H, $H_4$), 7.35 (t, J=7.4 Hz, 1H, $H_5$), 7.42-7.62 (m, 17H, $H_3$+$H_7$+Ph), 7.67 (d, J=8.2 Hz, 1H, $H_8$), 7.69 (s, 1H, $H_1$), 7.73 (d, J=7.3 Hz, 1H, He). $^{31}$p{$^1$H} NMR (161.9 MHz, $CDCl_3$, ppm): δ 42.4 (s). Matrix asssiste laser desorption ionization time of flight mas spectrometry (MALDI-TOF MS) (+) m/z 648.0 ([M]+, calcd. 648.1).

Synthesis Example 2: Synthesis of Compound B

Compound B was synthesized according to the following reaction scheme.

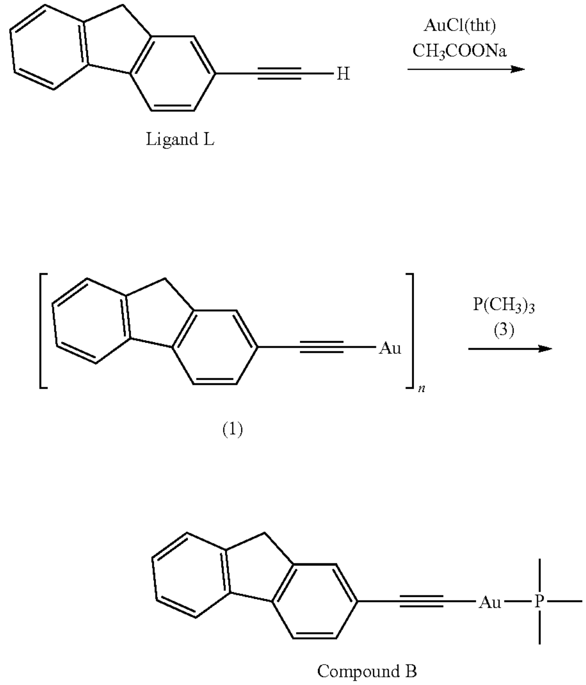

Synthesis of Compound B 16.8 mg (yield of 73%) of Compound B was obtained using the method used in the synthesis of Compound A, except that 52 microliters (μL) (1 mole per liter (molar, M) solution in THF, 0.052 mmol) of trimethylphosphine was used instead of triphenylphosphine.

$^1$H NMR (400 MHz, $CDCl_3$): δ (ppm): 1.60 (d, J=10.4 Hz, 9H, P—$CH_3$), 3.87 (s, 2H, $H_2$), 7.28 (td, J=7.4, 1.2 Hz, 1H, $H_4$), 7.32-7.39 (m, 2H, $H_5$+$H_7$), 7.5 (s, 1H, $H_1$), 7.55 (dt, J=7.5, 1.0 Hz, 1H, $H_3$), 7.73 (dd, J=7.9, 0.7 Hz, $H_8$), 7.81 (dd, J=7.6, 1.2 Hz, 1H, $H_6$) $^{31}$P{$^1$H} NMR (161.9 MHz, $CDCl_3$, ppm): δ 1.8 (s). MALDI-TOF MS(+) m/z 462.0 ($[M]^+$, calcd. 462.0).

Synthesis Example 3: Synthesis of Compound 1

Compound 1 was synthesized according to the following reaction scheme.

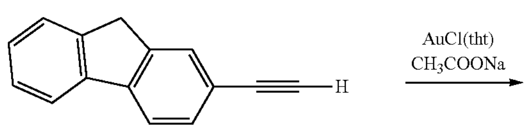

Ligand L

-continued

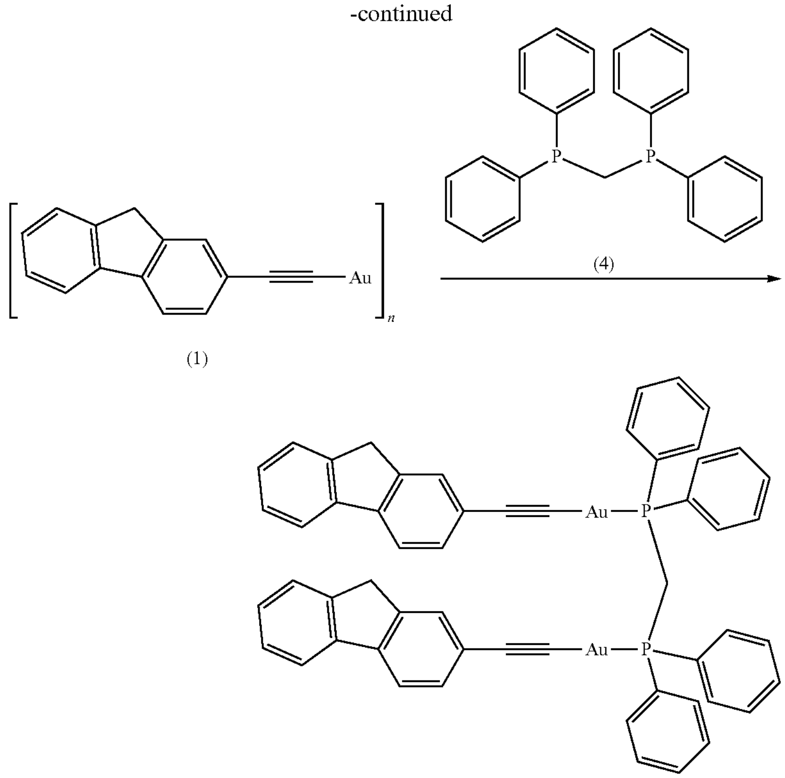

(1)

Compound 1

Synthesis of Compound 1

18.6 mg (yield of 62%) of Compound 1 was obtained using the method used in the synthesis of Compound A, except that 10.0 mg (0.026 mmol) of bis(diphenylphosphino)methane was used instead of triphenylphosphine.

$^{1}$H NMR (400 MHz, $CDCl_3$): δ 3.47 (s, 4H, $H_2$), 3.54 (t, J=10.8 Hz, 2H, Hg), 7.12 (t, J=7.3 Hz, 2H, $H_4$), 7.21 (d, J=6.96 Hz, 2H, $H_7$), 7.28 (t, J=7.1 Hz, 2H, $H_5$), 7.35 (d, J=7.7 Hz, 2H, $H_3$), 7.43 (s, 2H, $H_1$), 7.50-7.65 (m, 24H, $H_6$+$H_8$+Ph). $^{31}P\{^{1}H\}$ NMR (161.9 MHz, $CDCl_3$, ppm): δ 31.7 (s). MALDI-TOF MS(+) m/z 1156.1 ($[M]^+$, calcd. 1156.2).

Synthesis Example 4: Synthesis of Compound 31

Compound 31 was synthesized according to the following reaction scheme.

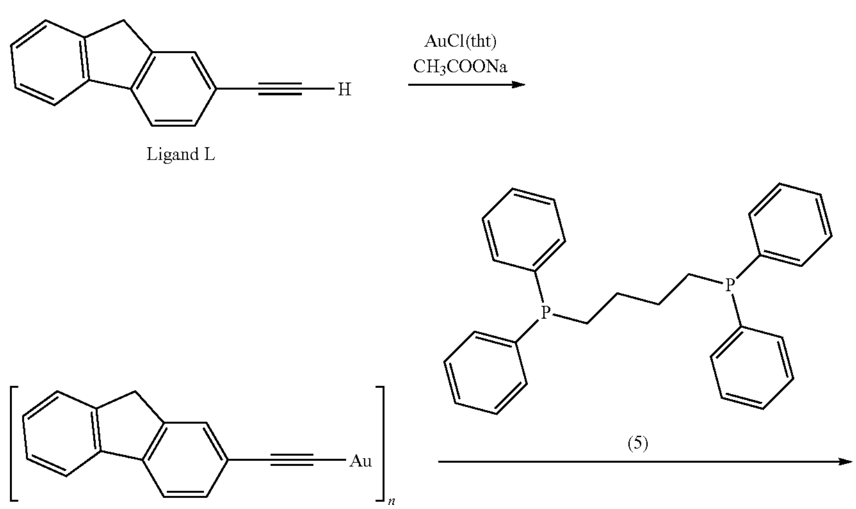

Ligand L (1)

-continued

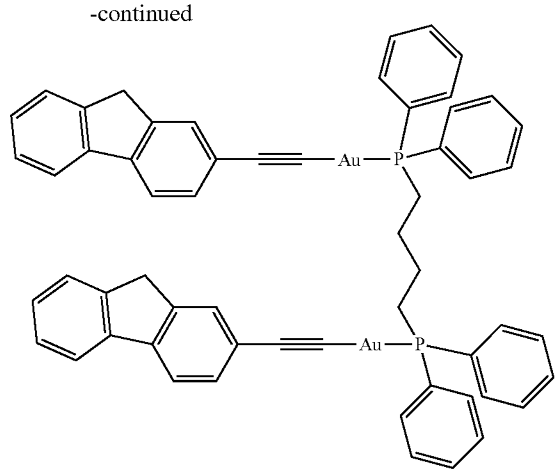

Compound 31

Synthesis of Compound 31

18.7 mg (yield of 60%) of Compound 31 was obtained using the method used in the synthesis of Compound A, except that 11.1 mg (0.026 mmol) of 1,4-bis(diphenylphosphino)butane was used instead of triphenylphosphine.

$^{1}H$ NMR (400 MHz, $CDCl_3$): δ 1.68-1.78 (m, 4H, $H_{10}$), 2.30-2.40 (m, 4H, $H_9$), 3.79 (s, 4H, $H_2$), 7.20 (td, J=7.5, 1.2 Hz, 2H, $H_4$), 7.29 (t, J=7.5 Hz, 2H, $H_5$), 7.56-7.69 (m, 30H, $H_1+H_3+H_6+H_7+H_8$+Ph). $^{31}P\{^{1}H\}$ NMR (161.9 MHz, $CDCl_3$, ppm): δ 37.3 (s). MALDI-TOF MS(+) m/z 1198.3 ($[M]^+$, calcd. 1198.2).

Evaluation Example

Evaluation Example 1: Evaluation of Optical Characteristics in Solution (1) Preparation Example 1: Preparation of Acetonitrile Solution Sample Ligand L and Compounds A, B, 1, and 31 were each dissolved in an acetonitrile solvent at a concentration of $1.0\times10^{-6}$ M to thereby prepare acetonitrile solution samples.

The following measurements were made at room temperature (about 25° C.).

Measurement of Absorption Spectrum

Figure 2:
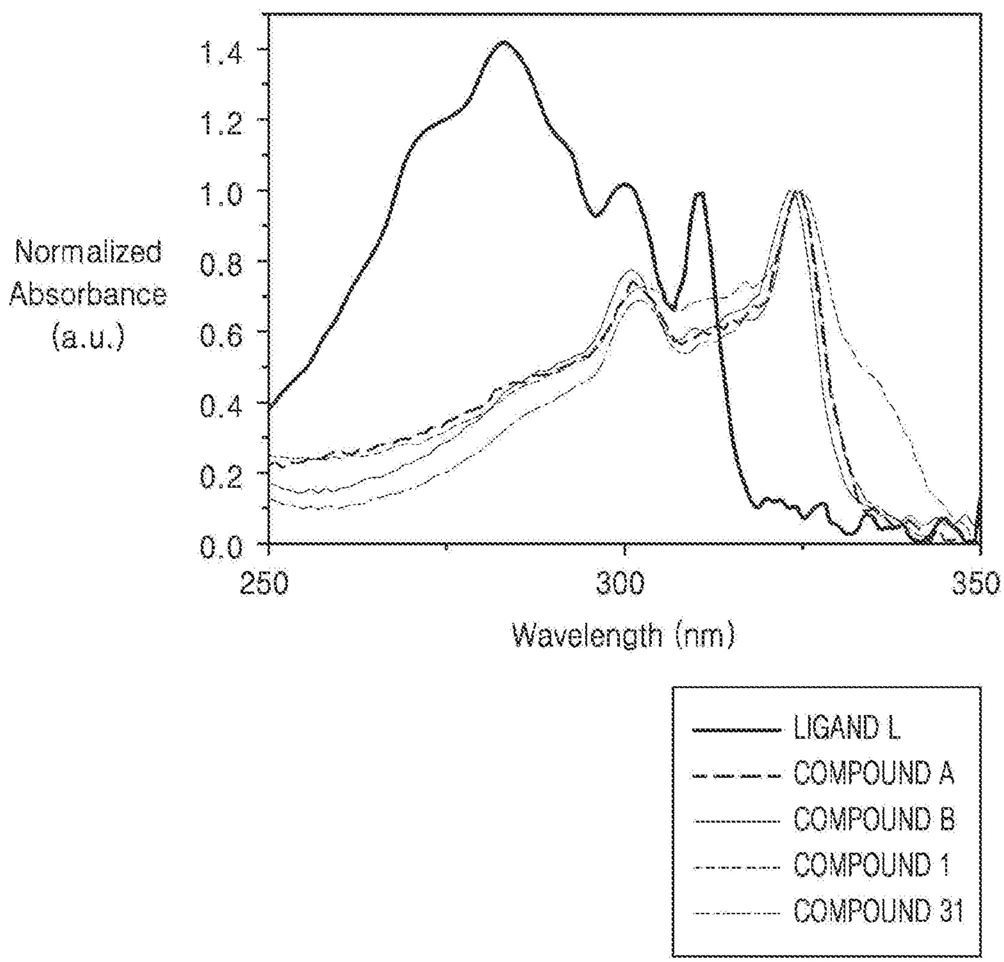
FIG. 2 are graphs of normalized absorption (arbitrary units, A.U.) versus wavelength (nanometers, nm) and show normalized absorption spectra of samples of acetonitrile solutions prepared in Preparation Example 1.

The prepared acetonitrile solution samples were each mounted on a UV-Vis spectrometer and absorbance was measured with respect to a wavelength range of 250 nm to 350 nm, and a normalized absorption spectrum is shown in FIG. 2.

Figure 3:
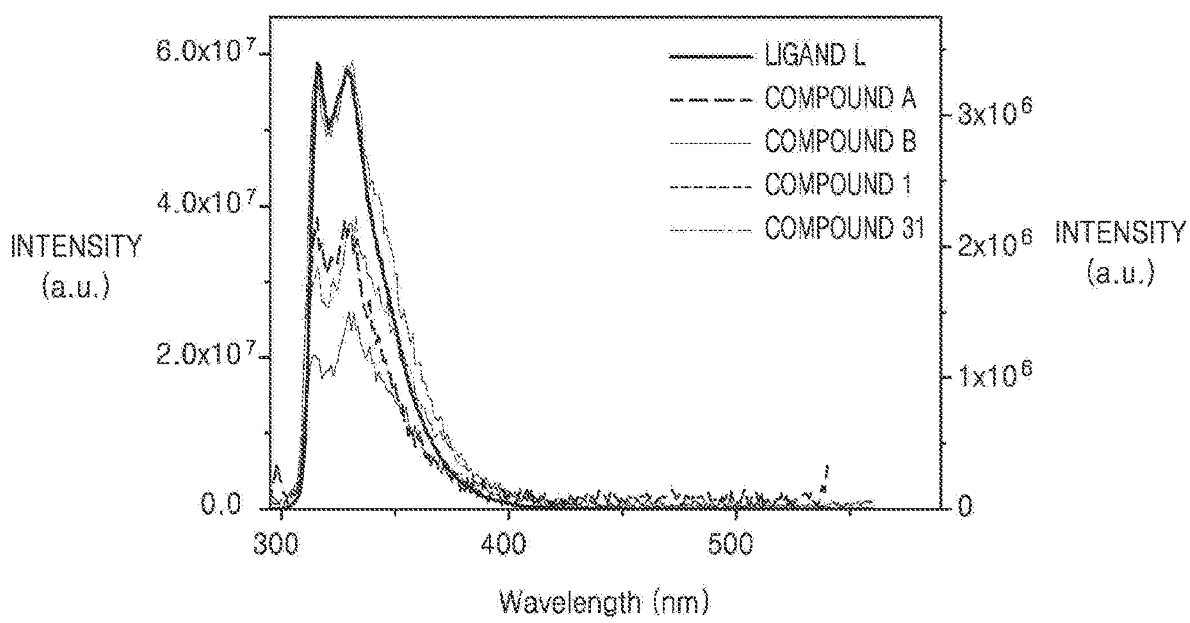
FIG. 3 are graphs of intensity (A.U.) versus wavelength (nm) and show normalized photoluminescence (PL) spectra of samples of acetonitrile solutions prepared in Preparation Example 1 in the presence of oxygen.

Measurement of Photoluminescence (PL) Spectrum (1) Measurement of Fluorescence Emission Wavelength A PL spectrum of each acetonitrile solution sample was measured by irradiating excitation light having an excitation wavelength ($\lambda_{exc}$) of 283 nm in the presence of oxygen, by using a PL measuring device. The normalized PL spectrum is shown in FIG. 3. In FIG. 3, left intensity (arbitrary units, A.U.) of a y-axis refers to emission intensity of Ligand L, and right intensity (arbitrary units, A.U.) of a y-axis refers to emission intensity of Compounds A, B, 1, and 31. In FIG. 3, although shapes of luminescence spectra of Ligand L and Compounds A, B, 1, and 31 are similar, Complexes A, B, 1, and 31 to which a metal is bound may have decreased fluorescence emission intensity. The fluorescence emission wavelength was determined from a wavelength value of a maximum emission peak of the normalized PL spectrum.

(2) Measurement of Phosphorescence Emission Wavelength

Figure 4:
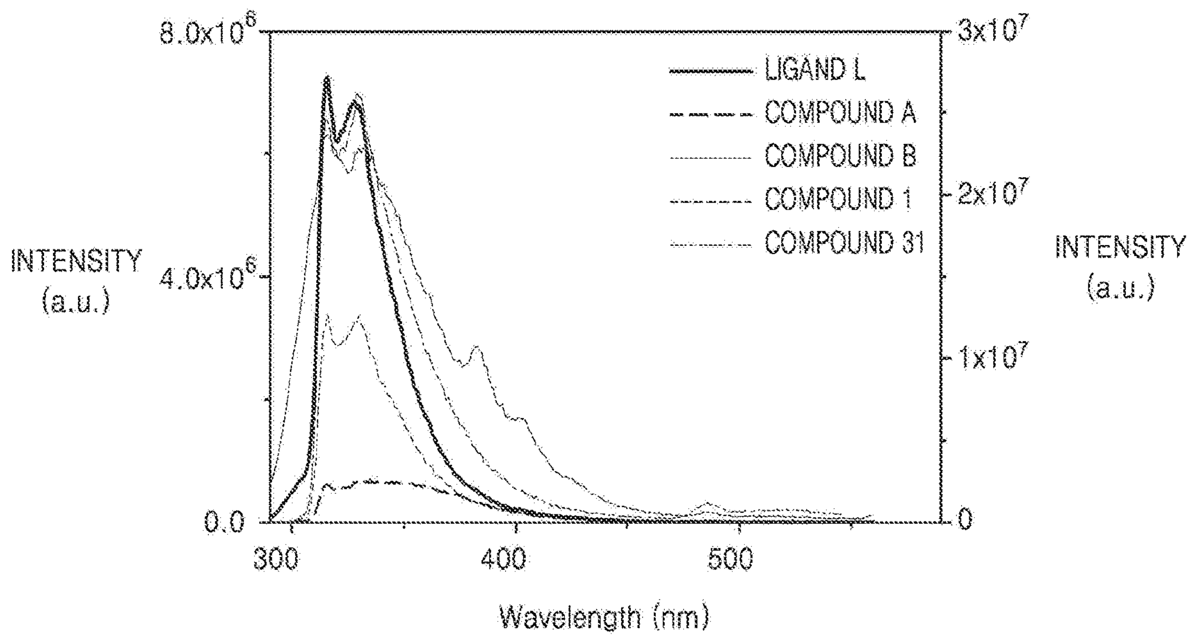
FIG. 4 are graphs of intensity (A.U.) versus wavelength (nm) and show normalized PL spectra of samples of acetonitrile solution prepared in Preparation Example 1 in the absence of oxygen.
Figure 5:
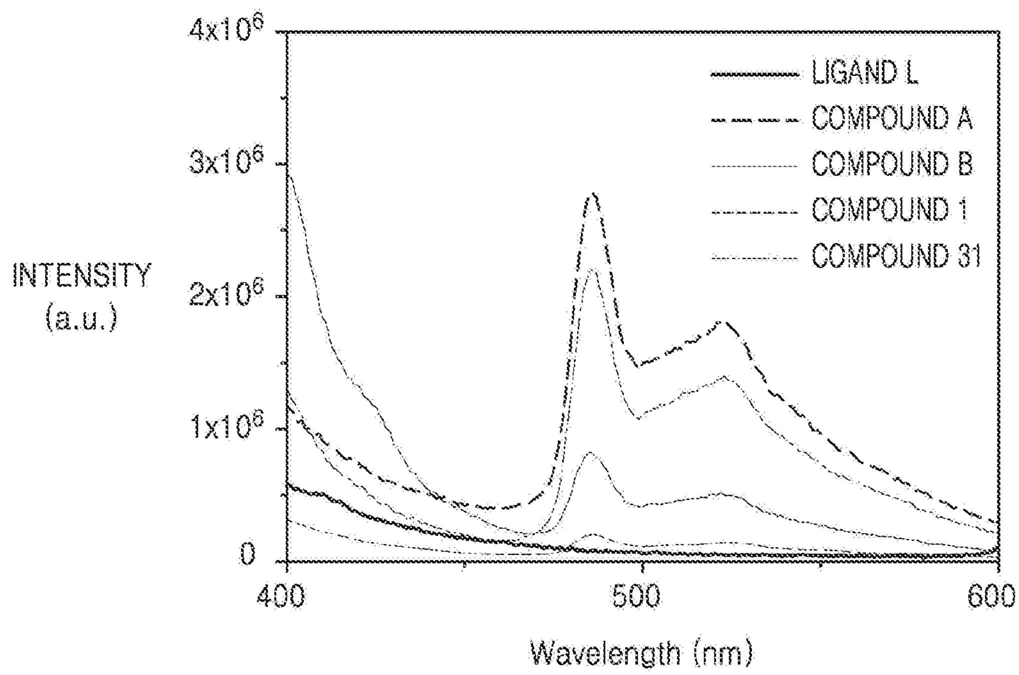
FIG. 5 are enlarged graphs of intensity (A.U.) versus wavelength (nm) and show a range of 400 nm to 60 nm of the PL spectra illustrated in FIG. 4.

After removal of oxygen according to a bubbling method in which a long injection needle is used to inject, for 10 minutes, dried nitrogen gas into an acetonitrile solution prepared for measurement, a PL spectrum of each acetonitrile solution sample was measured by irradiating excitation light having an excitation wavelength ($\lambda_{exc}$) of 325 nm under a condition in which oxygen is substantially not present. A normalized PL spectrum is shown in FIG. 4, and a range of 400 nm to 60 nm of the normalized PL spectrum is enlarged and shown in FIG. 5. In FIG. 4, left intensity (arbitrary units, A.U.) of a y-axis refers to emission intensity of Ligand L, and right intensity (arbitrary units, A.U.) of a y-axis refers to emission intensity of Compounds A, B, 1, and 31.

The normalized PL spectrum illustrated in FIG. 4 has a peak having a weak intensity in the vicinity of a wavelength of about 480 nm. Compounds A, B, 1, and 31 are interpreted to have a weak phosphorescence emission peak because phosphorescence emission intensity becomes strong under low oxygen concentration, for example, a substantially oxygen-free condition, or for example, an oxygen-free condition. The phosphorescence emission peak was determined from a wavelength value of a maximum emission peak of the PL spectrum illustrated in FIG. 5.

The maximum absorption wavelength, the molar extinction coefficient (E), the fluorescence emission wavelength, and the phosphorescence emission wavelength, which are determined from the normalized absorption spectrum and the normalized PL spectrum, are shown in Table 1.

TABLE 1

| Compound No. | Maximum absorption wavelength (nm) ($\varepsilon(10^4 M^{-1}\cdot cm^{-1})$) | Fluorescence emission wavelength (nm) ($\lambda_{exc}$ = 283 nm) | Phosphorescence emission wavelength (nm) ($\lambda_{exc}$ = 325 nm) |
|---|---|---|---|
| Ligand L | 311 (2.32), 300 (2.37), 283 (3.28) | 315, 328 | — |
| Compound A | 325 (6.70), 302 (5.64) | 315, 330 | 486, 523 |
| Compound B | 325 (6.70), 302 (5.64) | 315, 330 | 486, 523 |
| Compound 1 | 325 (8.94), 304 (6.47) | 315, 330 | 486, 523 |
| Compound 31 | 325 (11.09), 303 (7.65) | 315, 330 | 486, 523 |

TABLE 1-continued

| Compound No. | Maximum absorption wavelength (nm) ($\varepsilon(10^4 M^{-1} \cdot cm^{-1})$) | Fluorescence emission wavelength (nm) ($\lambda_{exc}$ = 283 nm) | Phosphorescence emission wavelength (nm) ($\lambda_{exc}$ = 325 nm) |
|---|---|---|---|

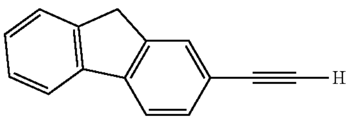

Ligand L

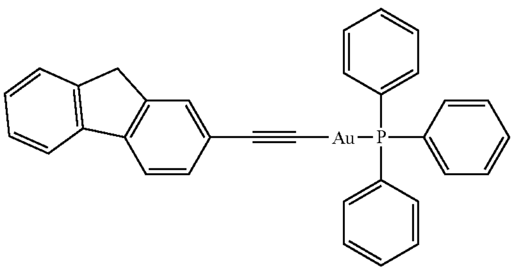

Compound A

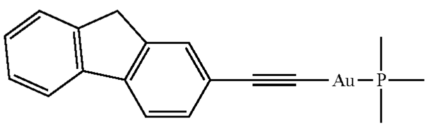

Compound B

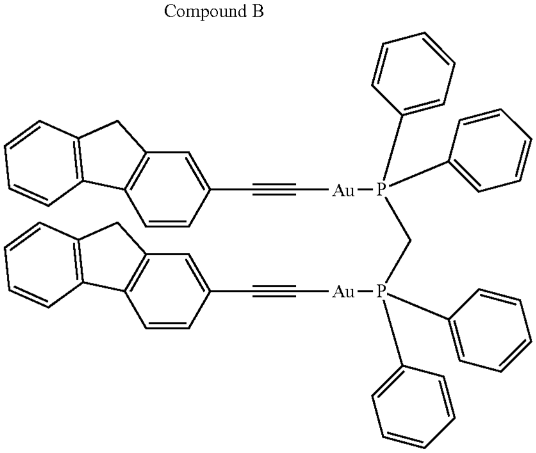

Compound 1

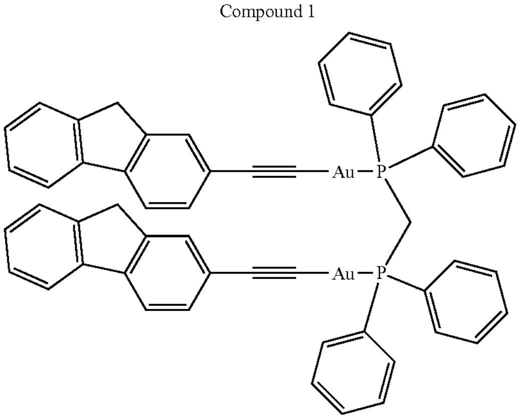

Compound 31

From Table 1, it was confirmed that Ligand L does not have phosphorescence emission characteristics, whereas Compounds A, B, 1, and 31 have phosphorescence emission characteristics at room temperature.

Evaluation Example 2: Measurement of Absolute Quantum Efficiency

With respect to each of the acetonitrile solution samples, the fluorescence quantum efficiency ($\Phi_{Fl}$) and the phosphorescence quantum efficiency ($\Phi_{Ph}$) under ambient atmosphere; and the fluorescence quantum efficiency and the phosphorescence quantum efficiency under nitrogen atmosphere were measured for each sample, and the results are shown in Table 2.

TABLE 2

| | Ambient atmosphere | | Nitrogen atmosphere | |
|---|---|---|---|---|
| Sample | $\Phi_{Fl}$ | $\Phi_{Ph}$ | $\Phi_{Fl}$ | $\Phi_{Ph}$ |
| Ligand L | 0.63 | 0 | 0.763 | 0 |
| Compound A | 0.021 | 0 | 0.021 | 0.019 |
| Compound B | 0.007 | 0.004 | 0.007 | 0.016 |
| Compound 1 | 0.005 | 0.001 | 0.005 | 0.043 |
| Compound 31 | 0.006 | 0.004 | 0.006 | 0.039 |

Evaluation Example 3: Evaluation of Optical Characteristics in Polymer Matrix (1) Preparation Example 2: Preparation of Polymethyl Methacrylate (PMMA) Thin Film Samples 200 mg/mL of PMMA was dissolved in 10 mL of chloroform to prepare a first solution, and 200 μg/mL of each of Ligand L and Compounds A, B, 1, and 31 were dissolved in 10 mL of chloroform to prepare a second solution.

1 mL of the first solution and 1 mL of the second solution were taken and mixed to prepare a polymer solution. The polymer solution was applied on a quartz substrate in a drop cast method and then a solvent was volatilized at room temperature to form a PMMA thin film, thereby preparing of a PMMA thin film sample.

(2) Preparation Example 3: Preparation of Cycloolefin Thin Film Sample

A cycloolefin thin film sample was prepared in the same manner as in Preparation Example 2, except that a cycloolefin resin (obtained as ZEONEX 480 from Nippon Zeon Co., Ltd.) was used instead of PMMA, and a second solution in which 100 μg/mL of each of Ligand L and Compounds A, B, 1, and 31 were dissolved was used.

Figure 6:
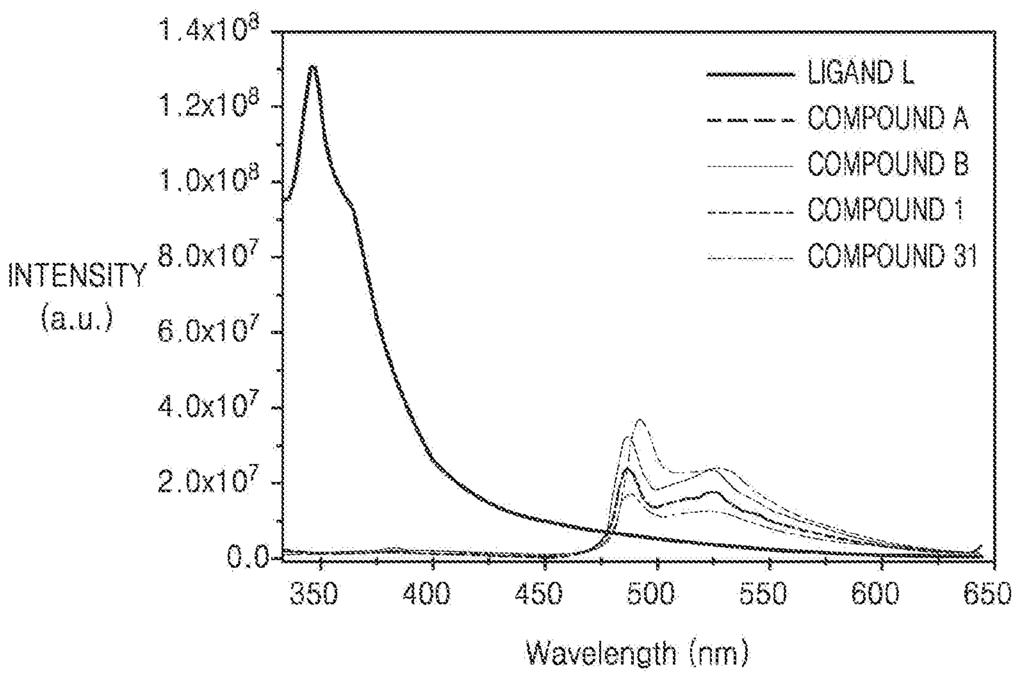
FIG. 6 are graphs of intensity (A.U.) versus wavelength (nm) and show PL spectra of samples of polymethyl methacrylate (PMMA) thin films prepared in Preparation Example 2.
Figure 7:
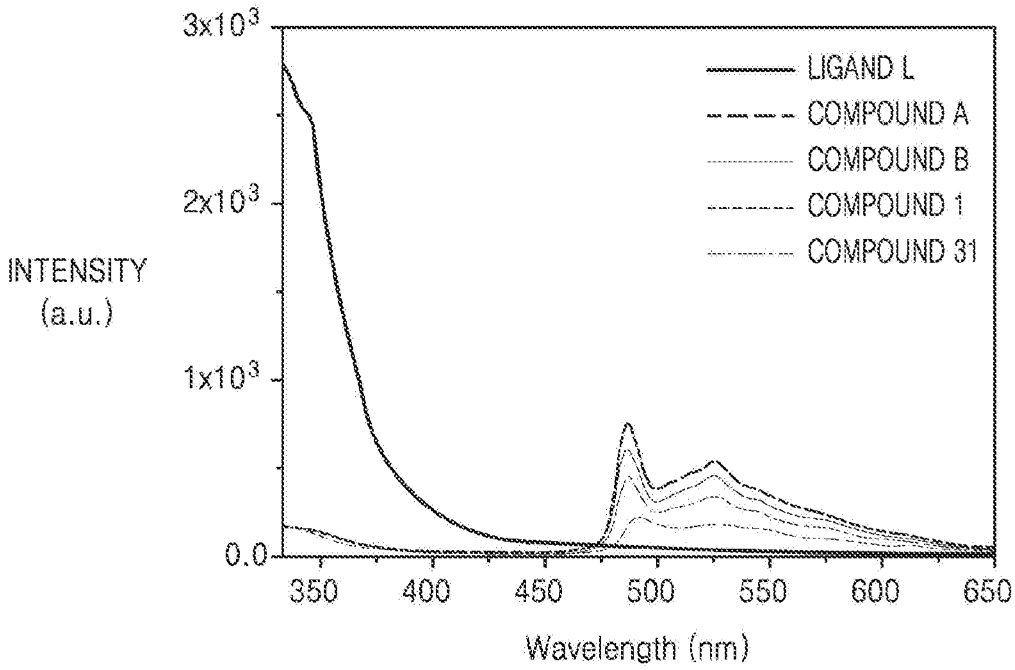
FIG. 7 are graphs of intensity (A.U.) versus wavelength (nm) and show PL spectra of samples of cycloolefin thin films prepared in Preparation Example 3.

The PL spectrum of the PMMA thin film sample measured by the PL measuring device and a PL spectrum of the cycloolefin thin film sample measured by the PL measuring device are shown in FIG. 6 and FIG. 7, respectively. When the PL was measured, the excitation wavelength ($\lambda_{exc}$) was 325 nm.

From FIGS. 6 and 7, it was confirmed that although a free ligand L exhibits fluorescence emission in a wavelength of about 350 nm, Compounds A, B, 1, and 31 complexed with gold atoms exhibit disappearance of fluorescence emission and appearance of fluorescence emission in a wavelength of about 475 nm and about 550 nm.

When a polymer matrix such as PMMA and cycloolefin are utilized, a non-luminescence path may be minimized due to an increase in a distance between sample molecules, and thus phosphorescence emission characteristics may be clearly confirmed during PL measurement.

Evaluation Example 4: Measurement of Phosphorescence Quantum Efficiency

With respect to the PMMA thin film sample and cycloolefin thin film sample, phosphorescence quantum efficiency was measured under an oxygen-free condition for each sample, and the results are shown in Table 3.

TABLE 3

| Sample | PMMA | Cycloolefin resin |
|---|---|---|
| Ligand L | 0.00 | 0.00 |
| Compound A | 0.24 | 0.23 |
| Compound B | 0.25 | 0.23 |
| Compound 1 | 0.27 | 0.09 |
| Compound 31 | 0.25 | 0.17 |

Ligand L does not emit phosphorescent light at room temperature, whereas complexes, Compounds A, B, 1, and 31, exhibit a photoluminescence quantum yield (PLQY) of about 24% to 30% in a PMMA matrix and a PLQY of about 10% to 25% in a cycloolefin matrix. In one or more embodiments, Compounds 1 and 31 of the present invention emit strong room-temperature phosphorescent light having a PLQY of about 25% to about 27% in a PMMA matrix and a PLQY of about 10% to about 20% in a cycloolefin matrix.

The organometallic compound may have a pincer or closed-ring structure including a heavy atom and may emit phosphorescent light at room temperature due to photoluminescence, and thus may be applied to an organic light-emitting device or an image sensor. Also, because the organometallic compound has excellent room-temperature phosphorescence emission characteristics, a diagnostic composition having high diagnostic efficiency may be provided using the organometallic compound and the organometallic compound may be used for a therapy using light.

It should be understood that the exemplary embodiments described herein should be considered in a descriptive sense and not for purposes of limitation. Descriptions of features or aspects within each exemplary embodiment should typically be considered as available for other similar features or aspects in other exemplary embodiments. While one or more exemplary embodiments have been described with reference to the drawings, it will be understood by those of ordinary skill in the art that various changes in form and details may be made herein without departing from the spirit and scope as defined by the following claims.

What is claimed is:

1. An organometallic compound represented by Formula 1:

Formula 1

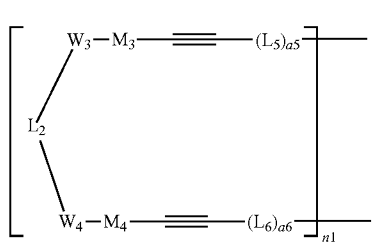

-continued

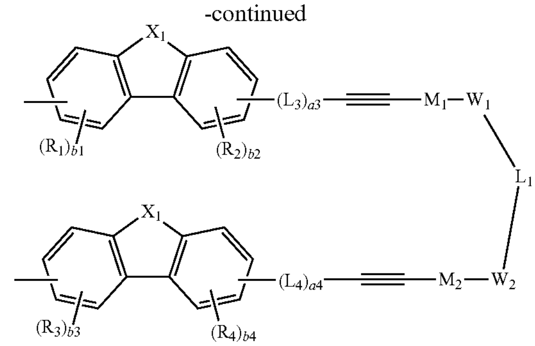

wherein, in Formula 1, $M_1$ to $M_4$ are each independently a first-row transition metal of the Periodic Table of Elements, a second-row transition metal of the Periodic Table of Elements, or a third-row transition metal of the Periodic Table of Elements, $X_1$ and $X_2$ are each independently $C(R_5)(R_6)$, $Si(R_5)(R_6)$, $N(R_5)$, O, S, Se, or Te, $W_1$ to $W_4$ are each independently $N(R_7)(R_8)$, $P(R_7)(R_8)$, $S(R_7)$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, $L_1$ to $L_6$ are each independently a $C_1$-$C_{30}$ alkylene group unsubstituted or substituted with at least one $R_{10a}$, a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, a3 to a6 are each independently an integer from 0 to 3, $R_1$ to $R_8$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_1$-$C_{10}$ heteroaryl group unsubstituted or substituted with at least one $R_{10a}$, a $C_1$-$C_{10}$ heteroaryloxy group unsubstituted or substituted with at least one $R_{10a}$, a $C_1$-$C_{60}$ heteroarylthio group unsubstituted or substituted with at least one $R_{10a}$, a $C_2$-$C_{60}$ heteroarylalkyl group unsubstituted or substituted with at least one $R_{10a}$, a $C_2$-$C_{60}$ alkylheteroaryl group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —$Si(Q_1)(Q_2)(Q_3)$, —$Ge(Q_1)(Q_2)(Q_3)$, —$N(Q_4)(Q_5)$, —$B(Q_6)(Q_7)$, —$P(=O)(Q_8)(Q_9)$, or —$P(Q_8)(Q_9)$, $R_7$ and $R_8$ are optionally connected to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, b1 and b3 are each independently an integer from 1 to 4, b2 and b4 are each independently an integer from 1 to 3, n1 is 0 or 1, provided that when n1 is 0, a group represented by:

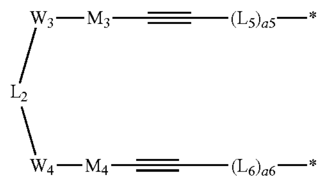

is not present, and $R_{10a}$ is:

deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$Si(Q_{11})(Q_{12})(Q_{13})$, —$Ge(Q_{11})(Q_{12})(Q_{13})$, —$N(Q_{14})(Q_{15})$, —$B(Q_{16})(Q_{17})$, —$P(=O)(Q_{18})(Q_{19})$, or —$P(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_0$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each substituted with at least one of deuterium, —$CD_3$, —$CD_2H$, —$CDH_2$, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{10}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$Si(Q_{21})(Q_{22})(Q_{23})$, —$Ge(Q_{21})(Q_{22})(Q_{23})$, —$N(Q_{24})(Q_{25})$, —$B(Q_{26})(Q_{27})$, —$P(=O)(Q_{28})(Q_{29})$, or —$P(Q_{28})(Q_{29})$; or —$Si(Q_{31})(Q_{32})(Q_{33})$, —$Ge(Q_{31})(Q_{32})(Q_{33})$, —$N(Q_{34})(Q_{35})$, —$B(Q_{36})(Q_{37})$, —$P(=O)(Q_{38})(Q_{39})$, or —$P(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{60}$ alkenyl group, a $C_2$-$C_{60}$ alkynyl group, a $C_1$-$C_{10}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{10}$ heteroaryl group, a monovalent non-aromatic condensed polycyclic group, or a monovalent non-aromatic condensed heteropolycyclic group.

2. The organometallic compound of claim 1, wherein $M_1$ to $M_4$ are each independently copper (Cu), silver (Ag), or gold (Au).

3. The organometallic compound of claim 1, wherein $W_1$ to $W_4$ are each independently $N(R_7)(R_8)$, $P(R_7)(R_8)$, $S(R_7)$, or a group represented by one of Formulae 2-1 to 2-7:

2-1

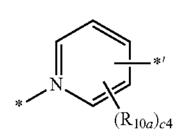

2-2

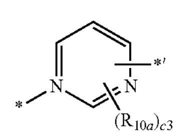

-continued 2-3

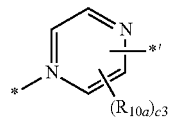

2-4

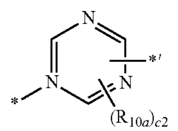

2-5

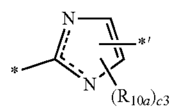

2-6

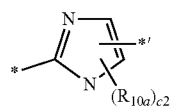

2-7

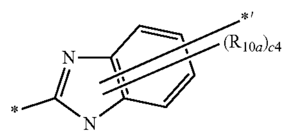

wherein, in Formulae 2-1 to 2-7, $R_{10a}$ is the same as described in claim 1, c2 is 1 or 2, c3 is 1, 2, or 3, c4 is 1, 2, 3, or 4,

* indicates a binding site to $M_1$, $M_2$, $M_3$, or $M_4$, and

*' indicates a binding site to $L_1$ or $L_2$.

4. The organometallic compound of claim 1, wherein $W_1$ to $W_4$ are each independently $N(R_7)(R_8)$, $P(R_7)(R_8)$, $S(R_7)$, or a group represented by one of Formulae 2-11 to 2-18:

2-11

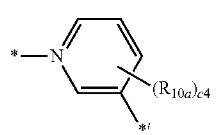

2-12

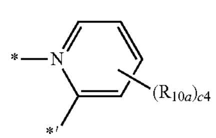

2-13

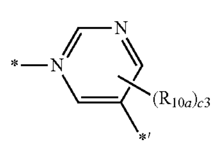

2-14

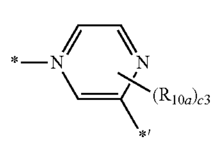

-continued 2-15

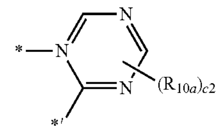

2-16

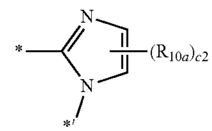

2-17

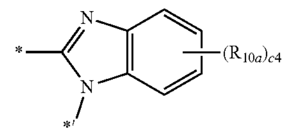

2-18

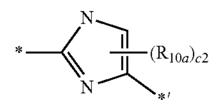

wherein, in Formulae 2-11 to 2-18, $R_{10a}$ is the same as described in claim 1, c2 is 1 or 2, c3 is 1, 2, or 3, c4 is 1, 2, 3, or 4,

* indicates a binding site to $M_1$, $M_2$, $M_3$, or $M_4$, and

*' indicates a binding site to $L_1$ or $L_2$.

5. The organometallic compound of claim 1, wherein Li and $L_2$ are each independently a group represented by Formula 3-1 or 3-2:

3-1

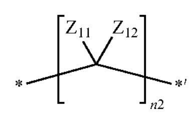

3-2

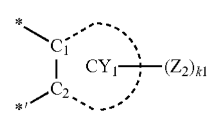

wherein, in Formulae 3-1 and 3-2, $C_1$ and $C_2$ each indicate a carbon atom, a bond between $C_1$ and $C_2$ is a single bond or a double bond, $CY_1$ is a $C_5$-$C_{30}$ carbocyclic group, or a $C_1$-$C_{30}$ heterocyclic group, $Z_{11}$, $Z_{12}$, and $Z_2$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$Si(Q_1)(Q_2)(Q_3)$, —$Ge(Q_1)(Q_2)(Q_3)$, —$N(Q_4)(Q_5)$, —$B(Q_6)(Q_7)$, —$P(=O)(Q_8)(Q_9)$, or —$P(Q_8)(Q_9)$, $Z_{11}$ and $Z_{12}$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is the same as described in claim 1, n2 is an integer from 1 to 10, k1 is an integer from 1 to 10, $Q_1$ to $Q_9$ are the same as described in claim 1, and

* and *' each indicate a binding site to a neighboring atom.

6. The organometallic compound of claim 5, wherein in Formulae 3-1 and 3-2, $Z_{11}$, $Z_{12}$, and $Z_2$ are each independently:

hydrogen, deuterium, —F, —Cl, —Br, —I, a hydroxyl group, a cyano group, a nitro group, an amino group, a $C_1$-$C_{20}$ alkyl group, or a $C_1$-$C_{20}$ alkoxy group; or a $C_1$-$C_{20}$ alkyl group, or a $C_1$-$C_{20}$ alkoxy group, each substituted with one or more of deuterium, —F, —Cl, —Br, —I, a hydroxyl group, a cyano group, a nitro group, or an amino group.

7. The organometallic compound of claim 5, wherein, in Formulae 3-1 and 3-2, $Z_{11}$, $Z_{12}$, and $Z_2$ are each independently:

hydrogen, deuterium, —F, —Cl, —Br, —I, a hydroxyl group, a cyano group, a nitro group, an amino group, a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, a 3-pentyl group, or a sec-isopentyl group; or a methyl group, an ethyl group, an n-propyl group, an isopropyl group, an n-butyl group, an isobutyl group, a sec-butyl group, a tert-butyl group, an n-pentyl group, a tert-pentyl group, a neo-pentyl group, an isopentyl group, a sec-pentyl group, a 3-pentyl group, or a sec-isopentyl group, each substituted with one or more of deuterium, —F, —Cl, —Br, —I, a hydroxyl group, a cyano group, a nitro group, or an amino group.

8. The organometallic compound of claim 1, wherein $L_1$ and $L_2$ are each independently a group represented by one of Formulae 3-11 to 3-22:

3-11

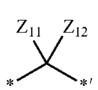

3-12

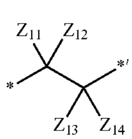

3-13

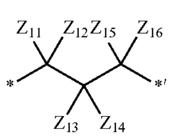

-continued 3-14

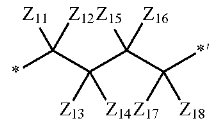

3-15

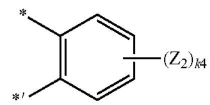

3-16

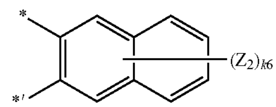

3-17

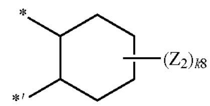

3-18

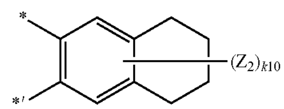

3-19

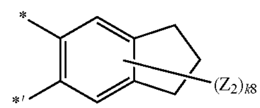

3-20

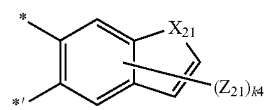

3-21

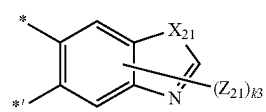

3-22

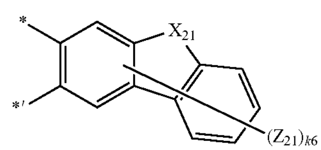

wherein, in Formulae 3-11 to 3-22, $X_{21}$ is $C(Z_{22})(Z_{23})$, $Si(Z_{22})(Z_{23})$, $N(Z_{22})$, O, S, or Se, $Z_{11}$ to $Z_{18}$, $Z_2$, and $Z_{21}$ to $Z_{23}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$Si(Q_1)(Q_2)(Q_3)$, —$Ge(Q_1)(Q_2)(Q_3)$, —$N(Q_4)(Q_5)$, —$B(Q_6)(Q_7)$, $P(=O)(Q_8)(Q_9)$, or —$P(Q_8)(Q_9)$, k3 is an integer from 1 to 3, k4 is an integer from 1 to 4, k6 is an integer from 1 to 6, k8 is an integer from 1 to 8, k10 is an integer from 1 to 10, $Q_1$ to $Q_9$ are the same as described in claim 1, and

* and *' each indicate a binding site to a neighboring atom.

9. The organometallic compound of claim 1, wherein a3 to a6 are each 0.

10. The organometallic compound of claim 1, wherein $R_1$ to $R_8$ are each independently:

hydrogen, deuterium, —F, —Cl, —Br, —I, a hydroxyl group, a cyano group, a nitro group, or an amino group;

a $C_1$-$C_{60}$ alkyl group and a $C_1$-$C_{60}$ alkoxy group, each unsubstituted or substituted with one or more of deuterium, —F, —Cl, —Br, —I, a hydroxyl group, a cyano group, a nitro group, or an amino group;

a cyclopentyl group, a cyclohexyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridimidinyl group, an imidazopyridinyl group, a pyridoindolyl group, a benzofuropyridinyl group, a benzothienopyridinyl group, a pyrimidoindolyl group, a benzofuropyrimidinyl group, a benzothienopyrimidinyl group, a phenoxazinyl group, a pyridobenzoxazinyl group, or a pyridobenzothiazinyl group, each unsubstituted or substituted with one or more of deuterium, —F, —Cl, —Br, —I, a hydroxyl group, a cyano group, a nitro group, an amino group, a $C_1$-$C_{60}$ alkyl group, a $C_1$-$C_{60}$ alkoxy group, a cyclopentyl group, a cyclohexyl group, a cyclopentenyl group, a cyclohexenyl group, a cycloheptenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridimidinyl group, an imidazopyridinyl group, a pyridoindolyl group, a benzofuropyridinyl group, a benzothienopyridinyl group, a pyrimidoindolyl group, a benzofuropyrimidinyl group, a benzothienopyrimidinyl group, a phenoxazinyl group, a pyridobenzoxazinyl group, or a pyridobenzothiazinyl group; or —$Si(Q_1)(Q_2)(Q_3)$, —$N(Q_4)(Q_5)$, or —$B(Q_6)(Q_7)$, wherein $Q_1$ to $Q_7$ are each independently hydrogen, deuterium, a $C_1$-$C_{10}$ alkyl group, a phenyl group, a biphenyl group, a naphthyl group, a fluorenyl group, a carbazolyl group, a dibenzofuranyl group, a dibenzothiophenyl group, a pyridinyl group, a pyrimidinyl group, a pyrazinyl group, or a triazinyl group.

11. The organometallic compound of claim 1, wherein $W_1$ to $W_4$ are each independently $P(R_7)(R_8)$, and $R_7$ and $R_8$ are each independently a phenyl group unsubstituted or substituted with one or more of deuterium, —F, —Cl, —Br, —I, a hydroxyl group, a cyano group, a nitro group, an amino group, a $C_1$-$C_{20}$ alkyl group, or a $C_1$-$C_{20}$ alkoxy group.

12. The organometallic compound of claim 1, wherein the organometallic compound is represented by Formula 1-1 or 1-2:

Formula 1-1

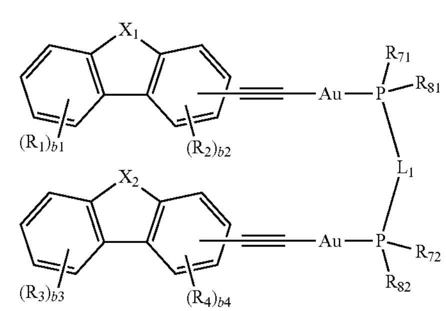

Formula 1-2

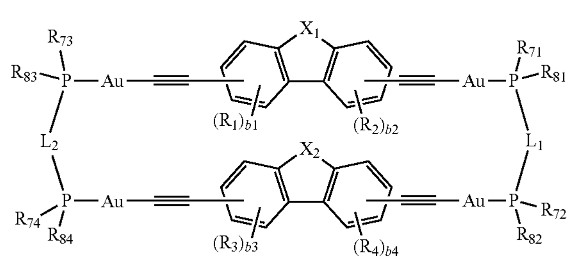

wherein, in Formula 1-1 or 1-2,
$R_{71}$ to $R_{74}$ are the same as described in connection with $R_7$ in claim 1,
$R_{81}$ to $R_{84}$ are the same as described in connection with $R_8$ in claim 1, and
$W_1$ to $W_4$, $X_1$, $X_2$, $L_1$, $L_2$, $R_1$ to $R_4$, and b1 to b4 are the same as described in claim 1.
13. The organometallic compound of claim 1, wherein the organometallic compound is represented by one of Compounds 1 to 810:
1
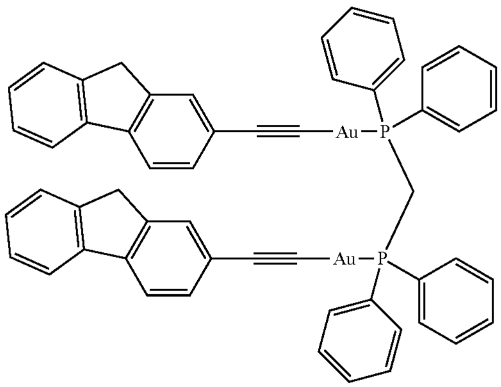
2
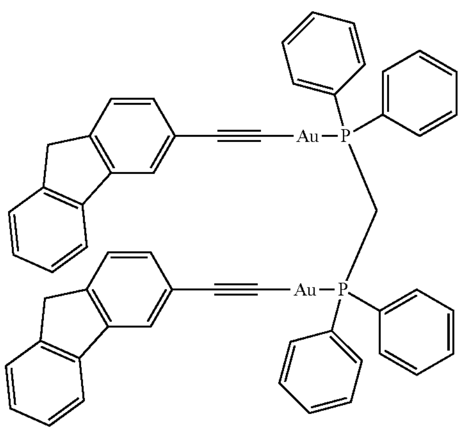
3
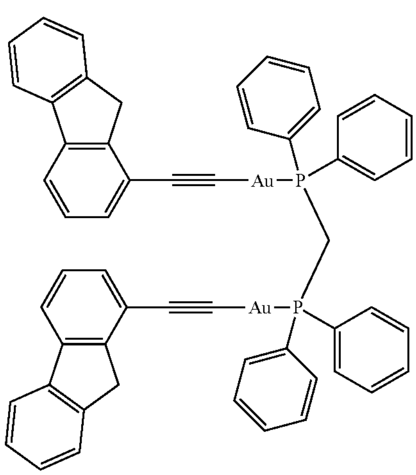
-continued
4
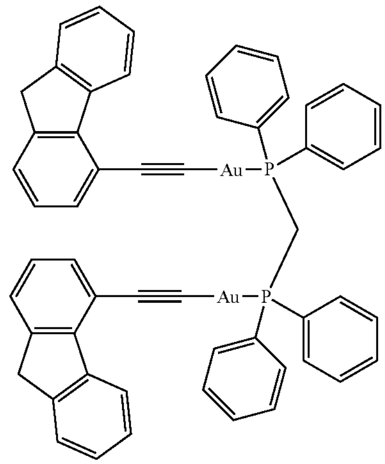
5
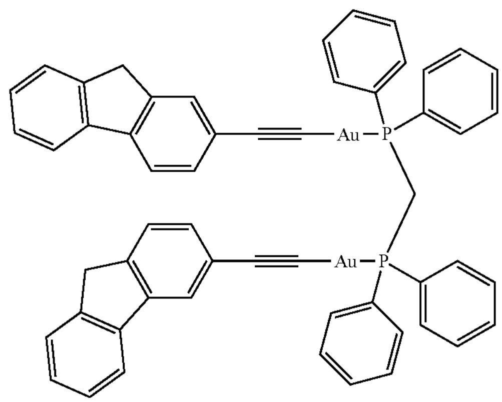
6
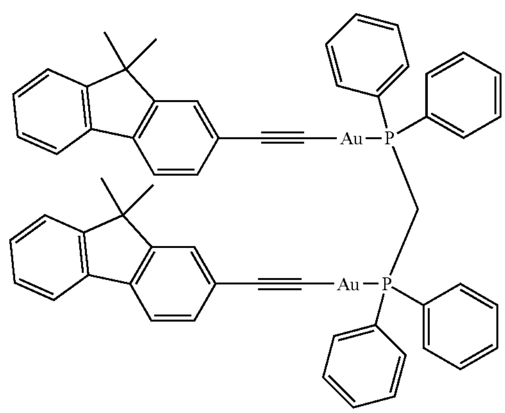

-continued
7
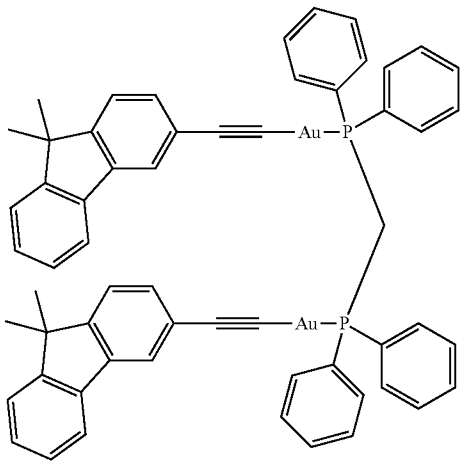
8
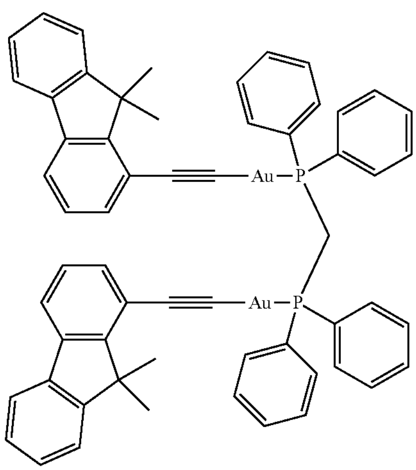
9
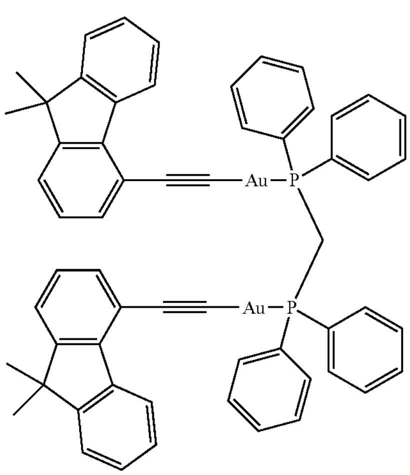
-continued
10
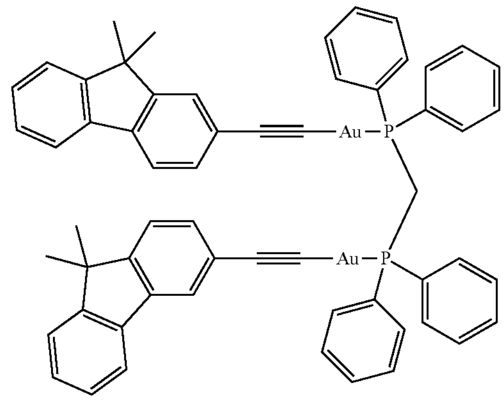
11
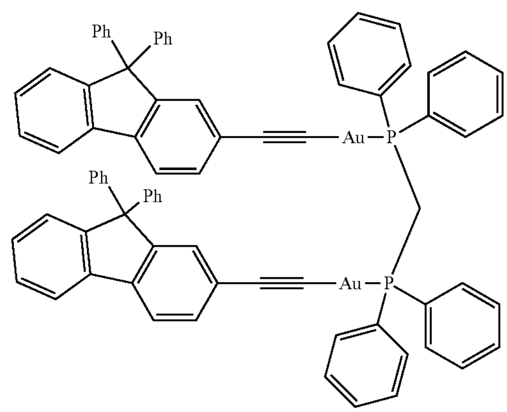
12
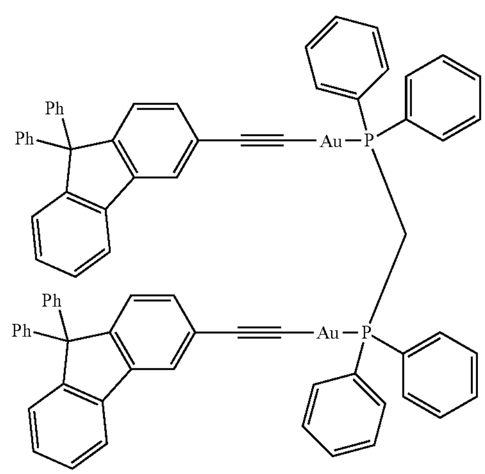

-continued
13
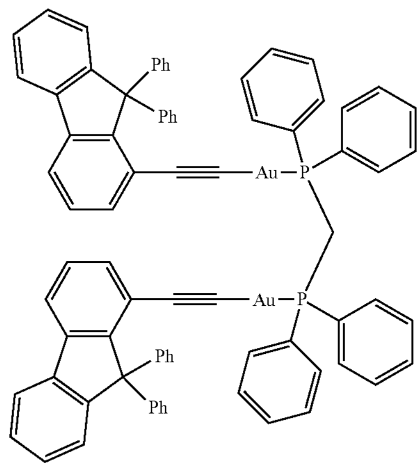
14
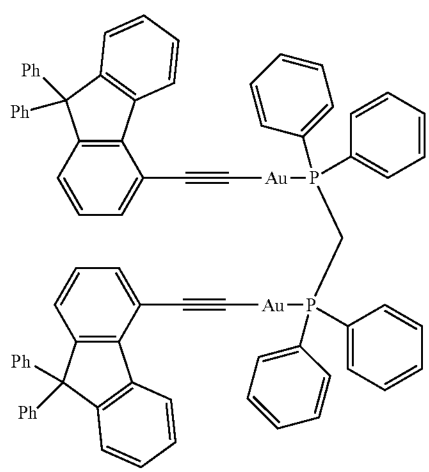
15
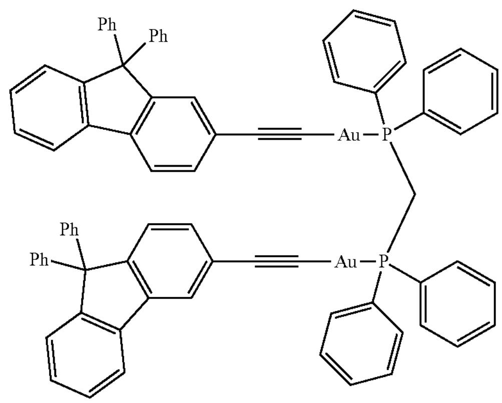
-continued
16
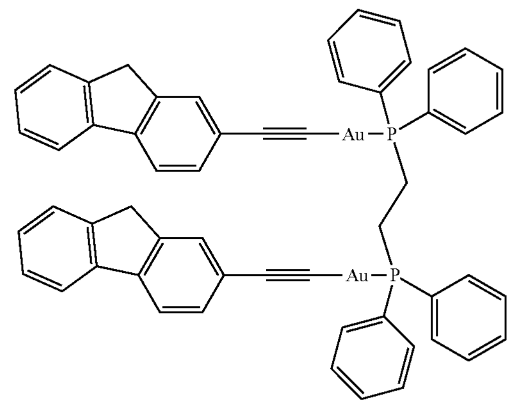
17
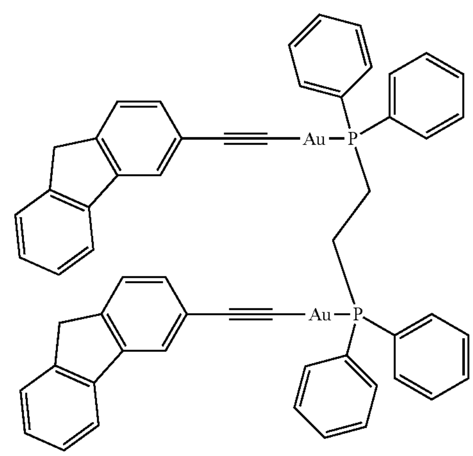
18
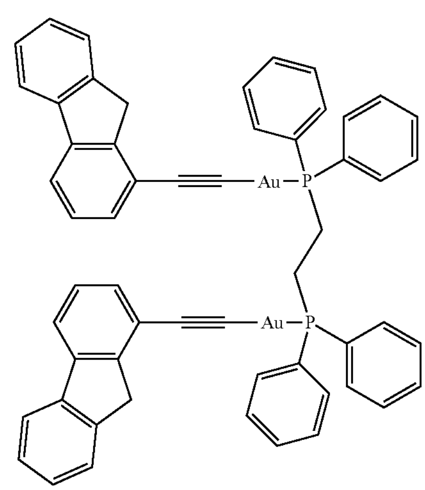

19
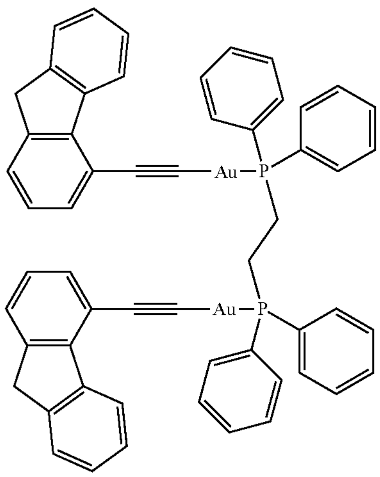
22
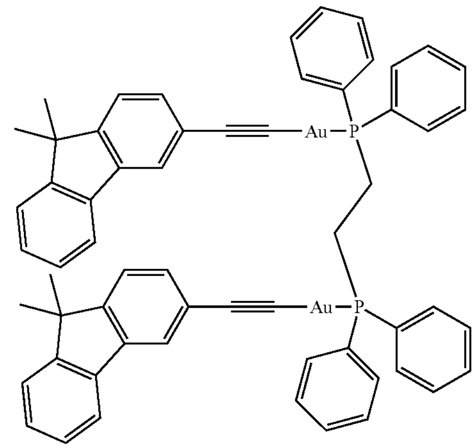
20
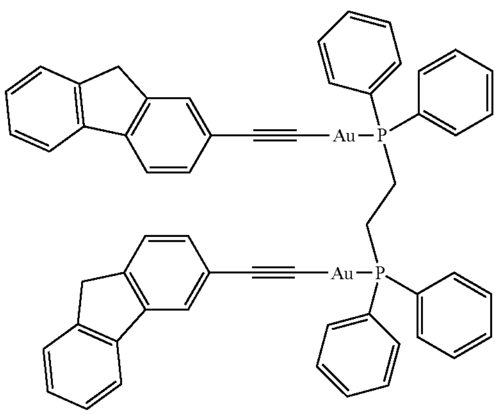
23
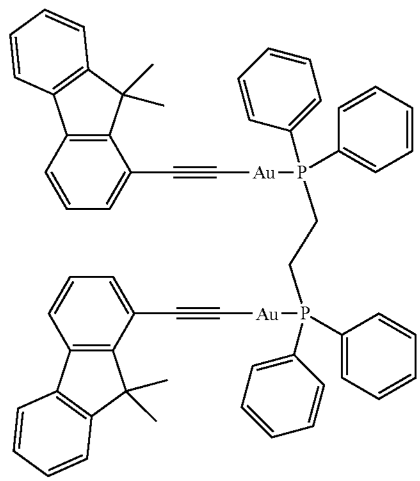
21
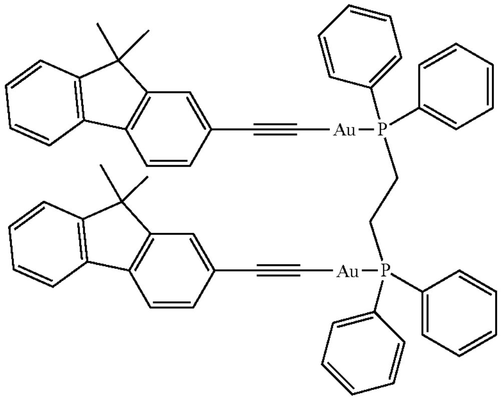
24
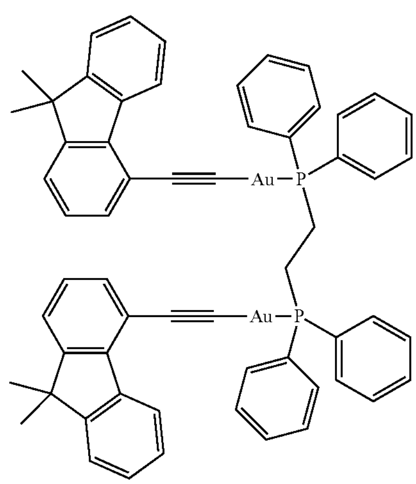

-continued
25
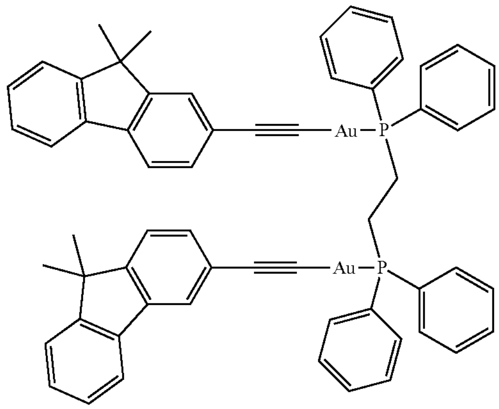
26
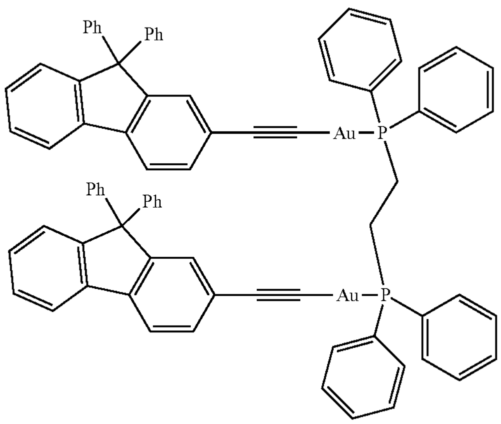
27
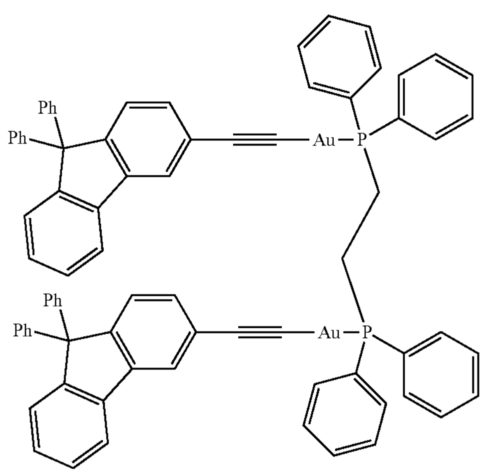
-continued
28
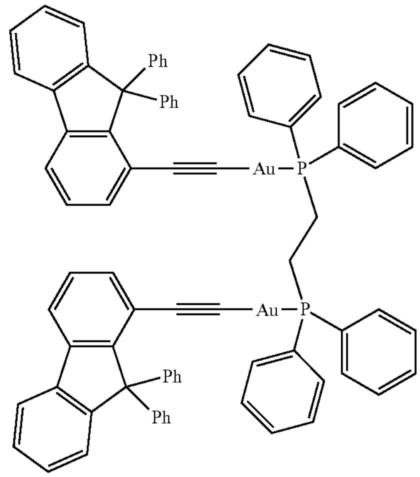
29
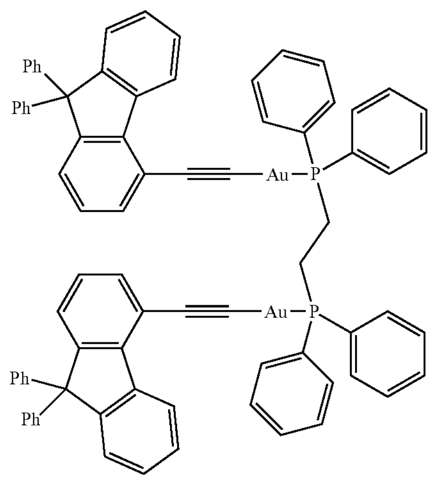
30
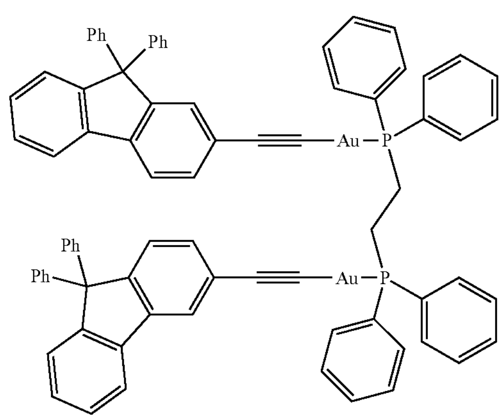

-continued
31
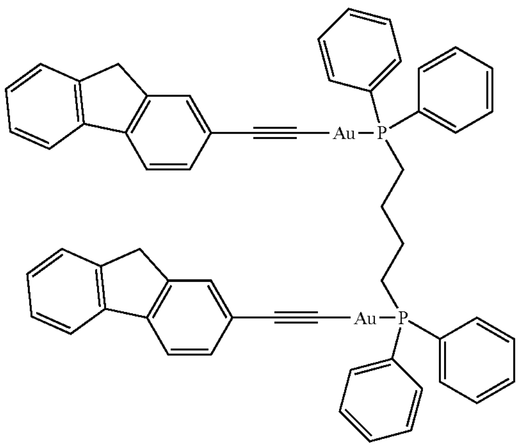
32
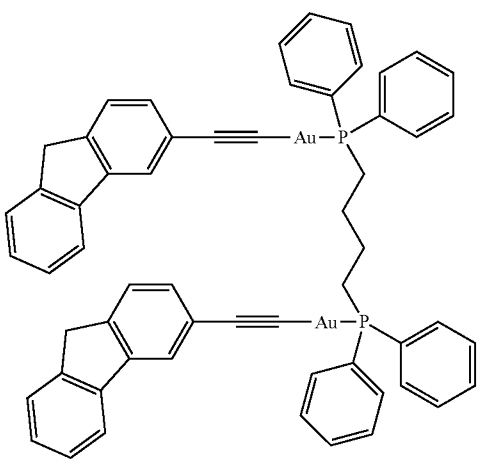
33
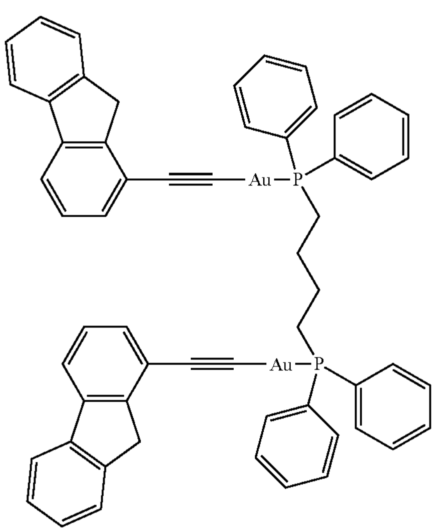
-continued
34
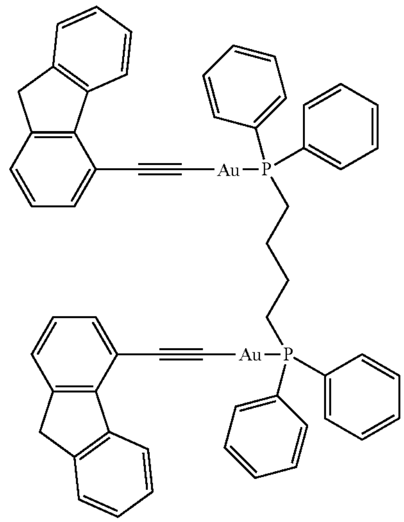
35
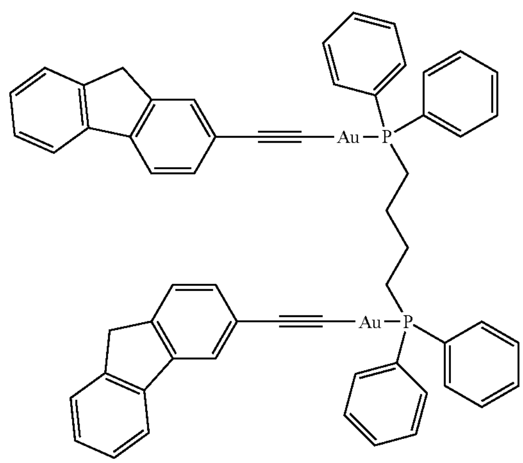
36
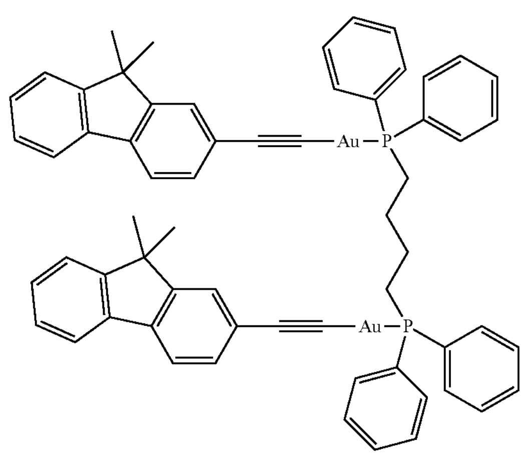

-continued
37
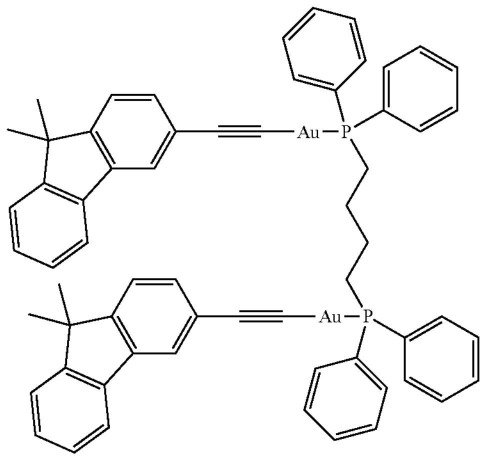
38
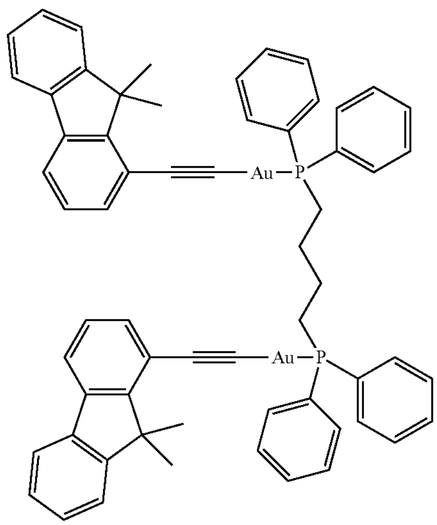
39
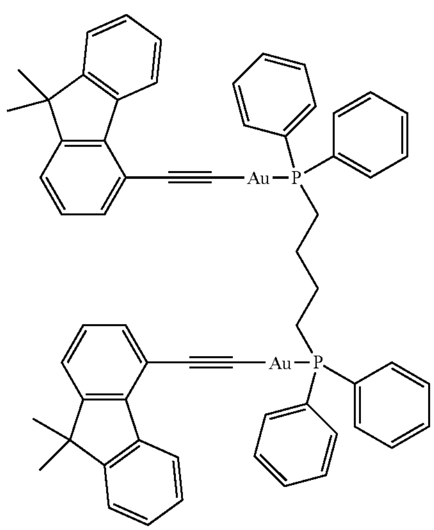
-continued
40
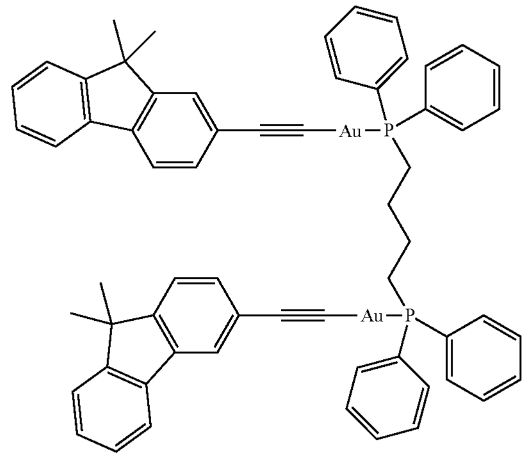
41
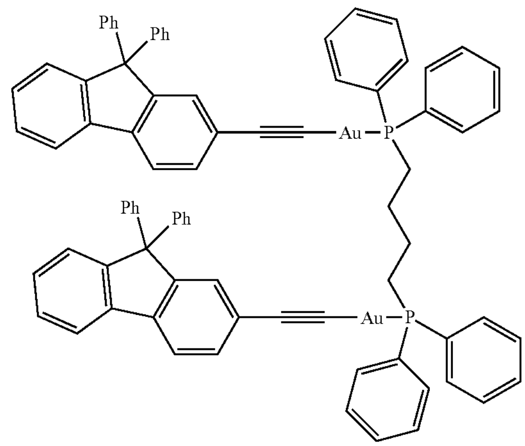
42
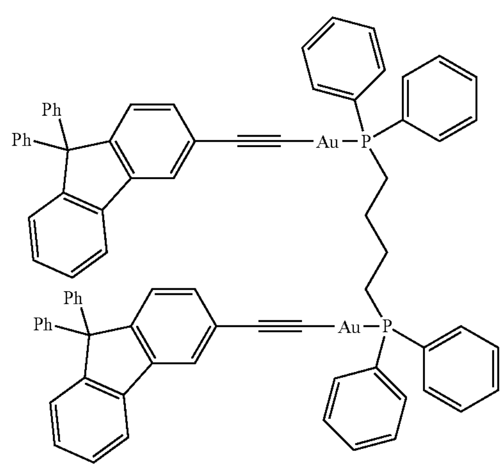

-continued
43
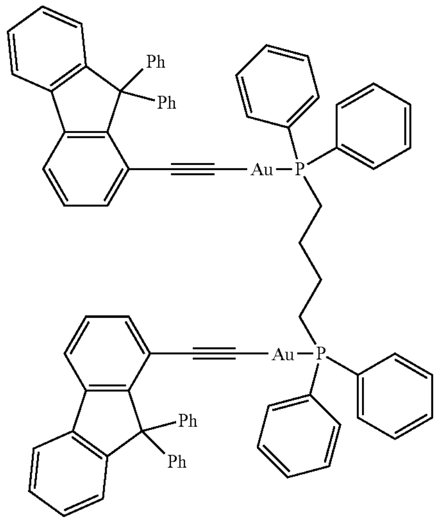
44
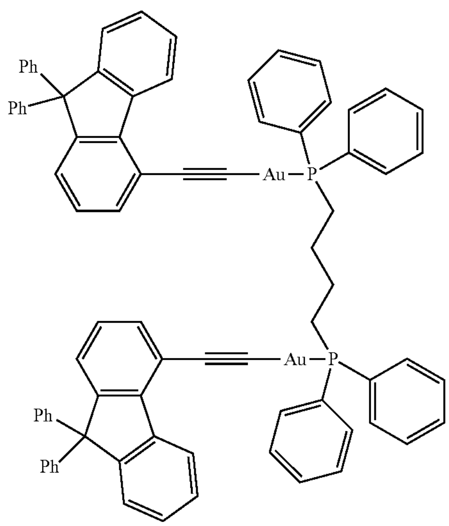
45
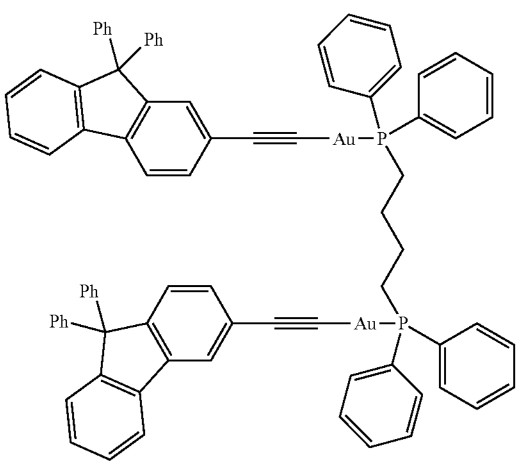
-continued
46
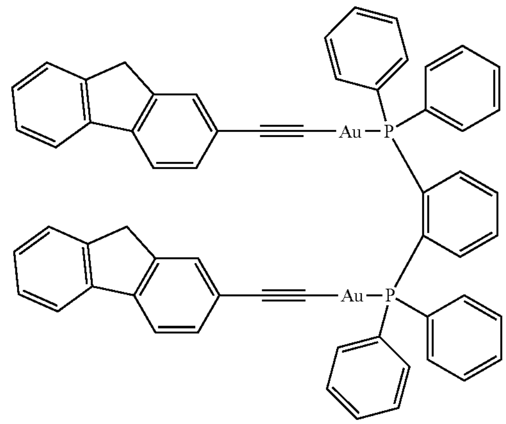
47
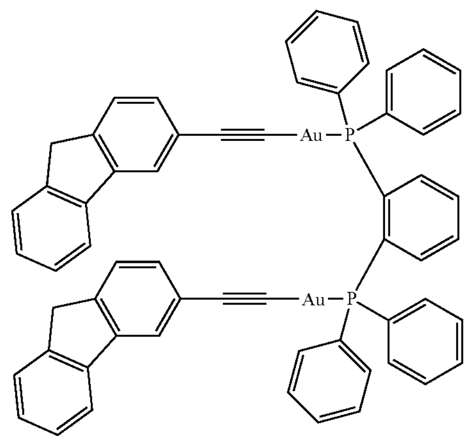
48
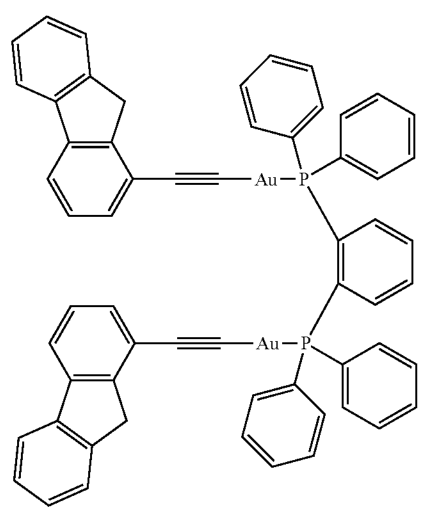

-continued
49
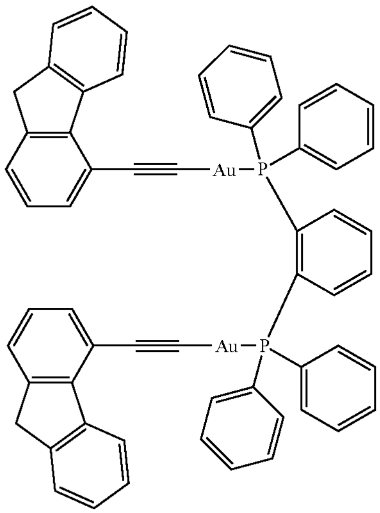
50
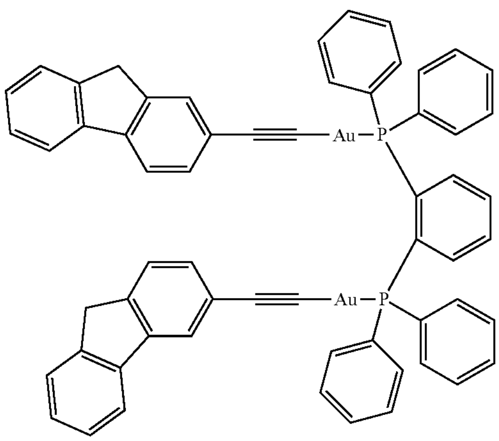
51
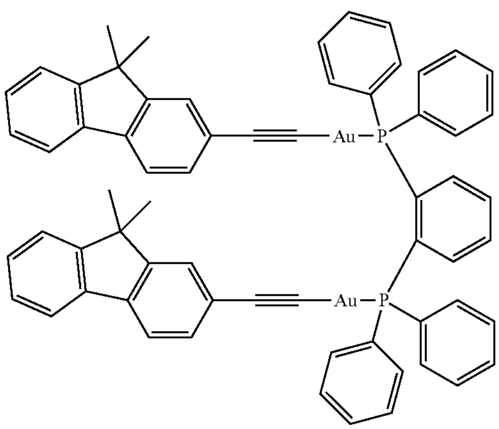
-continued
52
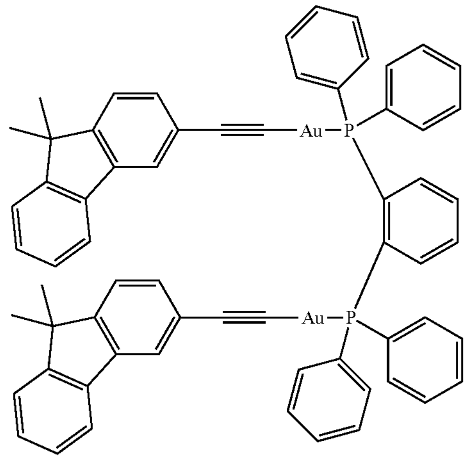
53
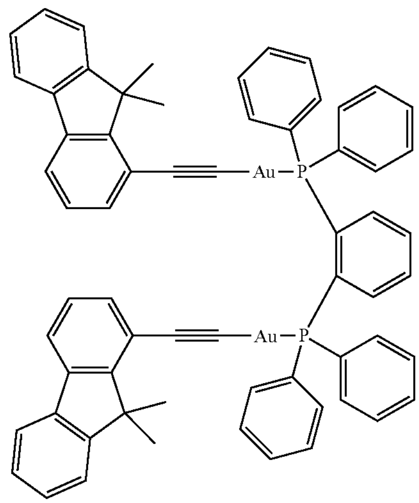
54
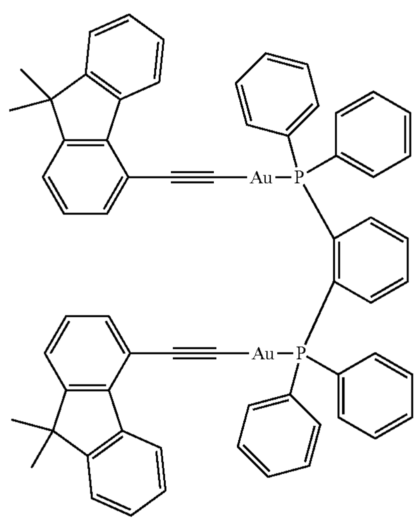

-continued
55
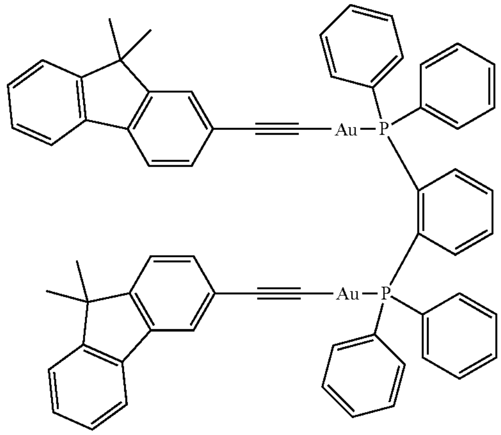
56
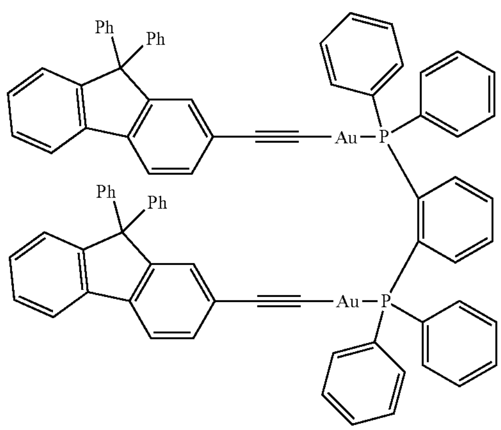
57
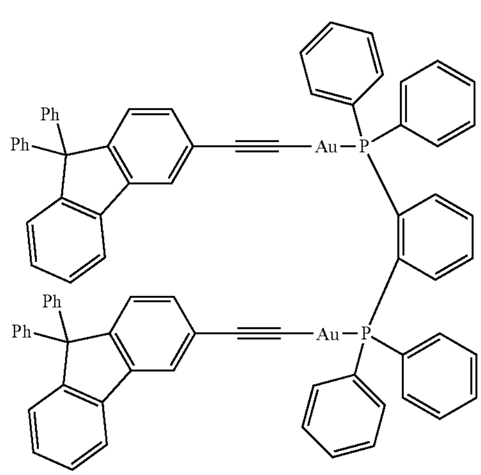
-continued
58
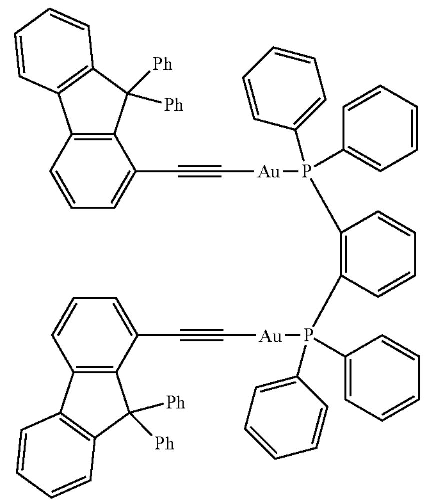
59
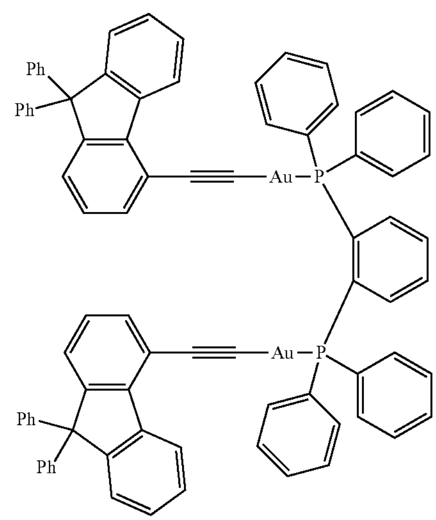
60
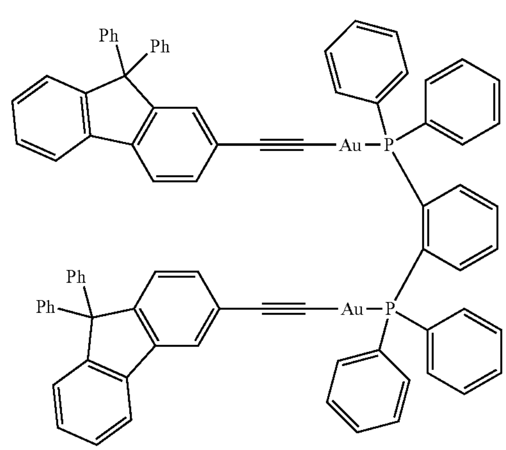

61
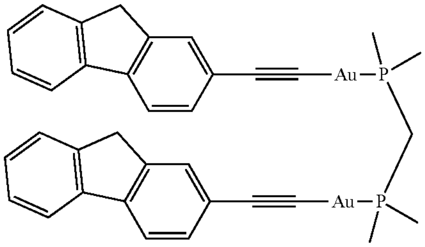
62
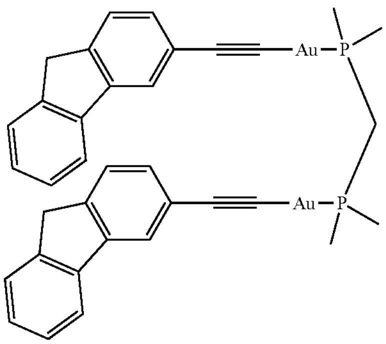
63
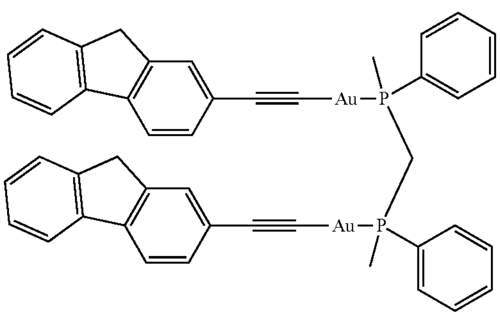
64
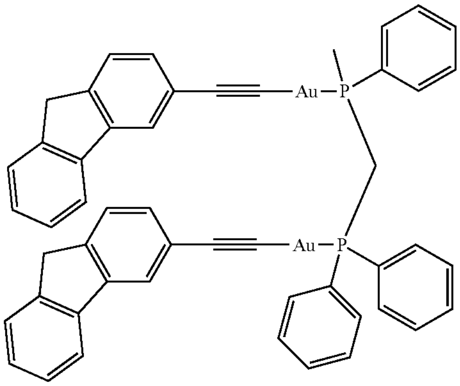
65
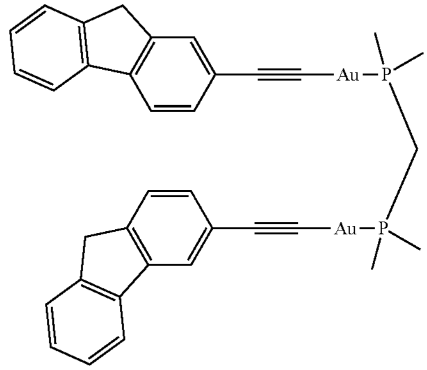
66
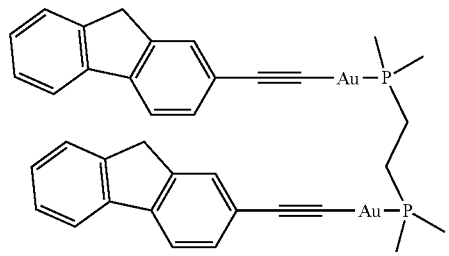
67
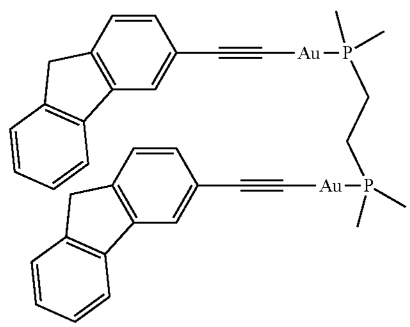
68
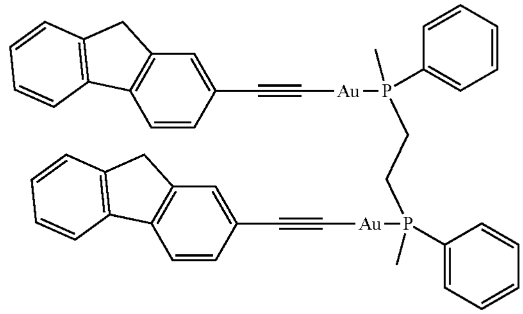

69
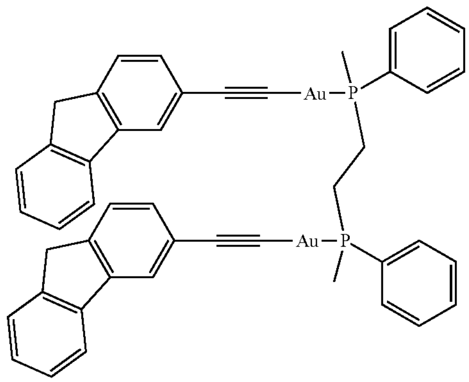
70
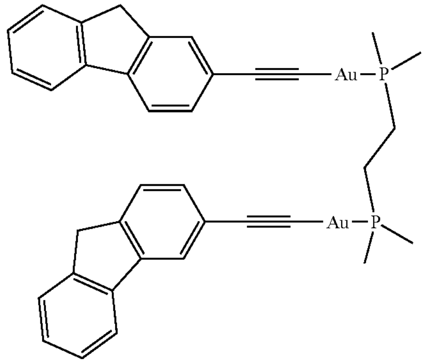
71
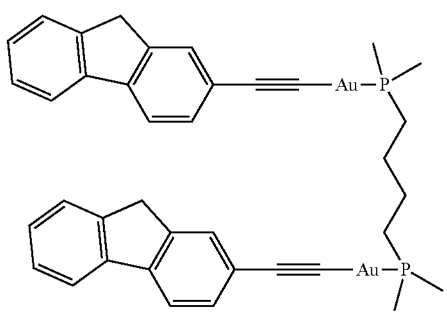
72
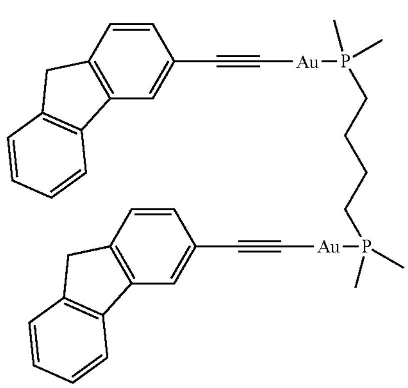
73
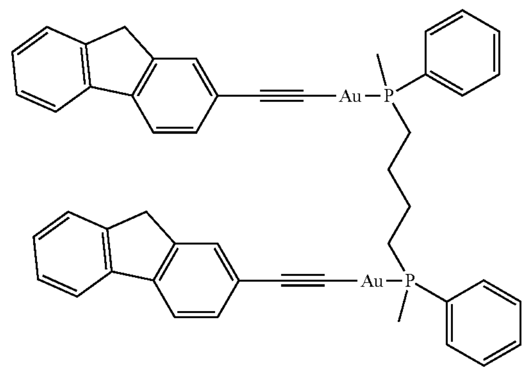
74
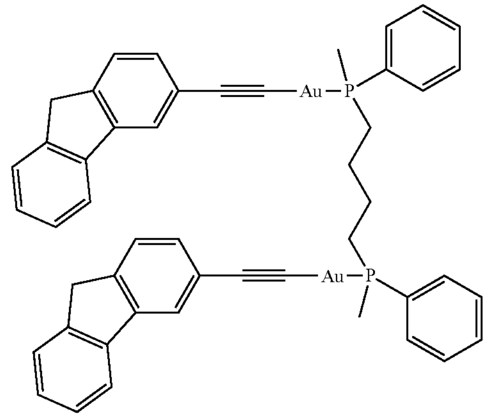
75
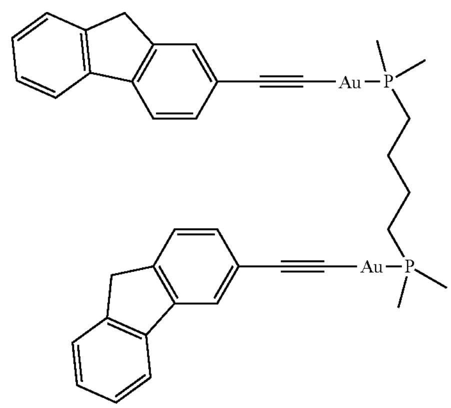
76
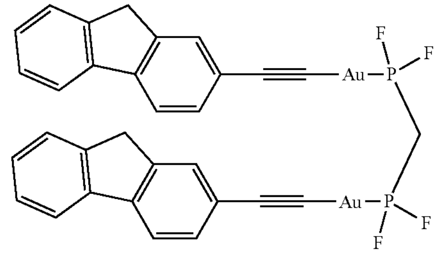

77
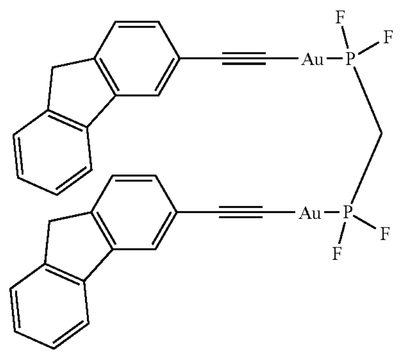
78
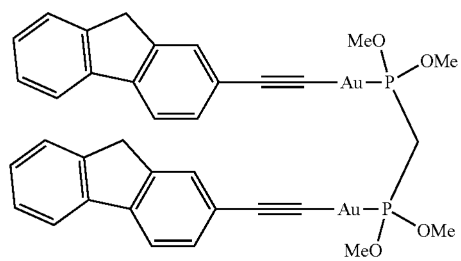
79
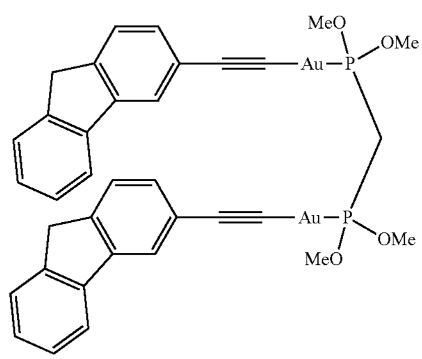
80
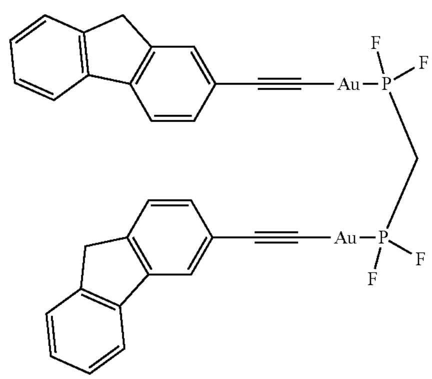
81
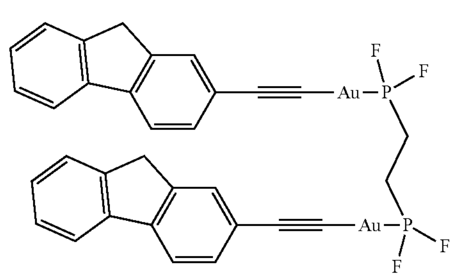
82
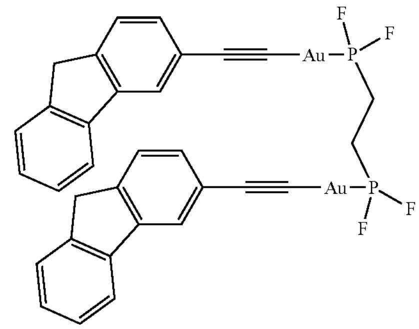
83
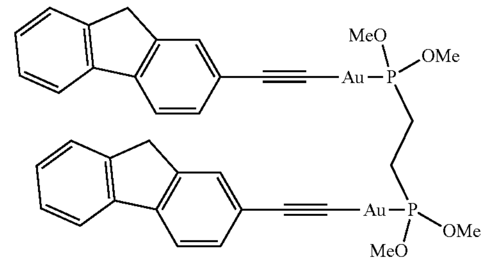
84
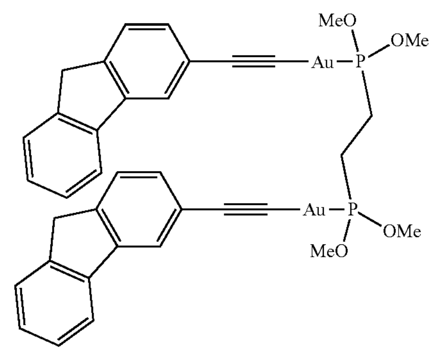
85
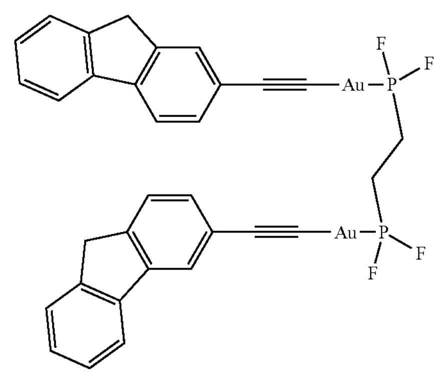
86
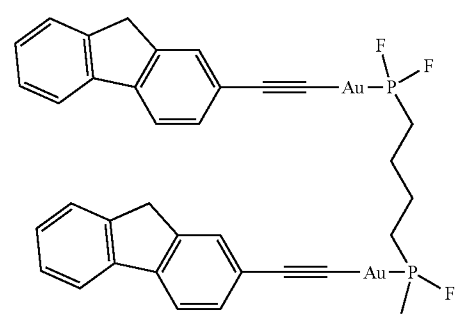

87
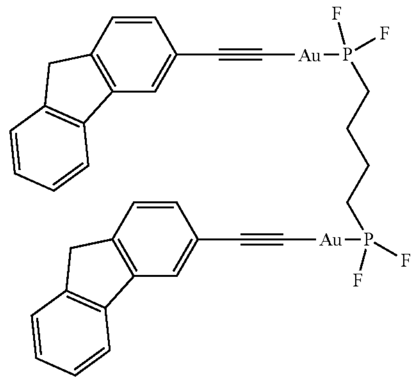
88
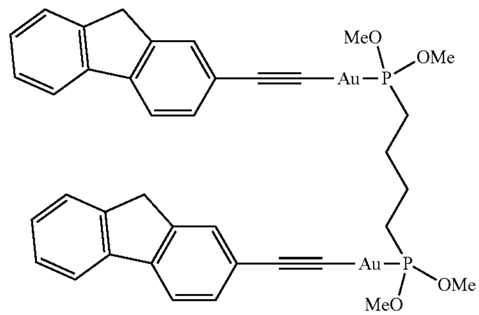
89
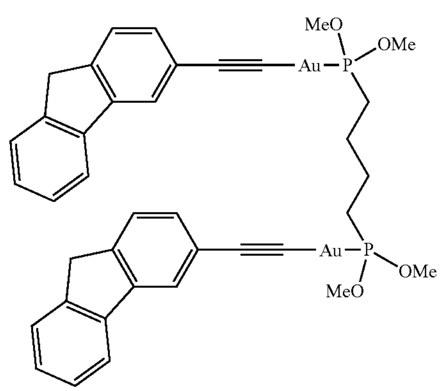
90
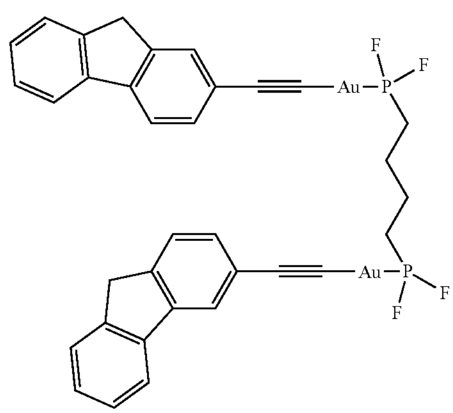
91
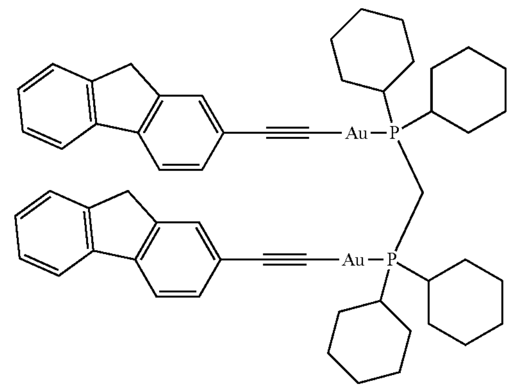
92
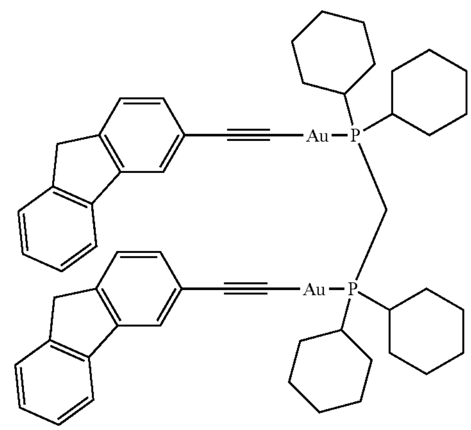
93
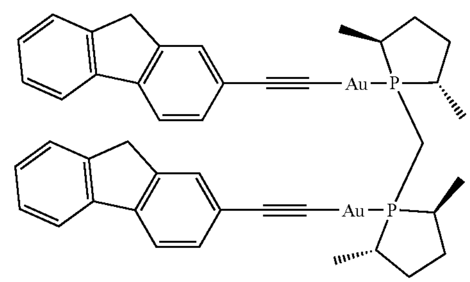
94
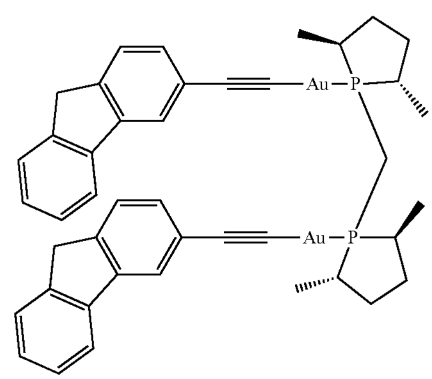

-continued
95
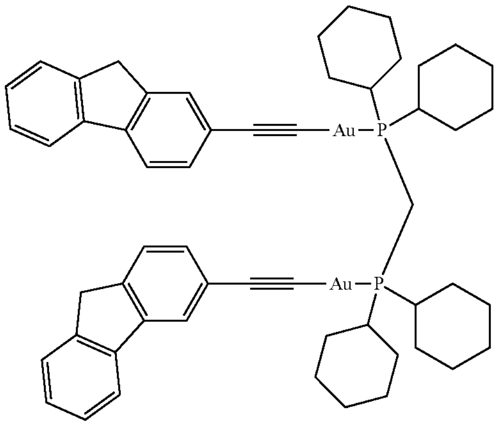
96
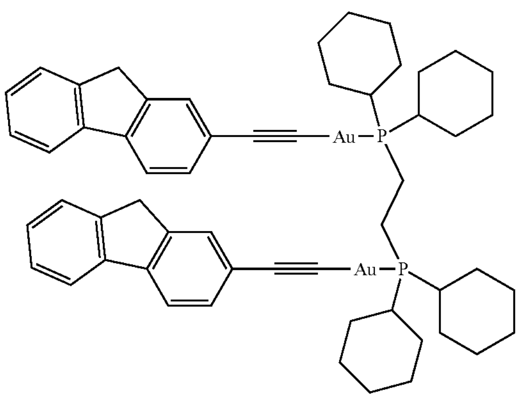
97
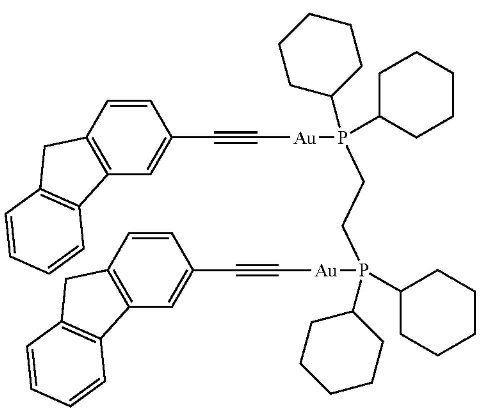
98
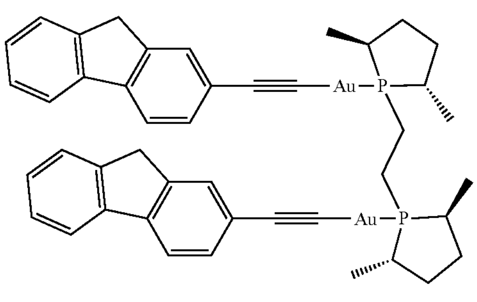
-continued
99
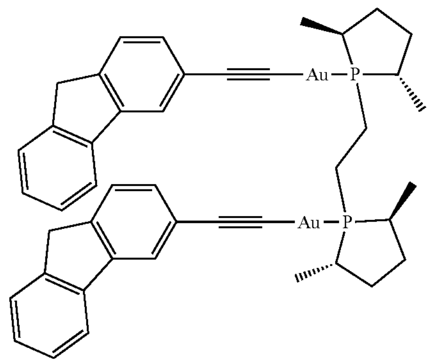
100
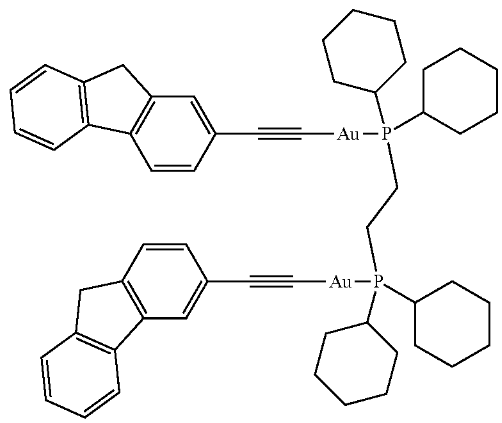
101
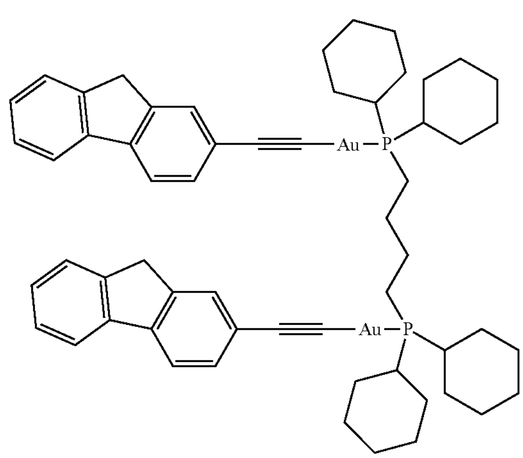

102
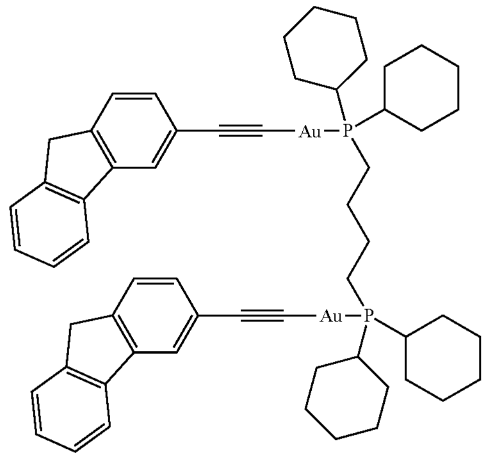
103
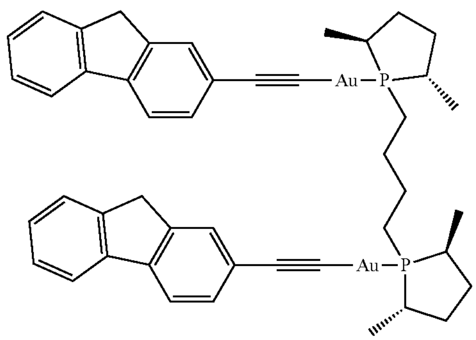
104
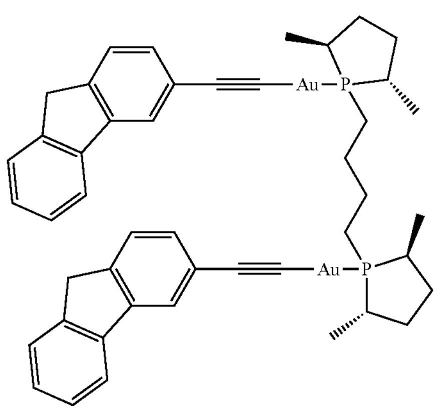
105
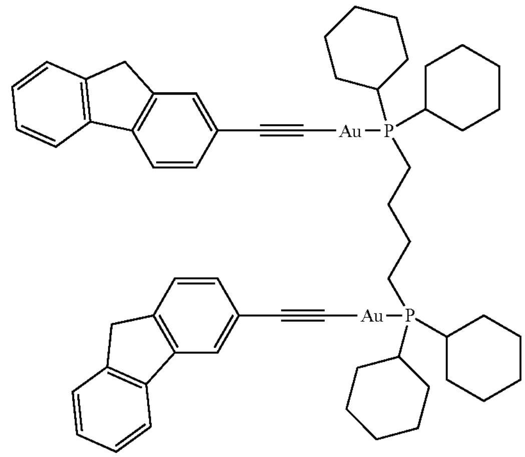
106
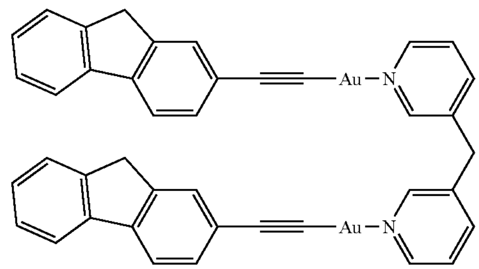
107
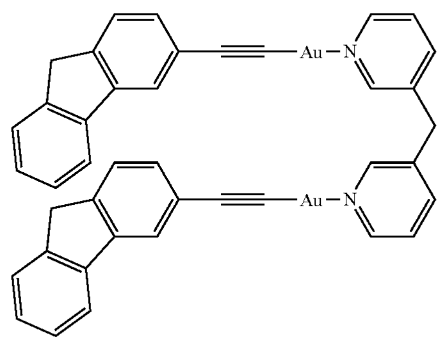
108
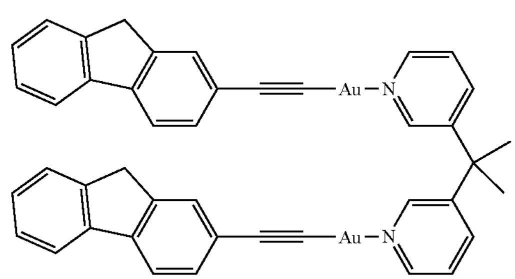

-continued
109
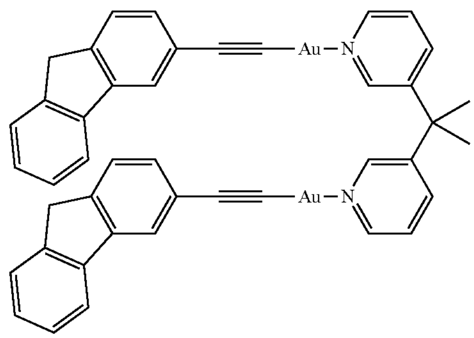
110
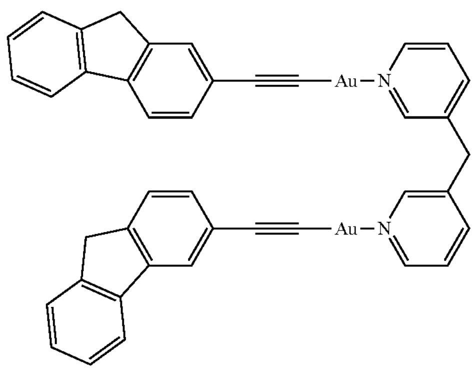
111
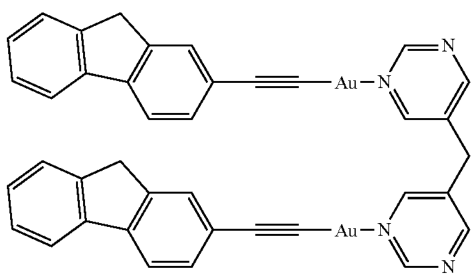
112
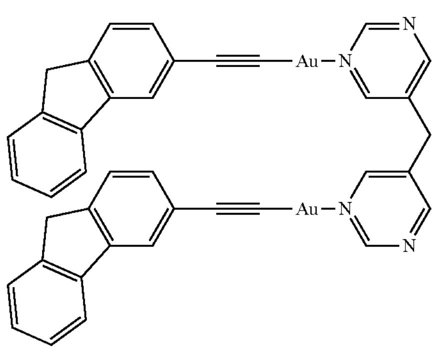
113
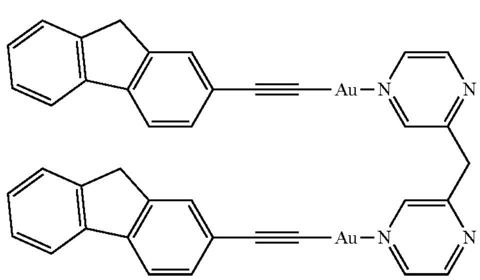
114
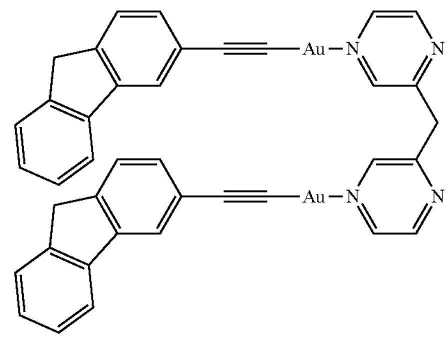
115
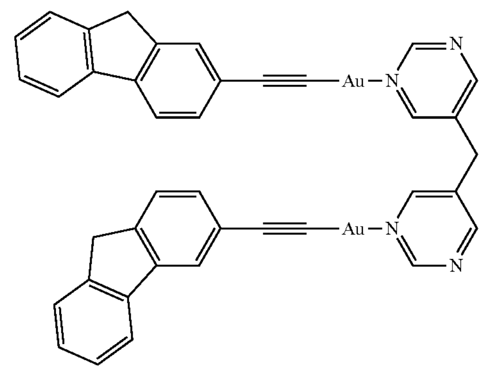
116
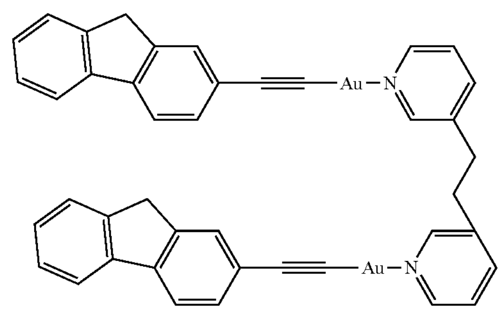
117
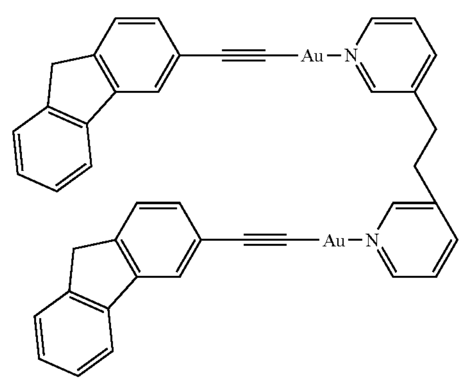

-continued
118
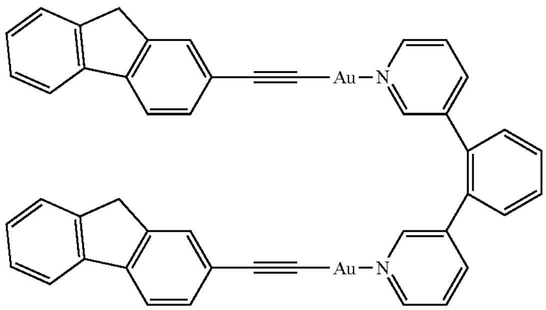
119
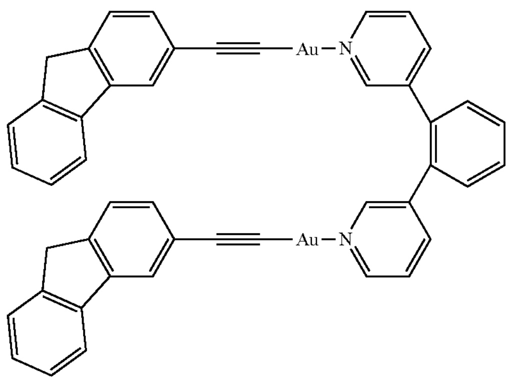
120
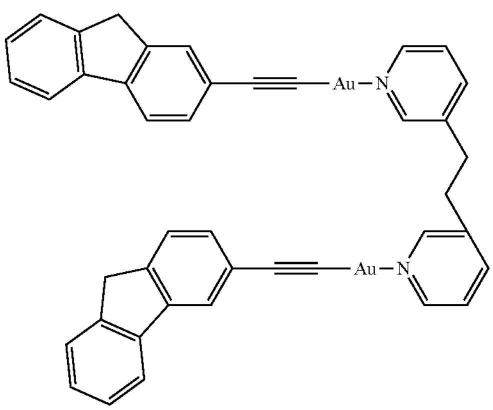
121
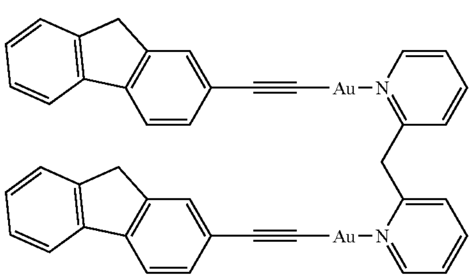
-continued
122
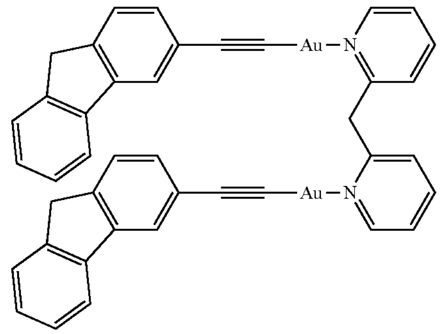
123
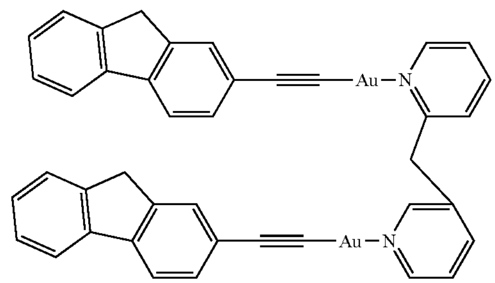
124
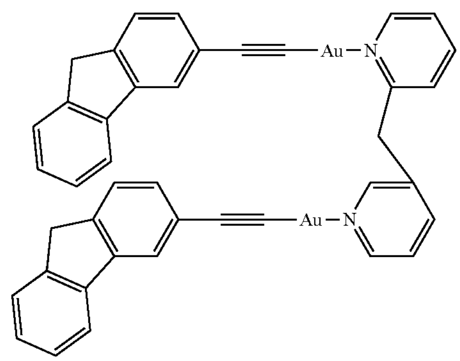
125
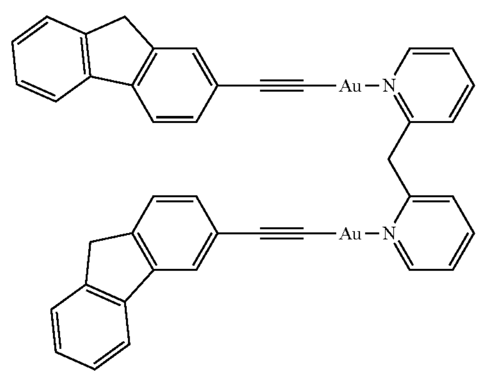
126
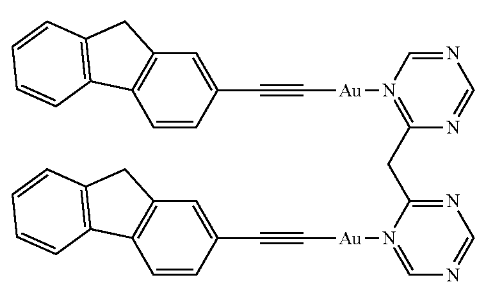

-continued
127
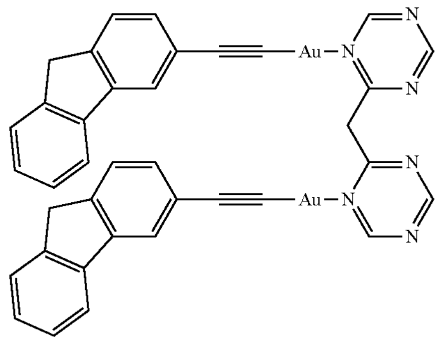
128
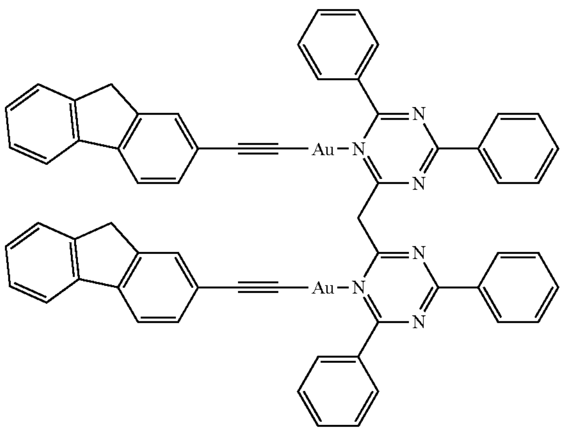
129
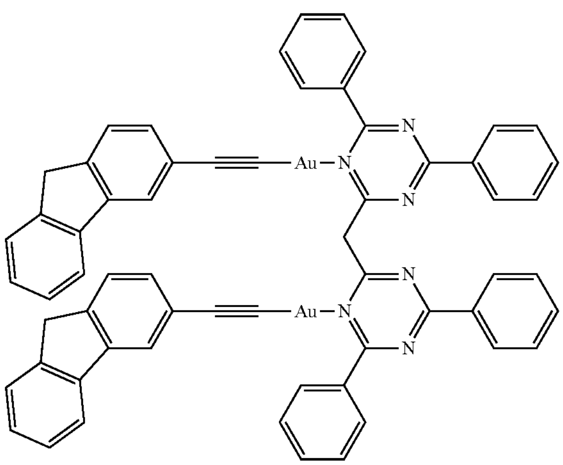
130
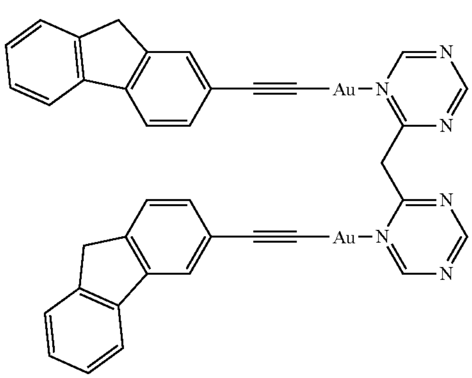
-continued
131
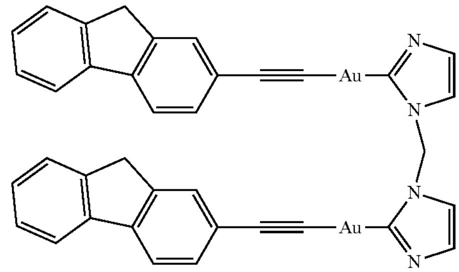
132
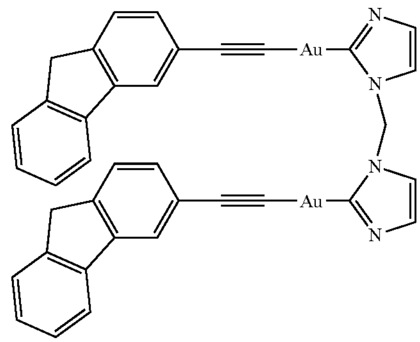
133
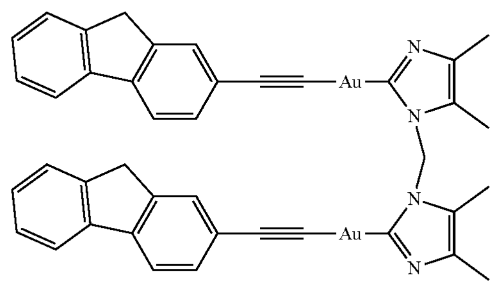
134
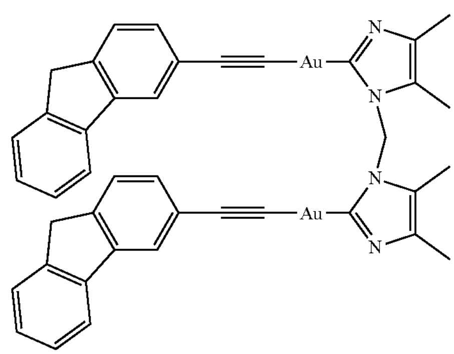
134
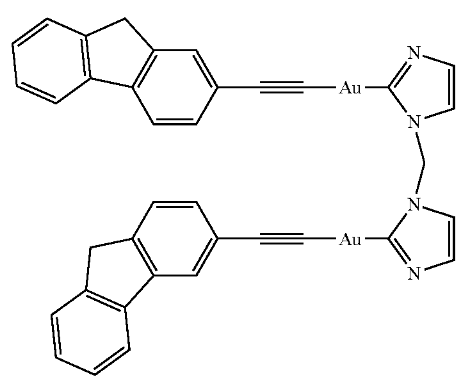

-continued
136
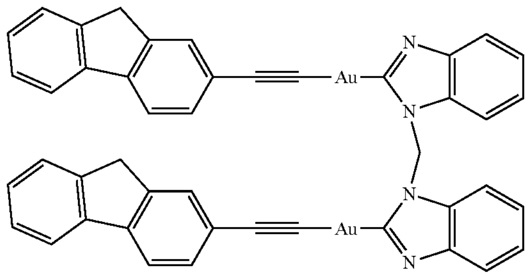
137
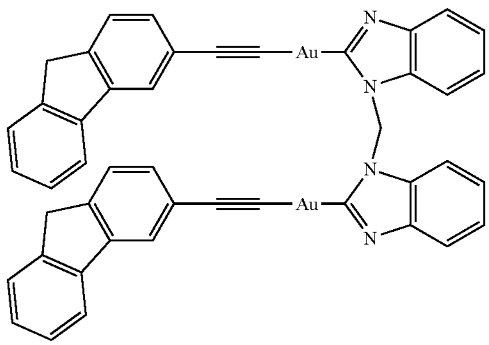
138
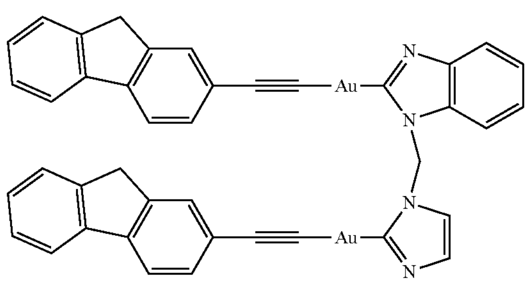
139
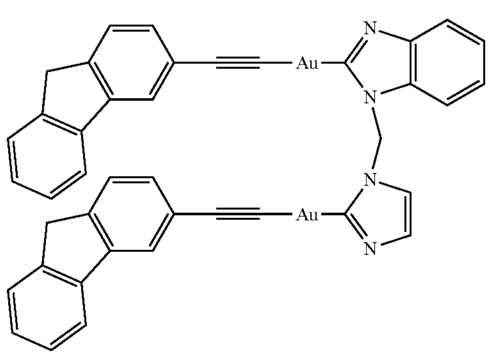
-continued
140
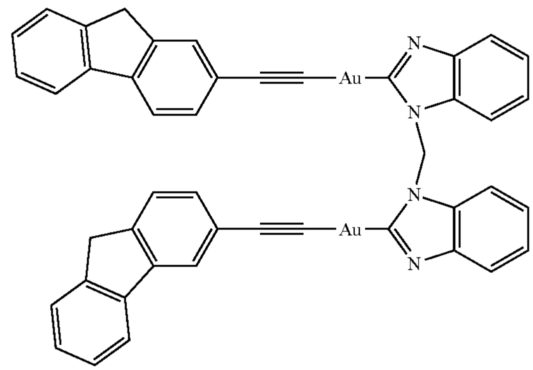
141
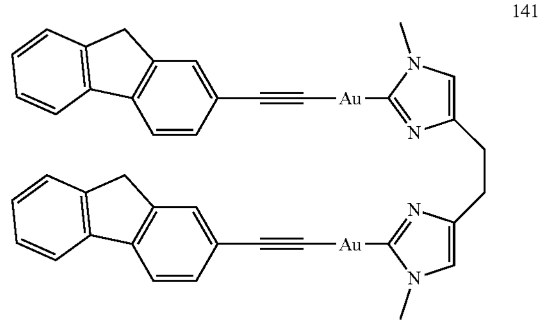
142
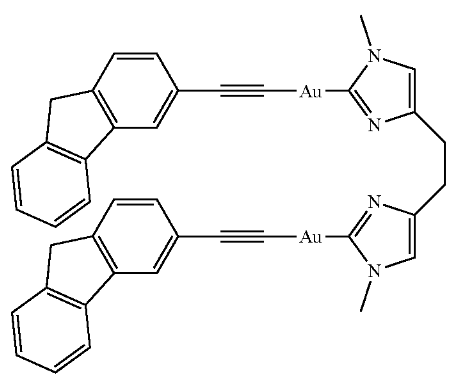
143
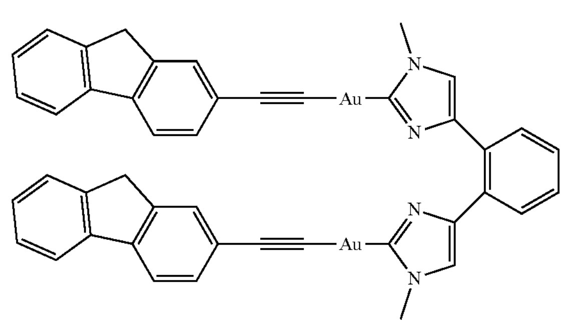

-continued
145
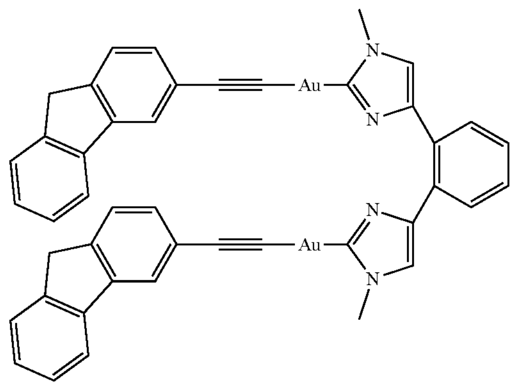
146
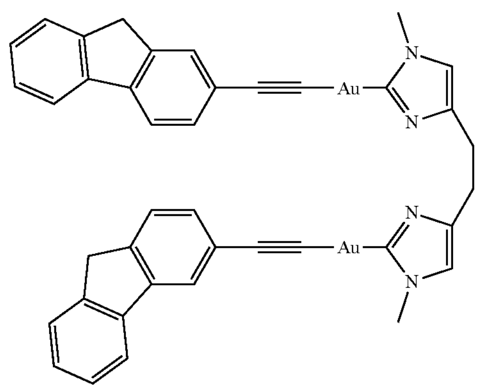
146
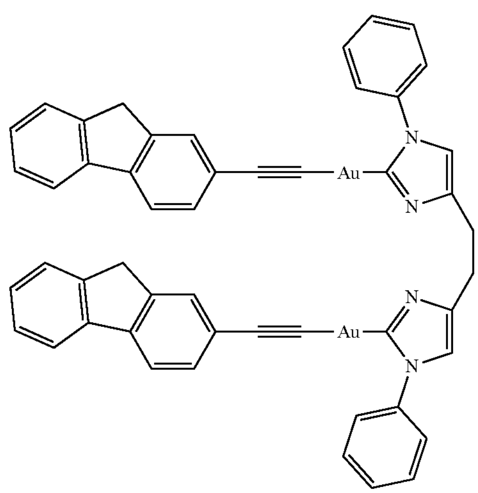
-continued
147
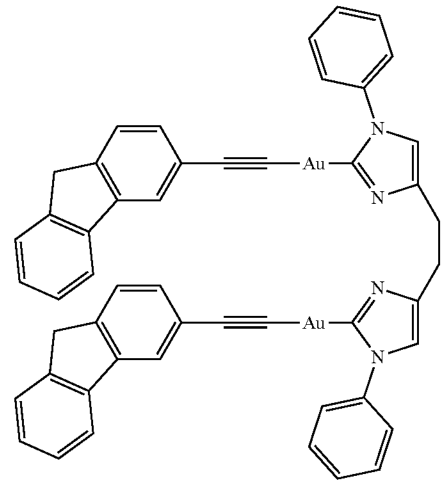
148
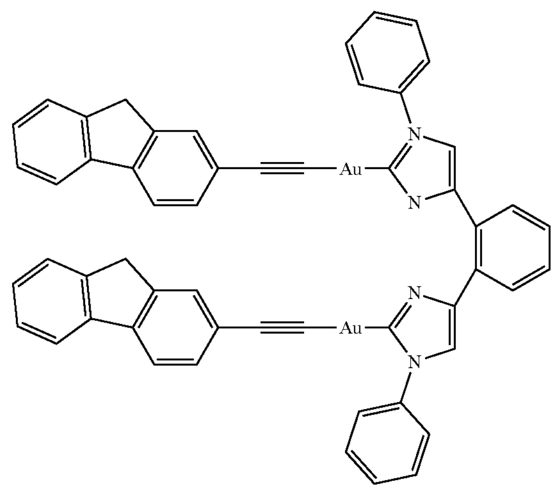
149
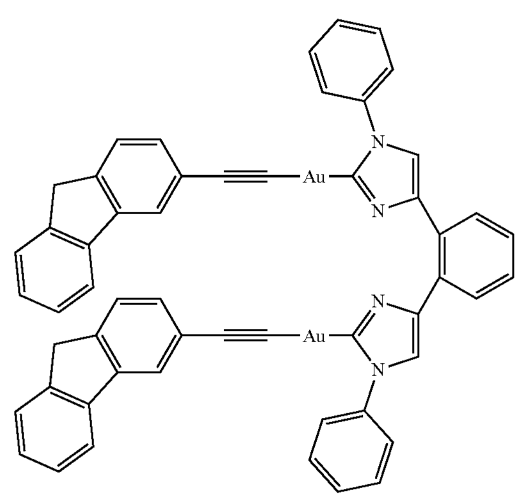

-continued
150
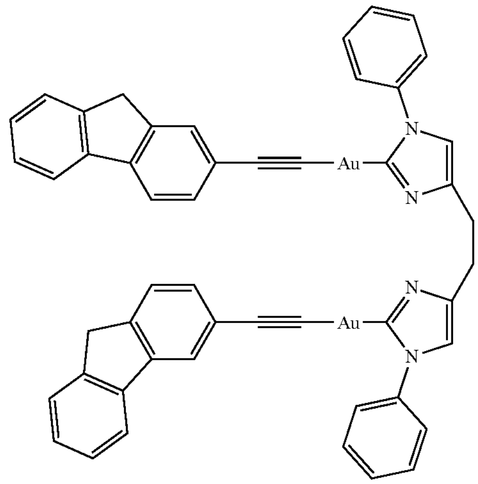
151
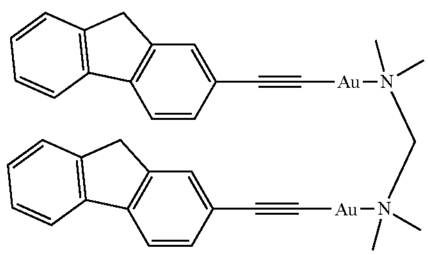
152
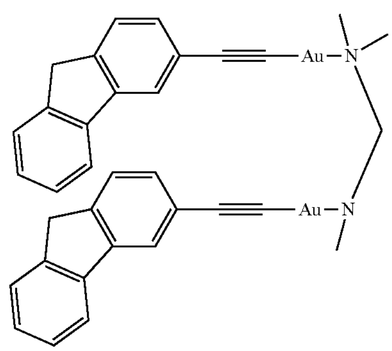
153
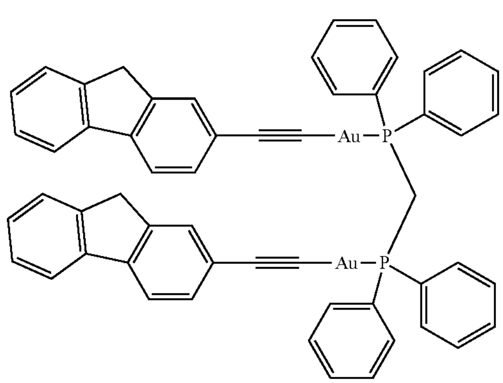
-continued
154
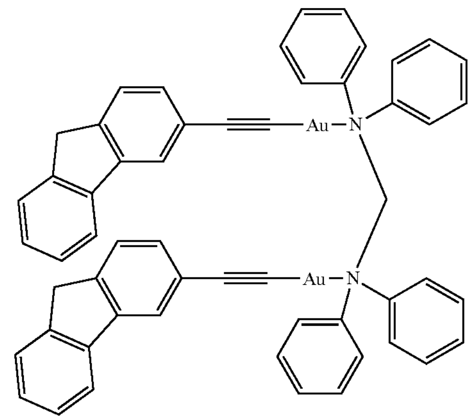
155
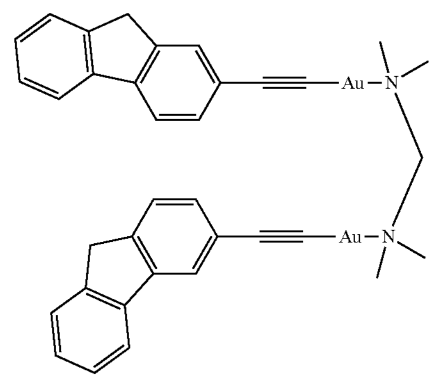
156
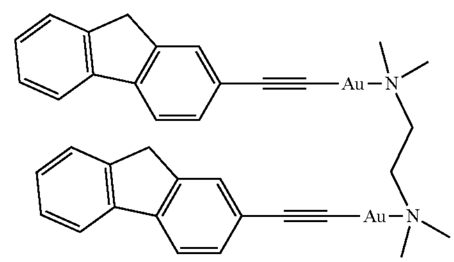
157
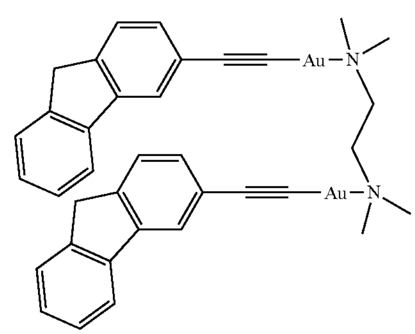

-continued
158
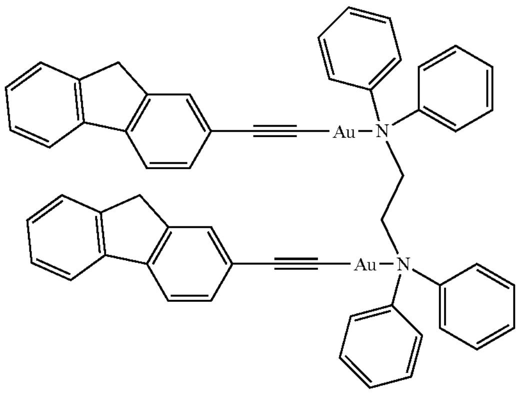
159
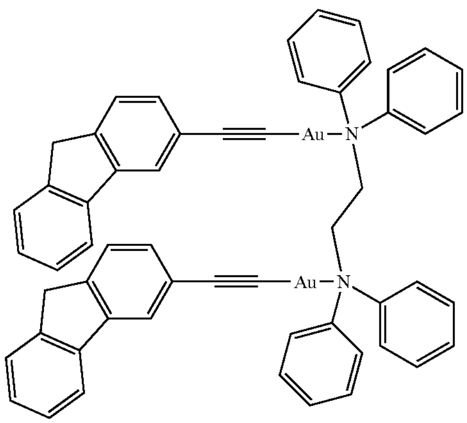
160
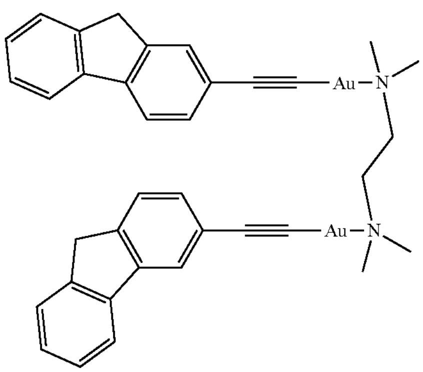
161
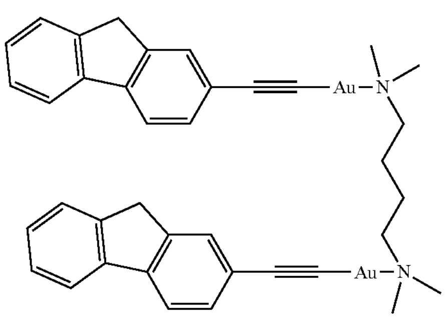
-continued
162
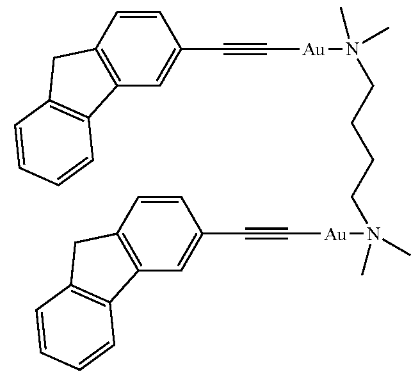
163
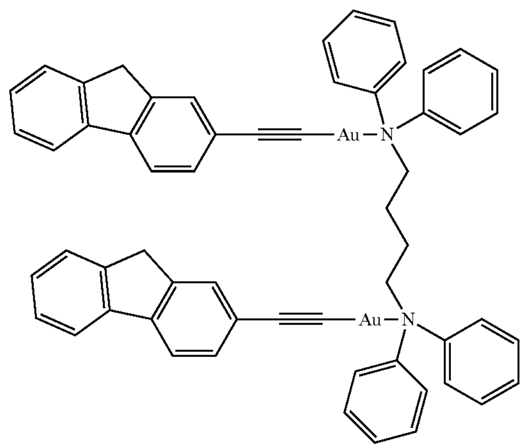
164
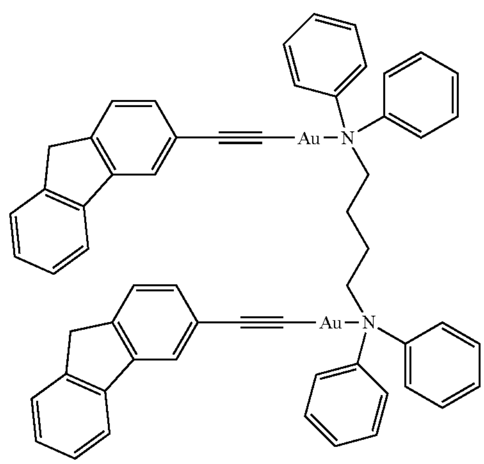

165
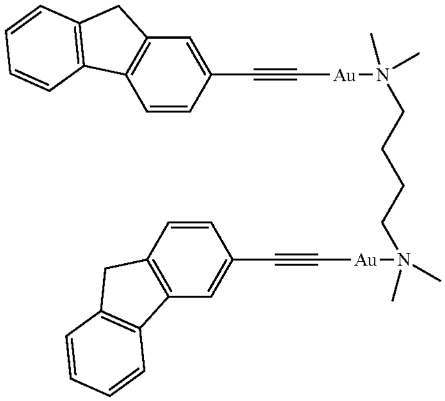
166
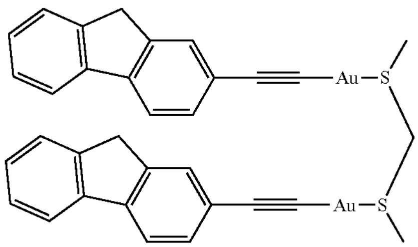
167
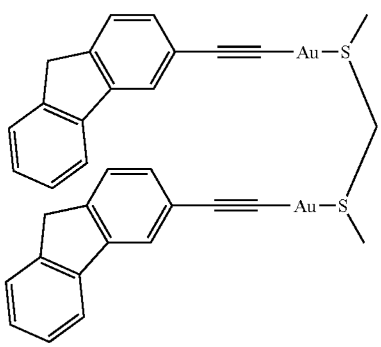
168
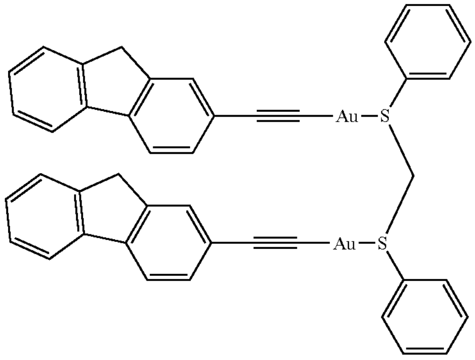
169
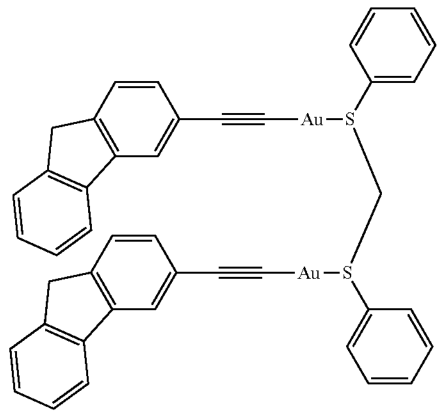
170
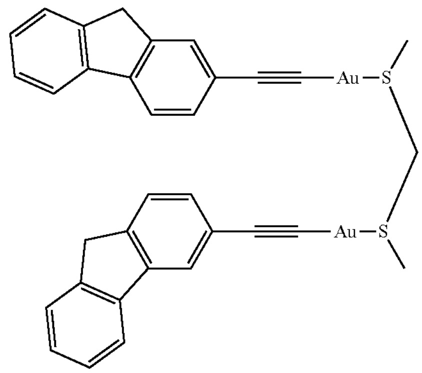
171
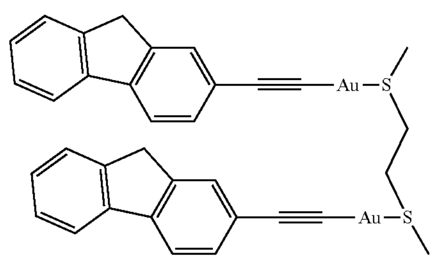
172
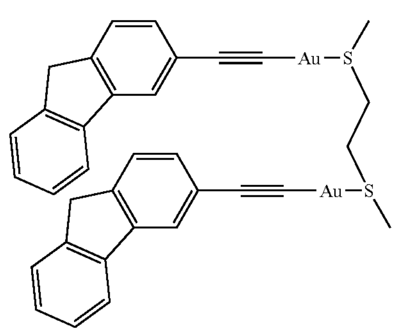

-continued
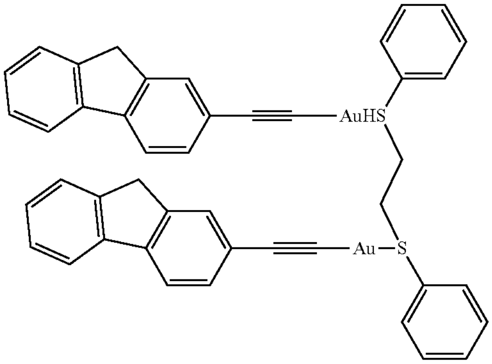
174
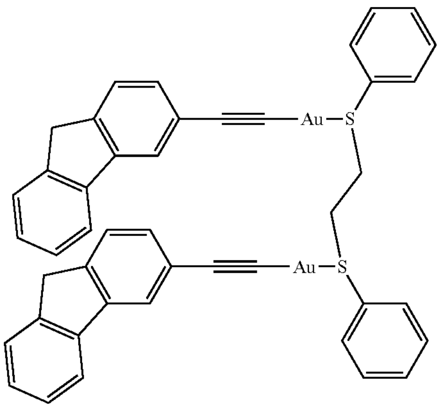
175
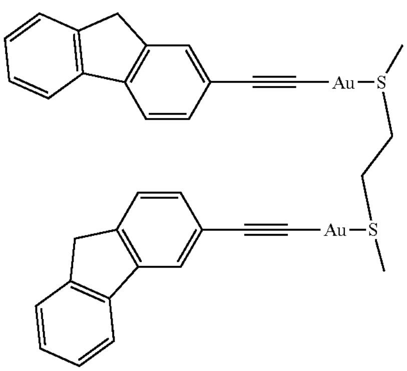
176
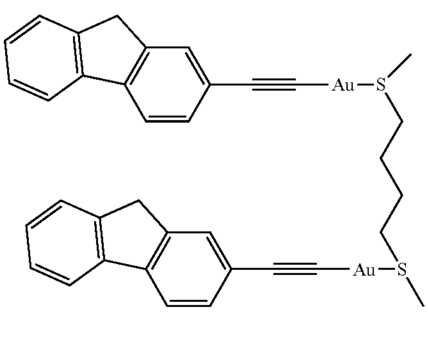
-continued
177
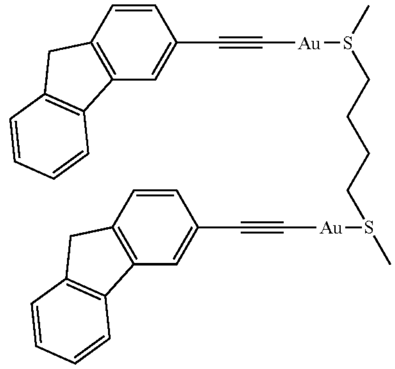
178
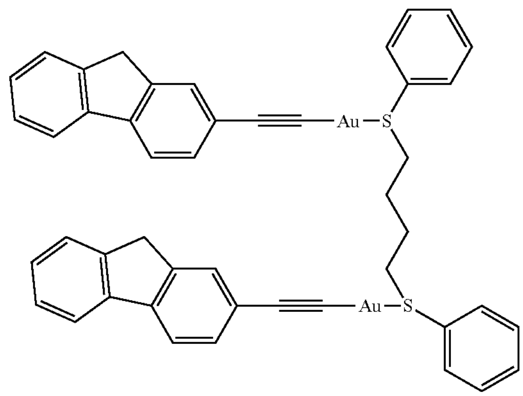
179
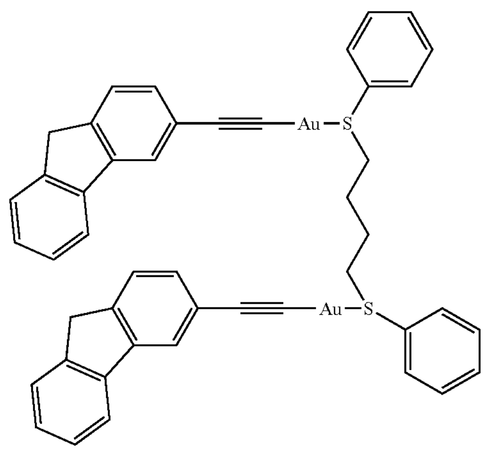
180
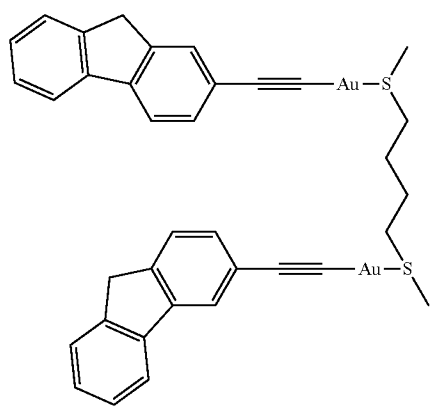

-continued
181
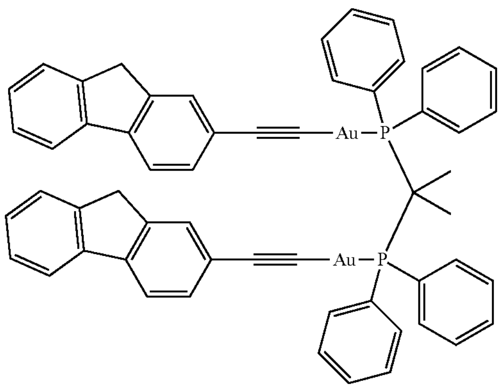
182
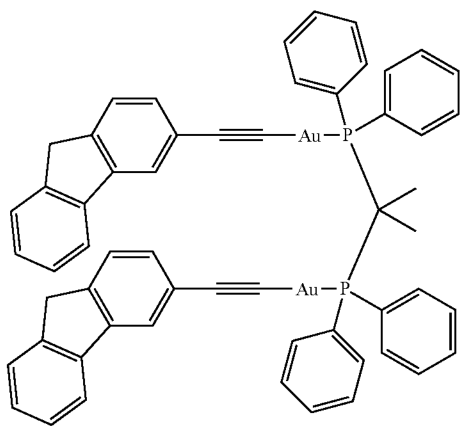
183
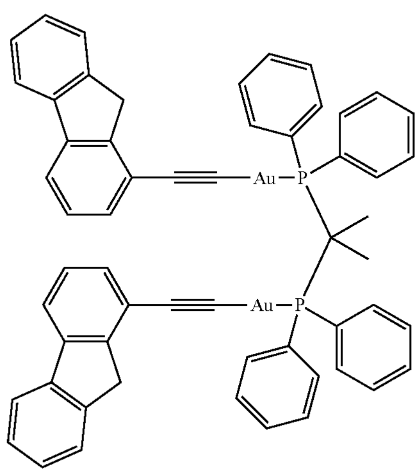
-continued
184
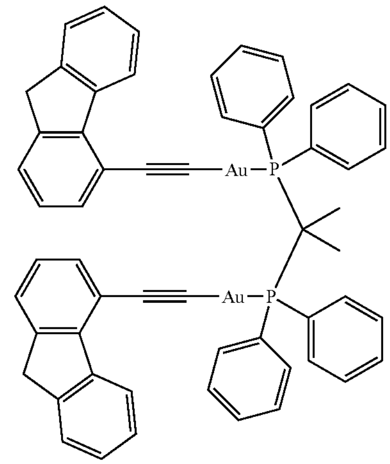
185
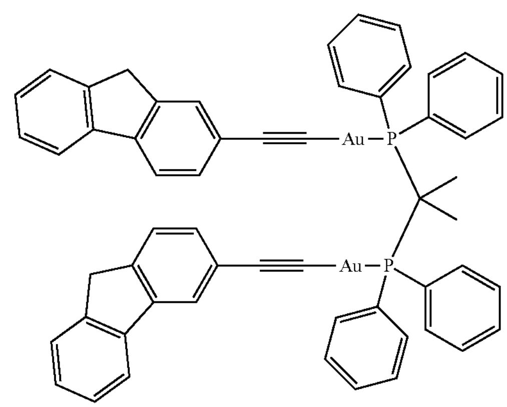
186
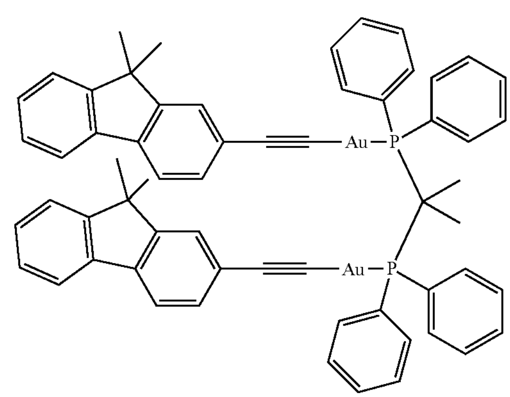

-continued
187
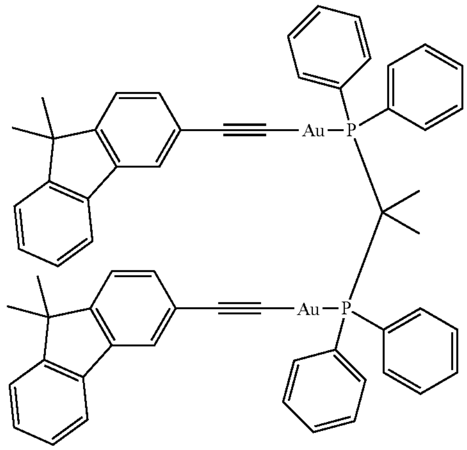
188
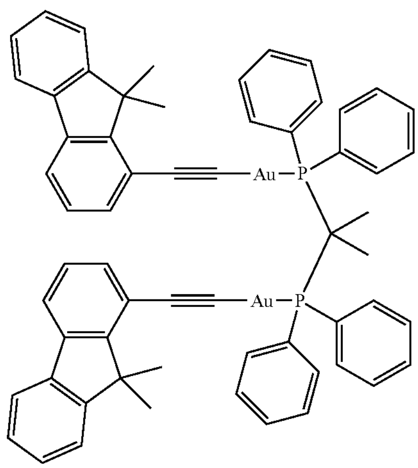
189
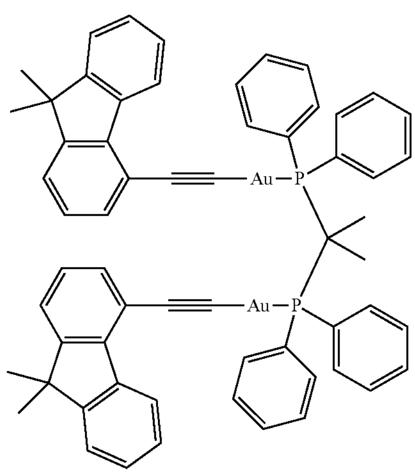
-continued
190
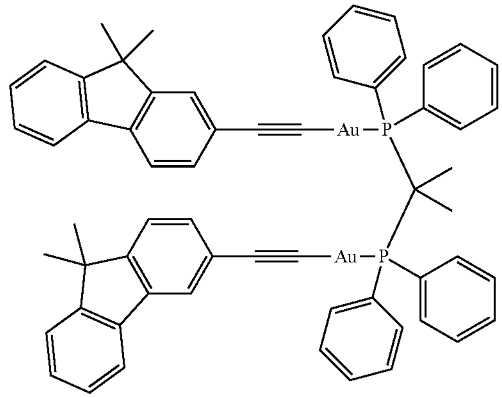
191
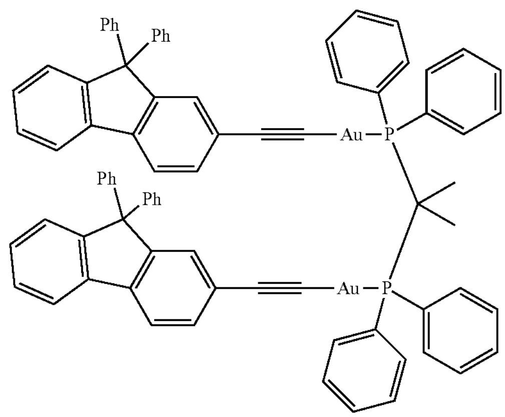
192
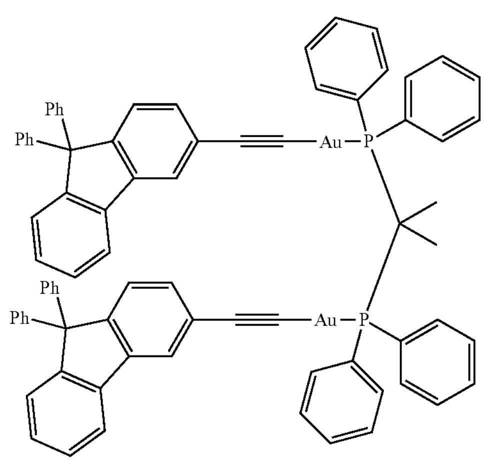

-continued
193
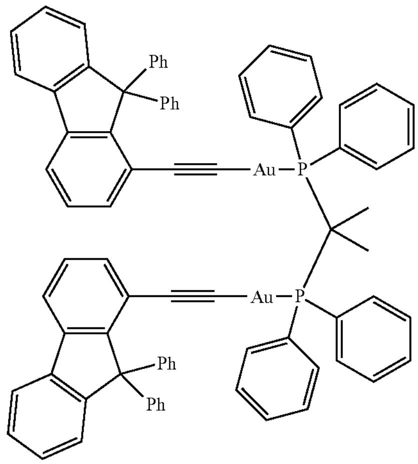
194
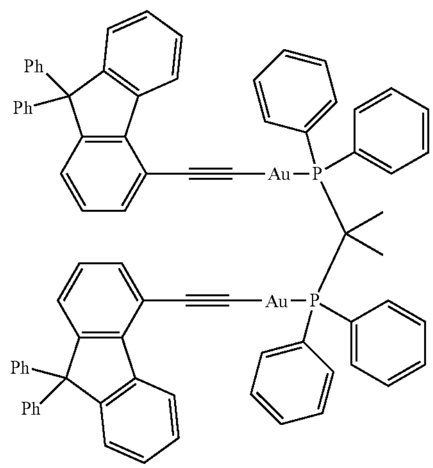
195
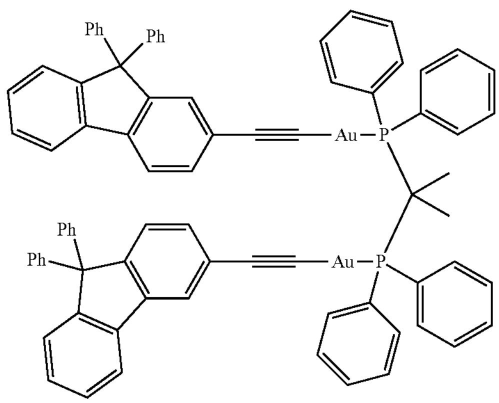
-continued
196
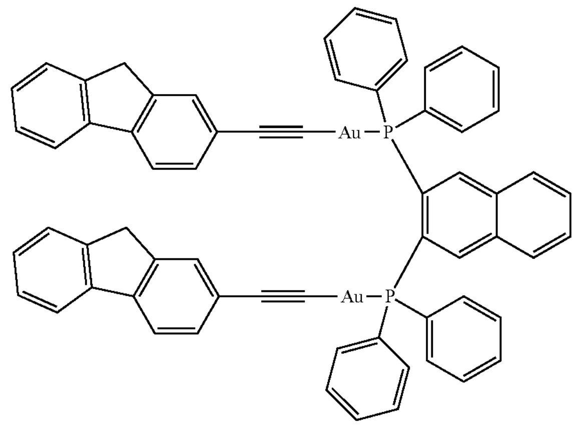
197
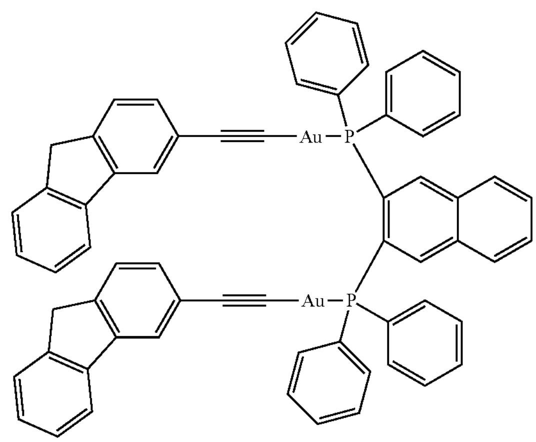
198
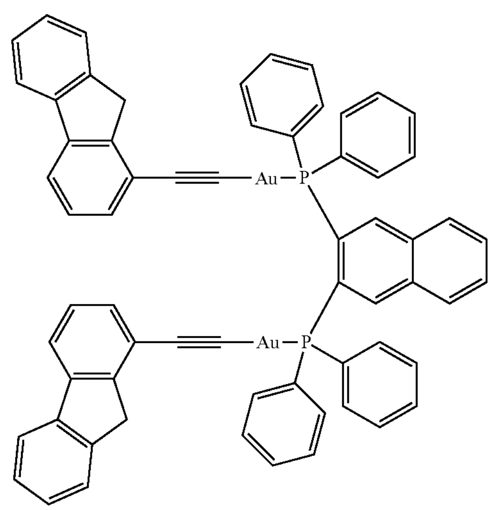

-continued
199
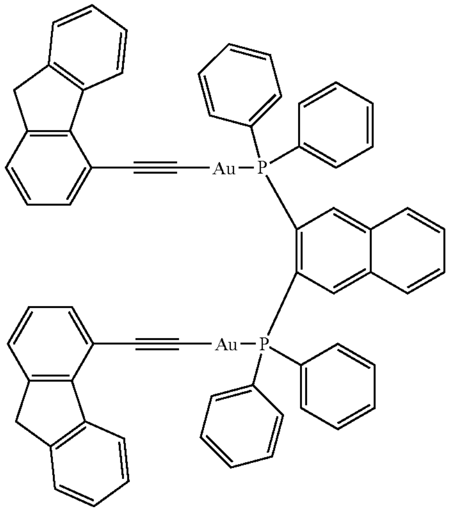
200
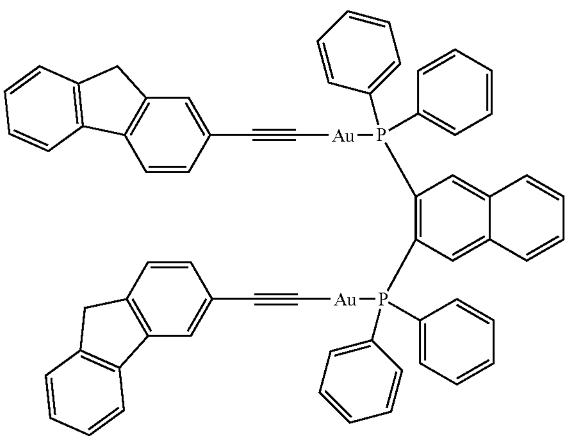
201
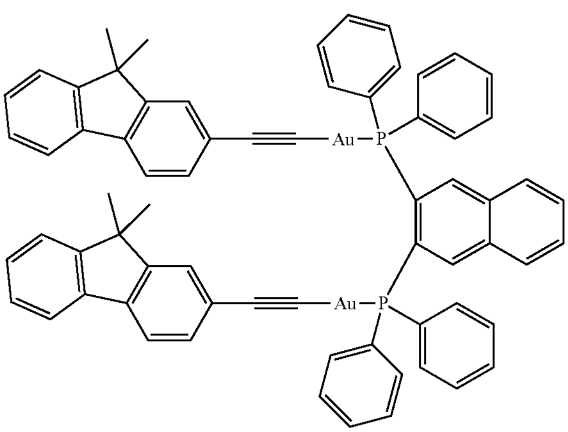
-continued
202
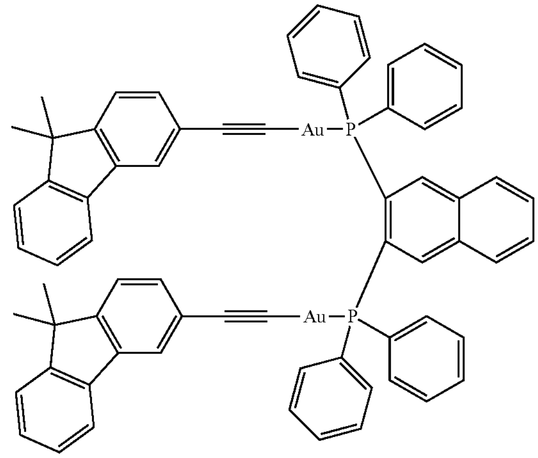
203
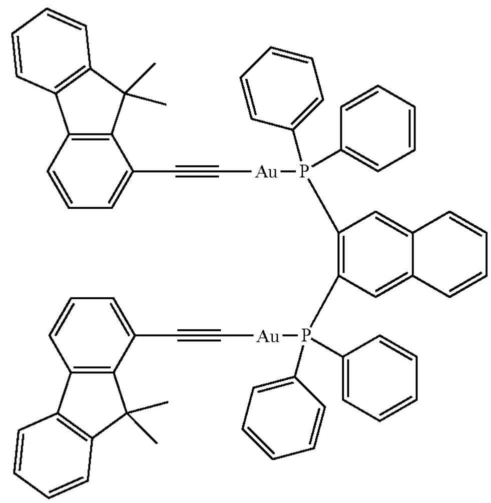
204
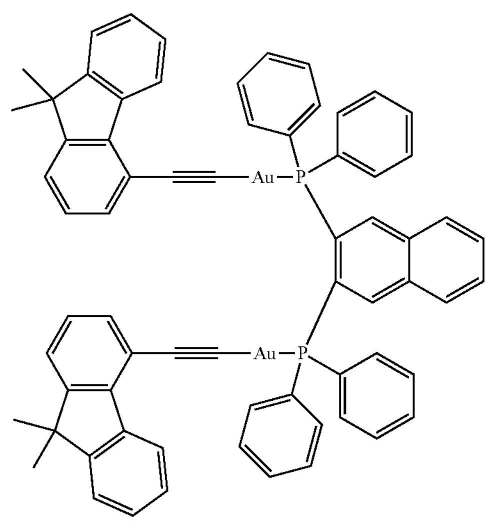

205
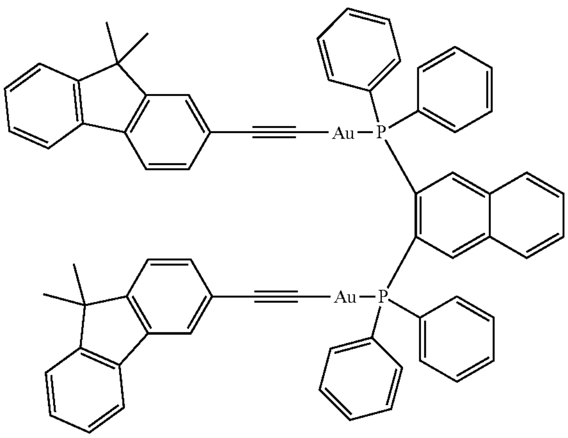
206
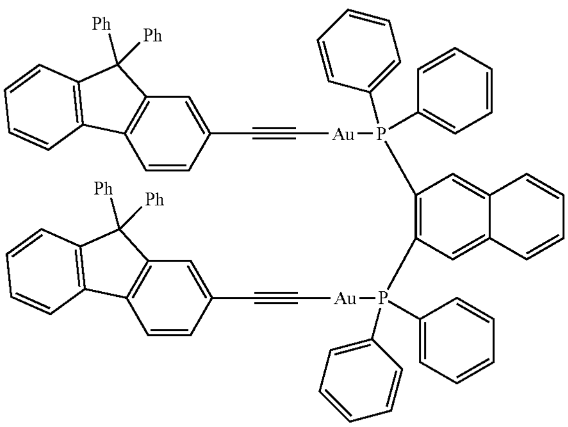
207
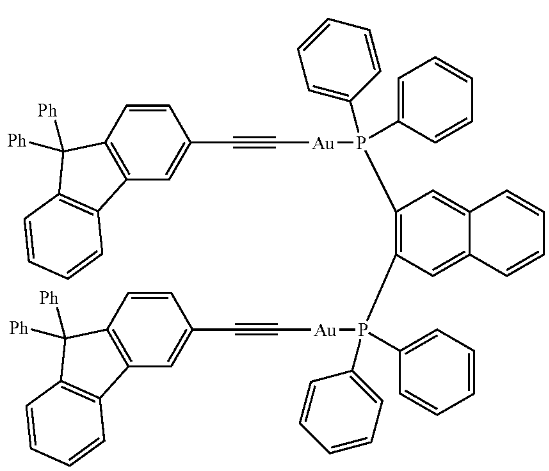
208
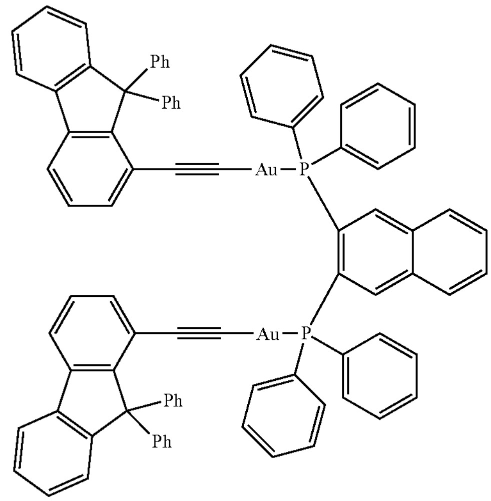
209
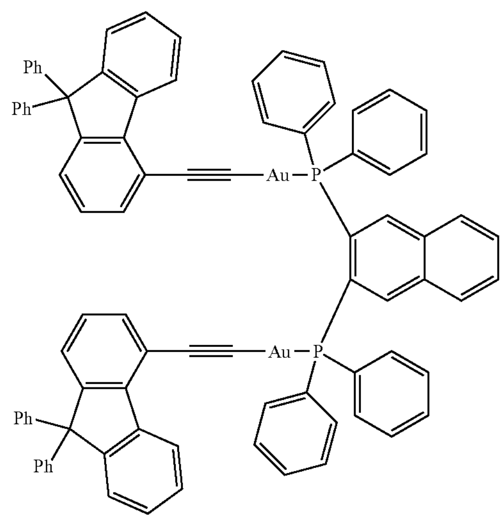
210
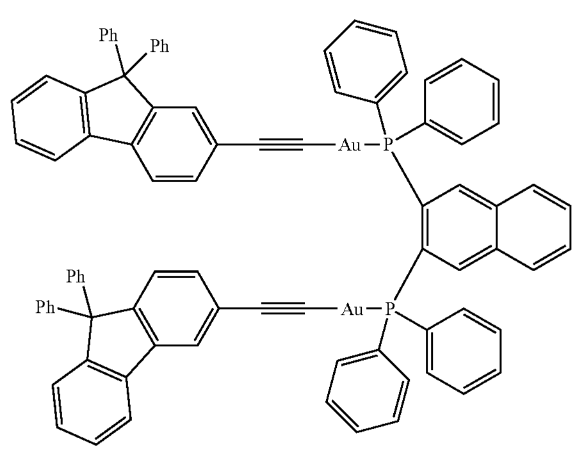

-continued
211
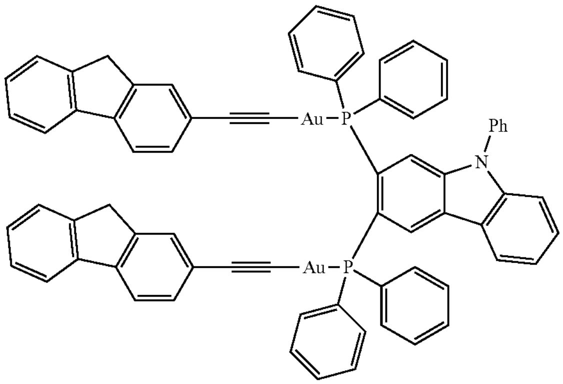
212
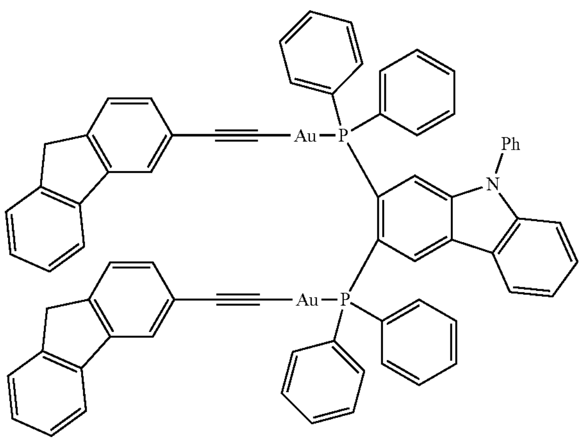
213
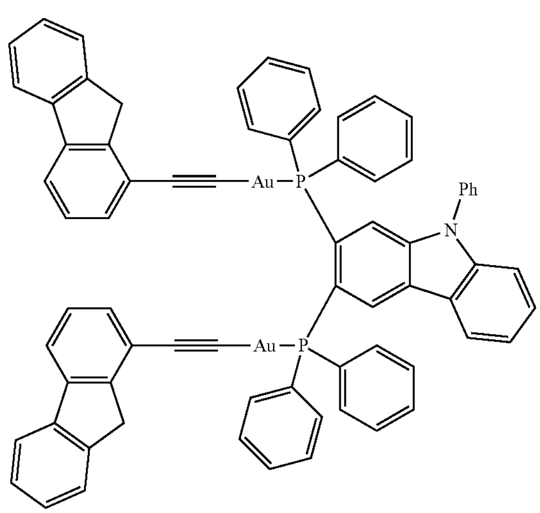
-continued
214
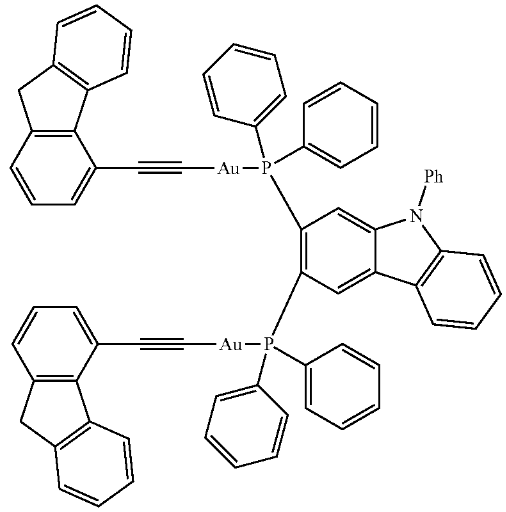
215
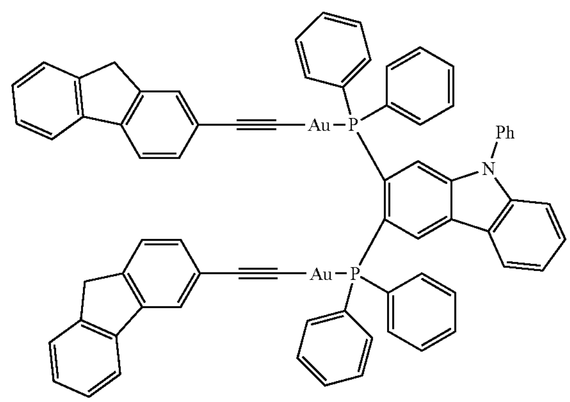
216
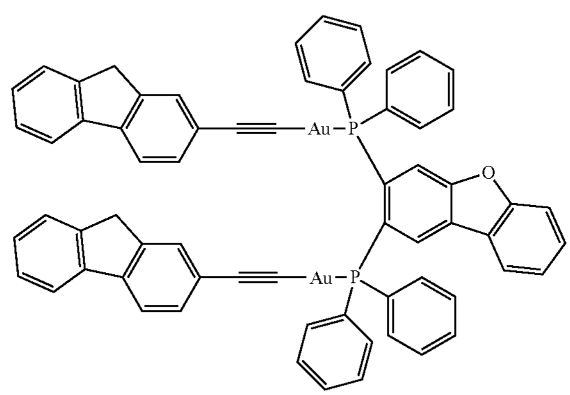

-continued
217
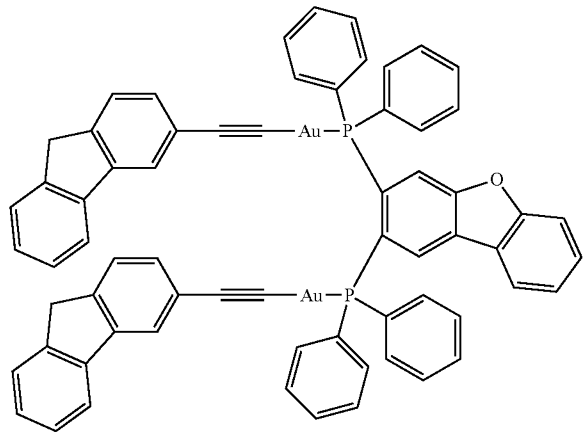
218
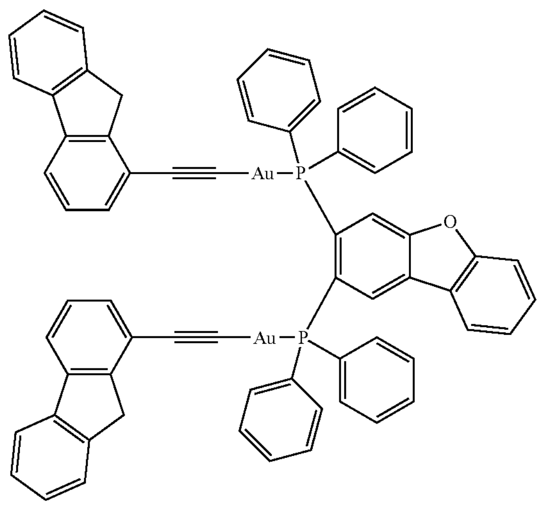
219
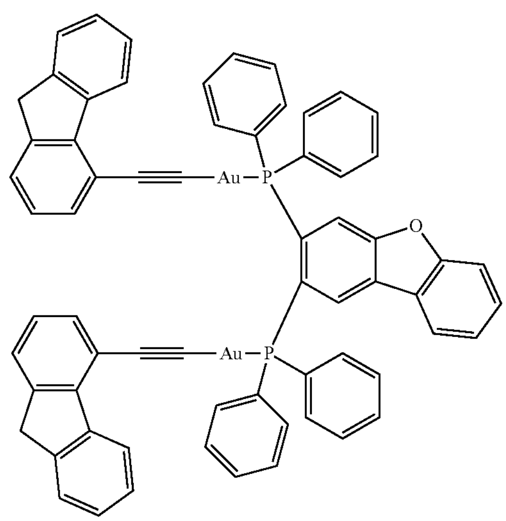
-continued
220
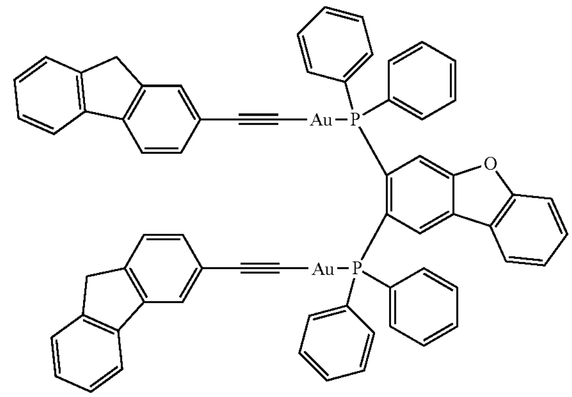
221
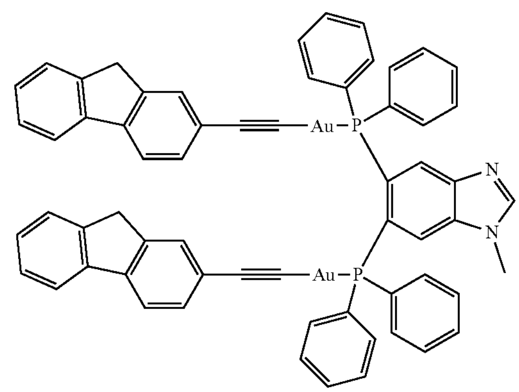
222
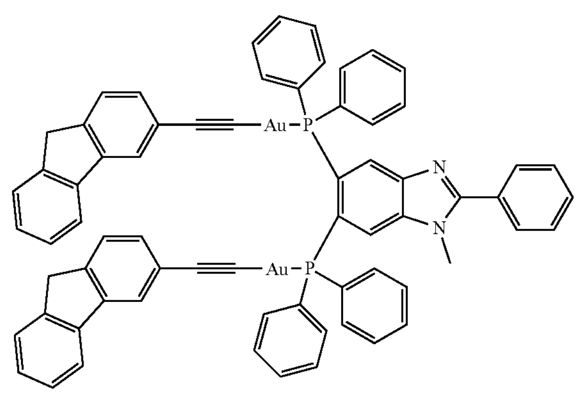

223
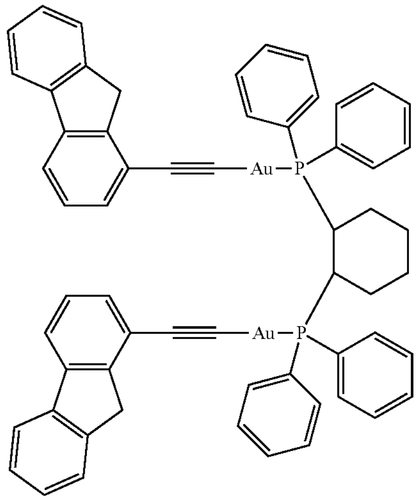
224
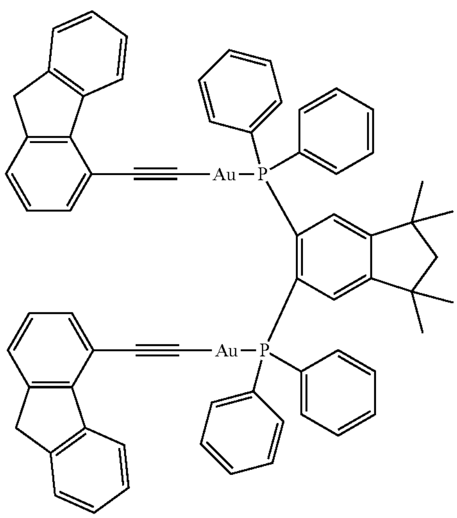
225
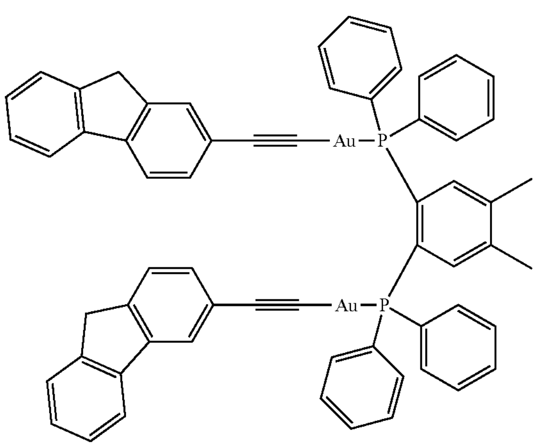
226
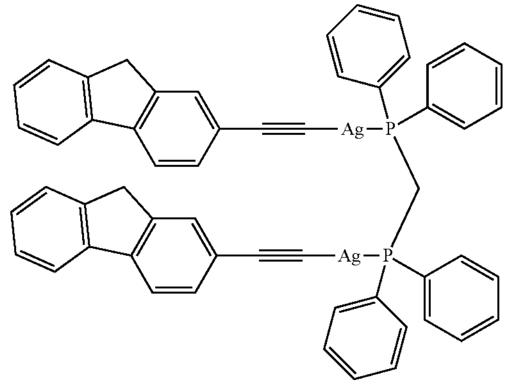
227
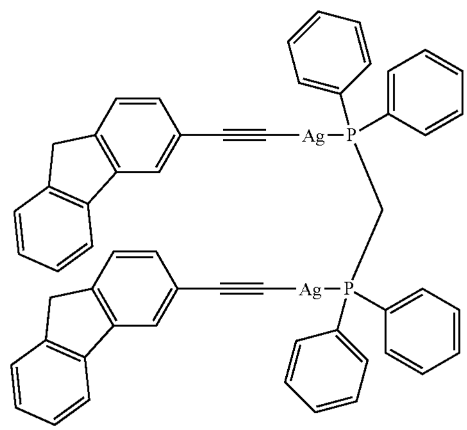
228
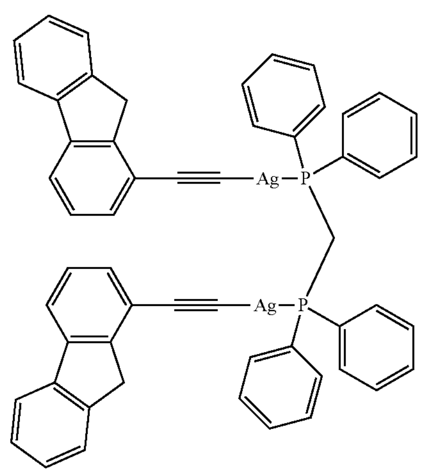

229
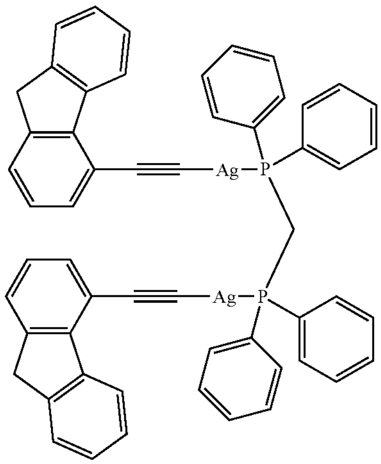
230
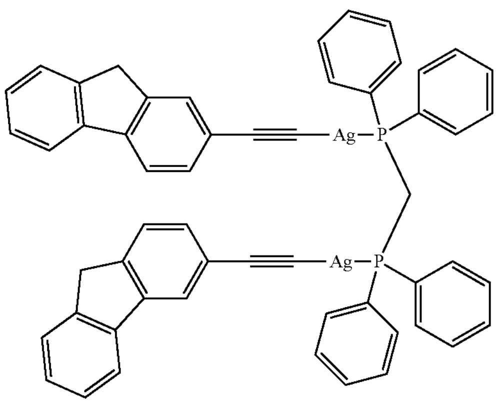
231
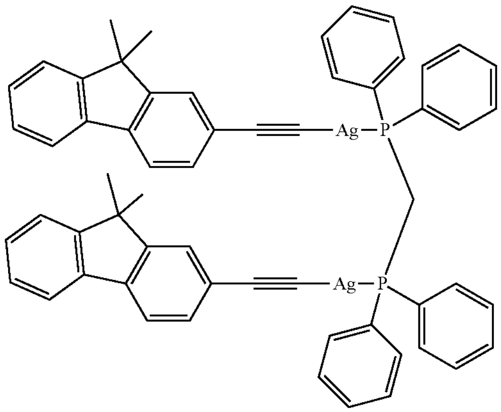
232
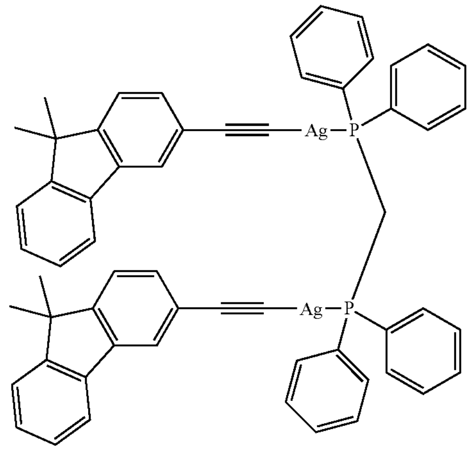
233
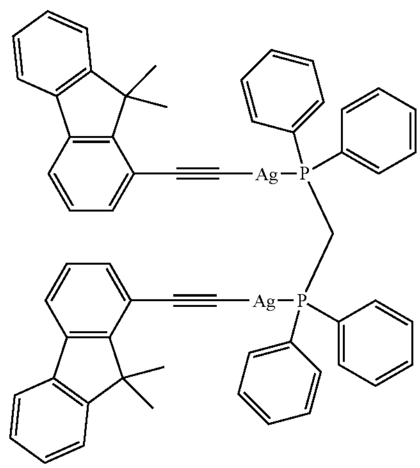
234
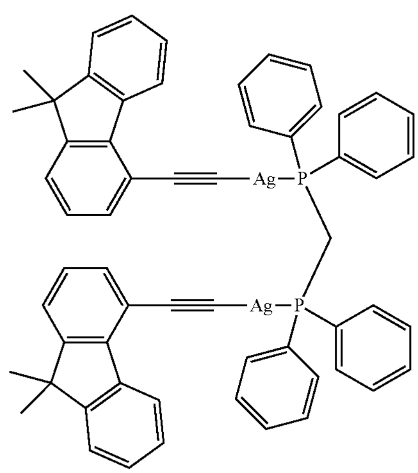

235
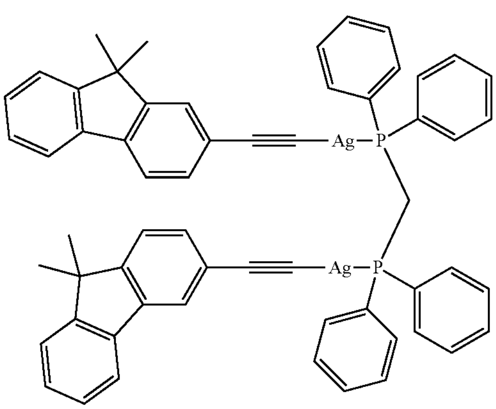
236
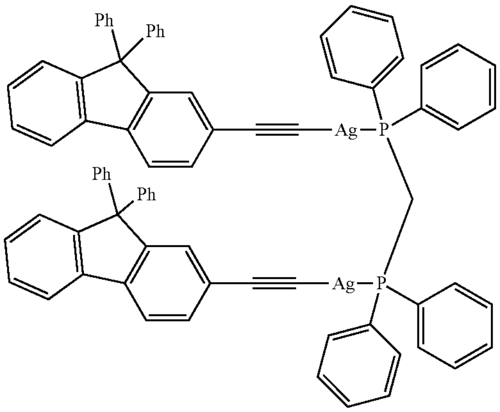
237
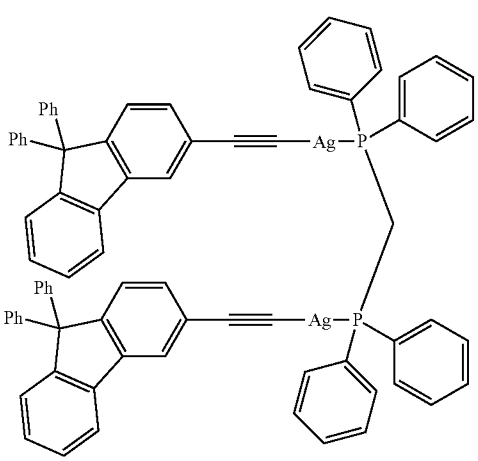
238
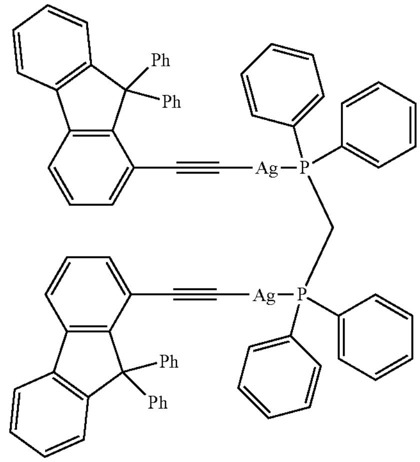
239
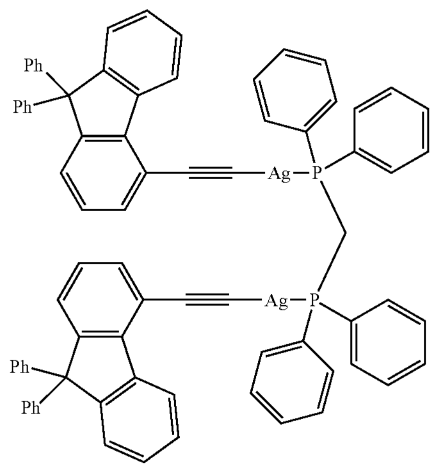
240
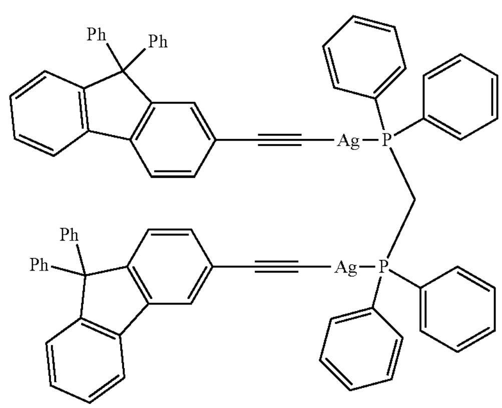

-continued
241
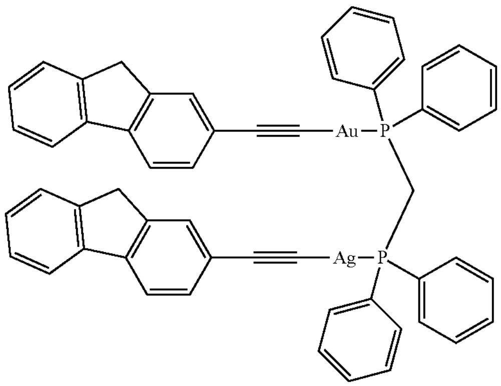
242
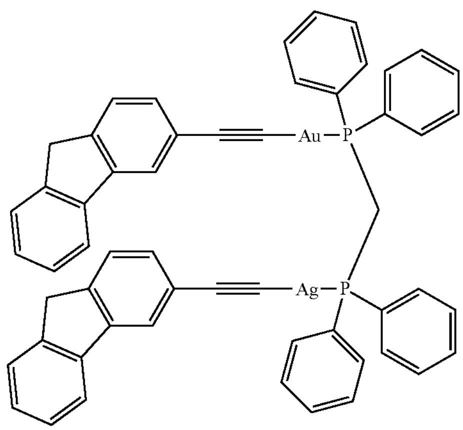
243
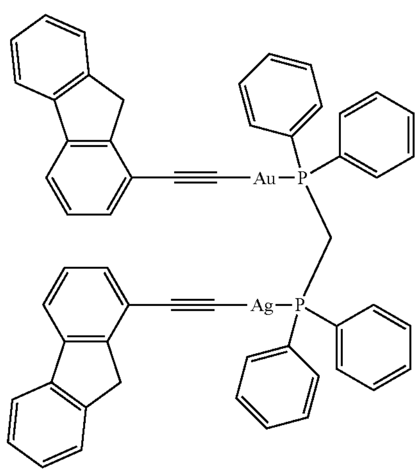
-continued
244
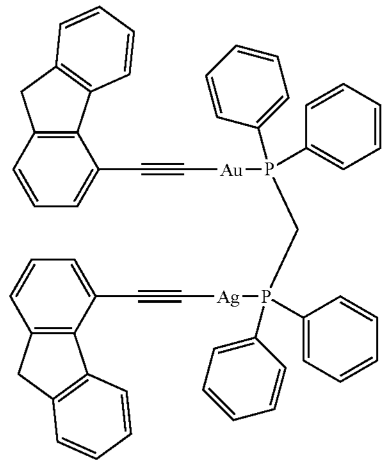
245
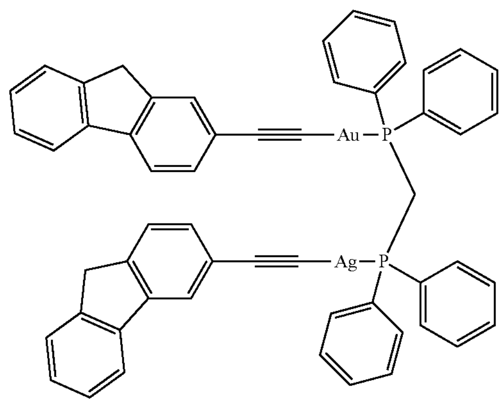
246
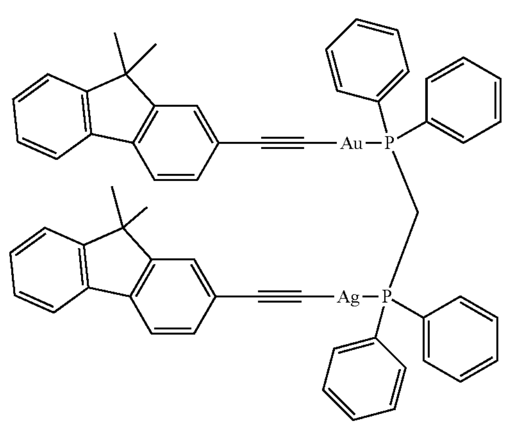

247
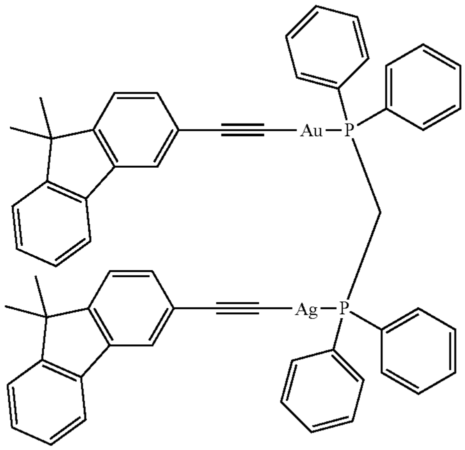
248
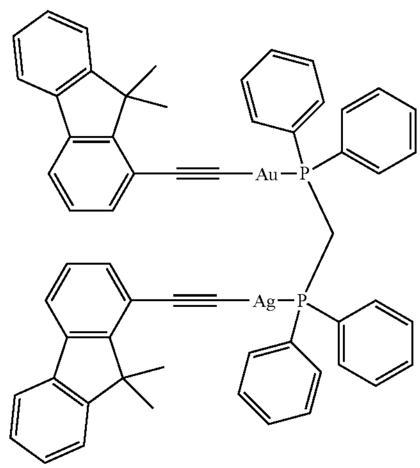
249
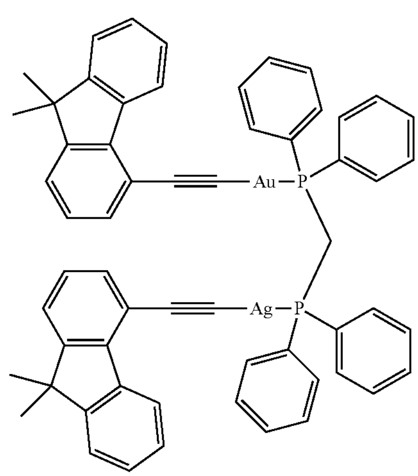
250
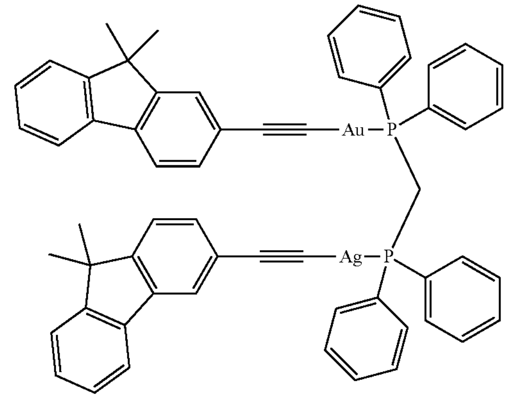
251
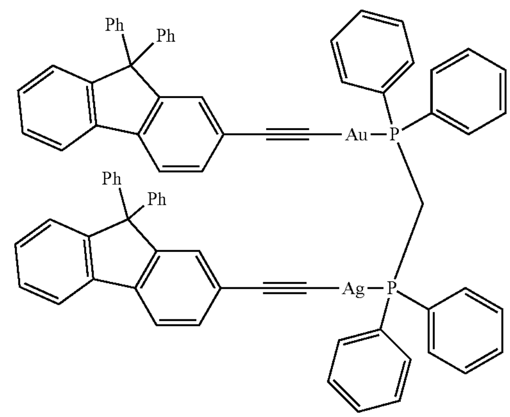
252
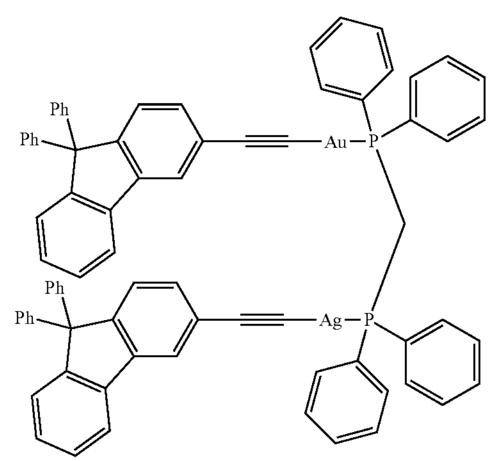

-continued
253
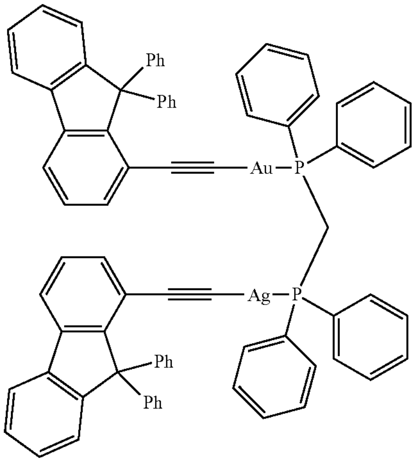
254
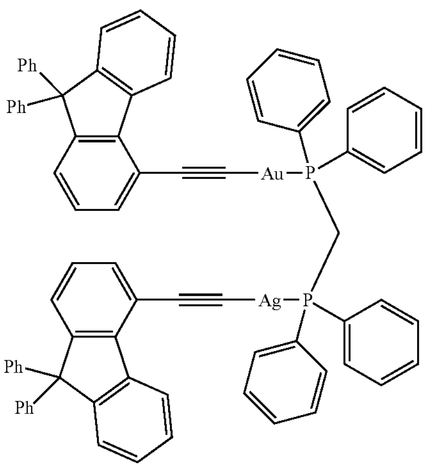
255
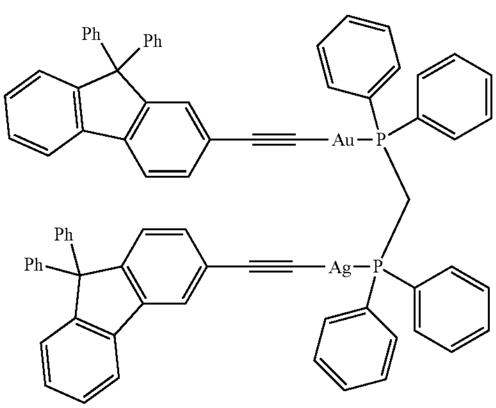
-continued
256
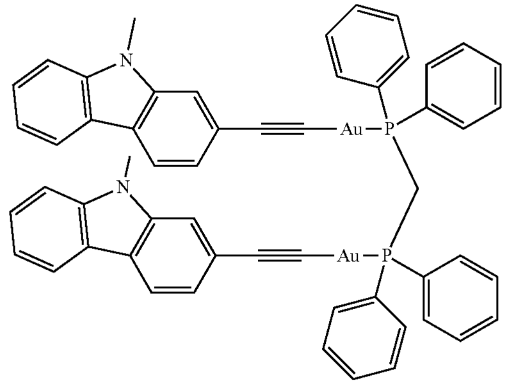
257
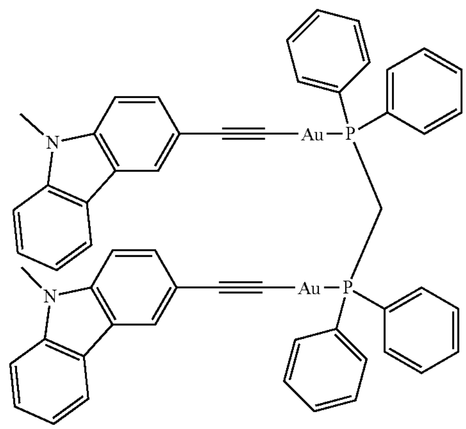
258
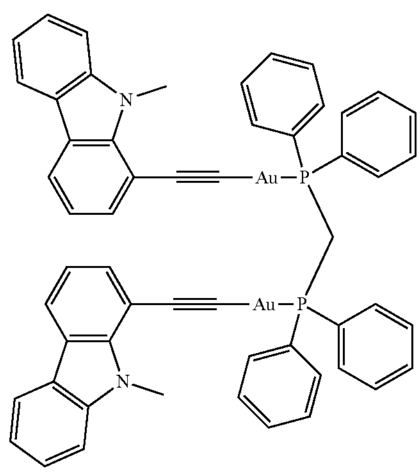

-continued
259
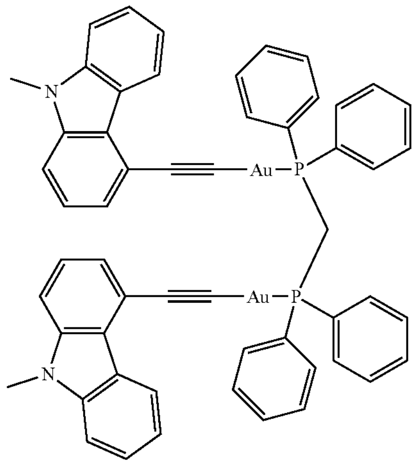
260
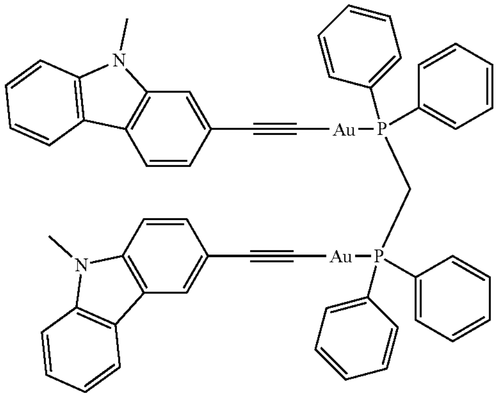
261
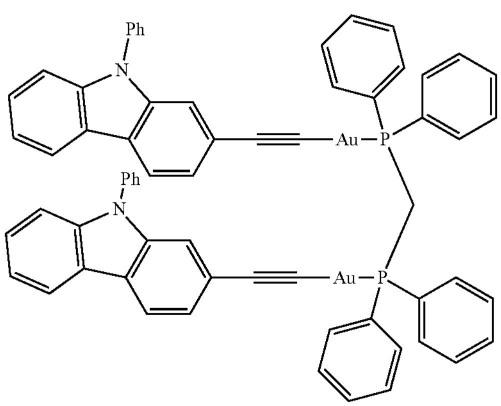
-continued
262
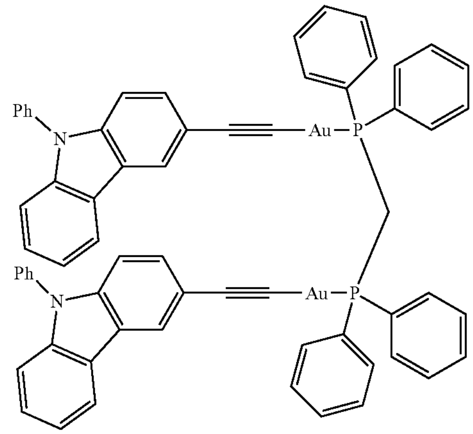
263
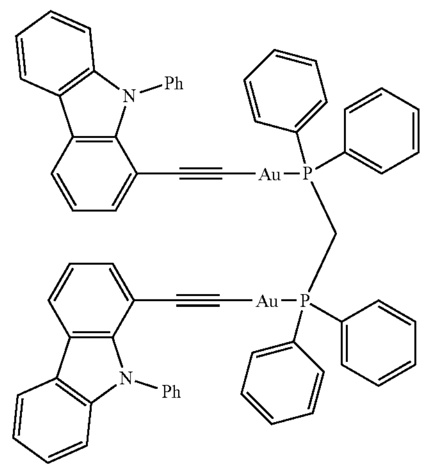
264
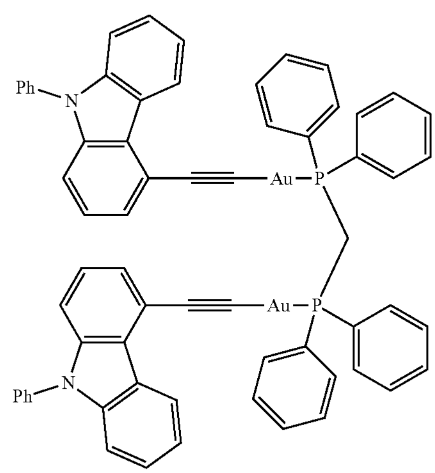

-continued
265
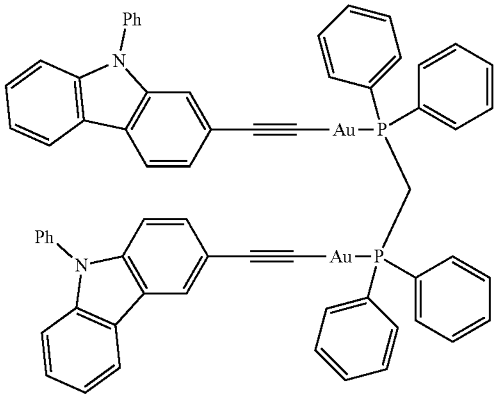
266
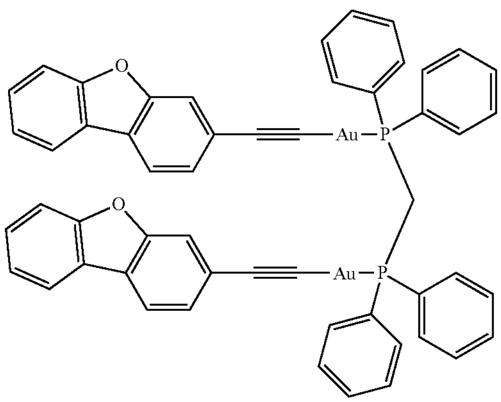
267
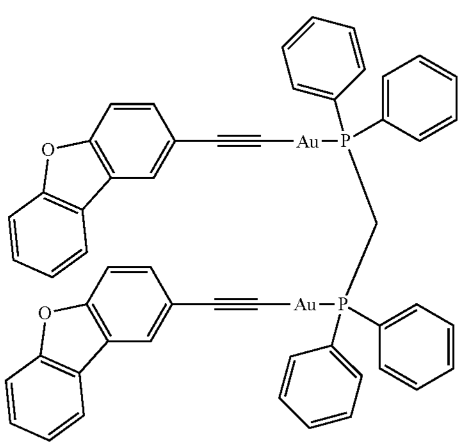
-continued
268
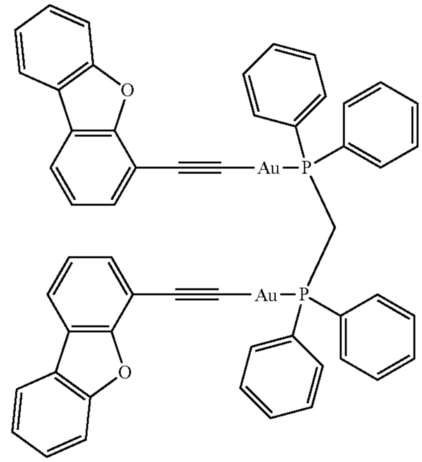
269
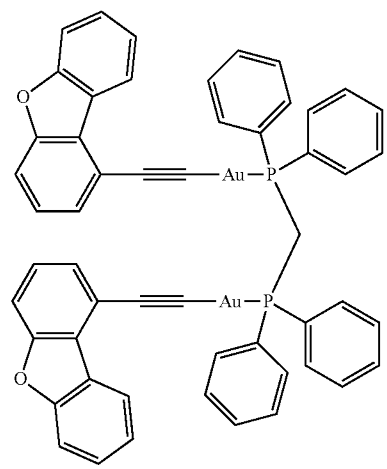
270
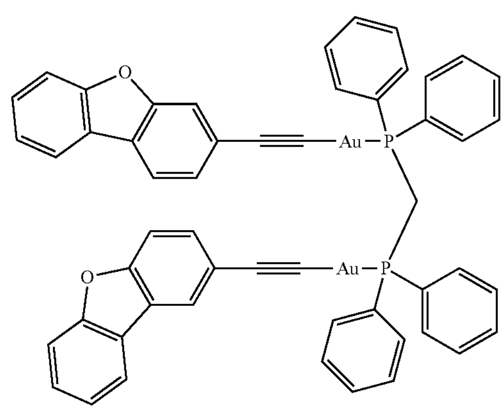

-continued
271
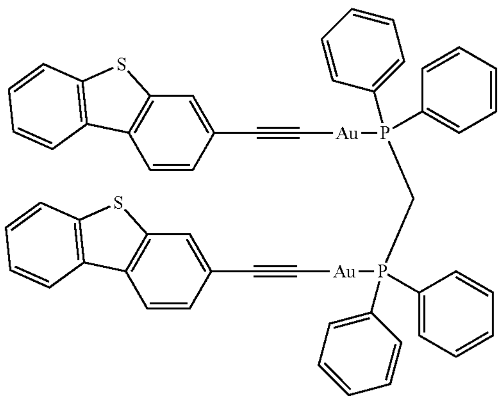
272
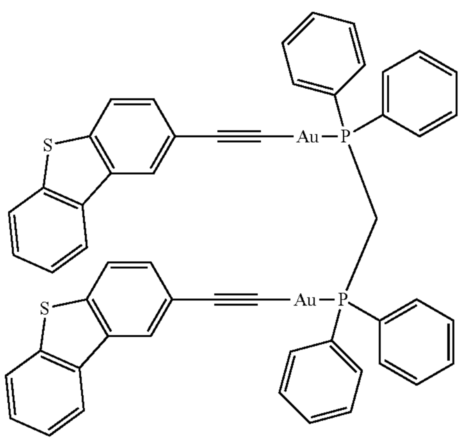
273
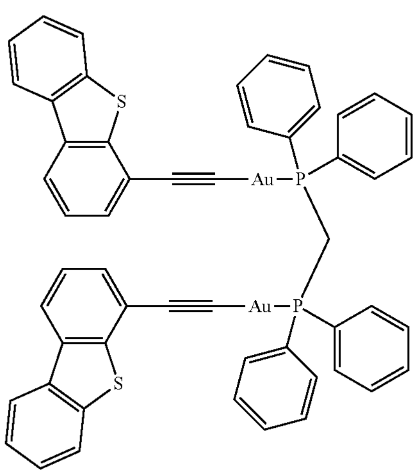
-continued
274
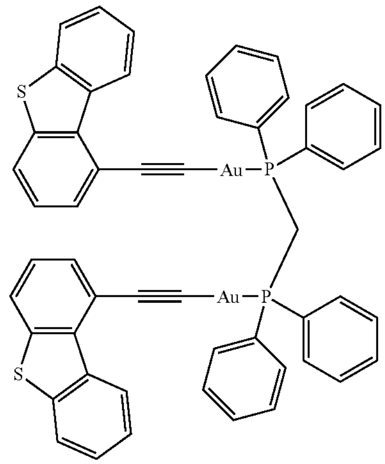
275
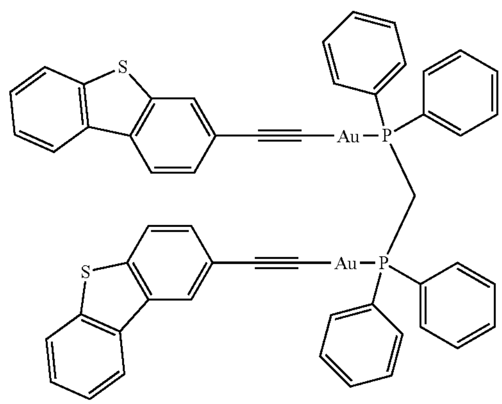
276
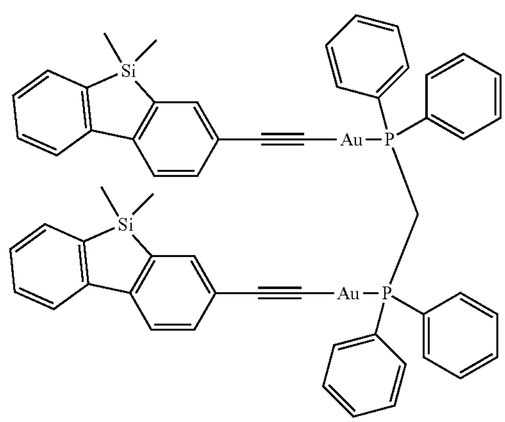

-continued
277
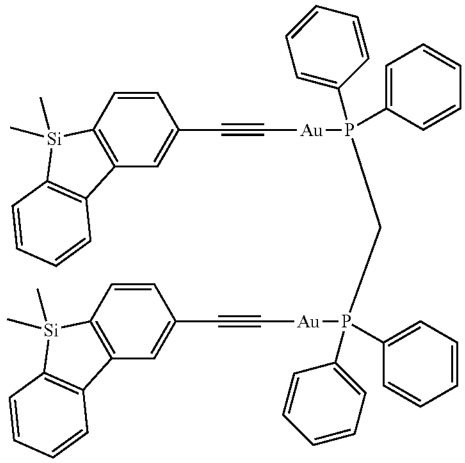
278
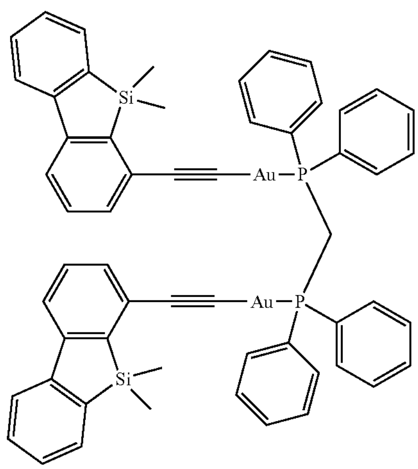
279
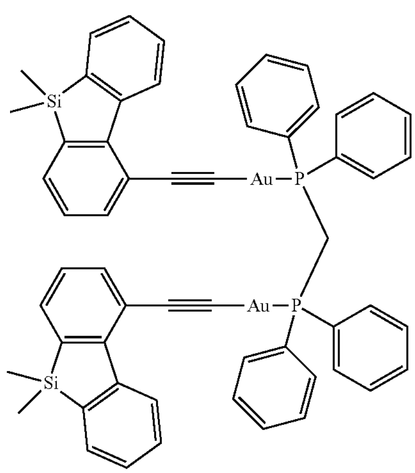
-continued
280
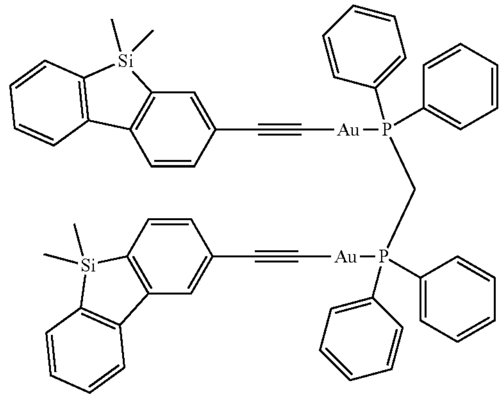
281
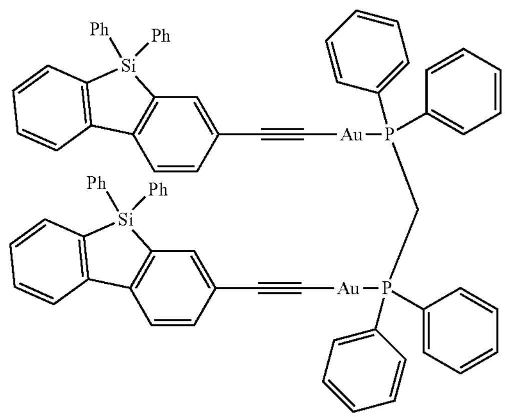
282
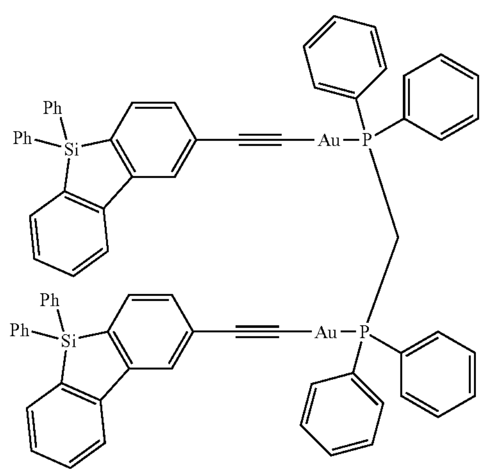

-continued
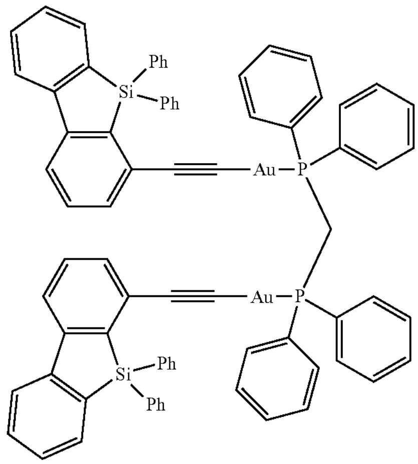
283
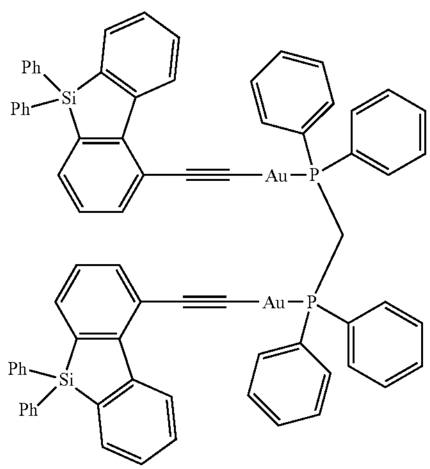
284
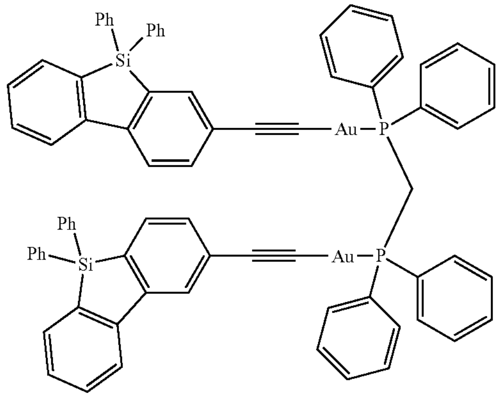
285
-continued
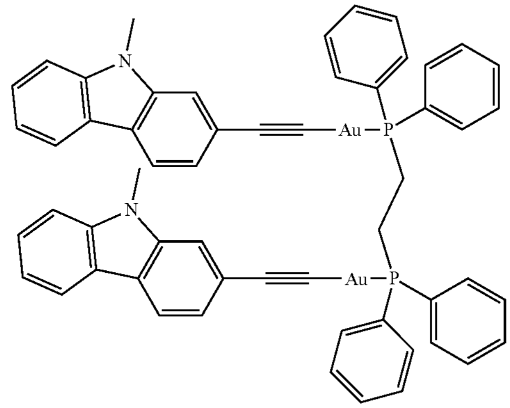
286
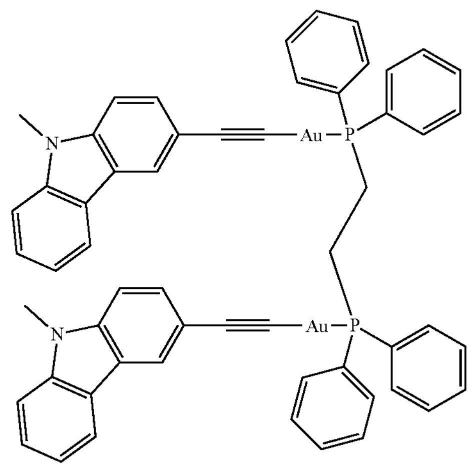
287
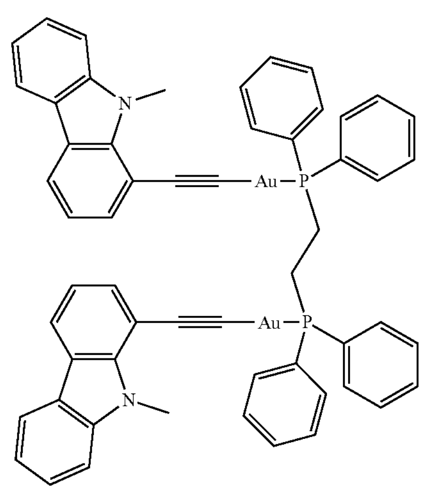
288

-continued
289
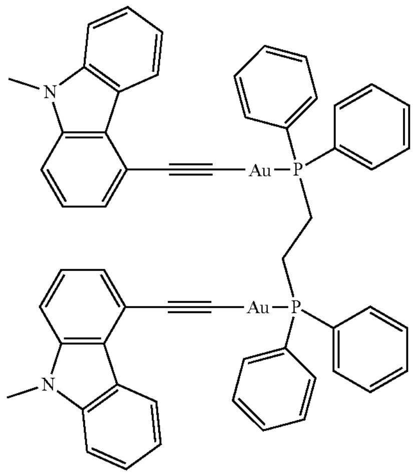
290
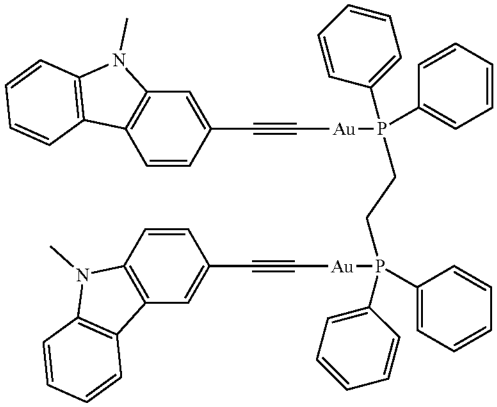
291
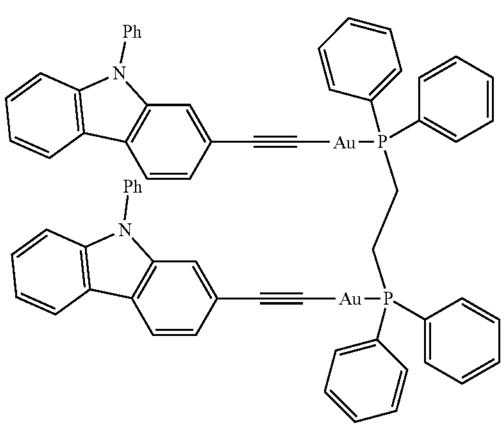
-continued
292
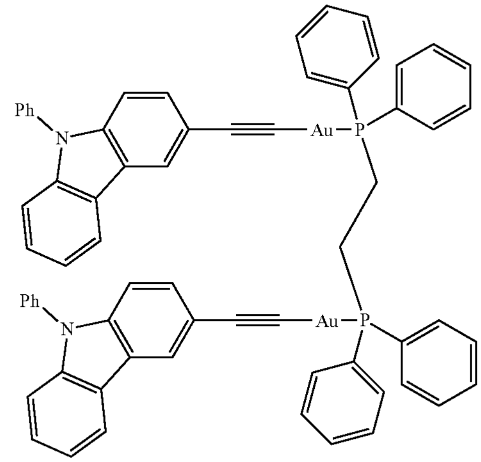
293
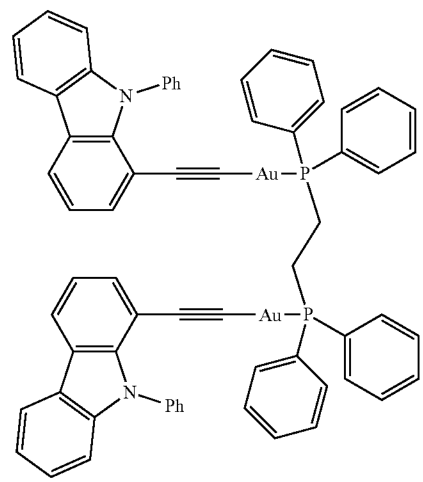
294
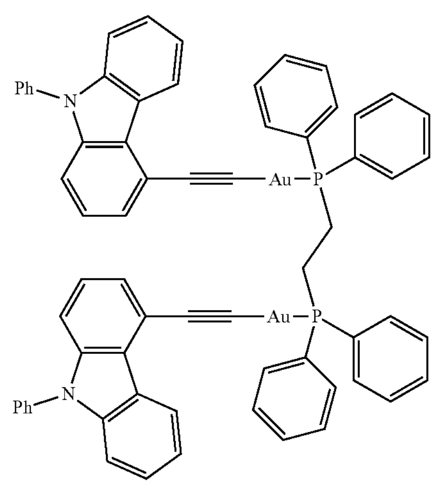

-continued
295
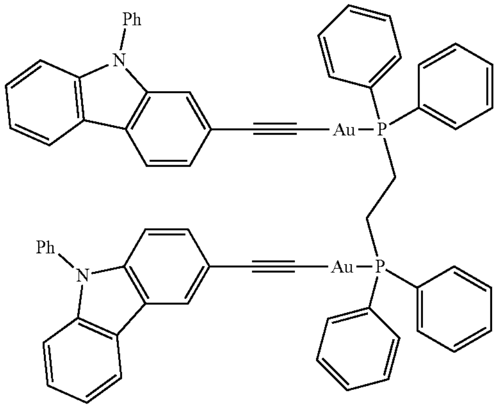
296
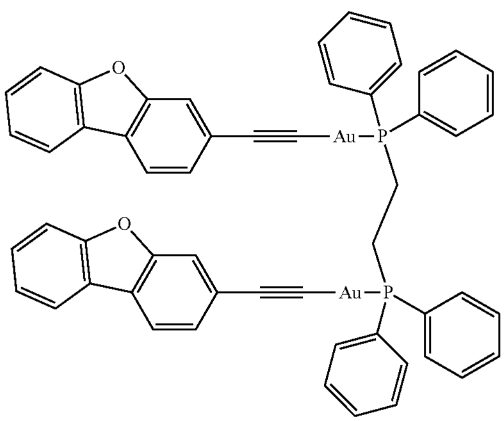
297
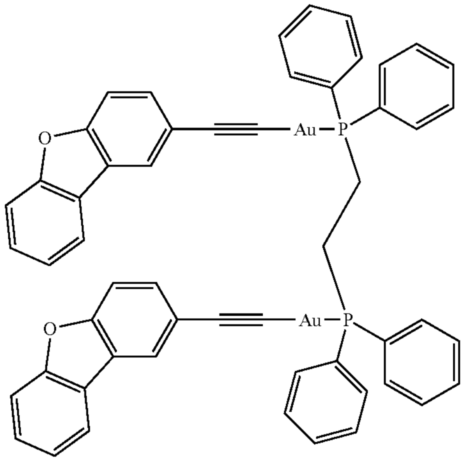
-continued
298
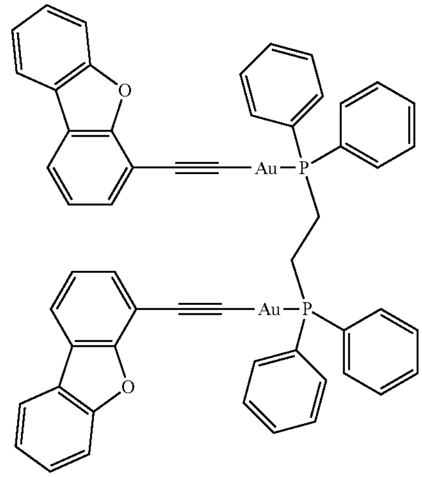
299
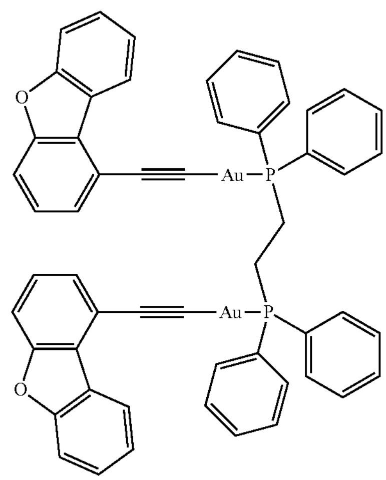
300
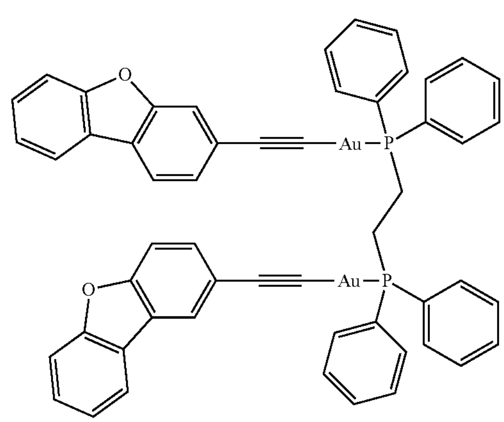

-continued
301
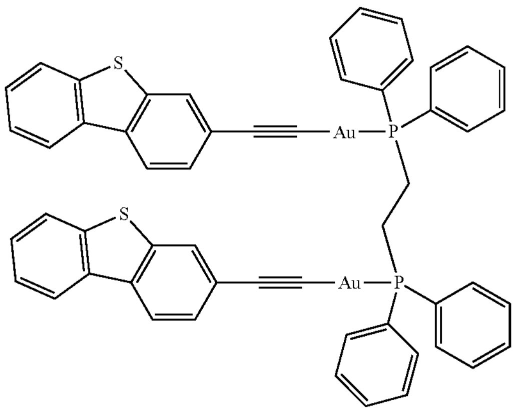
302
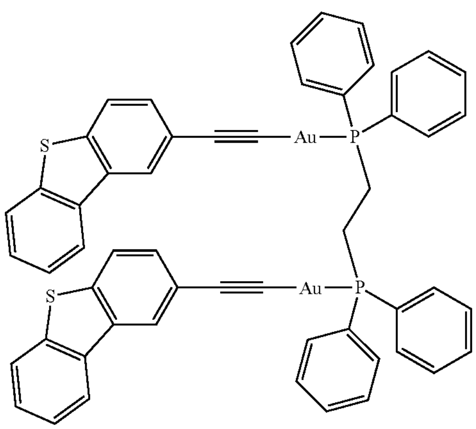
303
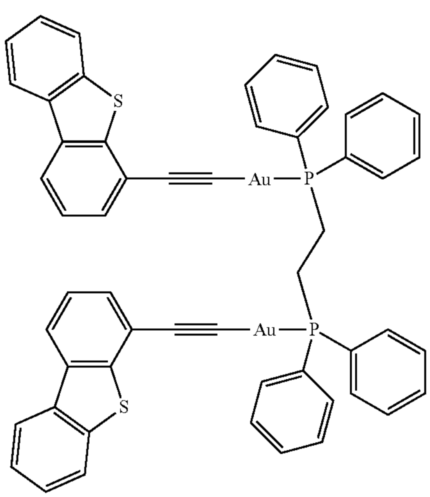
304
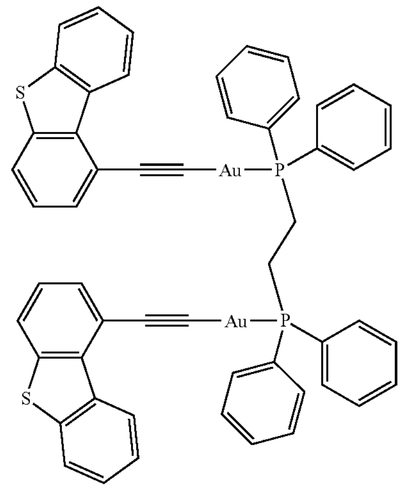
305
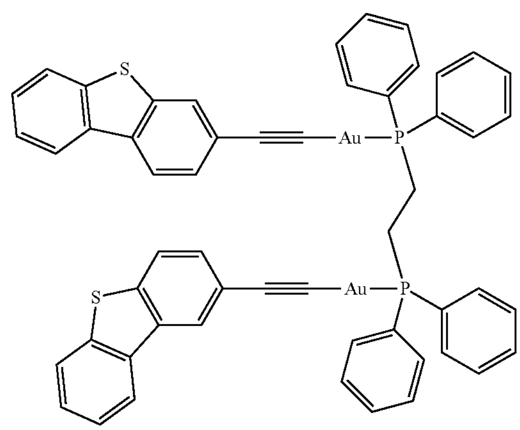
306
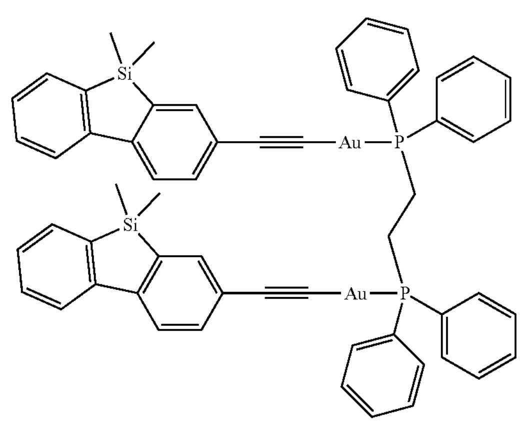

-continued
307
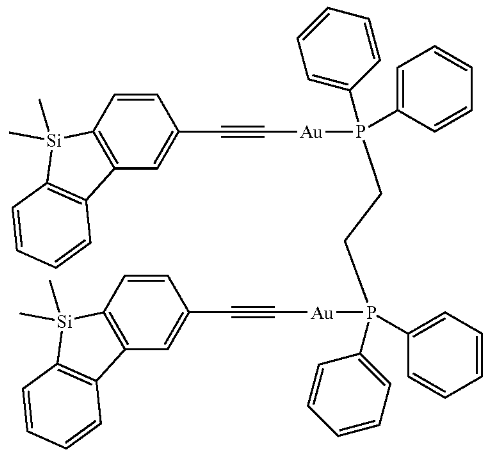
308
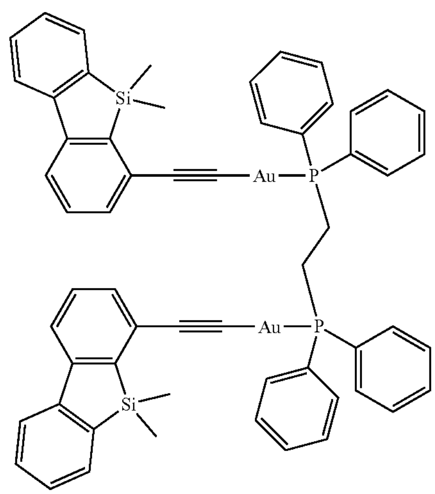
309
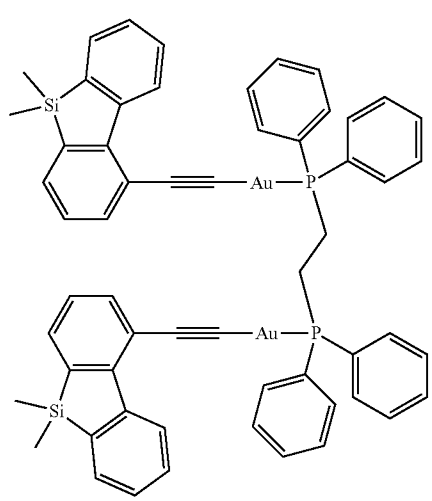
-continued
310
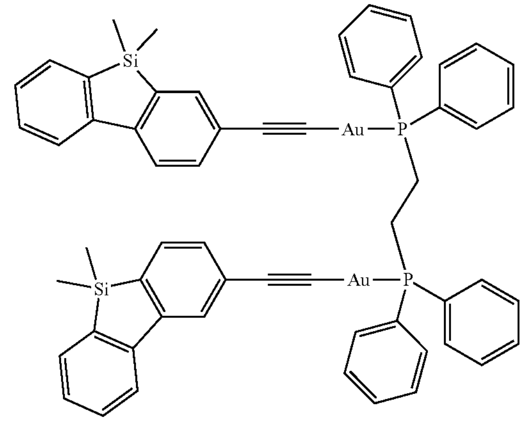
311
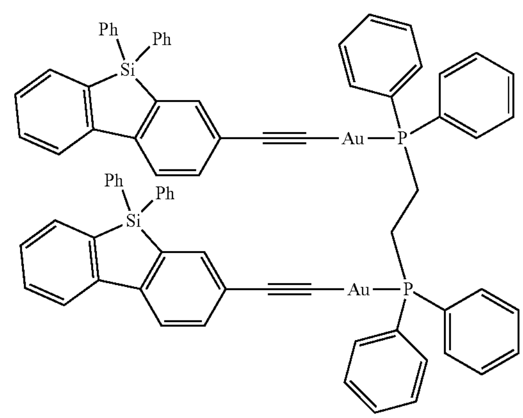
312
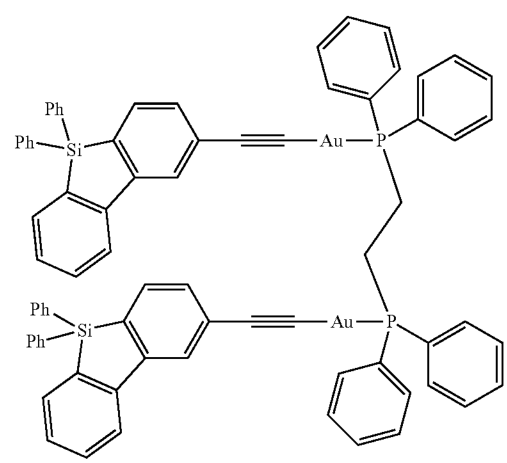

313
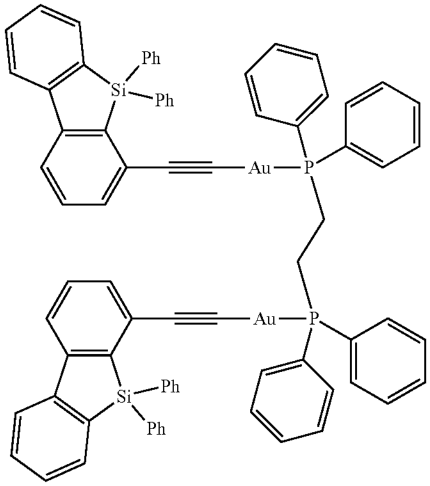
314
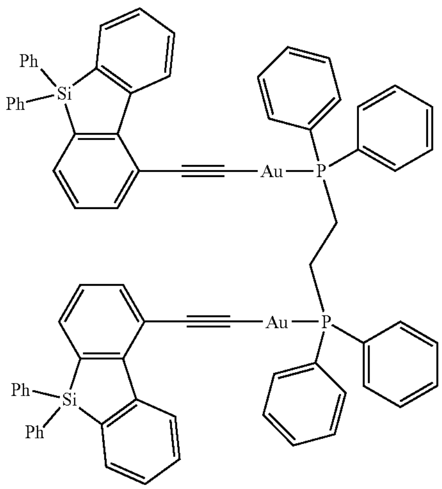
315
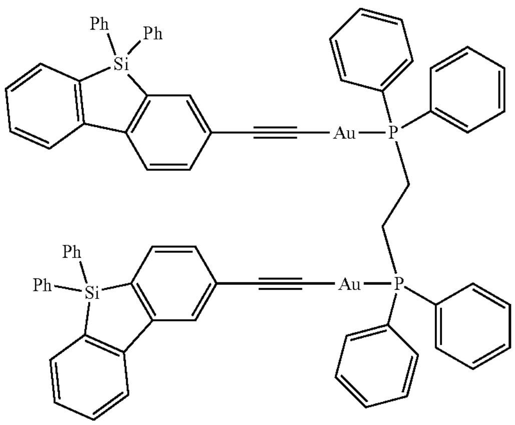
316
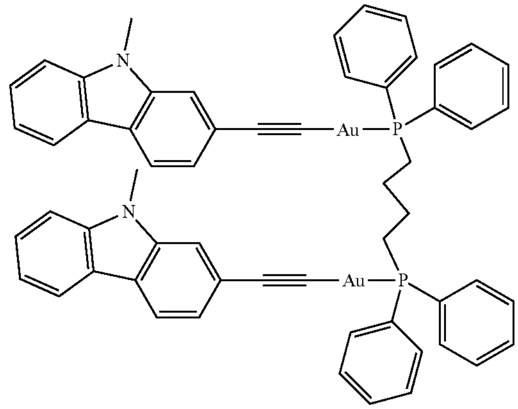
317
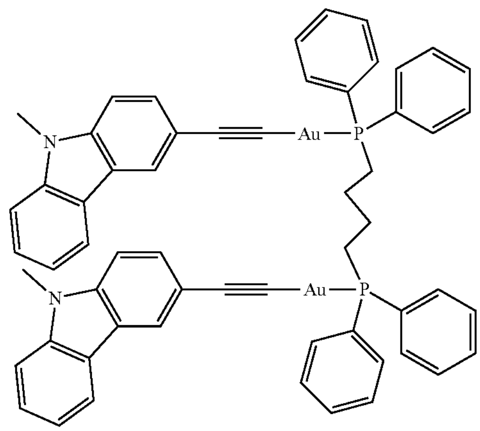
318
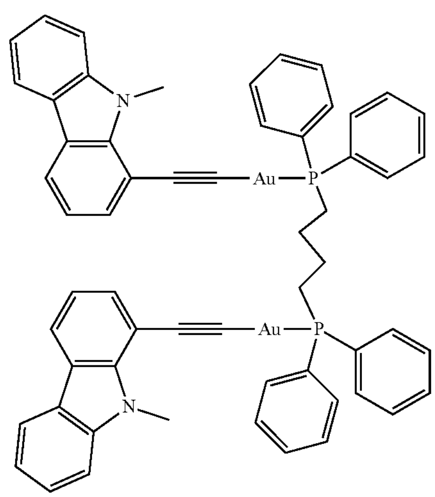

-continued
319
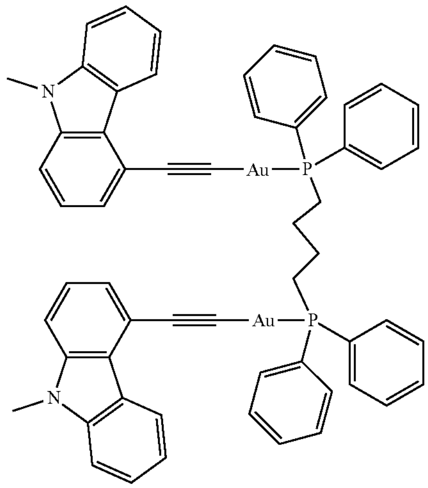
320
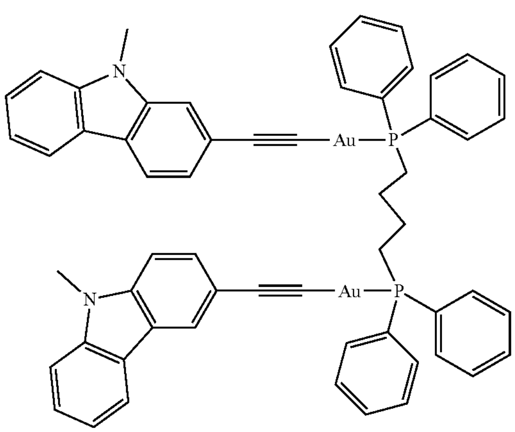
321
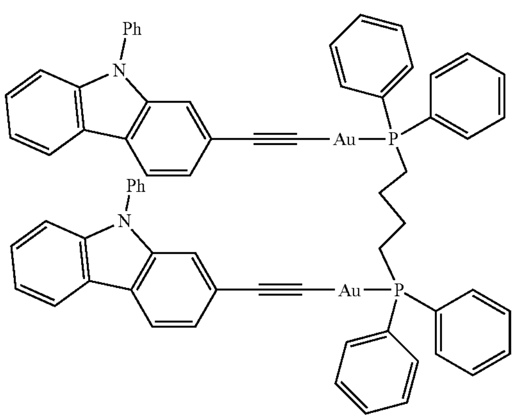
-continued
322
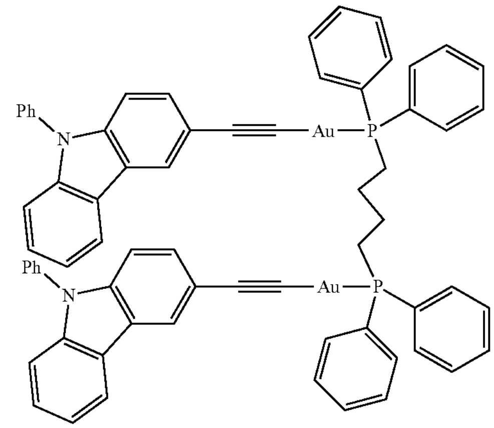
323
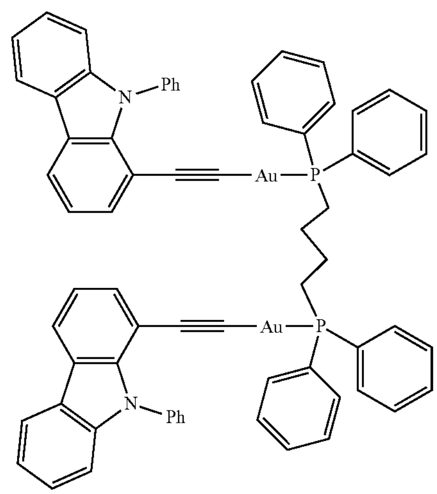
324
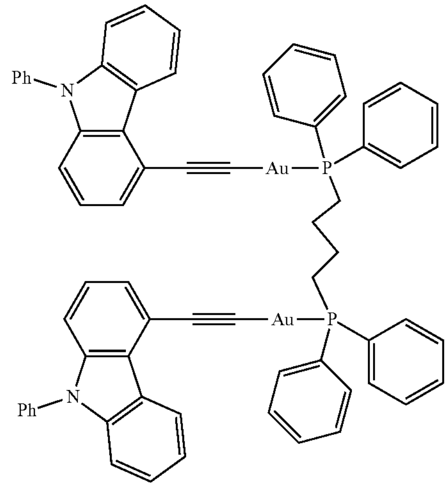

-continued
325
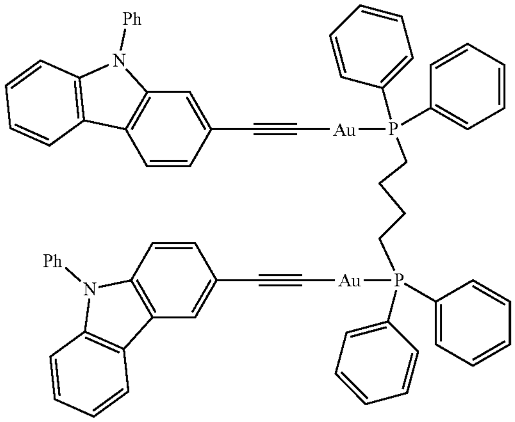
326
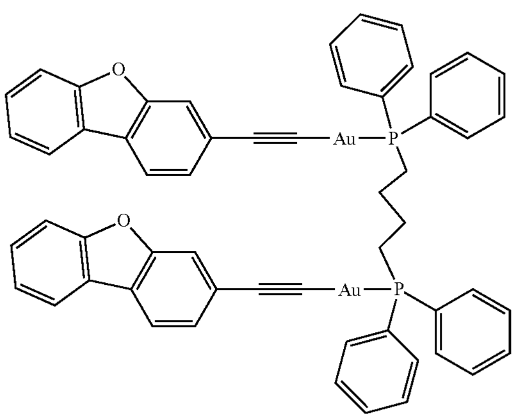
327
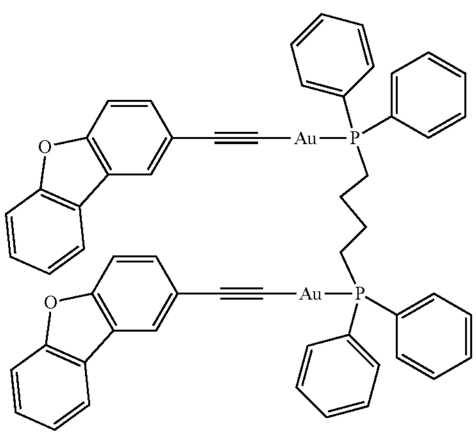
-continued
328
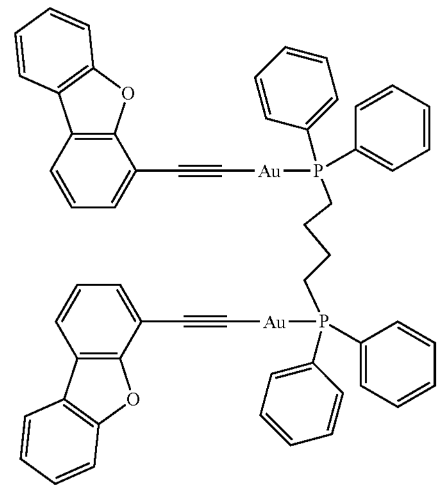
329
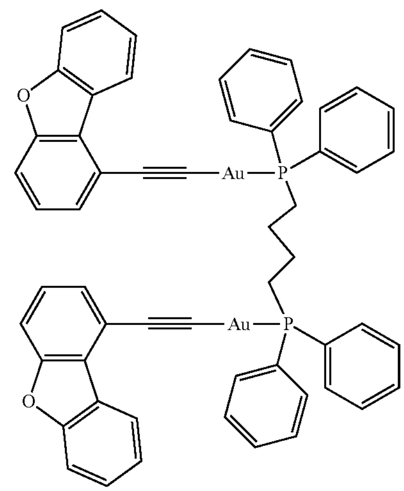
330
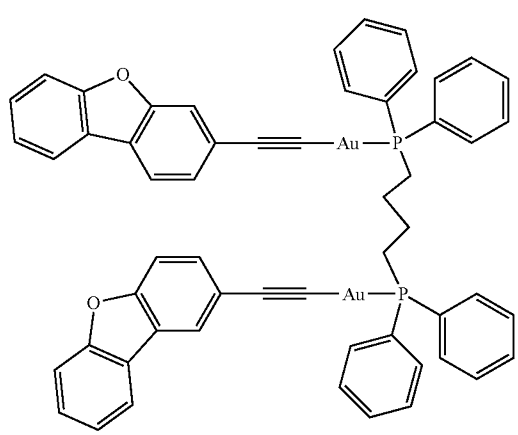

-continued
331
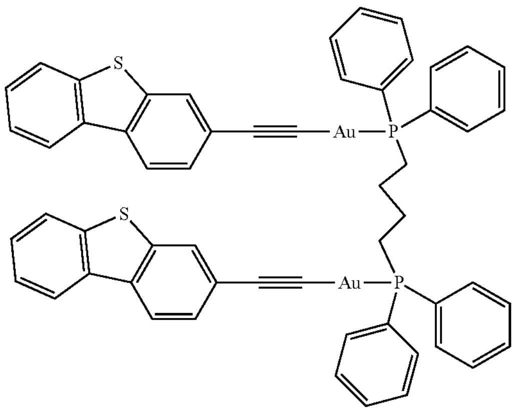
332
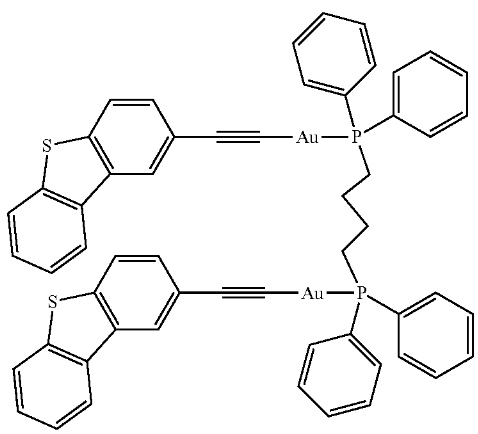
333
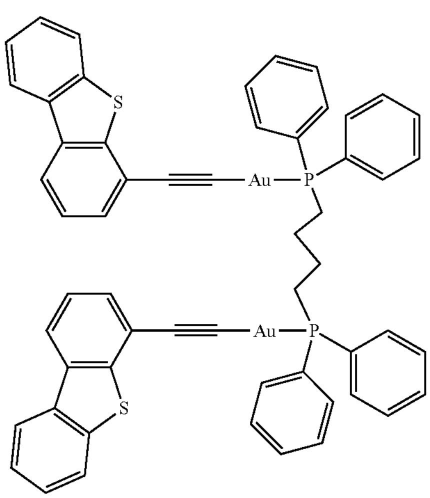
-continued
334
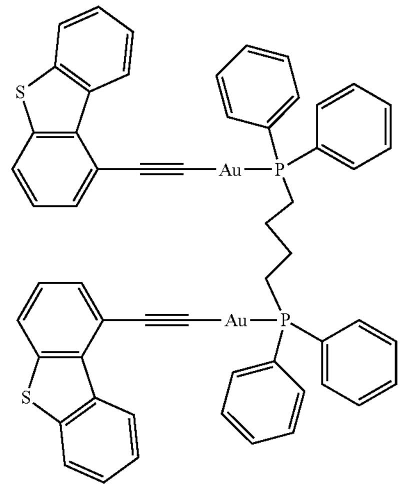
335
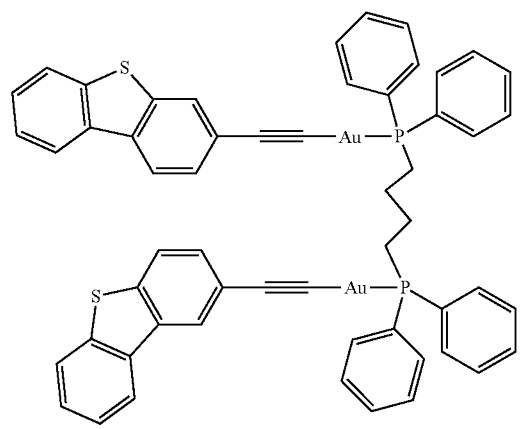
336
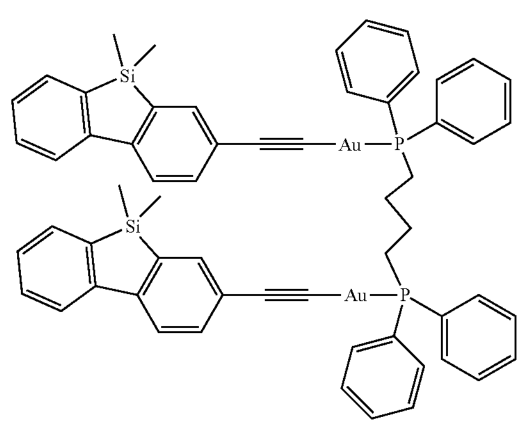

-continued
337
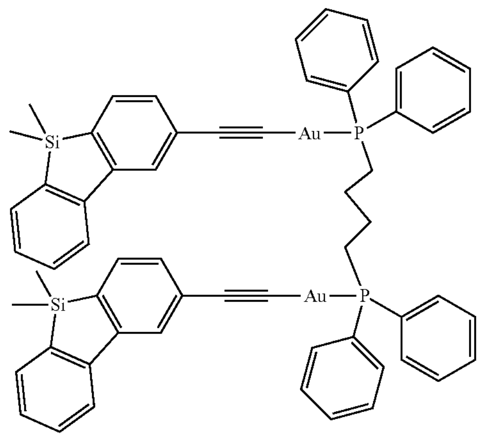
338
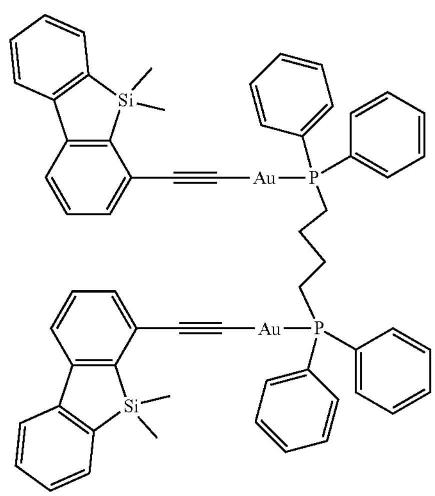
339
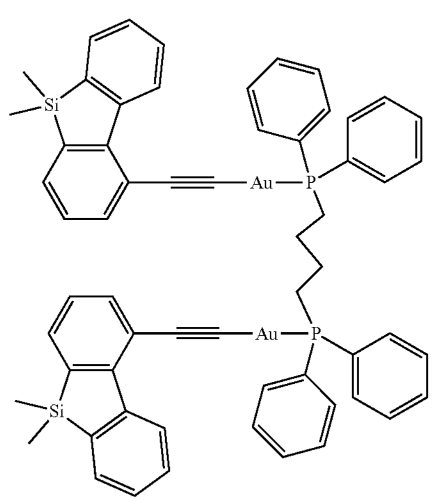
-continued
340
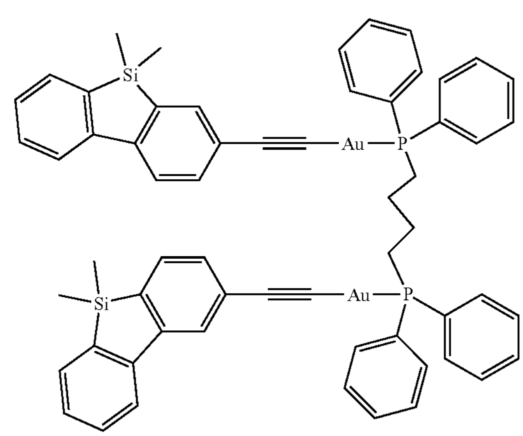
341
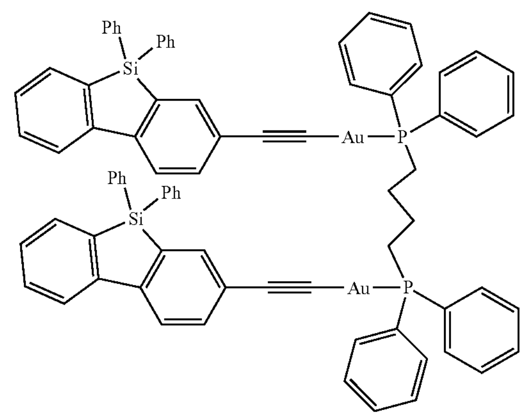
342
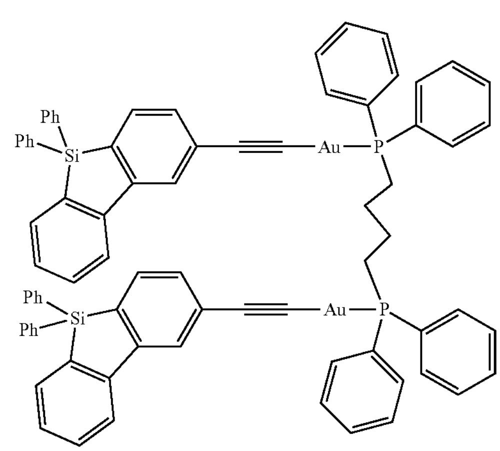

343
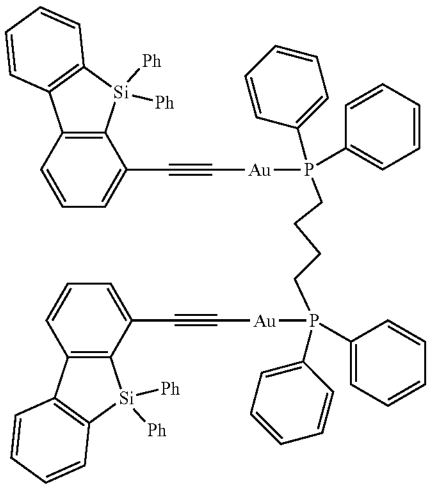
344
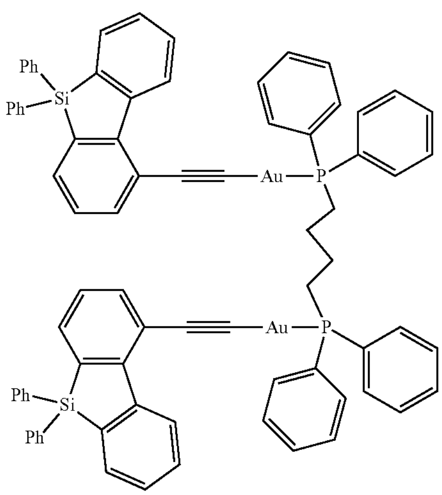
345
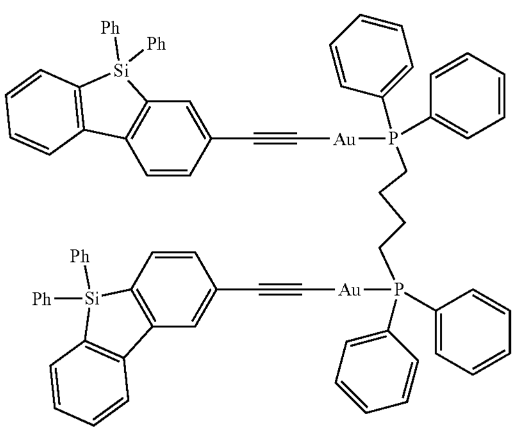
346
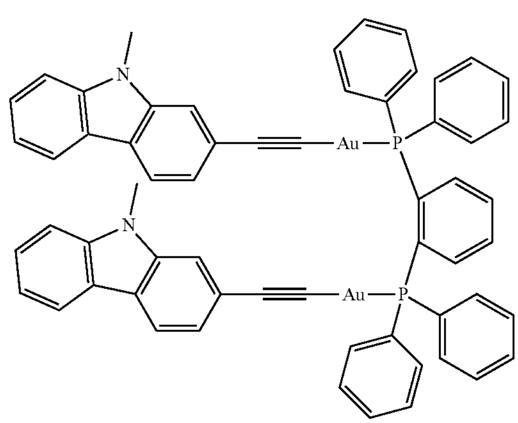
347
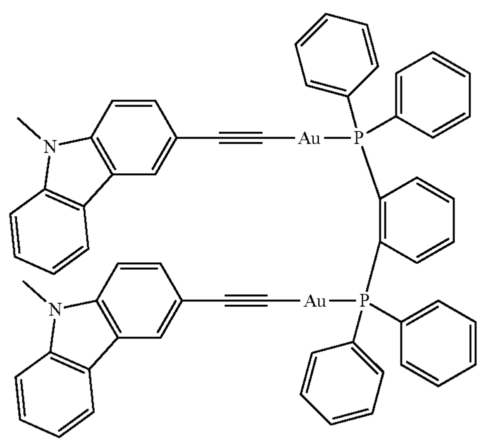
348
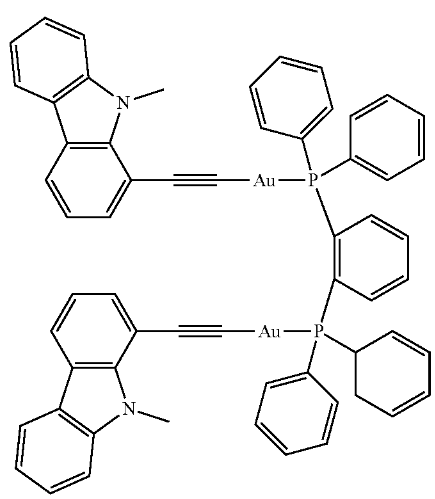

-continued
349
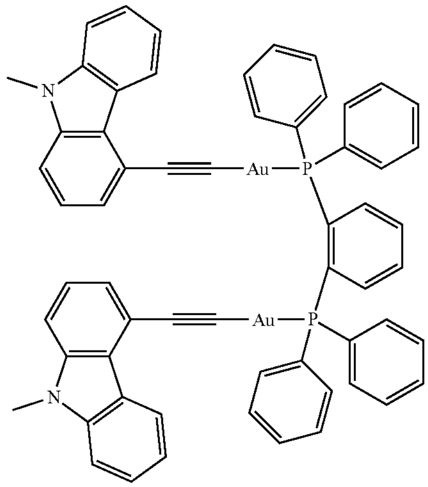
350
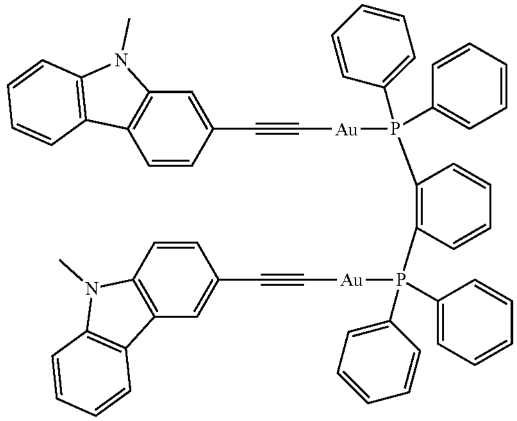
351
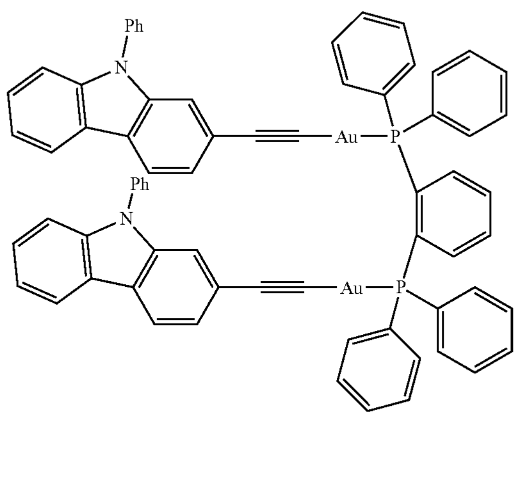
-continued
352
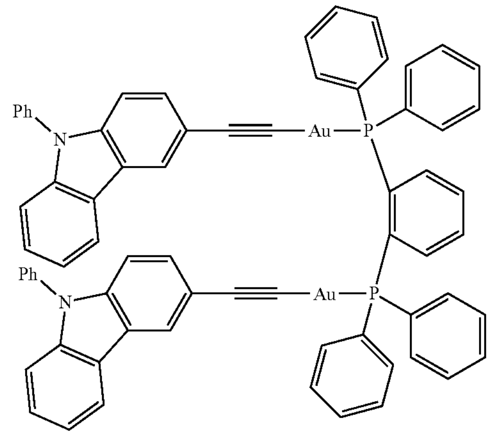
353
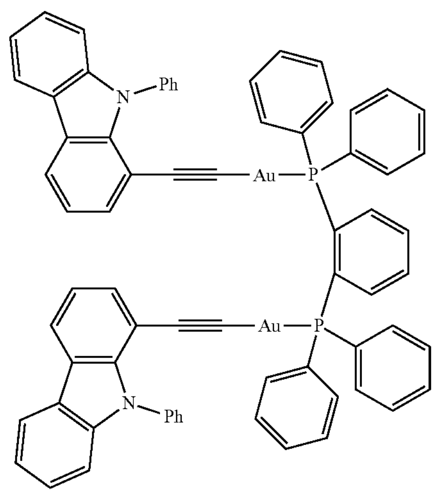
354
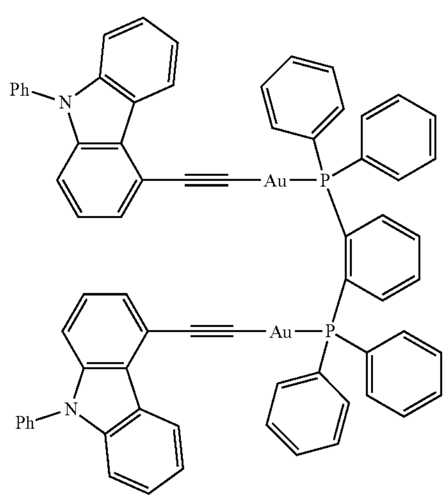

-continued
355
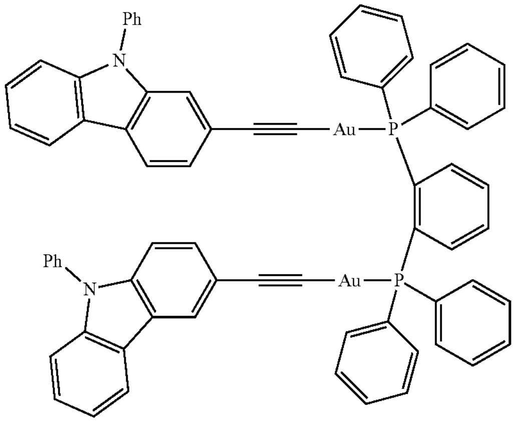
356
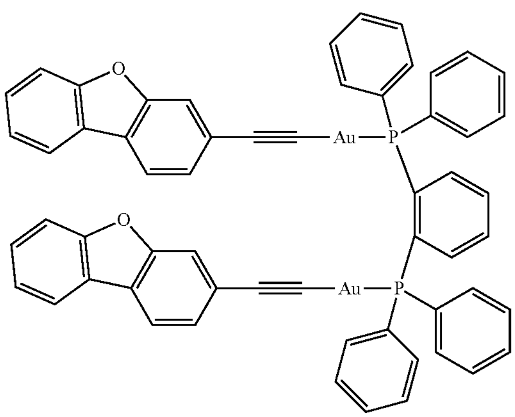
357
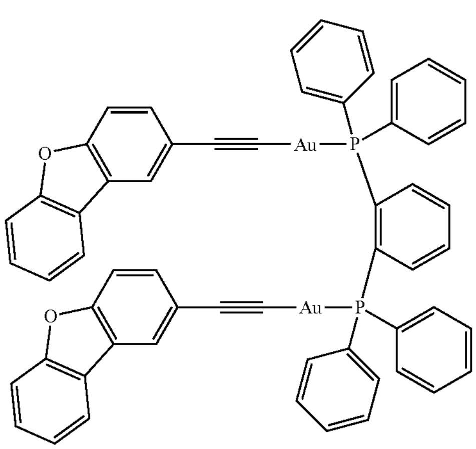
-continued
358
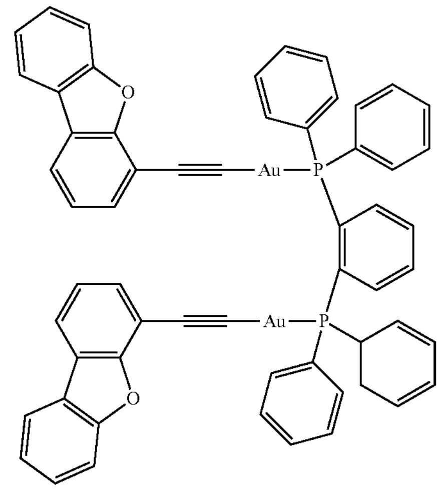
359
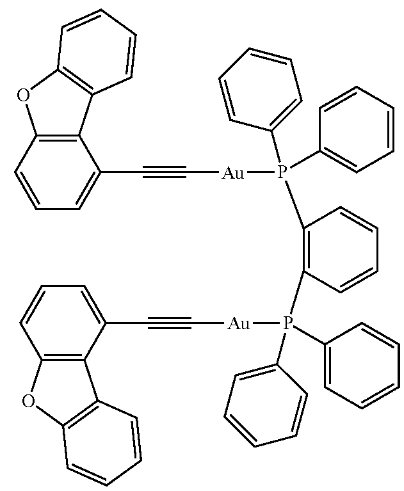
360
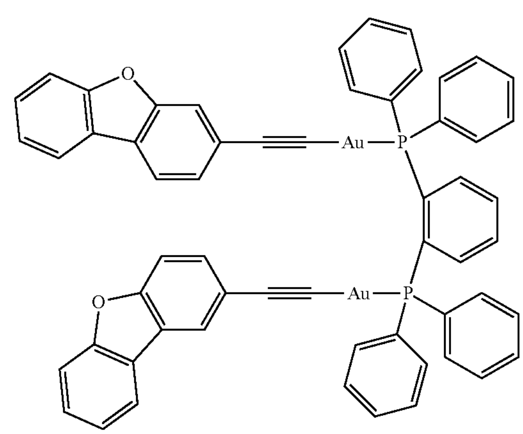

361
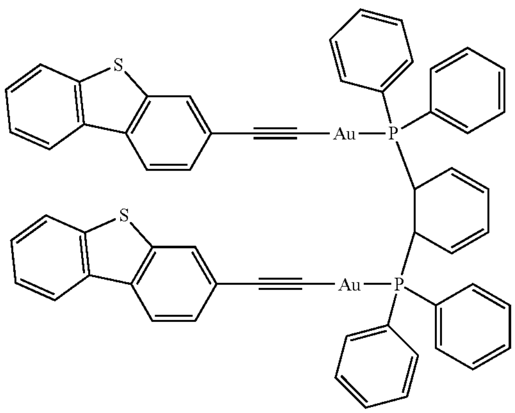
362
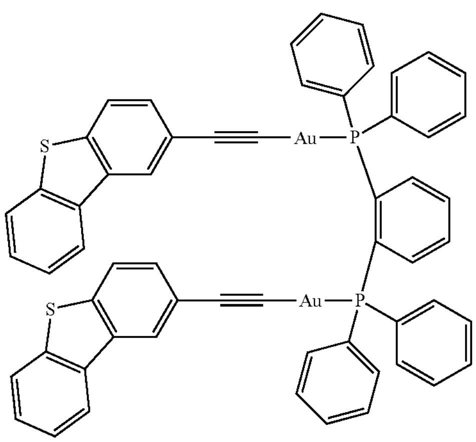
363
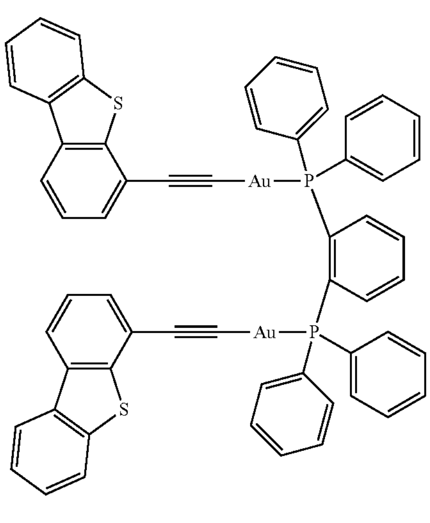
364
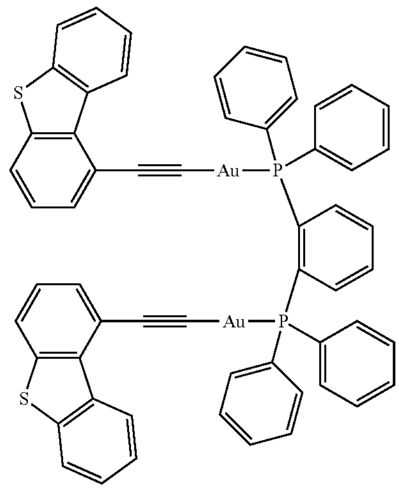
365
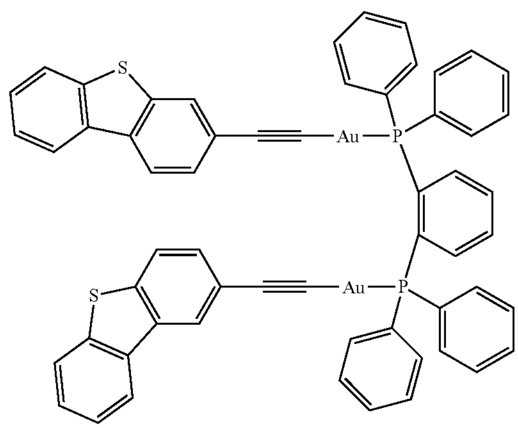
366
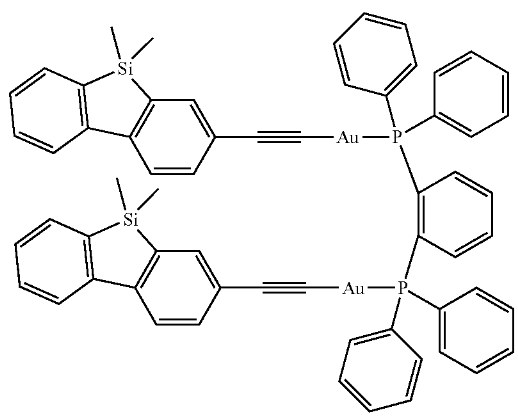

-continued
367
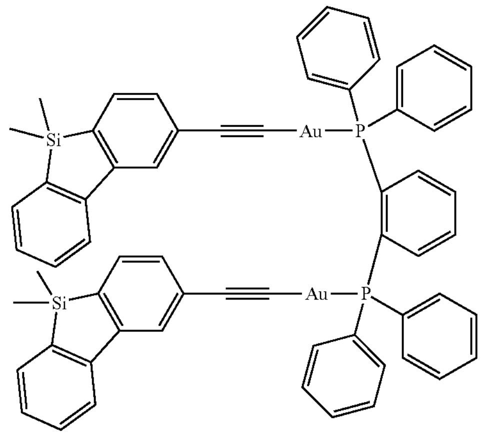
368
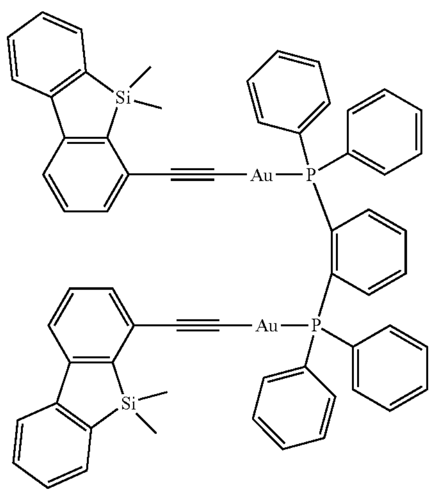
369
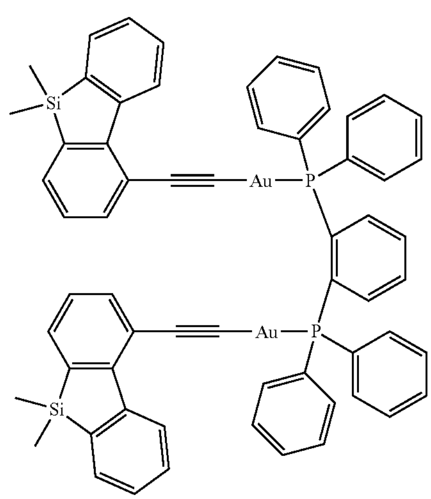
-continued
370
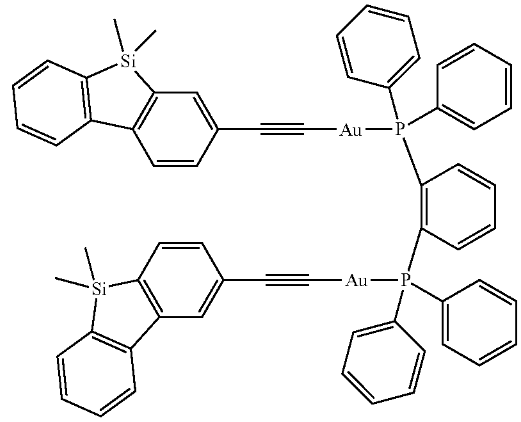
371
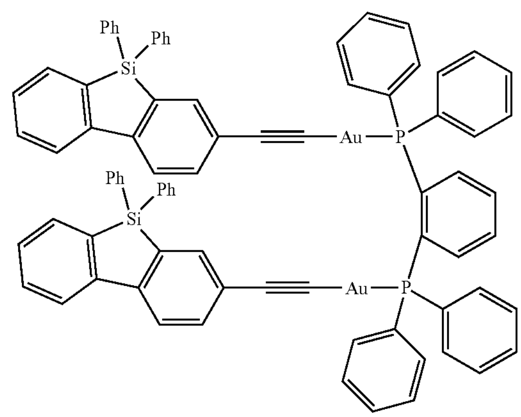
372
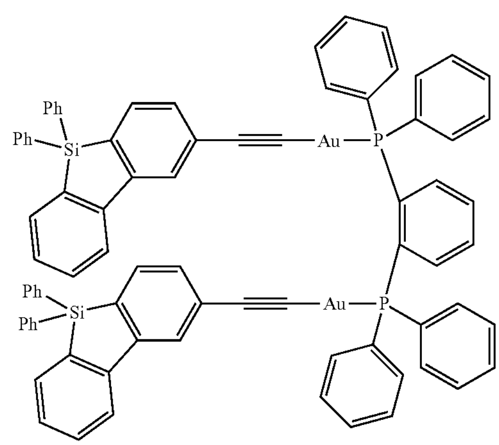

-continued
373
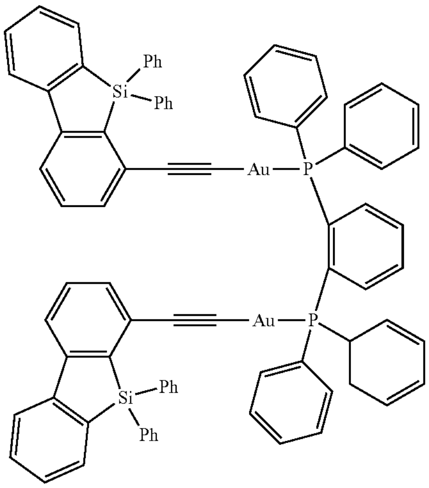
374
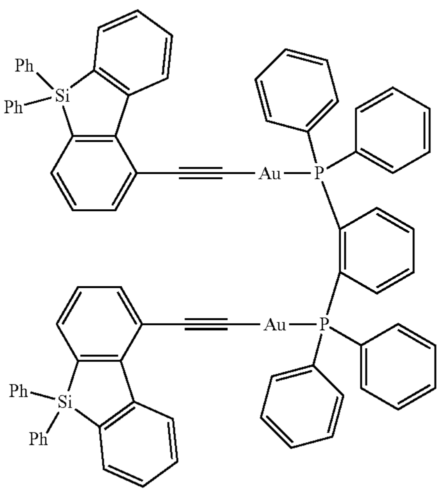
375
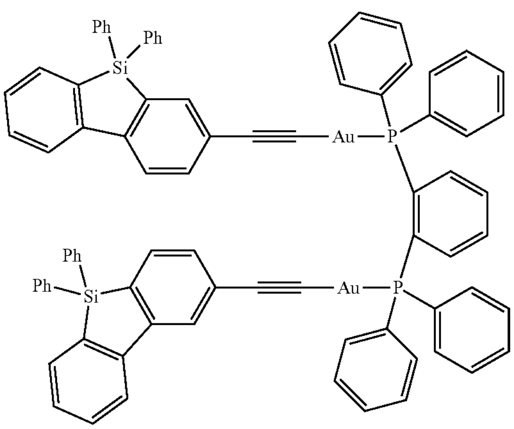
-continued
376
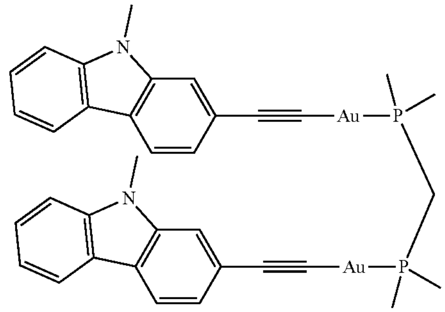
377
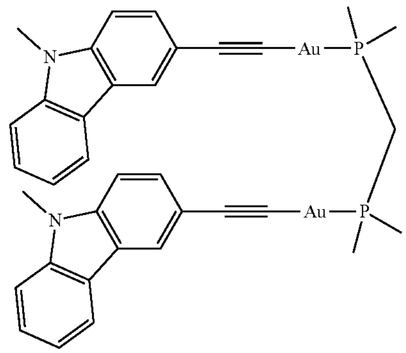
378
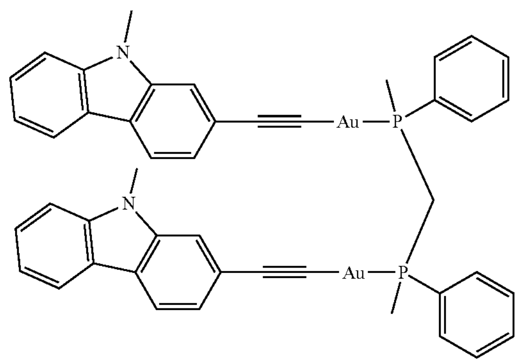
379
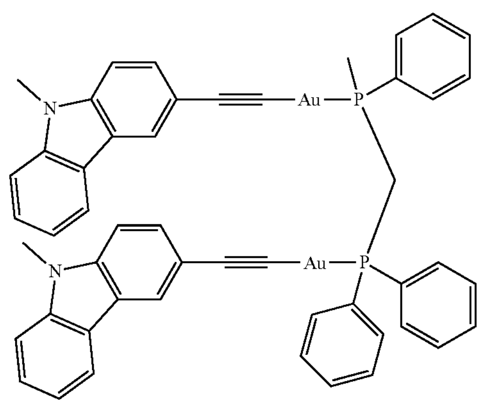

-continued
380
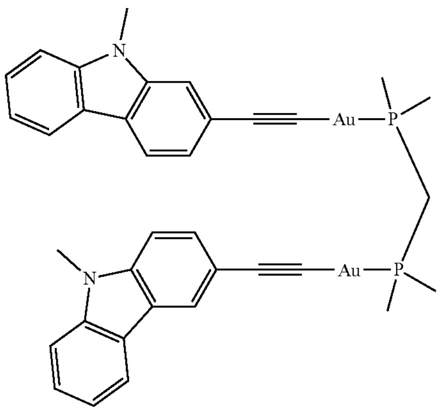
381
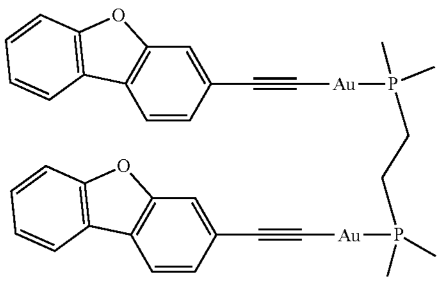
382
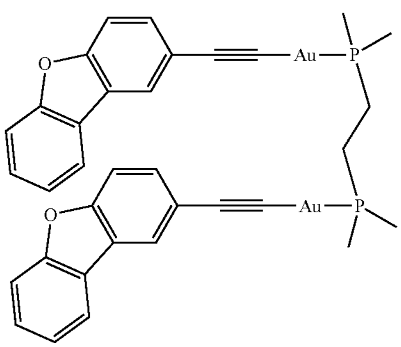
383
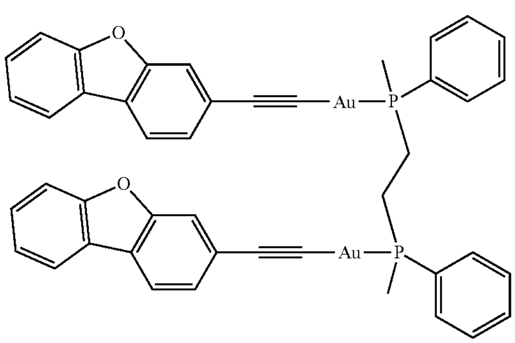
-continued
384
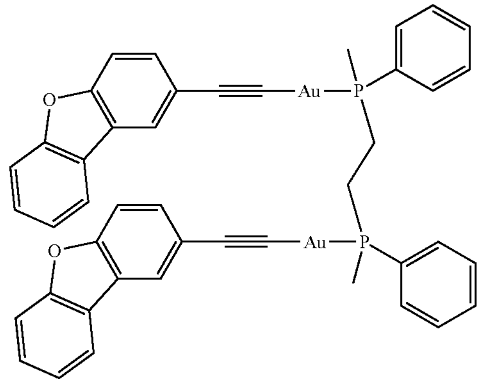
385
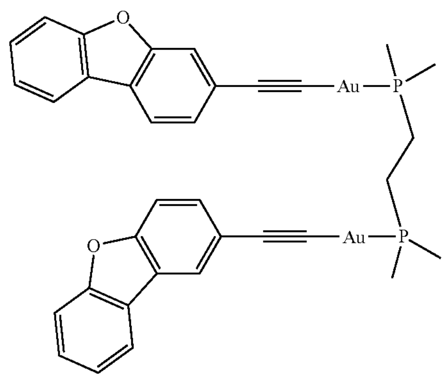
386
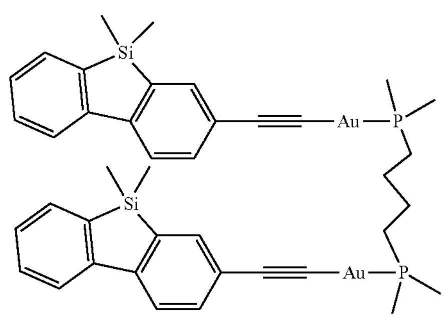
387
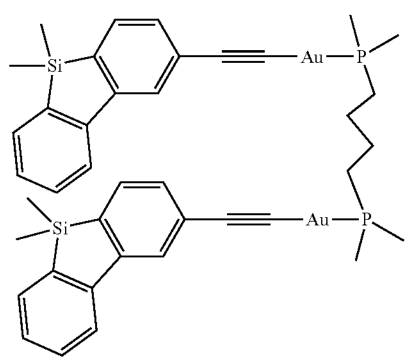

-continued
388
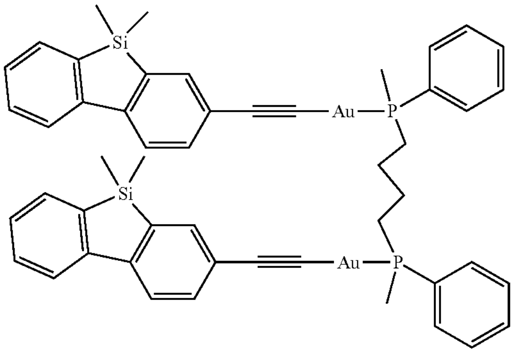
389
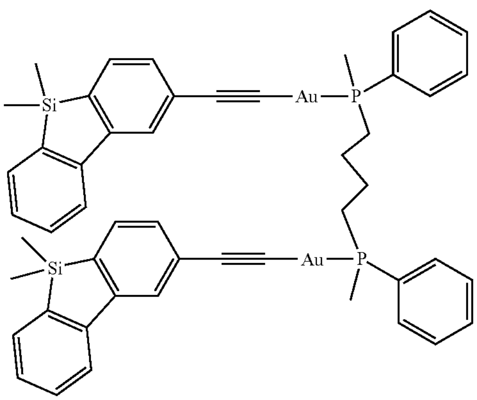
390
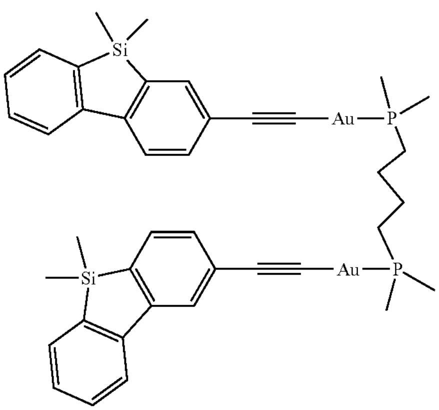
391
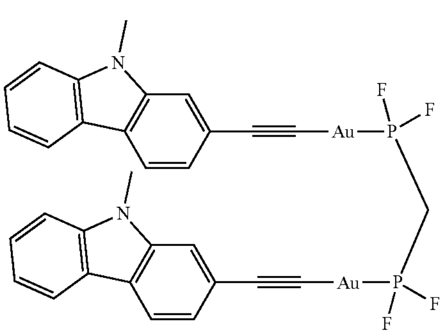
-continued
392
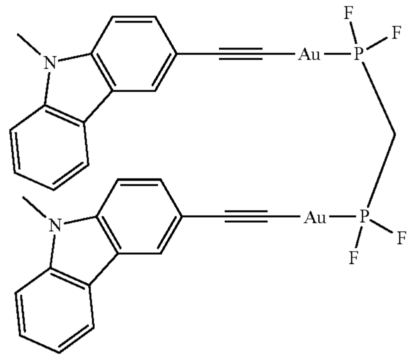
393
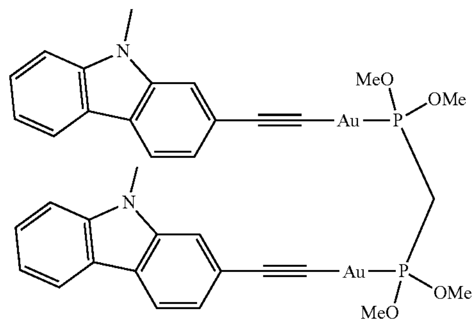
394
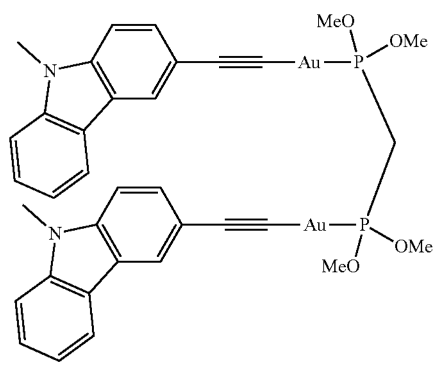
395
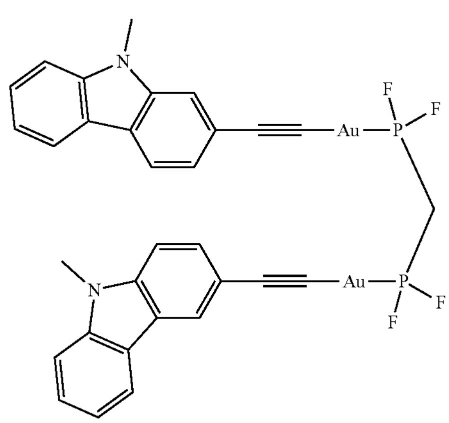

-continued
396
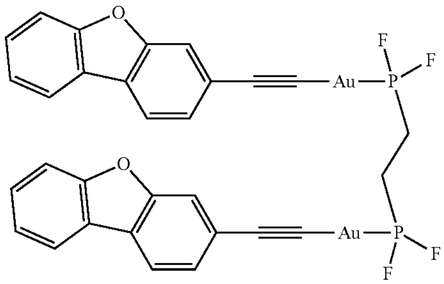
397
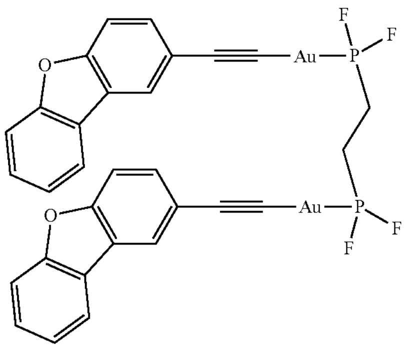
398
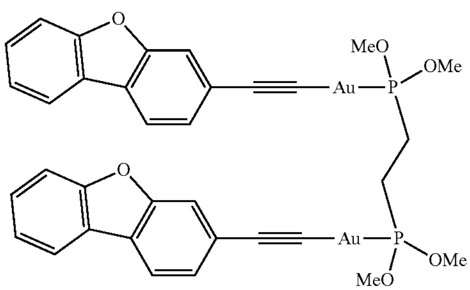
399
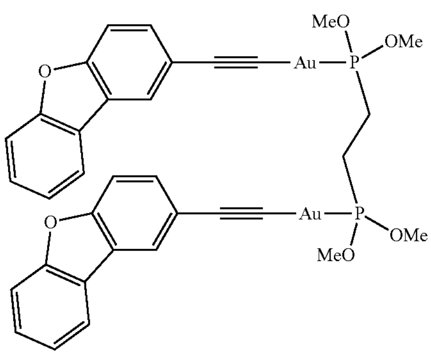
400
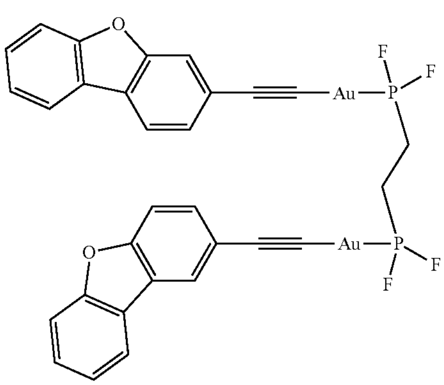
-continued
401
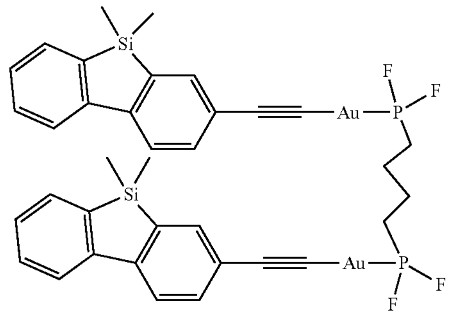
402
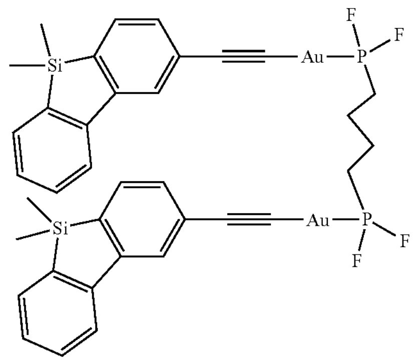
403
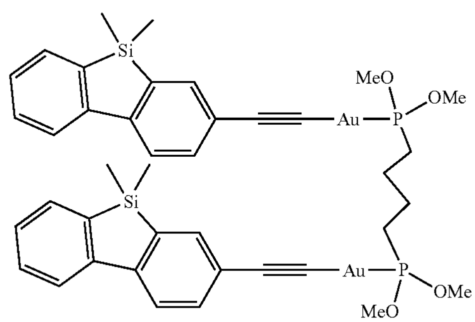
404
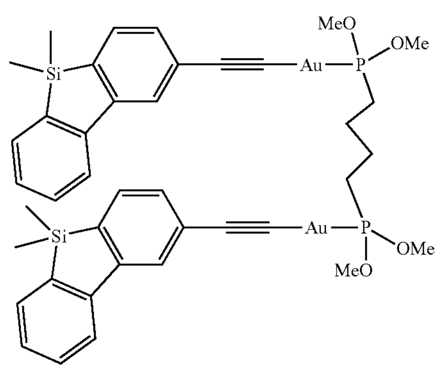

-continued
405
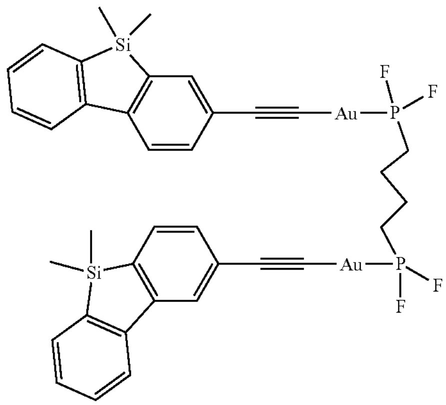
406
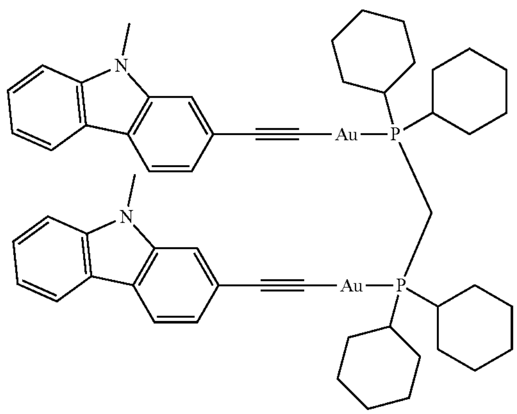
407
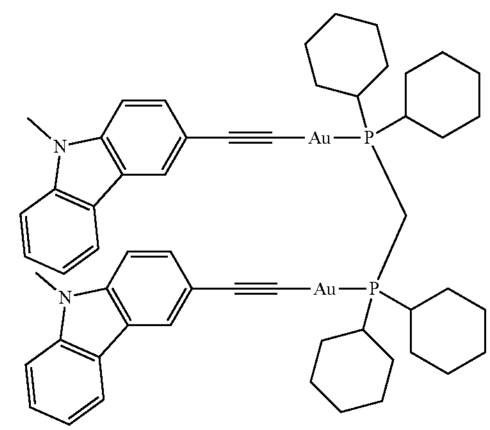
408
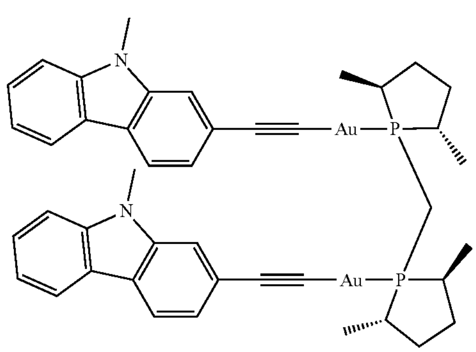
-continued
409
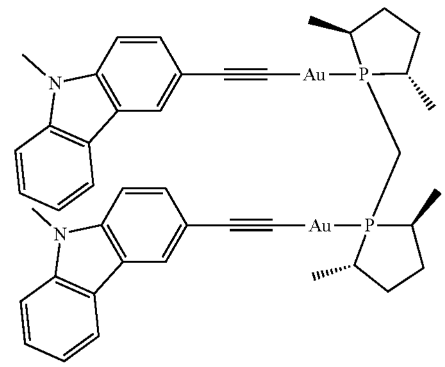
410
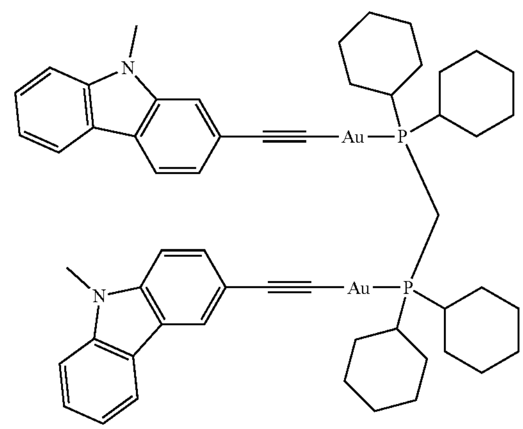
411
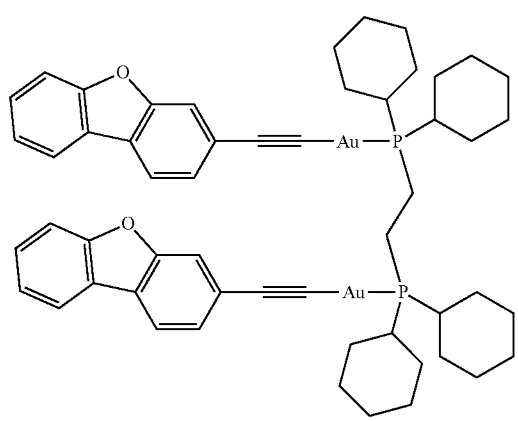

412
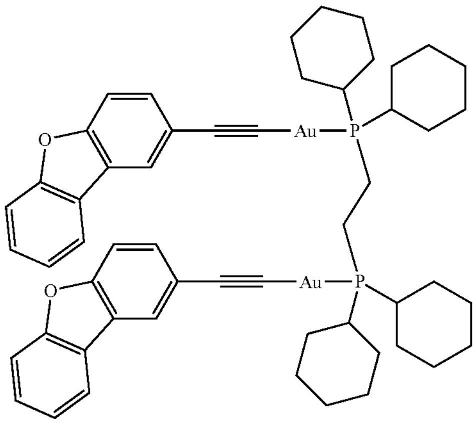
413
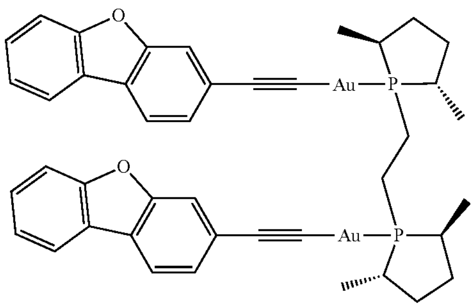
414
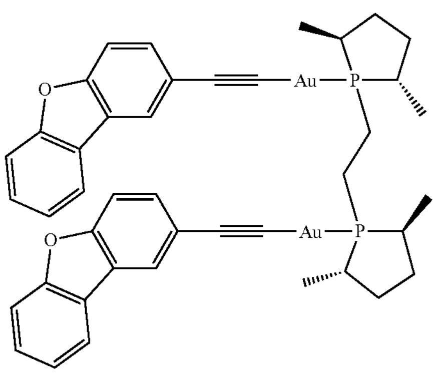
415
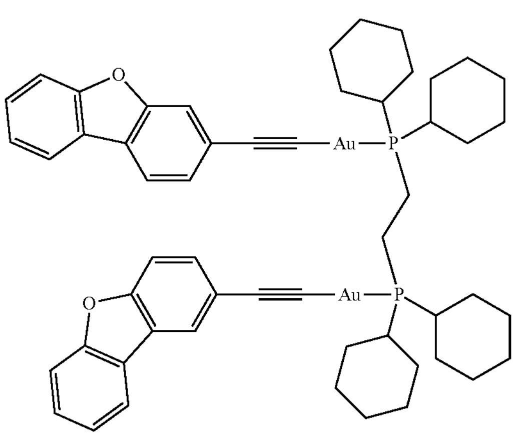
416
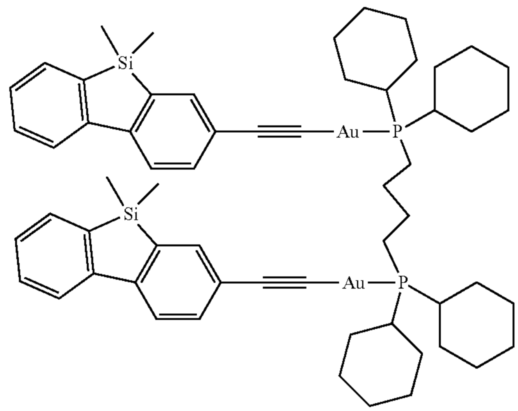
417
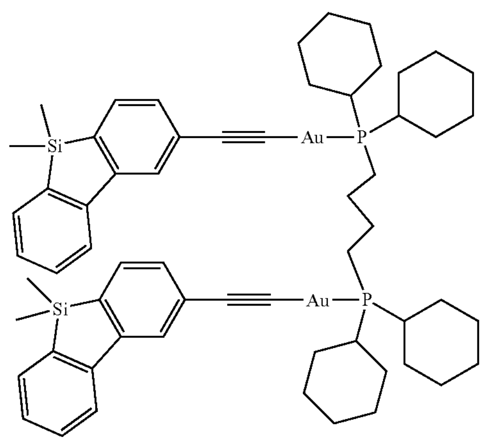
418
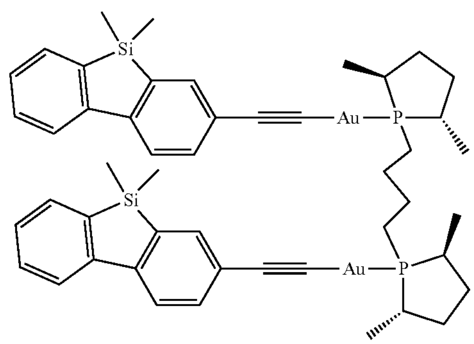
419
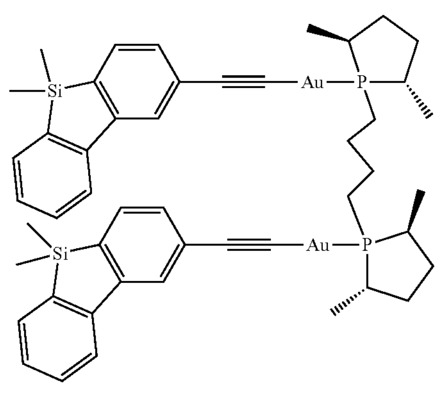

-continued
420
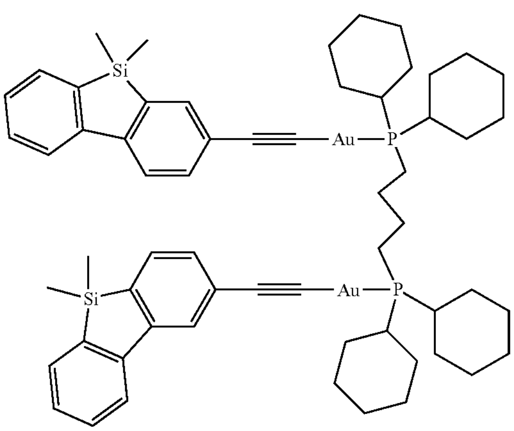
421
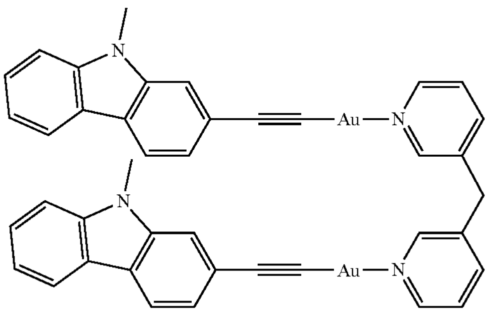
422
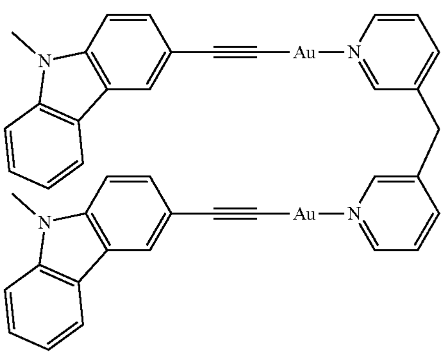
423
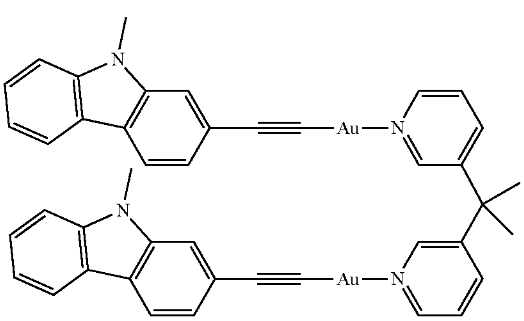
-continued
424
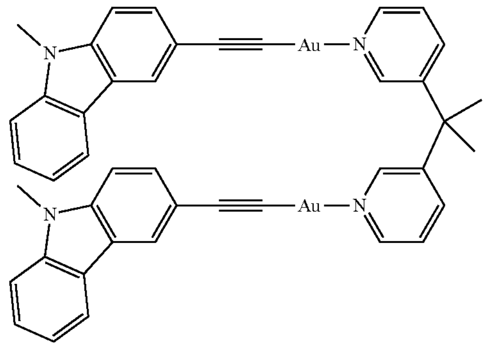
425
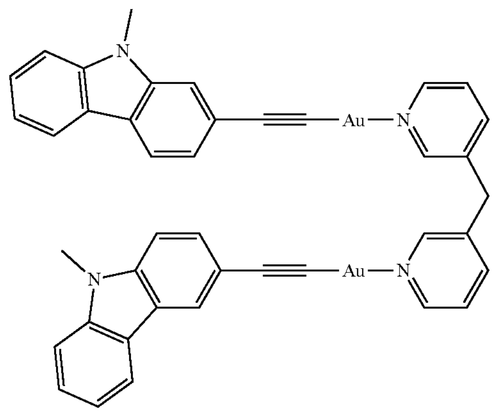
426
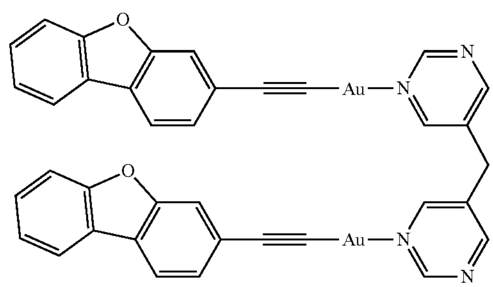
427
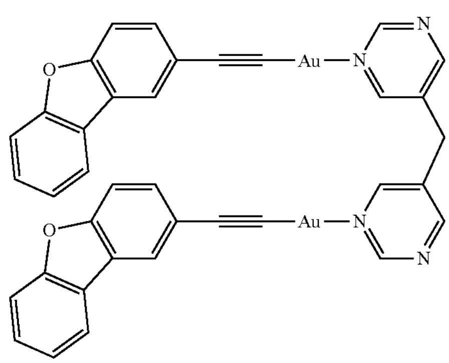

428
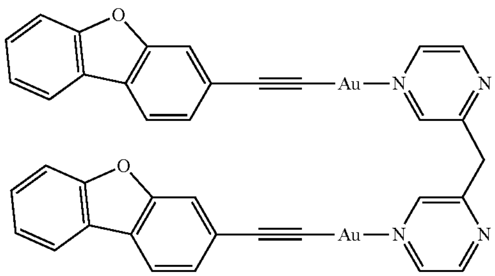
429
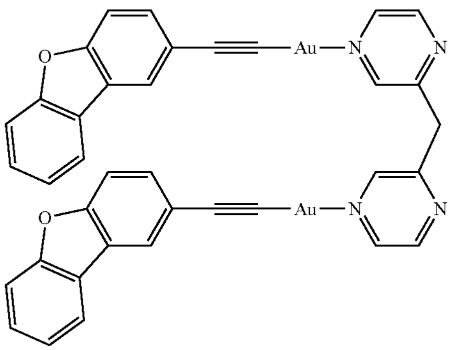
430
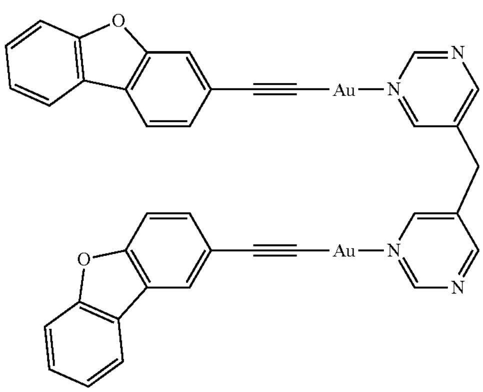
431
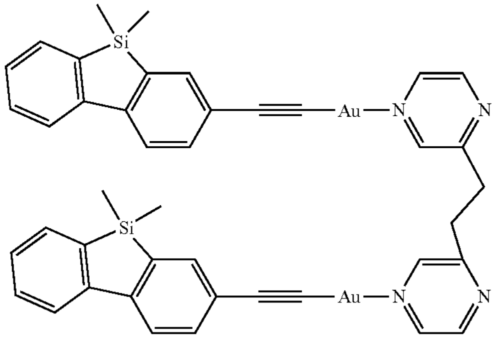
432
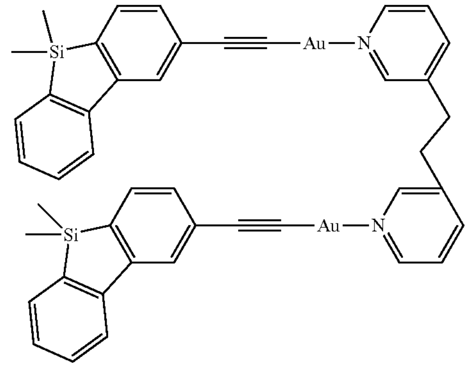
433
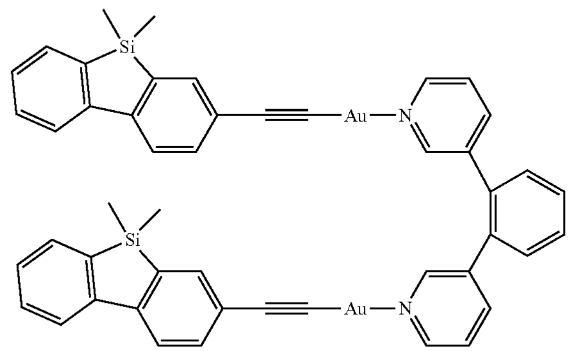
434
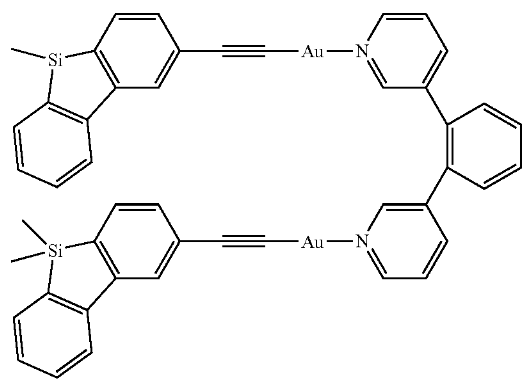
435
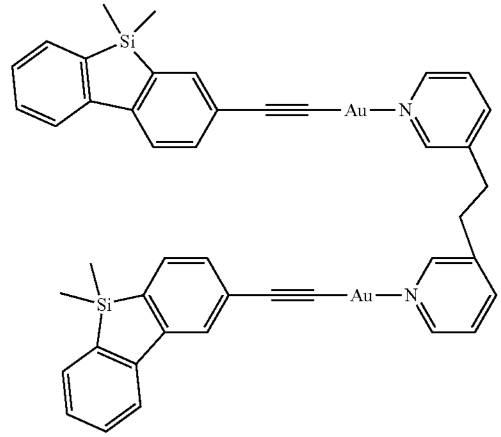

-continued
436
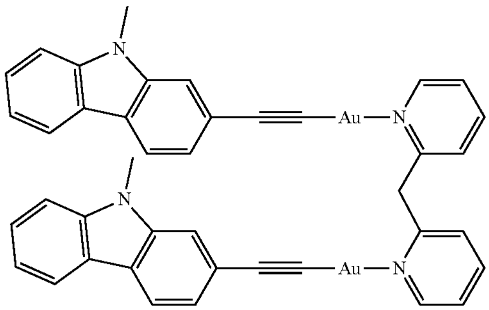
437
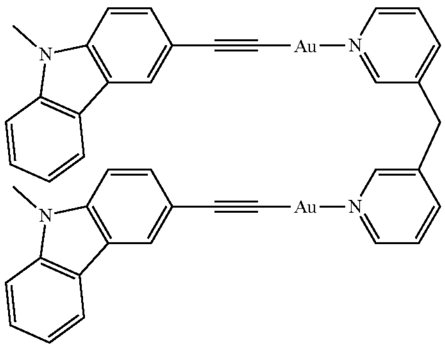
438
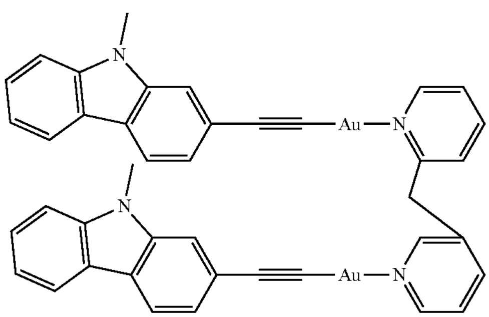
439
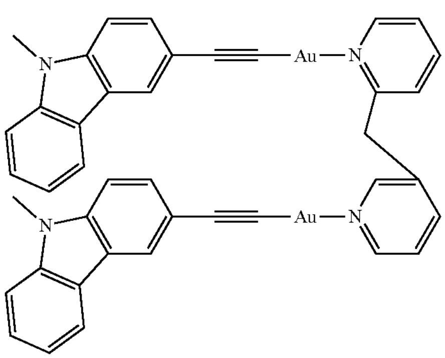
-continued
440
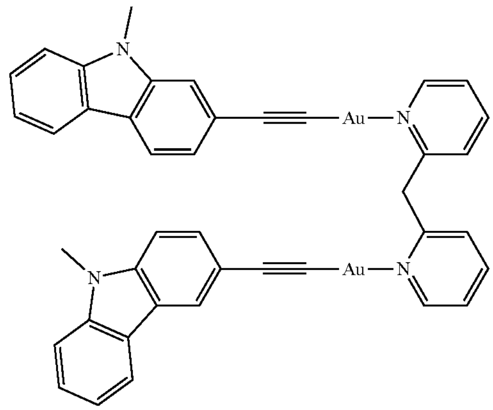
441
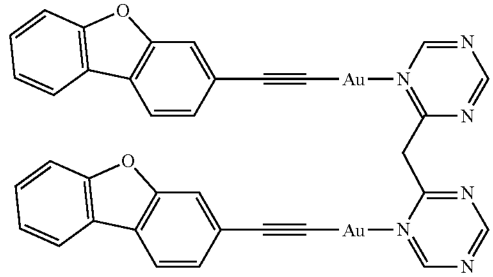
442
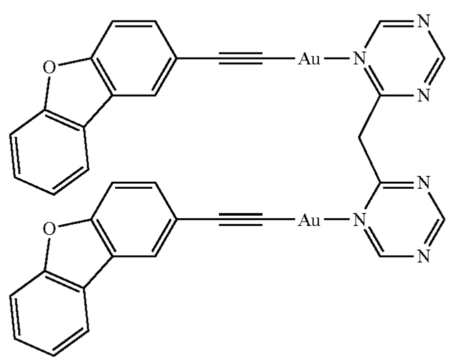
443
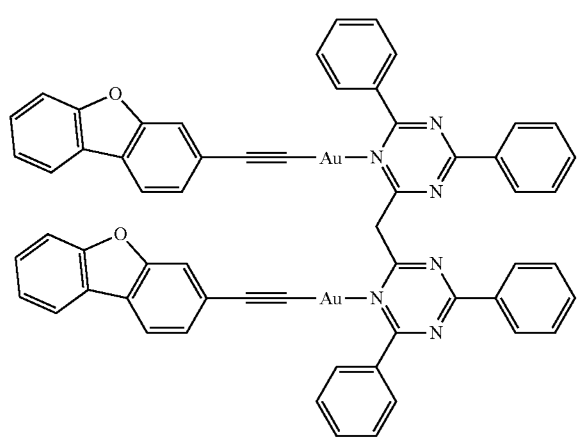

444
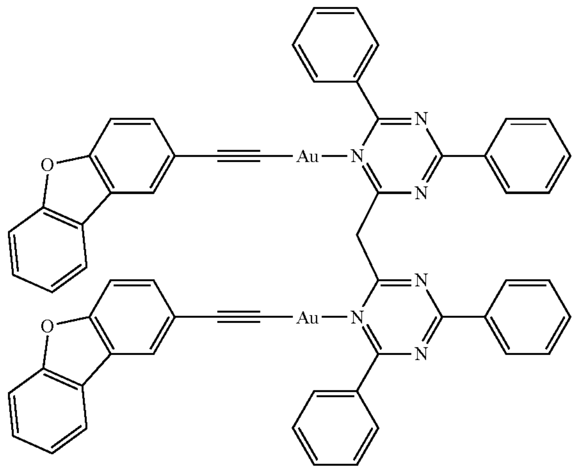
445
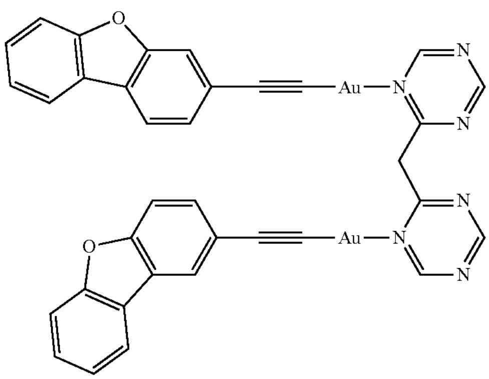
446
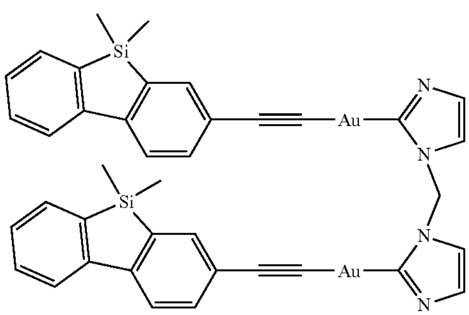
447
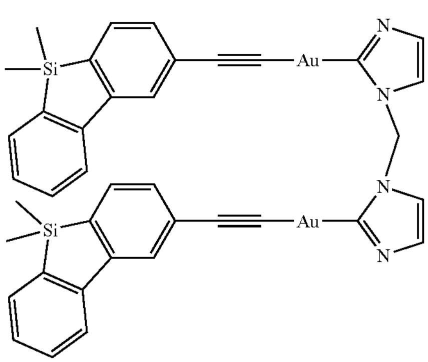
448
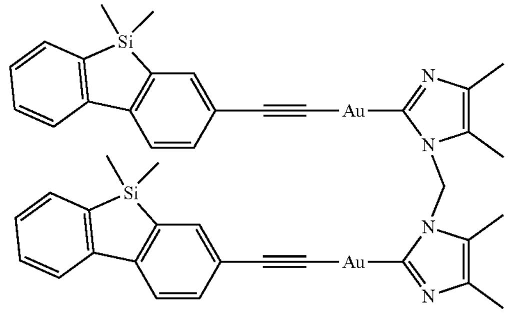
449
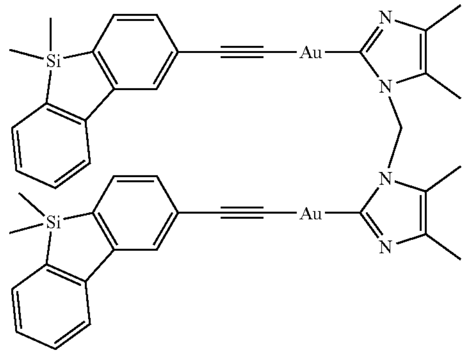
450
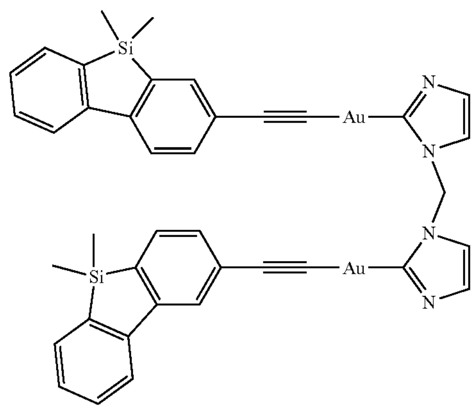
451
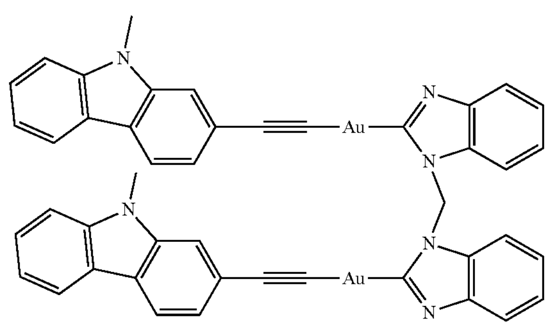

452
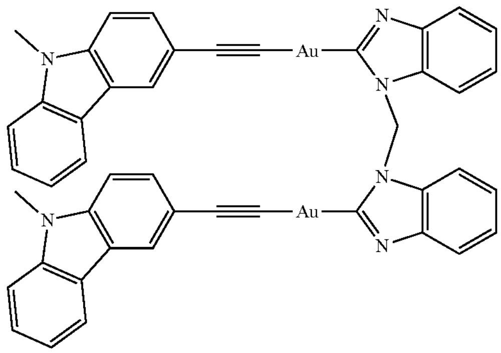
453
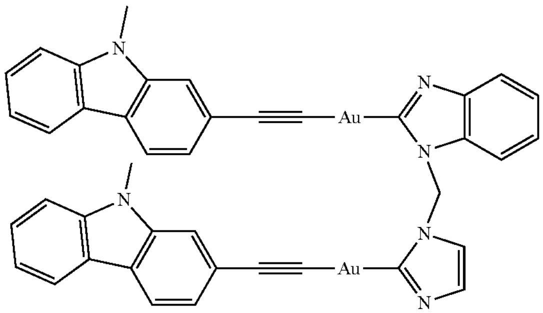
454
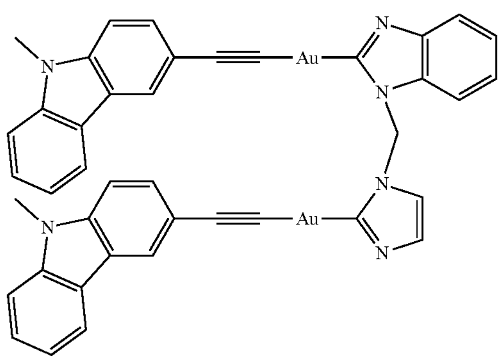
455
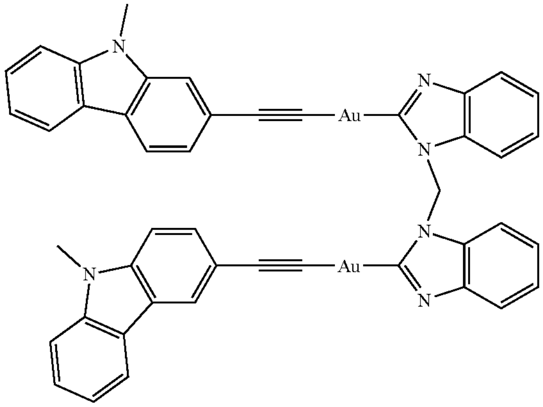
456
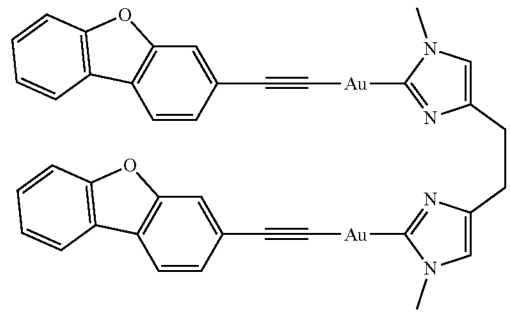
457
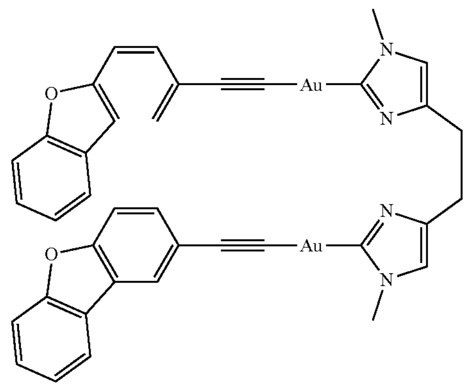
458
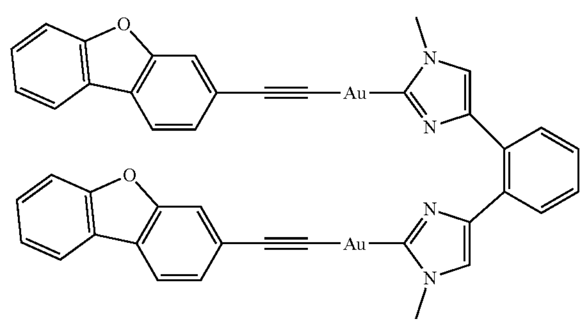
459
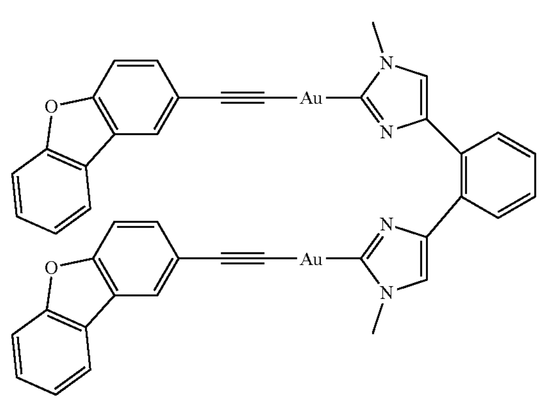

-continued
460
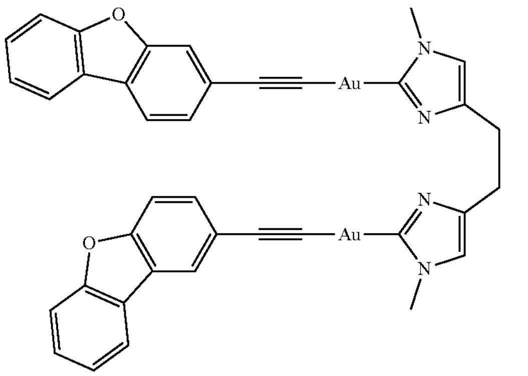
461
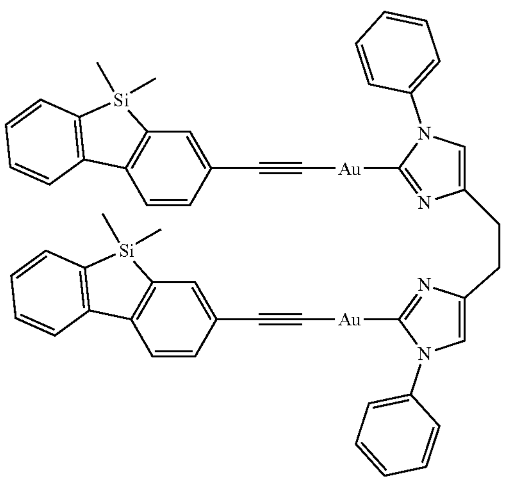
462
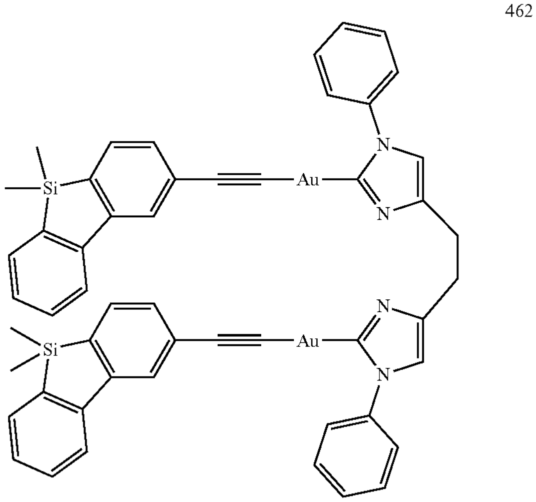
-continued
463
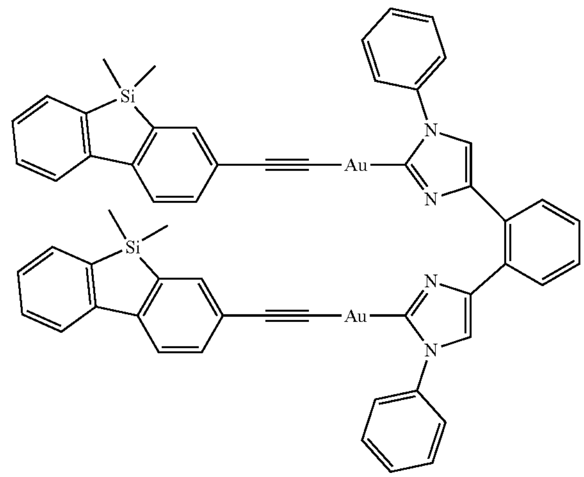
464
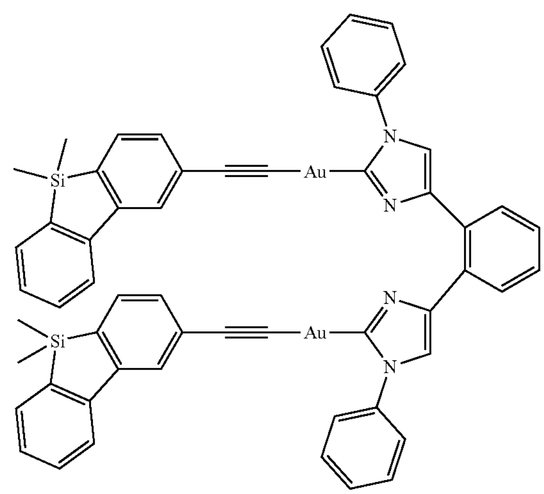
465
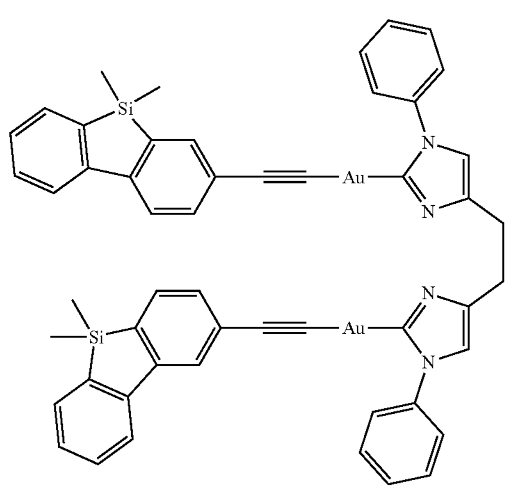

-continued
466
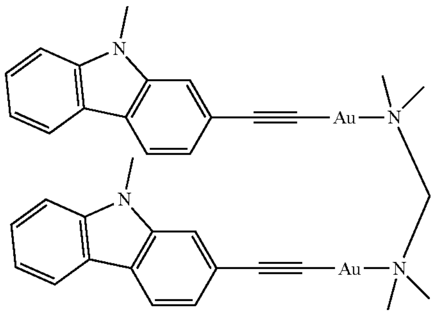
467
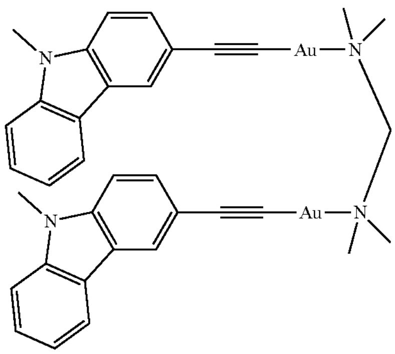
468
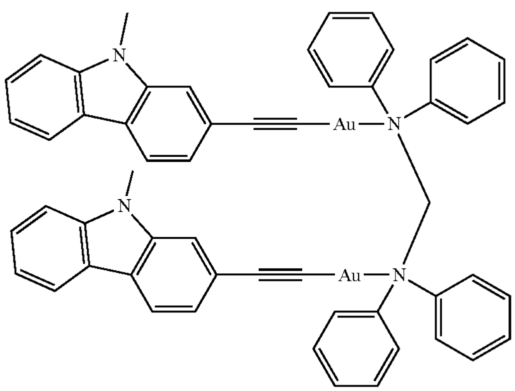
469
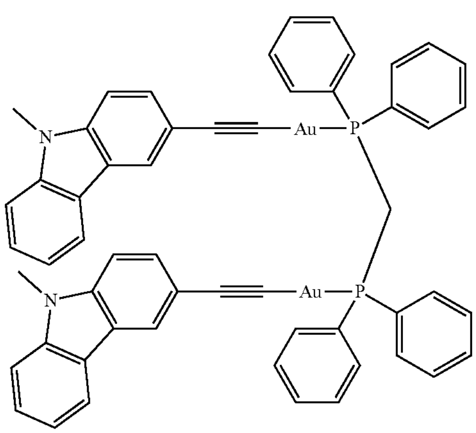
-continued
470
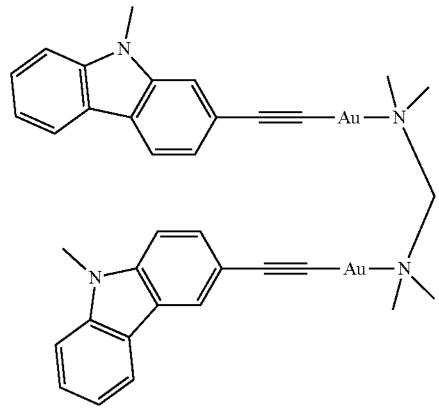
471
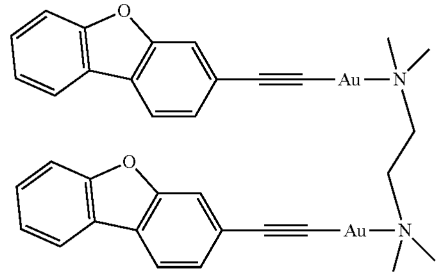
472
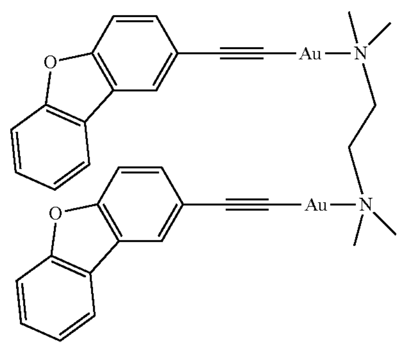
473
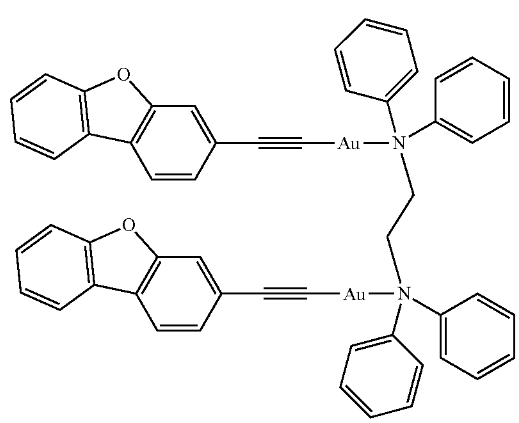

-continued
474
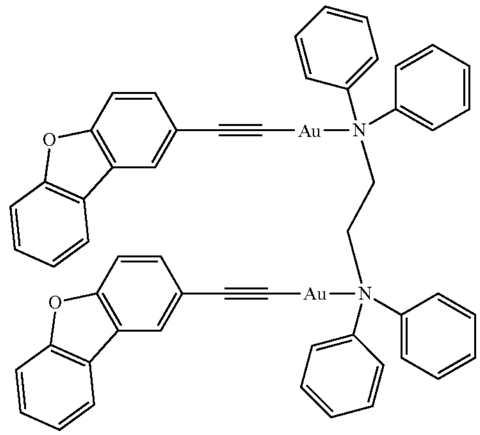
475
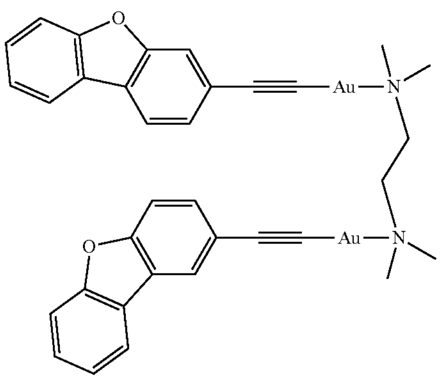
476
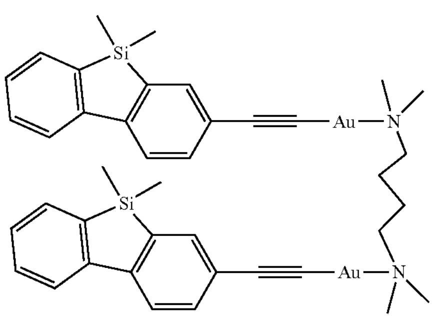
477
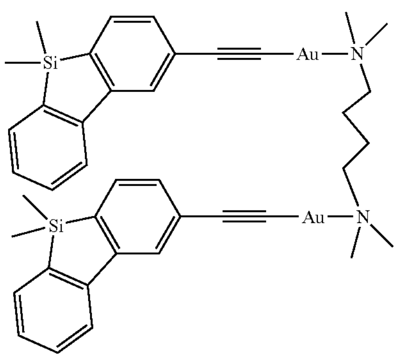
-continued
478
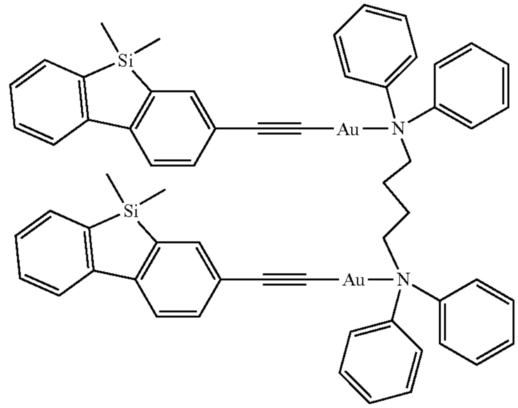
479
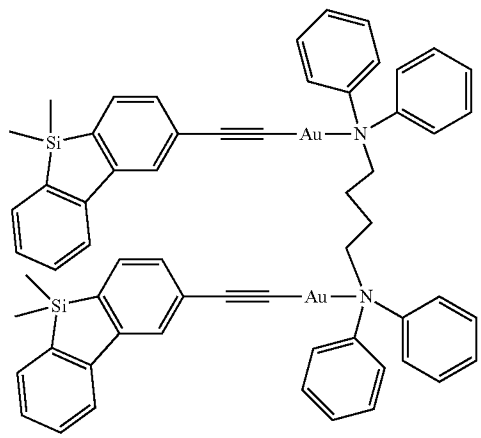
480
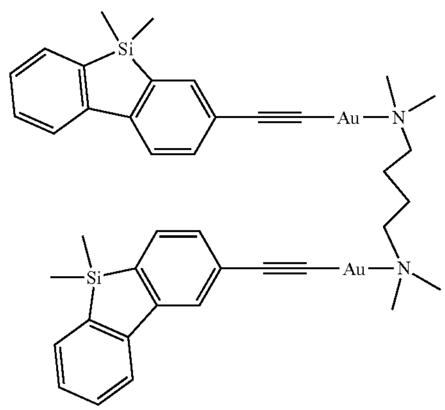
481
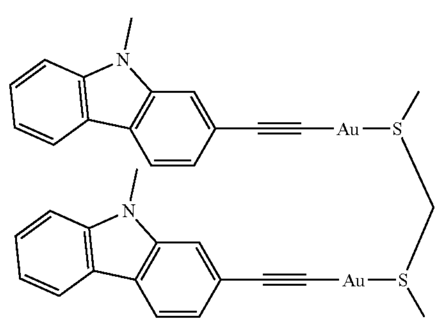

-continued
482
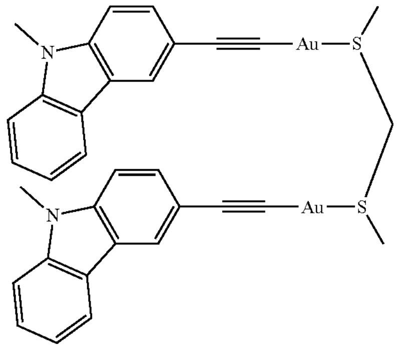
483
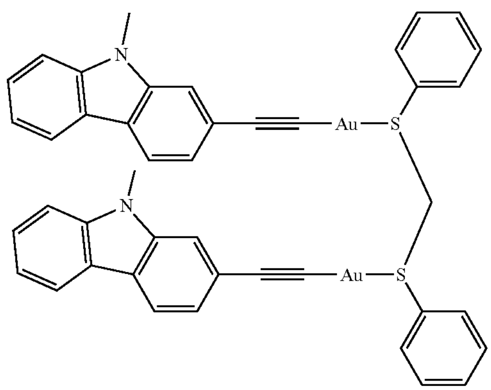
484
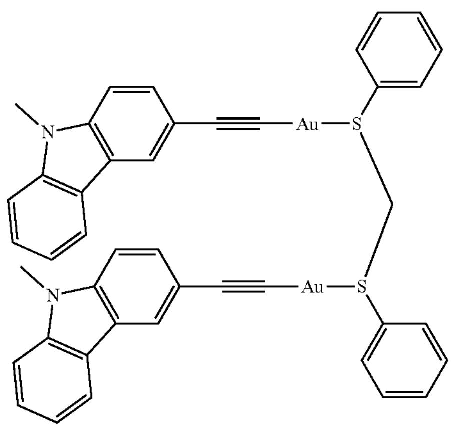
485
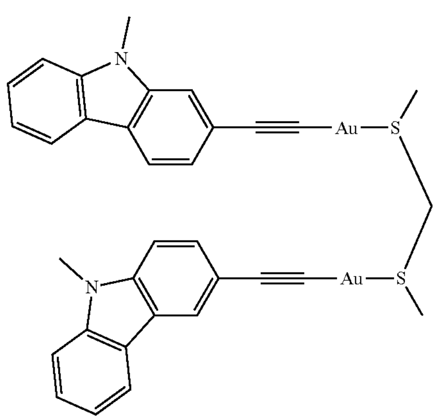
-continued
486
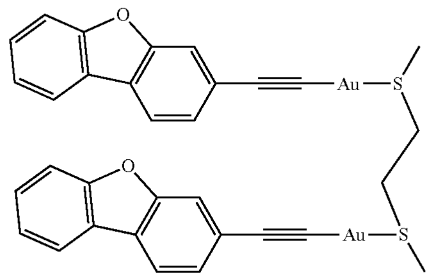
487
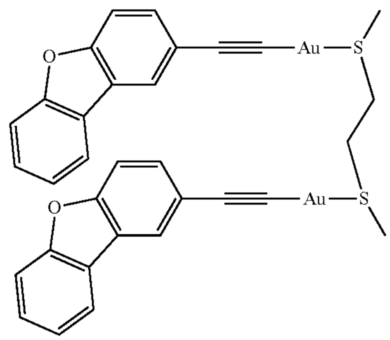
488
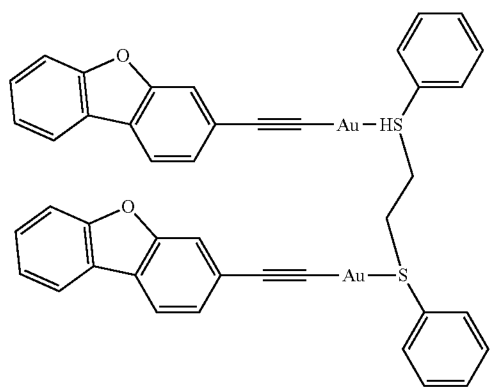
489
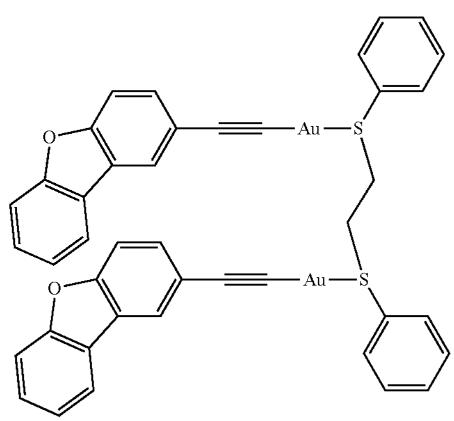

-continued
490
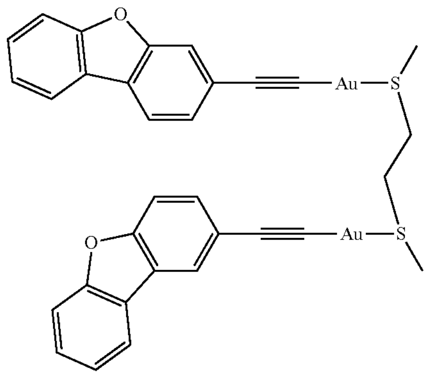
491
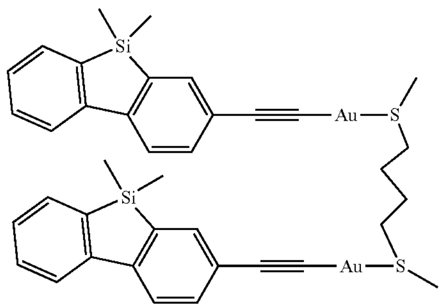
492
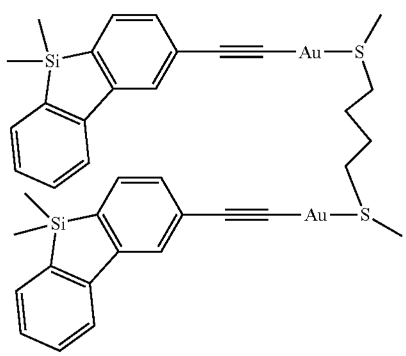
493
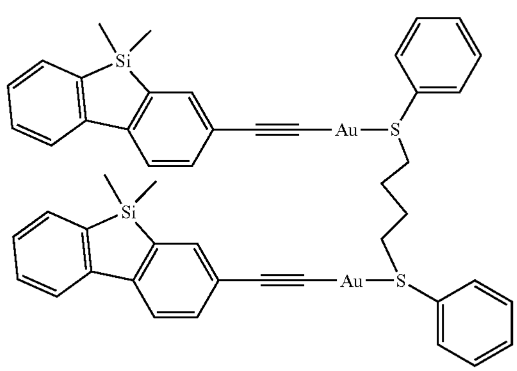
-continued
494
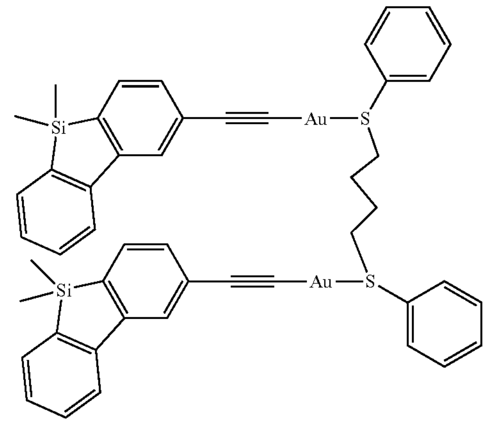
495
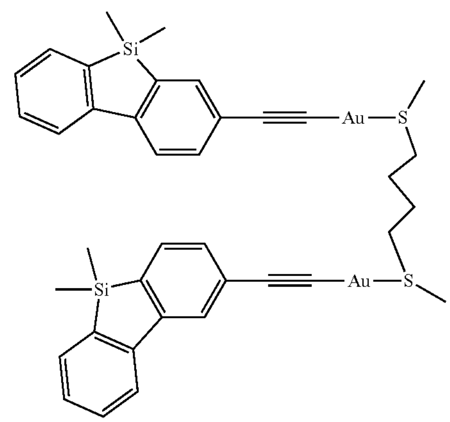
496
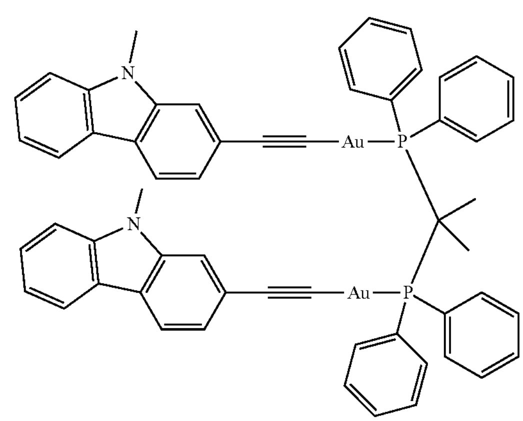

-continued
497
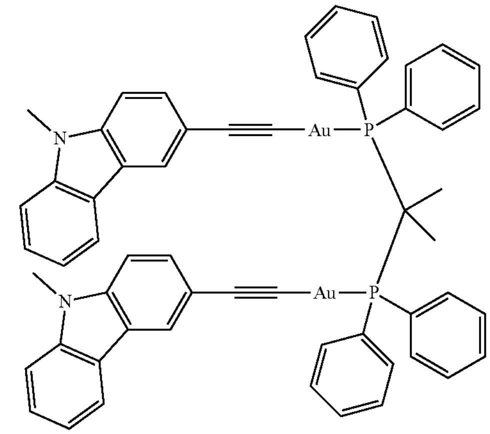
498
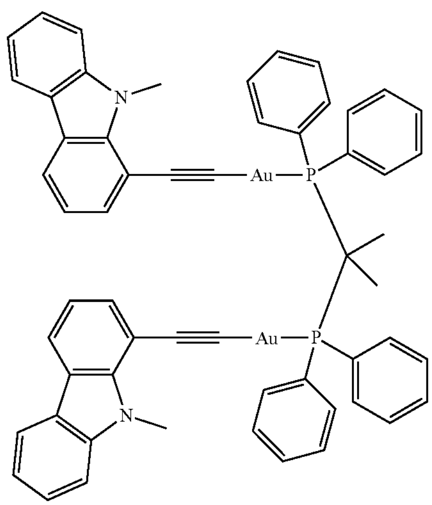
499
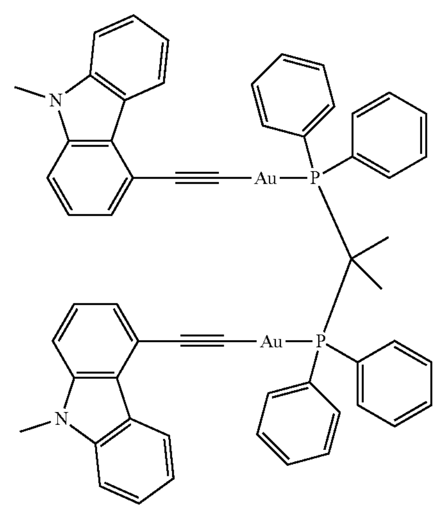
-continued
500
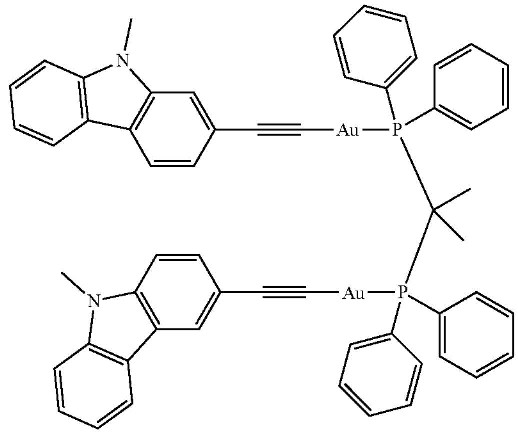
501
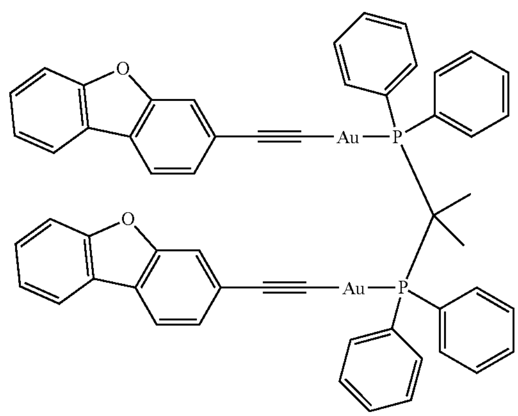
502
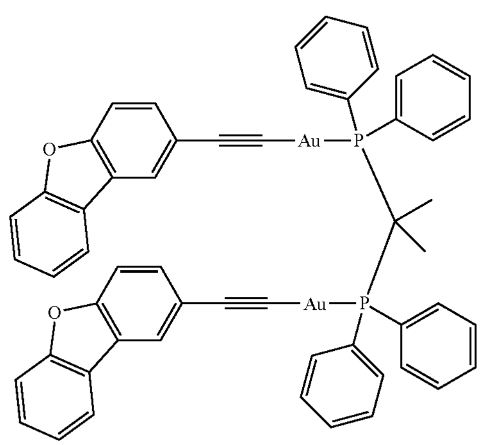

503
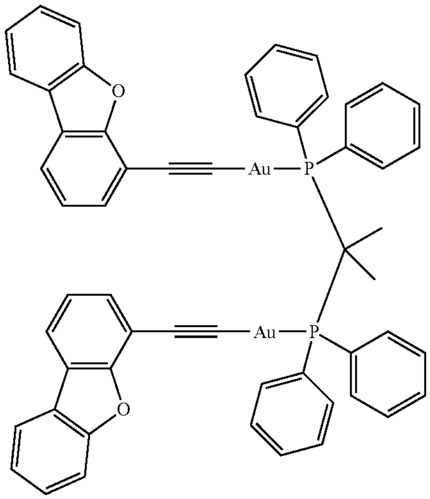
504
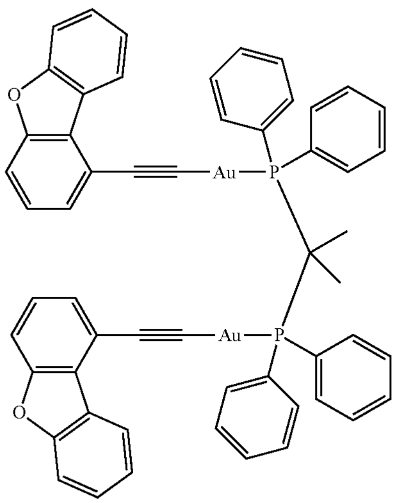
505
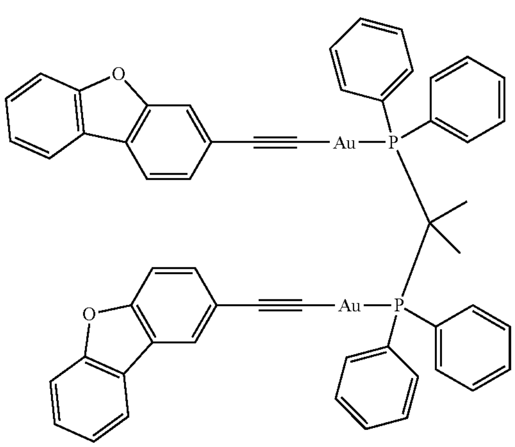
506
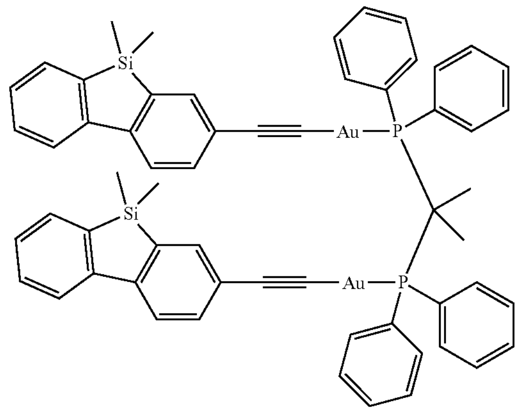
507
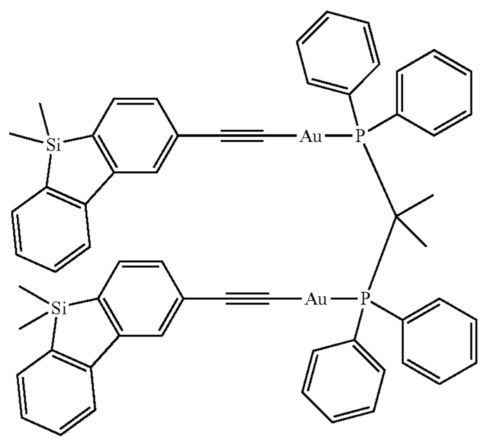
508
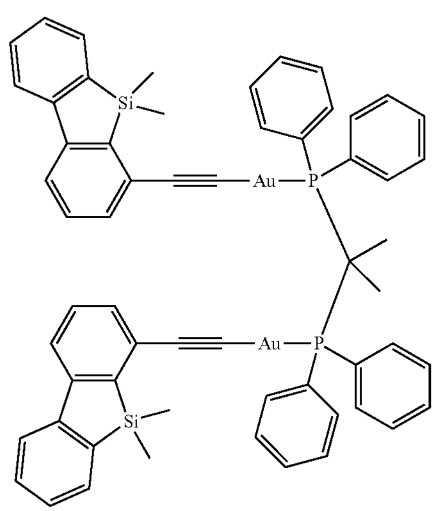

509
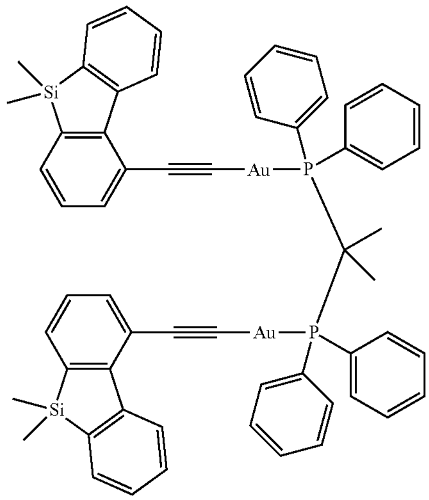
510
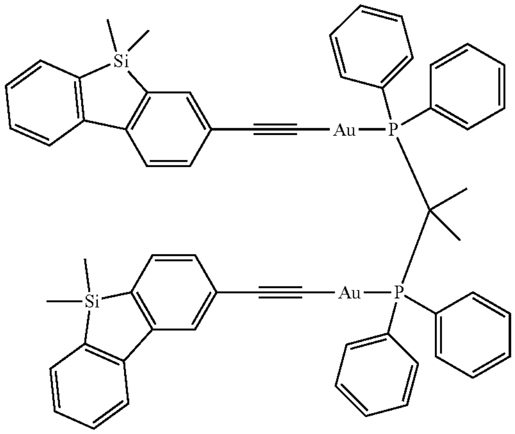
511
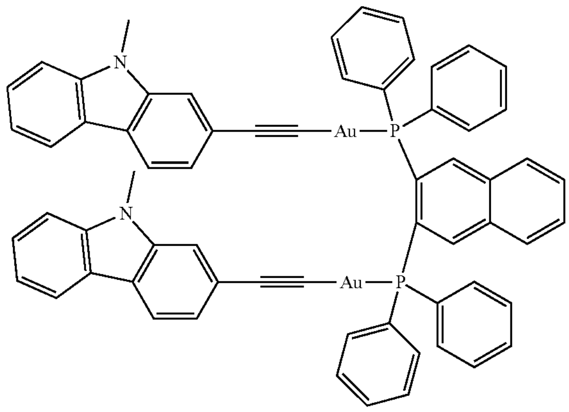
512
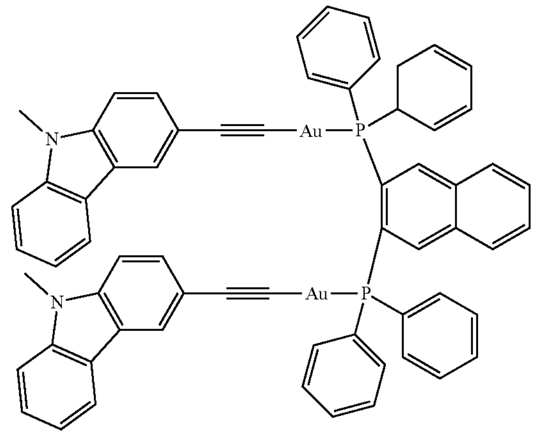
513
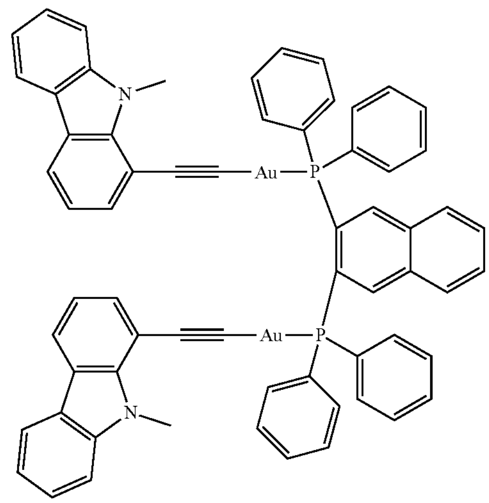
514
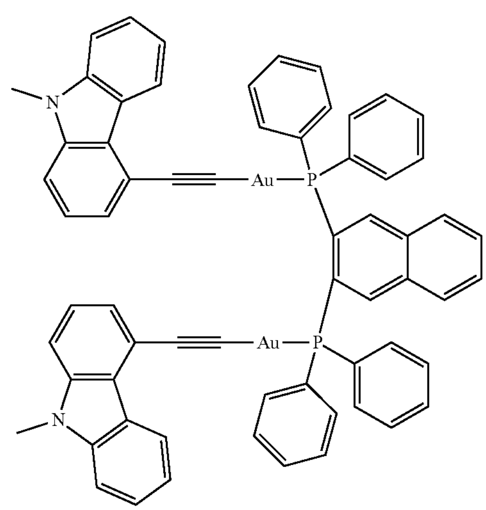

515
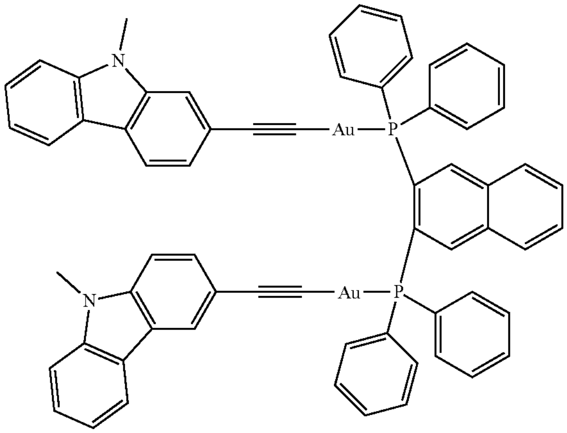
516
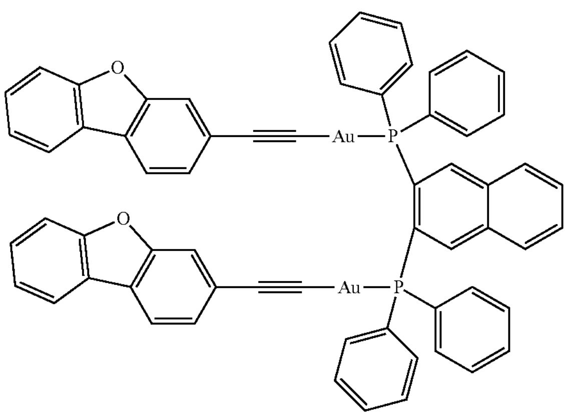
517
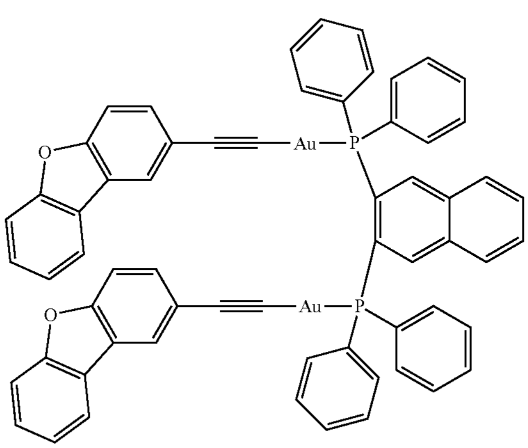
518
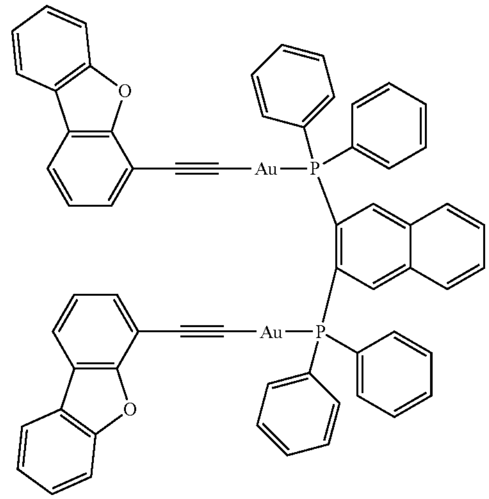
519
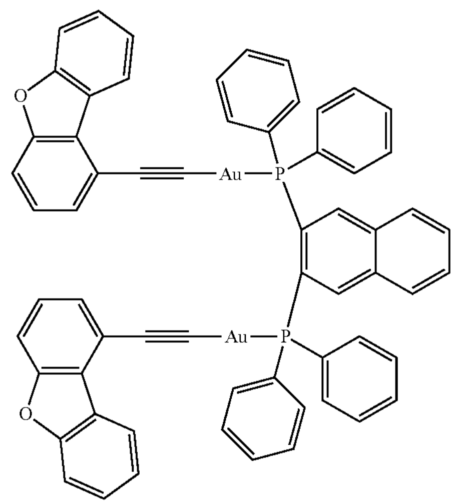
520
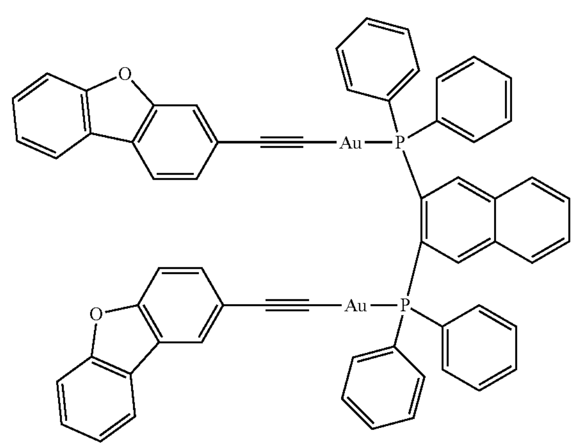

-continued
521
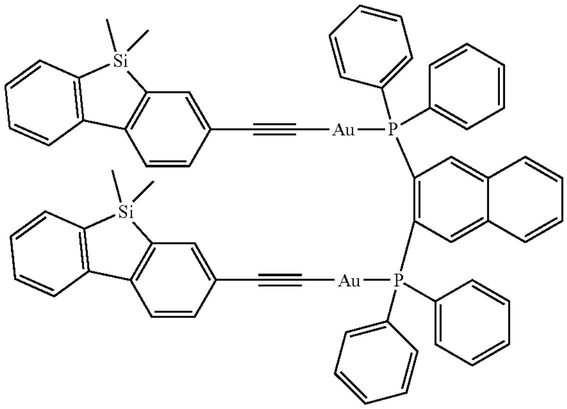
522
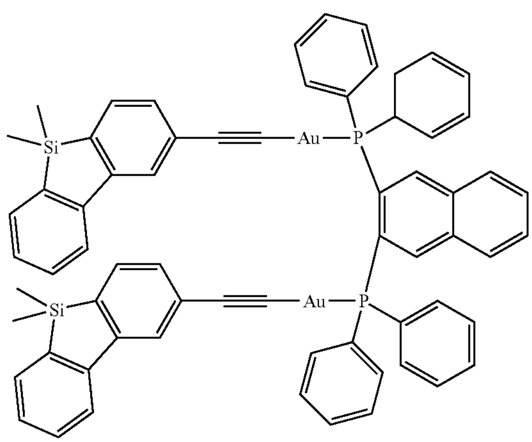
523
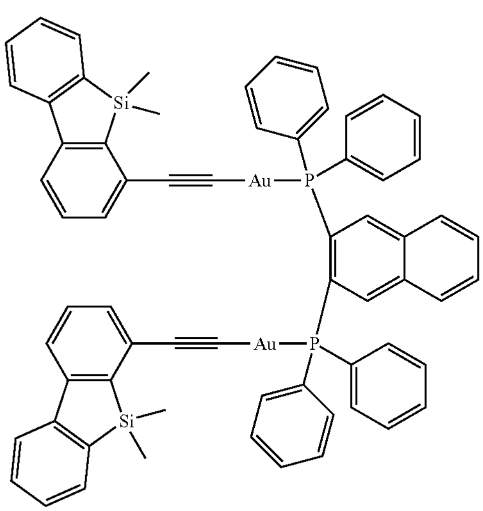
-continued
524
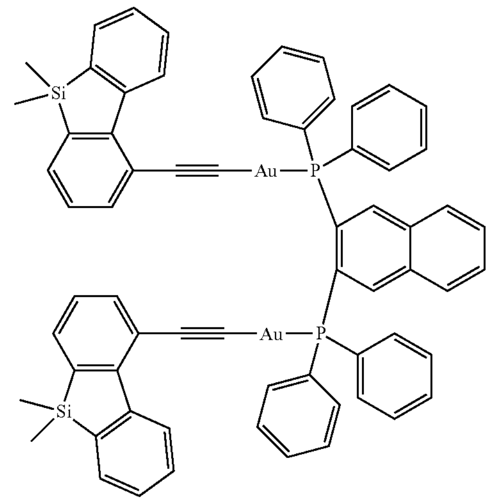
525
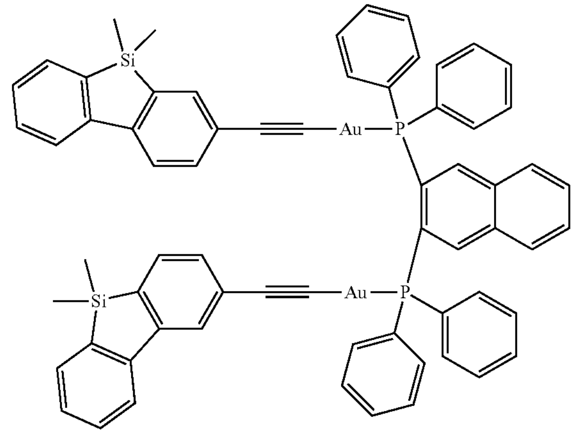
526
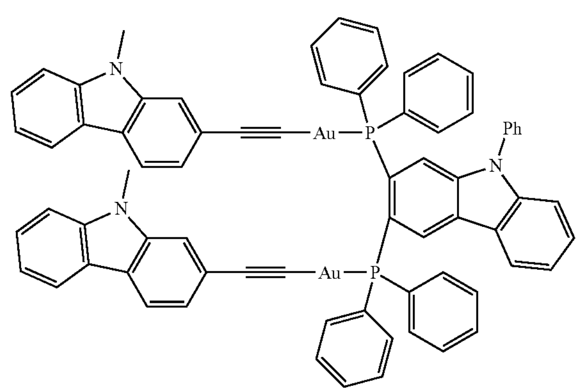

-continued
527
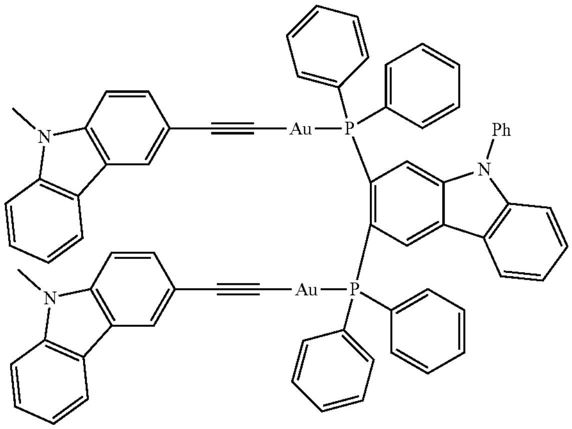
528
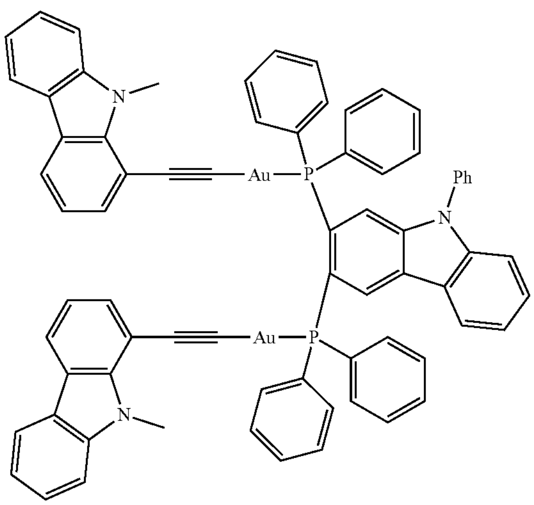
529
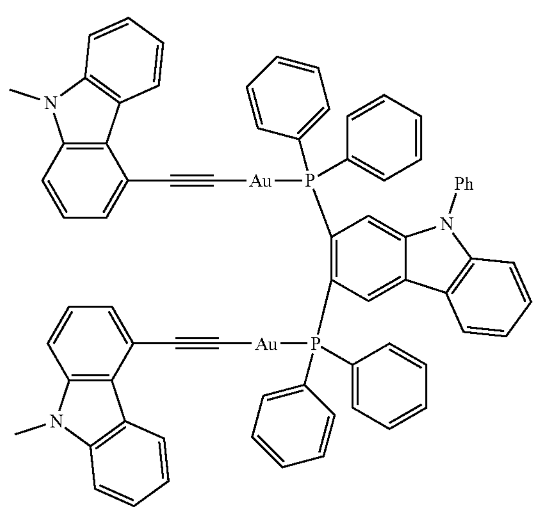
-continued
530
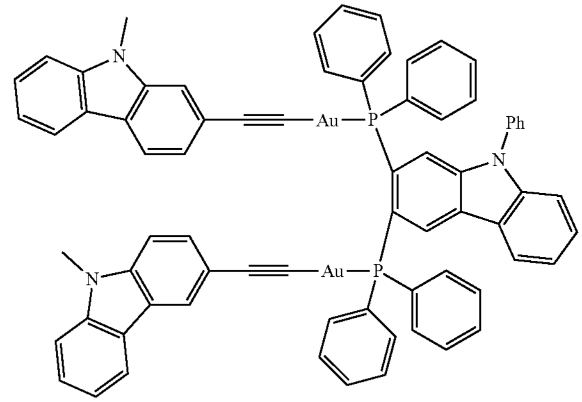
531
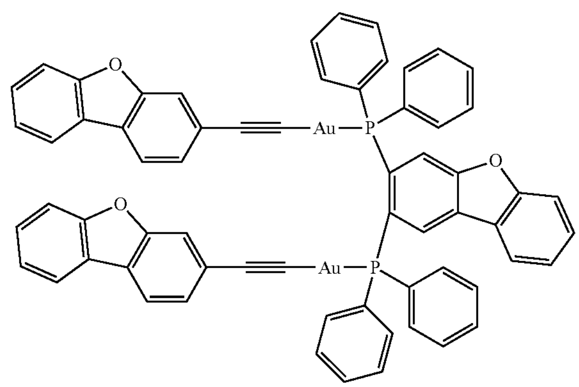
532
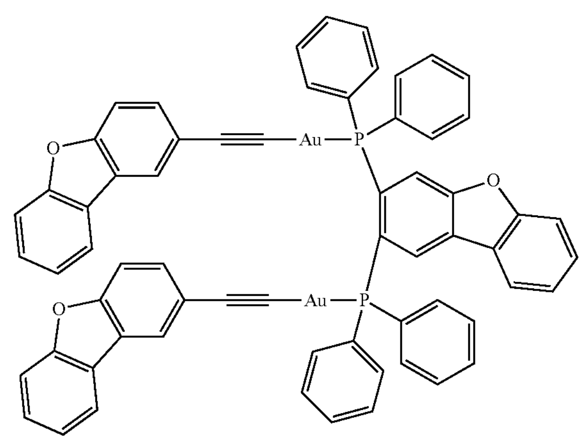

-continued
533
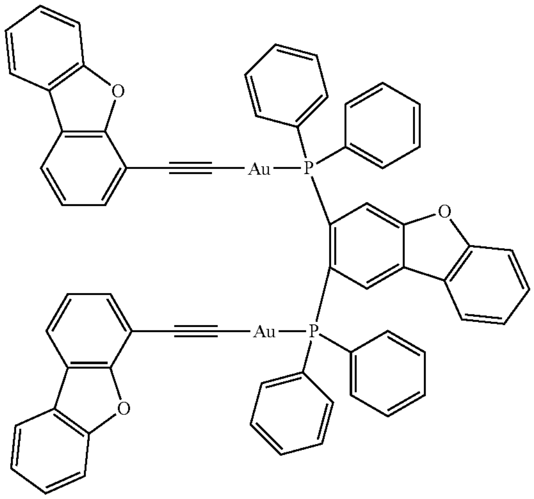
534
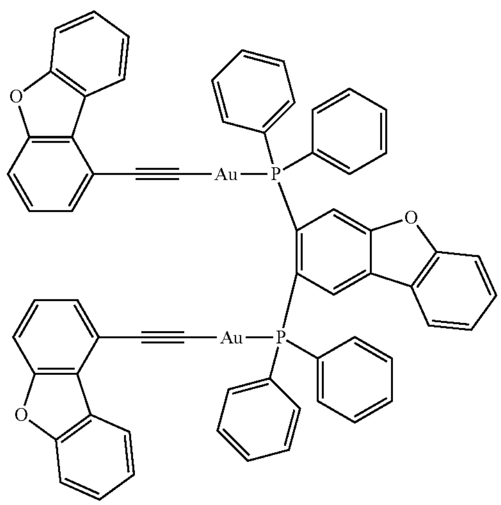
535
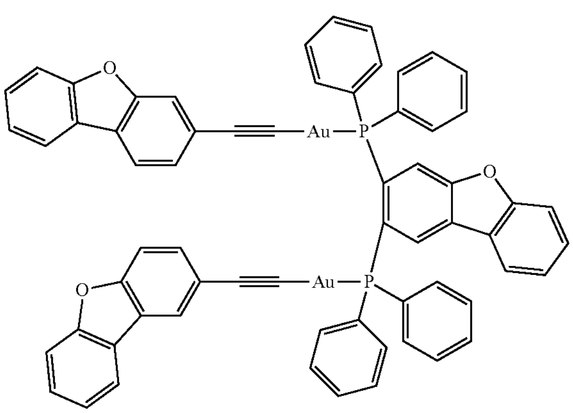
-continued
536
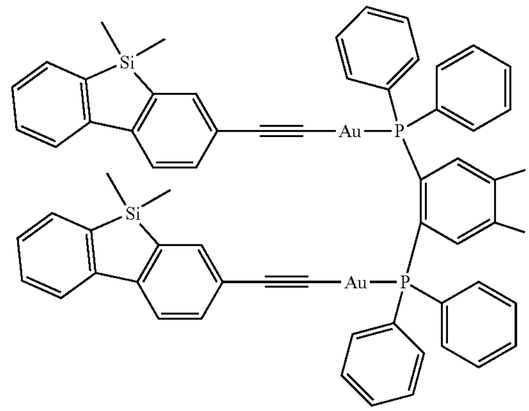
537
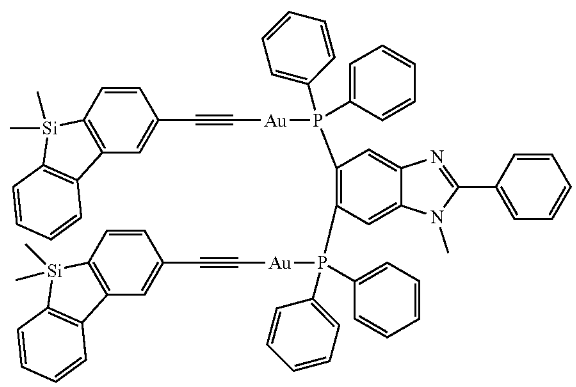
538
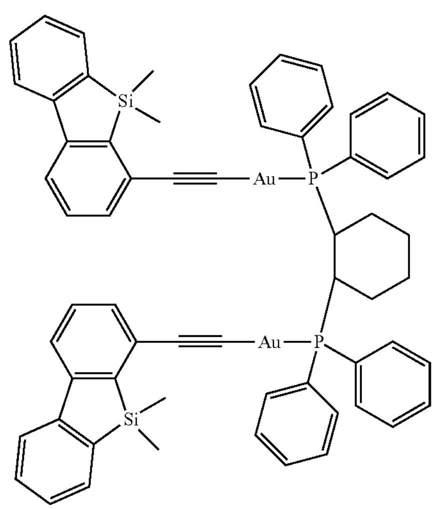

-continued
539
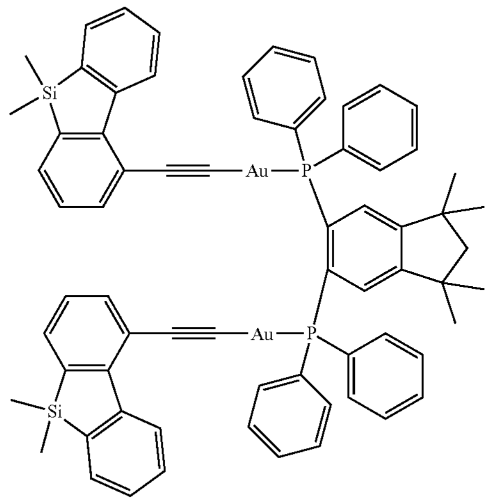
540
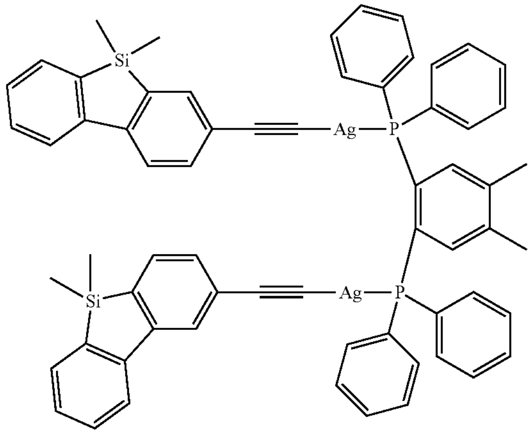
541
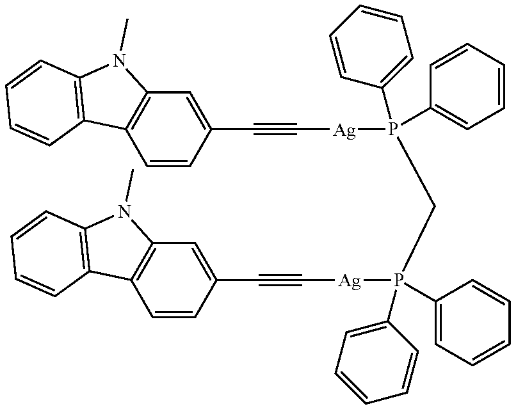
-continued
542
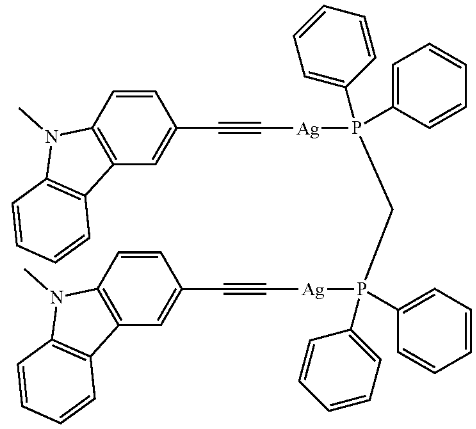
543
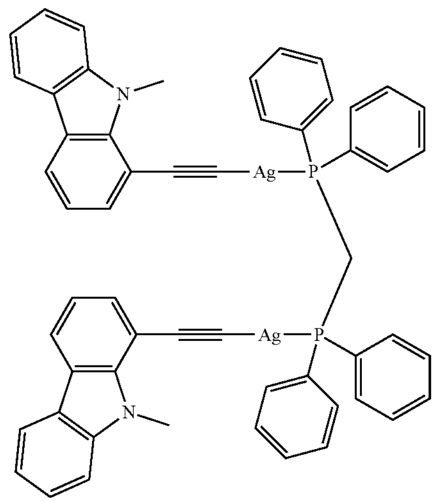
544
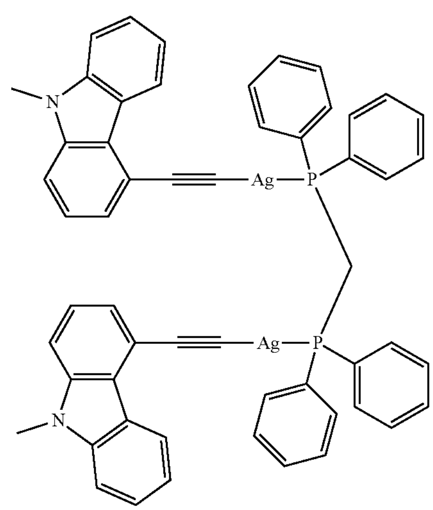

-continued
545
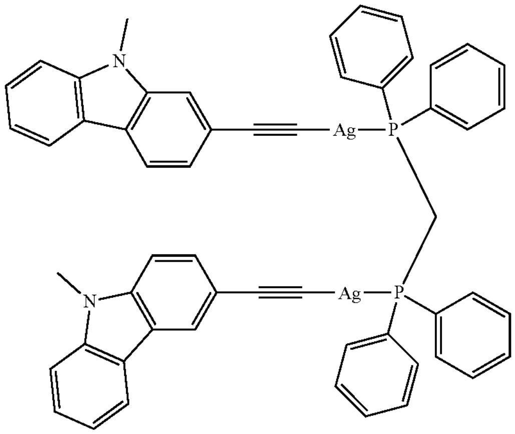
546
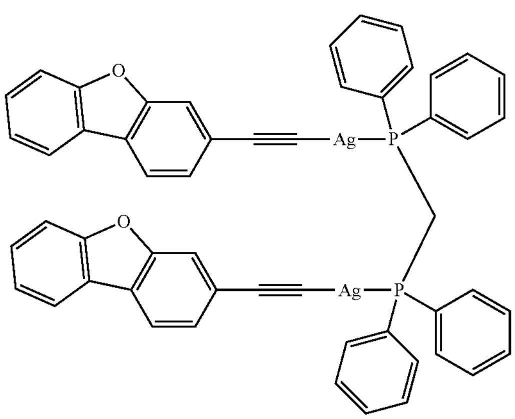
547
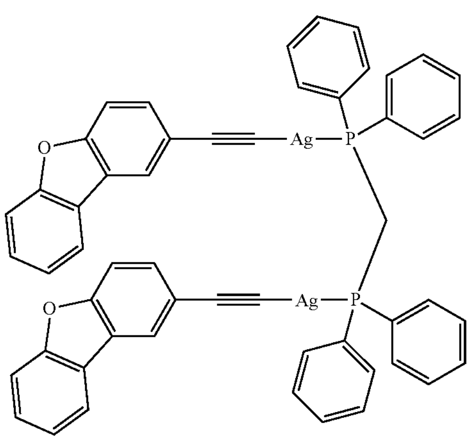
-continued
548
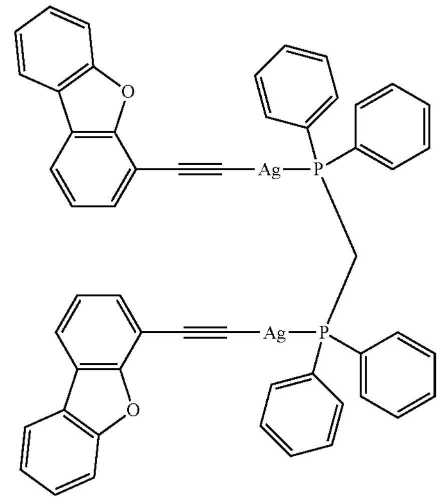
549
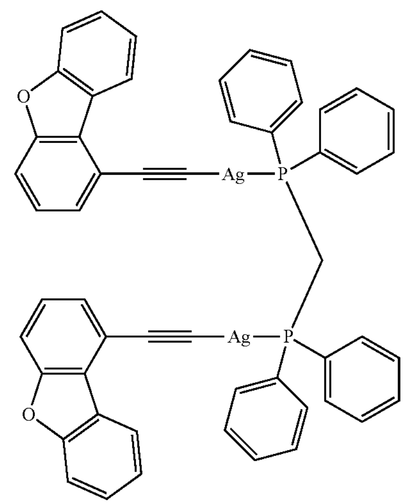
550
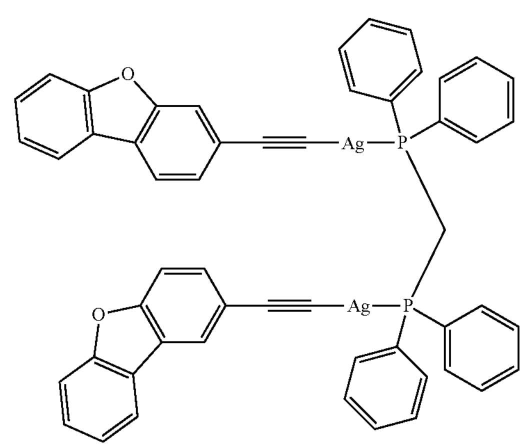

-continued
551
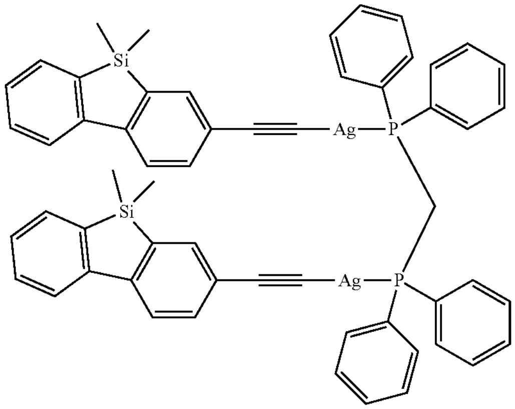
552
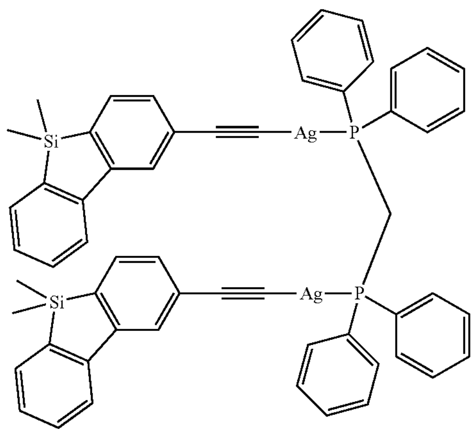
553
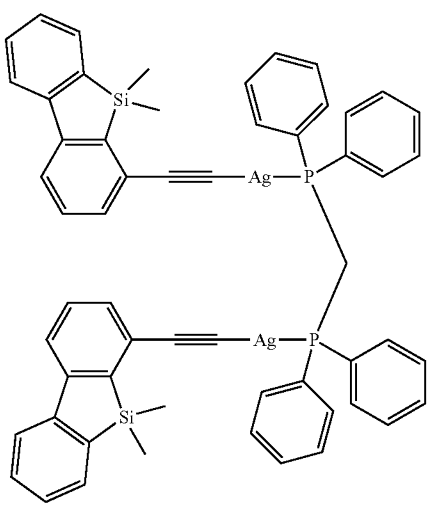
-continued
554
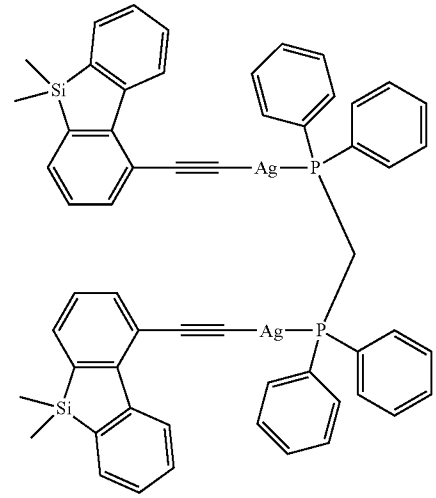
555
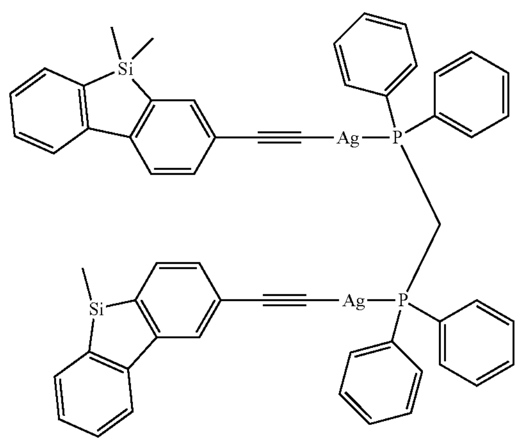
556
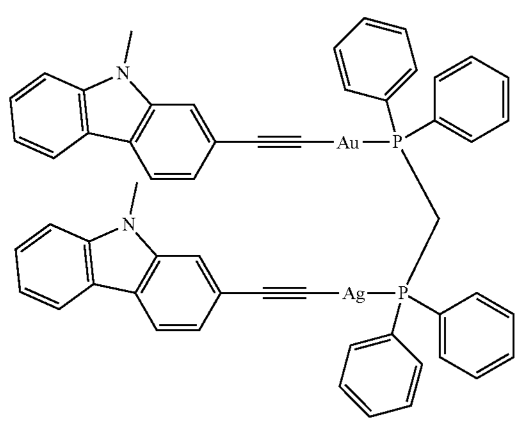

-continued
557
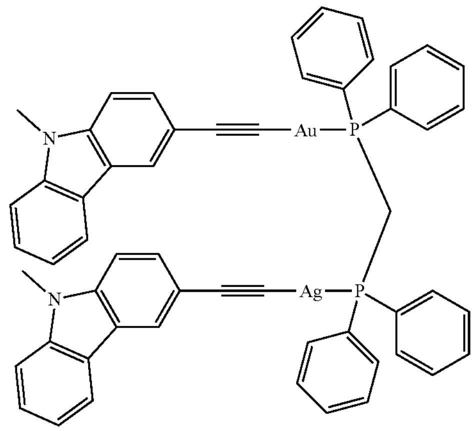
558
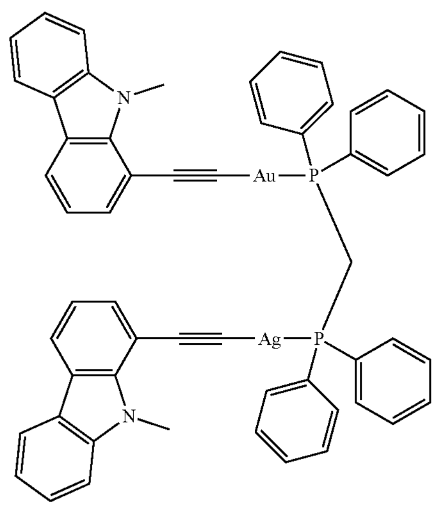
559
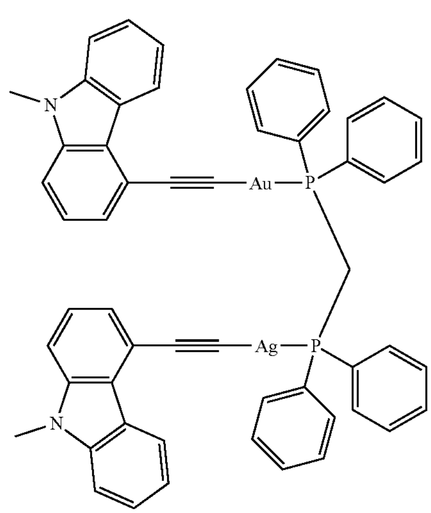
-continued
560
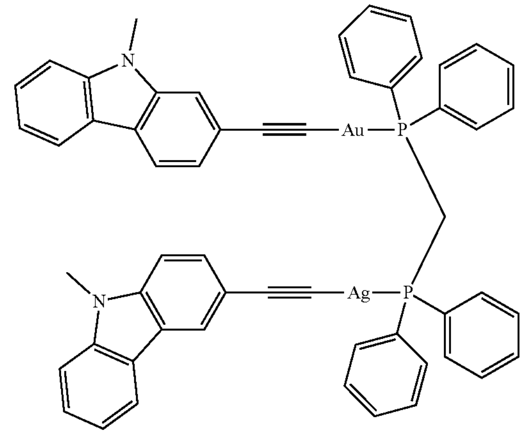
561
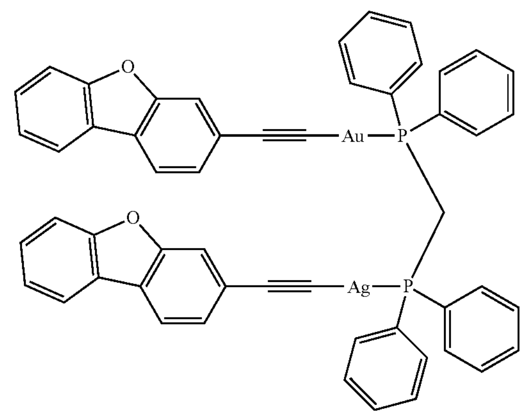
562
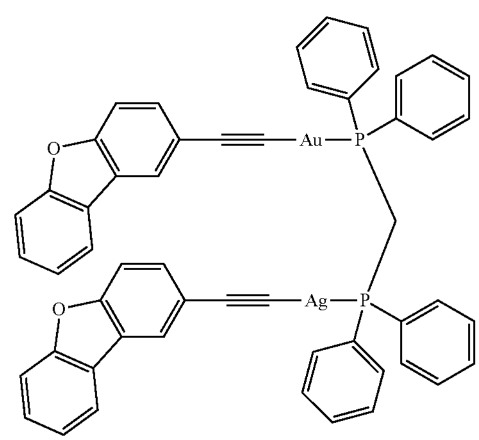

563
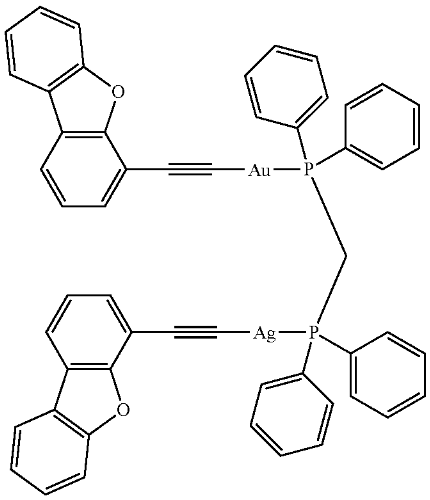
564
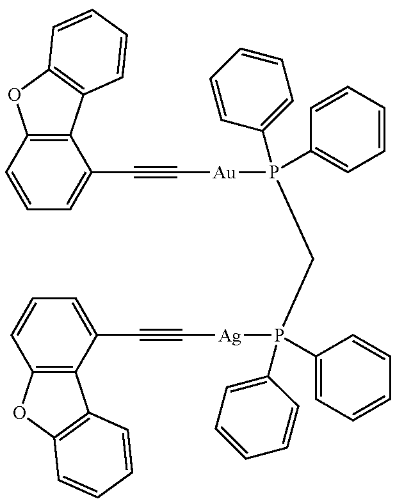
565
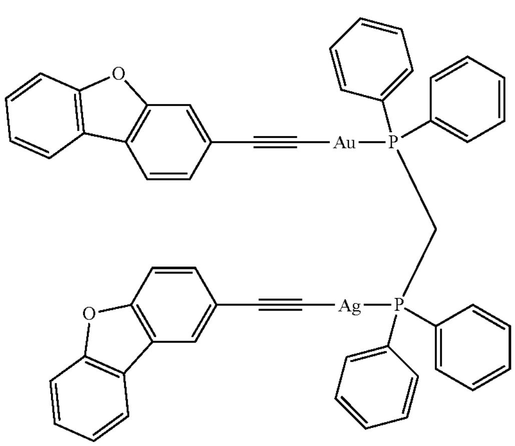
566
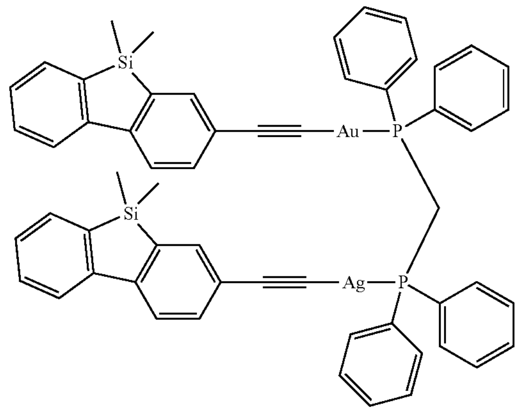
567
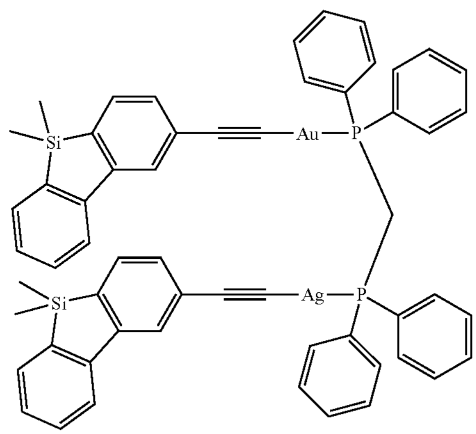
568
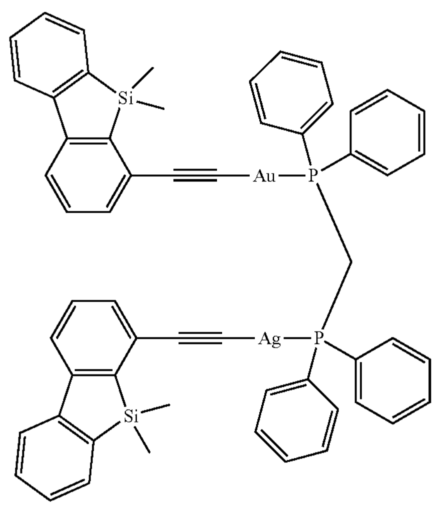

-continued
569
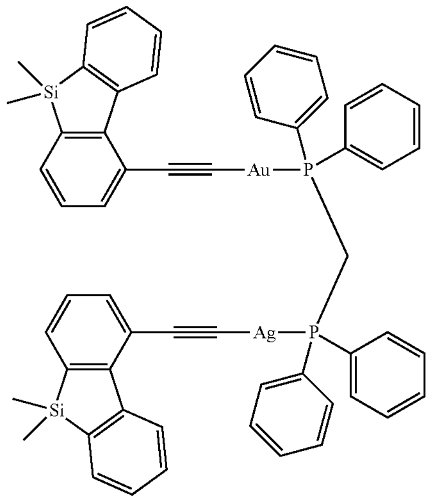
570
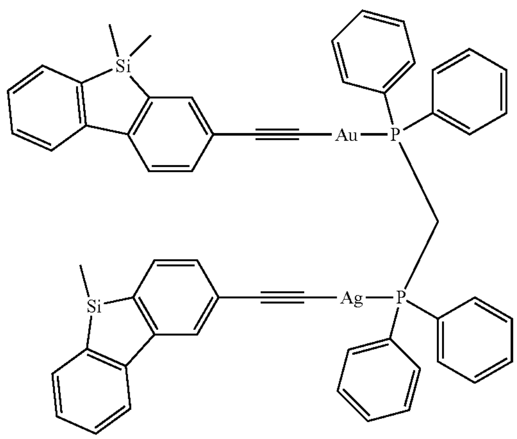
571
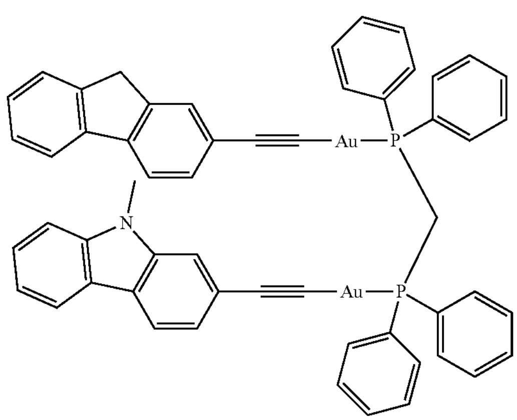
-continued
572
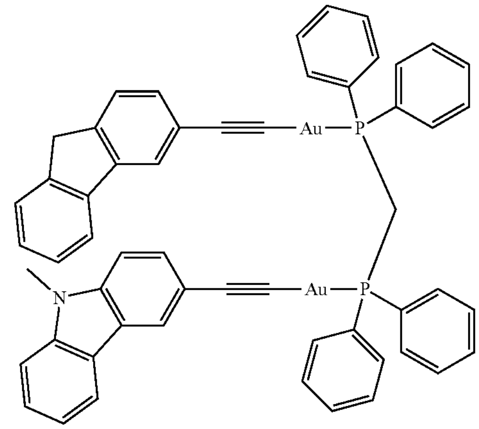
573
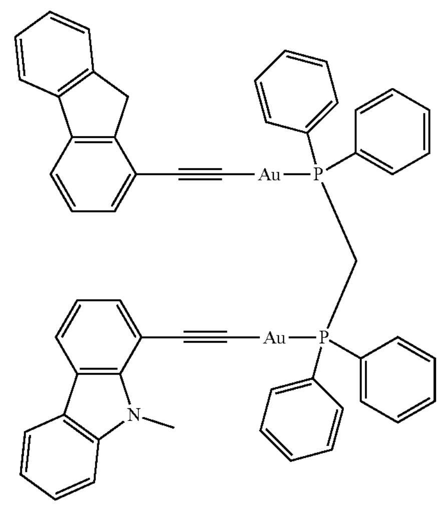
574
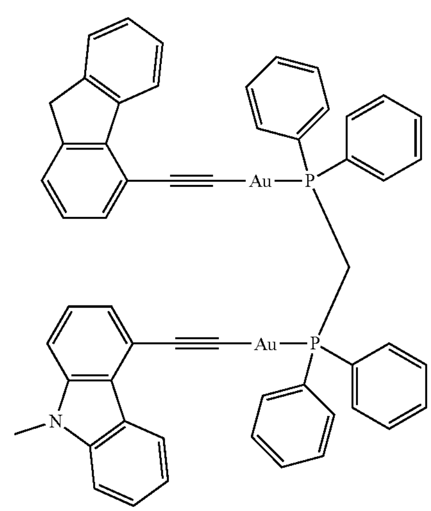

-continued
575
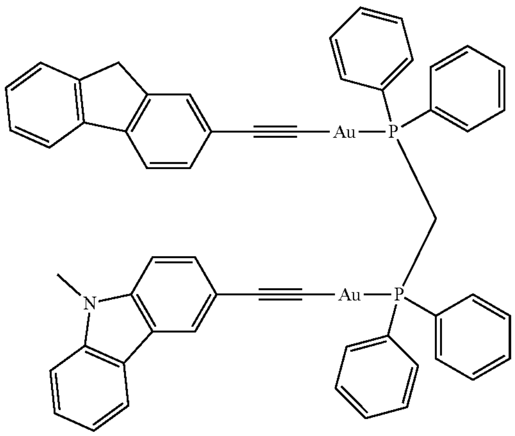
576
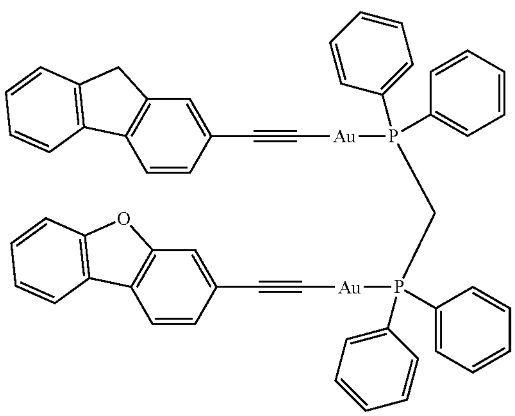
577
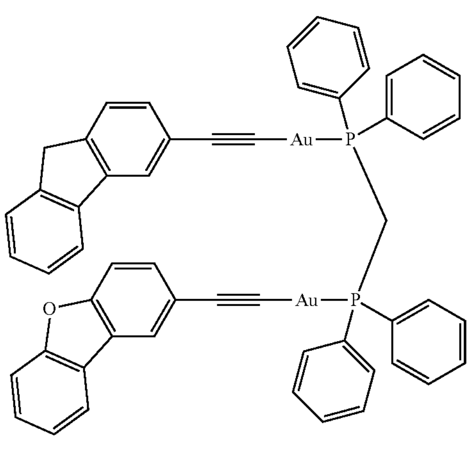
-continued
578
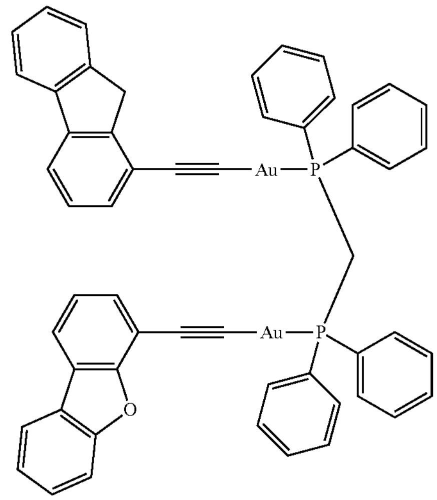
579
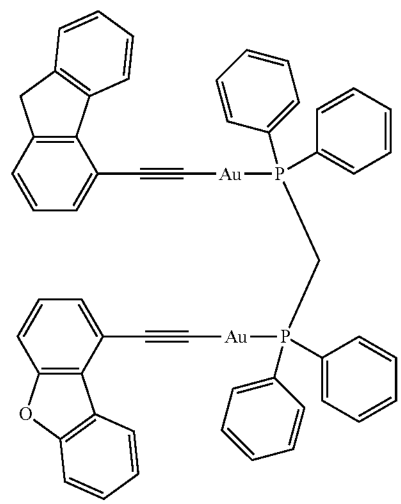
580
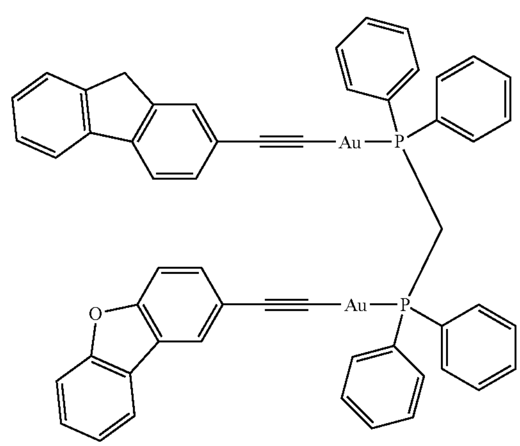

-continued
581
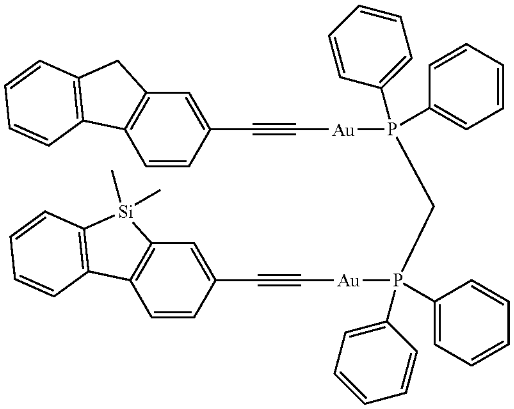
582
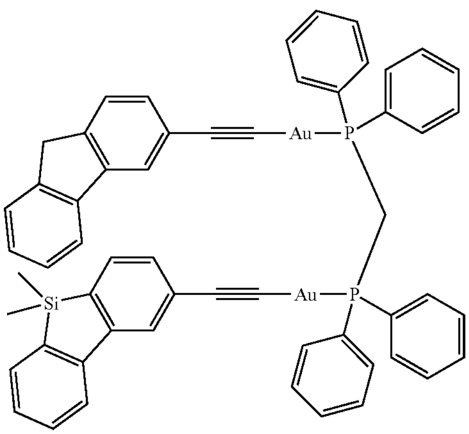
583
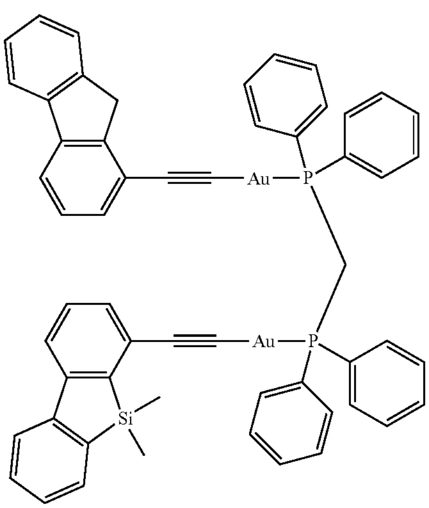
-continued
584
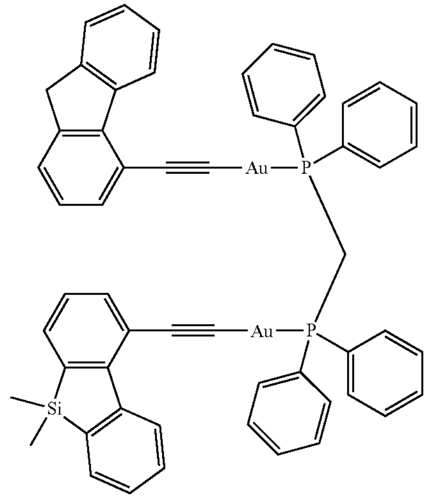
585
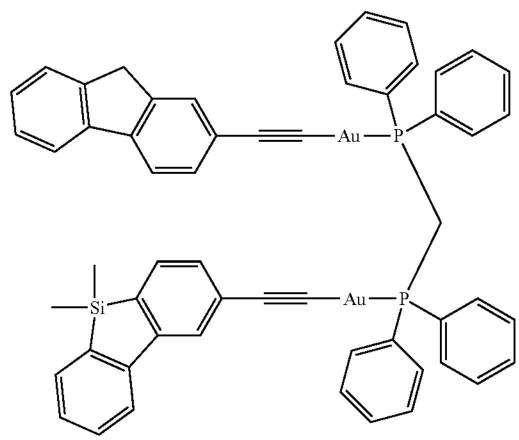
586
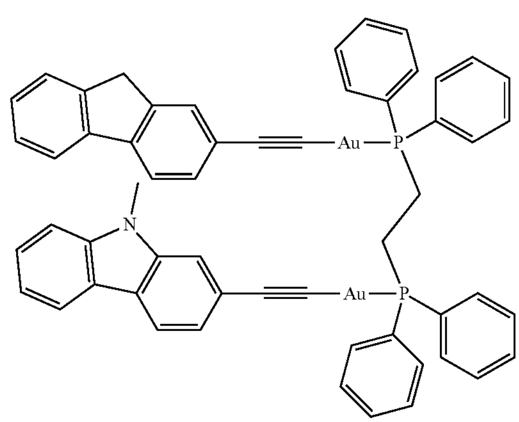

-continued
587
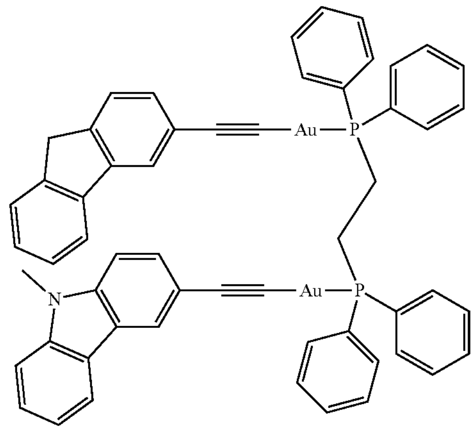
588
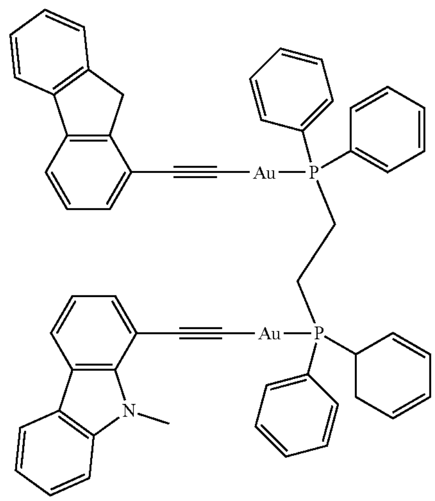
589
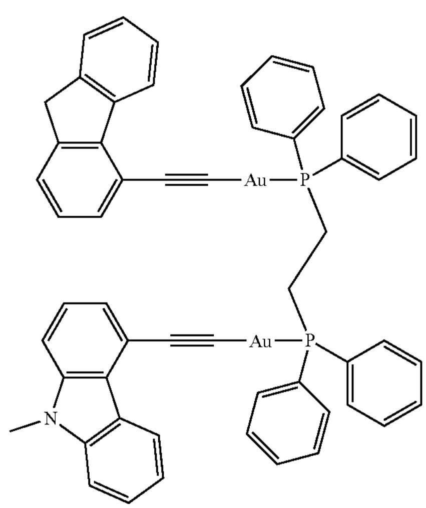
-continued
590
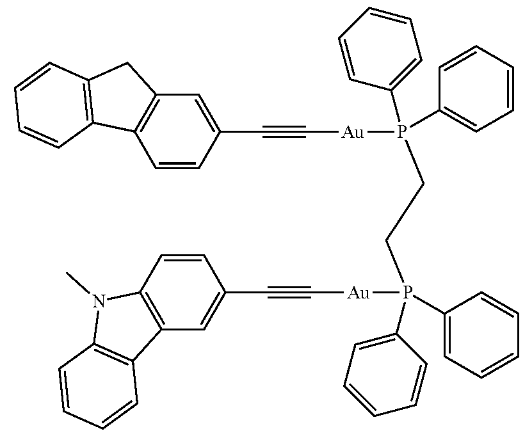
591
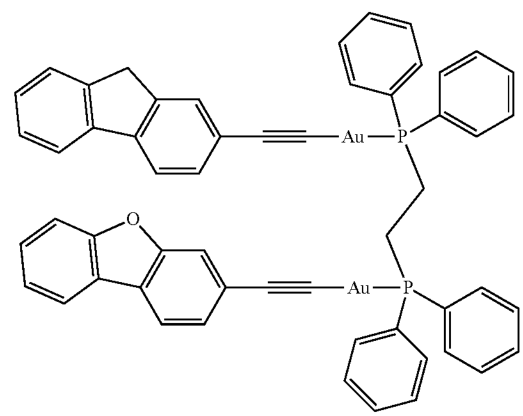
592
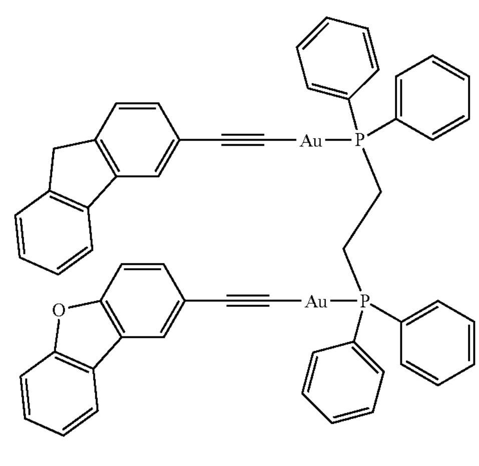

-continued
592
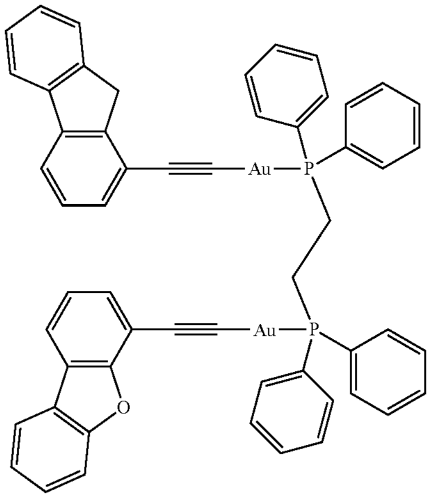
594
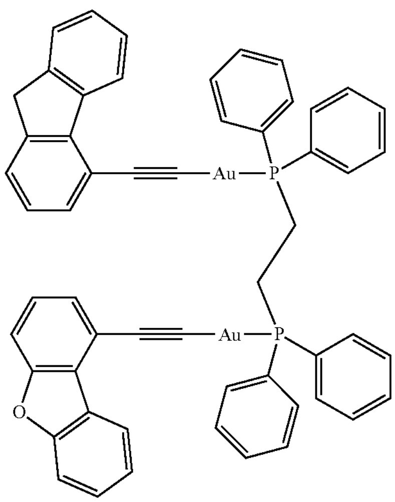
595
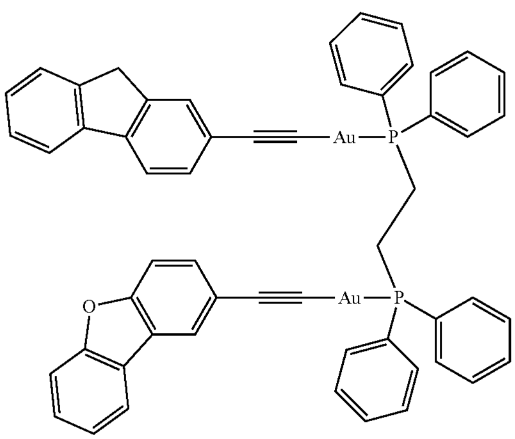
-continued
596
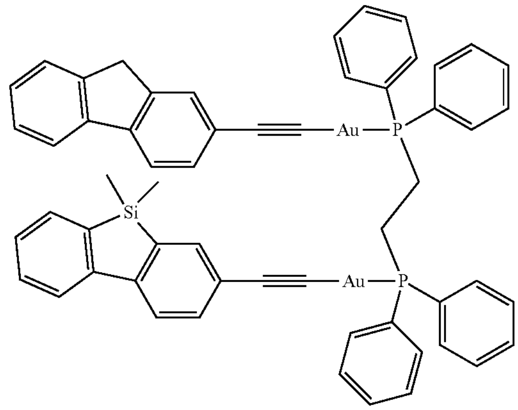
597
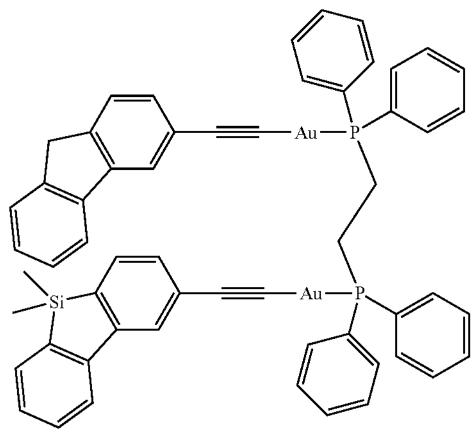
598
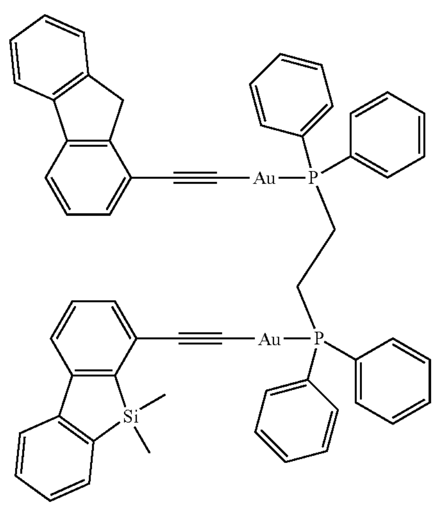

-continued
599
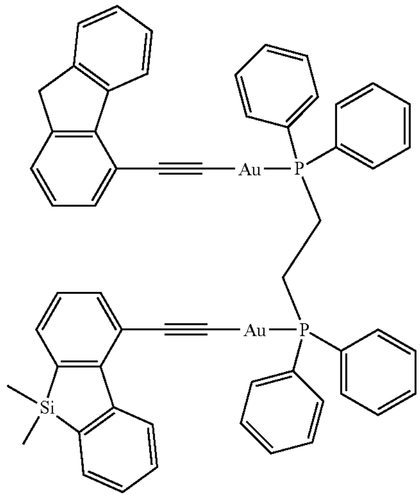
-continued
600
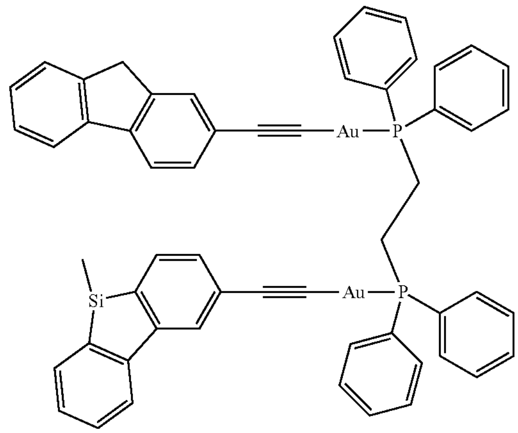
601
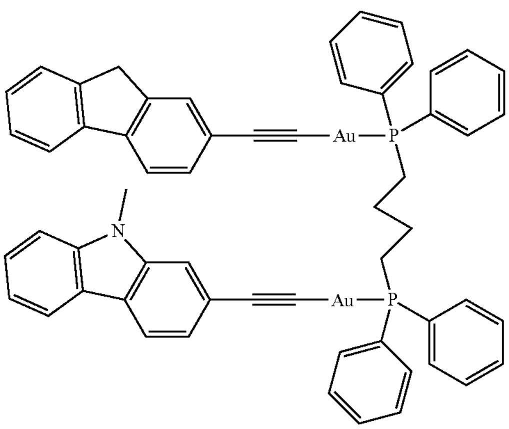
602
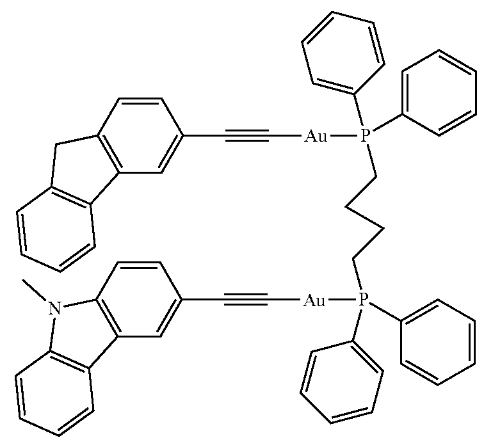
603
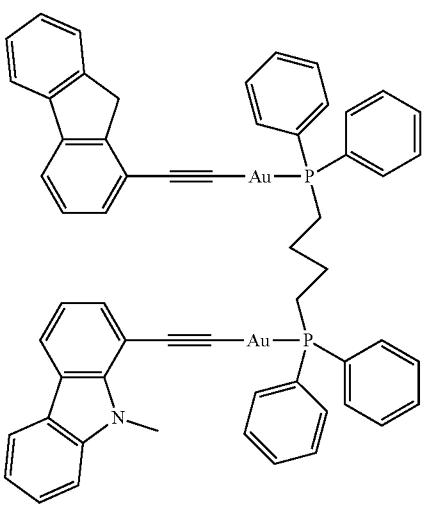
604
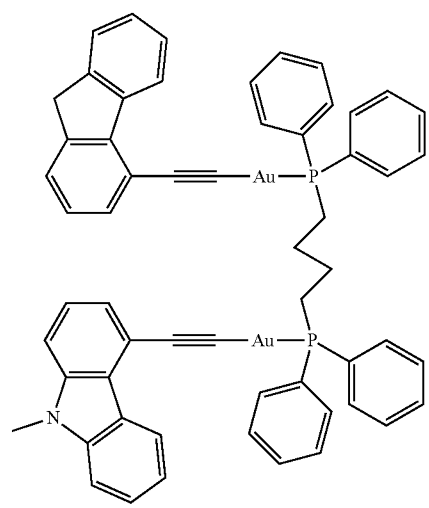

-continued
605
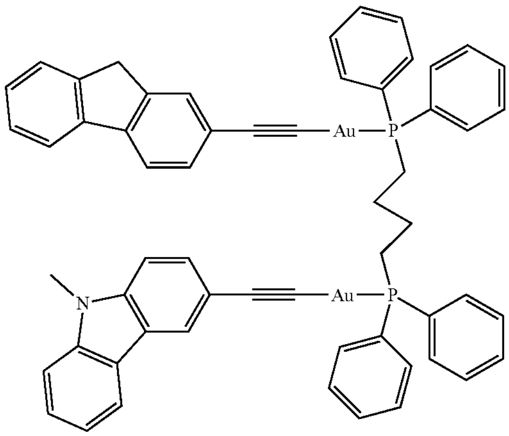
606
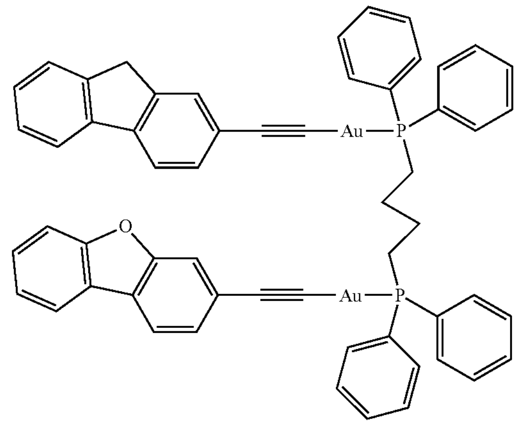
607
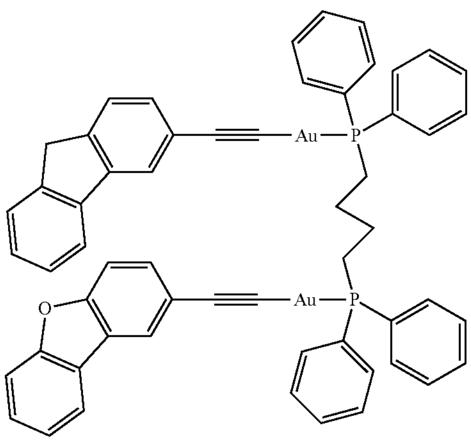
608
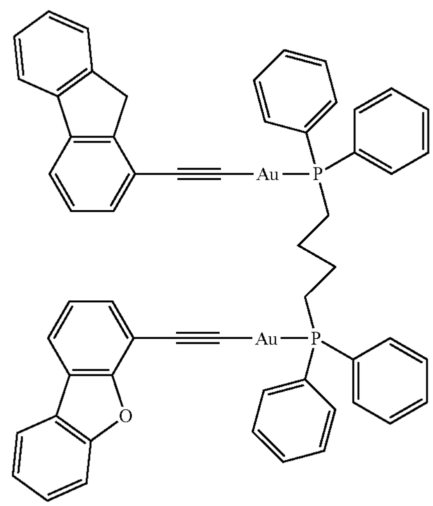
609
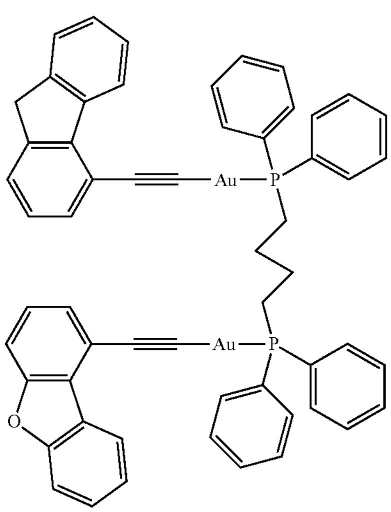
610
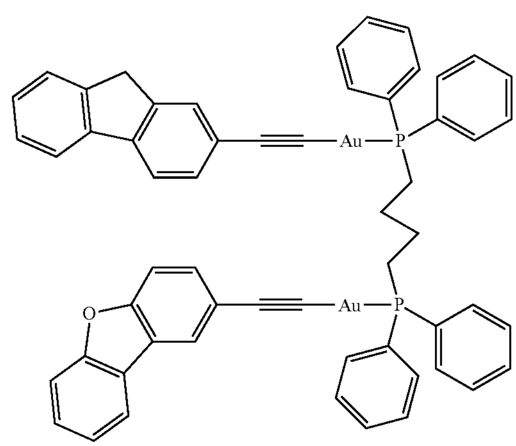

-continued
611
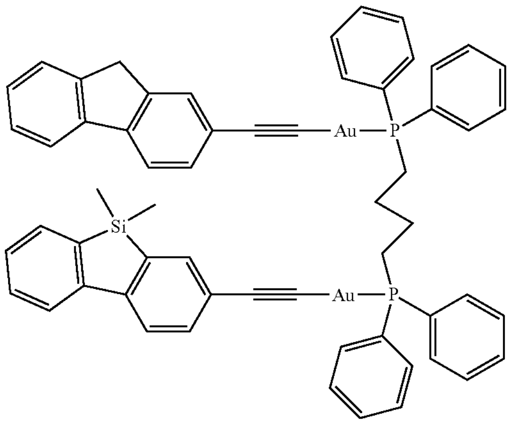
612
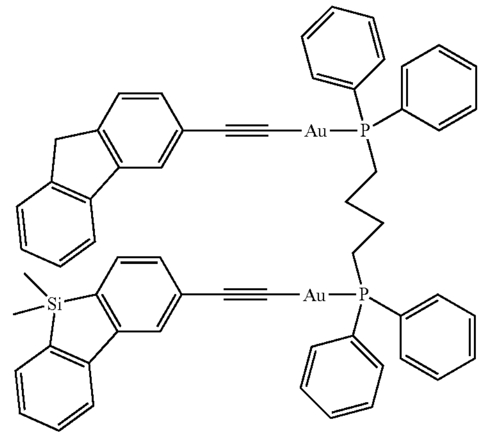
613
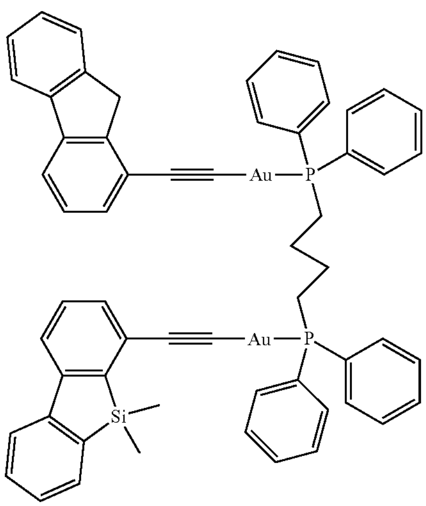
614
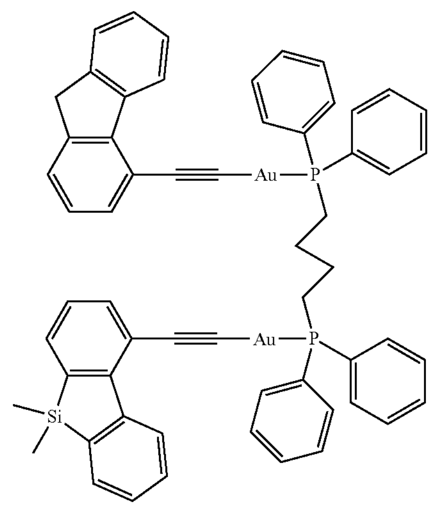
615
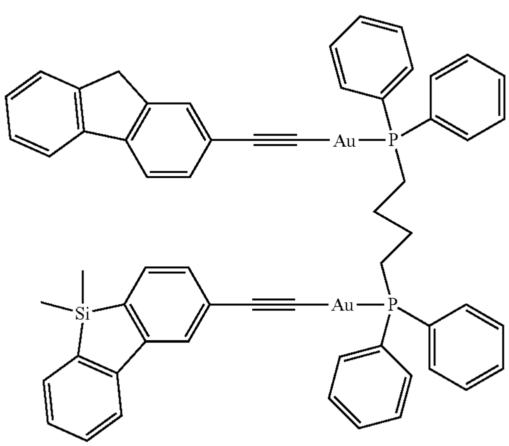
616
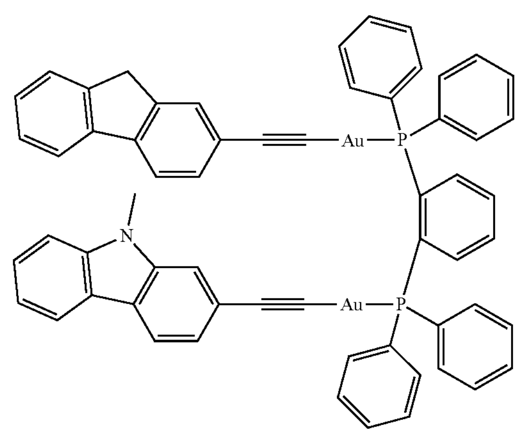

-continued
617
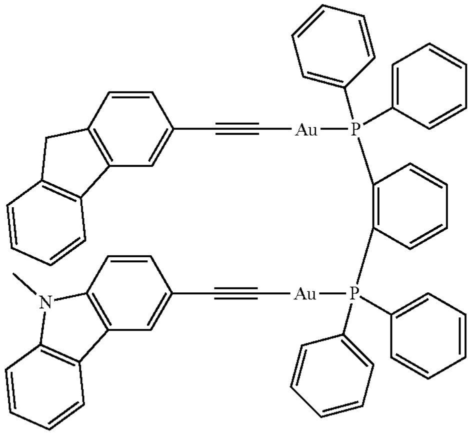
618
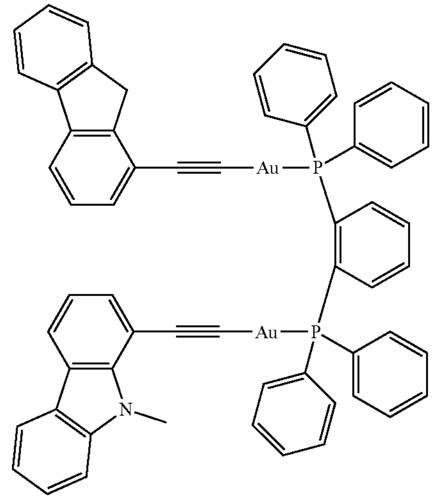
619
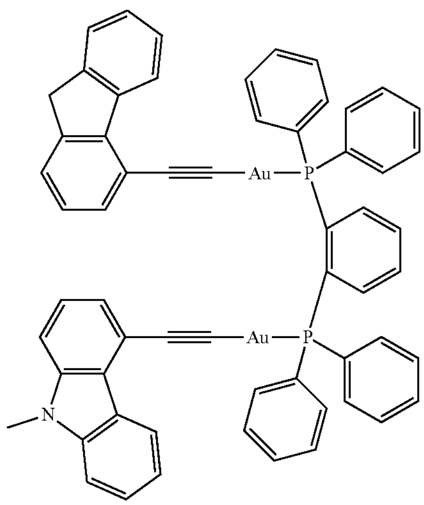
620
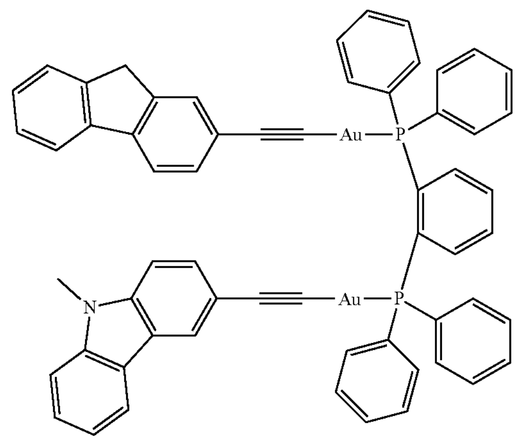
621
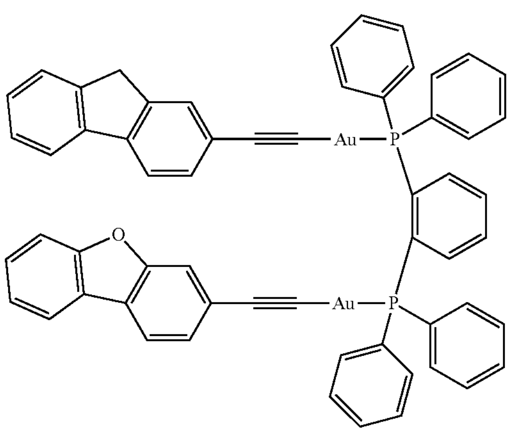
622
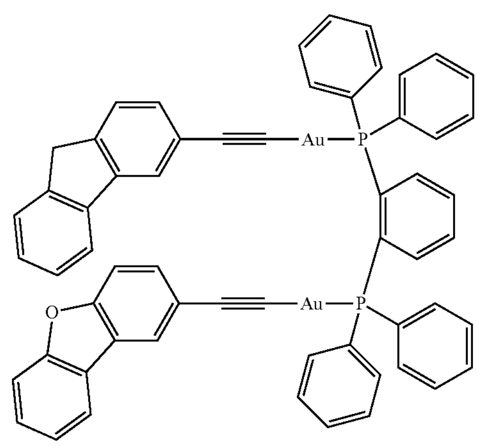

-continued
623
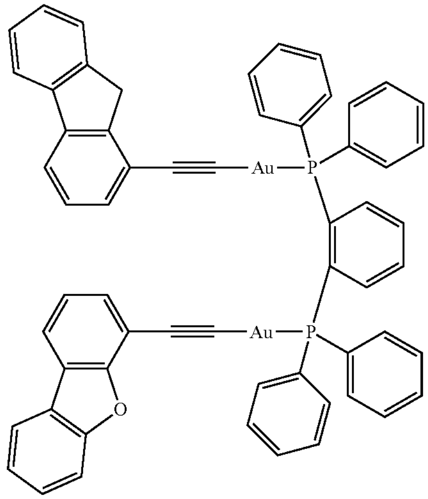
624
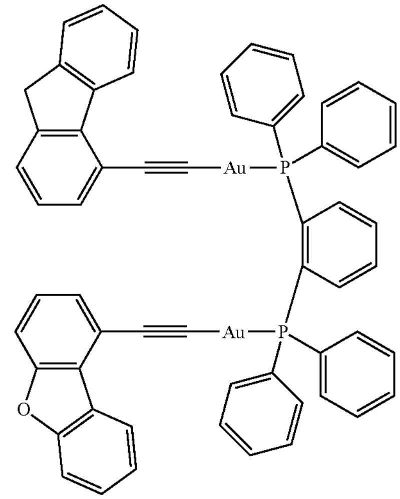
625
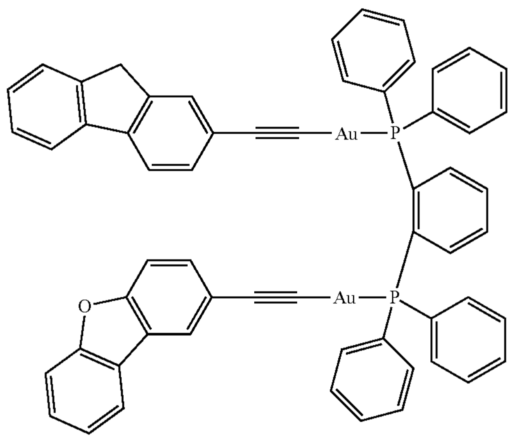
626
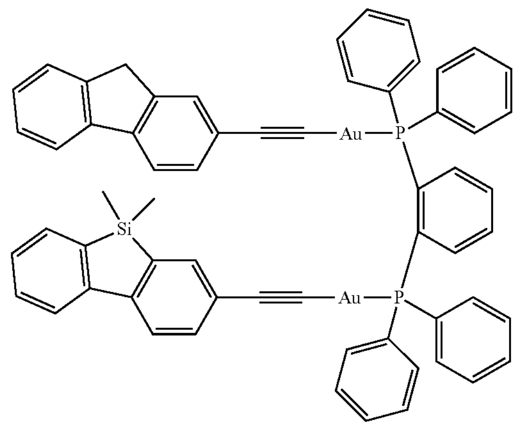
627
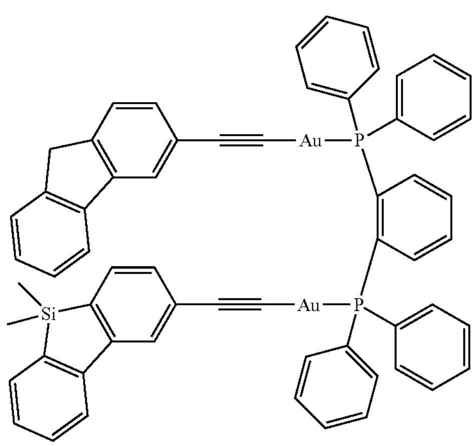
628
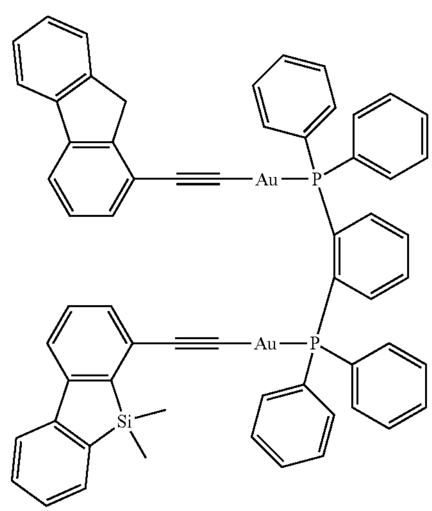

-continued
629
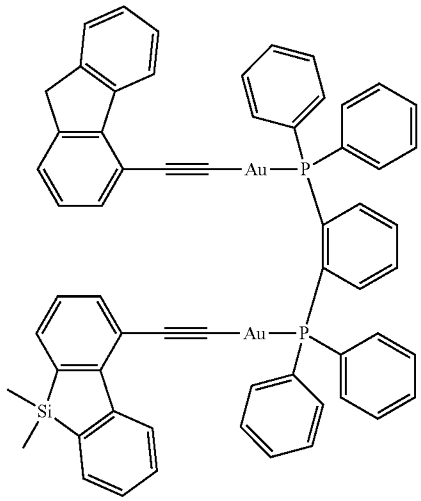
630
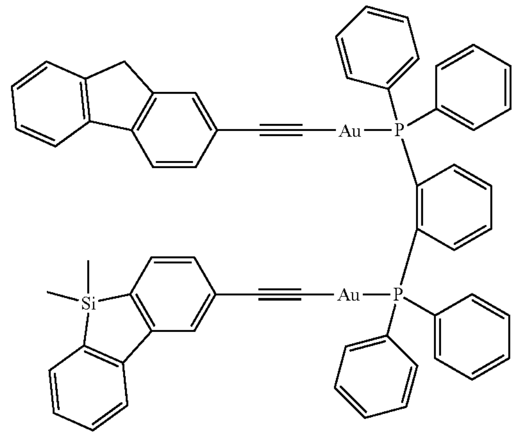
631
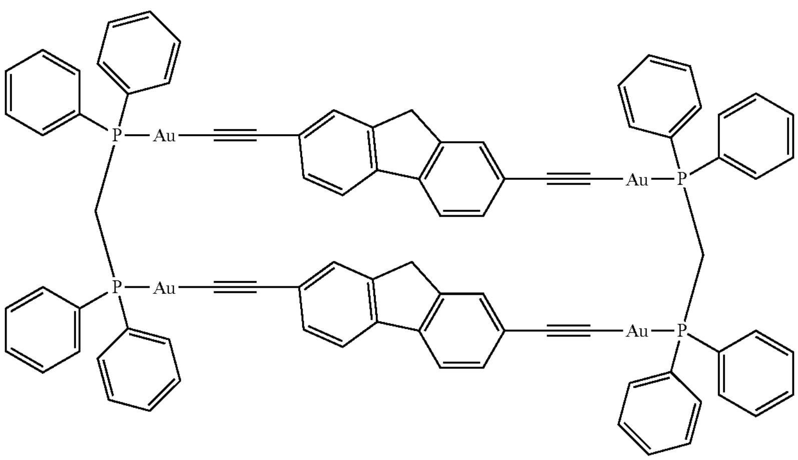
632
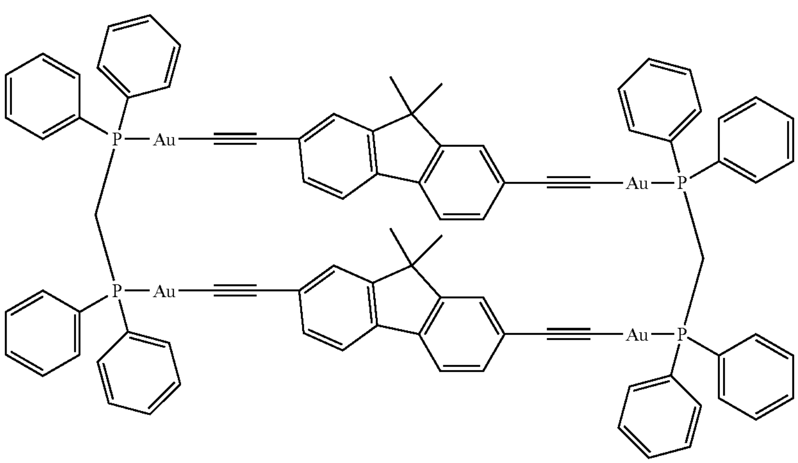

-continued
633
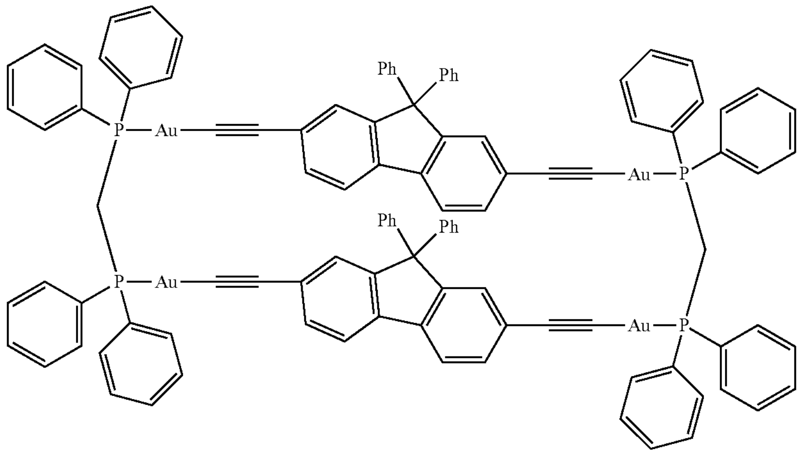
634
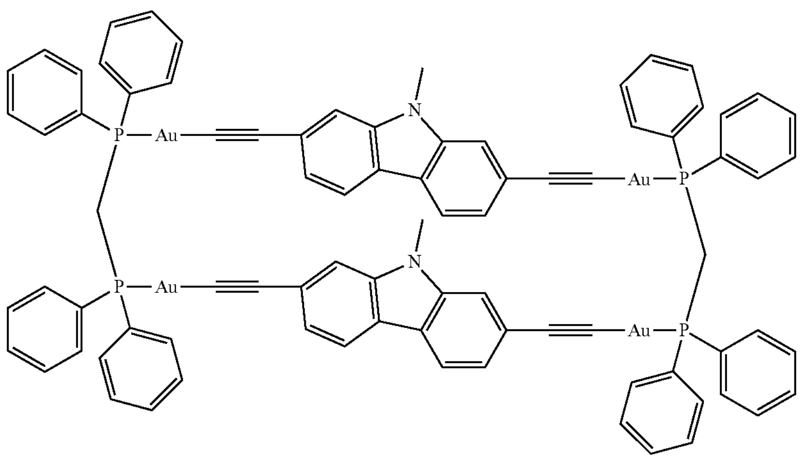
635
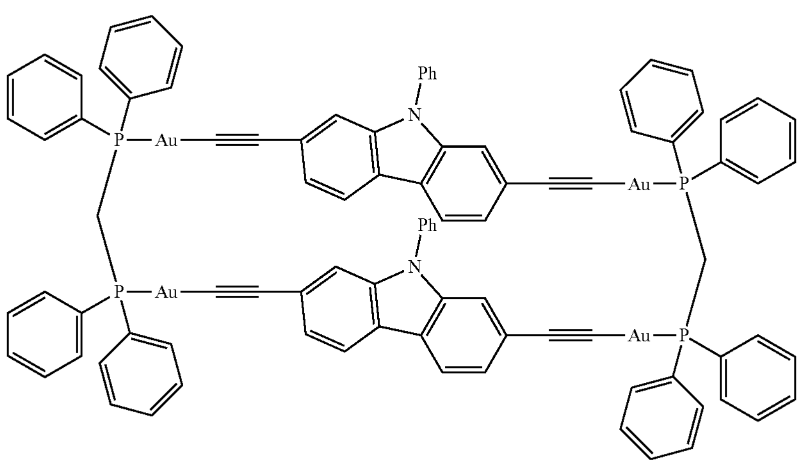

-continued
636
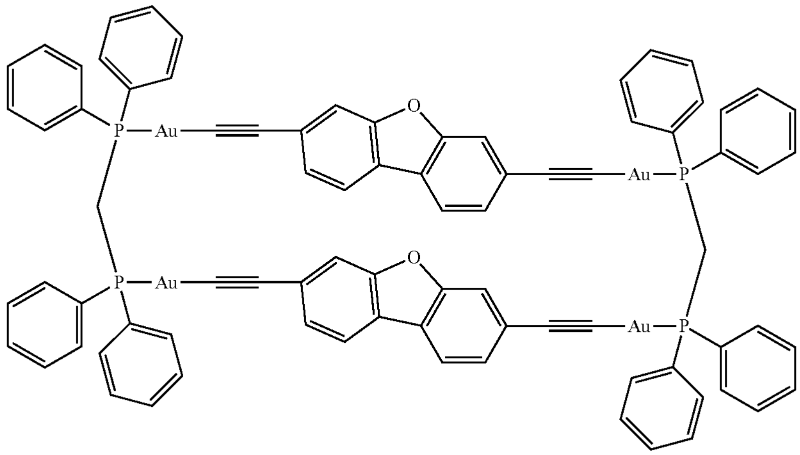
637
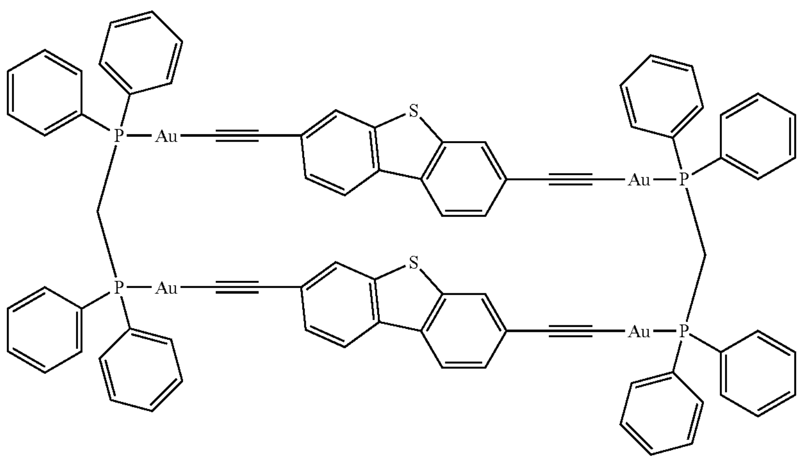
638
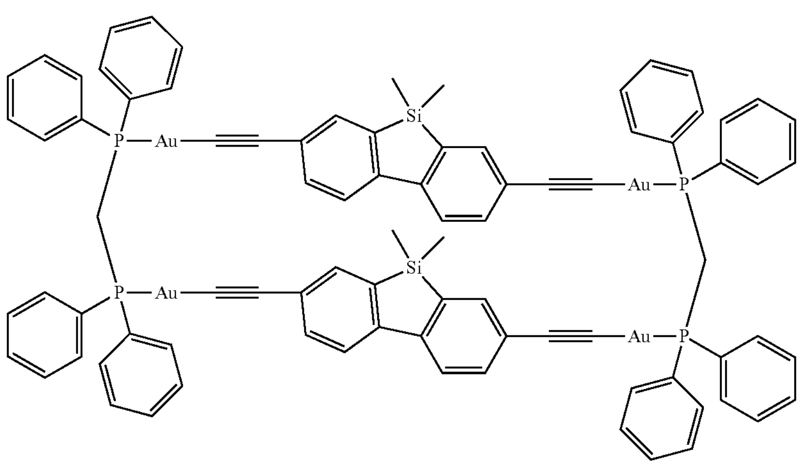

-continued
639
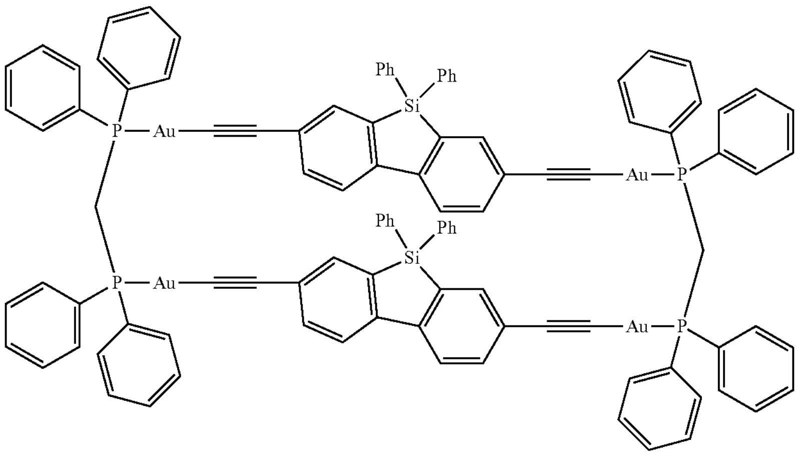
640
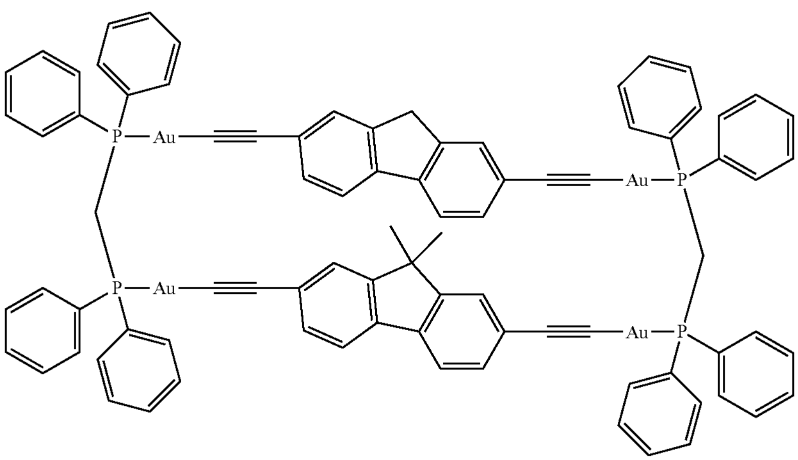
641
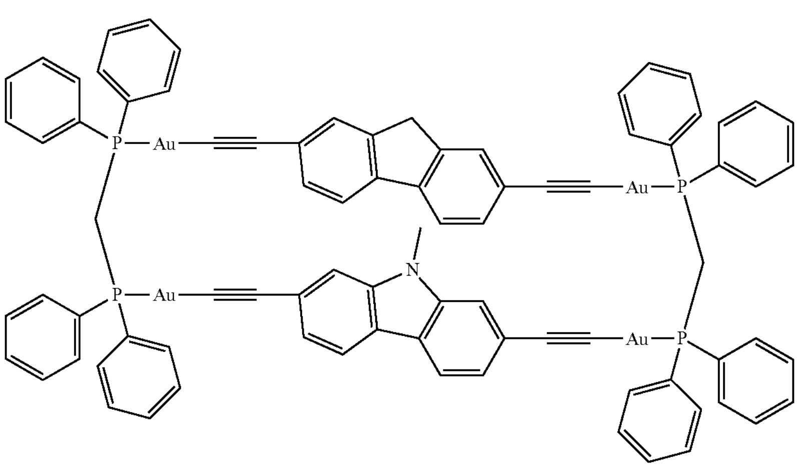

-continued
642
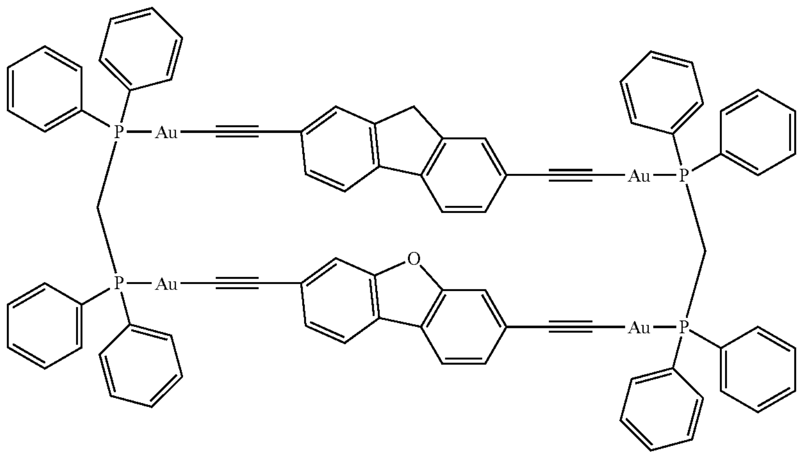
643
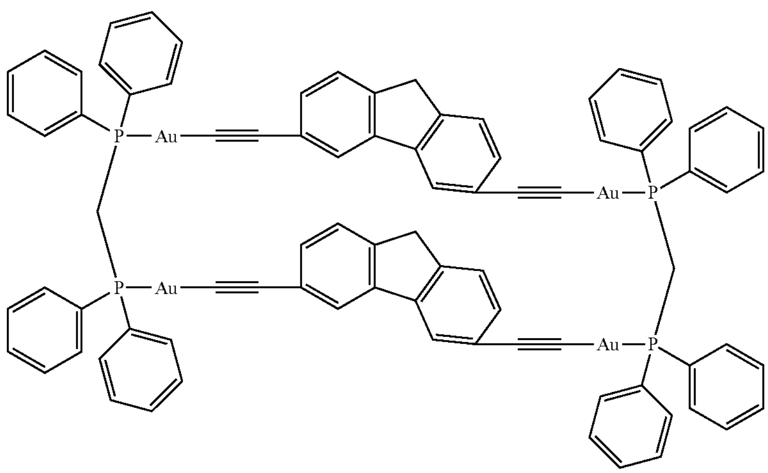
644
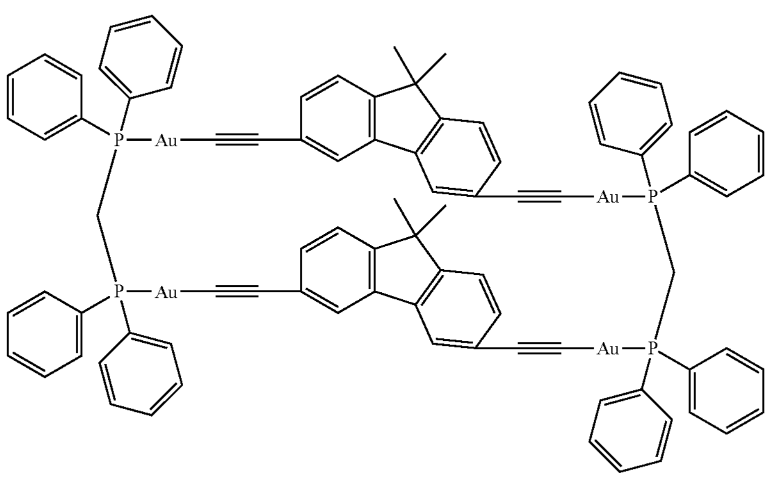

-continued
645
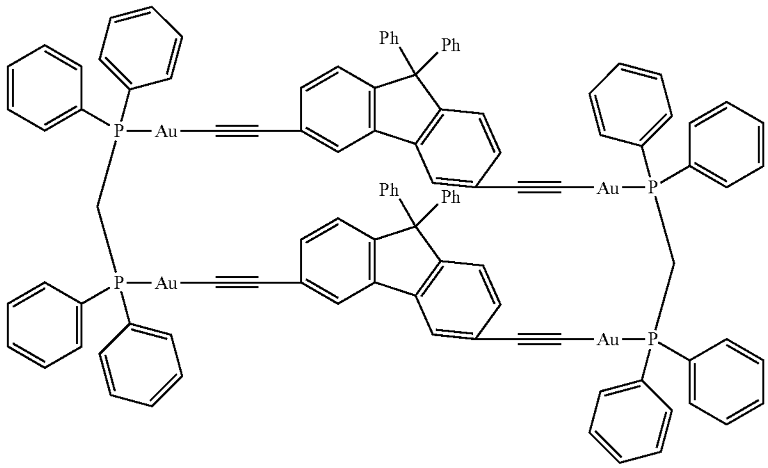
646
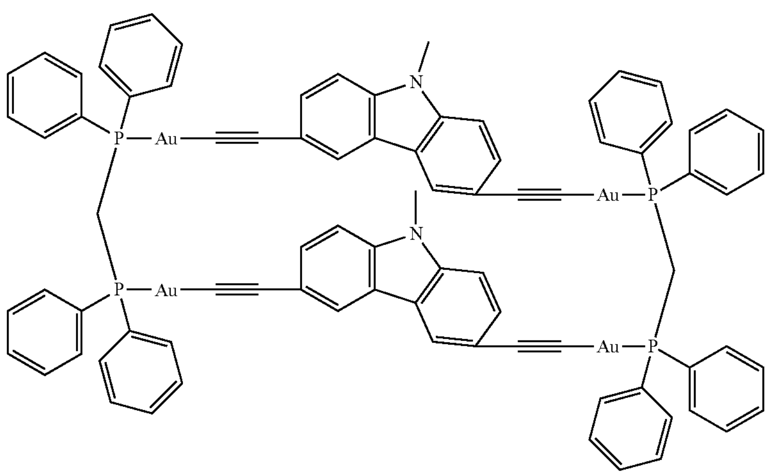
647
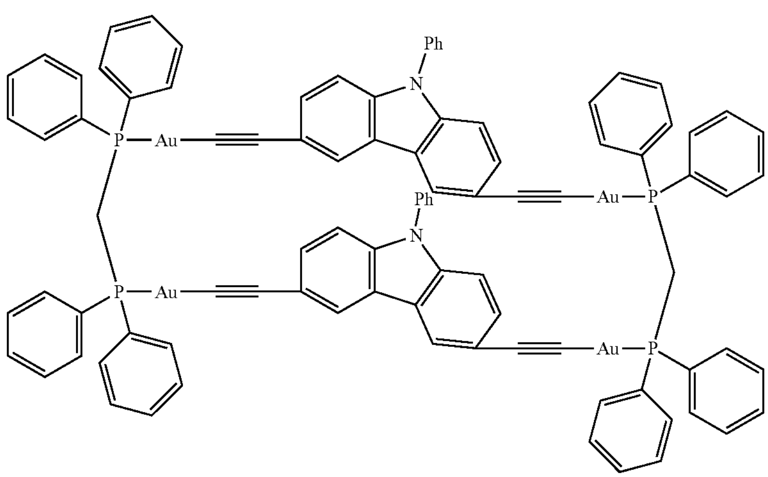

-continued
648
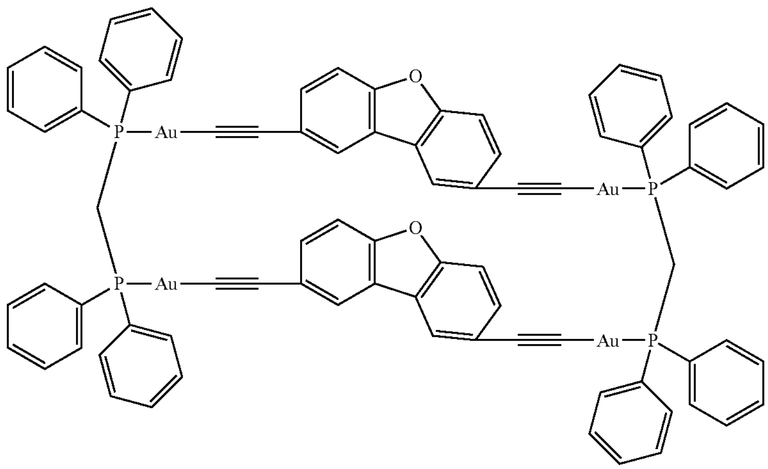
649
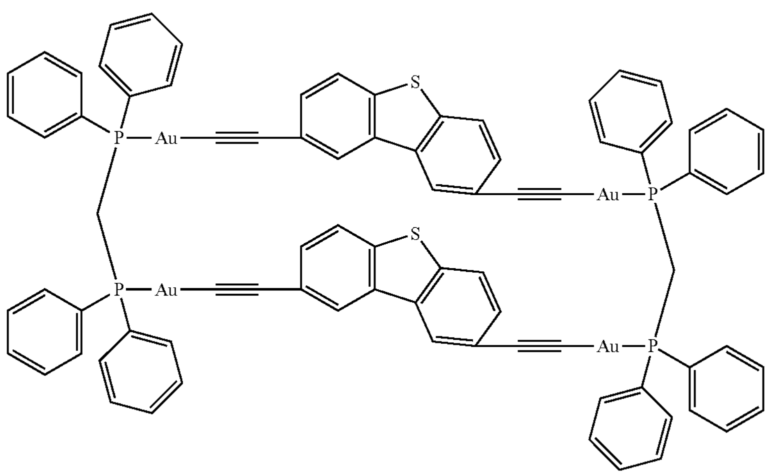
650
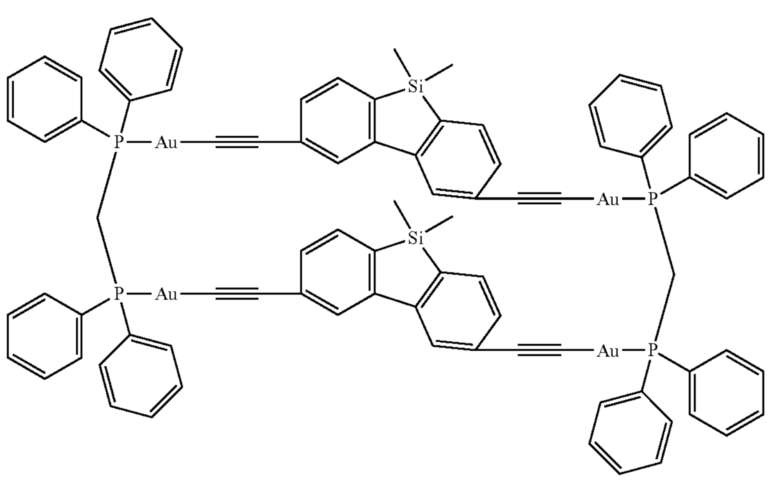

-continued
651
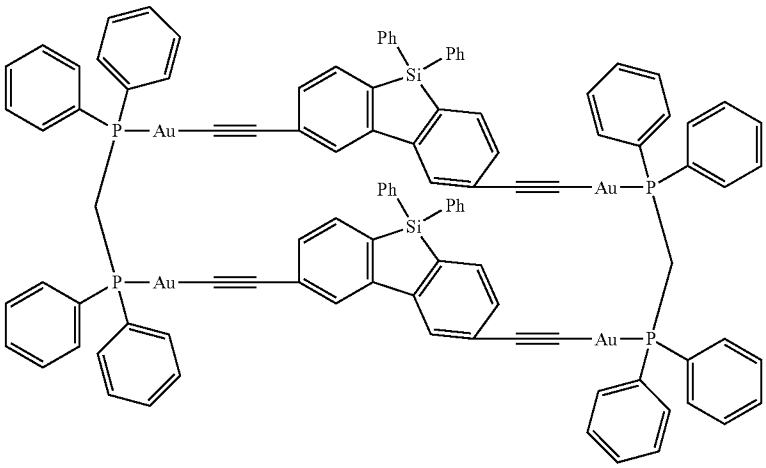
652
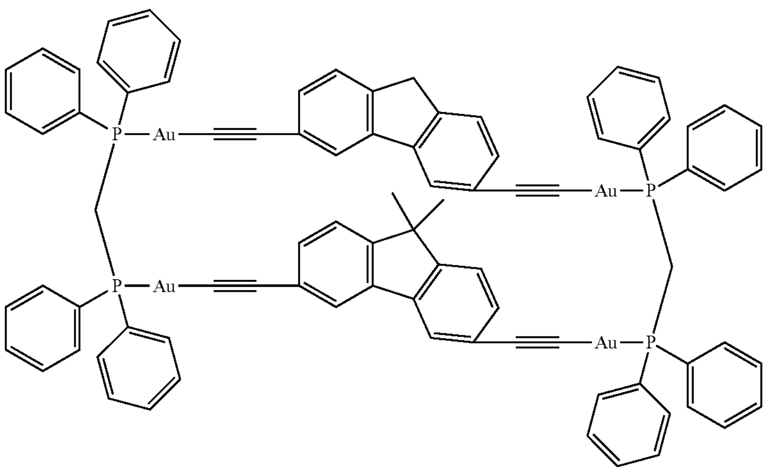
653
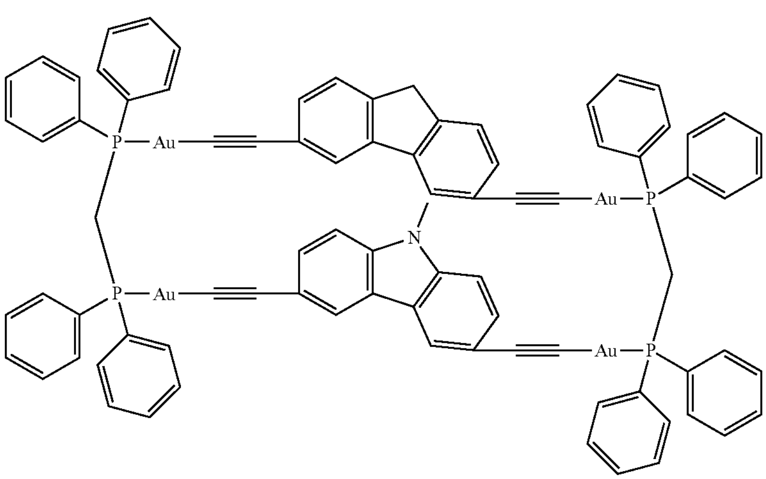

-continued
654
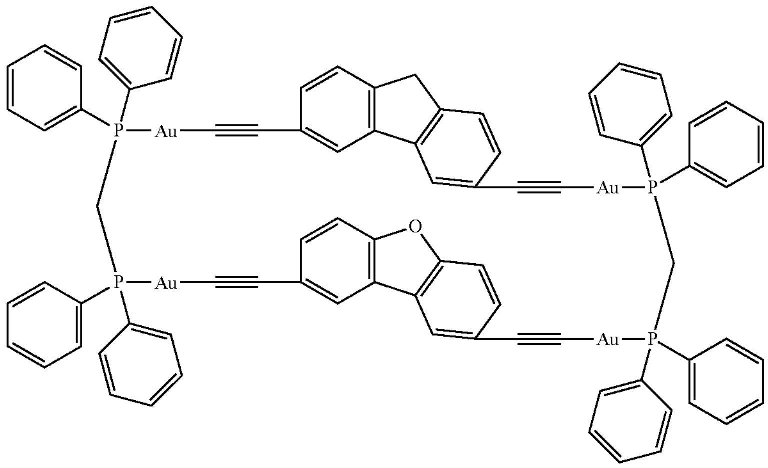
655
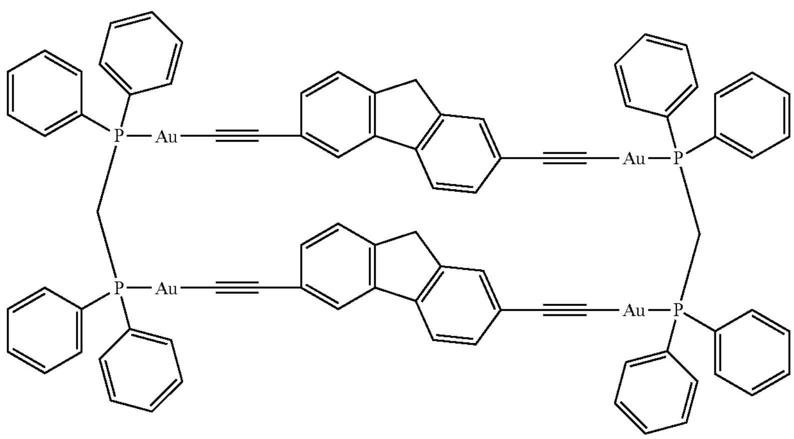
656
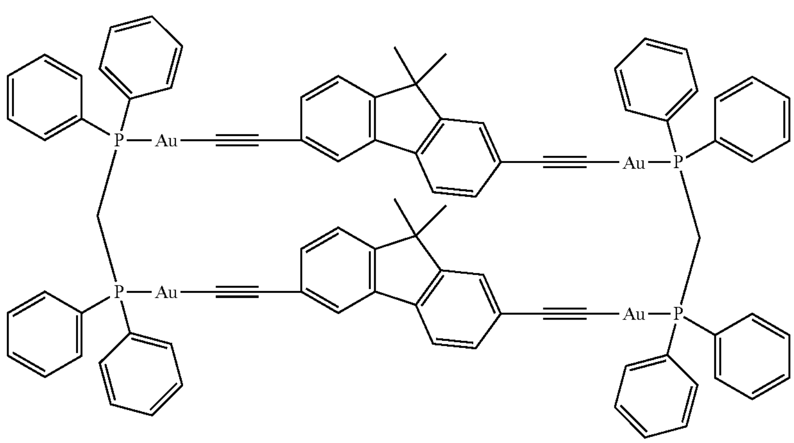

-continued
657
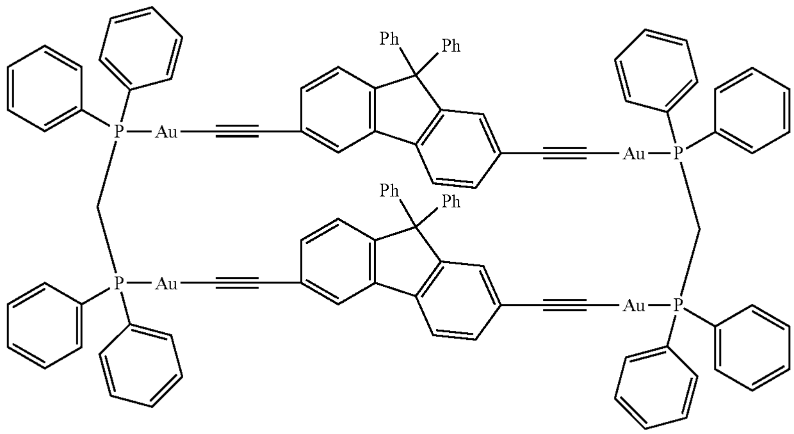
658
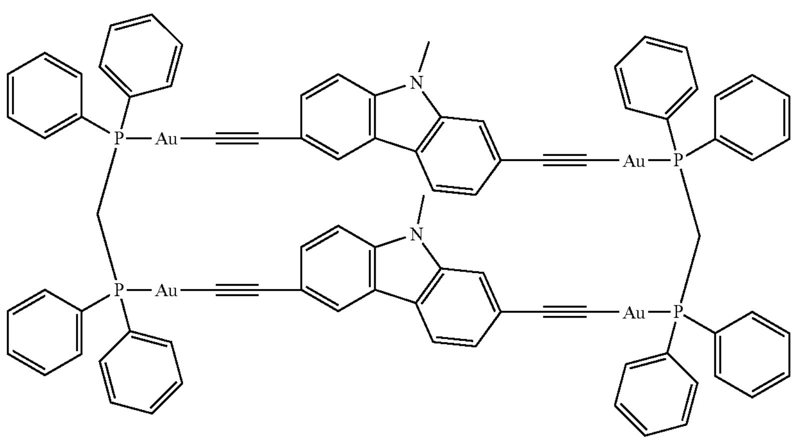
659
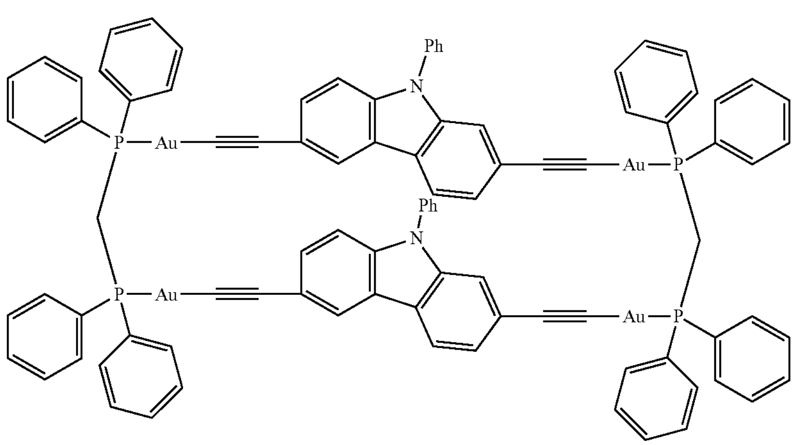

-continued
660
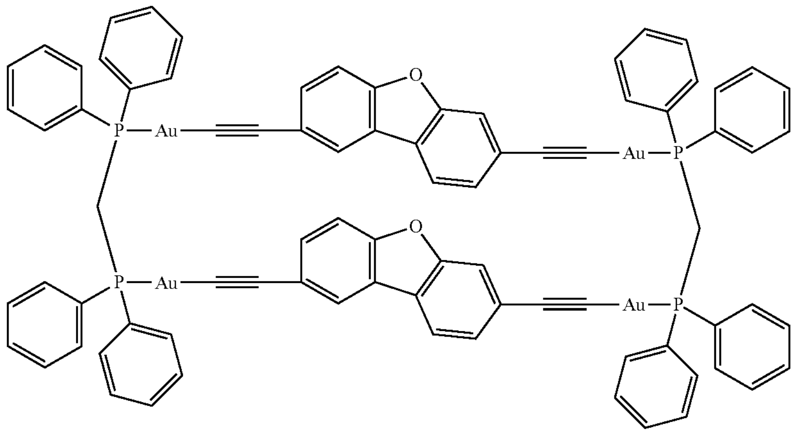
661
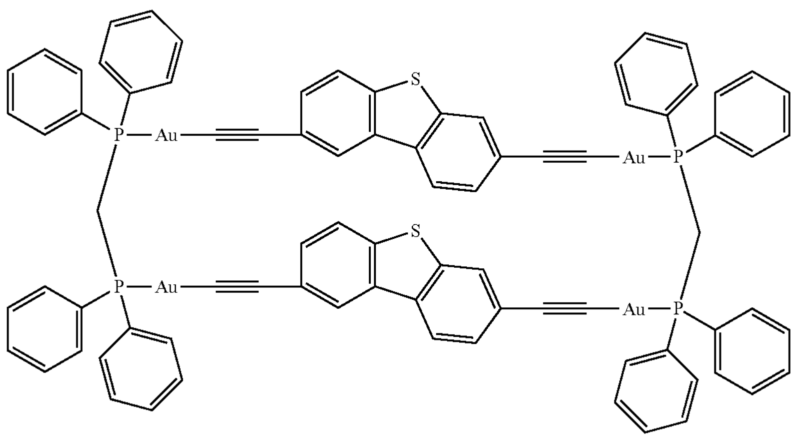
662
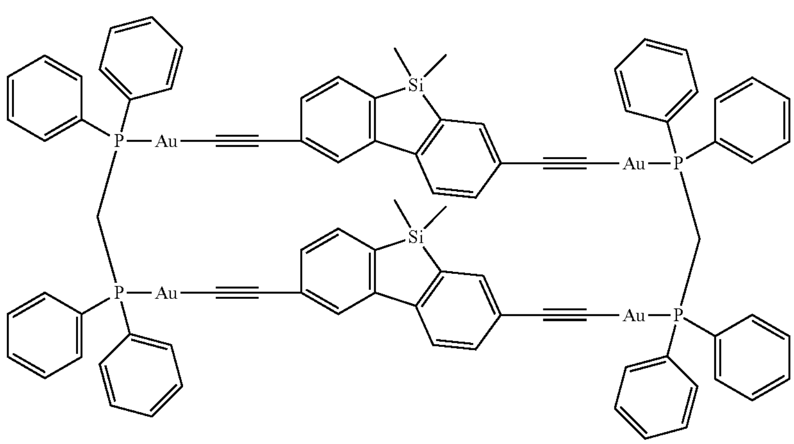

-continued
663
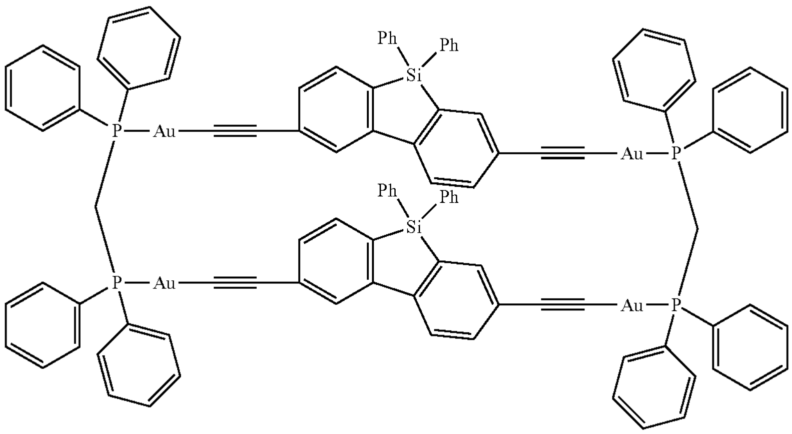
664
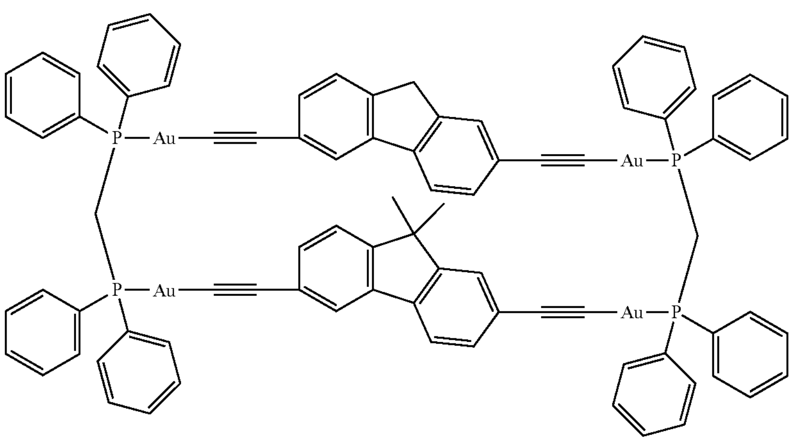
665
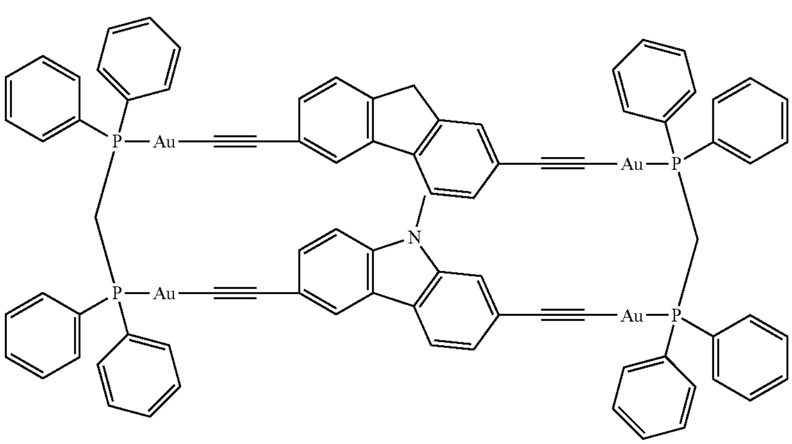

-continued
666
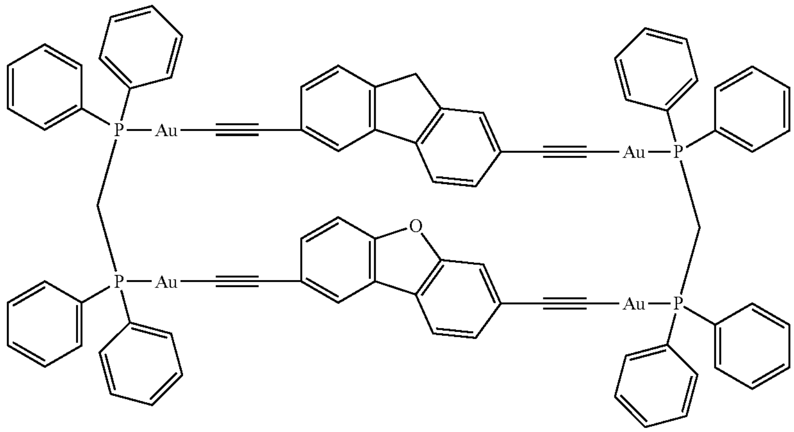
667
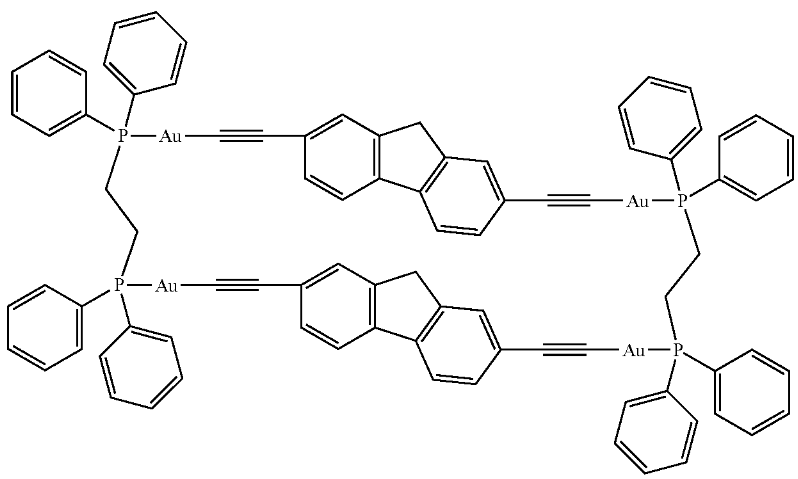
668
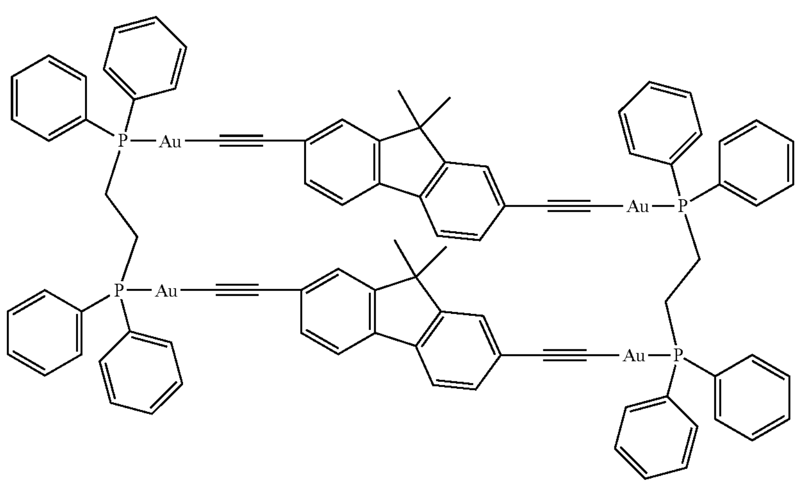

-continued
669
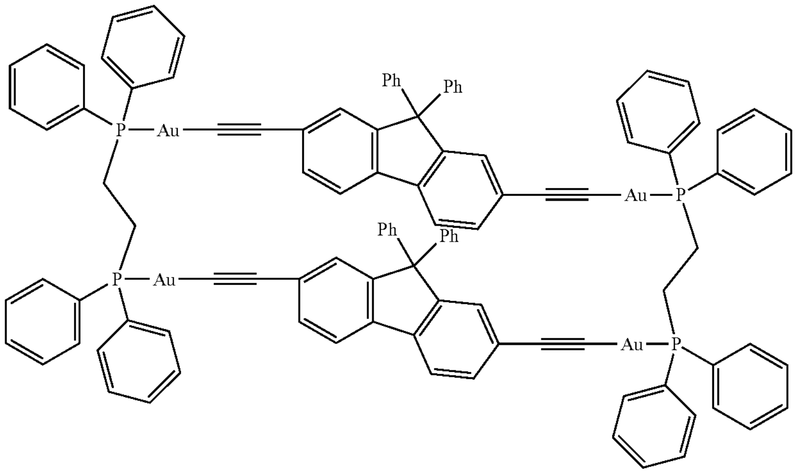
670
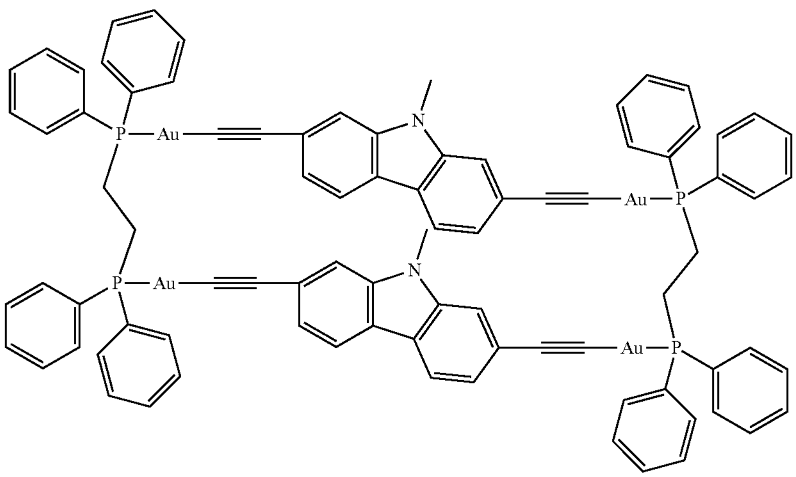
671
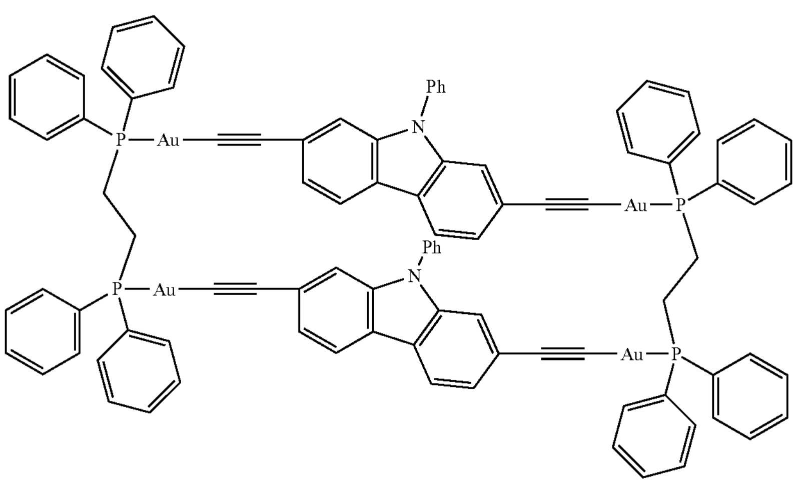

-continued
672
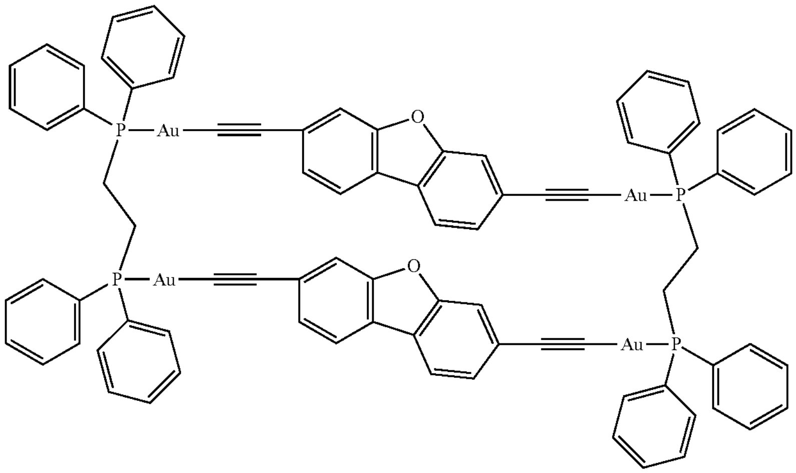
673
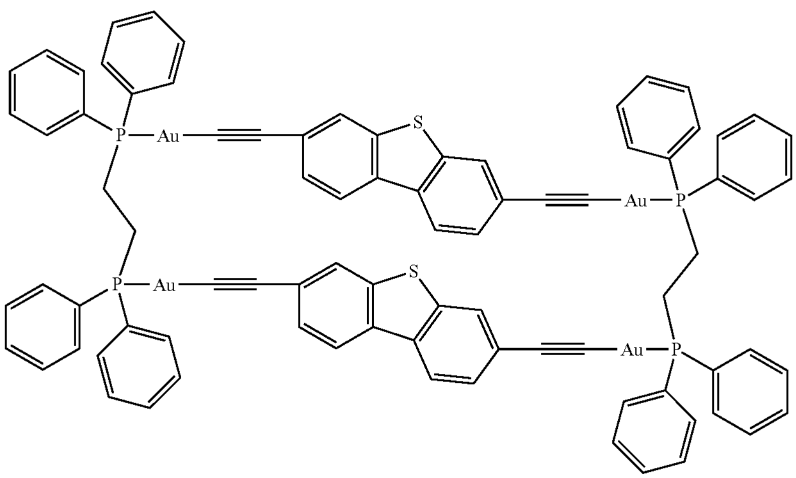
674
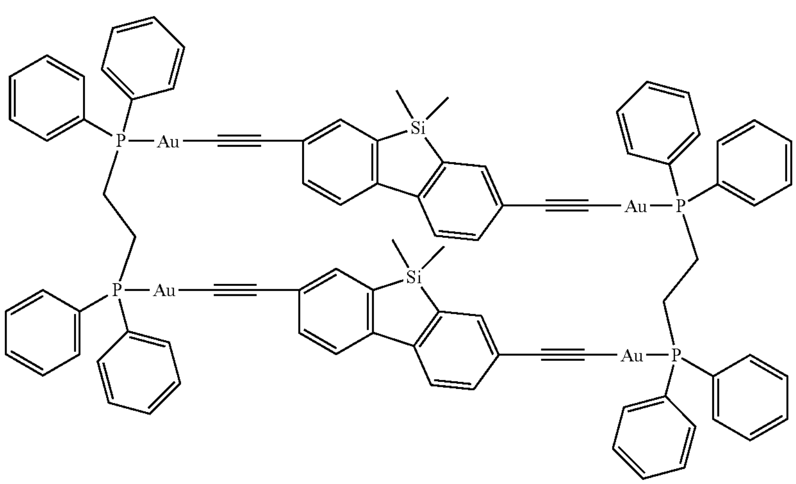

-continued
675
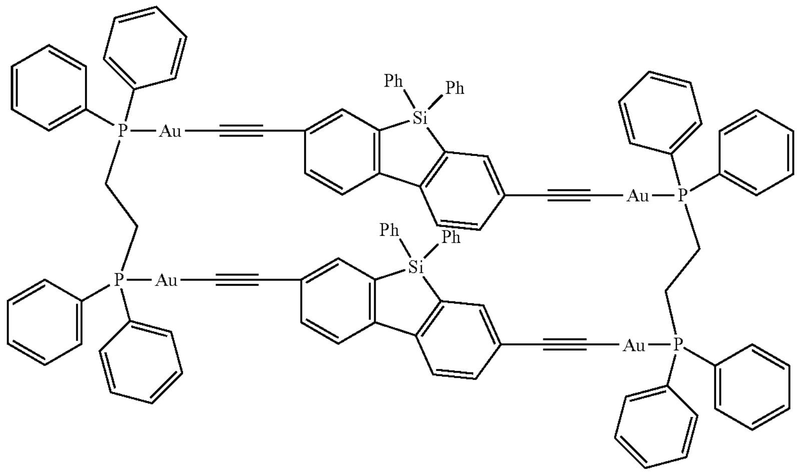
676
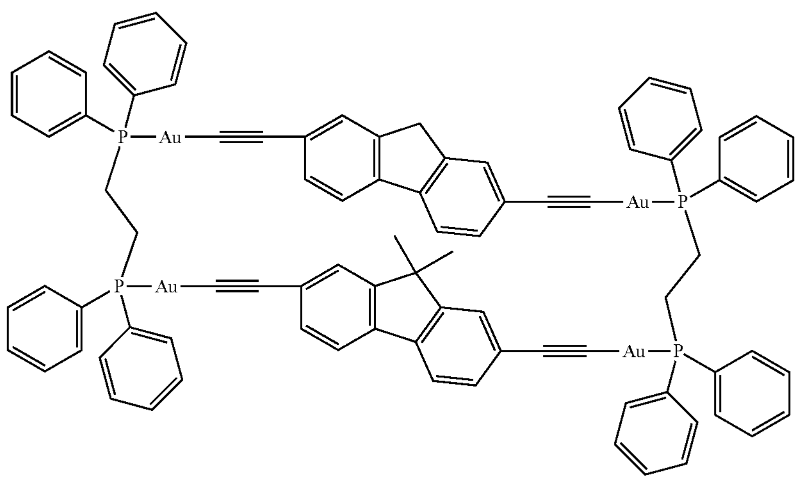
677
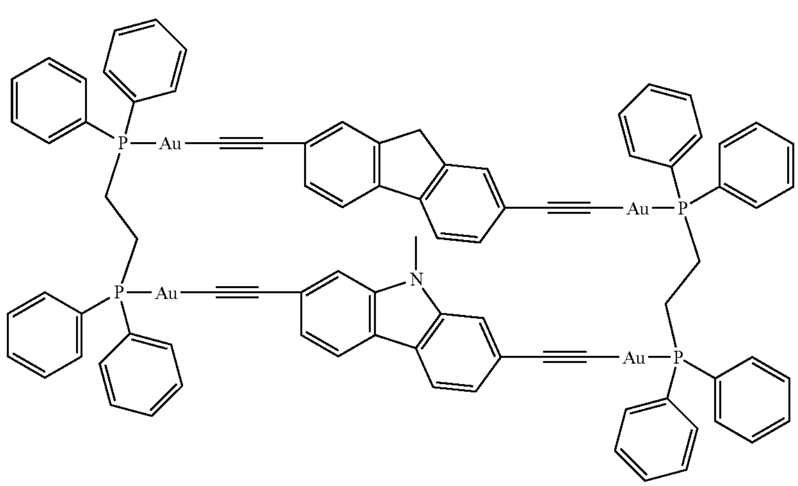

-continued
678
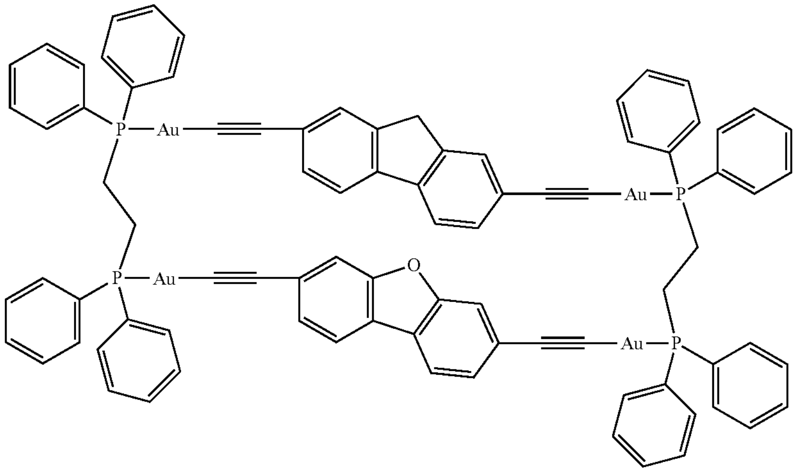
679
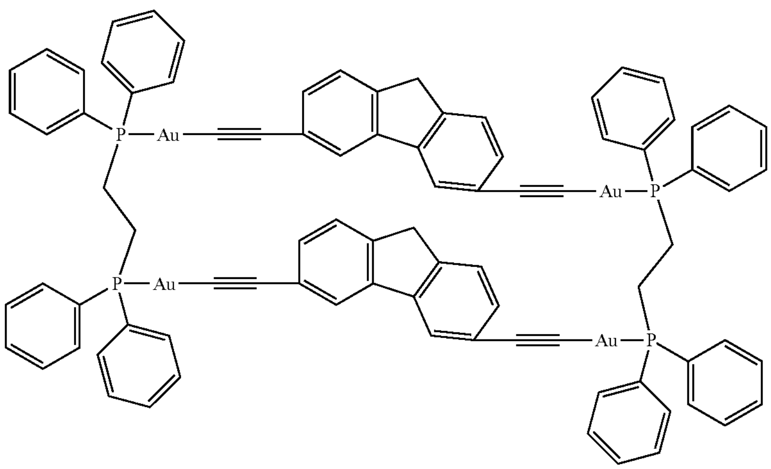
680
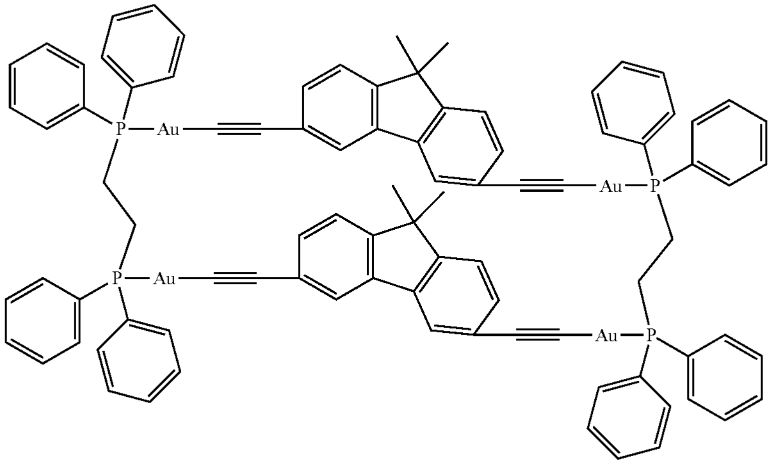

-continued
681
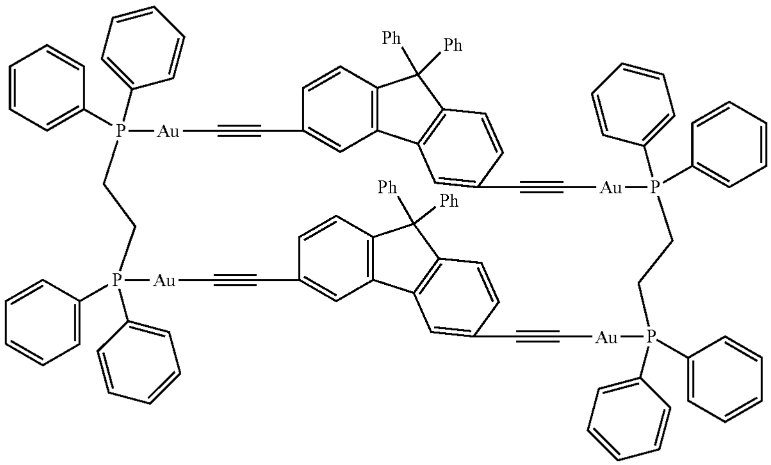
682
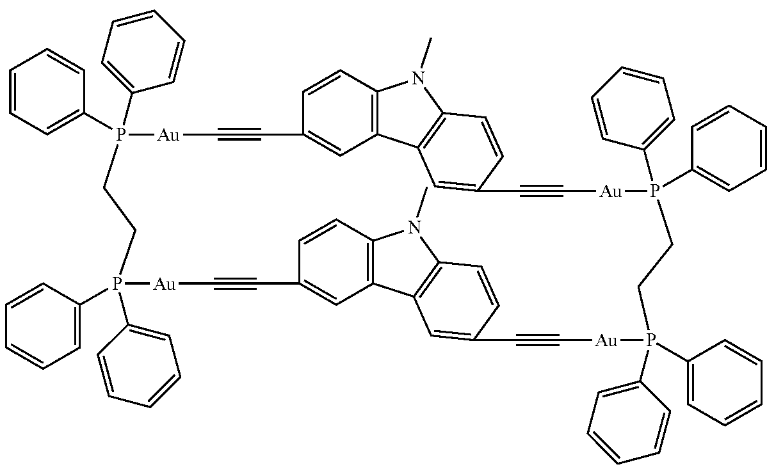
683
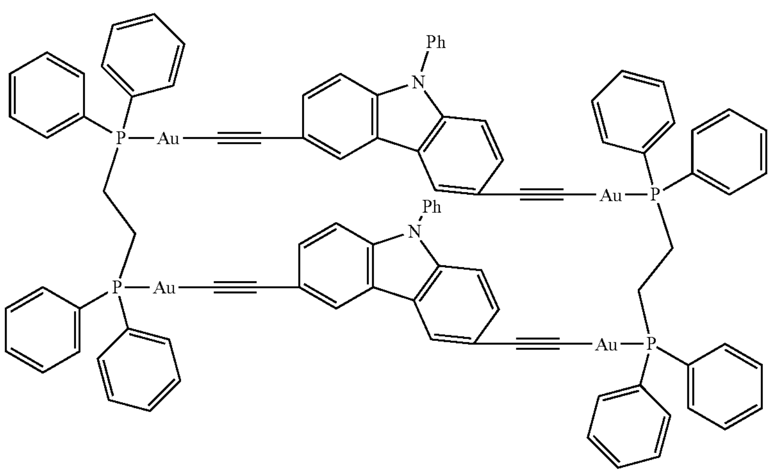

-continued
684
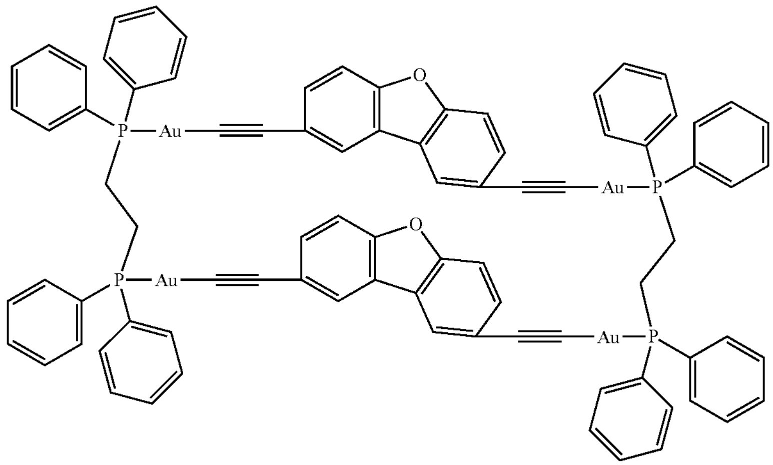
685
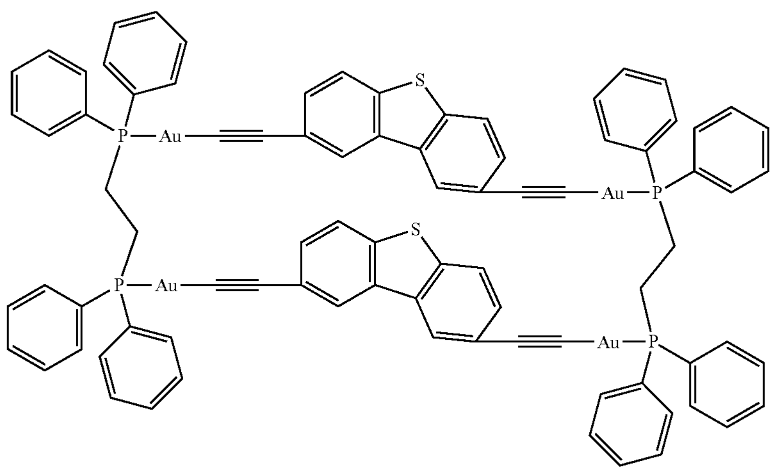
686
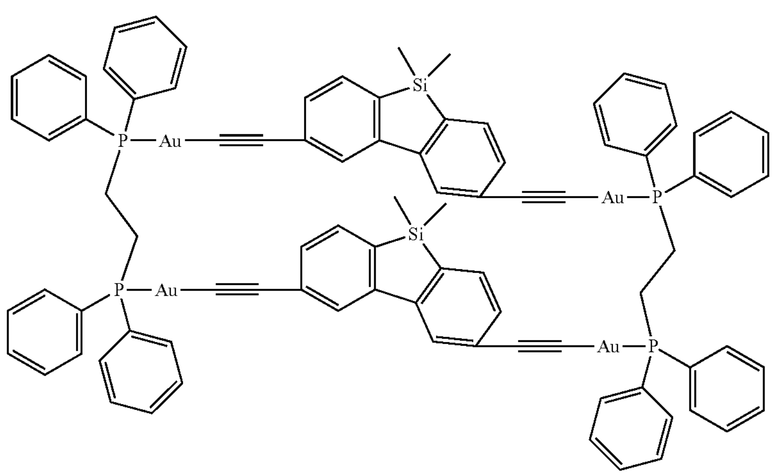

-continued
687
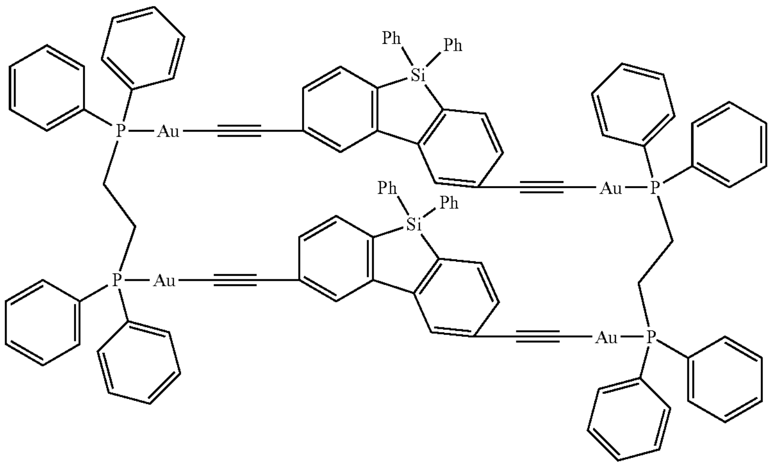
688
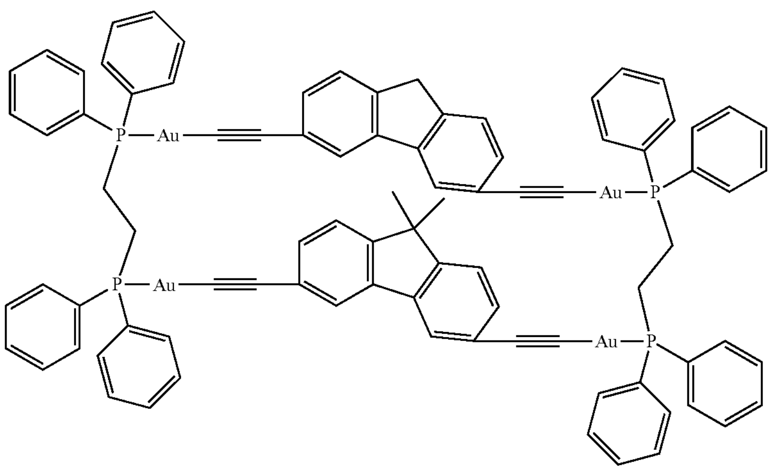
689
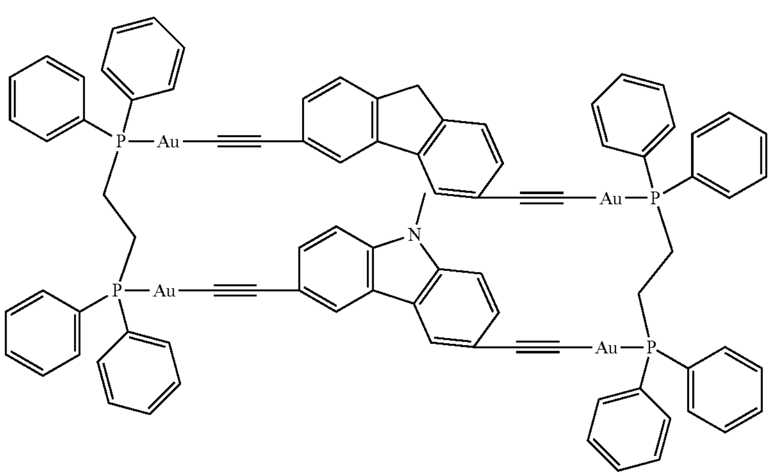

-continued
690
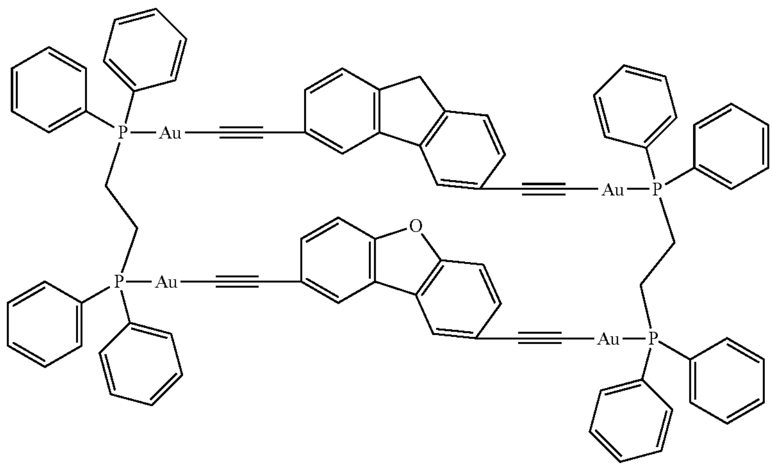
691
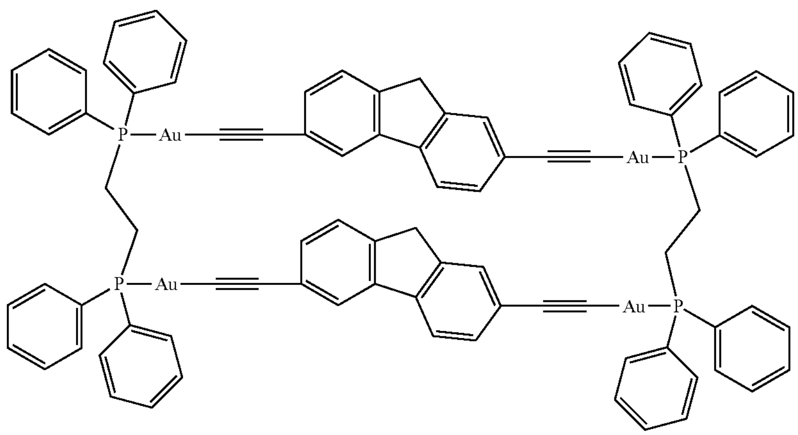
692
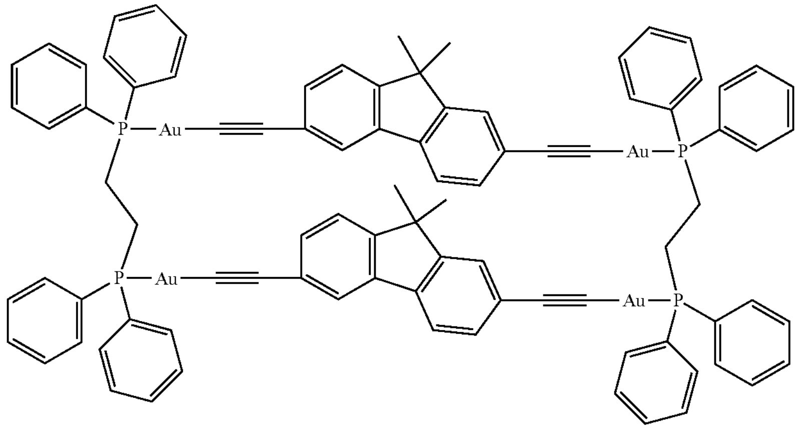

-continued
693
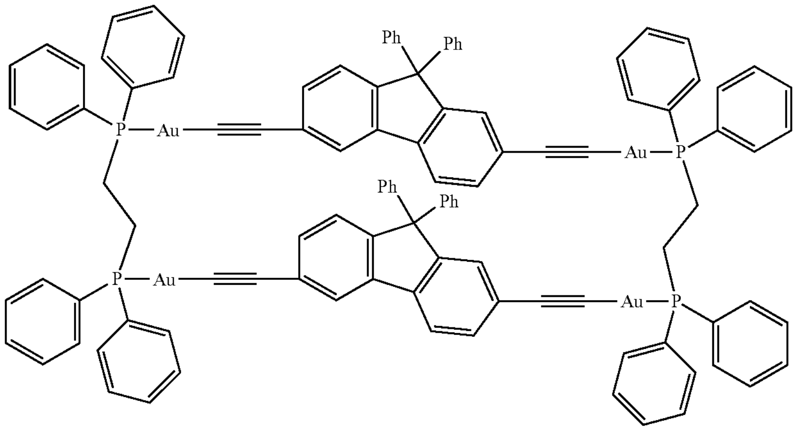
694
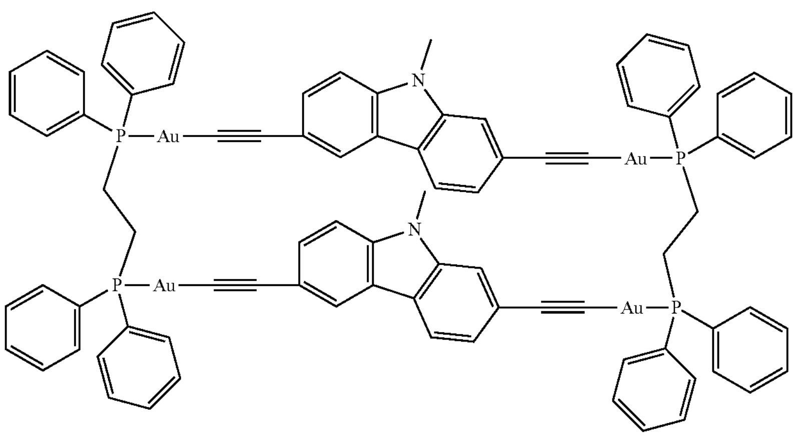
695
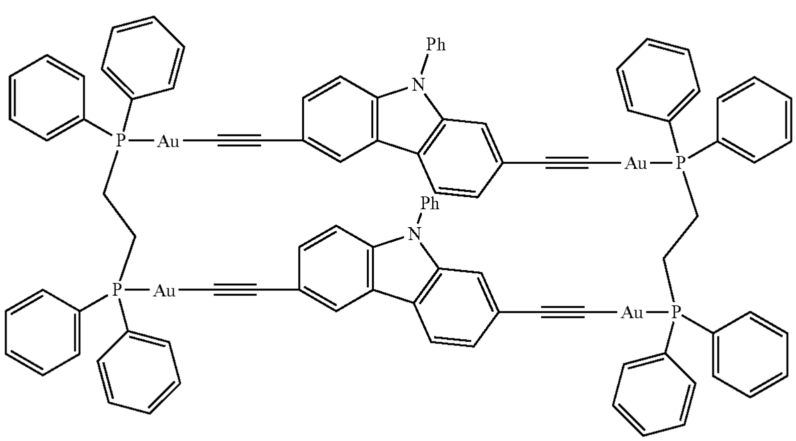

-continued
696
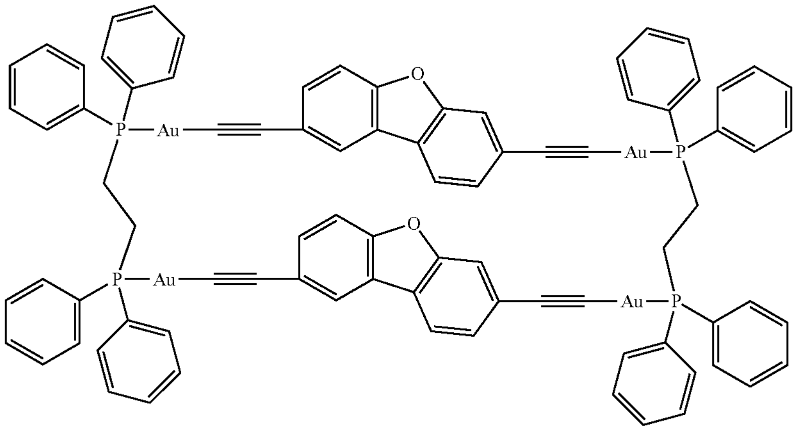
697
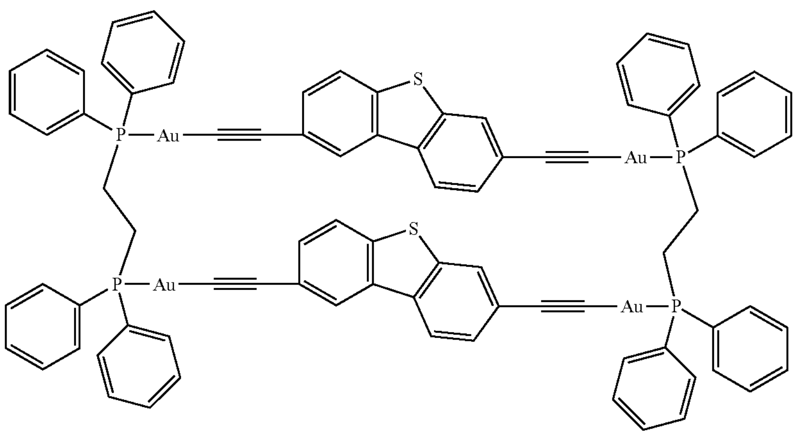
698
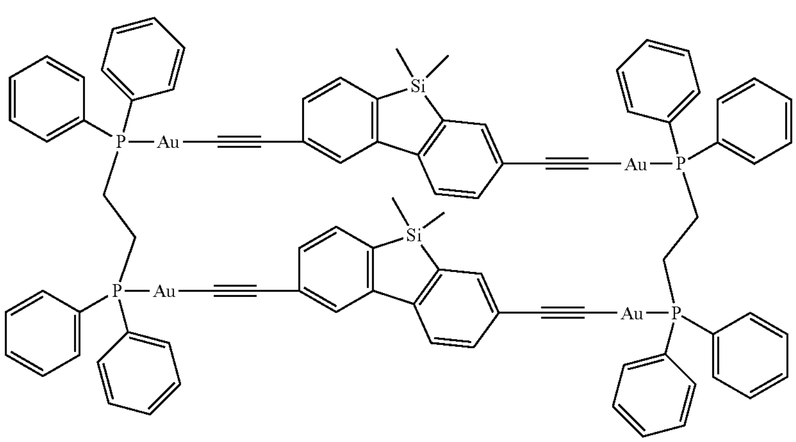

-continued
699
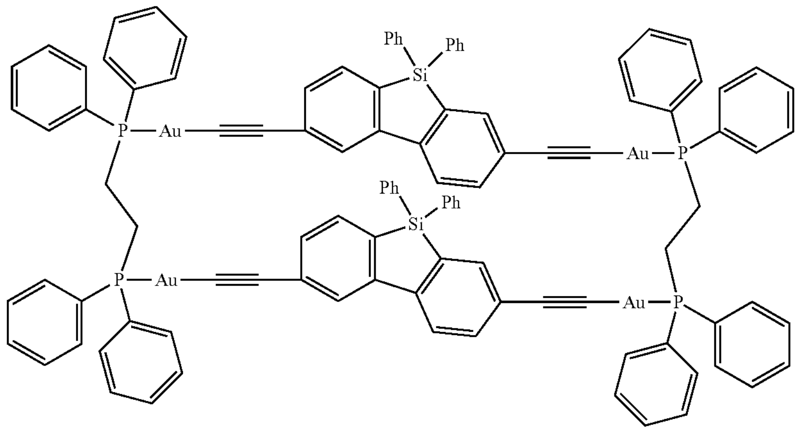
700
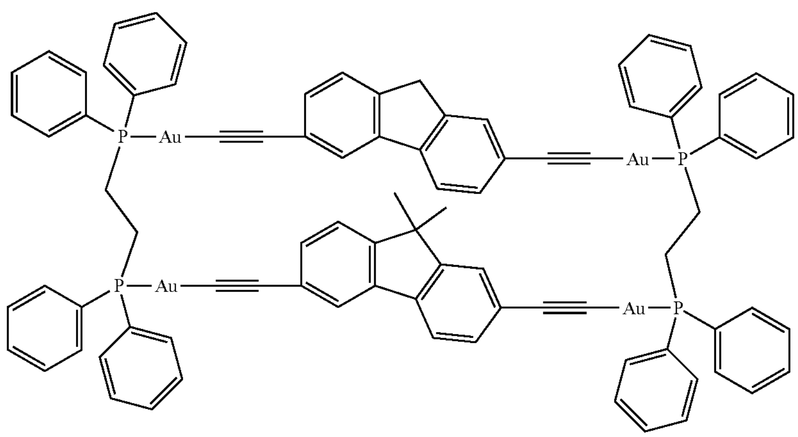
701
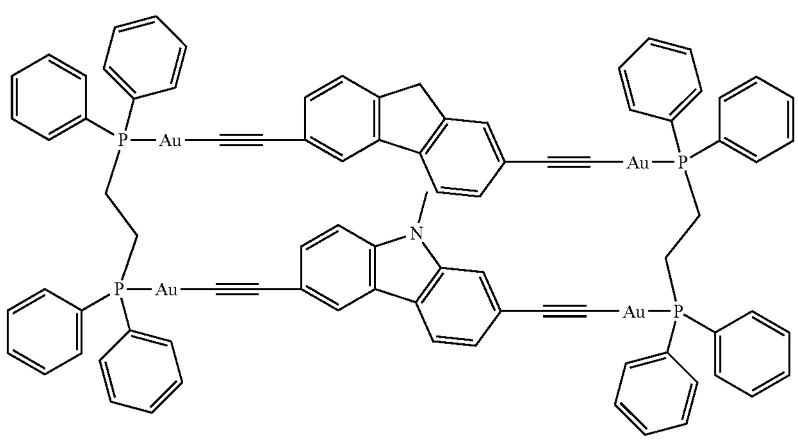

-continued
702
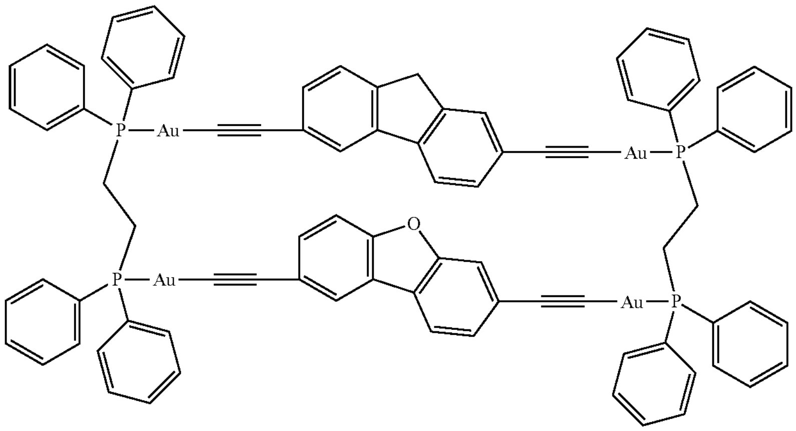
703
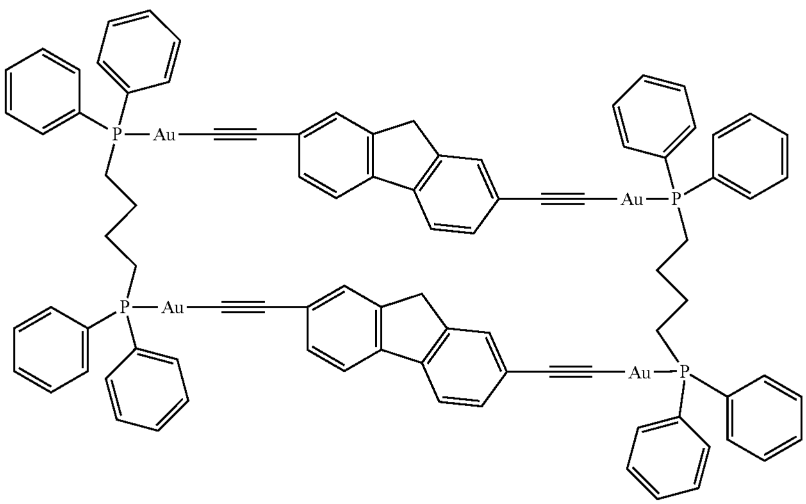
704
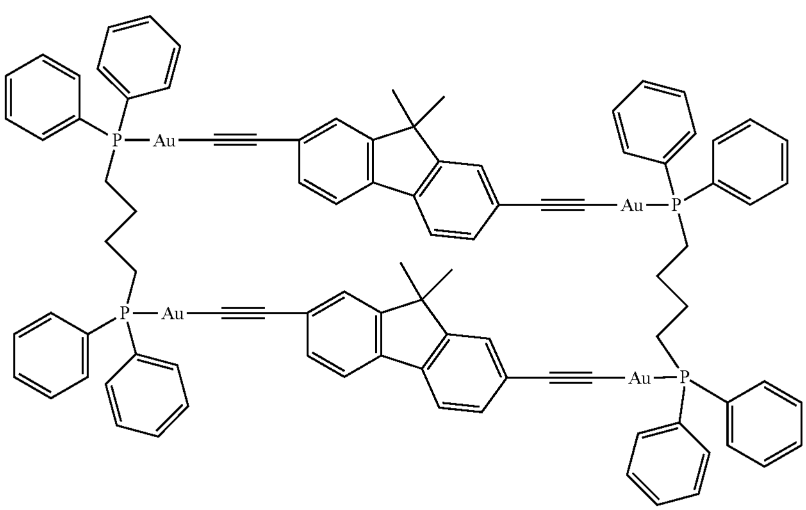

-continued
705
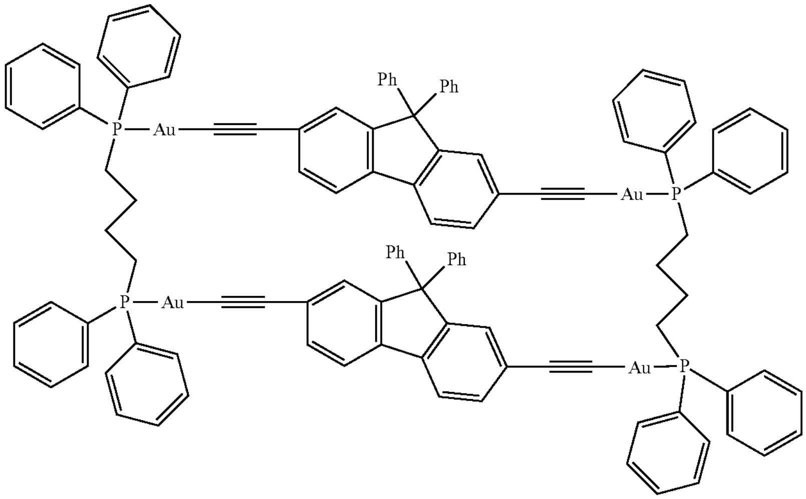
706
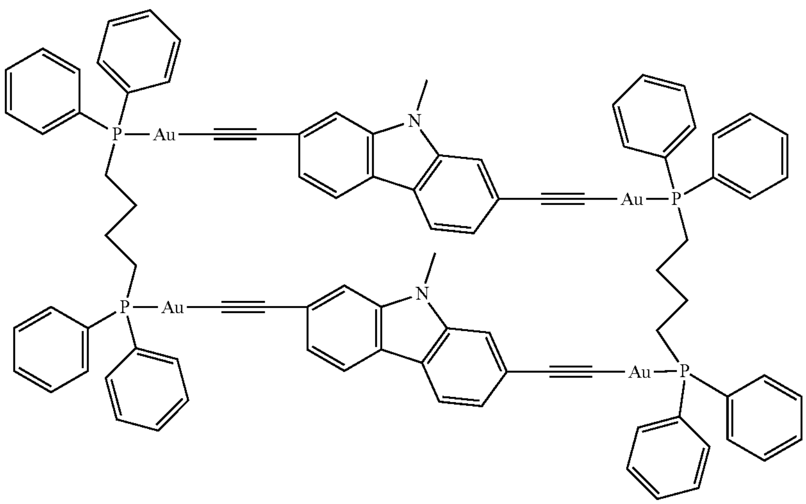
707
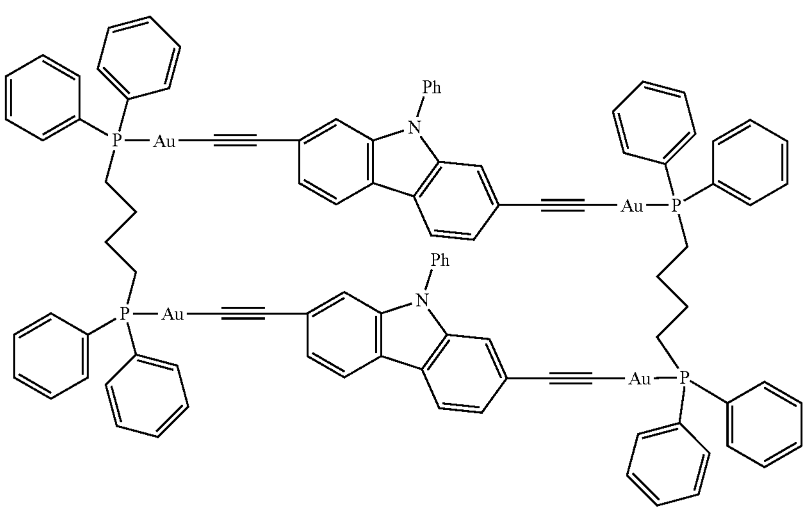

-continued
708
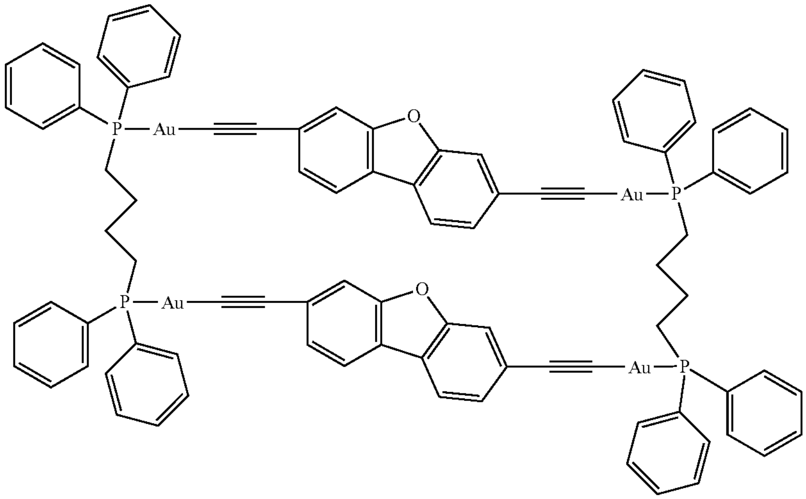
709
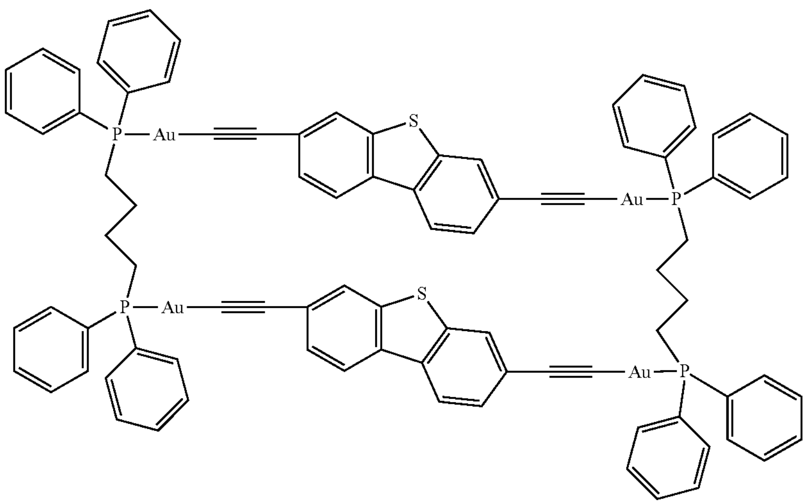
710
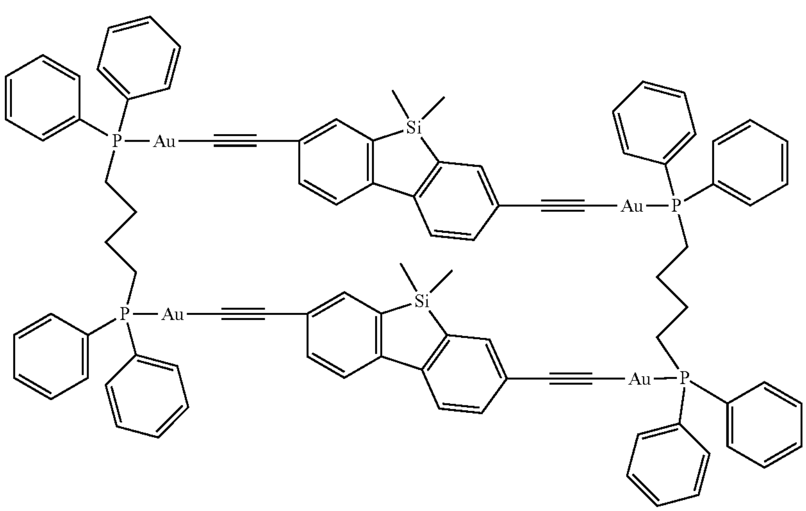

-continued
711
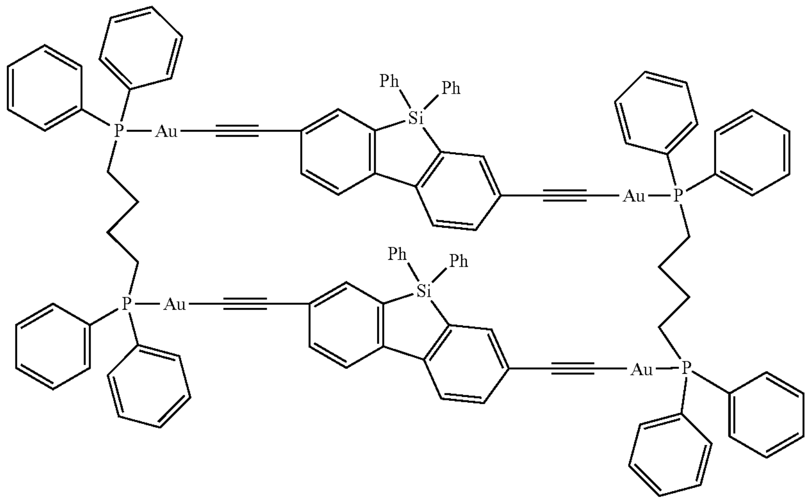
712
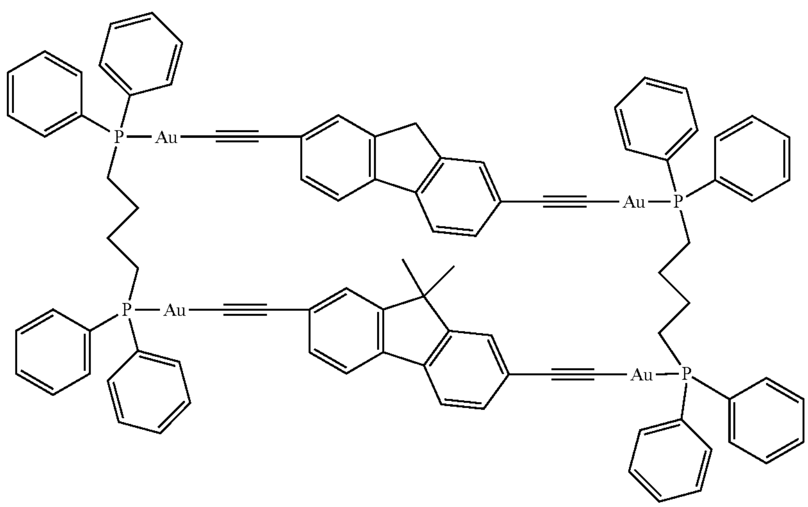
713
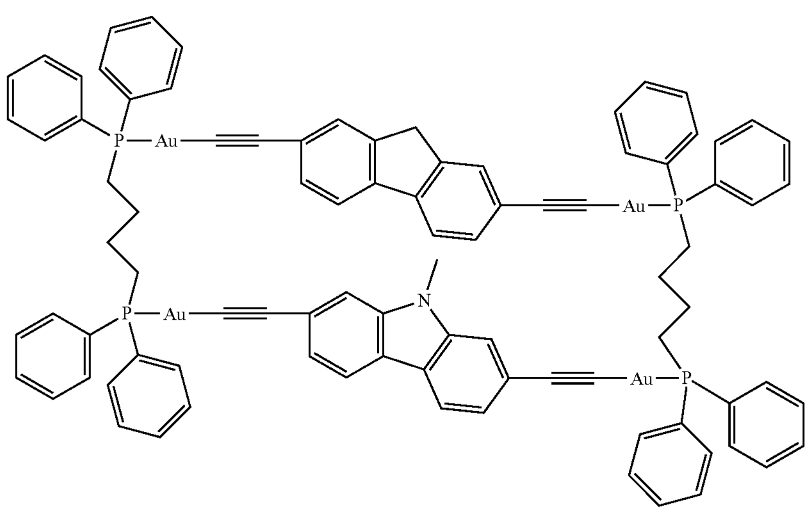

-continued
714
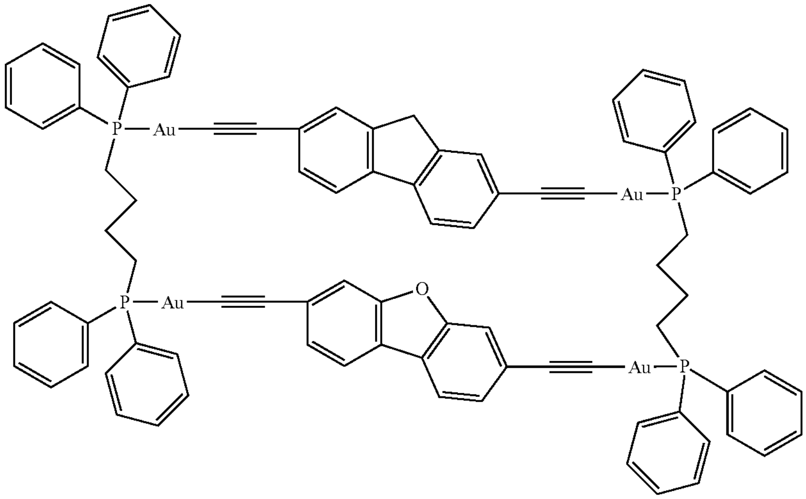
715
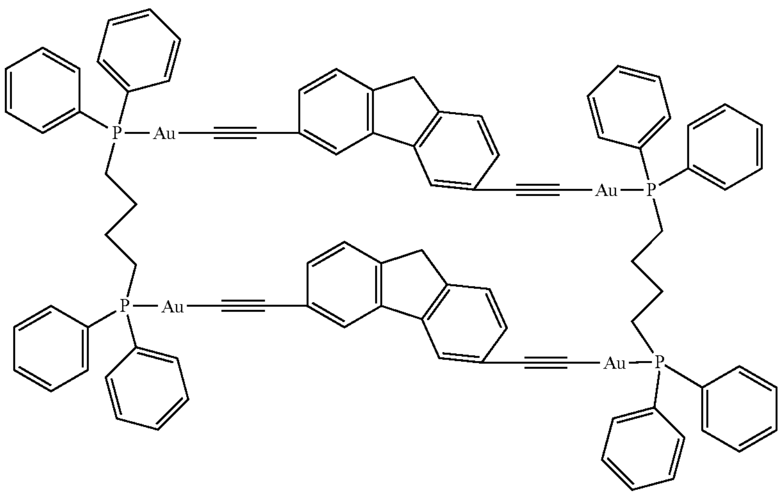
716
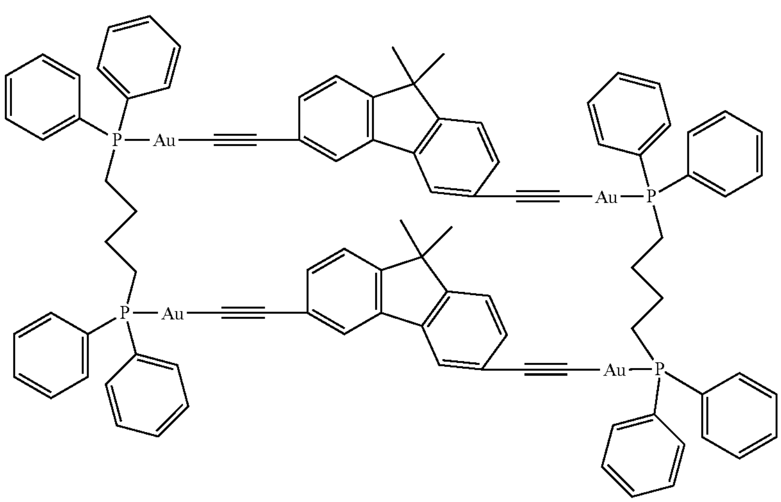

-continued
717
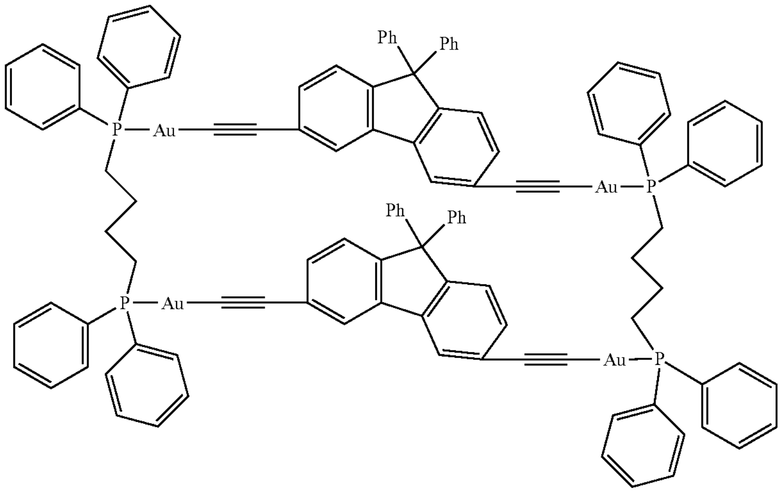
718
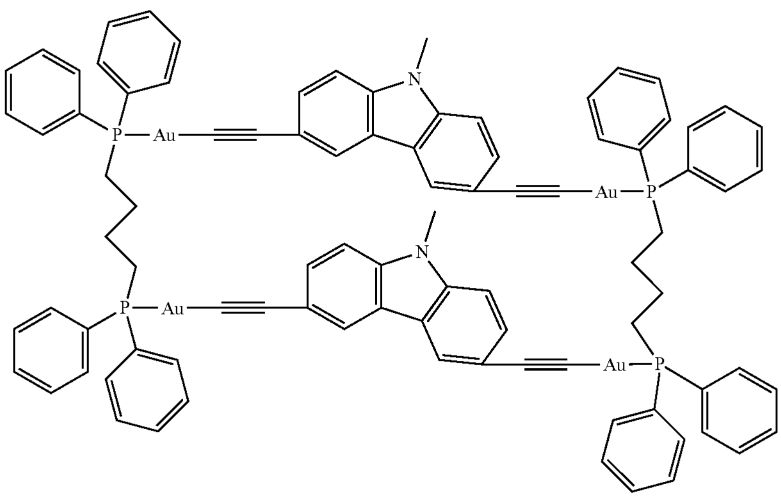
719
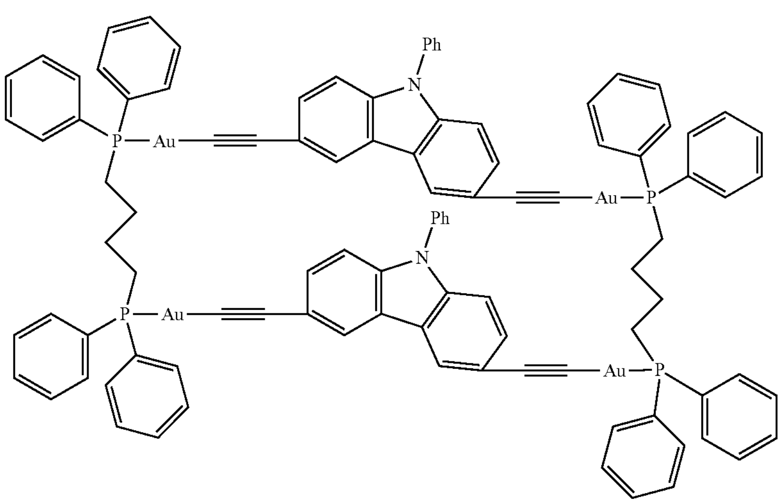

-continued
720
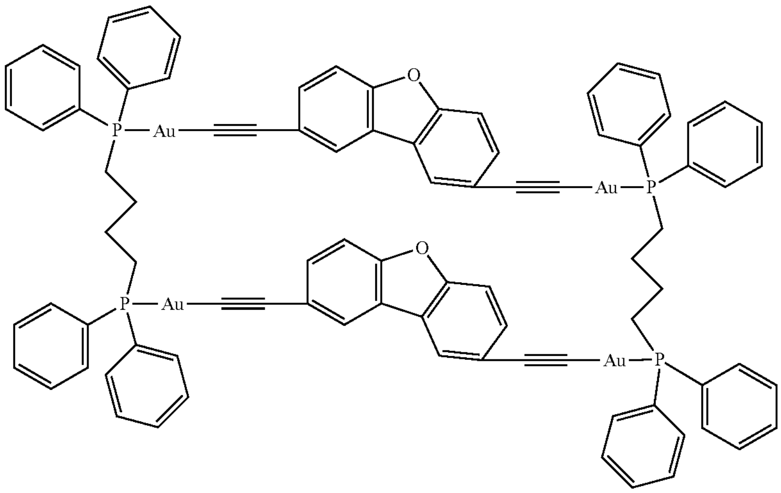
721
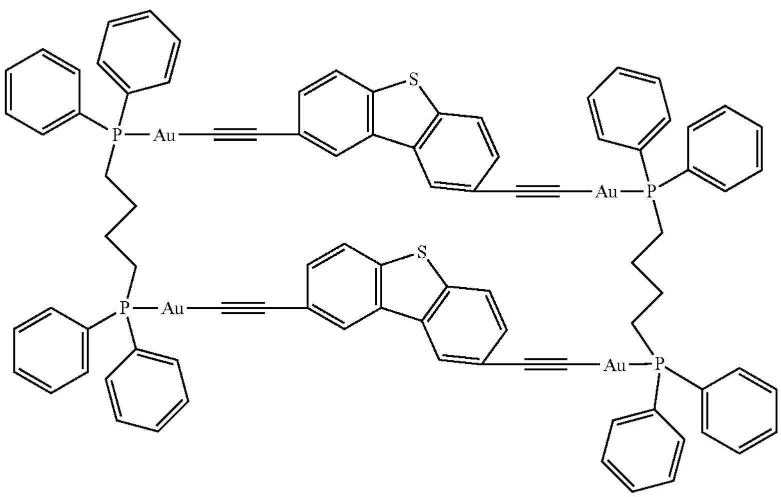
722
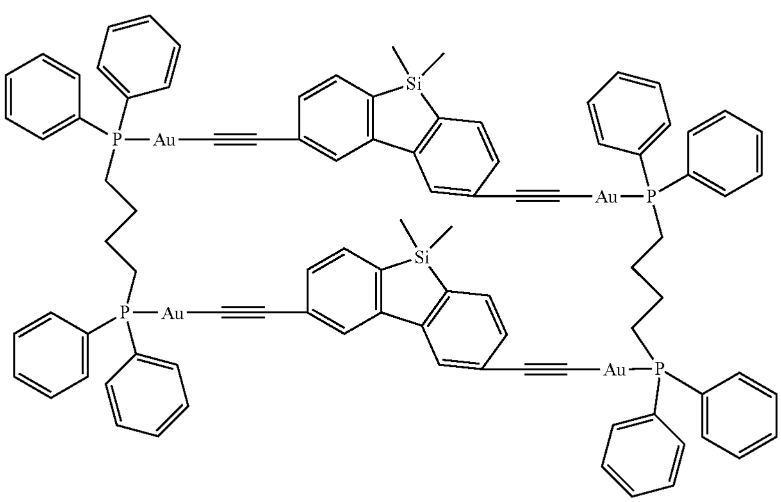

-continued
723
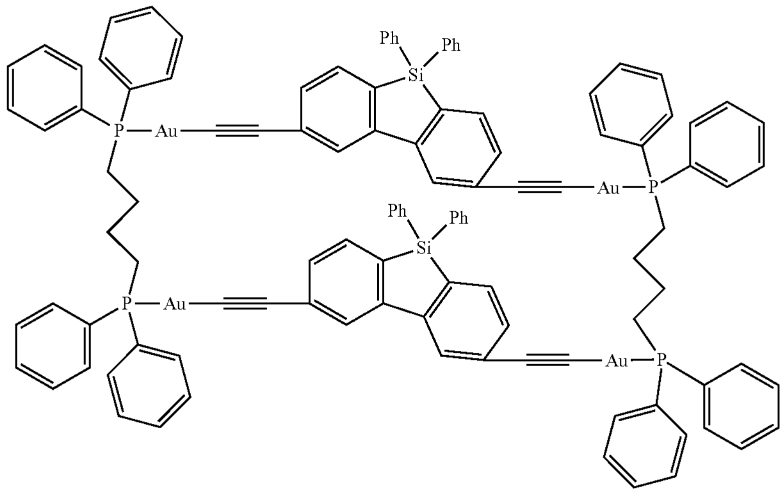
724
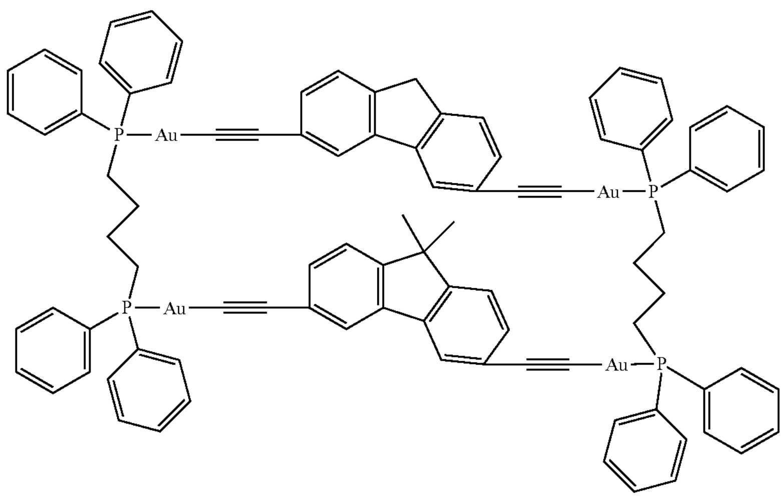
725
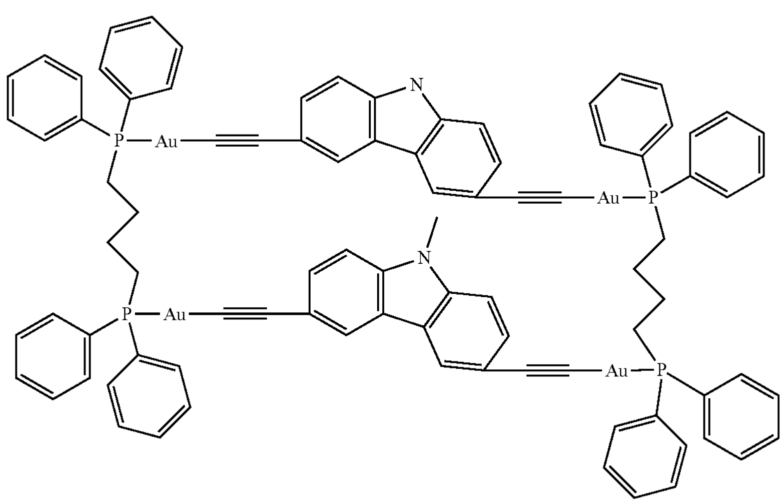

-continued
726
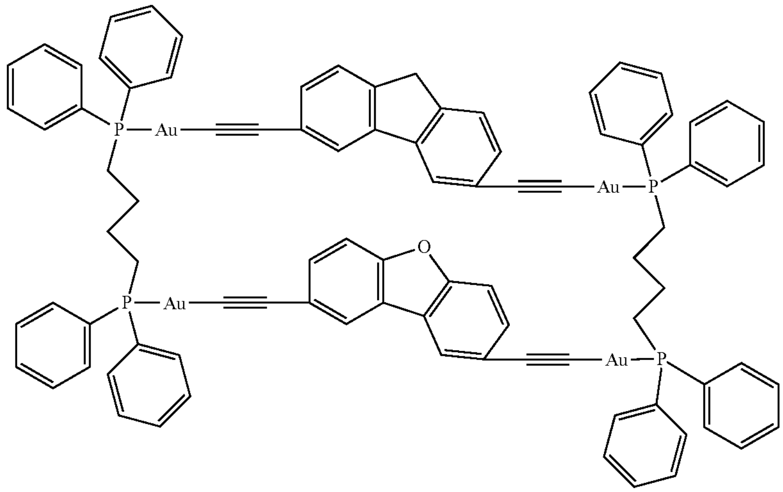
727
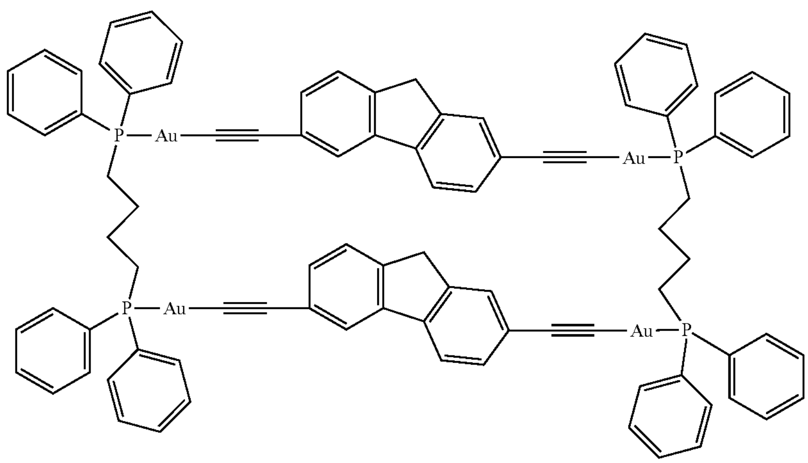
728
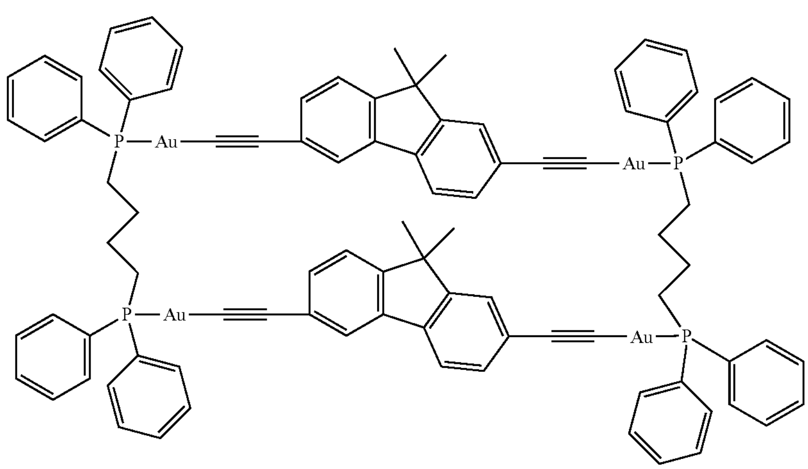

-continued
729
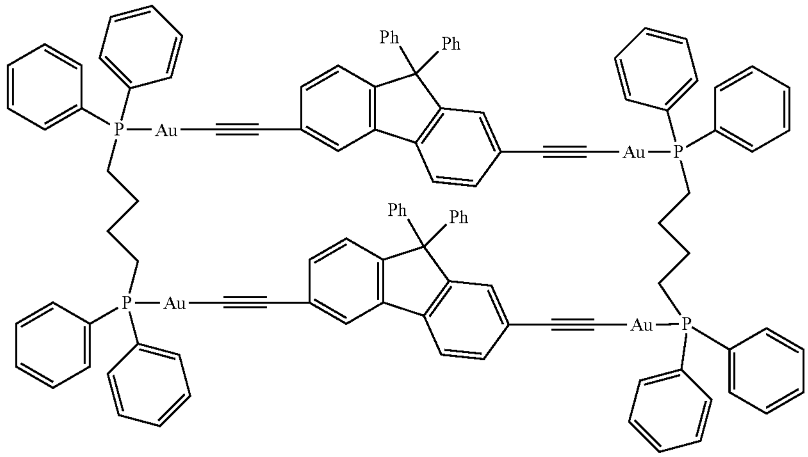
730
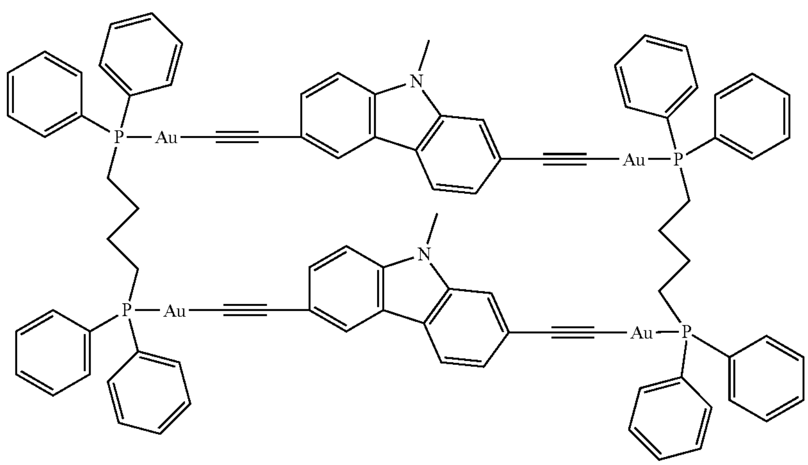
731
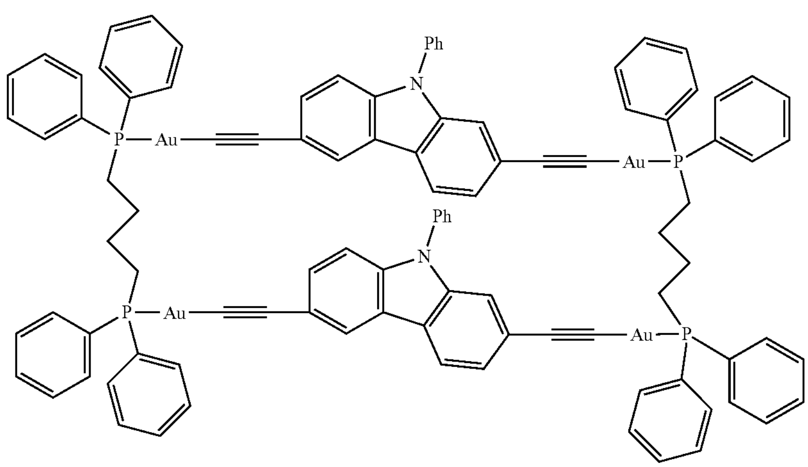

-continued
732
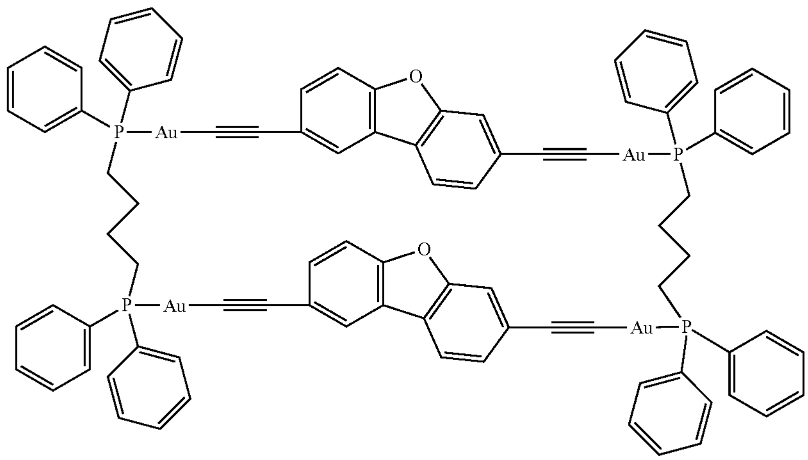
733
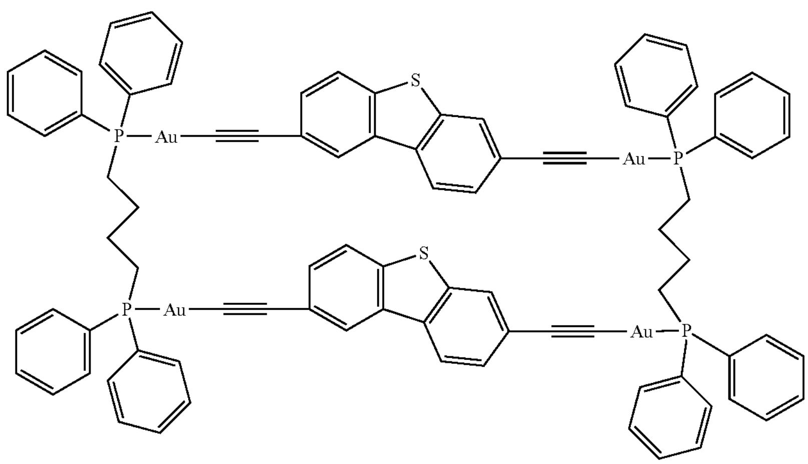
734
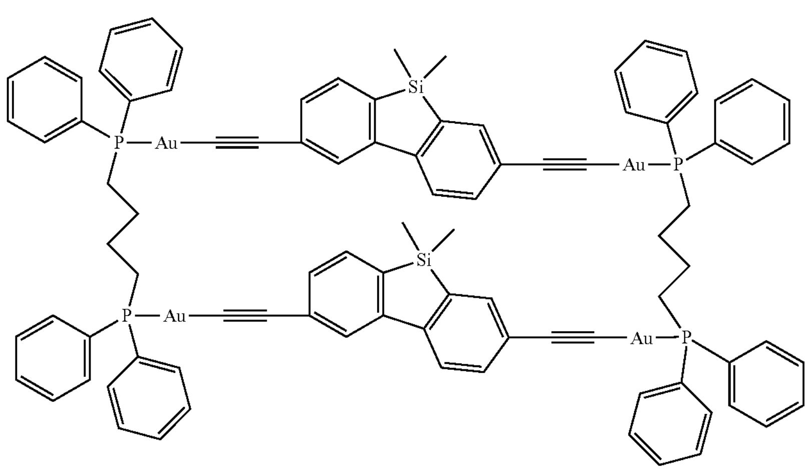

-continued
735
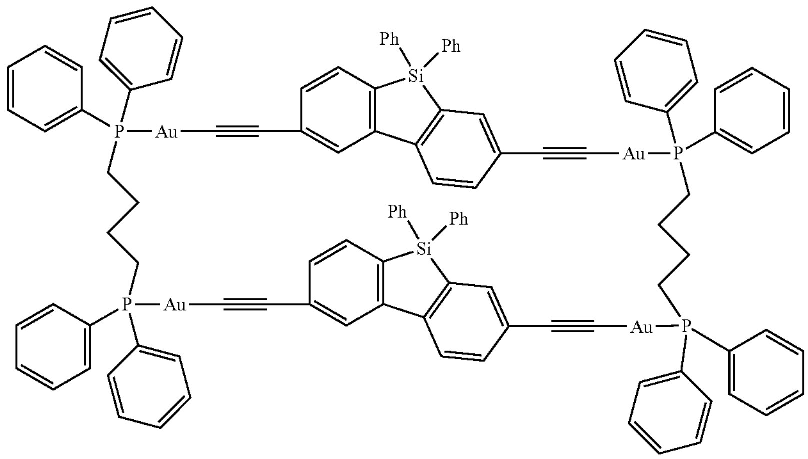
736
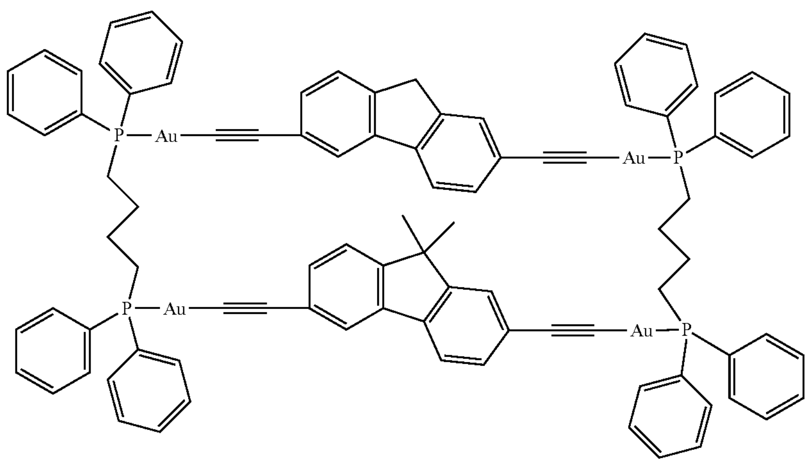
737
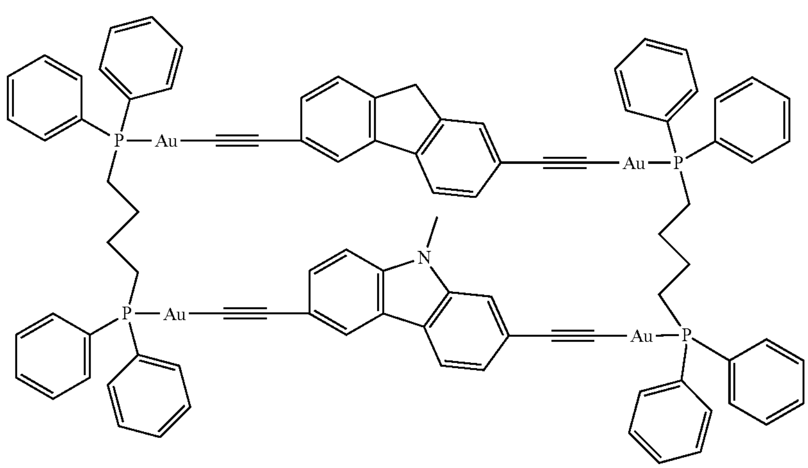

-continued
738
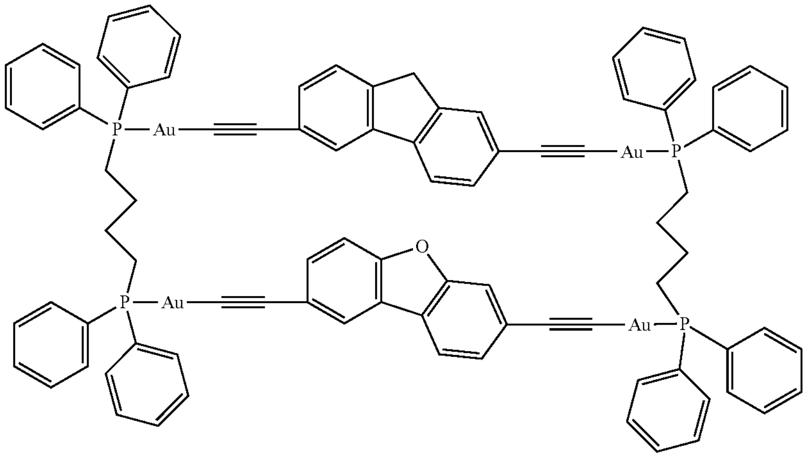
739
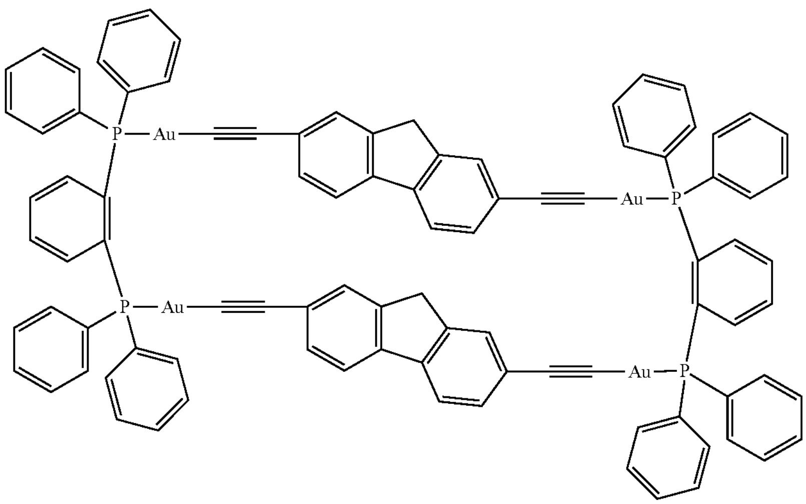
740
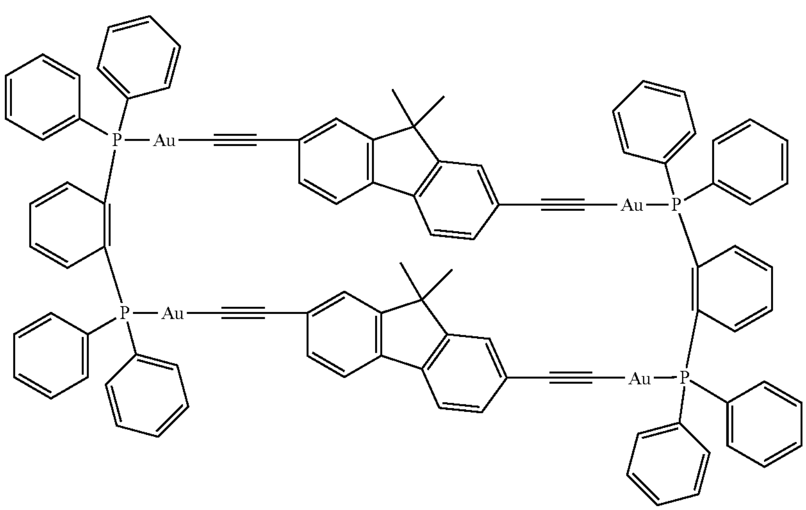

-continued
741
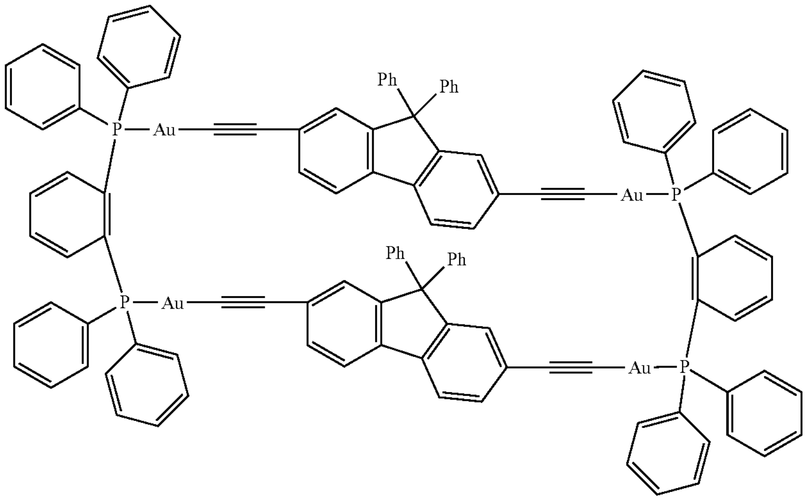
742
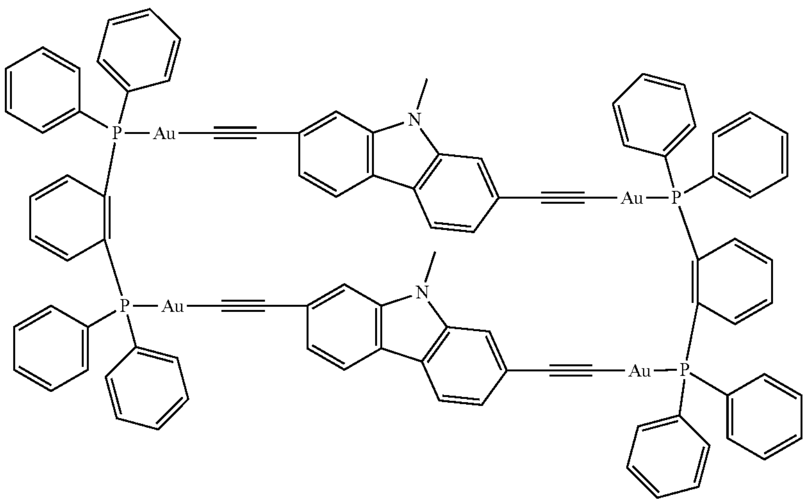
743
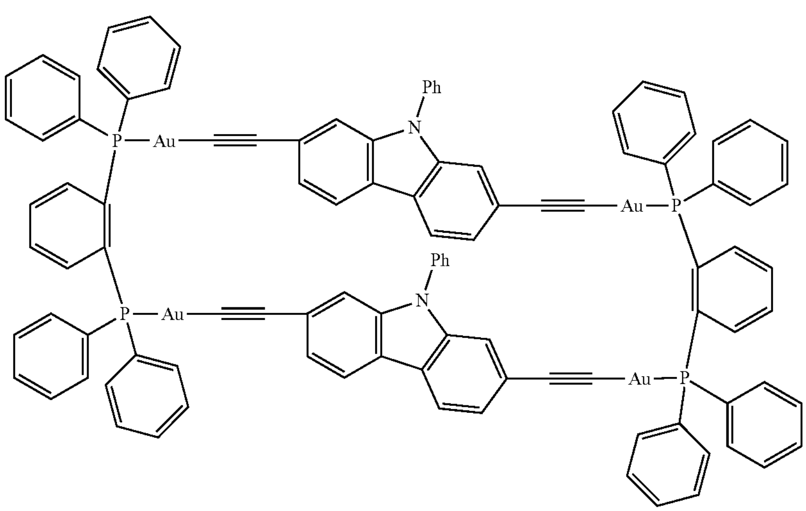

-continued
744
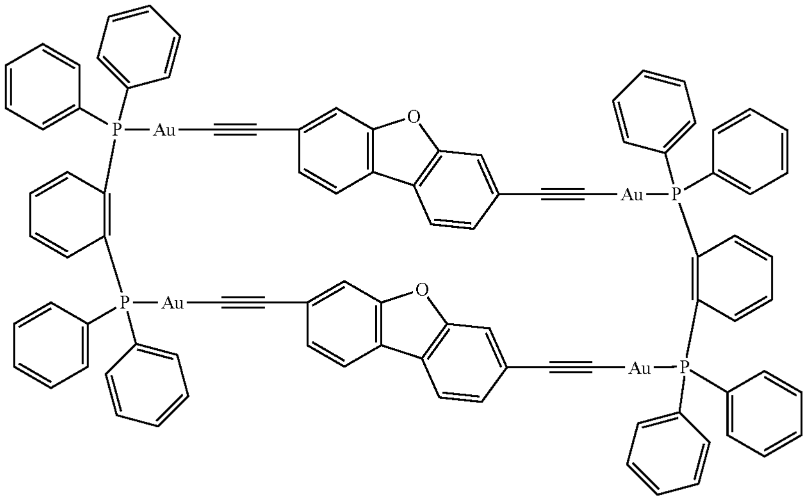
745
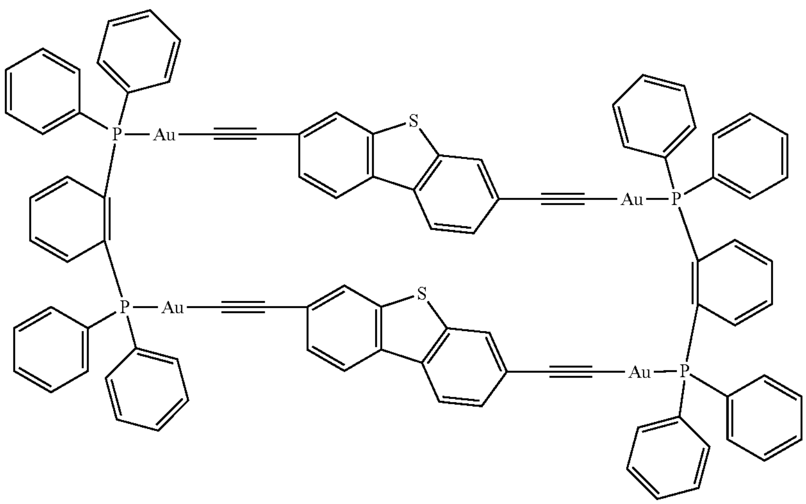
746
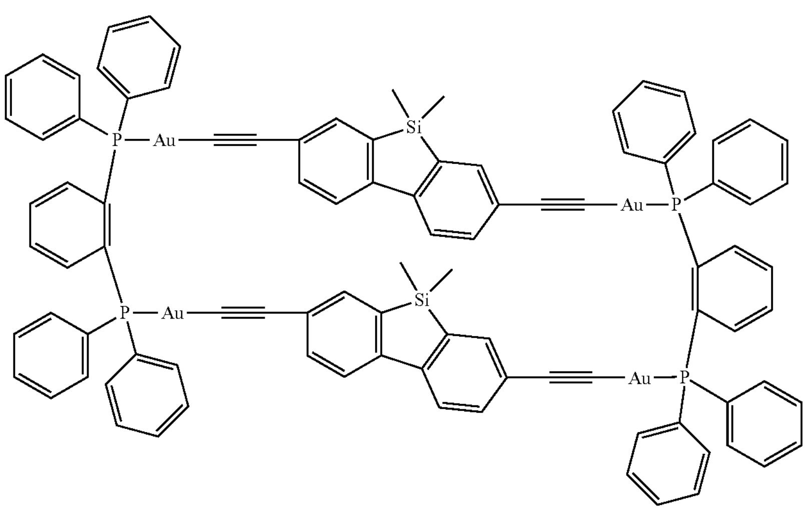

-continued
747
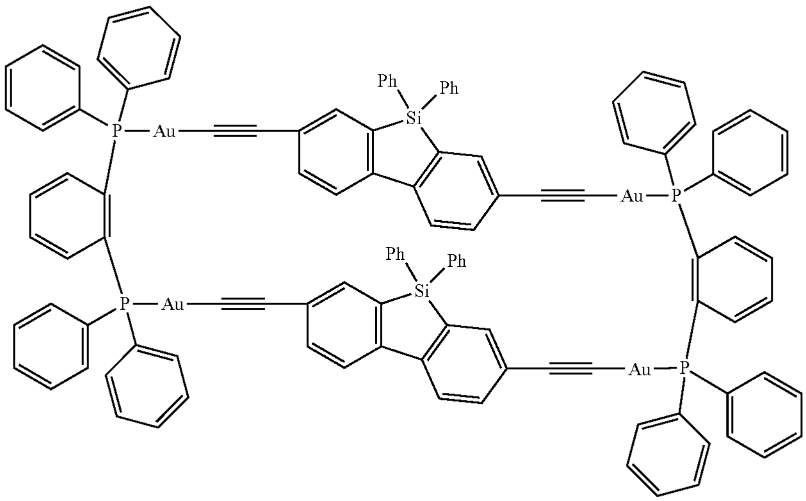
748
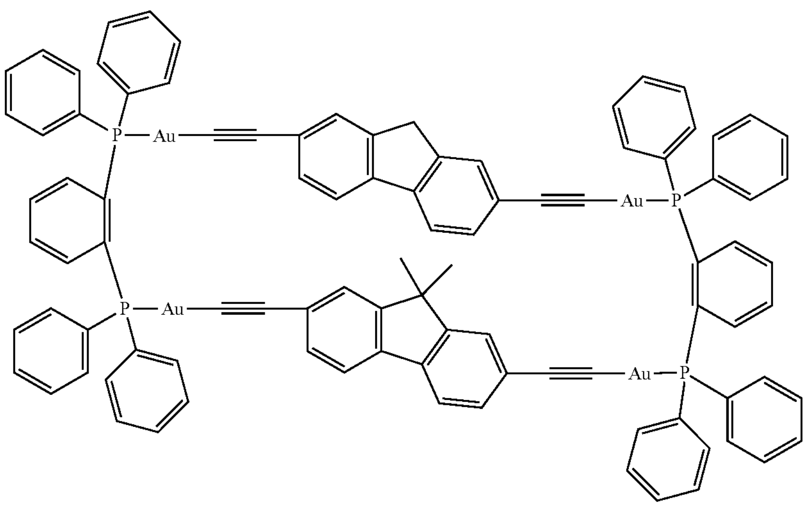
749
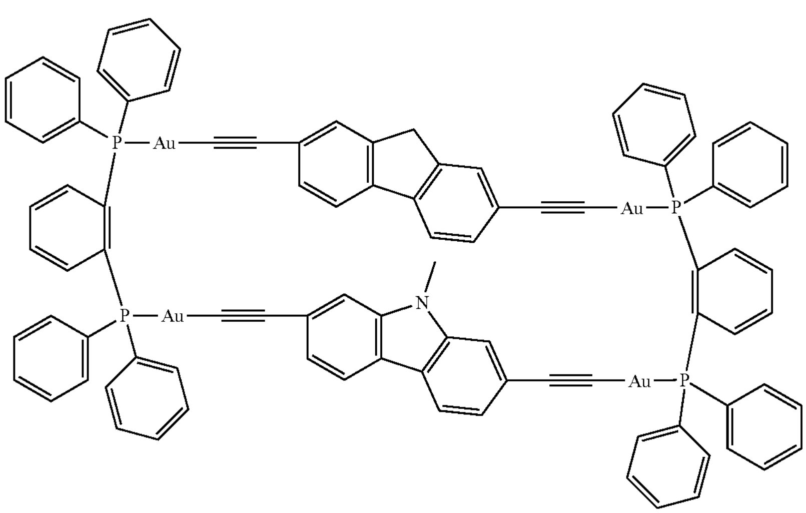

-continued
750
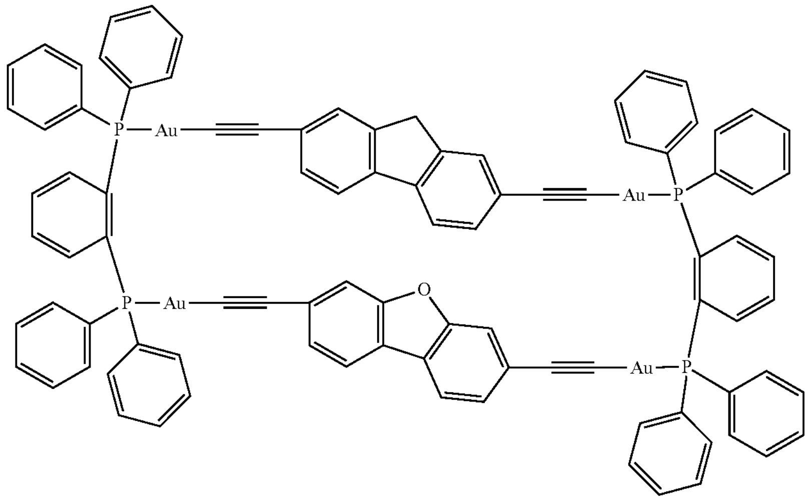
751
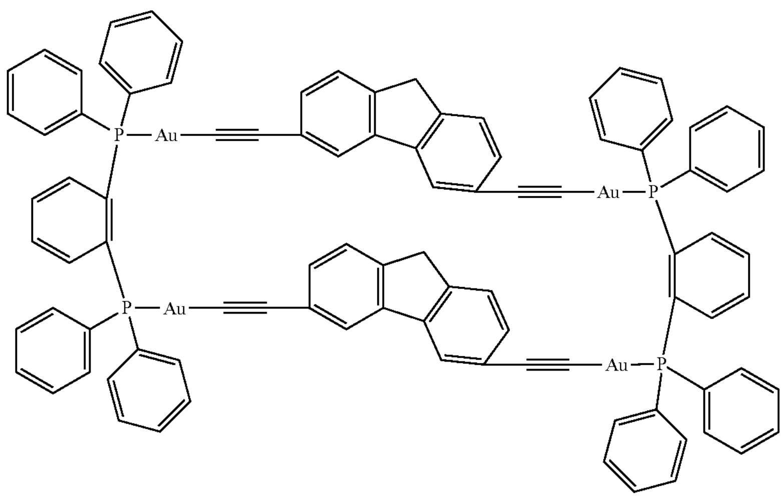
752
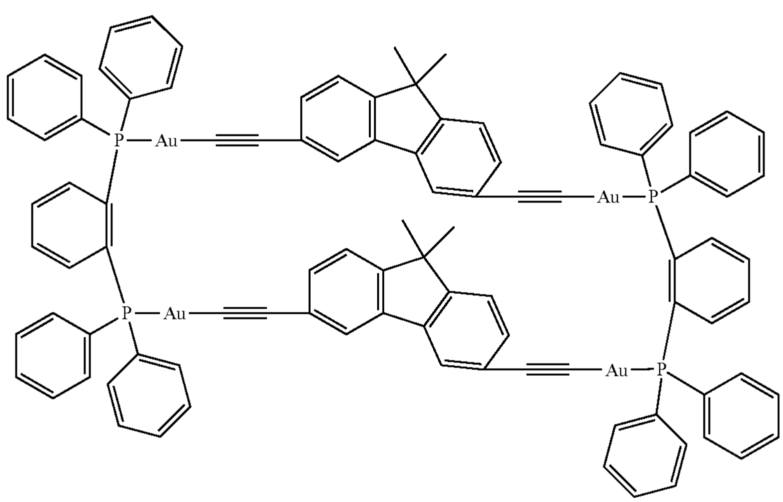

-continued
753
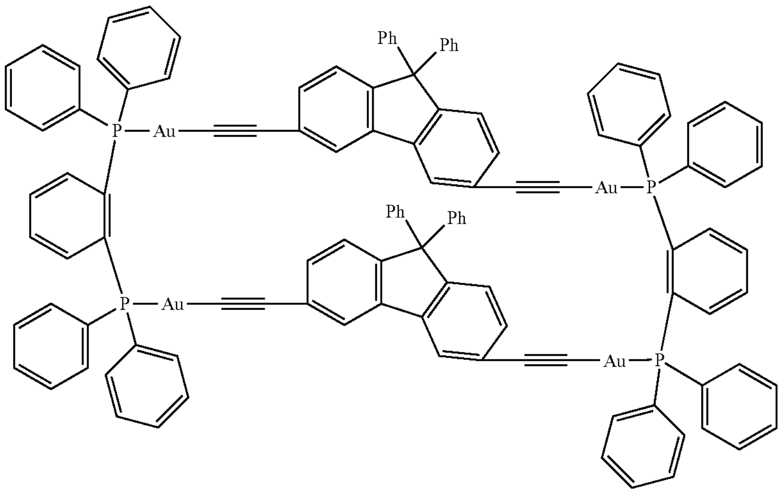
754
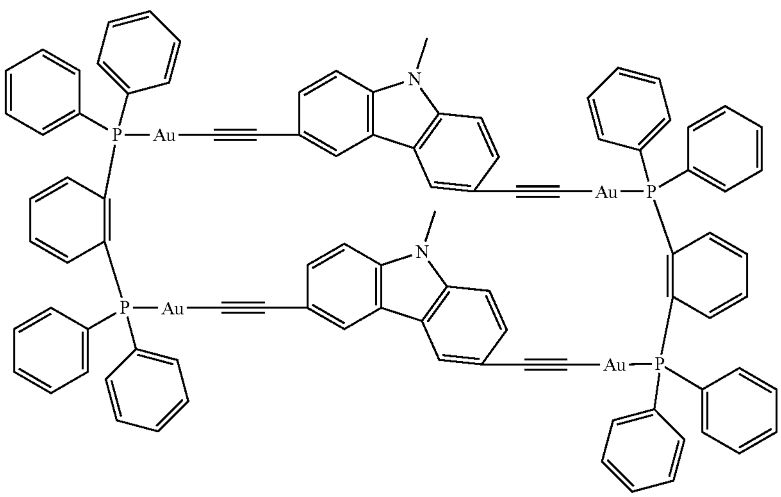
755
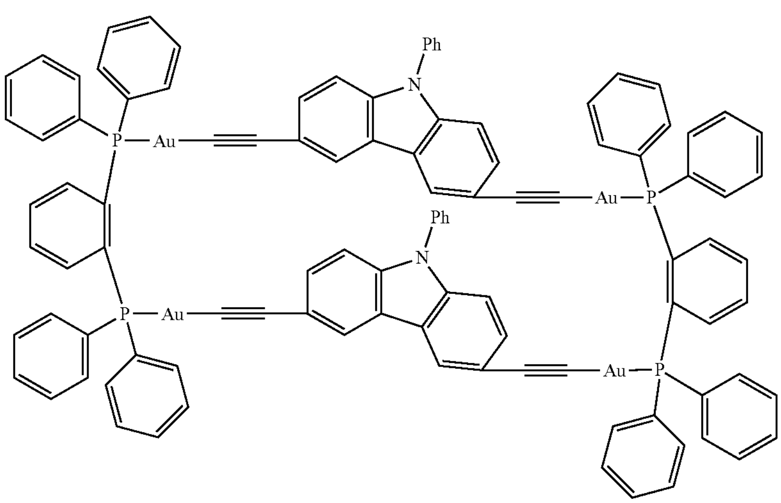

-continued
756
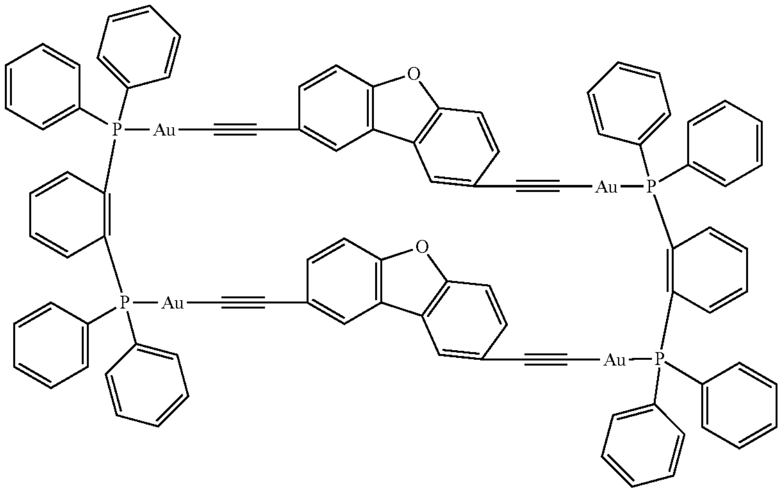
757
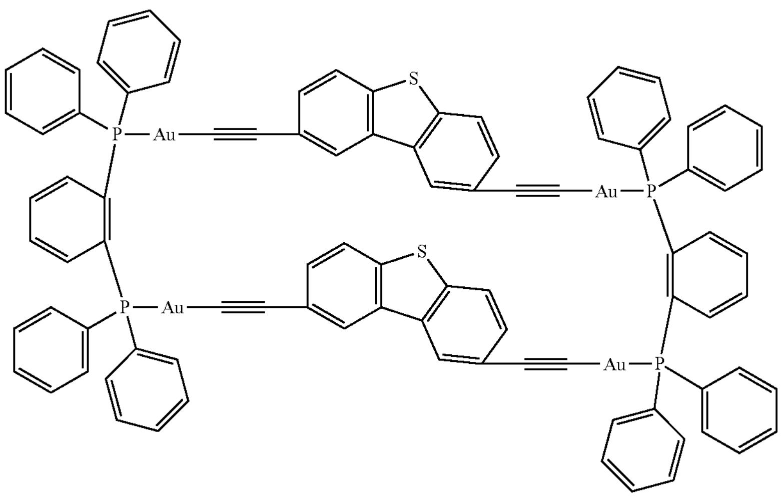
758
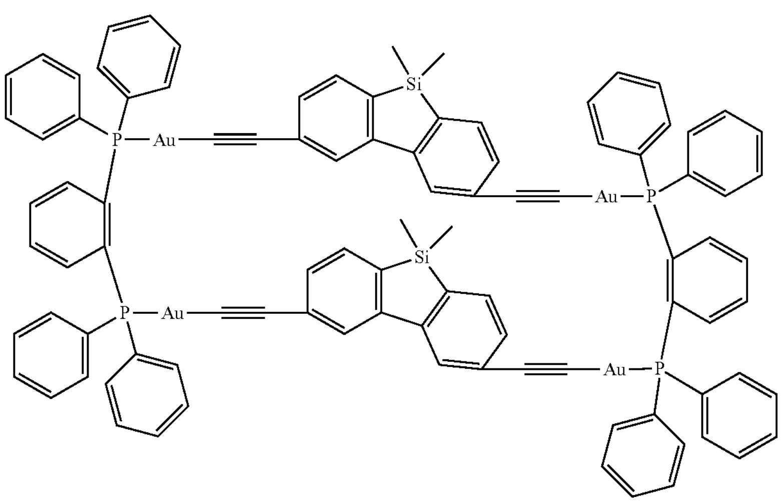

-continued
759
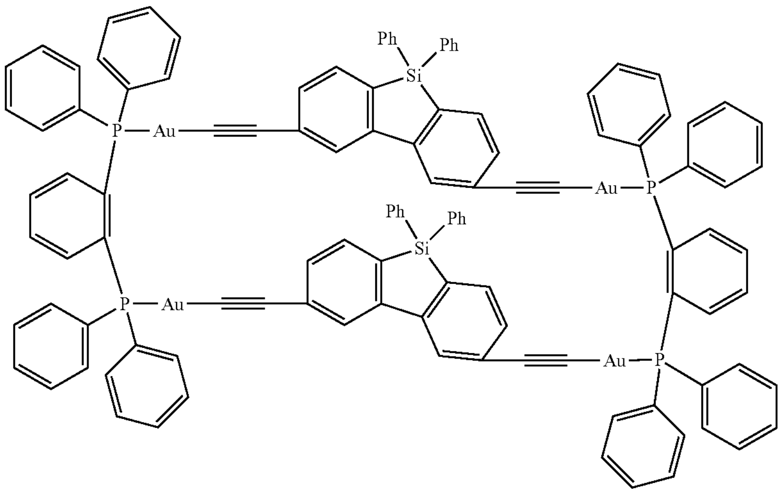
760
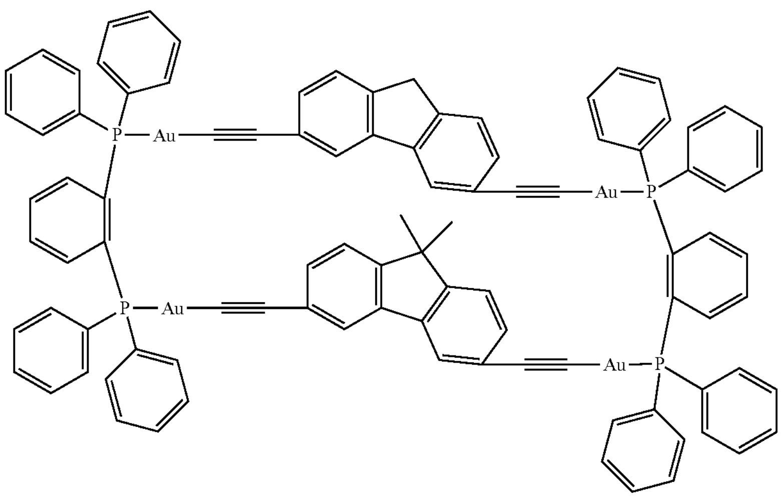
761
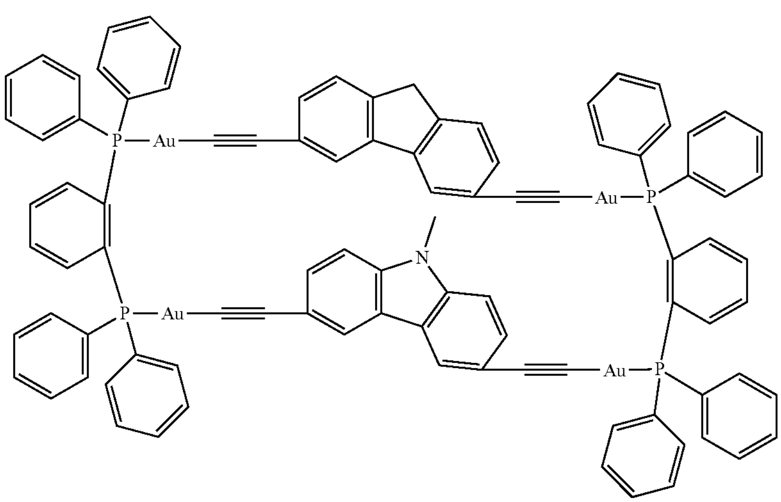

-continued
762
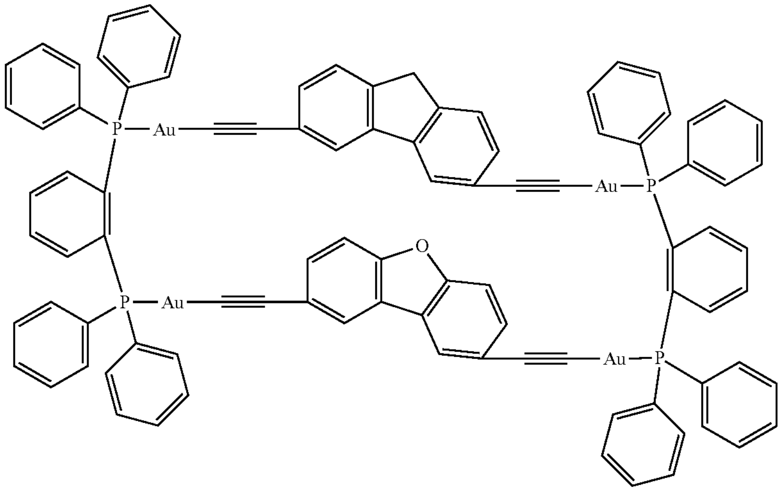
763
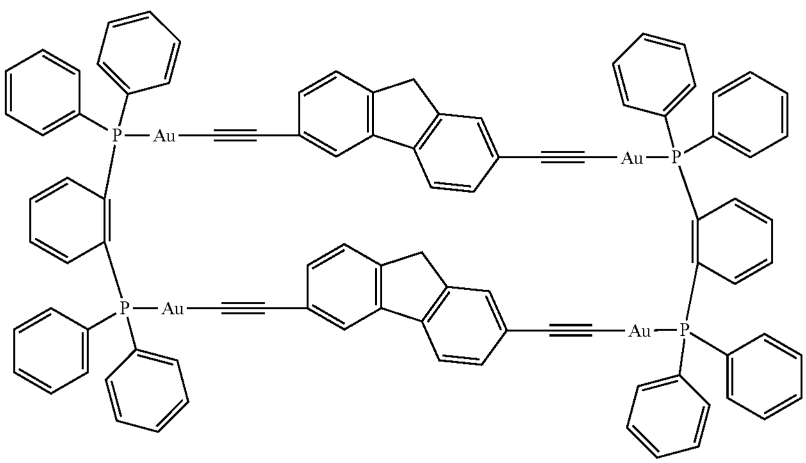
764
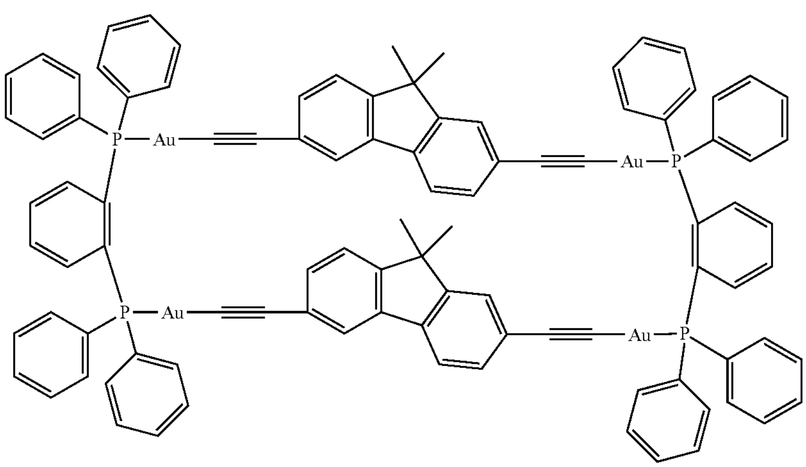

-continued
765
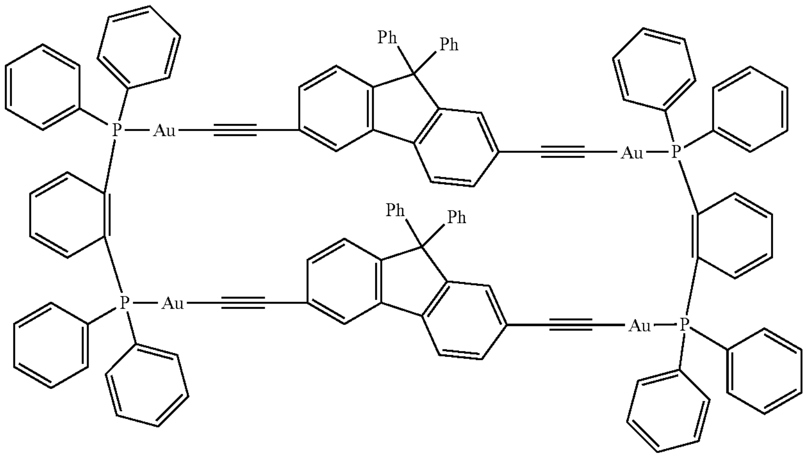
766
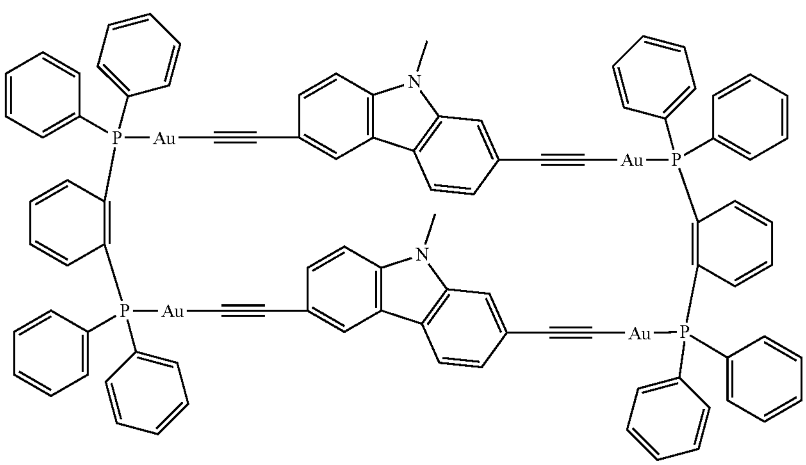
767
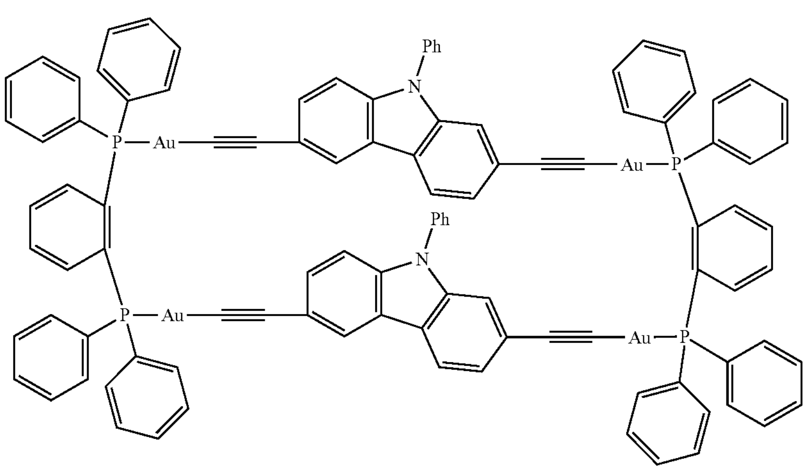

-continued
768
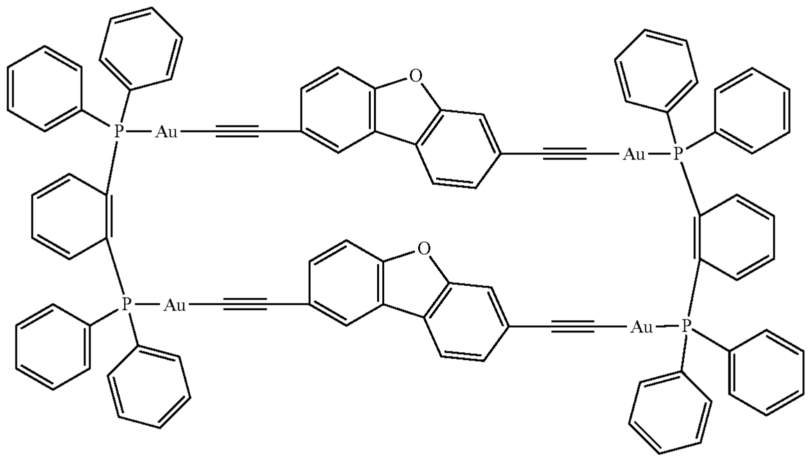
769
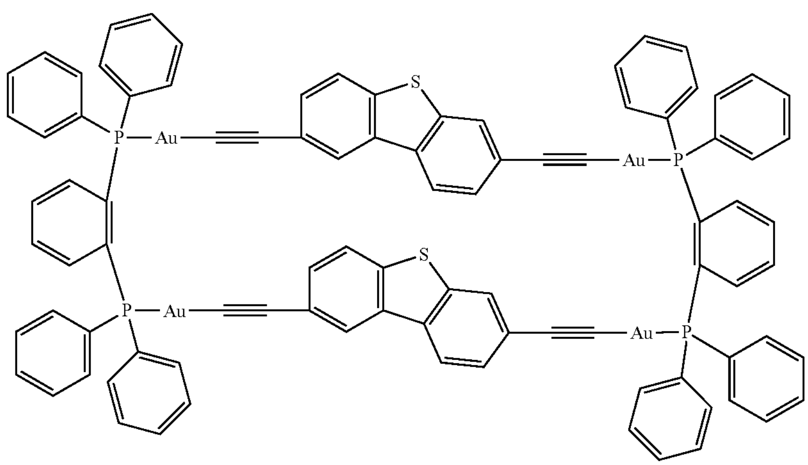
770
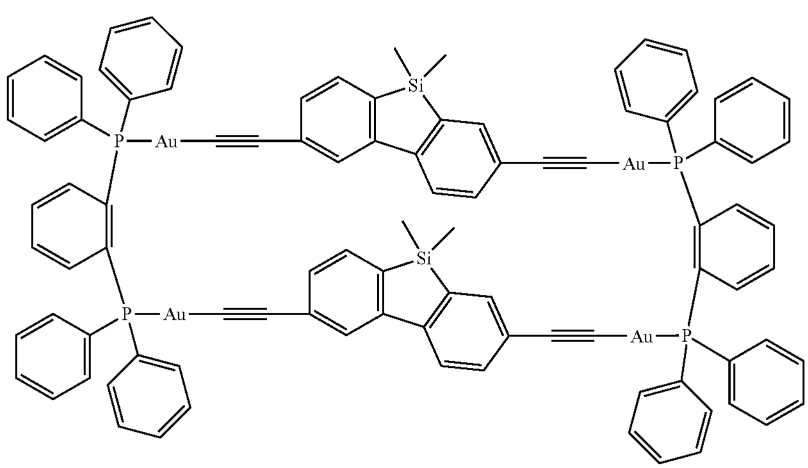

-continued
771
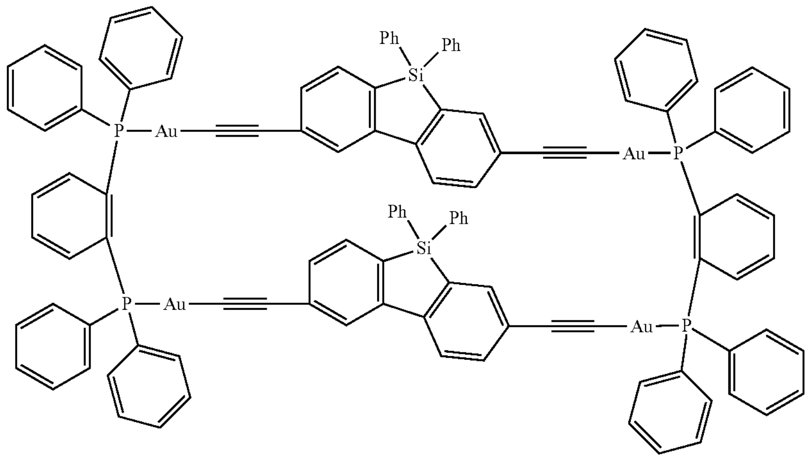
772
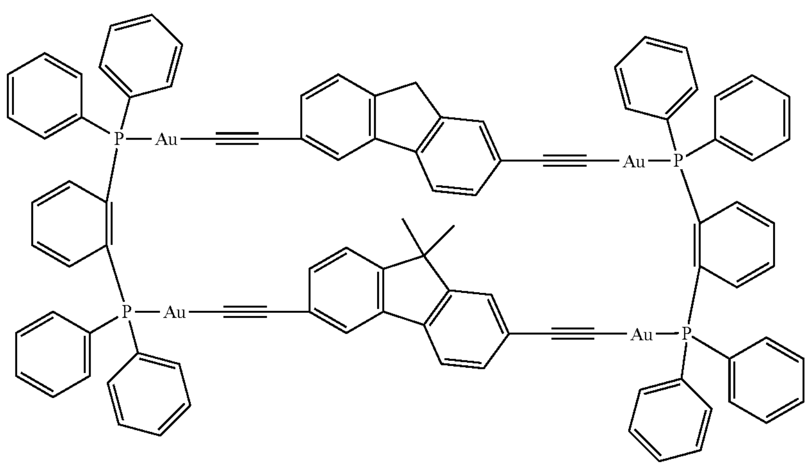
773
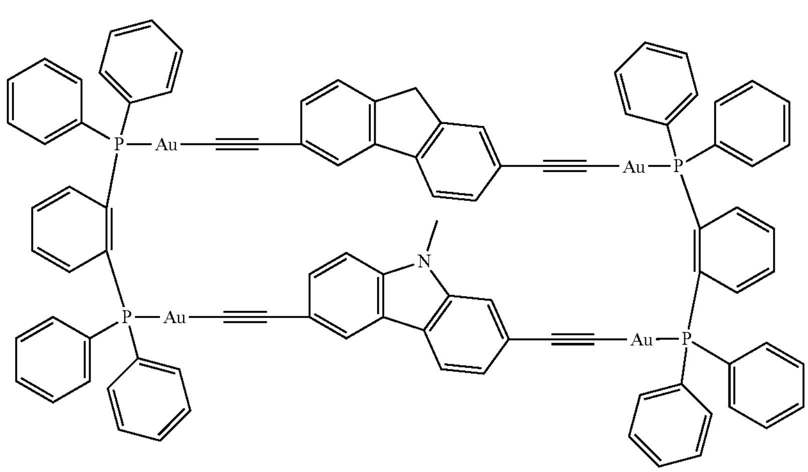

-continued
774
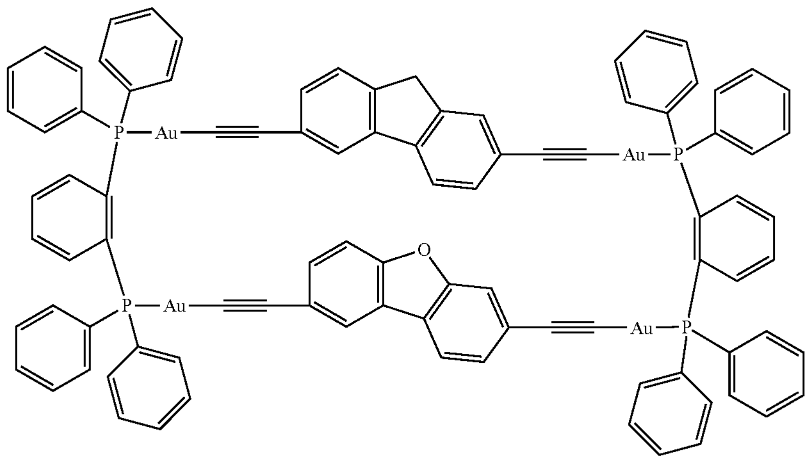
775
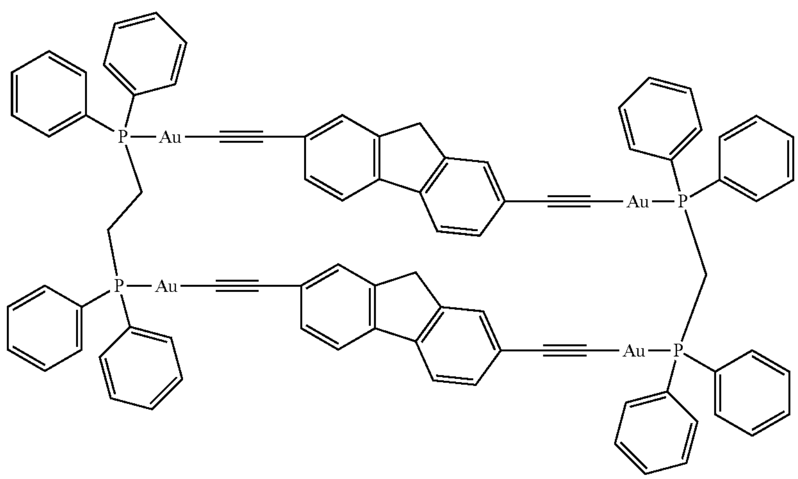
776
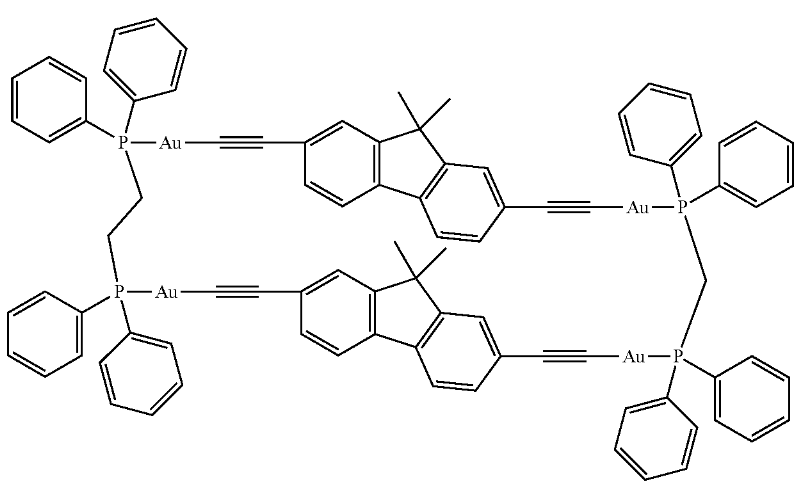

-continued
777
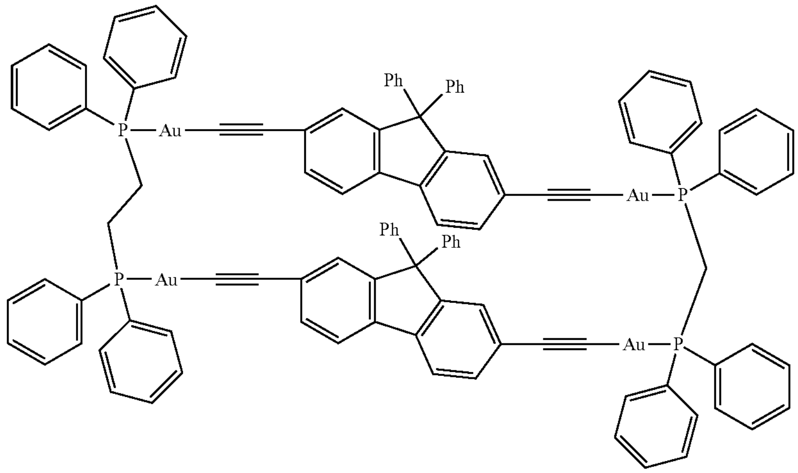
778
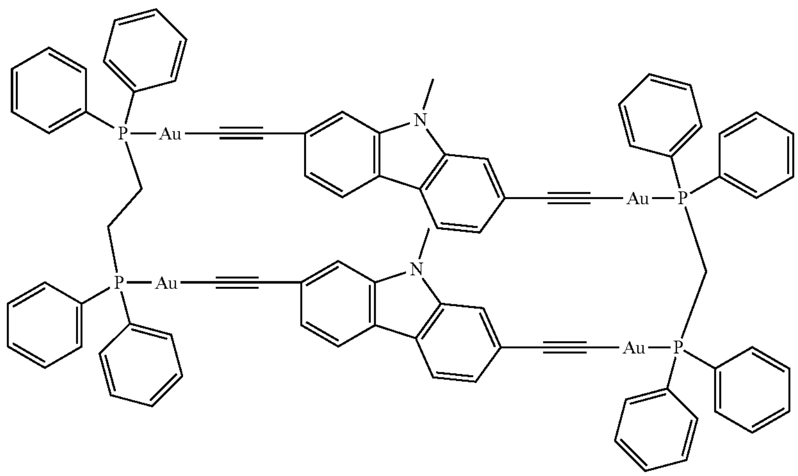
779
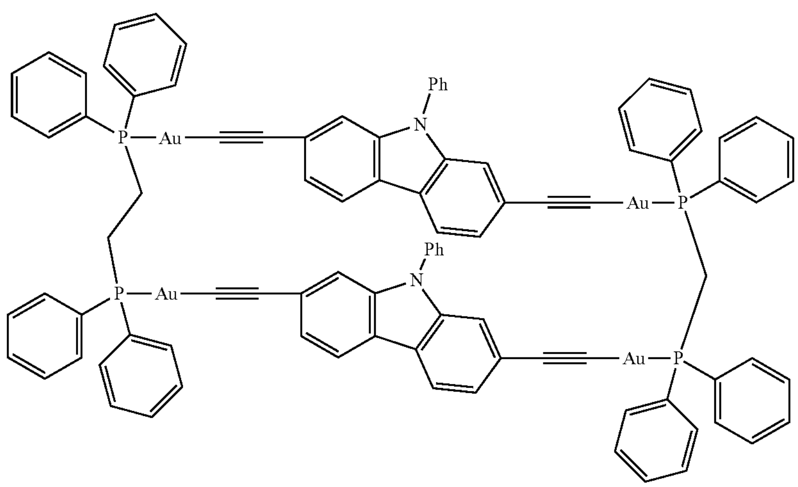

-continued
780
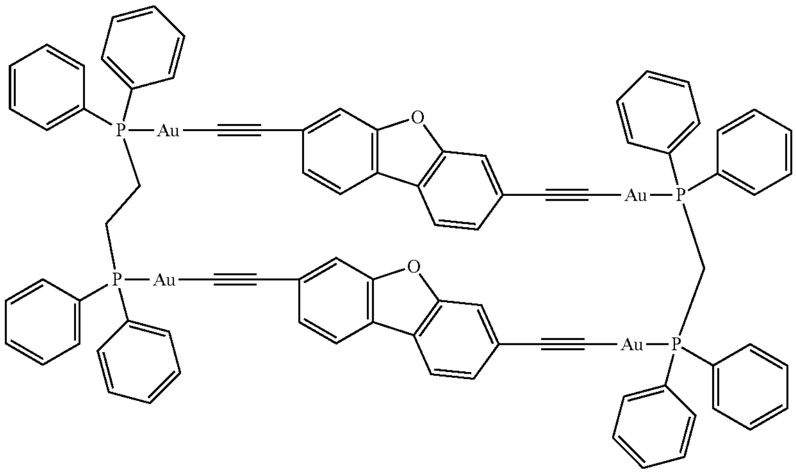
781
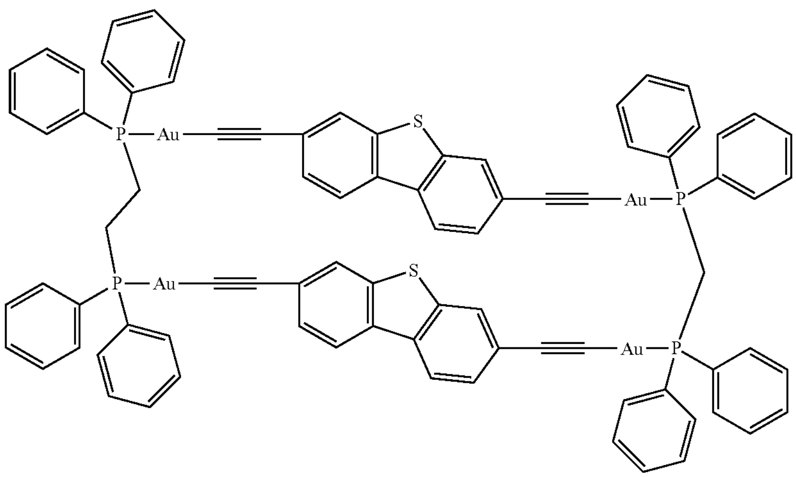
782
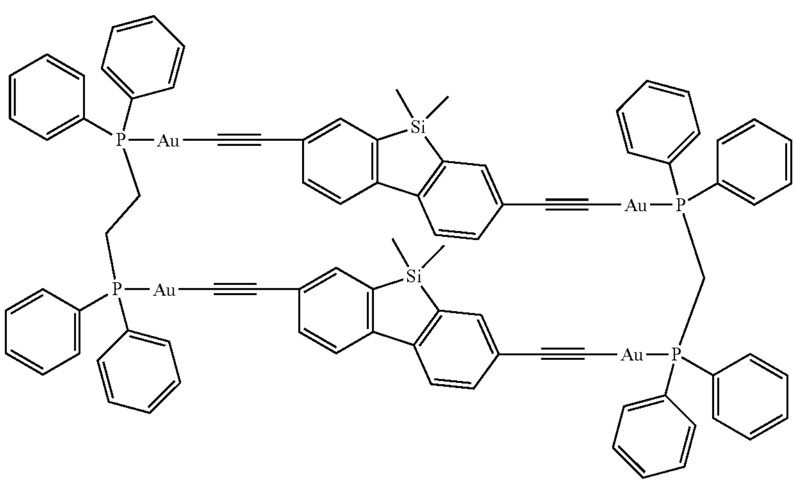

-continued
783
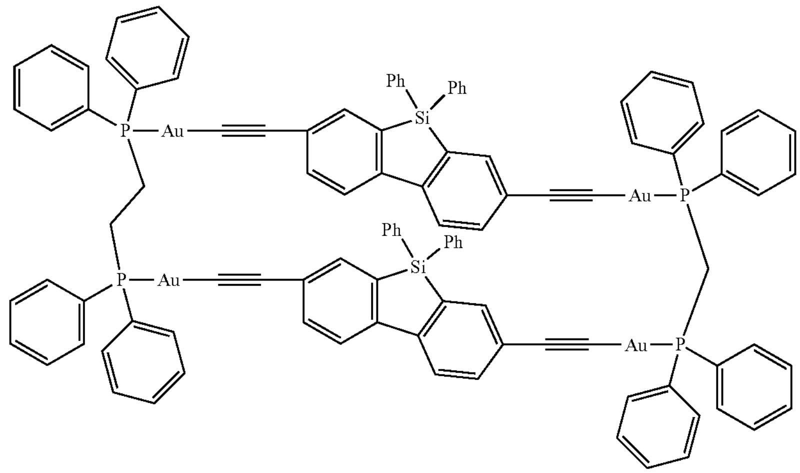
784
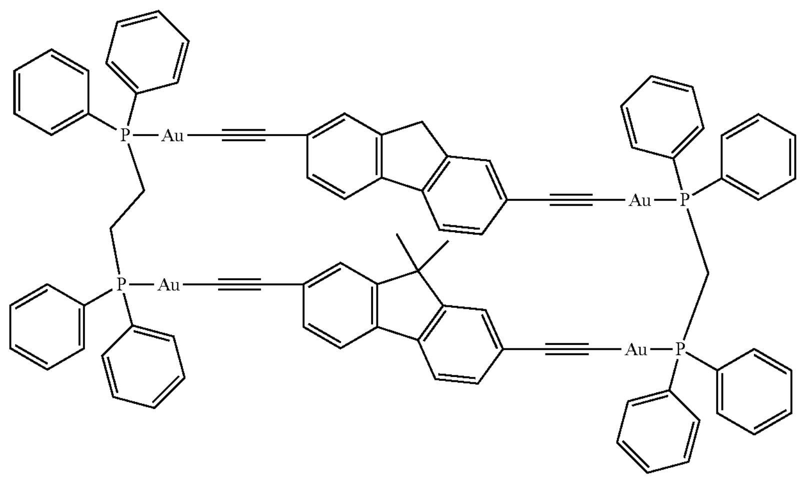
785
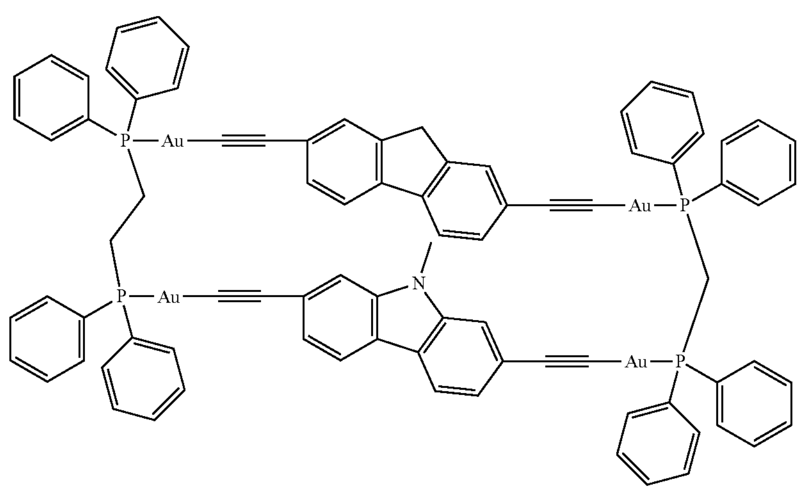

-continued
786
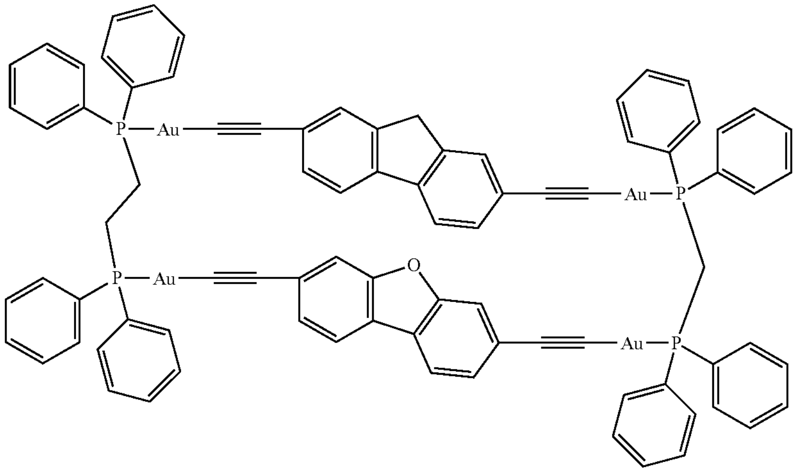
787
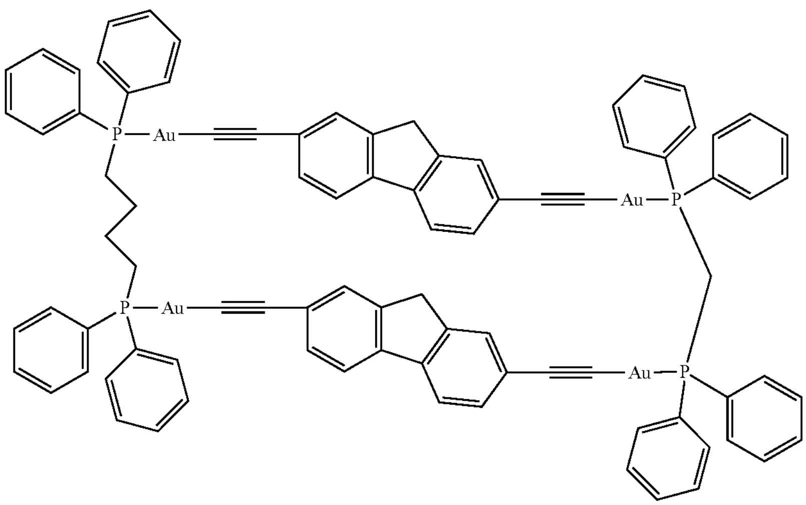
788
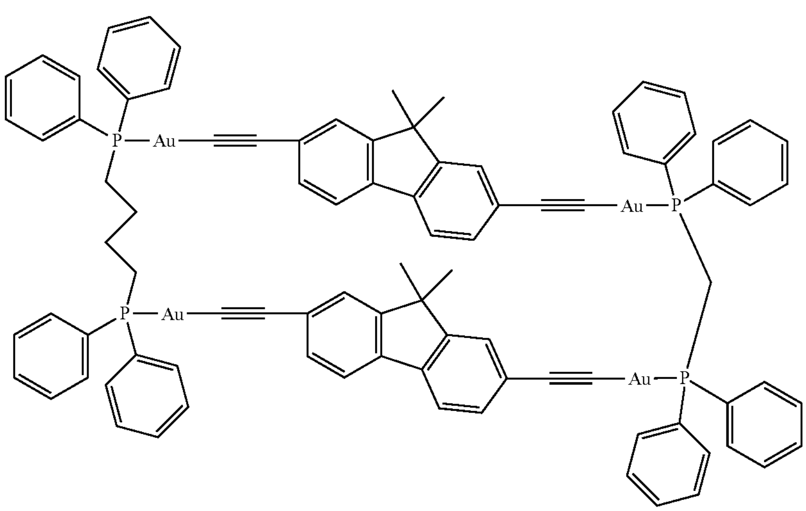

-continued
789
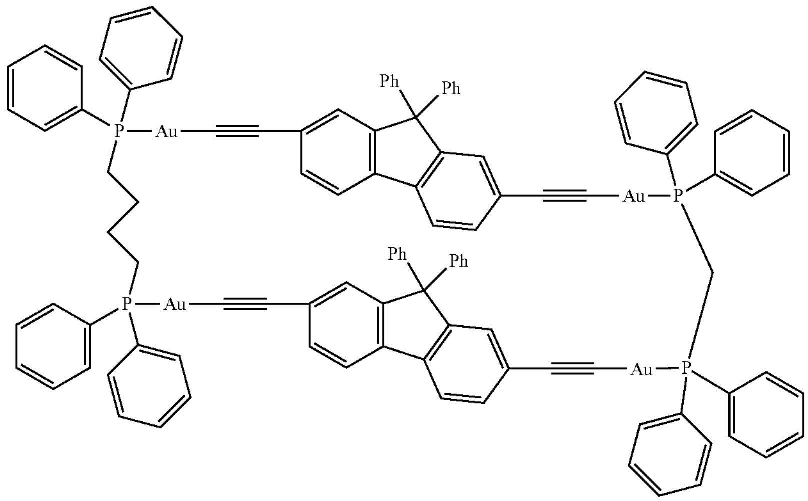
790
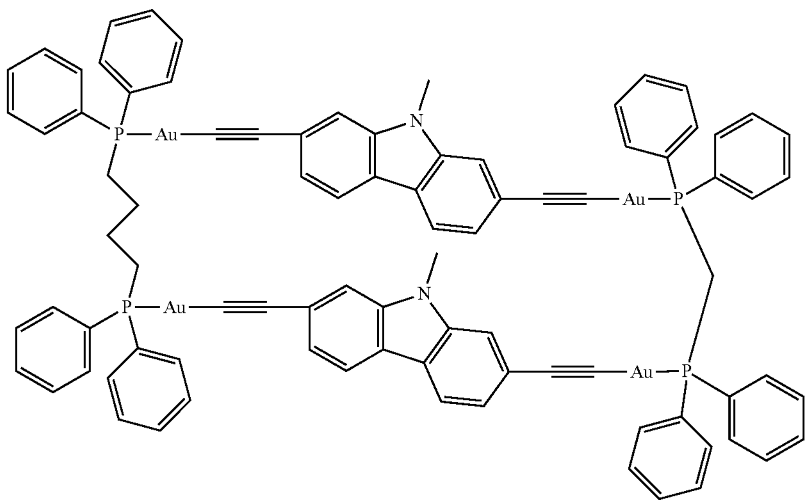
791
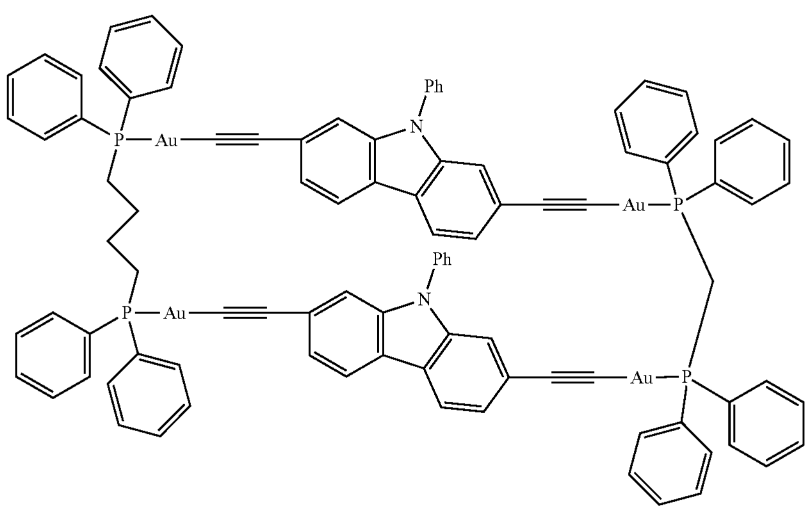

-continued
792
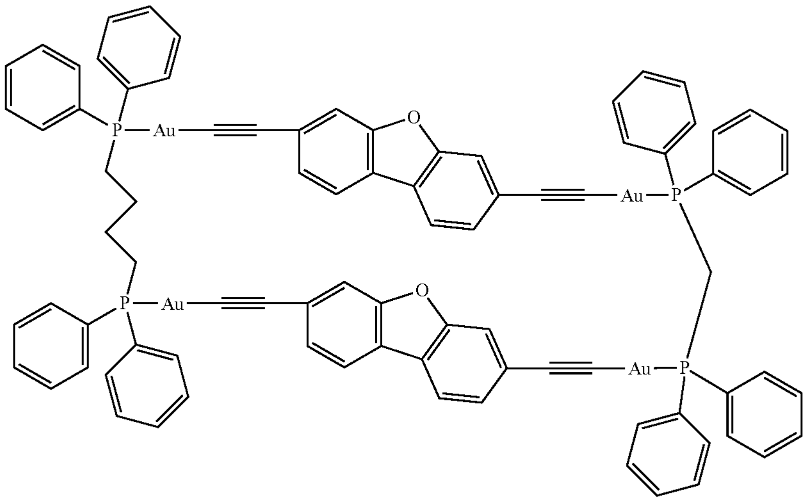
793
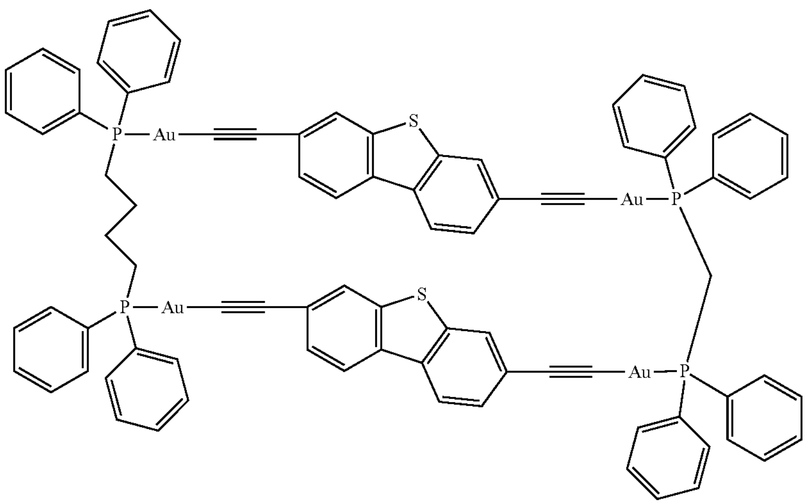
794
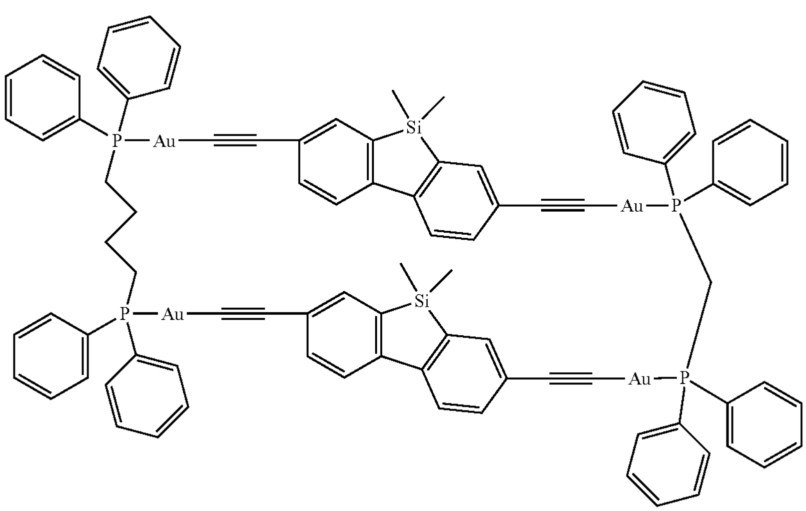

-continued
795
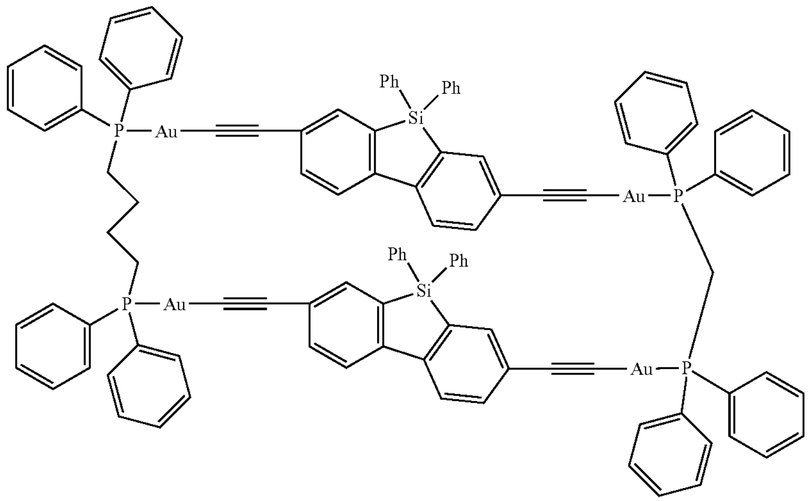
796
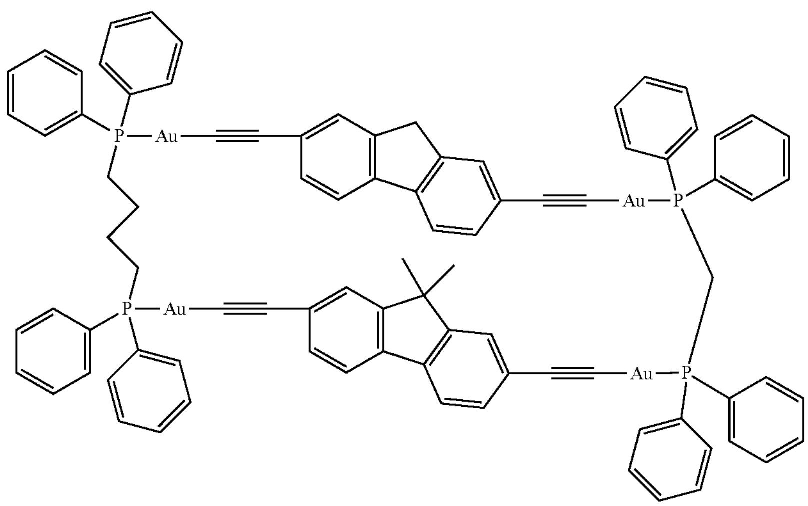
797
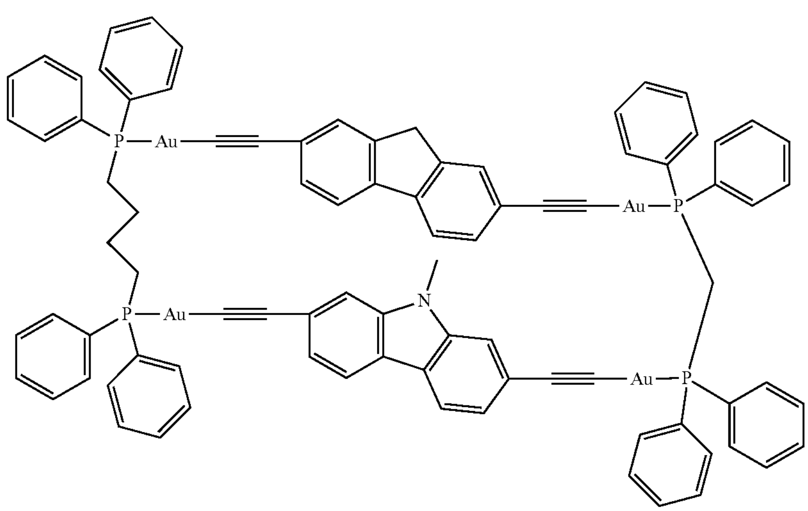

-continued
798
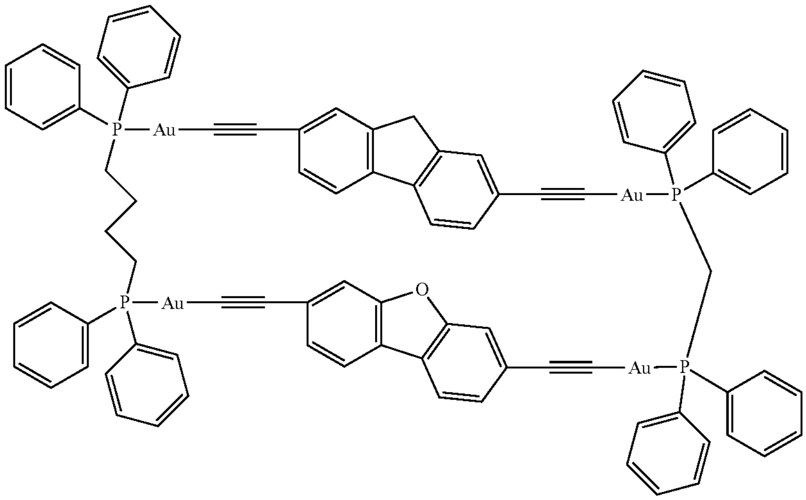
799
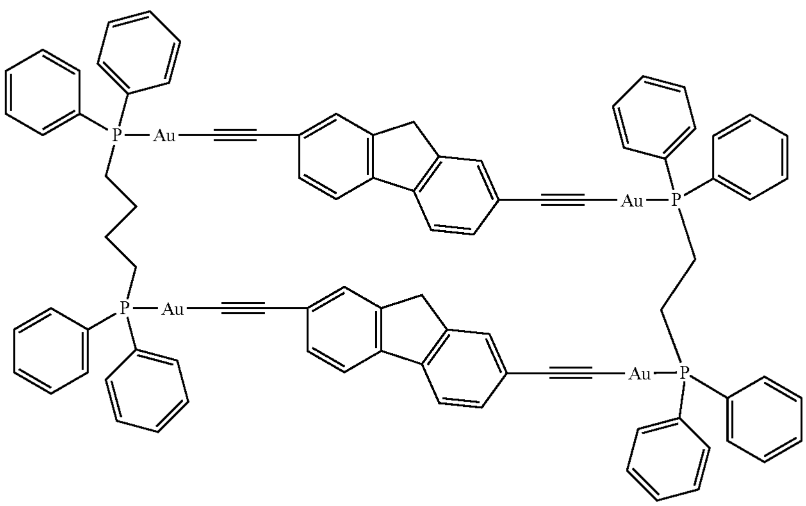
800
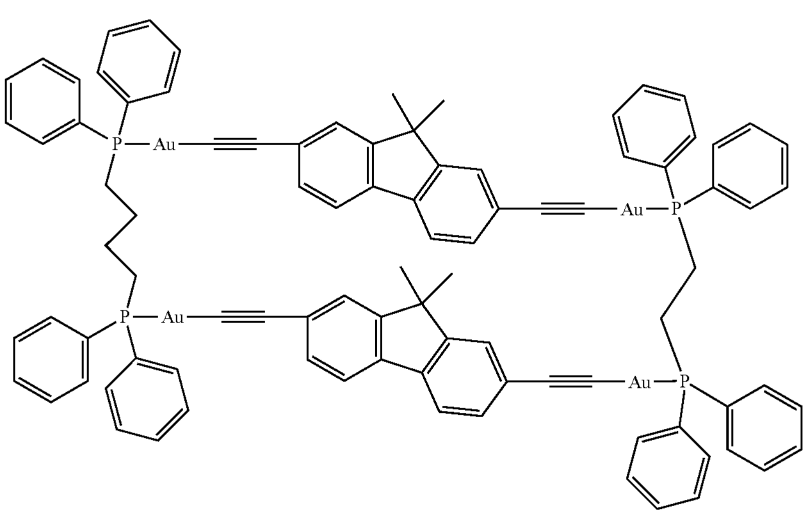

-continued
801
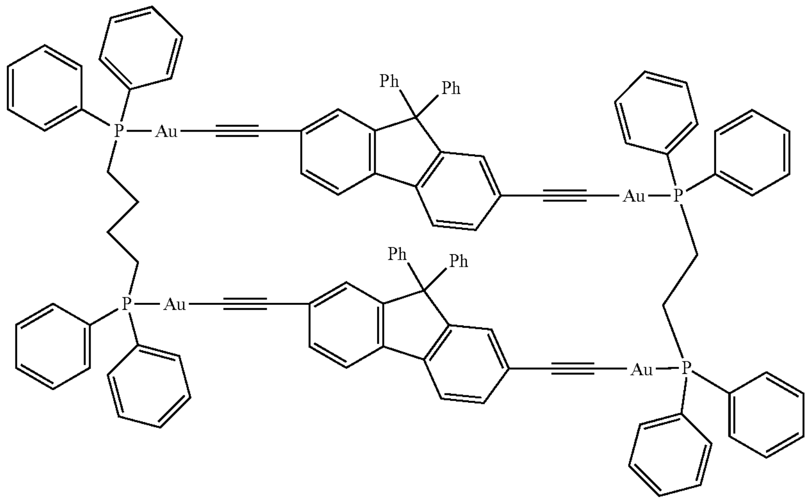
802
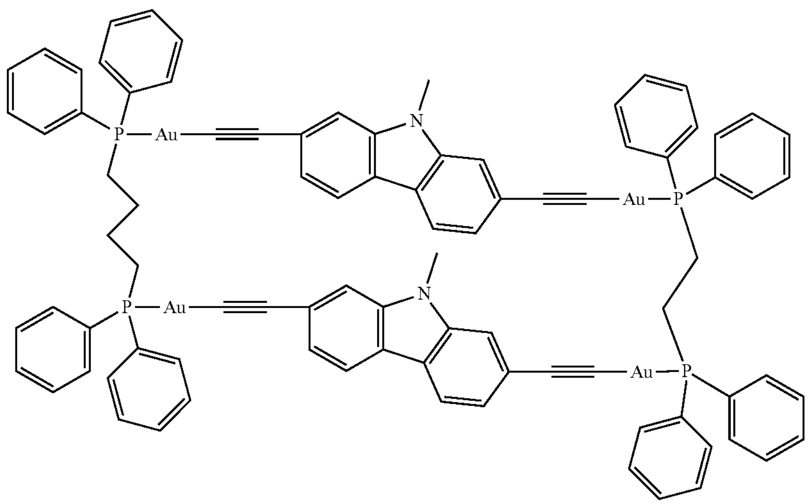
803
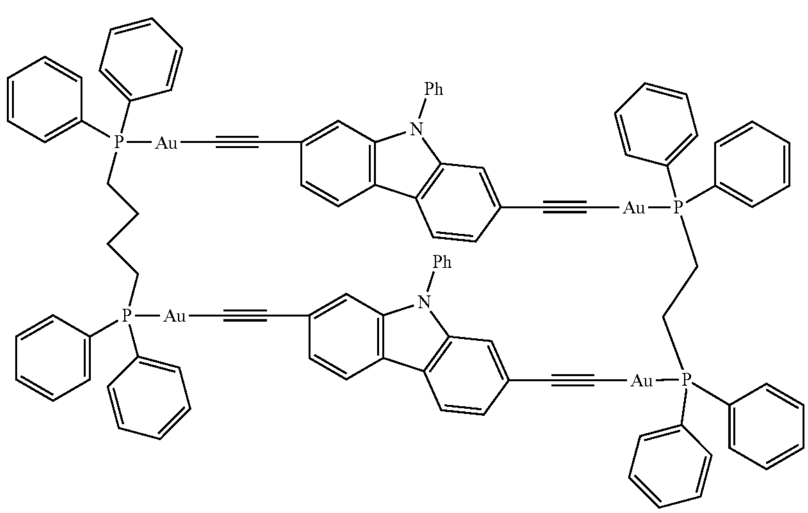

-continued
804
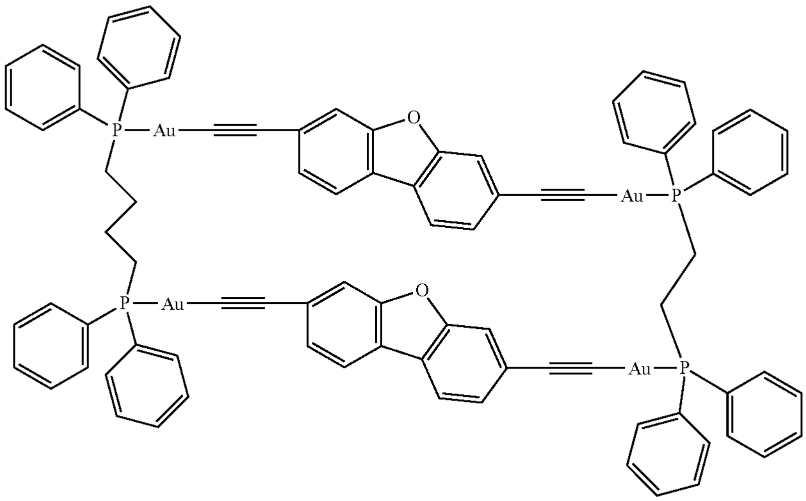
805
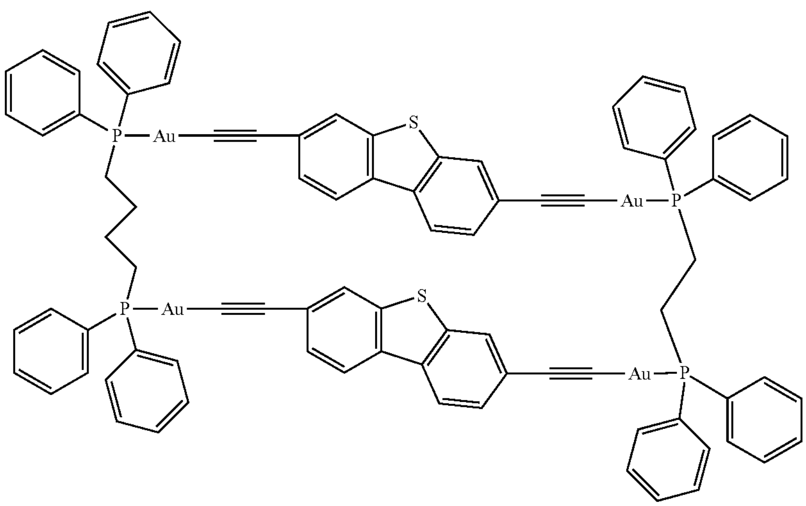
806
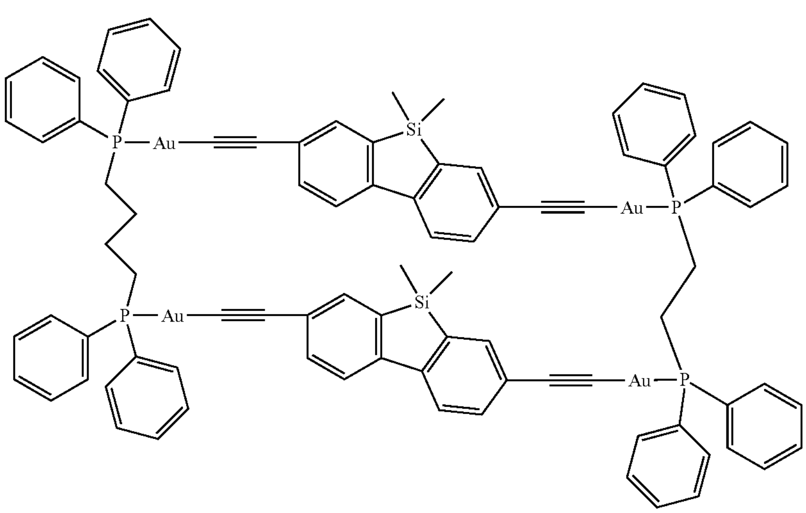

-continued
807
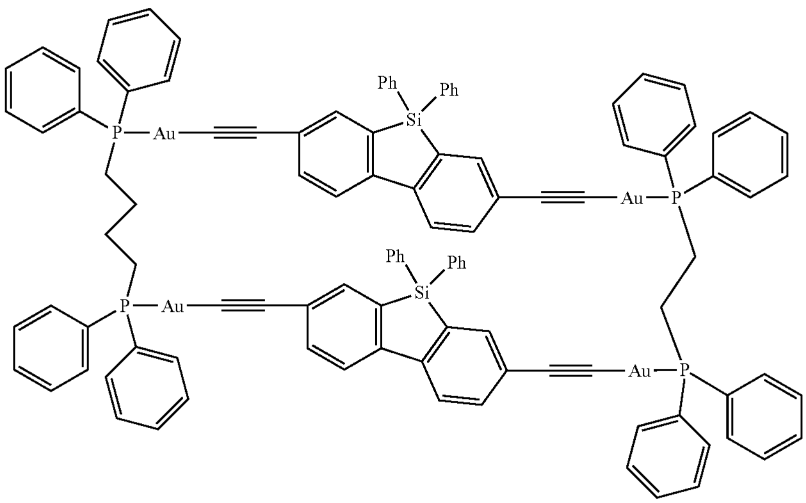
808
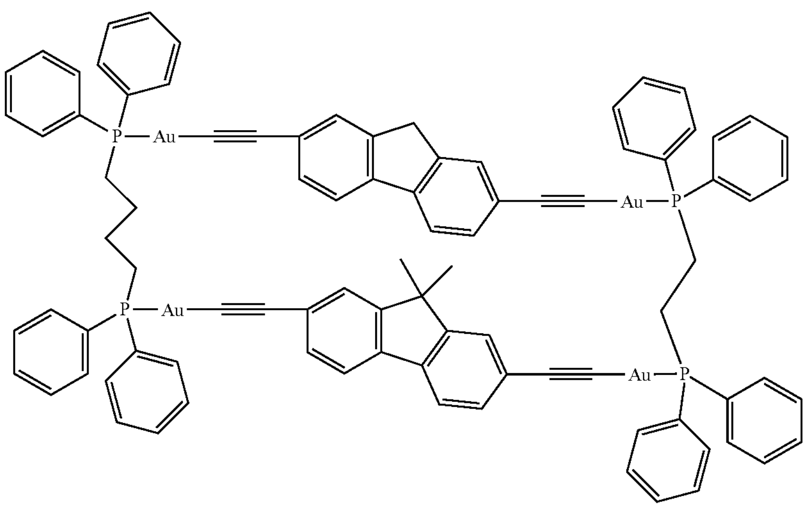
809
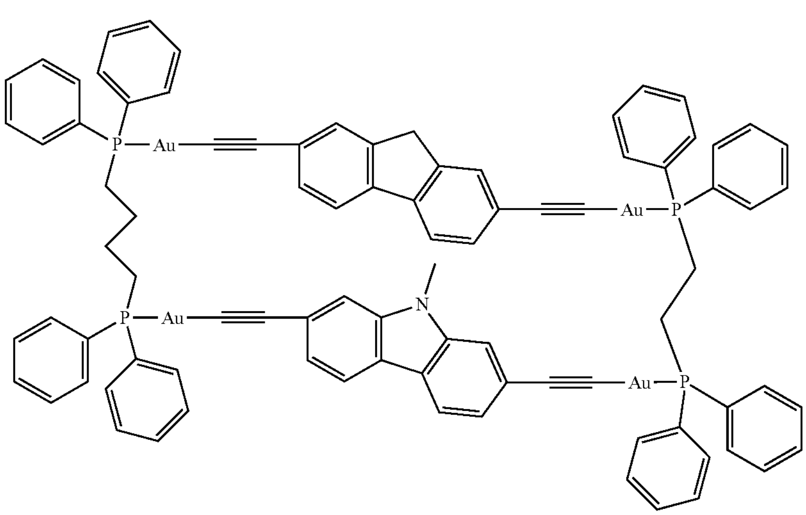

-continued

810

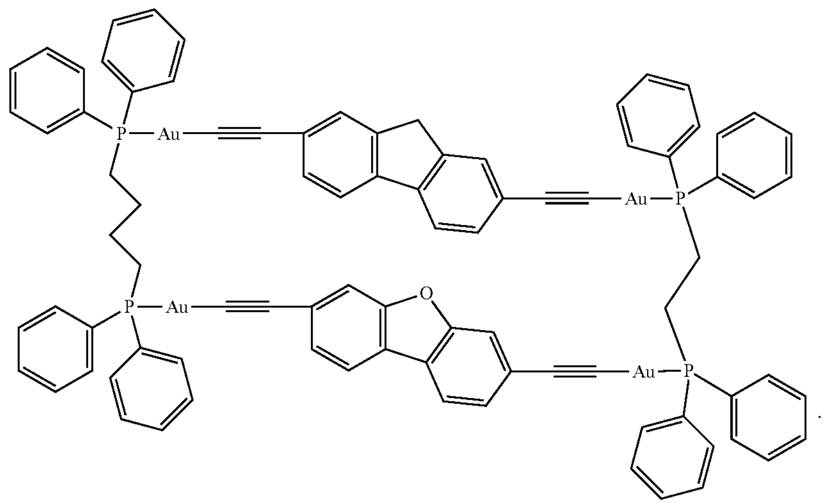

14. The organometallic compound of claim 1, wherein the organometallic compound absorbs ultraviolet light (UV) at 25° C. and emits phosphorescent light having a maximum luminescence wavelength of 470 nanometers to 500 nanometers.

15. A composition comprising at least one organometallic compound of claim 1.

16. The composition of claim 15, wherein the composition is a diagnostic composition, a composition for measurement, or a security ink composition.

* * * * *